US012740286B2

(12) United States Patent
Chang et al.

(10) Patent No.: US 12,740,286 B2
(45) Date of Patent: Sep. 15, 2026

(54) NUCLEATION-INHIBITING COATING CONTAINING RARE EARTH COMPOUNDS AND DEVICES INCORPORATING SAME

(71) Applicant: OTI LUMIONICS, INC., Mississauga (CA)

(72) Inventors: Yi-Lu Chang, Mississauga (CA); Qi Wang, Mississauga (CA); Zhibin Wang, Mississauga (CA); Michael Helander, Mississauga (CA)

(73) Assignee: OTI Lumionics, Inc., Mississauga (CA)

( * ) Notice: Subject to any disclaimer, the term of this patent is extended or adjusted under 35 U.S.C. 154(b) by 752 days.

(21) Appl. No.: 17/925,300

(22) PCT Filed: May 17, 2021

(86) PCT No.: PCT/IB2021/054230
§ 371 (c)(1),
(2) Date: Nov. 14, 2022

(87) PCT Pub. No.: WO2021/229553
PCT Pub. Date: Nov. 18, 2021

(65) Prior Publication Data

US 2023/0354677 A1 Nov. 2, 2023

Related U.S. Application Data

(60) Provisional application No. 63/181,100, filed on Apr. 28, 2021, provisional application No. 63/163,453,
(Continued)

(51) Int. Cl.
*H10K 59/80* (2023.01)
*C01F 5/02* (2006.01)
(Continued)

(52) U.S. Cl.
CPC ......... *H10K 59/80523* (2023.02); *C01F 5/02* (2013.01); *C01F 17/224* (2020.01); *H10K 59/12* (2023.02)

(58) Field of Classification Search
CPC .. H10K 59/80523; H10K 59/12; C01F 17/224
(Continued)

(56) References Cited

U.S. PATENT DOCUMENTS 2,876,247 A 3/1959 Ratz et al.
3,094,536 A 6/1963 Kenney et al.
(Continued)

FOREIGN PATENT DOCUMENTS

CA 2074331 A1 1/1993
CA 2544380 C 1/2014
(Continued)

OTHER PUBLICATIONS

Foreign Office Action of Chinese Appl. No. 2021800611499, N.d., (3 pages).
(Continued)

*Primary Examiner* — Xia L Cross
(74) *Attorney, Agent, or Firm* — Foley & Lardner LLP

(57) ABSTRACT

A device having a plurality of layers comprises a nucleation-inhibiting coating (NIC) disposed on a first layer surface in a first portion of a lateral aspect thereof; and a deposited layer comprised of a deposited material, disposed on a second layer surface, wherein an initial sticking probability against deposition of the deposited layer onto a surface of the NIC in the first portion is substantially less than the initial sticking probability against deposition of the deposited layer onto the second layer surface, such that the NIC is substantially devoid of a closed coating of the deposited material and wherein the NIC comprises a compound containing a rare earth element. The deposited layer can com-
(Continued)

prise a closed coating on the second layer surface in a second portion of the lateral aspect, and/or a discontinuous layer of at least one particle structure on a surface of the NIC.

43 Claims, 95 Drawing Sheets

Related U.S. Application Data filed on Mar. 19, 2021, provisional application No. 63/153,834, filed on Feb. 25, 2021, provisional application No. 63/107,393, filed on Oct. 29, 2020, provisional application No. 63/025,828, filed on May 15, 2020.

(51) Int. Cl.
*C01F 17/224* (2020.01)
*H10K 59/12* (2023.01)

(58) Field of Classification Search
USPC .......... 257/79
See application file for complete search history.

(56) References Cited

U.S. PATENT DOCUMENTS 3,140,143 A 7/1964 Kaspaul et al.
3,169,933 A 2/1965 Kenney
3,597,457 A 8/1971 Robinson et al.
3,928,480 A 12/1975 Tabushi et al.
3,978,030 A 8/1976 Resnick
4,022,928 A 5/1977 Piwcyzk
4,119,635 A 10/1978 Omodei-Sale et al.
4,188,486 A 2/1980 Tsukamoto et al.
4,379,155 A 4/1983 Omodei-Sale et al.
4,431,786 A 2/1984 Squire
4,594,399 A 6/1986 Anderson et al.
4,622,179 A 11/1986 Eda
4,749,637 A 6/1988 Hayashida et al.
4,803,005 A 2/1989 Juhlke et al.
4,832,983 A 5/1989 Nagatomi et al.
4,885,211 A 12/1989 Tang et al.
4,927,735 A 5/1990 Era et al.
4,960,538 A 10/1990 Itoh et al.
5,009,986 A 4/1991 Kawaguchi et al.
5,015,758 A 5/1991 Pilgrim et al.
5,034,309 A 7/1991 Tai et al.
5,059,862 A 10/1991 Vanslyke et al.
5,061,596 A 10/1991 Albert et al.
5,075,203 A 12/1991 Katayose et al.
5,219,706 A 6/1993 Tai et al.
5,232,635 A 8/1993 Van Moer et al.
5,260,435 A 11/1993 Sawada et al.
5,378,589 A 1/1995 Sawada et al.
5,399,936 A 3/1995 Namiki et al.
5,420,301 A 5/1995 Ackermann et al.
5,428,152 A 6/1995 Hayashida et al.
5,446,142 A 8/1995 Itoh et al.
5,484,685 A 1/1996 Tai et al.
5,512,095 A 4/1996 Sens et al.
5,550,290 A 8/1996 Mizuta et al.
5,652,285 A 7/1997 Coggio et al.
5,739,545 A 4/1998 Guha et al.
5,824,799 A 10/1998 Buechler et al.
5,872,357 A 2/1999 Flanagan
5,883,177 A 3/1999 Colaianna et al.
5,895,228 A 4/1999 Biebuyck et al.
5,916,481 A 6/1999 Willey
5,935,721 A 8/1999 Shi et al.
5,997,754 A 12/1999 Yamaha et al.
6,016,033 A 1/2000 Jones et al.
6,171,715 B1 1/2001 Sato et al.
6,191,433 B1 2/2001 Roitman et al.
6,251,687 B1 6/2001 Buechler et al.
6,285,039 B1 9/2001 Kobori et al.
6,329,490 B1 12/2001 Yamashita et al.
6,361,886 B2 3/2002 Shi et al.
6,407,408 B1 6/2002 Zhou et al.
6,465,115 B2 10/2002 Shi et al.
6,468,590 B2 10/2002 Biebuyck et al.
6,472,468 B1 10/2002 Omura
6,517,958 B1 2/2003 Sellinger et al.
6,538,374 B2 3/2003 Hosokawa
6,608,009 B2 8/2003 Akada et al.
6,635,364 B1 10/2003 Igarashi
6,638,644 B2 10/2003 Zheng et al.
6,682,785 B2 1/2004 Wingen et al.
6,787,468 B2 9/2004 Kim et al.
6,794,061 B2 9/2004 Liao et al.
6,835,950 B2 12/2004 Brown et al.
6,852,429 B1 2/2005 Li et al.
6,878,469 B2 4/2005 Yoon et al.
6,899,963 B1 5/2005 Zheng et al.
6,900,470 B2 5/2005 Kobayashi et al.
6,927,270 B2 8/2005 Lichtenhan et al.
6,995,035 B2 2/2006 Cok et al.
7,018,713 B2 3/2006 Padiyath et al.
7,053,255 B2 5/2006 Ikeda et al.
7,056,601 B2 6/2006 Cosimbescu et al.
7,099,299 B2 8/2006 Liang et al.
7,105,298 B2 9/2006 Liu et al.
7,115,684 B2 10/2006 Vanspeybroeck et al.
7,160,819 B2 1/2007 Conley et al.
7,166,240 B2 1/2007 Ishida et al.
7,169,482 B2 1/2007 Aziz et al.
7,173,276 B2 2/2007 Choi et al.
7,175,815 B2 2/2007 Yamasaki et al.
7,192,659 B2 3/2007 Ricks et al.
7,193,015 B1 3/2007 Mabry et al.
7,217,683 B1 5/2007 Blanski et al.
7,252,893 B2 8/2007 Ricks et al.
7,259,267 B2 8/2007 Pleschke et al.
7,280,731 B2 10/2007 Rantala
7,306,856 B2 12/2007 Igarashi et al.
7,319,129 B2 1/2008 Yoshida et al.
7,326,293 B2 2/2008 Randall et al.
7,326,371 B2 2/2008 Conley et al.
7,361,796 B2 4/2008 Ikeda et al.
7,363,308 B2 4/2008 Dillon et al.
7,365,486 B2 4/2008 Lee et al.
7,373,060 B2 5/2008 Satake et al.
7,402,948 B2 7/2008 Yamazaki et al.
7,427,783 B2 9/2008 Lee et al.
7,449,509 B2 11/2008 Marks et al.
7,449,539 B2 11/2008 Morimoto et al.
7,470,315 B2 12/2008 Vonwiller et al.
7,479,462 B2 1/2009 Rantala et al.
7,491,975 B2 2/2009 Kubota
7,495,389 B2 2/2009 Noguchi et al.
7,504,526 B2 3/2009 Kubota et al.
7,579,304 B2 8/2009 Liu et al.
7,651,787 B2 1/2010 Seo et al.
7,670,695 B2 3/2010 Wakabayashi et al.
7,674,914 B2 3/2010 Egawa et al.
7,701,132 B2 4/2010 Oh
7,728,510 B2 6/2010 Oh
7,733,009 B2 6/2010 Kondakov et al.
7,776,457 B2 8/2010 Lee et al.
7,790,892 B2 9/2010 Ikeda et al.
7,816,667 B2 10/2010 Park et al.
7,816,861 B2 10/2010 Choi et al.
7,820,864 B2 10/2010 Umemoto
7,833,632 B2 11/2010 Kawamura et al.
7,839,074 B2 11/2010 Ikeda et al.
7,839,083 B2 11/2010 Kubota
7,851,071 B2 12/2010 Yamamoto et al.
7,867,629 B2 1/2011 Yamamoto et al.
7,887,931 B2 2/2011 Cosimbescu et al.
7,897,667 B2 3/2011 Mabry et al.
7,910,687 B2 3/2011 Busing et al.
7,919,196 B2 4/2011 Kim et al.
7,947,519 B2 5/2011 Lee et al.
7,947,974 B2 5/2011 Kondakov

(56) References Cited

U.S. PATENT DOCUMENTS 7,956,351 B2 6/2011 Choi
7,973,306 B2 7/2011 Kim et al.
7,986,672 B2 7/2011 Tiedemann et al.
7,998,540 B2 8/2011 Goulding et al.
7,999,459 B2 8/2011 Chun et al.
8,004,180 B2 8/2011 Seo
8,025,815 B2 9/2011 Kawamura et al.
8,030,838 B2 10/2011 Kwak et al.
8,044,580 B2 10/2011 Yamazaki et al.
8,071,226 B2 12/2011 Je et al.
8,076,839 B2 12/2011 Kuma et al.
8,089,066 B2 1/2012 Yamazaki et al.
8,097,349 B2 1/2012 Yamamoto et al.
8,115,376 B2 2/2012 Fujioka et al.
8,174,185 B2 5/2012 Park et al.
8,217,570 B2 7/2012 Kawamura et al.
8,222,634 B2 7/2012 Lee et al.
8,232,350 B2 7/2012 Fujita et al.
8,237,351 B2 8/2012 Sung et al.
8,257,620 B2 9/2012 Cranor et al.
8,278,378 B2 10/2012 Jung et al.
8,310,149 B2 11/2012 Lifka et al.
8,318,878 B2 11/2012 Sudo et al.
8,318,995 B2 11/2012 Kubota et al.
8,319,095 B2 11/2012 Sharma
8,343,637 B2 1/2013 Parham et al.
8,346,024 B2 1/2013 Vonwiller et al.
8,362,469 B2 1/2013 Suh
8,399,720 B2 3/2013 Umemoto
8,518,489 B2 8/2013 Shin et al.
8,530,596 B2 9/2013 Sano et al.
8,541,113 B2 9/2013 Je et al.
8,568,902 B2 10/2013 Kubota et al.
8,568,965 B2 10/2013 Kitamura et al.
8,586,202 B2 11/2013 Imai et al.
8,586,689 B2 11/2013 Jung et al.
8,586,703 B2 11/2013 Yang et al.
8,592,053 B2 11/2013 Kawakami et al.
8,618,595 B2 12/2013 Korgel et al.
8,629,222 B2 1/2014 Takizawa et al.
8,653,302 B2 2/2014 Umemoto
8,679,647 B2 3/2014 Pflumm et al.
8,679,656 B2 3/2014 Kobayashi et al.
8,703,303 B2 4/2014 Yamamoto et al.
8,729,530 B2 5/2014 Nagao et al.
8,759,818 B2 6/2014 Lecloux et al.
8,766,306 B2 7/2014 Lifka et al.
8,779,655 B2 7/2014 Nishimura
8,785,006 B2 7/2014 Ikeda et al.
8,795,422 B2 8/2014 Ganapathiappan et al.
8,795,847 B2 8/2014 Heil et al.
8,795,855 B2 8/2014 Klubek et al.
8,809,838 B2 8/2014 Jeong et al.
8,816,117 B2 8/2014 Marciniec et al.
8,852,756 B2 10/2014 Vestweber et al.
8,853,675 B2 10/2014 Kubota et al.
8,859,110 B2 10/2014 Fuchs et al.
8,859,111 B2 10/2014 Parham et al.
8,872,206 B2 10/2014 Chung et al.
8,877,356 B2 11/2014 Spindler et al.
8,883,324 B2 11/2014 Yabunouchi et al.
8,895,972 B2 11/2014 Chung et al.
8,921,840 B2 12/2014 Kim et al.
8,940,568 B2 1/2015 Mohan et al.
8,952,946 B2 2/2015 Fukunaga et al.
8,957,413 B2 2/2015 Song et al.
8,963,137 B2 2/2015 Lee et al.
8,963,414 B2 2/2015 Sawabe et al.
8,986,852 B2 3/2015 Stoessel et al.
8,987,516 B2 3/2015 Umemoto
8,993,123 B2 3/2015 Buesing et al.
8,994,010 B2 3/2015 Choi et al.
8,999,534 B2 4/2015 Shimokawa et al.
9,006,565 B2 4/2015 Abusleme et al.
9,018,621 B2 4/2015 Park et al.
9,024,301 B2 5/2015 Kawamura et al.
9,024,307 B2 5/2015 Lee
9,040,962 B2 5/2015 Adamovich et al.
9,051,344 B2 6/2015 Lin et al.
9,064,755 B2 6/2015 Park et al.
9,076,993 B2 7/2015 Kim et al.
9,088,004 B2 7/2015 Chung et al.
9,093,403 B2 7/2015 Kim et al.
9,093,669 B2 7/2015 Park et al.
9,105,865 B2 8/2015 Chung et al.
9,105,867 B2 8/2015 Verschuuren et al.
9,113,536 B2 8/2015 Oka et al.
9,117,402 B2 8/2015 Lee et al.
9,126,970 B2 9/2015 Pflumm et al.
9,169,274 B2 10/2015 Mizuki et al.
9,214,636 B2 12/2015 Takashima et al.
9,219,234 B2 12/2015 Kubota et al.
9,231,030 B2 1/2016 Choi et al.
9,245,934 B2 1/2016 Chung et al.
9,246,105 B2 1/2016 Sun
9,246,123 B2 1/2016 Kim et al.
9,257,654 B2 2/2016 Kawakami et al.
9,276,220 B2 3/2016 Kim et al.
9,287,339 B2 3/2016 Lee et al.
9,293,515 B2 3/2016 Choi et al.
9,312,312 B1 4/2016 Tsai et al.
9,331,308 B2 5/2016 Choi et al.
9,353,027 B2 5/2016 Kawamura et al.
9,444,064 B2 9/2016 Kaiser et al.
9,450,027 B2 9/2016 Pang et al.
9,450,033 B2 9/2016 Suh et al.
9,471,172 B2 10/2016 Sirois
9,478,591 B2 10/2016 Nam et al.
9,487,724 B2 11/2016 Xu et al.
9,502,601 B1 11/2016 Smith et al.
9,508,957 B2 11/2016 Forrest et al.
9,515,280 B2 12/2016 Yun et al.
9,537,116 B2 1/2017 Lamansky et al.
9,548,456 B2 1/2017 Lee et al.
9,570,471 B2 2/2017 Heo et al.
9,583,716 B2 2/2017 Ikeda et al.
9,595,681 B2 3/2017 Mujica-Fernaud et al.
9,608,207 B2 3/2017 Takaku et al.
9,624,193 B2 4/2017 Aihara et al.
9,627,645 B2 4/2017 Cui et al.
9,647,042 B2 5/2017 Li et al.
9,660,195 B2 5/2017 Kawamura et al.
9,666,812 B2 5/2017 Lee et al.
9,680,108 B2 6/2017 Ito et al.
9,711,734 B2 7/2017 Kim
9,711,751 B2 7/2017 Prushinskiy et al.
9,728,726 B2 8/2017 Takaku et al.
9,741,973 B2 8/2017 Song et al.
9,748,318 B2 8/2017 Shim et al.
9,755,165 B2 9/2017 Nishide et al.
9,776,983 B2 10/2017 Marchionni et al.
9,786,846 B2 10/2017 Kubota et al.
9,791,760 B2 10/2017 Garcia et al.
9,793,491 B2 10/2017 Hwang et al.
9,812,657 B2 11/2017 Kravchuk et al.
9,831,457 B2 11/2017 Kang et al.
9,859,520 B2 1/2018 Kim
9,882,140 B2 1/2018 Han et al.
9,890,181 B2 2/2018 Jiang et al.
9,892,672 B2 2/2018 Lee et al.
9,896,621 B2 2/2018 Kim et al.
9,954,039 B2 4/2018 Im et al.
9,960,216 B2 5/2018 Lee et al.
9,960,260 B2 5/2018 Xu et al.
9,960,386 B2 5/2018 Thompson et al.
9,966,554 B2 5/2018 Lee et al.
10,022,951 B2 7/2018 Liu et al.
10,026,906 B2 7/2018 Jung et al.
10,032,843 B2 7/2018 Lee et al.
10,062,850 B2 8/2018 Jung et al.
10,084,019 B2 9/2018 Shim et al.
10,084,150 B1 9/2018 Lou
10,090,370 B2 10/2018 Lee et al.
10,147,769 B2 12/2018 Lee et al.

(56) References Cited

U.S. PATENT DOCUMENTS 10,153,450 B2 12/2018 Kawamura
10,158,094 B2 12/2018 Lee et al.
10,174,059 B2 1/2019 Warner et al.
10,177,206 B2 1/2019 Jung et al.
10,181,573 B2 1/2019 Im et al.
10,186,568 B2 1/2019 Kim et al.
10,205,101 B2 2/2019 Kubota et al.
10,224,386 B2 3/2019 Rieutort-Louis et al.
10,240,084 B2 3/2019 Molaire
10,263,185 B2 4/2019 Matsueda et al.
10,269,879 B2 4/2019 Shim et al.
10,270,033 B2 4/2019 Chang et al.
10,276,641 B2 4/2019 Lou
10,297,762 B2 5/2019 Zeng et al.
10,355,246 B2 7/2019 Helander et al.
10,361,375 B2 7/2019 Zeng et al.
10,442,823 B2 10/2019 Warner et al.
10,501,583 B2 12/2019 Song et al.
10,550,226 B2 2/2020 Valsecchi et al.
10,584,137 B2 3/2020 Warner
10,683,313 B2 6/2020 Choi et al.
10,700,304 B2 6/2020 Helander et al.
10,707,531 B1 7/2020 Harrup et al.
11,008,350 B2 5/2021 Diao et al.
11,040,991 B2 6/2021 Hayashi et al.
11,043,636 B2 6/2021 Helander et al.
11,046,885 B2 6/2021 Kim et al.
11,145,702 B2 10/2021 Chang et al.
11,152,587 B2 10/2021 Chang et al.
11,222,929 B2 1/2022 Wang et al.
11,355,734 B2 6/2022 Abe et al.
11,469,377 B2 10/2022 Yokoyama et al.
11,634,578 B2 4/2023 Eckel et al.
11,856,841 B2 12/2023 Kim et al.
2001/0051447 A1 12/2001 Usami
2002/0090811 A1 7/2002 Kim et al.
2002/0189392 A1 12/2002 Molstad
2003/0196987 A1 10/2003 Kung et al.
2003/0219625 A1 11/2003 Wolk et al.
2004/0018383 A1 1/2004 Aziz et al.
2004/0058193 A1 3/2004 Hatwar
2004/0152910 A1 8/2004 Fukuoka et al.
2004/0249027 A1 12/2004 Lim et al.
2004/0249070 A1 12/2004 Lim et al.
2004/0266087 A1 12/2004 Greier et al.
2005/0052118 A1 3/2005 Lee et al.
2005/0070196 A1 3/2005 Colombo et al.
2005/0168140 A1 8/2005 Nakamura et al.
2005/0175770 A1 8/2005 Liao et al.
2005/0181232 A1 8/2005 Ricks et al.
2005/0211958 A1 9/2005 Conley et al.
2005/0234210 A1 10/2005 Andrianov et al.
2005/0245648 A1 11/2005 Lim et al.
2005/0261389 A1 11/2005 Bratolavsky et al.
2005/0271899 A1 12/2005 Brown et al.
2005/0284336 A1 12/2005 Okada et al.
2006/0019116 A1 1/2006 Conley et al.
2006/0043858 A1 3/2006 Ikeda et al.
2006/0125390 A1 6/2006 Oh
2006/0154105 A1 7/2006 Yamamoto et al.
2006/0182993 A1 8/2006 Ogata et al.
2006/0210830 A1 9/2006 Funahashi et al.
2006/0246315 A1 11/2006 Begley et al.
2007/0003785 A1 1/2007 Slusarek et al.
2007/0077349 A1 4/2007 Newman et al.
2007/0178405 A1 8/2007 Kanda et al.
2007/0252517 A1 11/2007 Owczarczyk et al.
2007/0252521 A1 11/2007 Kondakov et al.
2007/0289623 A1 12/2007 Atwater
2008/0001123 A1 1/2008 Inoue et al.
2008/0012475 A1 1/2008 Oyamada et al.
2008/0033530 A1 2/2008 Zberg et al.
2008/0093986 A1 4/2008 Inoue et al.
2008/0103315 A1 5/2008 Egawa et al.
2008/0105865 A1 5/2008 Oyamada et al.
2008/0166593 A1 7/2008 Stoessel et al.
2008/0203905 A1 8/2008 Je et al.
2008/0258612 A1 10/2008 Kim et al.
2008/0265216 A1 10/2008 Hartmann et al.
2008/0286607 A1 11/2008 Nomura et al.
2008/0286610 A1 11/2008 Deaton et al.
2008/0303422 A1 12/2008 Vestweber et al.
2009/0033208 A1 2/2009 Nagayama et al.
2009/0066239 A1 3/2009 Yabunouchi
2009/0081827 A1 3/2009 Yang et al.
2009/0093641 A1 4/2009 Dolbier et al.
2009/0145483 A1 6/2009 Kim et al.
2009/0179196 A1 7/2009 Adachi et al.
2009/0199903 A1 8/2009 Oyamada et al.
2009/0233125 A1 9/2009 Choi et al.
2009/0236973 A1 9/2009 Yabe et al.
2009/0239986 A1 9/2009 Kim et al.
2010/0052526 A1 3/2010 Je et al.
2010/0078628 A1 4/2010 Chi et al.
2010/0080903 A1 4/2010 Tamitsuji et al.
2010/0108997 A1 5/2010 Kim et al.
2010/0113767 A1 5/2010 Gessner et al.
2010/0117028 A1 5/2010 Takeshima et al.
2010/0122725 A1 5/2010 Buchine et al.
2010/0126567 A1 5/2010 Kaufman
2010/0151180 A1 6/2010 Bravet et al.
2010/0193768 A1 8/2010 Habib
2010/0239821 A1 9/2010 Nagao et al.
2010/0244197 A1 9/2010 Arena et al.
2010/0286407 A1 11/2010 Kimura et al.
2010/0314615 A1 12/2010 Mizuki et al.
2010/0327240 A1 12/2010 Cranor et al.
2011/0006289 A1 1/2011 Mizuki et al.
2011/0091508 A1 4/2011 Esfand et al.
2011/0094889 A1 4/2011 Shin et al.
2011/0102308 A1 5/2011 Nakamura et al.
2011/0121271 A1 5/2011 Jeon et al.
2011/0156016 A1 6/2011 Kawamura et al.
2011/0168257 A1 7/2011 Kochergin
2011/0175031 A1 7/2011 Matsunami et al.
2011/0186820 A1 8/2011 Kim et al.
2011/0198582 A1 8/2011 Horiuchi et al.
2011/0204772 A1 8/2011 Egawa
2011/0220886 A1 9/2011 Takeshima et al.
2011/0285276 A1 11/2011 Kadoma et al.
2011/0297923 A1 12/2011 Mizuki et al.
2011/0309307 A1 12/2011 Zeika et al.
2012/0003484 A1 1/2012 Roehrig et al.
2012/0018770 A1 1/2012 Lu et al.
2012/0032138 A1 2/2012 Kim et al.
2012/0043533 A1 2/2012 Mizuki et al.
2012/0049228 A1 3/2012 Walter et al.
2012/0056165 A1 3/2012 Kawamura et al.
2012/0091885 A1 4/2012 Kim et al.
2012/0104422 A1 5/2012 Lee et al.
2012/0112169 A1 5/2012 Mizuki et al.
2012/0126274 A1 5/2012 Jagt et al.
2012/0146030 A1 6/2012 You et al.
2012/0181520 A1 7/2012 Kim et al.
2012/0181922 A1 7/2012 Kawamura et al.
2012/0187541 A1 7/2012 Arena et al.
2012/0235561 A1 9/2012 Ikeda et al.
2012/0266939 A1 10/2012 Fortmann et al.
2012/0266957 A1 10/2012 Wang et al.
2013/0020561 A1 1/2013 Suzuki et al.
2013/0026526 A1 1/2013 Lahijani
2013/0049024 A1 2/2013 Choi et al.
2013/0056784 A1 3/2013 Lee et al.
2013/0112952 A1 5/2013 Adamovich et al.
2013/0153878 A1 6/2013 Mizuki et al.
2013/0175509 A1 7/2013 Kim et al.
2013/0187143 A1 7/2013 Nishimura et al.
2013/0200780 A1 8/2013 Lee
2013/0221338 A1 8/2013 Kawamura et al.
2014/0014925 A1 1/2014 Jung et al.
2014/0070236 A1 3/2014 Chen et al.
2014/0103306 A1 4/2014 Moon et al.
2014/0110680 A1 4/2014 Choe
2014/0148877 A1 5/2014 Pan et al.

(56) References Cited

U.S. PATENT DOCUMENTS

2014/0159011 A1 6/2014 Suzuki et al.
2014/0168742 A1 6/2014 Hashimura et al.
2014/0178752 A1 6/2014 Park et al.
2014/0183500 A1 7/2014 Ikeda et al.
2014/0186983 A1 7/2014 Kim et al.
2014/0209154 A1 7/2014 Naughton et al.
2014/0225085 A1 8/2014 Hayashi et al.
2014/0231761 A1 8/2014 Kim et al.
2014/0239273 A1 8/2014 Mizutani et al.
2014/0246657 A1 9/2014 Kim et al.
2014/0291653 A1 10/2014 Ikeda et al.
2014/0299866 A1 10/2014 Ruske et al.
2014/0318596 A1 10/2014 Juluri et al.
2014/0319511 A1 10/2014 Mizuki et al.
2014/0326985 A1 11/2014 Mizuki et al.
2014/0332772 A1 11/2014 Han et al.
2014/0346406 A1 11/2014 Lee et al.
2014/0346482 A1 11/2014 Mizuki et al.
2014/0353601 A1 12/2014 Cho et al.
2014/0367654 A1 12/2014 Kim et al.
2015/0036234 A1 2/2015 Ben-Yakar et al.
2015/0090989 A1 4/2015 Matsumoto et al.
2015/0097171 A1 4/2015 Kim et al.
2015/0123086 A1 5/2015 Lee
2015/0144902 A1 5/2015 Do et al.
2015/0144909 A1 5/2015 Byun et al.
2015/0171337 A1 6/2015 Jung et al.
2015/0184104 A1 7/2015 Xu et al.
2015/0194614 A1 7/2015 Kravchuk et al.
2015/0194634 A1 7/2015 Kang et al.
2015/0200312 A1 7/2015 Watanabe et al.
2015/0228923 A1 8/2015 Schicktanz et al.
2015/0284580 A1 10/2015 Kawakami et al.
2015/0287846 A1 10/2015 Helander et al.
2015/0303336 A1 10/2015 Lefebvre et al.
2015/0333266 A1 11/2015 Ito et al.
2015/0376768 A1 12/2015 Veres et al.
2016/0005976 A1 1/2016 Mizuki et al.
2016/0013438 A1 1/2016 Im et al.
2016/0043325 A1 2/2016 Gorohmaru et al.
2016/0079543 A1 3/2016 Park et al.
2016/0099411 A1 4/2016 Kim et al.
2016/0104859 A1 4/2016 Kim et al.
2016/0116696 A1* 4/2016 Modavis ................ H10K 50/85 385/14
2016/0133846 A1 5/2016 Ishii et al.
2016/0149156 A1 5/2016 Kim et al.
2016/0155952 A1 6/2016 Hwang et al.
2016/0155979 A1 6/2016 Yim et al.
2016/0163770 A1 6/2016 Kim et al.
2016/0180763 A1 6/2016 Park et al.
2016/0181527 A1 6/2016 Mizuki et al.
2016/0181543 A1 6/2016 Ito et al.
2016/0197308 A1 7/2016 Jeong
2016/0211454 A1 7/2016 Kim et al.
2016/0211458 A1 7/2016 Ito et al.
2016/0211459 A1 7/2016 Ito et al.
2016/0222295 A1 8/2016 Lo et al.
2016/0225992 A1 8/2016 Ito et al.
2016/0233437 A1 8/2016 Suzuki et al.
2016/0240821 A1 8/2016 Carroll et al.
2016/0260901 A1 9/2016 Kim et al.
2016/0267830 A1 9/2016 Kimura
2016/0268520 A1 9/2016 Mizuki et al.
2016/0284998 A1 9/2016 Kawamura et al.
2016/0293888 A1 10/2016 Shim et al.
2016/0308137 A1 10/2016 Park et al.
2016/0308162 A1 10/2016 Yoo et al.
2016/0329521 A1 11/2016 Kim et al.
2016/0333137 A1 11/2016 Pan
2016/0351114 A1 12/2016 Lee
2016/0351638 A1 12/2016 Im et al.
2016/0351818 A1 12/2016 Kim et al.
2016/0372524 A1 12/2016 Yun et al.
2016/0380198 A1 12/2016 Mizuki et al.
2016/0380235 A1 12/2016 Kim et al.
2017/0012221 A1 1/2017 Buesing et al.
2017/0018733 A1 1/2017 Jin et al.
2017/0033166 A1 2/2017 Shim et al.
2017/0033317 A1 2/2017 Kajimoto
2017/0062755 A1 3/2017 Im et al.
2017/0090082 A1 3/2017 Cheah et al.
2017/0090083 A1 3/2017 Takishita et al.
2017/0100607 A1 4/2017 Pan et al.
2017/0104166 A1 4/2017 Jeong et al.
2017/0110689 A1 4/2017 Yang et al.
2017/0117469 A1 4/2017 Ito et al.
2017/0125495 A1 5/2017 Lee et al.
2017/0125506 A1 5/2017 Kim
2017/0125687 A1 5/2017 Ikeda et al.
2017/0125703 A1 5/2017 Suzuki et al.
2017/0155078 A1 6/2017 Lee
2017/0162111 A1 6/2017 Kang et al.
2017/0170246 A1 6/2017 Im et al.
2017/0179397 A1 6/2017 Kim et al.
2017/0179402 A1 6/2017 Kim et al.
2017/0183291 A1 6/2017 Ito et al.
2017/0186831 A1 6/2017 Nam et al.
2017/0190610 A1 7/2017 Joseph et al.
2017/0197998 A1 7/2017 Pan
2017/0220844 A1 8/2017 Jones et al.
2017/0222155 A1 8/2017 Cha et al.
2017/0222188 A1 8/2017 Lee et al.
2017/0237023 A1 8/2017 Kim et al.
2017/0256722 A1 9/2017 Shim et al.
2017/0256747 A1 9/2017 Lee et al.
2017/0279064 A1 9/2017 Wallikewitz et al.
2017/0309822 A1 10/2017 Mizuki et al.
2017/0313650 A1 11/2017 Stoessel et al.
2017/0317154 A1 11/2017 Heo
2017/0317284 A1 11/2017 Mizuki et al.
2017/0324045 A1 11/2017 Takahashi et al.
2017/0325314 A1 11/2017 Uchida et al.
2017/0330797 A1 11/2017 Lai et al.
2017/0338438 A1 11/2017 Kwon et al.
2017/0342318 A1 11/2017 Kim et al.
2017/0357139 A1 12/2017 Smith et al.
2018/0006239 A1 1/2018 Yokoyama et al.
2018/0006264 A1 1/2018 Lee et al.
2018/0006267 A1 1/2018 Sakamoto
2018/0018838 A1 1/2018 Fankhauser et al.
2018/0019398 A1 1/2018 Mizuki et al.
2018/0019408 A1 1/2018 Ko
2018/0033362 A1 2/2018 Yamazaki et al.
2018/0040685 A1 2/2018 Yeo et al.
2018/0061323 A1 3/2018 Kwon et al.
2018/0062088 A1 3/2018 Cho et al.
2018/0062104 A1 3/2018 Kwon et al.
2018/0083217 A1 3/2018 Chung et al.
2018/0090063 A1 3/2018 Ying et al.
2018/0102499 A1 4/2018 Pyo et al.
2018/0120492 A1 5/2018 Lee et al.
2018/0123054 A1 5/2018 Gorohmaru et al.
2018/0123055 A1 5/2018 Park et al.
2018/0123078 A1 5/2018 Byun et al.
2018/0127385 A1 5/2018 Jung et al.
2018/0130949 A1 5/2018 Kim et al.
2018/0145262 A1 5/2018 Zeng et al.
2018/0148586 A1 5/2018 Reichert et al.
2018/0158881 A1 6/2018 Lim et al.
2018/0166518 A1 6/2018 Kim
2018/0197927 A1 7/2018 Tan et al.
2018/0198052 A1 7/2018 Park
2018/0198076 A1 7/2018 Takahashi et al.
2018/0198080 A1 7/2018 Noh et al.
2018/0212060 A1 7/2018 Kang et al.
2018/0219058 A1 8/2018 Xiang et al.
2018/0226455 A1 8/2018 Kim et al.
2018/0240990 A1 8/2018 Choi et al.
2018/0261797 A1 9/2018 Lee
2018/0265777 A1 9/2018 Ambrosek et al.
2018/0273563 A1 9/2018 Choi et al.
2018/0294436 A1 10/2018 Choi et al.
2018/0306949 A1 10/2018 Matsumoto et al.

(56) References Cited

U.S. PATENT DOCUMENTS

2018/0309071 A1 10/2018 Jeon et al.
2018/0309073 A1 10/2018 Nakamura et al.
2018/0309085 A1 10/2018 Park et al.
2018/0315934 A1 11/2018 Nakata et al.
2018/0315936 A1 11/2018 Hirade et al.
2018/0323377 A1 11/2018 Mizuki et al.
2018/0337219 A1 11/2018 Rhee et al.
2018/0340032 A1 11/2018 Campbell et al.
2018/0342682 A1 11/2018 Park et al.
2018/0349665 A1 12/2018 He
2018/0366678 A1 12/2018 Chi et al.
2019/0013342 A1 1/2019 Kato et al.
2019/0036032 A1 1/2019 Denker et al.
2019/0081111 A1 3/2019 Lee et al.
2019/0088204 A1 3/2019 Zhang et al.
2019/0106611 A1 4/2019 Yang et al.
2019/0127328 A1 5/2019 Orimoto et al.
2019/0130822 A1 5/2019 Jung et al.
2019/0131365 A1 5/2019 Jung
2019/0135827 A1 5/2019 Altenbach et al.
2019/0148666 A1 5/2019 Li et al.
2019/0157620 A1 5/2019 Forrest et al.
2019/0207132 A1 7/2019 Park et al.
2019/0207156 A1 7/2019 Gil
2019/0219875 A1 7/2019 Jung et al.
2019/0237517 A1 8/2019 Hack
2019/0250450 A1 8/2019 Li
2019/0253591 A1 8/2019 Chen et al.
2019/0273125 A1 9/2019 Takechi
2019/0280026 A1 9/2019 Takeuchi
2019/0317629 A1 10/2019 Jung et al.
2019/0325805 A1 10/2019 Moon et al.
2019/0340980 A1 11/2019 Yum et al.
2019/0341435 A1 11/2019 Chang et al.
2019/0341575 A1 11/2019 Chung et al.
2019/0348627 A1 11/2019 Lee et al.
2019/0355288 A1 11/2019 Choi et al.
2019/0363156 A1 11/2019 Ohara et al.
2019/0386242 A1 12/2019 Choi et al.
2020/0035951 A1 1/2020 Cheon et al.
2020/0041709 A1 2/2020 Lee et al.
2020/0044197 A1 2/2020 Shedletsky et al.
2020/0064968 A1 2/2020 Kim et al.
2020/0075683 A1 3/2020 Polyakov et al.
2020/0075693 A1 3/2020 Polyakov et al.
2020/0075864 A1 3/2020 Helander et al.
2020/0099836 A1 3/2020 Chao
2020/0105843 A1 4/2020 Baek et al.
2020/0111401 A1 4/2020 Zhao et al.
2020/0124927 A1 4/2020 Kim et al.
2020/0133040 A1 4/2020 Bang et al.
2020/0136077 A1 4/2020 Lee et al.
2020/0144429 A1 5/2020 Naughton et al.
2020/0159284 A1 5/2020 Mathew et al.
2020/0176530 A1 6/2020 Baek
2020/0194676 A1 6/2020 Chang et al.
2020/0194730 A1 6/2020 Park et al.
2020/0209729 A1 7/2020 Chen et al.
2020/0212130 A1 7/2020 Kim et al.
2020/0212131 A1 7/2020 Kim et al.
2020/0219915 A1 7/2020 Kim et al.
2020/0231437 A1 7/2020 Enomura et al.
2020/0236259 A1 7/2020 Nakamura et al.
2020/0243622 A1 7/2020 Chung et al.
2020/0265798 A1 8/2020 Choi et al.
2020/0280017 A1 9/2020 Helander et al.
2020/0286972 A1 9/2020 Seo et al.
2020/0295093 A1 9/2020 Thompson et al.
2020/0295293 A1 9/2020 Menon et al.
2020/0295307 A1 9/2020 Fusella et al.
2020/0312926 A1 10/2020 Bae et al.
2020/0328366 A1 10/2020 Layton et al.
2020/0357871 A1 11/2020 Chung et al.
2020/0363894 A1 11/2020 Park et al.
2020/0365664 A1 11/2020 Jeon et al.
2020/0365667 A1 11/2020 Jo et al.
2020/0365674 A1 11/2020 Jeon et al.
2020/0381489 A1 12/2020 Hwang et al.
2020/0388791 A1 12/2020 Zhang et al.
2020/0394964 A1 12/2020 Hyun et al.
2020/0395430 A1 12/2020 Jeong et al.
2020/0403024 A1 12/2020 Lin et al.
2020/0409412 A1 12/2020 Kim et al.
2020/0411605 A1 12/2020 Moon et al.
2020/0411606 A1 12/2020 Kim et al.
2021/0013273 A1 1/2021 Jeong et al.
2021/0018805 A1 1/2021 Baek et al.
2021/0020704 A1 1/2021 Kim
2021/0028244 A1 1/2021 Jeong et al.
2021/0028248 A1 1/2021 Kim et al.
2021/0036070 A1 2/2021 Jeon et al.
2021/0043875 A1 2/2021 Lee et al.
2021/0056884 A1 2/2021 Choi et al.
2021/0057494 A1 2/2021 Chung et al.
2021/0057496 A1 2/2021 Bae et al.
2021/0065620 A1 3/2021 Yang et al.
2021/0066648 A1 3/2021 Chung et al.
2021/0066661 A1 3/2021 Kim et al.
2021/0083019 A1 3/2021 Jang et al.
2021/0091157 A1 3/2021 Oh et al.
2021/0107825 A1* 4/2021 Zhang .................... C03C 1/004
2021/0118961 A1 4/2021 Lee et al.
2021/0126059 A1 4/2021 Chang et al.
2021/0134901 A1 5/2021 Sung et al.
2021/0134926 A1 5/2021 Song
2021/0143231 A1 5/2021 Chae et al.
2021/0143244 A1 5/2021 Kim et al.
2021/0151544 A1 5/2021 Kim et al.
2021/0167320 A1 6/2021 Kim et al.
2021/0175297 A1 6/2021 Kim
2021/0175298 A1 6/2021 Park
2021/0183983 A1 6/2021 Bang et al.
2021/0183986 A1 6/2021 Shin et al.
2021/0183991 A1 6/2021 Shin et al.
2021/0184155 A1 6/2021 Chae et al.
2021/0191552 A1 6/2021 Bok et al.
2021/0193688 A1 6/2021 Shin et al.
2021/0193765 A1 6/2021 Kim et al.
2021/0193769 A1 6/2021 Bok et al.
2021/0193781 A1 6/2021 Shim et al.
2021/0200366 A1 7/2021 Bok et al.
2021/0202532 A1 7/2021 Kim et al.
2021/0202595 A1 7/2021 Lee et al.
2021/0202617 A1 7/2021 Cho
2021/0202628 A1 7/2021 Kim et al.
2021/0202641 A1 7/2021 Shin et al.
2021/0202680 A1 7/2021 Shin et al.
2021/0202683 A1 7/2021 Lee et al.
2021/0202880 A1 7/2021 Kim et al.
2021/0210564 A1 7/2021 Chae et al.
2021/0210584 A1 7/2021 Youn et al.
2021/0225292 A1 7/2021 Park et al.
2021/0225958 A1 7/2021 Ko et al.
2021/0225970 A1 7/2021 Ryu et al.
2021/0233976 A1 7/2021 Lee
2021/0240026 A1 8/2021 Yeke Yazdandoost et al.
2021/0241671 A1 8/2021 Lee et al.
2021/0241719 A1 8/2021 Choi et al.
2021/0249492 A1 8/2021 Choi et al.
2021/0249633 A1 8/2021 Fusella et al.
2021/0249635 A1 8/2021 Cho et al.
2021/0257419 A1 8/2021 Jang et al.
2021/0257594 A1 8/2021 Kim et al.
2021/0265431 A1 8/2021 Yun et al.
2021/0280825 A1 9/2021 Beon et al.
2021/0305537 A1 9/2021 Song et al.
2021/0313410 A1 10/2021 Kim et al.
2021/0320278 A1 10/2021 Chung et al.
2021/0351261 A1 11/2021 Kim et al.
2021/0359025 A1 11/2021 Jung et al.
2021/0371967 A1 12/2021 Varagnolo et al.
2021/0376007 A1 12/2021 Choi et al.
2021/0376300 A1 12/2021 Moon et al.
2021/0376301 A1 12/2021 Kim et al.

(56) References Cited

U.S. PATENT DOCUMENTS

| | | | |
|---|---|---|---|
| 2021/0408167 | A1 | 12/2021 | Kim et al. |
| 2022/0013749 | A1 | 1/2022 | Kim et al. |
| 2022/0025134 | A1 | 1/2022 | Wehrmann et al. |
| 2022/0045144 | A1 | 2/2022 | Lee et al. |
| 2022/0045160 | A1 | 2/2022 | Lee et al. |
| 2022/0052125 | A1 | 2/2022 | Choi et al. |
| 2022/0052291 | A1 | 2/2022 | Lee et al. |
| 2022/0068830 | A1 | 3/2022 | Lee et al. |
| 2022/0069048 | A1 | 3/2022 | Bok et al. |
| 2022/0085326 | A1 | 3/2022 | Chai et al. |
| 2022/0093697 | A1 | 3/2022 | Hong et al. |
| 2022/0102446 | A1 | 3/2022 | Baek et al. |
| 2022/0106477 | A1 | 4/2022 | Lee et al. |
| 2022/0123081 | A1 | 4/2022 | Park et al. |
| 2022/0123260 | A1 | 4/2022 | Chung et al. |
| 2022/0149316 | A1 | 5/2022 | Kim et al. |
| 2022/0223667 | A1 | 7/2022 | Choi et al. |
| 2022/0225006 | A1 | 7/2022 | Allec et al. |
| 2022/0271254 | A1 | 8/2022 | Ran et al. |
| 2022/0372180 | A1 | 11/2022 | Abe et al. |
| 2022/0382067 | A1 | 12/2022 | Mermillod-Anselme et al. |
| 2022/0392963 | A1 | 12/2022 | Chen et al. |
| 2022/0398759 | A1 | 12/2022 | Schindler et al. |
| 2022/0415871 | A1 | 12/2022 | Steckel |
| 2023/0008148 | A1 | 1/2023 | Hyun et al. |
| 2023/0022628 | A1 | 1/2023 | Abe et al. |
| 2023/0043940 | A1 | 2/2023 | Bae et al. |
| 2023/0048617 | A1 | 2/2023 | Kim et al. |
| 2023/0053320 | A1 | 2/2023 | Park et al. |
| 2023/0057334 | A1 | 2/2023 | Yang et al. |
| 2023/0065135 | A1 | 3/2023 | Kim et al. |
| 2023/0087411 | A1 | 3/2023 | Niu et al. |
| 2023/0087691 | A1 | 3/2023 | Chen et al. |
| 2023/0094087 | A1 | 3/2023 | Ji et al. |
| 2023/0094620 | A1 | 3/2023 | Lee et al. |
| 2023/0103050 | A1 | 3/2023 | Lee et al. |
| 2023/0105374 | A1 | 4/2023 | Jeong et al. |
| 2023/0112955 | A1 | 4/2023 | Lee et al. |
| 2023/0113586 | A1 | 4/2023 | Hong et al. |
| 2023/0117800 | A1 | 4/2023 | Kim et al. |
| 2023/0143745 | A1 | 5/2023 | Lee et al. |
| 2023/0152640 | A1 | 5/2023 | Woo et al. |
| 2023/0157052 | A1 | 5/2023 | Kim et al. |
| 2023/0157103 | A1 | 5/2023 | Lee et al. |
| 2023/0165050 | A1 | 5/2023 | Bok et al. |
| 2023/0172026 | A1 | 6/2023 | Lee |
| 2023/0172053 | A1 | 6/2023 | Ko et al. |
| 2023/0172553 | A1 | 6/2023 | An et al. |
| 2023/0184938 | A1 | 6/2023 | Hannan et al. |
| 2023/0189547 | A1 | 6/2023 | Lee et al. |
| 2023/0189616 | A1 | 6/2023 | Kim et al. |
| 2023/0200196 | A1 | 6/2023 | Sung et al. |
| 2023/0209891 | A1 | 6/2023 | Ma |
| 2023/0216209 | A1 | 7/2023 | Chang et al. |
| 2023/0226643 | A1 | 7/2023 | Kim et al. |
| 2023/0258785 | A1 | 8/2023 | Mandai et al. |
| 2023/0276675 | A1 | 8/2023 | Jing |
| 2023/0284481 | A1 | 9/2023 | Kim et al. |
| 2023/0288252 | A1 | 9/2023 | Eaton et al. |
| 2023/0292549 | A1 | 9/2023 | Seo et al. |
| 2023/0292573 | A1 | 9/2023 | Lee et al. |
| 2023/0320178 | A1 | 10/2023 | Park et al. |
| 2023/0329035 | A1 | 10/2023 | Yun et al. |
| 2023/0413649 | A1 | 12/2023 | Helander et al. |
| 2024/0065082 | A1 | 2/2024 | Wang et al. |
| 2024/0122065 | A1 | 4/2024 | Matsumoto et al. |

FOREIGN PATENT DOCUMENTS

| | | | |
|---|---|---|---|
| CA | 2890253 | A1 | 5/2014 |
| CN | 1284508 | A | 2/2001 |
| CN | 1460682 | A | 12/2003 |
| CN | 1695257 | A | 11/2005 |
| CN | 1866572 | A | 11/2006 |
| CN | 1866575 | A | 11/2006 |
| CN | 1961436 | A | 5/2007 |
| CN | 101299419 | A | 11/2008 |
| CN | 100526288 | C | 8/2009 |
| CN | 101617064 | A | 12/2009 |
| CN | 101730938 | A | 6/2010 |
| CN | 101932618 | A | 12/2010 |
| CN | 102099942 | A | 6/2011 |
| CN | 1625552 | B | 9/2011 |
| CN | 1696124 | B | 2/2012 |
| CN | 1784388 | B | 2/2012 |
| CN | 102455215 | A | 5/2012 |
| CN | 102456713 | A | 5/2012 |
| CN | 102618042 | | 8/2012 |
| CN | 102738409 | A | 10/2012 |
| CN | 101812021 | B | 12/2012 |
| CN | 102352090 | B | 4/2013 |
| CN | 101267022 | B | 8/2014 |
| CN | 103992481 | A | 8/2014 |
| CN | 104037359 | A | 9/2014 |
| CN | 104103766 | A | 10/2014 |
| CN | 104347803 | A | 2/2015 |
| CN | 104769149 | A | 7/2015 |
| CN | 101503393 | B | 8/2015 |
| CN | 204651324 | U | 9/2015 |
| CN | 105094451 | A | 11/2015 |
| CN | 105097877 | A | 11/2015 |
| CN | 105206650 | A | 12/2015 |
| CN | 105206753 | A | 12/2015 |
| CN | 105580144 | A | 5/2016 |
| CN | 105720207 | A | 6/2016 |
| CN | 103843153 | B | 7/2016 |
| CN | 106206995 | A | 12/2016 |
| CN | 106317025 | A | 1/2017 |
| CN | 104672458 | B | 2/2017 |
| CN | 103788087 | B | 5/2017 |
| CN | 104558016 | B | 6/2017 |
| CN | 106946859 | A | 7/2017 |
| CN | 106992267 | A | 7/2017 |
| CN | 107021986 | A | 8/2017 |
| CN | 107273826 | A | 10/2017 |
| CN | 107424955 | A | 12/2017 |
| CN | 107522744 | A | 12/2017 |
| CN | 107564945 | A | 1/2018 |
| CN | 107573329 | A | 1/2018 |
| CN | 107573485 | A | 1/2018 |
| CN | 107573582 | A | 1/2018 |
| CN | 107808895 | A | 3/2018 |
| CN | 107946480 | A | 4/2018 |
| CN | 105849930 | B | 6/2018 |
| CN | 105671525 | B | 8/2018 |
| CN | 108364967 | A | 8/2018 |
| CN | 108376019 | A | 8/2018 |
| CN | 108389878 | A | 8/2018 |
| CN | 108418928 | A | 8/2018 |
| CN | 108431981 | A | 8/2018 |
| CN | 105359289 | B | 9/2018 |
| CN | 108496098 | A | 9/2018 |
| CN | 108496260 | A | 9/2018 |
| CN | 108630830 | A | 10/2018 |
| CN | 108767136 | A | 11/2018 |
| CN | 108881531 | A | 11/2018 |
| CN | 108900659 | A | 11/2018 |
| CN | 106189093 | B | 12/2018 |
| CN | 109119446 | B | 1/2019 |
| CN | 109299631 | A | 2/2019 |
| CN | 106046688 | B | 3/2019 |
| CN | 109461758 | A | 3/2019 |
| CN | 109585663 | A | 4/2019 |
| CN | 109599030 | A | 4/2019 |
| CN | 109742132 | A | 5/2019 |
| CN | 109817672 | A | 5/2019 |
| CN | 109817694 | A | 5/2019 |
| CN | 109830495 | A | 5/2019 |
| CN | 109920931 | A | 6/2019 |
| CN | 109950293 | A | 6/2019 |
| CN | 110061014 | A | 7/2019 |
| CN | 110071150 | B | 7/2019 |
| CN | 209087844 | U | 7/2019 |
| CN | 110112182 | A | 8/2019 |

(56) References Cited

FOREIGN PATENT DOCUMENTS

CN 110144551 A 8/2019
CN 110265474 A 9/2019
CN 110275358 A 9/2019
CN 110277505 A 9/2019
CN 110301053 A 10/2019
CN 110323259 A 10/2019
CN 110365819 A 10/2019
CN 110391348 A 10/2019
CN 110416269 A 11/2019
CN 110429117 A 11/2019
CN 110444125 A 11/2019
CN 110459175 A 11/2019
CN 110473898 A 11/2019
CN 110473988 A 11/2019
CN 110491910 A 11/2019
CN 110491917 A 11/2019
CN 110491918 A 11/2019
CN 110492018 A 11/2019
CN 110518034 A 11/2019
CN 110570774 A 12/2019
CN 110619813 A 12/2019
CN 110620129 A 12/2019
CN 110634930 A 12/2019
CN 110649179 A 1/2020
CN 110660823 A 1/2020
CN 110676296 A 1/2020
CN 110718580 A 1/2020
CN 110727142 A 1/2020
CN 110752249 A 2/2020
CN 110767662 A 2/2020
CN 110767682 A 2/2020
CN 110767708 A 2/2020
CN 110767709 A 2/2020
CN 110767713 A 2/2020
CN 110767720 A 2/2020
CN 110767736 A 2/2020
CN 110767739 A 2/2020
CN 110767830 A 2/2020
CN 110767835 A 2/2020
CN 110767836 A 2/2020
CN 110767844 A 2/2020
CN 110780375 A 2/2020
CN 110782807 B 2/2020
CN 110783384 A 2/2020
CN 110783390 A 2/2020
CN 110783394 A 2/2020
CN 110783484 A 2/2020
CN 110783485 A 2/2020
CN 110783486 A 2/2020
CN 110785867 A 2/2020
CN 110828533 A 2/2020
CN 110828699 A 2/2020
CN 110832660 A 2/2020
CN 110854176 A 2/2020
CN 210052743 U 2/2020
CN 110867523 A 3/2020
CN 110867527 A 3/2020
CN 110890412 A 3/2020
CN 110914891 A 3/2020
CN 110923625 A 3/2020
CN 110928453 A 3/2020
CN 110931538 A 3/2020
CN 110943116 A 3/2020
CN 107887404 B 4/2020
CN 110956925 A 4/2020
CN 110970480 A 4/2020
CN 110989861 A 4/2020
CN 111009619 A 4/2020
CN 111020489 A 4/2020
CN 111028678 A 4/2020
CN 111029381 A 4/2020
CN 111029382 A 4/2020
CN 111029391 A 4/2020
CN 111046599 A 4/2020
CN 111048564 A 4/2020
CN 111063717 A 4/2020
CN 210272432 U 4/2020
CN 111129100 A 5/2020
CN 111129102 A 5/2020
CN 111142180 A 5/2020
CN 111155055 A 5/2020
CN 111180490 A 5/2020
CN 111192902 A 5/2020
CN 210467844 U 5/2020
CN 210575958 U 5/2020
CN 111046599 B 6/2020
CN 111223908 A 6/2020
CN 111261104 A 6/2020
CN 111261641 A 6/2020
CN 111292617 A 6/2020
CN 111293233 A 6/2020
CN 111293235 A 6/2020
CN 111293236 A 6/2020
CN 111312795 A 6/2020
CN 111341936 A 6/2020
CN 112928147 A 6/2020
CN 210668382 U 6/2020
CN 111383543 A 7/2020
CN 111383579 A 7/2020
CN 111403621 A 7/2020
CN 111435952 A 7/2020
CN 111435953 A 7/2020
CN 111490069 A 8/2020
CN 111524460 A 8/2020
CN 111524469 A 8/2020
CN 111554716 A 8/2020
CN 111584725 A 8/2020
CN 111584748 A 8/2020
CN 109449178 B 9/2020
CN 111640882 A 9/2020
CN 111668240 A 9/2020
CN 111682055 A 9/2020
CN 111682120 A 9/2020
CN 111710798 A 9/2020
CN 111725288 A 9/2020
CN 111739921 A 10/2020
CN 111739924 A 10/2020
CN 111755493 A 10/2020
CN 111755623 A 10/2020
CN 111799374 A 10/2020
CN 111834547 A 10/2020
CN 111862875 A 10/2020
CN 111863900 A 10/2020
CN 111863911 A 10/2020
CN 110783484 B 11/2020
CN 111883559 A 11/2020
CN 111883560 A 11/2020
CN 111900190 A 11/2020
CN 111987120 A 11/2020
CN 112002749 A 11/2020
CN 110783386 B 12/2020
CN 112037704 A 12/2020
CN 112054048 A 12/2020
CN 112071886 A 12/2020
CN 112071887 A 12/2020
CN 112103318 A 12/2020
CN 112159594 A 1/2021
CN 112234082 A 1/2021
CN 112271263 A 1/2021
CN 112310325 A 2/2021
CN 112382651 A 2/2021
CN 112420618 A 2/2021
CN 108807487 B 3/2021
CN 109728048 B 3/2021
CN 109860237 B 3/2021
CN 112436029 A 3/2021
CN 112436030 A 3/2021
CN 112436031 A 3/2021
CN 112436032 A 3/2021
CN 112562518 A 3/2021
CN 112635533 A 4/2021
CN 112687193 A 4/2021
CN 111192902 B 5/2021
CN 112838115 A 5/2021

(56) References Cited

FOREIGN PATENT DOCUMENTS

CN 112861763 A 5/2021
CN 112864186 A 5/2021
CN 112864211 A 5/2021
CN 112864216 A 5/2021
CN 112864338 A 5/2021
CN 112885876 A 6/2021
CN 112885976 A 6/2021
CN 112928149 A 6/2021
CN 112928225 A 6/2021
CN 112951878 A 6/2021
CN 112952021 A 6/2021
CN 112992991 A 6/2021
CN 113013360 A 6/2021
CN 113053978 A 6/2021
CN 113053985 A 6/2021
CN 113054133 A 6/2021
CN 113054134 A 6/2021
CN 113066940 A 7/2021
CN 113077749 A 7/2021
CN 113078199 A 7/2021
CN 113096581 A 7/2021
CN 113126825 A 7/2021
CN 111341817 B 8/2021
CN 113241367 A 8/2021
CN 113327972 A 8/2021
CN 113327973 A 8/2021
CN 113383611 A 9/2021
CN 113394261 A 9/2021
CN 113416925 A 9/2021
CN 113497206 A 10/2021
CN 113629205 A 11/2021
CN 113629207 A 11/2021
CN 113629208 A 11/2021
CN 113745271 A 12/2021
CN 113745433 A 12/2021
CN 109970981 B 4/2022
CN 110265702 B 6/2022
CN 114665036 A 6/2022
CN 114975812 A 8/2022
CN 112234082 B 11/2022
DE 19748109 A1 5/1999
EP 0 375 967 B1 3/1994
EP 0 357 360 B1 6/1994
EP 0 464 959 B1 12/1995
EP 1 465 874 A2 10/2004
EP 1 213 337 B1 11/2005
EP 1 816 114 A1 8/2007
EP 1 850 368 A1 10/2007
EP 1 873 162 A1 1/2008
EP 1 299 913 B1 3/2010
EP 2 180 029 A1 4/2010
EP 2 202 283 A1 6/2010
EP 1 602 648 B1 4/2013
EP 2 028 249 B1 5/2013
EP 1 621 597 B1 9/2013
EP 2 722 350 A1 4/2014
EP 1 834 945 B1 7/2014
EP 2 270 897 B1 12/2014
EP 1 009 044 B1 7/2015
EP 2 473 564 B1 2/2016
EP 2 998 997 A1 3/2016
EP 2 197 979 B1 12/2016
EP 3 182 477 A1 6/2017
EP 3 185 325 A1 6/2017
EP 2 248 849 B1 7/2017
EP 3 240 036 A1 11/2017
EP 3 316 311 A1 5/2018
EP 3 331 045 A1 6/2018
EP 3 336 899 A1 6/2018
EP 2 434 558 B1 7/2018
EP 3 396 728 A1 10/2018
EP 3 406 752 A1 11/2018
EP 3 499 576 A1 6/2019
EP 3 703 147 A1 9/2020
EP 3 149 012 B1 10/2020
EP 3 731 293 A1 10/2020
GB 1 096 600 A 12/1967
GB 1 188 212 A 4/1970
GB 2 018 17037 12/2018
IN 229083 B 8/2007
JP 08-175813 A 7/1996
JP H08-175813 A 7/1996
JP 2001-352011 A 12/2001
JP 2002-212163 A 7/2002
JP 2003-068470 A 3/2003
JP 2003-306595 A 10/2003
JP 2004-079422 A 3/2004
JP 3588978 B2 11/2004
JP 2004-352815 A 12/2004
JP 2005-041843 A 2/2005
JP 2006-100186 A 4/2006
JP 2006-156390 A 6/2006
JP 2006-202872 A 8/2006
JP 2006-277973 A 10/2006
JP 2006-278549 A 10/2006
JP 2007-188854 A 7/2007
JP 2007-245113 A 9/2007
JP 4025111 B2 12/2007
JP 4025136 B2 12/2007
JP 4025137 B2 12/2007
JP 2008-133263 A 6/2008
JP 2008-210665 A 9/2008
JP 4185097 B2 11/2008
JP 2008-291006 A 12/2008
JP 2009-065220 A 3/2009
JP 2009-182354 8/2009
JP 4308663 B2 8/2009
JP 2009-535813 A 10/2009
JP 2009-277507 A 11/2009
JP 2010-072616 A 4/2010
JP 2010-152072 A 7/2010
JP 2010-258410 A 11/2010
JP 4655790 B2 3/2011
JP 2011-173972 A 9/2011
JP 2011-210677 A 10/2011
JP 4846982 B2 12/2011
JP 2012-044125 A 3/2012
JP 4970934 B2 7/2012
JP 4972844 B2 7/2012
JP 2012-253015 A 12/2012
JP 2012-531426 A 12/2012
JP 5093879 B2 12/2012
JP 2013-026300 A 2/2013
JP 5166961 B2 3/2013
JP 5198657 B2 5/2013
JP 5233074 B2 7/2013
JP 2013-173771 A 9/2013
JP 2013-189321 A 9/2013
JP 2013-219278 A 10/2013
JP 5381748 B2 1/2014
JP 2014-032851 A 2/2014
JP 2014-517999 A 7/2014
JP 5572134 B2 8/2014
JP 2014-240374 A 12/2014
JP 5645849 B2 12/2014
JP 2015-023023 A 2/2015
JP 2015-099773 A 5/2015
JP 2015-103525 A 6/2015
JP 5749870 B1 7/2015
JP 2015-159164 A 9/2015
JP 2016-039249 A 3/2016
JP 2017-503317 A 1/2017
JP 2017-162616 A 9/2017
JP 2018-006115 A 1/2018
JP 2019-507899 A 3/2019
JP 2019-508733 A 3/2019
JP 2019-096439 A 6/2019
JP 2019-536249 A 12/2019
JP 2020-518107 6/2020
JP 2020-520076 A 7/2020
JP 6786081 B2 11/2020
JP 2022-537479 A 8/2022
JP 7135919 B2 9/2022
JP 2022-153102 A 10/2022

(56) References Cited

FOREIGN PATENT DOCUMENTS

JP 7222320 B2 2/2023
JP 2023-544281 A 10/2023
KR 100691543 B1 3/2007
KR 100826364 B1 5/2008
KR 100858816 B1 9/2008
KR 20090128427 A 12/2009
KR 1020090128427 A 12/2009
KR 20100041043 A 4/2010
KR 1020100041043 A 4/2010
KR 20100054630 A 5/2010
KR 1020100054630 A 5/2010
KR 20100066424 A 6/2010
KR 20100069216 A 6/2010
KR 1020100066424 A 6/2010
KR 1020100069216 A 6/2010
KR 20100123735 A 11/2010
KR 1020100123735 A 11/2010
KR 100998838 B1 12/2010
KR 101020350 B1 3/2011
KR 101036391 B1 5/2011
KR 20110123701 A 11/2011
KR 1020110123701 A 11/2011
KR 20120067644 A 6/2012
KR 20130077276 A 7/2013
KR 1020130077276 A 7/2013
KR 101317511 B1 10/2013
KR 20140062258 A 5/2014
KR 1020140062258 A 5/2014
KR 20140126108 A 10/2014
KR 1020140126108 A 10/2014
KR 101530266 B1 6/2015
KR 20150103510 A 9/2015
KR 1020150103510 A 9/2015
KR 101561479 B1 10/2015
KR 20150120906 A 10/2015
KR 1020150120906 A 10/2015
KR 20150127368 A 11/2015
KR 1020150127368 A 11/2015
KR 101640772 B1 7/2016
KR 101661925 B1 10/2016
KR 20170024182 A 3/2017
KR 20170030168 A 3/2017
KR 1020170024182 A 3/2017
KR 1020170030168 A 3/2017
KR 20170075865 A 7/2017
KR 1020170075865 A 7/2017
KR 1020180075589 A 7/2018
KR 20180115655 A 10/2018
KR 1020180115655 A 10/2018
KR 20180121304 A 11/2018
KR 1020180121304 A 11/2018
KR 20190020930 A 3/2019
KR 1020190020930 A 3/2019
KR 1020190086756 A 7/2019
KR 102028264 B1 10/2019
KR 10-20200037025 A 4/2020
KR 20200126463 A 11/2020
KR 1020200126463 A 11/2020
KR 20210002829 A 1/2021
KR 1020210002829 A 1/2021
KR 20210075549 A 6/2021
KR 20210079850 A 6/2021
KR 1020210075549 A 6/2021
KR 1020210079850 A 6/2021
KR 20210083043 A 7/2021
KR 20210084869 A 7/2021
KR 20210085263 A 7/2021
KR 20210086033 A 7/2021
KR 1020210083043 A 7/2021
KR 1020210084869 A 7/2021
KR 1020210085263 A 7/2021
KR 1020210086033 A 7/2021
KR 1020210095913 A 8/2021
KR 10-20220090181 A 6/2022
KR 1020220135161 A 10/2022
TW I227655 B 2/2005
TW 201105775 A 2/2011
TW I363054 B 5/2012
TW I485137 B 5/2015
TW I499653 B 9/2015
TW 201819593 A 6/2018
TW 201929219 A 7/2019
WO WO-98/18804 A1 5/1998
WO WO-99/17892 A1 4/1999
WO WO-00/71647 A1 11/2000
WO WO-02/096913 A1 12/2002
WO WO-2004/083295 A1 9/2004
WO WO-2006/070711 A1 7/2006
WO WO-2006/070712 A1 7/2006
WO WO-2006/093193 A1 9/2006
WO WO-2008/069586 A1 6/2008
WO WO-2008/105294 A1 9/2008
WO WO-2009/102054 A1 8/2009
WO WO-2010/094378 A1 8/2010
WO WO-2010/114256 A2 10/2010
WO WO-2010/114263 A2 10/2010
WO WO-2010/122810 A1 10/2010
WO WO-2010/134350 A1 11/2010
WO WO-2010/151006 A1 12/2010
WO WO-2011/012212 A1 2/2011
WO WO-2011/027276 A1 3/2011
WO WO-2011/042374 A1 4/2011
WO WO-2011/049284 A1 4/2011
WO WO-2011/074252 A1 6/2011
WO WO-2011/074253 A1 6/2011
WO WO-2011/107417 A1 9/2011
WO WO-2011/115378 A1 9/2011
WO WO-2011/129096 A1 10/2011
WO WO-2011/136379 A1 11/2011
WO WO-2012/070535 A1 5/2012
WO WO-2013/109030 A1 7/2013
WO WO-2013/100724 A4 10/2013
WO WO-2013/152446 A1 10/2013
WO WO-2013/180456 A1 12/2013
WO WO-2013/183851 A1 12/2013
WO WO-2013/187007 A1 12/2013
WO WO-2014/024880 A1 2/2014
WO WO-2014/025317 A1 2/2014
WO WO-2014/031360 A1 2/2014
WO WO-2014/071518 A1 5/2014
WO WO-2014/104144 A1 7/2014
WO WO-2014/163228 A1 10/2014
WO WO-2015/005440 A1 1/2015
WO WO-2015/033559 A1 3/2015
WO WO-2015/041352 A1 3/2015
WO WO-2016/042098 A1 3/2016
WO WO-2016/042781 A1 3/2016
WO WO-2016/056364 A1 4/2016
WO WO-2017/072678 A1 5/2017
WO WO-2017/100944 A1 6/2017
WO WO-2018/100559 A1 6/2018
WO WO-2018/103747 A1 6/2018
WO WO-2018/206575 A1 11/2018
WO WO-2018/211460 A1 11/2018
WO WO-2018/216545 A1 11/2018
WO WO-2018198052 A1 * 11/2018 ......... H10K 59/1795
WO WO-2019/002198 A1 1/2019
WO WO-2019/006749 A1 1/2019
WO WO-2019/047126 A1 3/2019
WO WO-2019/062221 A1 4/2019
WO WO-2019/062236 A1 4/2019
WO WO-2019/088594 A2 5/2019
WO WO-2019/102661 A1 5/2019
WO WO-2019/113490 A1 6/2019
WO WO-2019/141198 A1 7/2019
WO WO-2019/147012 A1 8/2019
WO WO-2019/150327 A1 8/2019
WO WO-2019/178782 A1 9/2019
WO WO-2019/199131 A1 10/2019
WO WO-2019/199139 A1 10/2019
WO WO-2019/199693 A1 10/2019
WO WO-2019/200862 A1 10/2019
WO WO-2019/215591 A1 11/2019
WO WO-2019/215630 A2 11/2019

(56) References Cited

FOREIGN PATENT DOCUMENTS

WO WO-2019/233298 A1 12/2019
WO WO-2019/242510 A1 12/2019
WO WO-2020/029559 A1 2/2020
WO WO-2020/029612 A1 2/2020
WO WO-2020/029621 A1 2/2020
WO WO-2020/045262 A1 3/2020
WO WO-2020/052232 A1 3/2020
WO WO-2020/057208 A1 3/2020
WO WO-2020/079456 A1 4/2020
WO WO-2020/092266 A1 5/2020
WO WO-2020/105015 A1 5/2020
WO WO-2020/134914 A1 7/2020
WO WO-2020/178804 A 9/2020
WO WO-2020/191889 A1 10/2020
WO WO-2020/192051 A1 10/2020
WO WO-2020/195917 A1 10/2020
WO WO-2020/199445 A1 10/2020
WO WO-2020/212953 A1 10/2020
WO WO-2020/219267 A1 10/2020
WO WO-2020/221633 A1 11/2020
WO WO-2020/225778 A1 11/2020
WO WO-2020/226383 A1 11/2020
WO WO-2020/232692 A1 11/2020
WO WO-2020/243740 A1 12/2020
WO WO-2020/261191 A1 12/2020
WO WO-2021/012400 A1 1/2021
WO WO-2021/017320 A1 2/2021
WO WO-2021/055547 A2 3/2021
WO WO-2021/079927 A1 4/2021
WO WO-2021/088953 A1 5/2021
WO WO-2021/120761 A1 6/2021
WO WO-2021/233773 A1 11/2021
WO WO-2021/250643 A1 12/2021
WO WO-2022/035527 A1 2/2022
WO WO-2022/097043 A1 5/2022
WO WO-2022/101429 A1 5/2022
WO WO-2022/192005 A1 9/2022
WO WO-2022/203222 A1 9/2022
WO WO-2022/203276 A1 9/2022
WO WO-2022/203323 A1 9/2022
WO WO-2022/229208 A1 11/2022
WO WO-2023/278000 A1 1/2023
WO WO-2023/013697 A1 2/2023
WO WO-2023/043579 A1 3/2023
WO WO-2023/156317 A1 8/2023
WO WO-2023/156449 A1 8/2023

OTHER PUBLICATIONS

Foreign Office Action on Japanese Appl. No. 2022-576446 dated Oct. 8, 2025 (4 pages, with English translation).

"PubChem Substructure Fingerprint v1.3." retrieved from https://ftp.ncbi.nlm.nih.gov/pubchem/specifications/pubchem_fingerprints.pdf.

Abraham, Michael H., et al. "Determination of molar refractions and Abraham descriptors for tris (acetylacetonato)chromium(III), tris (acetylacetonato)iron(III) and tris (acetylacetonato)cobalt(III)." New Journal of Chemistry 41.23 (2017): 14259-14265.

Abroshan, H. et al. "66-3: Active Learning for the Design of Novel OLED Materials." SID Symposium Digest of Technical Papers. 53.1 (2022).

Adams, R. O., A. Digiallonardo, and C. W. Nordin. "Films of rare earth oxides formed by electron beam evaporation." Thin Solid Films 154.1-2 (1987): 101-108.

Aftab, Alina. "Sintering Behavior, Structural, and Catalytic Properties of Ytterbium Oxide (Yb2O3)." (2019).

Ahn, J. K., et al., "Vapor-phase deposition-based self-assembled monolayer for an electrochemical sensing platform", AIP Advances, 2020, 10(4), 045213.

Ai, Lianghui, et al. "Synthesis and flame retardant properties of cyclophosphazene derivatives containing boron." Polymer Degradation and Stability 155 (2018): 250-261.

Akada, Misaho, et al. "Superconducting phase sequence in RxC60 fullerides (R= Sm and Yb)." Physical Review B 73.9 (2006): 094509.

Akada, Misaho, et al. "Superconductivity appearing from C60 doped with rare-earth metals." Science and Technology of Advanced Materials 7.S1 (2006): S83.

Alaaeddine, Ali, et al. "Synthesis and characterization of novel alternating fluorinated copolymers bearing oligo (ethylene oxide) side chains." Journal of Polymer Science Part A: Polymer Chemistry 51.4 (2013): 977-986.

Alexandra, M. Z. "Lanthanide ß-diketonate glyme complexes exhibiting unusual co-ordination modes." Journal of the Chemical Society, Dalton Transactions 15 (1993): 2379-2386.

Alhadid A. et al., "Design of Deep Eutectic Systems: A Simple Approach for Preselecting Eutectic Mixture Constituents (Supplementary Material)", Molecules, 25.5 (2020): 1077.

Alhadid A. et al., "Design of Deep Eutectic Systems: A Simple Approach for Preselecting Eutectic Mixture Constituents", Molecules, 25.5 (2020): 1077.

Alipour, Mojtaba, and Zahra Safari. "Photophysics of OLED materials with emitters exhibiting thermally activated delayed fluorescence and used in hole/electron transporting layer from optimally tuned range-separated density functional theory." The Journal of Physical Chemistry C 123.1 (2018): 746-761.

Allcock, H. R. "Recent advances in phosphazene (phosphonitrilic) chemistry." chemical Reviews 72.4 (1972): 315-356.

Allcock, H. R., and D. B. Patterson. "Phosphorus-nitrogen compounds. 27. Ring-ring and ring-chain equilibration of dimethylphosphazenes. Relation to phosphazene polymerization." Inorganic Chemistry 16.1 (1977): 197-200.

Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.

Allcock, H. R., J. L. Schmutz, and Karen M. Kosydar. "A new route for poly (organophosphazene) synthesis. Polymerization, copolymerization, and ring-ring equilibration of trifluoroethoxy-and chloro-substituted cyclotriphosphazenes1, 2." Macromolecules 11.1 (1978): 179-186.

Allcock, H. R., R. L. Kugel, and K. J. Valan. "Phosphonitrilic compounds. VI. High molecular weight poly (alkoxy-and aryloxyphosphazenes)." Inorganic Chemistry 5.10 (1966): 1709-1715.

Allcock, H. R., W. J. Cook, and D. P. Mack. "Phosphonitrilic compounds. XV. High molecular weight poly [bis (amino) phosphazenes] and mixed-substituent poly (aminophosphazenes)." Inorganic Chemistry 11.11 (1972): 2584-2590.

Allcock, H.R. "Phosphorus-nitrogen Compounds", pp. 400-407, Academic Press (1972).

Allcock, H.R. "Phosphorus-nitrogen Compounds", pp. 400-447, Academic Press (1972).

Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972):4538-4545.

Allcock, Harry R. "The expanding field of polyphosphazene high polymers." Dalton Transactions 45.5 (2016): 1856-1862.

Allcock, Harry R., and Chen Chen. "Polyphosphazenes: phosphorus in inorganic-organic polymers." The Journal of Organic Chemistry 85.22 (2020): 14286-14297.

Allcock, Harry R., and Dawn E. Smith. "Surface studies of poly (organophosphazenes) containing dimethylsiloxane grafts." Chemistry of materials 7.8 (1995): 1469-1474.

Allcock, Harry R., and Dennis C. Ngo. "Synthesis of poly [bis (phosphazo) phosphazenes] bearing aryloxy and alkoxy side groups." Macromolecules 25.11 (1992): 2802-2810.

Allcock, Harry R., and Michael L. Turner. "Ring expansion and polymerization of transannular bridged cyclotriphosphazenes and their spirocyclic analogs." Macromolecules 26.1 (1993): 3-10.

Allcock, Harry R., and R. L. Kugel. "Synthesis of high polymeric alkoxy-and aryloxyphosphonitriles." Journal of the American Chemical Society 87.18 (1965): 4216-4217.

(56) References Cited

OTHER PUBLICATIONS

Allcock, Harry R., and Young Baek Kim. "Synthesis, characterization, and modification of poly (organophosphazenes) with both 2, 2, 2-trifluoroethoxy and phenoxy side groups." Macromolecules 27.14 (1994): 3933-3942.
Allcock, Harry R., et al. "Controlled refractive index polymers: polyphosphazenes with chlorinated- and fluorinated-, aryloxy-and alkoxy-side-groups." Chemistry of materials 15.2 (2003): 473-477.
Allcock, Harry R., et al. "Hydrophobic and superhydrophobic polyphosphazenes." Journal of adhesion science and technology 23.3 (2009): 435-445.
Allcock, Harry R., et al. "Plasma surface functionalization of poly [bis (2, 2, 2-trifluoroethoxy) phosphazene] films and nanofibers." Langmuir 23.15 (2007): 8103-8107.
Allcock, Harry R., et al. "Poly (monophosphazophosphazenes): New polymers with N: PR3 side groups." Macromolecules 27.26 (1994): 7556-7564.
Allcock, Harry R., et al. "Syntheses and structures of cyclic and short-chain linear phosphazenes bearing 4-phenylphenoxy side groups." Journal of the American Chemical Society 113.7 (1991): 2628-2634.
Allcock, Harry R., Gayann S. McDonnell, and James L. Desorcie. "Ring expansion and equilibration in organophosphazenes and the relationship to polymerization." Inorganic chemistry 29.19 (1990): 3839-3844.
Allcock, Harry R., Lee B. Steely, and Anurima Singh. "Hydrophobic and superhydrophobic surfaces from polyphosphazenes." Polymer international 55.6 (2006): 621-625.
Allcock, Harry R., Michael L. Turner, and Karyn B. Visscher. "Synthesis of transannular-and spiro-substituted cyclotriphosphazenes: x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {O2C10H6}], and 1, 3-[N3P3 (OCH2CF3) 4} O2C10H6}]." Inorganic chemistry 31.21 (1992): 4354-4364.
Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.
Amat, Miguel A., and Gregory C. Rutledge. "Liquid-vapor equilibria and interfacial properties of n-alkanes and perfluoroalkanes by molecular simulation." The Journal of chemical physics 132.11 (2010): 114704.
Aneta Wiatrowska, et al. "Ultra-Precise Deposition for Display Manufacturing: from Rapid Prototyping to Mass Production", The 21st international meeting on information display, Seoul, Korea.
Aqra, Fathi, and Ahmed Ayyad. "Surface free energy of alkali and transition metal nanoparticles." Applied surface science 314 (2014): 308-313.
Araki, H. and Naka, K., "Syntheses and Properties of Dumbbell-Shaped POSS Derivatives Linked by Luminescent p-Conjugated Units", Polymer Chemistry, 50.20 (2012):4170-4181.
Araki, H. and Naka, K., "Syntheses and Properties of Star- and Dumbbell-Shaped POSS Derivatives Containing Isobutyl Groups", Polymer Journal, 44 (2012):340-346.
Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.
Arvanitidis, J., et al. "Raman spectroscopic study of the rare-earth fullerides Eu6-xSrxC60." Nanoscale 3.6 (2011): 2490-2493.
Arvanitidis, J., et al. "Temperature-induced valence transition and associated lattice collapse in samarium fulleride." Nature 425.6958 (2003): 599-602.
Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.
Aubouy, Miguel, Manoel Manghi, and Elie Raphaël. "Interfacial properties of polymeric liquids." Physical Review Letters 84.21 (2000): 4858.
Azimi, Gisele, et al. "Hydrophobicity of rare-earth oxide ceramics." Nature materials 12.4 (2013): 315-320.
Azimi, Gisele, et al. Supplementary Information for "Hydrophobicity of rare-earth oxide ceramics." Nature materials 12.4 (2013): 315-320.
Azimi, Gisele, et al. Supplementary material for "Hydrophobicity of rare-earth oxide ceramics." Nature materials 12.4 (2013): 315-320.
Bae, J et al. "Optically recoverable, deep ultraviolet (UV) stable and transparent sol-gel fluoro siloxane hybrid material for a UV LED encapsulant." RSC advances 6.32 (2016): 26826-26834.
Baek, Jang-Yeol, et al. "New asymmetrical limb structured blue emitting material for OLED." Optical Materials Express 4.6 (2014): 1151-1158.
Baek, Seungin, et al. "74-2: Diffracted Image Retrieving with Deep Learning." SID Symposium Digest of Technical Papers. vol. 51. No. 1. 2020.
Balague, J., et al. "Synthesis of fluorinated telomers. Part 1. Telomerization of vinylidene fluoride with perfluoroalkyl iodides." Journal of Fluorine Chemistry 70.2 (1995): 215-223.
Baradie, B. et al. "Synthesis and characterization of novel polysiloxane-grafted fluoropolymers." Canadian journal of chemistry 83.6-7 (2005): 553-558.
Barrett, Eric W., et al. "Patterning poly (organophosphazenes) for selective cell adhesion applications." Biomacromolecules 6.3 (2005): 1689-1697.
Barry, B., "Routes to Silsesquioxanes Functionalization—Capping of DDSQs for the Synthesis of Asymmetric POSS Compounds", Masters Thesis, Michigan State University (2019).
Batsanov, S. S., G. N. Grigor'eva, and N. P. Sokolova. "Optical properties of oxides of the rare-earth metals." Journal of Structural Chemistry 3.3 (1962): 323-325.
Bechtolsheim, C. V., V. Zaporojtchenko, and F. Faupel. "Interface structure and formation between gold and trimethylcyclohexane polycarbonate." Journal of materials research 14.9 (1999): 3538-3543.
Becke-Goehring, Margot, and Ekkehard Fluck. "Phosphonitrilic chlorides from phosphorus pentachloride." Angewandte Chemie International Edition in English 1.6 (1962): 281-285.
Beier, Petr, et al. "Preparation of SF5 Aromatics by Vicarious Nucleophilic Substitution Reactions of Nitro(pentafluorosulfanyl)benzenes with Carbanions." Journal of Organic Chemistry 76.11 (2011): 4781-4786.
Ben'kovskii, V. G., T. M. Bogoslovskaya, and M. Kh Nauruzov. "Density, surface tension and refractive index of aromatic hydrocarbons at low temperatures." Chemistry and Technology of Fuels and Oils 2.1 (1966): 23-26.
Bernstein, M.P., et al. "Ultraviolet irradiation of the polycyclic aromatic hydrocarbon (PAH) naphthalene in H2O. Implications for meteorites and biogenesis." Advances in Space Research 30.6 (2002): 1501-1508.
Bertolucci, M et al. "Wetting Behavior of Films of New Fluorinated Styrene—Siloxane Block Copolymers." Macromolecules 37.10 (2004): 3666-3672.
Besli, S et al., "Bridged Cyclophosphazenes Resulting From Deprotonation Reactions of Cyclotriphophazenes Bearing a P—NH Group", 40.19 (2011):5307.
Besli, S. et al., "Bridged Cyclophosphazenes Resulting From Deprotonation Reactions of Cyclotriphophazenes Bearing a P—NH Group", Dalton Trans., 40.19 (2011):5307.
Besli, Serap, et al. "Regiochemical control in the substitution reactions of cyclotriphosphazene derivatives with secondary amines." Inorganic Chemistry 57.19 (2018): 12066-12077.
Bezière, Nicolas, and Ntziachristos, Vasilis. "Optoacoustic Imaging of Naphthalocyanine: Potential for Contrast Enhancement and Therapy Monitoring." Naphthalocyanine In Optoacoustic Imaging 56.2 (2015): 323-328.
Biddlestone, M., and R. A. Shaw. "A two-ring assembly phosphazene." Chemical Communications (London) 7 (1968): 407-408.
Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.

(56) References Cited

OTHER PUBLICATIONS

Biederman, H. et al., "The Properties of Fluorocarbon Films Prepared by R.F.Sputtering and Plasma Polymerization in Inert and Active Gas", Thin Solid Films, 41.3 (1977):329-339.
Bierwagen, Oliver, et al. "Oxygen-deficient oxide growth by subliming the oxide source material: The cause of silicide formation in rare earth oxides on silicon." Crystal growth & design 13.8 (2013): 3645-3650.
Blanchet, G.B., "Deposition of Amorphous Fluoropolymers Thin Films by Laser Ablation", Appl. Phys. Lett. 62 (1993):479-481.
Blanco, I., "The Rediscovery of Poss: A Molecule Rather than a Filler", Polymers, 10.8 (2018):904-914.
Böhm, E., et al. "Novel transport materials for high-performance fluorescent and phosphorescent OLEDs." Journal of Information Display 12.3 (2011): 141-144.
Boyne, D. et al., "Vacuum Thermal Evaporation of Polyaniline Doped with Camphor Sulfonic Acid", Journal of Vacuum Science & Technology A, 33.3 (2015):031510.
Breu, Josef, et al. "Crystal Structure of fac- Ir (ppy) 3 and Emission Properties under Ambient Conditions and at High Pressure." Chemistry of materials 17.7 (2005): 1745-1752.
Brickley, J.F. et al., "Supramolecular Variations on a Molecular Theme: the Structural Diversity of Phosphazenes (RNH)6P3N3 in the Solid State", Dalton Trans., 7 (2003): 1235-1244.
Brown, Douglas E., et al. "Poly [(vinyloxy) cyclophosphazenes]." Macromolecules 34.9 (2001): 2870-2875.
Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.
Buzin, M. I., et al. "Solid-state polymerization of hexaphenylcyclotrisiloxane." Journal of Polymer Science Part A: Polymer Chemistry 35.10 (1997): 1973-1984.
Cai, J. et al. "P-13.10: A New Color Space Model for AMOLED Display Based on IR Drop" SID Symposium Digest of Technical Papers 54 (2023).
Calhoun, Harry P. "Studies on the ligand properties of phosphonitrilic derivatives." Diss. University of British Columbia, 1973.
Camino, G. et al., "Polydimethylsiloxane Thermal Degradation Part 1. Kinetic Aspects", Polymer, 42.6 (2001):2395-2402.
Cao, Xuewei, et al. "Raman scattering of ytterbium intercalated C60 compounds." Journal of Raman Spectroscopy 31.6 (2000): 461-463.
Carolina Martínez Ceballos, Evelyn, et al. "Synthesis and characterization of polyphosphazenes modified with hydroxyethyl methacrylate and lactic acid." International Journal of Polymer Science 2013 (2013).
Carriedo, Gabino A., et al. "Preparation of a new type of phosphazene high polymers containing 2, 2 '-dioxybiphenyl groups." Macromolecules 29.16 (1996): 5320-5325.
Casas-Solvas, Juan M., Joshua D. Howgego, and Anthony P. Davis. "Synthesis of substituted pyrenes by indirect methods." Organic & Biomolecular Chemistry 12.2 (2014): 212-232.
Casella, Girolamo, et al. "Cyclo-and polyphosphazenes for biomedical applications." Molecules 27.23 (2022): 8117.
Chaiprasert, T. et al. "Vinyl-functionalized Janus ring siloxane: potential precursors to hybrid functional materials." Materials 14.8 (2021): 2014.
Chambrier, Isabelle, et al. "Synthesis of Porphyrin-CdSe Quantum Dot Assemblies: Controlling Ligand Binding by Substituent Effects. " Inorganic chemistry 54.15 (2015): 7368-7380.
Chan, E.P. et al., "Viscoelastic Properties of Confined Polymer Films Measured via Thermal Wrinkling", Soft Matter, 5.23 (2009):4638-4641.
Chan, K.L. et al., "Cubic Silsesquioxanes for Use in Solution Processable Organic Light Emitting Diodes (OLED)", Journal of Materials Chemistry, 19.48 (2009):9103-9120.
Chandrasekhar, V. et al., "Cyclophosphazene-Based Multi-Site Coordination Ligands", Coordination Chemistry Reviews, 251.9-10 (2007): 1045-1074.
Chang, Li, et al. "A smart surface with switchable wettability by an ionic liquid." Nanoscale 9.18 (2017): 5822-5827.
Charpentier, P. A., et al. "Continuous polymerizations in supercritical carbon dioxide: chain-growth precipitation polymerizations." Macromolecules 32.18 (1999): 5973-5975.
Chaudhury, M. and Pocius, A. V. "Adhesion science and engineering-2: Surfaces, Chemistry and Applications" Elsevier (2002).
Chen, B. J., X. W. Sun, and S. C. Tan. "Transparent organic light-emitting devices with LiF/Mg: Ag cathode." Optics express 13.3 (2005): 937-941.
Chen, G. K. J., and J. Chen. "Flexible displays: Flexible AMOLED manufacturing." Handbook of Visual Display Technology; Chen, J., Cranton, W., Fihn, M., Eds (2016).
Chen, Hsiao-Fan, et al. "1,3,5-Triazine derivatives as new electron transport-type host materials for highly efficient green phosphorescent OLEDs." Journal of Materials Chemistry 19.43 (2009): 8112-8118.
Chen, W. et al., "Highly Thermal Stable Phenolic Resin Based on Double-Decker-Shaped POSS Nanocomposites for Supercapacitors", Polymers, 12.9 (2020):2151-2165.
Chen, Yu-Hung, et al. "58.2: High-Performance Large-Size OLED Tv with Ultra Hd Resolution." SID Symposium Digest of Technical Papers. vol. 46. No. 1. 2015.
Cheng, Yu, et al. "Delivery and efficacy of a cancer drug as a function of the bond to the gold nanoparticle surface." Langmuir 26.4 (2010): 2248-2255.
Chevirė, François, Franck Tessier, and Roger Marchand. "Optical properties of rare-earth oxides and oxynitrides, . . . Towards 'second generation' UV absorbers." Silicates industriels 69.5-6 (2004): 159-163.
Chi, Dam Hieu, et al. "Pressure-induced structural phase transition in fullerides doped with rare-earth metals." Physical Review B 67.9 (2003): 094101.
Ching, Suet Ying. "Plasmonic properties of silver-based alloy thin films." (2015). Open Access Theses and Dissertations. 194.
Ching, Suet Ying. "Plasmonic properties of silver-based alloy thin films." (2016).
Ching, Suet Ying. "Plasmonic properties of silver-based alloy thin films." Diss. Hong Kong Baptist University, 2015.
Cho, H.U. et al. "17-1: Invited Paper: Enhancement of Current Efficiency for OLED Devices Using Meta-Heuristic Algorithm." SID Symposium Digest of Technical Papers. 52.1 (2021).
Cho, Song Yun, and Harry R. Allcock. "Novel highly fluorinated perfluorocyclobutane-based phosphazene polymers for photonic applications." Chemistry of Materials 19.25 (2007): 6338-6344.
Choi, B. K. et al. "48-1: Invited Paper: Next Generation Highly Efficient and Stable Phosphorescent Emitting Materials for OLEDs." SID Symposium Digest of Technical Papers 51.1 (2020).
Choi, B. K. et al. "Next Generation Highly Efficient and Stable Phosphorescent Emitting Materials for OLEDs." SID2020 Symposium.
Choi, J. et al., "Light Extraction Enhancement in Flexible Organic Light-Emitting Diodes by a Light-Scattering Layer of Dewetted Ag Nanoparticles at Low Temperatures", App. Mater. Interfaces, 10 (2018):32373-32379.
iftçi, Gönül Yenilmez, et al. "Investigation of the structural properties of 2-naphthylamine substituted cyclotetraphosphazenes." Polyhedron 77 (2014): 1-9.
Citrin, P. H., et al. "Distorted and inequivalently charged C60 anions in Yb2.75 C60." Physical Review B 56.9 (1997): 5213.
Condorelli, Guglielmo G., Graziella Malandrino, and Ignazio L. Fragalà. "Engineering of molecular architectures of ß-diketonate precursors toward new advanced materials." Coordination chemistry reviews 251.13-14 (2007): 1931-1950.
Cordes, D.B. et al., "Recent Developments in the Chemistry of Cubic Polyhedral Oligosilsesquioxanes", Chem. Rev., 110 (2010):2081-2173.
Cosnahan, T., et al., "Modelling of a vacuum metallization patterning method for organic electronics", Surface and Coatings Technology, 2018, 336, 128.
Crowder, Gene A., et al. "Vapor pressures and triple point temperatures for several pure fluorocarbons." Journal of Chemical and Engineering Data 12.4 (1967): 481-485.

(56) References Cited

OTHER PUBLICATIONS

Cuny, Philippe, Monique Acquaviva, and Michèle Gilewicz. "Phenanthrene degradation, emulsification and surface tension activities of a Pseudomonas putida strain isolated from a coastal oil contaminated microbial mat." Ophelia 58.3 (2004): 283-287.
Dalvi, V.H. and Rossky, P.J., "Molecular Origins of Fluorocarbon Hydrophobicity", PNAS, 107.31 (2010):13603-13607.
Dams, Rudy, and Klaus Hintzer. "Industrial aspects of fluorinated oligomers and polymers." (2016): 1-31.
Das, Prajwalita, et al. "Recent advancements in the synthesis of pentafluorosulfanyl (SF5)-containing heteroaromatic compounds." Tetrahedron Letters 58.52 (2017): 4803-4815.
Dash, P. and Y. C.H. "How much battery does dark mode save? An accurate OLED display power profiler for modern smartphones." Proceedings of the 19th Annual International Conference on Mobile Systems, Applications, and Services (2021).
David, Robert, Neumann, A. Wilhelm. "A Theory for the Surface Tensions and Contact Angles of HydrogenBonding Liquids." Langmuir 30.39 (2014):11634-11639.
Dawood, Kamal M. "Electrolytic fluorination of organic compounds." Tetrahedron 7.60 (2004): 1435-1451.
Dayneko, Sergey, et al. "Effect of surface ligands on the performance of organic light-emitting diodes containing quantum dots." Optoelectronic Devices and Integration V. Vol. 9270. SPIE, 2014.
De Wilde, W., "Evaporation of Polytetrafluoroethylene by Electron Bombardment of the Bulk Material", Thin Solid Films, 24.1 (1974):101-111.
Devaux, Didier, et al. "Crosslinked perfluoropolyether solid electrolytes for lithium ion transport." Solid State Ionics 310 (2017): 71-80.
Di Nicola, Giovanni, Gianluca Coccia, and Mariano Pierantozzi. "Surface tension of silanes: A new equation." Fluid Phase Equilibria 418 (2016): 88-93.
Dikarev, Evgeny V., Haitao Zhang, and Bo Li. "Heterometallic bismuth-transition metal homoleptic ß-diketonates." Journal of the American Chemical Society 127.17 (2005): 6156-6157.
Dolbier, William R. Jr., and Kanishchev, Oleksandr S. "Chapter One—SF5-Substituted Aromatic Heterocycles." Advances in Heterocyclic Chemistry 120 (2016): 1-42.
Dolbier, William R. Jr., and Zheng, Zhaoyun. "Use of 1,3-Dipolar Reactions for the Preparation of SF5-Substituted Five-Membered Ring Heterocycles. Pyrroles and Thiophenes." / Journal of Fluorine Chemistry 132.6(2011): 389-393.
Dong, H. et al., "Surface Properties and Thermal Stability of a Novel Low-Surface-Energy Polybenzoxazine/Clay Nanocomposites", Polymer Composites, 33.8 (2012): 1313-1320.
Drelich, J. et al., "Hydrophilic and Superhydrophilic Surfaces and Materials", Soft Matter, 7.21 (2011): 9804-9828.
Drelich, Jaroslaw, et al. "Hydrophilic and Superhydrophilic Surfaces and Materials." Soft Matter, 7.21 (2011): 9804-9828.
Du, Libin, et al. "Fluoropolymer synthesis in supercritical carbon dioxide." The Journal of Supercritical Fluids 47.3 (2009): 447-457.
Dubrovskii, Vladimir. "Fundamentals of Nucleation Theory." Nucleation Theory and Growth of Nanostructures. Springer, Berlin, Heidelberg, 2014. 1-73.
Dudziec, B. and Marciniec, B., "Double-decker Silsesquioxanes: Current Chemistry and Applications", Current Organic Chemistry, 21.28 (2017):2794-2813.
Dudziec, B. et al., "Synthetic Routes to Silsesquioxane-Based Systems as Photoactive Materials and Their Precursors", Polymers, 11.3 (2019):504-542.
Dutkiewicz, M. et al., "New Fluorocarbofunctional Spherosilicates: Synthesis and Characterization", Organometallics, 30.8 (2011):2149-2153.
Ebnesajjad, S. "Fluoroplastics: vol. 1: Non-Melt Processible Fluoroplastics. 2000."Plastics Design Library: United States of America, Norwich, NY, Chapter 11.
Ebnesajjad, Sina. "Introduction to fluoropolymers." Applied Plastics Engineering Handbook. William Andrew Publishing, 2011. 49-60.
Edrissi, M., et al. "Novel Method for the Preparation of Copper Phthalocyanin Blue Nanoparticles in an Electrochemical Cell Irradiated by Microwave (Research Note)". International Journal of Engineering, 20.3 (2007): 257-262.
Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Ellis, David A., et al. "Degradation of Fluorotelomer Alcohols: A Likely Atmospheric Source of Perfluorinated Carboxylic Acids." Environmental science & technology 38.12 (2004): 3316-3321.
Ellis, David A., et al. "Partitioning of organofluorine compounds in the environment." Organofluorines. Springer, Berlin, Heidelberg, 2002. 63-83.
Ellison, A. H., H. W. Fox, and W. A. Zisman. "Wetting of fluorinated solids by hydrogen-bonding liquids." The Journal of Physical Chemistry 57.7 (1953): 622-627.
Elmas, Gamze, et al. "Phosphorus-nitrogen compounds. Part 52. The reactions of octachlorocyclotetraphosphazene with sodium 3-(N-ferrocenylmethylamino)-1-propanoxide: Investigations of spectroscopic, crystallographic and stereogenic properties." Inorganica Chimica Acta 497 (2019): 119106.
Emerton, Neil, David Ren, and Tim Large. "28-1: Image Capture Through TFT Arrays." SID Symposium Digest of Technical Papers. vol. 51. No. 1. 2020.
Endo, Ayataka, et al. "Measurement of photoluminescence efficiency of Ir (III) phenylpyridine derivatives in solution and solid-state films." Chemical Physics Letters 460.1-3 (2008): 155-157.
English Translation of Office Action and Search Report for Chinese Application No. 202180041306.X dated Aug. 13, 2024, 11 pages.
English Translation of Office Action for Korean Application No. 10-2022-7037670 dated Nov. 20, 2024, 17 pages.
English translation of Office Action on Korean Application No. 10-2023-7022930 date Oct. 10, 2024.
Evers, Robert C. "Low glass transition temperature fluorocarbon ether bibenzoxazole polymers." Journal of Polymer Science: Polymer Chemistry Edition 16.11 (1978): 2833-2848.
Exner, O. "Conception and Significance of the Parachor." Nature 196.4857 (1962): 890-891.
Farrow, Darcie A., et al. "Polarized pump-probe measurements of electronic motion via a conical intersection." The Journal of Chemical Physics 128.14 (2008): 144510.
Faupel, F., et al. "Nucleation, growth, interdiffusion, and adhesion of metal films on polymers." AIP Conference Proceedings. vol. 491. No. 1. American Institute of Physics, 1999.
Feher, F.J. and Budzichowski, T.A., "Silasesquioxanes as Ligands in Inorganic and Organometallic Chemistry", Polyhedron, 14.22 (1995):3239-3253.
Feistel, G. R., and T. Moeller. "The geminal structure of the compound N3P3CI4 (NH2) 2." Journal of Inorganic and Nuclear Chemistry 29.11 (1967): 2731-2737.
Feng, Zhengyu, et al. "28-3: Pixel Design for Transparent MicroLED Display with Low Blurring." SID Symposium Digest of Technical Papers. vol. 51. No. 1. 2020.
Finkenzeller, Walter J., and Hartmut Yersin. "Emission of Ir (ppy) 3. Temperature dependence, decay dynamics, and magnetic field properties." Chemical physics letters 377.3-4 (2003): 299-305.
Flaningam, Ora L. "Vapor pressures of poly (dimethylsiloxane) oligomers." Journal of Chemical and engineering Data 31.3 (1986): 266-272.
Flores-Camacho, Jose Manuel, et al. "Growth and optical properties of Ag clusters deposited on poly (ethylene terephthalate)." Nanotechnology 22.27 (2011): 275710.
Fluorosilicone Fluids, p. 20, retrieved from <https://s3.amazonaws.com/gelest/product-brochures/Inert_Silicones.pdf> on Mar. 24, 2022.
Foreign Action other than Search Report on non-Foley case related to US Dtd Dec. 19, 2024.
Foreign Action other than Search Report on PCT Dtd Jun. 22, 2023.
Formica, Nadia, et al. "Ultrastable and Atomically Smooth Ultrathin Silver Films Grown on a Copper Seed Layer." ACS Applied Materials & Interfaces 5.8 (2013): 3048-3053.

(56) References Cited

OTHER PUBLICATIONS

Forrest, James A. "Reductions of the glass transition temperature in thin polymer films: Probing the length scale of cooperative dynamics." Physical Review E 61.1 (2000): R53-6.
Fowkes, Frederick M. "Attractive Forces at Interfaces." Industrial and Engineering Chemistry 56.12 (1964): 40-52.
Fox, H.W. et al., "Polyorganosiloxanes . . . Surface Active Properties", Ind. Eng. Chem., 39.11 (1947):1401-1409.
Freire, Mara G., et al. "Surface Tension of Liquid Fluorocompounds." Journal of Chemical & Engineering Data 51.5 (2006): 1820-1824.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness."? Macromolecules?34.16 (2001): 5627-5634.
Furukawa, Yutaka, et al. "Fluorosilicone elastomer based on the poly [(3, 3, 3-trifluoropropyl) methyl-siloxane-co-(3, 3, 4, 4, 5, 5, 6, 6, 6-nonafluorohexyl) methylsiloxane]." Polymers for Advanced Technologies 13.1 (2002): 60-65.
Furukawa, Yutaka, et al. "Reactivity of cyclosiloxane with 3, 3, 4, 4, 5, 5, 6, 6, 6-nonafluorohexyl group and its application to fluorosilicone synthesis." Journal of applied polymer science 82.13 (2001): 3333-3340.
Fusella, Michael A., et al. "Plasmonic enhancement of stability and brightness in organic light-emitting devices." Nature 585.7825 (2020): 379-382.
Fushimi, Toshiki, and Harry R. Allcock. "Synthesis and optical properties of sulfur-containing monomers and cyclomatrix polyphosphazenes." Dalton transactions 39.22 (2010): 5349-5355.
Gabler, D.G. and Haw, J.F., "Hydrolysis Chemistry of the Chlorophosphazene Cyclic Trimer", Inorganic Chemistry, 29.20 (1990):4018-4021.
Gali, Sai Manoj, et al. "Ambipolarity and dimensionality of charge transport in crystalline group 14 phthalocyanines: A computational study." The Journal of Physical Chemistry C 122.5 (2018): 2554-2563.
Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012):7520-7526.
Gao Y., "Microphase Separation of Stimulus-Responsive Block-co-Polypeptides on Surfaces", Master's thesis, Duke University (2018).
Gao, Lichao, and Thomas J. McCarthy. "Teflon is hydrophilic. Comments on definitions of hydrophobic, shear versus tensile hydrophobicity, and wettability characterization." Langmuir 24.17 (2008): 9183-9188.
Garrick, Lloyd M. "Novel , New Aromatic SF 5 Derivatives ! Prepared in High Yield via Highly Versatile & Cost Competitive Methods." (2019).
Gavrilenko, V. V., et al. "Synthesis of yttrium, lanthanum, neodymium, praseodymium, and lutetium alkoxides and acetylacetonates." Bulletin of the Russian Academy of Sciences, Division of chemical science 41.11 (1992): 1957-1959.
Giebink, C. "Catastrophic OLED failure and pathways to address it" Department of Energy, url:https://www.energy.gov/sites/prod/files/2018/02/f48/giebink_oled-failure_nashville18_0.pdf (2018).
Gleria, Mario, et al. "Fluorine containing phosphazene polymers." Journal of Fluorine Chemistry 125.2 (2004): 329-337.
Glüge, J. et al., An Overview of the Uses of Per- and Polyfluoroalkyl Substances (PFAS), Environmental Science: Processes & Impacts, 20.12 (2020):2345-2373.
Glüge, J. et al., "An Overview of the Uses of Per- and Polyfluoroalkyl Substances (PFAS)-Electronic supplementary information 1", Environmental Science: Processes & Impacts, 20.12 (2020):2345-2373.
Gogoi, N et al., "Low-Surface-Energy Materials Based on Polybenzoxazines for Surface Modification of Textiles", The Journal of The Textile Institute, 105.11 (2014):1212-1220.
Golemme, Gianni, and Anna Santaniello. "Perfluoropolymer/molecular sieve mixed-matrix membranes." Membranes 9.2 (2019): 19.
Golovin, K. et al., "Low-Interfacial Toughness Materials for Effective Large-Scale Deicing", Science, 364.6438 (2019):371-375.
Golovin, K. et al., Supplementary Materials for "Low-Interfacial Toughness Materials for Effective Large-Scale Deicing", Science, 364.6438 (2019):371-375.
Goyal, S. et al. "Fundamentals of Organic-Glass Adhesion", Handbook of Materials Modeling, edited by Andreoni W. and Yip S., Springer Nature Switzerland AG (2020): 2049-2089.
Graham, Paul, et al. "Fluoropolymers with very low surface energy characteristics." Journal of Fluorine Chemistry 104.1 (2000): 29-36.
Grant Norton, M. et al., "Pulsed Laser Ablation and Deposition of Fluorocarbon Polymers", Applied Surface Science, 96-98 (1996):617-620.
Grant, Trevor M., et al. "Multifunctional ternary additive in bulk heterojunction OPV: increased device performance and stability." Journal of Materials Chemistry A 5.4 (2017): 1581-1587.
Gray, Victor, et al. "Photophysical characterization of the 9, 10-disubstituted anthracene chromophore and its applications in triplet-triplet annihilation photon upconversion."Journal of Materials Chemistry C 3.42 (2015): 11111-11121.
Green, Mark. "The nature of quantum dot capping ligands." Journal of Materials Chemistry 20.28 (2010): 5797-5809.
Gritsenko, K.P. and Krasovsky, A.M., "Thin-Film Deposition of Polymers by Vacuum Degradation", Chem. Rev., 103.9 (2003):3607-3649.
Grytsenko, K. "Vacuum-deposited fluoropolymer films for organic electronics" International Symphosium on Plastics Electronics (Part of Semicon Europe—2015) at Dresden, Germany (2015).
Grytsenko, K.P. et al., "Protective Applications of Vacuum-Deposited Perfluoropolymer Films", Semiconductor Physics, Quantum Electronics & Optoelectronics, 19.2 (2016):139-148.
Grzyll, Lawrence R., Charlie Ramos, and Dwight D. Back. "Density, viscosity, and surface tension of liquid quinoline, naphthalene, biphenyl, decafluorobiphenyl, and 1, 2-diphenylbenzene from 300 to 400 C." Journal of Chemical & Engineering Data 41.3 (1996): 446-450.
Guo, X. Andrew, Allen D. Hunter, and Jie Chen. "Preparation and characterization of acrylates and polyacrylates having variable fluorine contents and distributions." Journal of Polymer Science Part A: Polymer Chemistry 32.1 (1994): 47-56.
Haddon, R. C. "Electronic structure, conductivity and superconductivity of alkali metal doped (C60)." Accounts of chemical research 25.3 (1992): 127-133.
Hadi, A., et al. "Accelerated Design and Optimization of Novel OLED Materials", The 21st international meeting on information display, Seoul, Korea.
Halls, M. D., et al. "An Innovation Platform for Optoelectronics: Synergistic Acceleration of de Novo Design Powered by Multiscale Simulations and Machine Learning", The 21st international meeting on information display, Seoul, Korea.
Hammer, Nathan I., Todd Emrick, and Michael D. Barnes. "Quantum dots coordinated with conjugated organic ligands: new nanomaterials with novel photophysics." Nanoscale Research Letters 2.6 (2007): 282-290.
Han, Yoon Deok, et al. "Quantum dot and p-conjugated molecule hybrids: nanoscale luminescence and application to photoresponsive molecular electronics." NPG Asia Materials 6.6 (2014): e103-e103.
Handke, Bartosz, Lukasz Klita, and Wiktor Niemiec. "Self-assembly of dodecaphenyl POSS thin films." Surface Science 666 (2017): 70-75.
Hashimoto, A. "Evaporation kinetics of oxides of rare earth and refractory trace elements, and the chemical fractionation of hibonite by evaporation." Lunar and Planetary Science Conference. vol. 22. 1991.
Hashimoto, A. "Evaporation kinetics of REE oxides." Lunar and Planetary Science Conference. vol. 19. 1988.
Heaney, James B. "Evaluation of commercially supplied silver coated Teflon for spacecraft temperature control usage." (1974).

(56) References Cited

OTHER PUBLICATIONS

Hedley, Gordon J., Arvydas Ruseckas, and Ifor DW Samuel. "Ultrafast luminescence in Ir (ppy) 3." Chemical Physics Letters 450.4-6 (2008): 292-296.
Heinrich, Darina, Axel Haupt, and Dieter Lentz. "Synthesis of Cyclopentadiene Ligands with Fluorinated Substituents by Reaction of Cobaltocene with Fluoroalkenes." European Journal of Inorganic Chemistry 2014.30 (2014): 5103-5106.
Herzog, Axel, et al. "A Perfluorinated Nanosphere: Synthesis and Structure of Perfluoro-deca-B-methyl-para-carborane." Angewandte Chemie International Edition 40.11 (2001): 2121-2123.
Hiroto, Satoru, et al. "Synthetic protocol for diarylethenes through Suzuki-Miyaura coupling." Chemical communications 47.25 (2011): 7149-7151.
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hodges, A. M., et al. "New pentafluoro-? 6-sulfanyl (SF5) perfluoroalkyl benzene derivatives." Journal of fluorine chemistry 114.1 (2002): 3-8.
Hoene, Joan Von, Robert G. Charles, and William M. Hickam. "Thermal decomposition of metal acetylacetonates: mass spectrometer studies." The Journal of Physical Chemistry 62.9 (1958): 1098-1101.
Hofbeck, Thomas, and Hartmut Yersin. "The triplet state of fac-Ir (ppy) 3." Inorganic chemistry 49.20 (2010): 9290-9299.
Hoge, J. "Novel Benzoxazine Based System for Flame Retardant Aircraft Interior Prepreg Applications" The Sixth Triennial International Aircraft Fire and Cabin Safety Research (2010).
Hoge, J. "Novel Benzoxazine Resin System for Flame Retardant Aircraft Interior Applications" The Sixth Triennial International Aircraft Fire and Cabin Safety Research (2010).
Holland, L et al., "Sputtered and Plasma Polymerized Fluorocarbon Films", Thin Solid Films, 35 (1976): L19-L21.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
Hughes, Russell P., and Hernando A. Trujillo. "Selective solubility of organometallic complexes in saturated fluorocarbons. Synthesis of cyclopentadienyl ligands with fluorinated ponytails." Organometallics 15.1 (1996): 286-294.
Hwang, Hyeon-Deuk, and Hyun-Joong Kim. "UV-curable low surface energy fluorinated polycarbonate-based polyurethane dispersion." Journal of colloid and interface science 362.2 (2011): 274-284.
Hwang, S. et al., "ChemInform Abstract: Dendritic Macromolecules for Organic Light-Emitting Diodes", Chemical Society Reviews, 37.11 (2008):2543-2557.
Hyre, Ariel S., and Linda H. Doerrer. "A structural and spectroscopic overview of molecular lanthanide complexes with fluorinated O-donor ligands." Coordination Chemistry Reviews 404 (2020): 213098.
Iacono, S. T. et al. "Fluorinated polyhedral oligomeric silsesquioxanes (F-POSS)", Defense Technical Information Center, (2010) url:https://apps.dtic.mil/sti/tr/pdf/ADA521393.pdf.
Iacono, S. T. et al. "Fluorinated polyhedral oligomeric silsesquioxanes (F-POSS), and pathways to address it", Defense Technical Information Center, url:https://apps.dtic.mil/sti/citations/ADA533422 (2010).
Iacono, S.T. et al., "Preparation of Composite Fluoropolymers with Enhanced Dewetting Using Fluorinated Silsesquioxanes as Drop-In Modifiers", J. Mater. Chem., 20.15 (2010):2979-2984.
Lacono, Scott T., et al. "Facile synthesis of hydrophobic fluoroalkyl functionalized silsesquioxane nanostructures." Chemical communications 47 (2007): 4992-4994.
Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009): 125-135.
Ikonnikov, D.A., "Controlling Multiple Diffraction with Quasiperiodic Gratings", Laser Phys. Lett., 16.12 (2019): 126202.
Im, Yirang, et al. "Recent progress in high-efficiency blue-light-emitting materials for organic light-emitting diodes." Advanced Functional Materials 27.13 (2017): 1603007.
Imoto, H. et al., "Corner- and Side-Opened Cage Silsesquioxanes: Structural Effects on the Materials Properties", European Journal of Inorganic Chemistry, 2020.9 (2020): 737-742.
Imoto, H. et al., "Tripodal Polyhedral Oligomeric Silsesquioxanes as a Novel Class of Three- Dimensional Emulsifiers", Polymer Journal, 47 (2015):609-615.
International Search Report and Witten Opinion for PCT Application No. PCT/IB2022/000066 dated Jun. 30, 2022.
International Search Report and Written Opinion for PCT Application No. PCT/IB2021/060062 dated Feb. 18, 2022 (12 pages).
International Search Report and Written Opinion on PCT PCT/IB2022/062254 dated Mar. 13, 2023 (10 pages).
Ishii, Kenji, et al. "Ferromagnetism and giant magnetoresistance in the rare-earth fullerides Eu6-x SrxC60." Physical Review B 65.13 (2002): 134431.
Ito, Hitoshi, et al. "Synthesis and Thermal Properties of Fully Aromatic Polysilarylenesiloxanes." Polymer Journal 38.2 (2006): 109-116.
Ivleva, E.A. et al., "Synthesis of Adamantane Functional Derivatives Basing on N-[(Adamantan-1-yl)alkyl]acetamides", Russian Journal of Organic Chemistry, 52.11 (2016): 1558-1564.
Iwamori, S. et al., "Adsorption Properties of Fluorocarbon Thin Films Prepared by Physical Vapor Deposition Methods", Surface & Coatings Technology, 204:16-17 (2010):2803-2807.
Iwamori, S., "Adhesion and Friction Properties of Fluorocarbon Polymer Thin Films Coated onto Metal Substrates", Key Engineering Materials, 384 (2008):311-320.
Jain, Akash, Gang Yang, and Samuel H. Yalkowsky. "Estimation of melting points of organic compounds." Industrial & engineering chemistry research 43.23 (2004): 7618-7621.
Jang, Sang Eok, et al. "Thermally stable fluorescent blue organic light-emitting diodes using spirobifluorene based anthracene host materials with different substitution position." Synthetic metals 160.11-12 (2010): 1184-1188.
Jarvis, N.L. and Zisman, W.A., "Surface Chemistry of Fluorochemicals", Defense Technical Information Center (1965):1-37.
Jarvis, N.L., Zisman, W.A., and Naval Research Lab Washington Dc, "Surface Chemistry of Fluorochemicals", Defense Technical Information Center, (1965): 1-37.
Jiao, Zhiqiang, et al. "61-2: Weakening Micro-Cavity Effects in White Top-Emitting WOLEDs with Semitransparent Metal Top Electrode." SID Symposium Digest of Technical Papers. vol. 49. No. 1. 2018.
Jin, Y. et al. "Two-Tier Ensemble Deep Learning Model for Anomaly Detection in OLED Encapsulation Process" The 21st International Meeting on Information Display, Seoul, Korea (2021).
Johnson, P. G., and B. Tittle. "The preparation of perfluorinated carboxylic esters and perfluoro carbonates." Journal of Fluorine Chemistry 3.1 (1973): 1-6.
Joliton, Adrien, and Carreira, Erick M. "Ir-Catalyzed Preparation of SF5-Substituted Potassium Aryl Trifluoroborates via C-H Borylation and Their Application in the Suzuki-Miyaura Reaction." Organic Letters 15.20 (2013): 5147-5149.
Josefsen, Leanne B., and Ross W. Boyle. "Photodynamic therapy and the development of metal-based photosensitisers." Metal-based drugs 2008 (2008).
Jung, W. et al. "62-3: High Precise laser glass cutting for future display" Journal of the Society for Information Display 30.5 (2022): 462-470.
Jung, W. et al. "Extremely Precise Laser Glass Cutting Technology for Future Display", The 21st international meeting on information display, Seoul, Korea.
Jung, W. et al. "High-precision laser glass cutting for future display" Journal of the Society for Information Display 30.5 (2022): 462-470.

(56) References Cited

OTHER PUBLICATIONS

Kaesler, K., "The hidden defenders: Silane and siloxane impregnation protects construction materials", European coatings journal, 3 (2006): 36-41.
Kajdas, C. "Nanoscale boundary lubrication of diamond-like carbon coatings with fluorinated compounds." Journal of Synthetic Lubrication 18.1 (2001): 17-38.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp.422-427.
Kato, Daimotsu, et al. "52.4 L Transmissive One-Side-Emission OLED Panel using Alignment-Free Cathode Patterning." SID Symposium Digest of Technical Papers. vol. 46. No. 1. 2015.
Ke, L., et al. "Panchromatic ternary/quaternary polymer/fullerene BHJ solar cells based on novel silicon naphthalocyanine and silicon phthalocyanine dye sensitizers." Journal of Materials Chemistry A 5.6 (2017): 2550-2562.
Khan, Sami. Hydrophobicity of rare-earth oxide ceramics and their application in promoting sustained drop-wise condensation. Diss. Massachusetts Institute of Technology, 2016.
Khanin, D. A., et al. "New hybrid materials based on cyclophosphazene and polysiloxane precursors: Synthesis and properties." Polymer 186 (2020): 122011.
Khetubol, Adis, et al. "Ligand exchange leads to efficient triplet energy transfer to CdSe/ZnS Q-dots in a poly(N-vinylcarbazole) matrix nanocomposite." Journal of Applied Physics 113.8 (2013): 083507.
Khetubol, Adis, et al. "Triplet Harvesting in Poly(9-vinylcarbazole) and Poly(9-(2,3-epoxypropyl)carbazole) Doped with CdSe/ZnS Quantum Dots Encapsulated with 16-(N-Carbazolyl) Hexadecanoic Acid Ligands." Journal of Polymer Science Part B: Polymer Physics 52.7 (2014): 539-551.
Kido, Junji, and Toshio Matsumoto. "Bright organic electroluminescent devices having a metal-doped electron-injecting layer. "Applied Physics Letters 73.20 (1998): 2866-2868.
Kim, Beomjin, et al. "Synthesis and electroluminescence properties of highly efficient blue fluorescence emitters using dual core chromophores." Journal of Materials Chemistry C 1.3 (2013): 432-440.
Kim, Chiwoo, et al. "Fine metal mask material and manufacturing process for high-resolution active-matrix organic light-emitting diode displays." Journal of the Society for Information Display 28.8 (2020): 668-679.
Kim, G. et al. "Multiscale Calculation of Carrier Mobility in Organic Solids Through the Fine-Tuned Kinetic Monte Carlo Method" The 21st International Meeting on Information Display, Seoul, Korea (2021).
Kim, H. et al. "83-2: Reliability Characterization of Luminance Degradation of OLED Mobile Display Considering Color Difference Index Based on Usage Patterns." SID Symposium Digest of Technical Papers 51.1 (2020).
Kim, H. et al. "Reliability Characterization of Luminance Degradation of OLED Mobile Display Considering Color Difference Index Based on Usage Patterns." SID 2020 Symposium.
Kim, Haewon, et al. "Analysis of Semi-Transparent Cathode Performance Based on Fabrication Methods." IDW '19. 2019.
Kim, Hyun-Chang, et al. "39-4: A Method of Panel-Current Limitation for Automotive OLED Displays." SID Symposium Digest of Technical Papers. Vol. 51. No. 1. 2020.
Kim, J. et al. "Design of Stable Blue Phosphorescent OLEDs Using State Interaction between Exciplex and Component Host" The 21st International Meeting on Information Display, Seoul, Korea (2021).
Kim, J.H. et al., "Thickness and Composition Dependence of the Glass Transition Temperature in Thin Homogeneous Polymer Blend Films", Macromolecules, 35.1 (2002): 311-313.
Kim, J.H. et al., "Thickness Dependence of the Glass Transition Temperature in Thin Polymer Films", Langmuir, 17.9 (2001):2703-2710.
Kim, J.H. et al., "Thickness Dependence of the Melting Temperature of Thin Polymer Films", Macromol. Rapid Commun. 22.6 (2001):386-389.
Kim, Kwon-Hyeon, and Jang-Joo Kim. "Origin and Control of Orientation of Phosphorescent and TADF Dyes for High-Efficiency OLEDs." Advanced Materials 30.42 (2018): 1705600.
Kim, Kyu-Sung, et al. "Blue light-emitting OLED using new spiro [fluorene-7, 9'-benzofluorene] host and dopant materials." Organic Electronics 9.5 (2008): 797-804.
Kim, S. et al. "25-3: Machine-Learning-Assisted Materials Discovery of Blue Emitter for More Efficient and Durable OLED Device." SID Symposium Digest of Technical Papers. 52.1 (2021).
Kim, S. "40-2: Invited Paper: Prolonging Device Lifetime of Blue Organic Light-Emitting Diodes." SID Symposium Digest of Technical Papers 53.1 (2022).
Kim, S. "40-2: Long lifetime Phosphorescent Blue" 2022 Display Week International Symposium, San Jose (2022).
Kim, S. et al. "Machine-Learning-Assisted Materials Discovery of Blue Emitter for a More Efficient and Durable OLED Device." 2021 Virtual Display Week International Symposium (2021).
Kim, S. et al. "Autonomous Materials Design for More Efficient OLED Devices using Machine Learning" The 21st International Meeting on Information Display, Seoul, Korea (2021).
Kim, S. et al., "Origin of Macroscopic Adhesion in Organic Light-Emitting Diodes Analyzed at Different Length Scales", Scientific Reports, 8.6391 (2018): 1-7.
Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kim, Sinheui, et al. "Degradation of blue-phosphorescent organic light-emitting devices involves exciton-induced generation of polaron pair within emitting layers." Nature communications 9.1 (2018): 1-11.
Kim, T. et al., "Electrical Injection and Transport in Teflon-Diluted Hole Transport Materials", Organic Electronics, 83 (2020): 105754.
Kim, Y. "AI & Simulation Technology for Displays", SID 2021 Short Course, SID Display Week, virtual (2021).
Kim, Y. et al. "17-2: Invited Paper: Simulation Based Artificial Intelligence for Displays." SID Symposium Digest of Technical Papers. 52.1 (2021).
Kim, Y. et al. "17-2: Invited talk: Simulation Based Artificial Intelligence for Displays." 2021 Virtual Display Week International Symposium (2021).
King, Allison, et al. "Semicrystalline polyphosphazenes: A comparative study of topology, morphology, and contact angles for three fluorous and one aryl polyphosphazene." Polymer 54.3 (2013): 1123-1129.
Kireev, Vyacheslav V., V. I. Astrina, and Eugeny A. Chernyshev. "Oligomeric Alkoxyphosphazens." Russian Chemical Reviews 50.12 (1981): 1186.
Kisin, Srdjan. Adhesion changes at metal-polymer interfaces: Study of the copper-(acrylonitrile-butadiene-styrene) system. Diss. Dissertation, Technische Universiteit Eindhoven, 2007.
Kiskan, B., "Adapting Benzoxazine Chemistry for Unconventional Applications", Reactive and Functional Polymers, 129 (2018):76-88.
Knight Jr, L. B., et al. "Unusual behavior of vaporized magnesium under low pressure conditions." The Journal of Physical Chemistry 79.12 (1975): 1183-1190.
Kobayashi, Hideki, and Michael J. Owen. "Surface tension of liquid polysiloxanes having fluorinated alkyl side-chains." Die Makromolekulare Chemie: Macromolecular Chemistry and Physics 194.6 (1993): 1785-1792.
Kober, Ehrenfried, Henry Lederle, and Gerhard Ottmann. "Fluoroalkylphosphonitrilates: A New Class of Potential Fire-Resistant Hydraulic Fluids and Lubricants. I." Asle Transactions 7.4 (1964): 389-397.
Koh, K et al., "Precision Synthesis of a Fluorinated Polyhedral Oligomeric Silsesquioxane-Terminated Polymer and Surface Char-

(56) References Cited

OTHER PUBLICATIONS acterization of Its Blend Film with Poly(methyl methacrylate)", Macromolecules, 38.4 (2005):1264-1270.
Kohonenko, V. I., et al. "Density and surface tension of liquid rare earth metals, scandium, and yttrium." physica status solidi (a) 84.2 (1984): 423-432.
Koma, N. et al. "44.2: Novel Front-light System Using Fine-pitch Patterned OLED." SID Symposium Digest of Technical Papers, 39: 655-658. 2008.
Korich, Andrew L., and Peter M. lovine. "Boroxine chemistry and applications: A perspective." Dalton Transactions 39.6 (2010): 1423-1431.
Kota, Arun K., Gibum Kwon, and Anish Tuteja. "The design and applications of superomniphobic surfaces." NPG Asia Materials 6.7 (2014): e109-e109.
Kota, Arun K., Gibum Kwon, and Anish Tuteja. "The design and applications of superomniphobic surfaces." NPG Asia Materials 6.7 (2014): e109.
Kovacik, P et al., "Vacuum-Deposited Planar Heterojunction Polymer Solar Cells", ACS Appl. Mater. Interfaces, 3.1 (2011):11-15.
Kovacina, T. A., et al. "Syntheses and characterizations of poly(pentafluorosulfur diacetylenes)." Industrial & Engineering Chemistry Product Research and Development 22.2 (1983): 170-172.
Kovalchuk, N.M., et al. "Fluoro- vs hydrocarbon surfactants: Why do they differ in wetting performance?" Advances in Colloid and Interface Science 210 (2014): 65-71.
Krishnamurthy, S. S., P. M. Sundaram, and Michael Woods. "Studies of phosphazenes. 12. Reactions of N4P4Cl8 with dibenzylamine-isolation of an unusual" bicyclic" phosphazene, N4P4 [N (CH2Ph) 2] 6 (NCH2Ph)." Inorganic Chemistry 21.1 (1982): 406-410.
Krishnan, S. et al., "Fluorinated Polymers: Liquid Crystalline Properties and Applications in Lithography", The Chemical Record, 4.5 (2004):315-330.
Kunthom, R. et al., "Synthesis and Characterization of Unsymmetrical Double-Decker Siloxane (Basket Cage)", Molecules, 24.23 (2019):4252.
Kuo, S. et al., "Preparing Low-Surface-Energy Polymer Materials by Minimizing Intermolecular Hydrogen-Bonding Interactions", J. Phys. Chem. C, 113.48 (2009):20666-20673.
Kwak, Sang Woo, et al. "Synthesis and Electroluminescence Properties of 3-(Trifluoromethyl)phenyl-Substituted 9, 10-Diarylanthracene Derivatives for Blue Organic Light-Emitting Diodes." Applied Sciences 7.11 (2017): 1109-1120.
Kwon, Sun-kap, et al. "Efficient micro-cavity top emission OLED with optimized Mg: Ag ratio cathode." Optics Express 25.24 (2017): 29906-29915.
Lanoux, S. and Mas, R.H., "Reactions of the Hydrolyzed Phosphazene N3P3(OCH2CF3)5ONa", Phosphorus and Sulfur and the Related Elements, 26.2 (1986): 139-142.
Lederle, Henry, Ehrenfried Kober, and Gerhard Ottmann. "Fluoroaklyl Phosphonitrilates: A New Class of Potential Fire-Resistant Hydraulic Fluids and Lubricants." Journal of Chemical and Engineering Data 11.2 (1966): 221-228.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs." SID Symposium Digest of Technical Papers. vol. 46. No. 1. 2015.
Lee, David KY, et al. "Synthesis and inclusion behavior of cyclotriphosphazene molecules with asymmetric spiro rings." Dalton Transactions 39.22 (2010): 5341-5348.
Lee, Donggu, et al. "The influence of sequential ligand exchange and elimination on the performance of P3HT: CdSe quantum dot hybrid solar cells." Nanotechnology 26.46 (2015): 465401.
Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).
Lee, J. et al. "55-2: Methods for Overcoming the Trade-off between Efficiency and Lifetime of Organic Light-Emitting Diodes: OLED Lifetime Simulation." SID2020 Symposium.
Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.
Lee, Jiun-Haw, et al. "Blue organic light-emitting diodes: current status, challenges, and future outlook." Journal of Materials Chemistry C 7.20 (2019): 5874-5888.
Lee, S. et al. "20-2: High Efficiency and Long Device Lifetime Green Organic Light Emitting Diodes using a Pt Complex." SID Symposium Digest of Technical Papers 51.1 (2020).
Lee, S. et al. "Highly Efficient and Long-lifetime Green OLED using a Pt Complex." 2020 Virtual Display Week International Symposium.
Lee, Sangwha, Joon-Seo Park, and T. Randall Lee. "The wettability of fluoropolymer surfaces: Influence of surface dipoles." Langmuir 24.9 (2008): 4817-4826.
Lei, Hui, et al. "Fluorine-free low surface energy organic coating for anti-stain applications." Progress in Organic Coatings 103 (2017): 182-192.
Lei, Ying Duan, Frank Wania, and Dan Mathers. "Temperature-dependent vapor pressure of selected cyclic and linear polydimethylsiloxane oligomers." Journal of Chemical & Engineering Data 55.12 (2010): 5868-5873.
Lenton, M. V., and B. Lewis. "Preparation and properties of some novel diaminotetra (fluoroalkoxy)-triphosphonitriles." Journal of the Chemical Society A: Inorganic, Physical, Theoretical (1966): 665-667.
Li, Chong, et al. "Photocontrolled Intramolecular Charge/Energy Transfer and Fluorescence Switching of Tetraphenylethene-Dithienylethene-Perylenemonoimide Triad with Donor-Bridge-Acceptor Structure." Chemistry—An Asian Journal 9.1 (2014): 104-109.
Li, L. et al., "Synthesis and Properties of Microporous Organic Polymers Based on Adamantane", Progress in Chemistry, 32 (2020):190-203.
Li, Lu, et al. "Fluorinated anthracene derivatives as deep-blue emitters and host materials for highly efficient organic light-emitting devices." RSC Advances 5.73 (2015): 59027-59036.
Li, P. et al. "Preparation and application of fluorinated-siloxane protective surface coating material for stone inscriptions." Journal of Polymer Engineering 35.6 (2015): 511-522.
Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).
Lifka, H. et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, C. et al., "Mechanistic Studies on Ring-Opening Polymerization of Benzoxazines: A Mechanistically Based Catalyst Design", Macromolecules, 44.12 (2011):4616-4622.
Liu, F. et al. "Syntheses and structure of the first eight-membered fluoro and chloro hafnium siloxane complexes" Zeitschrift für anorganische und allgemeine Chemie 622.5 (1996): 819-822.
Liu, Meng, et al. "Facile fabrication of superhydrophobic surface from fluorinated poss acrylate copolymer via one-step breath figure method and its anti-corrosion property." Polymers 11.12 (2019): 1953.
Liu, Xiao, et al. "Substituent exchange reactions of linear oligomeric aryloxyphosphazenes with sodium 2, 2, 2-trifluoroethoxide." Inorganic chemistry 51.21 (2012): 11910-11916.
Liu, Xiao, et al. "Substituent exchange reactions with high polymeric organophosphazenes." Macromolecules 45.22 (2012): 9100-9109.

(56) References Cited

OTHER PUBLICATIONS

Liu, Yang, et al. "P-168: Top Emission WOLED for High Resolution OLED TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Liu, Z. et al., "Two-Dimensional Gratings of Hexagonal Holes for High Order Diffraction Suppression", Optics Express, 25.2 (2017): 1339-1349.
Lo, Angel SW, and István T. Horváth. "Fluorous ethers." Green Chemistry 17.10 (2015): 4701-4714.
Lowe, R.D. et al., "Deposition of Dense Siloxane Monolayers from Water and Trimethoxyorganosilane Vapor", Langmuir, 27.16 (2011):9928-9935.
Lu, Changqing, Jae-Ho Kim, and Darryl D. DesMarteau. "Synthesis of perfluoro-t-butyl trifluorovinyl ether and its copolymerization with TFE." Journal of Fluorine Chemistry 131.1 (2010): 17-20.
Lu, H. and Nutt, S., "Restricted Relaxation in Polymer Nanocomposites near the Glass Transition", Macromolecules, 36.11 (2003):4010-4016.
Lu, T. et al., "Blended Hybrids Based on Silsesquioxane—OH and Epoxy Resins", Journal of Applied Polymer Science, 106.6 (2007):4117-4123.
Lund, L. G., et al. "514. Phosphonitrilic derivatives. Part I. The preparation of cyclic and linear phosphonitrilic chlorides." Journal of the Chemical Society (Resumed) (1960): 2542-2547.
Lysien, M. et al. "55-1: Deposition of Conductive and Insulating Materials at Micrometer Scale for Display-Component Prototyping." SID Symposium Digest of Technical Papers 53.1 (2022).
Mabry, J.M. et al., "Fluorinated Polyhedral Oligomeric Silsesquioxanes (F-POSS)", Angew. Chem. Int. Ed., 47.22 (2008):4137-4140.
Mabry, Joseph M., et al. Ultrahydrophobic Fluorinated Polyhedral Oligomeric Silsesquioxanes (F-POSS)(Preprint). Air Force Research Lab Edwards AFB CA Propulsion Directorate, 2007.
Mackus, A.J.M. et al. "From the bottom-up: toward area-selective atomic layer deposition with high selectivity" Chemistry of Materials 31.1 (2018): 2-12.
Maderna, Andreas, et al. "The syntheses of amphiphilic camouflaged carboranes as modules for supramolecular construction." Journal of the American Chemical Society 123.42 (2001): 10423-10424.
Magda van Leeuwen, et al. "The photochemistry and photophysics of a series of alpha octa(alkyl-substituted) silicon, zinc and palladium phthalocyanines." Photochemical & Photobiological Sciences 13.1 (2014): 62-69.
Maher, Andrew E., and Harry R. Allcock. "Influence of the n-Hexoxy Group on the Properties of Fluoroalkoxyphosphazene Polymers." Macromolecules 38.2 (2005): 641-642.
Maissel, Leon I., and Maurice H. Francombe. An introduction to thin films. CRC Press, 1973. pp. 61-83, 198, 199.
Majhy, B. et al., "Facile Fabrication and Mechanistic Understanding of a Transparent Reversible Superhydrophobic—Superhydrophilic Surface", Scientific Reports, 8 (2018):18018.
Malandrino, Graziella, et al. "New thermally stable and highly volatile Precursors for lanthanum MOCVD: Synthesis and characterization of lanthanum. Beta.-Diketonate Glyme Complexes." Inorganic Chemistry 34.25 (1995): 6233-6234.
Malinowski et al., SID 2019 DIGEST, 1007, 4 pages.
Malonowski, P. et al., "71-3: Organic Photolithography for Displays with Integrated Fingerprint Scanner," SID Symposium Digest of Technical Papers, vol. 50, Issue 1, 2019, pp. 107-1010, ISSN: 0097-996X/19/4802-1007. Retrieved from the internet https://lirias.kuleuven.be/retrieve/550644.
Mao, Hui-Ting, et al. "Recent progress in phosphorescent Ir (III) complexes for nondoped organic light-emitting diodes." Coordination Chemistry Reviews 413 (2020): 213283.
Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.
Marchon, B., et al. "Fomblin Multidentate Lubricants for Ultra-Low Magnetic Spacing." IEEE Transactions on Magnetics 42.10 (2006): 2504-2506.
Marzari, N et al. "Electronic-structure methods for materials design." Nature materials 20.6 (2021): 736-749.
McDowell, Matthew, Ashley E. Wright, and Nathan I. Hammer. "Semiconductor nanocrystals hybridized with functional ligands: New composite materials with tunable properties." Materials 3.1 (2010): 614-637.
McIntosh, Thomas J., et al. "Structure and Interactive Properties of Highly Fluorinated Phospholipid Bilayers." Biophysical Journal 71.4 (1996): 1853-1868.
McMasters, O. D., and K. A. Gschneidner Jr. "Ytterbium-magnesium system." Journal of the Less Common Metals 8.5 (1965): 289-298.
Medenbach, O., et al. "Refractive index and optical dispersion of rare earth oxides using a small-prism technique." Journal of Optics A: Pure and Applied Optics 3.3 (2001): 174.
Meinders, Marcel BJ, William Kloek, and Ton van Vliet. "Effect of surface elasticity on Ostwald ripening in emulsions." Langmuir 17.13 (2001): 3923-3929.
Melville, Owen A., Trevor M. Grant, and Benot H. Lessard. "Silicon phthalocyanines as N-type semiconductors in organic thin film transistors." Journal of Materials Chemistry C 6.20 (2018): 5482-5488.
Michel, U., et al. "Copolymerization of tetrafluoroethylene and 2, 2-bis (trifluoromethyl)-4, 5-difluoro-1, 3-dioxole in supercritical carbon dioxide." Macromolecules 36.19 (2003): 7107-7113.
Michele Ricks. Advanced OLED Materials Enabling Large-Size OLED Displays by Ink Jet Printing. OLEDs World Summit, Sep. 2020.
Mikhaylov, D.Y. and Budnikova, Y.H., "Fluoroalkylation of Organic Compounds", Russian Chemical Reviews, 82.9 (2013):835-864.
Mishra, Shashank, and Stephane Daniele. "Metal-organic derivatives with fluorinated ligands as precursors for inorganic nanomaterials." Chemical Reviews 115.16 (2015): 8379-8448.
Mittal, Kashmiri Lal, ed. Metallized plastics 3: fundamental and applied aspects. Springer Science & Business Media, 2012.
Modzelewski, Tomasz, and Harry R. Allcock. "An unusual polymer architecture for the generation of elastomeric properties in fluorinated polyphosphazenes." Macromolecules 47.19 (2014): 6776-6782.
Morgenstern, Karina, Georg Rosenfeld, and George Comsa. "Decay of two-dimensional Ag islands on Ag (111)." Physical review letters 76.12 (1996): 2113.
Mucur, S.P., et al. "Conventional and inverted organic light emitting diodes based on bright green emmisive polyfluorene derivatives." Polymer 151.12 (2018): 101-107.
Mugisawa, M. et al., "Synthesis and Application of Novel Fluoroalkyl End-Capped Cooligomers Having Adamantane as a Pendant Group", Colloid Polym Sci, 285 (2007):737-744.
Murano, Sven, et al. "30.3: Invited Paper: AMOLED Manufacturing-Challenges and Solutions from a Material Makers Perspective." SID Symposium Digest of Technical Papers. vol. 45. No. 1. 2014.
Muray, M. et al., "NMR Studies of Hydrolysis and Rearrangement Reactions of Cyclophosphazenes", Phosphorus, Sulfur, and Silicon and the Related Elements, 65.1-4 (1992):83-86.
Murcur, S.P., et al., "Charge Carrier Performance of Phosphazene-based Ionic Liquids Doped Hole Transport Layer in Organic Light-emitting Diodes," Applied Physics A, Material Science & Processing, (2020), vol. 126:923, pp. 1-14.
Murotani, Eisuke, et al. "Synthesis and polymerization of a novel perfluorinated monomer." Journal of Fluorine Chemistry 128.10 (2007): 1131-1136.
Murray, M. et al., "NMR Studies of Hydrolysis and Rearrangement Reactions of Cyclophosphazenes", Phosphorus, Sulfur, and Silicon and the Related Elements, 65.1-4 (1992):83-86.
Nabatova-Gabain, Nataliya, Yoko Wasai, and Taiju Tsuboi. "Spectroscopic ellipsometry study of Ir (ppy) 3 organic light emitting diode." Current Applied Physics 6.5 (2006): 833-838.
Nakamura, Daiki, et al. "68-4: Top-emission OLED Kawara-type Multidisplay with Auxiliary Electrode." SID Symposium Digest of Technical Papers. vol. 49. No. 1. 2018.

(56) References Cited

OTHER PUBLICATIONS

Nason, T.C. et al., "Deposition of Amorphous Fluoropolymer Thin Films by Thermolysis of Teflon Amorphous Fluoropolymer", Appl. Phys. Lett. 60 (1992):1866-1868.
Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.
Navarrini, Walter, et al. "Low surface energy coatings covalently bonded on diamond-like carbon films." Diamond and related materials 19.4 (2010): 336-341.
Nicolas, G. and Spiegelmann, F., "Theoretical Study of Ethylene-Noble Metal Complexes", J. Am. Chem. Soc., 112 (1990):5410-5419.
Nishino, T. et al., "The Lowest Surface Free Energy Based on -CF3 Alignment", Langmuir, 15 (1999):4321-4323.
Nittler, Laurent, et al. "Morphology study of small amounts of evaporated gold on polymers." Surface and interface analysis 44.8 (2012): 1072-1075.
Niu, J. et al., "High Order Diffraction Suppression by Quasi-Periodic Two-Dimensional Gratings", Optical Materials Express, 7.2 (2017):366-375.
Notice of Reason for Rejection on Japanese Application No. 2023-518448 dated Dec. 22, 2023.
Nykänen, Virginia P. Silva, et al. "An efficient and stable star-shaped plasticizer for starch: cyclic phosphazene with hydrogen bonding aminoethoxy ethanol side chains." Green Chemistry 16.9 (2014): 4339-4350.
Office Action for Chinese Application No. 202180041306.X dated Aug. 13, 2024.
Office action for Korean Application No. 10-2022-7037670 dated Nov. 20, 2024, 244 pages.
Office Action on Korean Application No. 10-2023-7013418 dated Mar. 28, 2024.
Office Action on Korean Application No. 10-2023-7022930 dated Oct. 10, 2024.
Office Action with English Translation for Chinese Patent Application No. 202180074135.0 dated Feb. 21, 2025, 20 pages.
Office action with English Translation for Japanese Application No. 2022-561483 dated Dec. 19, 2024, 12 pages.
Oh, Il-Kwon, et al. "Hydrophobicity of rare earth oxides grown by atomic layer deposition." Chemistry of Materials 27.1 (2015): 148-156.
Ohnishi Y. et al., "Optical Characteristics of Poly(tetrafluoroethylene) Thin Film Prepared by a Vacuum Evaporation", Jpn. J. Appl. Phys., 55:2S (2016):02BB04.
Ohno, T. R., et al. "Yb and Yb-K fulleride formation, bonding, and electrical character." Physical Review B 46.16 (1992): 10437.
Ohring, Milton. Materials science of thin films. Elsevier, 2001.
Oka, M. and Satoshi, H. "Synthesis of photoresponsive cyclic poly (dimethyl siloxane) s from monodisperse linear precursors" Reactive and functional polymers 158 (2021): 104800.
Okamoto, Yoshiyuki, et al. "New amorphous perfluoro polymers: perfluorodioxolane polymers for use as plastic optical fibers and gas separation membranes." Polymers for Advanced Technologies 27.1 (2016): 33-41.
Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.
Okuyama, Kentaro, et al. "79-4L: Late-News Paper: Highly Transparent LCD using New Scattering-type Liquid Crystal with Field Sequential Color Edge Light." SID Symposium Digest of Technical Papers, 48, 2017.
Olejnik, A. et al., "Silsesquioxanes in the Cosmetics Industry—Applications and Perspectives", Materials, 15.3 (2022):1126-1143.
Olshavsky, Michael, and Harry R. Allcock. "Polyphosphazenes with high refractive indices: optical dispersion and molar refractivity." Macromolecules 30.14 (1997): 4179-4183.
Ottmann, Gerhard, Henry Lederle, and Ehrenfried Kober. "Arylamino Polyfluoroalkoxy Phosphonitriles. New Class of Potential Fire-Resistant Hydraulic Fluids and Lubricants." Industrial & Engineering Chemistry Product Research and Development 5.2 (1966): 202-204.
Owen, M. J. "A review of significant directions in fluorosiloxane coatings" Surface Coatings International Part B: Coatings Transactions 87:B2 (2004).
Özdas, E., et al. "Superconductivity and cation-vacancy ordering in the rare-earth fulleride Yb2.75C60." Nature 375.6527 (1995): 126-129.
Pandharkar, Riddhish, et al. "A Computational Study of AlF3 and ACF Surfaces." Inorganics 6.4 (2018): 124.
Park, Chan II, et al. "54-1: Distinguished Paper: World 1st Large Size 77-inch Transparent Flexible OLED Display." SID Symposium Digest of Technical Papers. Vol. 49. No. 1. 2018.
Park, Eun Ji, et al. "Fabrication of conductive, transparent and superhydrophobic thin films consisting of multi-walled carbon nanotubes." RSC Advances 4.57 (2014): 30368-30374.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.
Paulson, A.E. et al., "Three-Dimensional Profiling of OLED by Laser Desorption Ionization-Mass Spectrometry Imaging", Journal of the American Society for Mass Spectrometry, 31.12 (2020), 2443-2451.
Pearson, Andrew J., et al. "Silicon phthalocyanines as dopant red emitters for efficient solution processed OLEDs." Journal of Materials Chemistry C 5.48 (2017): 12688-12698.
Peters, Richard D., et al. "Using Self-Assembled Monolayers Exposed to X-rays to Control the Wetting Behavior of Thin Films of Diblock Copolymers." Langmuir 16.10 (2000): 4625-4631.
Pham, J.Q. and Green, P.F., "The Glass Transition of Thin Film Polymer/Polymer Blends: Interfacial Interactions and Confinement", J. Chem. Phys., 116.13 (2002):5801-5806.
Piorecka, Kinga, et al. "Hydrophilic Polyhedral Oligomeric Silsesquioxane, POSS (OH) 32, as a Complexing Nanocarrier for Doxorubicin and Daunorubicin." Materials 13.23 (2020): 5512.
Pittman, Allen G., Dennis L. Sharp, and Barbara A. Ludwig. "Polymers derived from fluoroketones. II. Wetting properties of fluoroalkyl acrylates and methacrylates." Journal of Polymer Science Part A-1: Polymer Chemistry 6.6 (1968): 1729-1740.
Plajer, Alex J., et al. "A modular approach to inorganic phosphazane macrocycles." Angewandte Chemie International Edition 56.31 (2017): 9087-9090.
Plajer, Alex J., et al. "Conformational Control in Main Group Phosphazane Anion Receptors and Transporters." Journal of the American Chemical Society 142.2 (2019): 1029-1037.
Plajer, Alex J., et al. "Tailoring the Binding Properties of Phosphazane Anion Receptors and Transporters." Journal of the American Chemical Society 141.22 (2019): 8807-8815.
Plint, Trevor, Benoît H. Lessard, and Timothy P. Bender. "Assessing the potential of group 13 and 14 metal/metalloid phthalocyanines as hole transport layers in organic light emitting diodes." Journal of Applied Physics 119.14 (2016): 145502.
Pocius, A. V. and Dillard, D.A. "Adhesion science and engineering-1: The Mechanics of Adhesion" Elsevier (2002).
Prassides, Kosmas, Yasuhiro Takabayashi, and Takeshi Nakagawa. "Mixed valency in rare-earth fullerides." Philosophical Transactions of the Royal Society A: Mathematical, Physical and Engineering Sciences 366. 1862 (2008): 151-161.
Pu, T. et al., "Effects of Structure Parameters on High-Order Diffraction Suppression of Quasi-Periodic Gratings", Journal of the Optical Society of America B, 35.4 (2018):711-717.
Quan, Wei, et al. "69-2: Transparent Conductive Hybrid Cathode Structure for Top-Emitting Organic Light-Emitting Devices." SID Symposium Digest of Technical Papers. vol. 51. No. 1. 2020.

(56) References Cited

OTHER PUBLICATIONS

Quast, Matthew J., et al. "Synthesis and Physical Properties of Highly Branched Perfluorinated Polymers from AB and AB2 Monomers." Journal of Polymer Science Part A: Polymer Chemistry 53.16 (2015): 1880-1894.
Ramirez, S.M. et al., "Incompletely Condensed Fluoroalkyl Silsesquioxanes and Derivatives: Precursors for Low Surface Energy Materials", J. Am. Chem. Soc. 133.50 (2011):20084-20087.
Ratz, Rudi, et al. "A New Class of Stable Phosphonitrilic Acid Esters. Polyfluoroalkyl Phosphonitrilates." Journal of the American Chemical Society 84.4 (1962): 551-555.
Reichert, V.R. and Mathias, L.J., "Expanded Tetrahedral Molecules from 1,3,5,7-Tetraphenyladarnantane", Macromolecules, 27.24 (1994):7015-7023.
Ren, Zhongjie, and Yan, Shouke. "Polysiloxanes for optoelectronic applications." Progress in Materials Science 83 (2016): 383-416.
Rey, Nadège, et al. "Dumbbell-Shaped T8-POSS with Functional Organic Linkers." European Journal of Inorganic Chemistry 2019. 27 (2019): 3148-3156.
Ribeiro, Paulo, David L. Andrews, and Maria Raposo, eds. Optics, Photonics and Laser Technology 2017. vol. 222. Springer, 2019.
Riberiro, P et al., "Optics, Photonics and Laser Technology 2017", Chapters 2 and 3, Springer (2019).
Richard Koplik. "Ultraviolet and visible spectrometry", url: https://web.vscht.cz/~poustkaj/SFA-9-UV_VIS_spectrometry.pdf.
Riess, Jean G. "Understanding the fundamentals of perfluorocarbons and perfluorocarbon emulsions relevant to in vivo oxygen delivery." Artificial cells, blood substitutes, and biotechnology 33.1 (2005): 47-63.
Ringe, E., "Shapes, Plasmonic Properties, and Reactivity of Magnesium Nanoparticles", J. Phys, Chem. C, 124 (2020):15665.
Roesky, H. W., and E. Niecke. "Darstellung von P3N3F5NH2 und P3N3F5NPCl3." Inorganic and Nuclear Chemistry Letters 4.8 (1968): 463-465.
Roesky, Herbert W. "Lineare und cyclische Chlorphosphazene." Chemische Berichte 105.4 (1972): 1439-1445.
Roesky, Herbert W., Walter Grosse Bowing, and Edgar Niecke. "Über die Darstellung von Fluorcyclotriphosphazenen mit Phosphazenseitenketten." Chemische Berichte 104.2 (1971): 653-660.
Roitman, James N., and Allen G. Pittman. "Wetting properties of acrylic polymers containing perfluoro-t-butyl side chains." Journal of Polymer Science Part B: Polymer Letters 10.7 (1972): 499-503.
Roitman, James N., and Allen G. Pittman. "Wetting properties of bis (trifluoromethyl) carbinyl acrylate polymers." Journal of Polymer Science: Polymer Chemistry Edition 12.7 (1974): 1421-1436.
Rokni-Fard, Mahroo, and Quanmin Guo. "Biased Ostwald ripening in site-selective growth of two-dimensional gold clusters." The Journal of Physical Chemistry C 122.14 (2018): 7801-7805.
Romack, T. J., J. M. DeSimone, and T. A. Treat. "Synthesis of tetrafluoroethylene-based, nonaqueous fluoropolymers in supercritical carbon dioxide." Macromolecules 28.24 (1995): 8429-8431.
Roy, M.R., "Surface Properties of Hard Fluorinated Amorphous Carbon Films Deposited by Pulsed-DC Discharges", Doctoral Thesis, Universitat de Barcelona (2012).
Rudy Dams and Klaus Hintzer, Chapter 1: Industrial Aspects of Fluorinated Oligomers and Polymers, in Fluorinated Polymers: vol. 2: Applications, 2016, pp. 1-31.
Rumyantcev, R. V., and G. K. Fukin. "Intramolecular C—F—Ln dative interactions in lanthanide complexes with fluorinated ligands." Russian Chemical Bulletin 66.9 (2017): 1557-1562.
Rycenga et al., "Controlling the Synthesis and Assembly of Silver Nanostructures for Plasmonic Applications," Chemical Reviews, 2011, 111(6), pp. 3669-3712.
Safonov, Alexey I., et al. "Deposition of thin composite films consisting of fluoropolymer and silver nanoparticles having surface plasmon resonance." Thin Solid Films 603 (2016): 313-316.
Sajoto, Tissa, et al. "Temperature dependence of blue phosphorescent cyclometalated Ir (III) complexes." Journal of the American Chemical Society 131.28 (2009): 9813-9822.
Sakamoto, Keiichi, and Eiko Ohno-Okumura. "Syntheses and functional properties of phthalocyanines." Materials 2.3 (2009): 1127-1179.
Sakka, Tetsuo, and Yukio H. Ogata. "Surface tension of fluoroalkanes in a liquid phase." Journal of fluorine chemistry 126.3 (2005): 371-375.
Sanju, K. S. "Synthesis of Organic Systems and Study of their Light Emitting Properties in Solution and Polymer Matrix." Chapter 1. https://shodhganga.inflibnet.ac.in/bitstream/10603/106813/8/08_chapter%201.pdf.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schenck, Rudolf, and G. Romer. "Uber die Phosphornitrilchloride und ihre Umsetzungen (I.)." Berichte der deutschen chemischen Gesellschaft (A and B Series) 57.8 (1924): 1343-1355.
Schilling, C.I et al., "Fourfold Suzuki-Miyaura and Sonogashira Cross-Coupling Reactions on Tetrahedral Methane and Adamantane Derivatives", Eur. J. Org. Chem., 2011.9 (2011):1743-1754.
Schissel, Paul, and Alvin Warren Czanderna. "Reactions at the silver/polymer interface: a review." Solar Energy Materials 3.1-2 (1980): 225-245.
Schneider, Andreas, Stefan Kairies, and Klaus Rose. "Synthesis of alkoxysilyl substituted cyclophosphazenes and their properties in the sol-gel process." Silicon Chemistry. Springer, Vienna, 1999. 89-98.
Schrögel, Pamela, et al. "Phosphazene-based host materials for the use in blue phosphorescent organic light-emitting diodes." Chemistry of Materials 23.22 (2011): 4947-4953.
Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.
Seebauer, E.G. and Allen, C.E., "Estimating Surface Diffusion Coefficients", Progress in Surface Science, 49.3 (1995): 265-330.
Senaweera, Sameera M., and Jimmie D. Weaver. "Selective Perfluoro- and Polyfluoroarylation of Meldrum's Acid." The Journal of Organic Chemistry 79.21 (2014): 10466-10476.
Senchyk, A.G. et al., "1,2,4-Triazole Functionalized Adamantanes: a New Library of Polydentate Tectons for Designing Structures of Coordination Polymers", Dalton Trans., 41.28 (2012):8675-8689.
Senchyk, G.A. et al., "Functionalized Adamantane Tectons Used in the Design of Mixed-Ligand Copper(II) 1,2,4-Triazolyl/Carboxylate Metal-Organic Frameworks", Inorganic Chemistry, 52.2 (2013):863-872.
Sessler, C.D. et al., "CF2H, a Hydrogen Bond Donor", J. Am. Chem. Soc., 139.27 (2017): 9325-9332.
Shen, Mingmin, et al. "Destabilization of Ag nanoislands on Ag (100) by adsorbed sulfur." The Journal of chemical physics 135.15 (2011): 154701.
Shen, Wen-Jian, et al. "Spirobifluorene-linked bisanthracene: An efficient blue emitter with pronounced thermal stability." Chemistry of materials 16.5 (2004): 930-934.
Shen, Xiao-Min, et al. "Highly photostable silicon(IV) phthalocyanines containing adamantane moieties: synthesis, structure, and properties." Tetrahedron 66.46 (2010): 9041-9048.
Shen. Y, et al. "32.1: Research of Nanocomposite Materials with High Refractive Index for HLEMS Application" SID Symposium Digest of Technical Papers 54 (2023).
Shevlin, S. et al. "Computational materials design." Nature Materials 20.6 (2021): 727-727.
Shi, Lina, et al. "Two dimensional gratings of connected holes for high order diffraction suppression." Optics, Photonics and Laser Technology 2017 (2019): 55-74.
Shi, Shiming, et al. "56-1: Invited Paper: Research on Commercial Foldable AMOLED and Relevant Technologies." SID Symposium Digest of Technical Papers. vol. 51. No. 1. 2020.

(56) References Cited

OTHER PUBLICATIONS

Shi, Yan X., et al. "Synthesis and hydrolytic studies on the air-stable [(4-CN-PhO)(E) P (μ-N t Bu)] 2 (E= O, S, and Se) cyclodiphosphazanes." Inorganic Chemistry 54.13 (2015): 6423-6432.
Shih, H. et al., "A Cross-Linkable Triphenylamine Derivative as a Hole Injection/Transporting Material in Organic Light-Emitting Diodes", Polym. Chem., 6 (2015):6227-6237.
Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.
Shin, Dong-Youn, and Inyoung Kim. "Self-patterning of fine metal electrodes by means of the formation of isolated silver nanoclusters embedded in polyaniline." Nanotechnology 20.41 (2009): 415301.
Shirasaki, Yasuhiro. Efficiency loss mechanisms in colloidal quantum-dot light-emitting diodes. Diss. Massachusetts Institute of Technology, 2013.
Shizu, Katsuyuki, et al. "Highly efficient blue electroluminescence using delayed-fluorescence emitters with large overlap density between luminescent and ground states." The Journal of Physical Chemistry C 119.47 (2015): 26283-26289.
Silicone Fluids, p. 20, retrieved from <https://s3.amazonaws.com/gelest/product-brochures/Inert_Silicones.pdf> on Mar. 24, 2022.
Sim, Ying, et al. "Orthogonality in main group compounds: a direct one-step synthesis of air-and moisture-stable cyclophosphazanes by mechanochemistry." Chemical Communications 54.50 (2018): 6800-6803.
Singh, Anurima, Lee Steely, and Harry R. Allcock. "Poly [bis (2, 2, 2-trifluoroethoxy) phosphazene] superhydrophobic nanofibers." Langmuir 21.25 (2005): 11604-11607.
Singh, Rajendra Prasad, et al. "A Novel Synthesis of Hexakis (trifluoromethyl) cyclotriphosphazene. Single-Crystal X-ray Structures of N3P3 (CF3) 6 and N3P3F6." Inorganic Chemistry 39.2 (2000): 375-377.
Sinha, A., et al., "Area selective atomic layer deposition of titanium dioxide: Effect of precursor chemistry", Journal of Vacuum Science & Technology B: Microelectronics and Nanometer Structures Processing, Measurement, and Phenomena, 2006, 24(6), 2523.
Smith, Arthur RG, Paul L. Burn, and Ben J. Powell. "Spin—Orbit Coupling in Phosphorescent Iridium (III) Complexes." ChemPhysChem 12.13 (2011): 2429-2438.
Smith, Arthur RG, Paul L. Burn, and Benjamin J. Powell. "Exact exchange and the density functional theory of metal-to-ligand charge-transfer in fac-Ir (ppy) 3." Organic Electronics 33 (2016): 110-115.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Snyder Jr, Carl E. "Structural Modifications of Fluoro-alkyl S-Triazines and Their Lubricant Properties." Asle Transactions 14.3 (1971): 237-242.
Sohn, I. et al. "Improved modeling of material deposition during OLED manufacturing using direct simulation monte carlo method on GPU Architecture." International Journal of Precision Engineering and Manufacturing-Green Technology 6 (2019): 861-873.
Sohn, I. et al. "Numerical Experiment Using Direct Simulation Monte Carlo for Improving Material Deposition Uniformity During OLED Manufacturing." International Journal of Precision Engineering and Manufacturing-Green Technology (2021): 1-14.
Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Song, Wook, and Jun Yeob Lee. "Degradation mechanism and lifetime improvement strategy for blue phosphorescent organic light-emitting diodes." Advanced Optical Materials 5.9 (2017): 1600901.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.
Spelt, J. K., Absolom, D. R., Neumann, A. W. "Solid Surface Tension: The Interpretation of Contact Angles by the Equation of State Approach and the Theory of Surface Tension Components." Langmuir 2.5 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Spoljaric, S. et al., "Novel Elastomer-Dumbbell Functionalized POSS Composites: Thermomechanical and Morphological Properties", Journal of Applied Polymer Science, 123.1 (2012):585-600.
Starr, F.W. et al., "Bound Layers 'Cloak' Nanoparticles in Strongly Interacting Polymer Nanocomposites", ACS Nano, 10.12 (2016):10960-10965.
Steely, Lee B., et al. "Foam formation from fluorinated polyphosphazenes by liquid CO2 processing." Polymer Engineering & Science 48.4 (2008): 683-686.
Stokes, H. N. "On trimetaphosphimic acid and its decomposition-products." Amer. chem. J. 18 (1986): 629-663.
Stokes, Ho No. "On the chloronitrides of phosphorus." Amer. Chem. 17 (1985): 275-291.
Sun, J. et al. "6-4: Late-News Paper: Realizing Deep Blue Emission in Blue Phosphorescent Organic Light-Emitting Diodes", SID Symposium Digest of Technical Papers, 51,2020: 65-66.
Sun, J. et al. "Realizing Deep Blue Emission in Blue Phosphorescent Organic Light-Emitting Diodes", SID Symposium Digest of Technical Papers, 2020.
Sun, T. et al., "Reversible Switching between Superhydrophilicity and Superhydrophobicity", Angew. Chem. Int. Ed., 43.3 (2004):357-360.
Sundaram, P. M., et al. "The Reaction of N4P4Cl8 with Dibenzylamine: Formation of an Unusual Bicyclic Phosphazene, N4P4 [N (CH2Ph) 2] 6 (NCH2Ph), by Dealkylation." Phosphorus and Sulfur and the Related Elements 8.3 (1980): 373-374.
Süzen, Yasemin, and Simge Metinoglu. "Novel cyclomatrix-type polyphosphazene microspheres crosslinked with octachlorocyclotetraphosphazene: preparation and characterization." Anadolu University Journal of Science and Technology A-Applied Sciences and Engineering 18.5 (2017): 973-987.
Svorcik, V. et al., "Deposition of Polystyrene Films by Vacuum Evaporation", Journal of Materials Science Letters, 16 (1997):1564-1566.
Syafiq, A., et al. "Superhydrophilic Smart Coating for Self-Cleaning Application on Glass Substrate." Journal of Nanomaterials 2018 (2018).
Szabó, Dénes, et al. "Synthesis of novel lipophilic and/or fluorophilic ethers of perfluoro-tert-butyl alcohol, perfluoropinacol and hexafluoroacetone hydrate via a Mitsunobu reaction: Typical cases of ideal product separation." Journal of Fluorine Chemistry 126.4 (2005): 639-650.
Szabó, Dénes, et al. "Synthesis of novel lipophilic and/or fluorophilic ethers of perfluoro-tert-butyl alcohol, perfluoropinacol and hexafluoroacetone hydrate via a Mitsunobu reaction: Typical cases of ideal product separation." Journal of fluorine chemistry 126.4 (2005): 641-652.
Takele, H et al., "Plasmonic Properties of Ag Nanoclusters in Various Polymer Matrices", Nanotechnology, 17.14 (2006):3499-3505.
Tang, Meixian, et al. "Inhibition of bacterial adhesion and biofilm formation by a textured fluorinated alkoxyphosphazene surface." Bioactive Materials 6.2 (2021): 447-459.

(56) References Cited

OTHER PUBLICATIONS

Tang, Quan, et al. "28-2: Study of the Image Blur through FFS LCD Panel Caused by Diffraction for Camera under Panel." SID Symposium Digest of Technical Papers. vol. 51. No. 1. 2020.
Tao, C. et al., "Highly Icephobic Properties on Slippery Surfaces Formed From Polysiloxane and Fluorinated POSS", Progress in Organic Coatings, 103 (2017):48-59.
Tarasevich, Y. I. "Surface energy of oxides and silicates." Theoretical and Experimental Chemistry 42 (2006): 145-161.
Thran, A., et al. "Condensation coefficients of Ag on polymers." Physical review letters 82.9 (1999): 1903-1906.
Thran, A., et al. "Condensation coefficients of Ag on polymers." Physical review letters 82.9 (1999): 1903.
Thurston, John H., et al. "Toward a General Strategy for the Synthesis of Heterobimetallic Coordination Complexes for Use as Precursors to Metal Oxide Materials:? Synthesis, Characterization, and Thermal Decomposition of Bi2(Hsal)6?M(Acac)3 (M = Al, Co, V, Fe, Cr)." Inorganic chemistry 43.10 (2004): 3299-3305.
Tian, Zhicheng, Chen Chen, and Harry R. Allcock. "New Mixed-Substituent Fluorophosphazene High Polymers and Small Molecule Cyclophosphazene Models: Synthesis, Characterization, and Structure Property Correlations." Macromolecules 48.5 (2015): 1483-1492.
Tian, Zhicheng, et al. "Limits to expanding the PN-F series of polyphosphazene elastomers." Polymer Engineering & Science 54.8 (2014): 1827-1832.
Tian, Zhicheng, et al. "Phosphazene high polymers and models with cyclic aliphatic side groups: new structure—property relationships." Macromolecules 48.13 (2015): 4301-4311.
Tokuchi. S et al. "8-4: Oxide Semiconductor In—Zn—O—X system with High Electron Mobility." SID Symposium Digest of Technical Papers 54.1 (2023).
Tong, T. et al., "Adhesion in Organic Electronics Structures", Journal of Applied Physics, 106.8 (2009): 083708.
Töpper, T. et al. "Siloxane-based thin films for biomimetic low-voltage dielectric actuators." Sensors and Actuators A: Physical 233 (2015): 32-41.
Töpper, Tino, et al. "Tailoring the mass distribution and functional group density of dimethylsiloxane-based films by thermal evaporation." APL Materials 4.5 (2016): 056101.
Trautner, Frank, et al. "Gas-Phase Structure of Hexakis (trifluoromethyl)-cyclotriphosphazene,[(CF3) 2PN] 3." Inorganic Chemistry 39.23 (2000): 5398-5399.
Tsai, Yu-Hsiang, et al. "P-202: A Flexible Transparent OLED Display with FlexUPTM Technology." SID Symposium Digest of Technical Papers. vol. 48. No. 1. 2017.
Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).
Tsuji, Kosuke, and Tsuyoshi Tsujioka. "Metal patterning for organic electronics based on metal undeposition effect on soft polymer surfaces." 2011 International Conference on Solid State Devices and Materials, Nagoya, 2011, pp. 380-381.
Tsujioka, Tsuyoshi, and Akari Nishimura. "Selective noble-metal deposition modulation on photocurable polydimethylsiloxane films for electronics device applications." Applied Physics A 127 (2021): 1-8.
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Metal-vapor integration/transportation based on metal-atom desorption from polymer surfaces with a low glass-transition temperature." Journal of Vacuum Science & Technology A 35.2 (2017).
Tsujioka, Tsuyoshi, et al. "Selective metal deposition on photoswitchable molecular surfaces." Journal of the American Chemical Society 130.32 (2008): 10740-10747.
Tsujioka, Tsuyoshi, Rie Takagi, and Takahiro Shiozawa. "Light-controlled metal deposition on photochromic polymer films."? Journal of Materials Chemistry?20.43 (2010): 9623-9627.
Tu, Kuan-Heng, et al. "A cyano-rich small molecule dopant for organic thermoelectrics." Organic Electronics 87 (2020): 105978.
Tuteja, A. et al., "Designing Superoleophobic Surfaces", Science, 318.5856 (2007):1618-1622.
Ullah, Raja Summe, et al. "Synthesis of polyphosphazenes with different side groups and various tactics for drug delivery." RSC advances 7.38 (2017): 23363-23391.
Umemoto, Teruo, et al. "Discovery of practical production processes for arylsulfur pentafluorides and their higher homologues, bis- and tris(sulfur pentafluorides): Beginning of a new era of 'super-trifluoromethyl' arene chemistry and its industry." Beilstein Journal of Organic Chemistry 8 (2012): 461-471.
Uslu, A. and Yesilot, S., "Chiral Configurations in Cyclophosphazene Chemistry", Coordination Chemistry Reviews, 291 (2015):28-67.
Usui, H. et al., "Anthracene and Polyethylene Thin Film Depositions by lonized Cluster Beam", J. Vac. Sci. Technol., 4.1 (1986):52-60.
Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.
Usui, H., "Deposition of Polymeric Thin Films by Ionization-Assisted Method", IEICE Trans. Electron., E83-C:7 (2000):1128-1133.
Vampola, K. J. et al. "12-1: Invited Paper: Through-OLED Display Ambient Color Sensing." SID Symposium Digest of Technical Papers. 53.1 (2022).
Vampola, K. J. et al. "12-1: Through-OLED Display Ambient Color Sensing." Apple, Cupertino CA.
Van de Grampel, R.D., "Surfaces of Fluorinated Polymer Systems", Doctoral Thesis, Technische Universiteit Eindhoven (2002).
Varagnolo, Silvia, et al. "Embedded-grid silver transparent electrodes fabricated by selective metal condensation," Journal of Materials Chemistry C 8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vasilak, L. et al., "A statistical paradigm for organic optoelectronic devices: normal force testing for adhesion of OPVs and OLEDs", ACS Appl. Mater. Interfaces, 9.15 (2017), 13347-13356.
Vasilak, L. et al., "Statistical Paradigm for Organic Optoelectronic Devices: Normal Force Testing for Adhesion of Organic Photovoltaics and Organic Light-Emitting Diodes", ACS Appl. Mater. Interfaces, 9.15 (2017), 13347-13356.
Vassileva, P., et al. "XPS determination of the binding energies of phosphorus and nitrogen in phosphazenes." Journal of materials science 39.9 (2004): 3201-3202.
Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).
Vitos, Levente, et al. "The surface energy of metals." Surface science 411.1-2 (1998): 186-202.
Vogelsang, D.F. et al., "Separation of Asymmetrically Capped Double-Decker Silsesquioxanes Mixtures", Polyhedron, 155 (2018): 189-193.
Von R. Schleyer, P. and Nicholas, R. D., "The Reactivity of Bridgehead Compounds of Adamantane", J. Am. Chem. Soc., 83.12 (1961):2700-2707.
Vu, B.D. et al., "Simple Two-step Procedure for the Synthesis of Memantine Hydrochloride from 1,3-Dimethyl-adamantane", ACS Omega, 5.26 (2020):16085-16088.
Wadley, Maurice L., et al. "Solvent Dependence of the Morphology of Spin-Coated Thin Films of Polydimethylsiloxane-Rich Polystyrene-block-Polydimethylsiloxane Copolymers." Macromolecules 45.13 (2012): 5538-5545.

(56) References Cited

OTHER PUBLICATIONS

Wahl, Helene, Delia A. Haynes, and Tanya le Roex. "A series of polymorphs of hexakis (4-fluorophenoxy) cyclotriphosphazene." Crystal growth & design 12.8 (2012): 4031-4038.
Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.
Walsh, Patrick N., Harold W. Goldstein, and David White. "Vaporization of Rare-Earth Oxides." Journal of the American Ceramic Society 43.5 (1960): 229-233.
Wang, B. et al., "Graded-Index Fluoropolymer Antireflection Coatings for Invisible Plastic Optics", Nano Lett. 19.2 (2019):787-792.
Wang, C. et al., "Stable Superhydrophobic Polybenzoxazine Surfaces over a Wide pH Range", Langmuir, 22.20 (2006):8289-8292.
Wang, Hailiang, et al. "P-132: An Under-Display Camera Optical Structure for Full-Screen LCD." SID Symposium Digest of Technical Papers. vol. 51. No. 1. 2020.
Wang, J. et al. "A new fluorinated polysiloxane with good optical properties and low dielectric constant at high frequency based on easily available tetraethoxysilane (TEOS)." Macromolecules 50.23 (2017): 9394-9402.
Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.
Wang, Maw Ling, and Ho Sheng Wu. "Kinetic study of the substitution reaction of hexachlorocyclotriphosphazene with 2, 2, 2-trifluoroethanol by phase-transfer catalysis and separation of the products." Industrial & engineering chemistry research 29.10 (1990): 2137-2142.
Wang, Y. et al., "Substrate Effect on the Melting Temperature of Thin Polyethylene Films", Physical Review Letters, 96.2 (2006):028303.
Wang, Y., and Q. J. Wang. "Lubrication regimes." Encyclopedia of Tribology (2013): 1903-2158.
Wang, Y., and Q. J. Wang. "Lubrication regimes." Encyclopedia of Tribology (2013): 2056.
Wang, Zhibin, et al. "55-1: Invited Paper: Self-Assembled Cathode Patterning in AMOLED for Under-Display Camera." SID Symposium Digest of Technical Papers. vol. 51. No. 1. 2020.
Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Wei, H. and Eilers, H., "Electrical Conductivity of Thin-Film Composites Containing Silver Nanoparticles Embedded in a Dielectric Fluoropolymer Matrix", Thin Solid Films, 517.2 (2008):575-581.
Wei, H. and Eilers, H., "Electrical Conductivity of Thin-Film Composites Containing Silver Nanoparticles Embedded in a Dielectric Teflon® AF Matrix (Pre-print version)", Thin Solid Films, 517.2 (2008):575-581.
Wei, Qiang, et al. "Small-Molecule Emitters with High Quantum Efficiency: Mechanisms, Structures, and Applications in OLED Devices." Advanced Optical Materials 6.20 (2018): 1800512.
Weigel, W.K. et al., "Direct Radical Functionalization Methods to Access Substituted Adamantanes and Diamondoids", Org. Biomol. Chem., 20 (2022):10-36.
Weimer, P. K. "Physics of Thin Films, vol. 2.". Academic Press, (1964).
Weiss, F.M. et al., "Molecular Beam Deposition of High-Permittivity Polydimethylsiloxane for Nanometer-Thin Elastomer Films in Dielectric Actuators", Materials and Design, 105 (2016):106-113.
Wheeler, Bob L., et al. "A silicon phthalocyanine and a silicon naphthalocyanine: synthesis, electrochemistry, and electrogenerated chemiluminescence." Journal of the American Chemical Society 106.24 (1984): 7404-7410.
Wilcock, Donald F. "Vapor pressure-viscosity relations in methylpolysiloxanes." Journal of the American Chemical Society 68.4 (1946): 691-696.
Winget, P. et al. "57-1: Accelerating Next-Generation Display Materials Development with a Smart Digital Chemistry Platform." SID Symposium Digest of Technical Papers 54.1 (2023).
Winter, R. W., et al. "The application of novel methodology for the synthesis of o-, m-, and p-(SF5-perfluoroethyl) benzene derivatives." Journal of fluorine chemistry 122.2 (2003): 251-253.
Wojtczak, L., "The Melting Point of Thin Films", Phys. Stat. Sol., 23.2 (1967):K163-K166.
Wolf, Florian F., Joerg-M. Neudoerfl, and Bernd Goldfuss. "Hydrogen-bonding cyclodiphosphazanes: superior effects of 3, 5-(CF 3) 2-substitution in anion-recognition and counter-ion catalysis." New Journal of Chemistry 42.7 (2018): 4854-4870.
Wolfgang Decker, Vast Films, Ltd. "Pattern Metallization: Selective Deposition of Metals on Polymer Films for Functional Applications" AIMCAL Fall Conference 2005.
Wu, Y. et al. "P-13.5: Investigation on Chromatic Dispersion of Reflection for CFOT Display" SID Symposium Digest of Technical Papers 54 (2023).
Wu, Yinghua, and Jean-Luc Bredas. "Simulations of the emission spectra of fac-tris (2-phenylpyridine) iridium and Duschinsky rotation effects using the Herman-Kluk semiclassical initial value representation method." The Journal of chemical physics 129.21 (2008): 214305.
Wu, Zhongyuan, et al. "34-2: Distinguished Paper: Development of 55inch 8K AMOLED TV by Inkjet Printing Process." SID Symposium Digest of Technical Papers. vol. 51. No. 1. 2020.
Xia, Bo, M. W. Ruckman, and Myron Strongin. "Photoelectron study of Yb/C60 bilayers and the Yb fullerides formed at the interfaces." Physical Review B 48.19 (1993): 14623.
Xia, Zhen-Yuan, et al. "High performance organic light-emitting diodes based on tetra (methoxy)-containing anthracene derivatives as a hole transport and electron-blocking layer." Journal of Materials Chemistry 20.38 (2010): 8382-8388.
Xie, Changqing, et al. "Towards high-order diffraction suppression using two-dimensional quasi-periodic gratings." Optics, Photonics and Laser Technology 2017 (2019): 31-53.
Xie, J et al., "Regioselective Synthesis of Methyl-Substituted Adamantanes for Promoting Oxidation Stability of High-Density Fuels", Energy Fuels, 34.4 (2020):4516-4524.
Xu, Guang-Rui, Miao-Jun Xu, and Bin Li. "Synthesis and characterization of a novel epoxy resin based on cyclotriphosphazene and its thermal degradation and flammability performance." Polymer degradation and stability 109 (2014): 240-248.
Xu, Haoran, et al. "Fabrication of copper patterns on polydimethylsiloxane through laser-induced selective metallization." Industrial & Engineering Chemistry Research 60.24 (2021): 8821-8828.
Xu, Hua, et al. "Transparent AMOLED Display Derived by Metal Oxide Thin Film Transistor with Praseodymium Doping." Proceedings of the International Display Workshops vol. 26 (IDW '19). 2019.
Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009):4740-4745.
Xu, Pengyun, et al. "Superhydrophobic ceramic coating: Fabrication by solution precursor plasma spray and investigation of wetting behavior." Journal of Colloid and Interface Science 523 (2018):35-44.
Xu, X. et al. "A Unified Spatial-Angular Structured Light for Single-View Acquisition of Shape and Reflectance" Proceedings of the IEEE/CVF Conference on Computer Vision and Pattern Recognition (2023).
Xu, Y. et al. "Depth Estimation by Combining Binocular Stereo and Monocular Structured-Light" Proceedings of the IEEE/CVF Conference on Computer Vision and Pattern Recognition (2022).
Yamada, Toshikazu, et al. "Nanoparticle chemisorption printing technique for conductive silver patterning with submicron resolution." Nature communications 7.1 (2016): 1-9.
Yang, H. et al., "Catalyst-Controlled C-H Functionalization of Adamantanes Using Selective H-Atom Transfer", ACS Catal., 9.6 (2019):5708-5715.

(56) References Cited

OTHER PUBLICATIONS

Yang, J. et al. "25-4: Methodology and Correlation of Al-Based Design for OLED Materials." SID Symposium Digest of Technical Papers 52.1 (2021).
Yang, J. et al. "25.4: Methodology and Correlation of AI-Based Design for OLED Materials." SID2021 Symposium.
Yang, Jun-Yu, et al. "32-3: AMOLED IR Drop Compensation for Channel Length Modulation." SID Symposium Digest of Technical Papers. vol. 51. No. 1. 2020.
Yang, Min K., Roger H. French, and Edward W. Tokarsky. "Optical properties of Teflon® AF amorphous fluoropolymers." Journal of Micro/Nanolithography, MEMS, and MOEMS 7.3 (2008): 033010.
Yanyan, Z. H. U., F. A. N. G. Zebo, and L. I. U. Yongsheng. "Structural and optical properties of Er2O3 films." Journal of Rare Earths 28.5 (2010): 752-755.
Yao, Pan, et al. "Highly soluble and thermally stable copolyimides modified with trifluoromethyl and siloxane." Journal of Applied Polymer Science 132.13 (2015).
Yao, Wenqiang, Yongjun Li, and Xiaoyu Huang. "Fluorinated poly (meth) acrylate: Synthesis and properties." Polymer 55.24 (2014): 6197-6211.
Yao, Y. et al. "P-7.12: Research on High Brightness Mode Uniformity Problem of Flexible AMOLED Mobile" SID Symposium Digest of Technical Papers 54 (2023).
Yao, Z. et al. "Inverse design of nanoporous crystalline reticular materials with deep generative models." Nature Machine Intelligence 3.1 (2021): 76-86.
Yersin, Hartmut, et al. "Design of a new mechanism beyond thermally activated delayed fluorescence toward fourth generation organic light emitting diodes." Chemistry of Materials 31.16 (2019): 6110-6116.
Yersin, Hartmut, et al. "The triplet state of organo-transition metal compounds. Triplet harvesting and singlet harvesting for efficient OLEDs." Coordination Chemistry Reviews 255.21-22 (2011): 2622-2652.
Yeung, Leo WY, Christopher Stadey, and Scott A. Mabury. "Simultaneous analysis of perfluoroalkyl and polyfluoroalkyl substances including ultrashort-chain C2 and C3 compounds in rain and river water samples by ultra performance convergence chromatography." Journal of Chromatography A 1522 (2017): 78-85.
Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.
Yoo, D. et al. "Retrosynthesis Planning for Thermally Activated Delayed Fluorescence Molecules" The 21st International Meeting on Information Display, Seoul, Korea (2021).
Yook, Kyoung Soo, and Jun Yeob Lee. "Organic materials for deep blue phosphorescent organic light-emitting diodes." Advanced materials 24.24 (2012): 3169-3190.
Yoshinaga, Harunobu, et al. "Spin-orbit coupling analyses of phosphorescence: the effects of cyclometalated ligand replacement in fac-Ir (ppy) 3 with various bpy ligands on blue phosphorescence." RSC advances 6.69 (2016): 65020-65030.
Youn, S. et al. "73-4: Novel Materials and Structures for High Efficiency and Long Lifetime Green Phosphorescent OLEDs in Automotive Applications." SID 2022 Symposium.
Youn, S. et al. "73-4: Novel Materials and Structures for High Efficiency and Long Lifetime Green Phosphorescent OLEDs in Automotive Applications." SID Symposium Digest of Technical Papers. 53.1 (2022).
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Yuan, Fulong, et al. "A modified method for preparation of a pure octachlorocyclotetraphosphazene." Phosphorus, Sulfur, and Silicon and the Related Elements 176.1 (2001): 77-81.
Yuan, Y., D. Grozea, and Z. H. Lu. "Fullerene-doped hole transport molecular films for organic light-emitting diodes." Applied Physics Letters 86.14 (2005).
Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).
Zalewski, K et al., "A Review of Polysiloxanes in Terms of Their Application in Explosives", Polymers, 13.7 (2021):1080-1090.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method." Surface science 532 (2003): 300-305.
Zaporojtchenko, V., et al. "Determination of condensation coefficients of metals on polymer surfaces." Surface science 454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zarian, J., P. C. Painter, and M. M. Coleman. "Vibrational Spectra and Normal Coordinate Calculations of Chlorophosphazene Compounds. II. Octachlorocyclotetraphosphazene." Applied Spectroscopy 36.3 (1982): 272-277.
Zeng, Yang, et al. "28-4: Investigation of Moire Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects." SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, Tianyu, et al. "Transparent white organic light-emitting devices with a LiF/Yb: Ag cathode." Optics letters 34.8 (2009): 1174-1176.
Zhang, Tianzhan, et al. "Bio-inspired superhydrophilic coatings with high anti-adhesion against mineral scales." NPG Asia Materials 10.3 (2018): e471-e471.
Zhang, W. et al., "Polymer/polyhedral Oligomeric Silsesquioxane (POSS) Nanocomposites: An Overview of Fire Retardance", Progress in Polymer Science, 67 (2017):77-125.
Zhang, W. et al., "Why We Need to Look Beyond the Glass Transition Temperature to Characterize the Dynamics of Thin Supported Polymer Films", PNAS Latest Articles, 115.22 (2018):5641-5646.
Zhang, Xu, et al. "General approach to compute phosphorescent OLED efficiency." The Journal of Physical Chemistry C 122.11 (2018): 6340-6347.
Zhang, Xuan, et al. "Synthesis of extended polycyclic aromatic hydrocarbons by oxidative tandem spirocyclization and 1, 2-aryl migration." Nature communications 8.1 (2017): 1-8.
Zhang, Yongjie, Mingshuai Fan, and Xiaopei Li. "Reaction of "unreactive" silicone: synthesis of long-chain alkyl fluorosilicone via a simple siloxane equilibration process." Polymer Bulletin 77.6 (2020): 2855-2871.
Zhang, Zhenhua. "74-3: Image Deblurring of Camera Under Display by Deep Learning." SID Symposium Digest of Technical Papers. vol. 51. No. 1. 2020.
Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.
Zhao, Xuan, et al. "P-233: Late-News-Poster: Color Shift Improvement of AMOLED Device with Color Filter." SID Symposium Digest of Technical Papers. vol. 51. No. 1. 2020.

(56) References Cited

OTHER PUBLICATIONS

Zharkova, N. M., M. A. Kleinovskaya, and Yu K. Molokanov. "Evaporation of oligoorganic siloxanes under hgh vacuum." Chemistry and Technology of Fuels and Oils 5.4 (1969): 257-261.
Zheng, Bi-Yuan, et al. "Synthesis and antifungal photodynamic activities of a series of novel zinc(II) phthalocyanines substituted with piperazinyl moieties." Dyes and Pigments 99.1 (2013): 185-191.
Zheng, Dongxiao, Pei Zhao, and Liangliang Zhu. "Non-conjugated and p-conjugated functional ligands on semiconductive quantum dots." Composites Communications 11 (2019): 21-26.
Zhu, C. et al. "A novel synthetic UV-curable fluorinated siloxane resin for low surface energy coating." Polymers 10.9 (2018): 979.
Zhu, X. L., et al. "29.3: Very Bright and Efficient Top-Emitting OLED with Ultra-Thin Yb as Effective Electron Injector." SID Symposium Digest of Technical Papers. vol. 37. No. 1. Oxford, UK: Blackwell Publishing Ltd, 2006.
Zibarov, A. et al., "AB5 Derivatives of Cyclotriphosphazene for the Synthesis of Dendrons and Their Applications", Molecules, 26.13 (2021):4017-4040.
International Search Report and Written Opinion for PCT Application No. PCT/IB2021/052980 dated Aug. 2, 2021 (10 pages).
International Search Report and Written Opinion for PCT Application No. PCT/IB2021/054230 dated Aug. 2, 2021 (9 pages).
International Search Report and Written Opinion for PCT Application No. PCT/IB2021/055232 dated Sep. 22, 2021 (12 pages).
International Search Report and Written Opinion for PCT Application No. PCT/IB2021/056685 dated Oct. 26, 2021 (7 pages).
International Search Report and Written Opinion for PCT Application No. PCT/IB2021/058323 dated Dec. 8, 2021 (12 pages).
International Search Report and Written Opinion for PCT Application No. PCT/IB2021/059300 dated Dec. 23, 2021 (15 pages).
Kachan et al., "High-absorbing Gradient Multilayer Coatings with Silver Nanoparticles," Applied Physics B, 2006, 84, pp. 281-287.
Cho, H.U. et al. "Enhancement of Current Efficiency for OLED Devices Using Meta-Heuristic Algorithm." 2021 Virtual Display Week International Symposium (2021) 19 pages.
Decision of Rejection for CN Appl. No. 202180041306.X dated Mar. 31, 2025 (27 pages with English language translation).
English translation Office Action for Chinese Patent Application No. 2021800611499, 3 pages.
International Search Report and Written Opinion for PCT Application No. PCT/IB2022/061385 dated Feb. 22, 2022, 7 pages.
JP Notice of Reasons for Rejection on JP Appl. No. 2023-545811 dated Aug. 14, 2025 (11 pages with English translation) (Keyword: Eng trans).
JP Notice of Rejection on JP Appl. No. 2023-526153 dated Aug. 1, 2025 (10 pages with English language translation).
JP Office Action on JP Appl. No. 2022-561483 dated Jul. 1, 2025 (8 pages with English language translation).
JP Office Action on JP Appl. No. 2023-515731 dated Jun. 6, 2025 (7 pages with English language translation).
KR Office Action on KR Appl. No. 10-2022-7037670 dated Jul. 7, 2025 (23 pages with English language translation).
KR Office Action on KR Appl. No. 10-2023-7001216 dated Jun. 26, 2025 (20 Pages with English language translation).
KR Office Action on KR Appl. No. 10-2023-7030369 dated Jun. 26, 2025 (24 pages with English language translation).
KR Office Action on KR Application No. 10-2023-7015326 dated Jun. 25, 2025 (14 pages with English language translation).
Malinowski, et al., "Photolithography as Enabler of AMOLED Displays Beyond 1000 ppi," SID Symposium, Seminar, and Exhibition 2017, Display Week 2017. May 21, 2017 through May 26, 2017, pp. 623-262.
Notice for Reasons for Rejection on Japanese Appl. No. 2022-576446 dated May 12, 2025 (8 pages with English language translation).
Notice of Reasons for Rejection on JP Appl. No. 2023-504772 dated May 21, 2025 (16 pages with English language translation).
Notification of Grounds for Refusal for Korean App. No. 10-2023-7005506 dated May 9, 2025 (13 pages with English language translation).
Notification of Transmittal of The International Search Report and Written Opinion for PCT Application No. PCT/IB2021/058663 dated Dec. 31, 2021, 8 pages.
Office Action on CN Appl. No. 202180055454.7 dated Sep. 27, 2025 (10 pages with English language translation).
Office action with English Translation for Chinese Application No. 202180041306.X dated Jan. 14, 2025, 21 pages with English language translation.
Search Report for European Application No. 21822884.9 dated Jul. 3, 2024, 3 pages.
Final Office Action for JP App. No. 2022-576446 dated Oct. 14, 2025 (with English translation, 4 pages).
First and Second Office Action for CN App. No. 202180061149.9 dated Oct. 31, 2025 (10 pages).
JP Decision of Refusal for JP Appl. No. 2023-526153 dated Feb. 24, 2026 (8 pages).
JP Notices of Reasons for Rejection for JP Appl. No. 2024-156739 dated Mar. 26, 2026 (4 pages).
KR Final Rejection for KR Appl. No. 10-2023-7001216 dated Mar. 19, 2026 (9 pages).
JP Decision on Refusal on JP Appl. No. 2023-515731 dated May 27, 2026 (4 pages with English language translation).

* cited by examiner 330
1030
1020
1320
1340
10
1310
1040

NUCLEATION-INHIBITING COATING CONTAINING RARE EARTH COMPOUNDS AND DEVICES INCORPORATING SAME

RELATED APPLICATIONS

The present application is a National Stage Entry under 35 U.S.C. § 371 of International Application No. PCT/IB2021/054230, filed 17 May 2021, which claims the benefit of priority to: U.S. Provisional Patent Application No. 63/025,828 filed 15 May 2020, U.S. Provisional Patent Application No. 63/107,393 filed 29 Oct. 2020, U.S. Provisional Patent Application No. 63/153,834 filed 25 Feb. 2021, U.S. Provisional Patent Application No. 63/163,453 filed 19 Mar. 2021 and U.S. Provisional Patent Application No. 63/181,100 filed 28 Apr. 2021, the contents of each which are incorporated herein by reference in their entirety.

TECHNICAL FIELD

The present disclosure relates to layered devices and in particular to a patterning coating, which may act as, and/or be a nucleation-inhibiting coating (NIC), and a layered device forming an opto-electronic device having first and second electrodes separated by a semiconductor layer and having a deposited layer deposited thereon, patterned using a patterning coating, which may act as, and/or be such NIC.

BACKGROUND

In an opto-electronic device such as an organic light emitting diode (OLED), at least one semiconducting layer is disposed between a pair of electrodes, such as an anode and a cathode. The anode and cathode are electrically coupled to a power source and respectively generate holes and electrons that migrate toward each other through the at least one semiconducting layer. When a pair of holes and electrons combine, a photon may be emitted.

OLED display panels may comprise a plurality of (sub-) pixels, each of which has an associated pair of electrodes. Various layers and coatings of such panels are typically formed by vacuum-based deposition techniques.

In some applications, there may be an aim to provide a closed coating of a conductive deposited material in a pattern for each (sub-) pixel of the panel across either or both of a lateral and a cross-sectional aspect thereof, by selective deposition of at least one thin film of the deposited material to form a device feature, such as, without limitation, an electrode, and/or a conductive element electrically coupled thereto, during the OLED manufacturing process.

One method for doing so, in some non-limiting applications, involves the interposition of a fine metal mask (FMM) during deposition of such deposited material. However, deposited materials typically used as electrodes have relatively high evaporation temperatures, which impacts the ability to re-use the FMM, and/or the accuracy of the pattern that may be achieved, with attendant increases in cost, effort, and complexity.

One method for doing so, in some non-limiting examples, involves depositing the deposited material and thereafter removing, including by a laser drilling process, unwanted regions thereof to form the pattern. However, the removal process often involves the creation, and/or presence of debris, which may affect the yield of the manufacturing process.

Further, such methods may not be suitable for use in some applications, and/or with some devices with certain topographical features.

In some non-limiting applications, there may be an aim to provide an improved mechanism for providing selective deposition of a deposited material.

BRIEF DESCRIPTION OF THE DRAWINGS

Examples of the present disclosure will now be described by reference to the following figures, in which identical reference numerals in different figures indicate identical, and/or in some non-limiting examples, analogous, and/or corresponding elements and in which:

FIG. 31A is a schematic diagram illustrating, in plan view, an example of a transparent version of the device of FIG. 10 comprising at least one example pixel region and at least one example light-transmissive region according to an example in the present disclosure;

Figure 1:
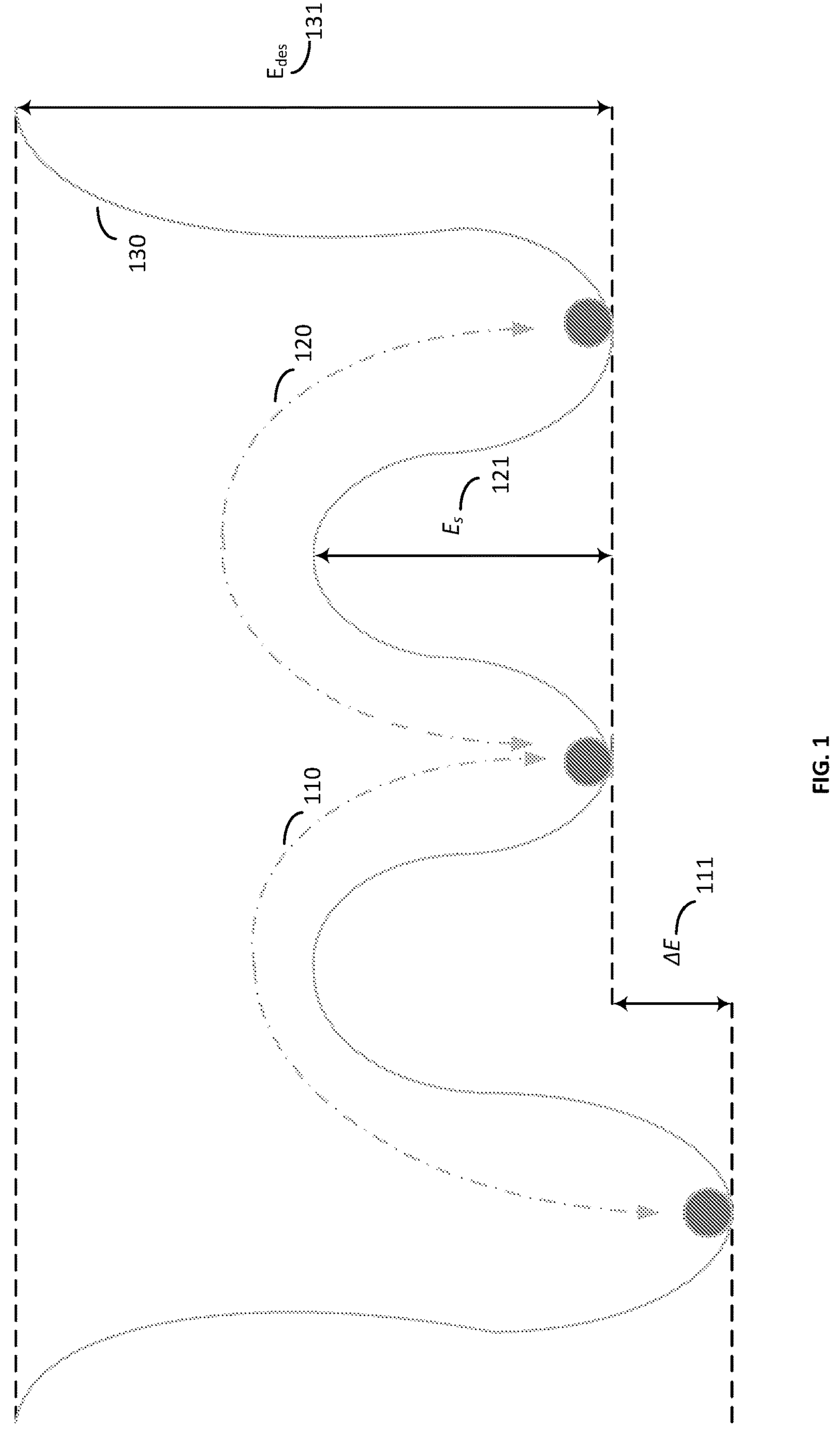
FIG. 1 is an example energy profile illustrating relative energy states of an adatom absorbed onto a surface according to an example in the present disclosure.

In the present disclosure, a reference numeral having one or more numeric values (including without limitation, in subscript), and/or alphabetic character(s) (including without limitation, in lower case) appended thereto, may be considered to refer to a particular instance, and/or subset thereof, of the element or feature described by the reference numeral. Reference to the reference numeral without reference to the appended value(s), and/or character(s) may, as the context dictates, refer generally to the element(s) or feature(s) described by the reference numeral, and/or to the set of all instances described thereby.

In the present disclosure, for purposes of explanation and not limitation, specific details are set forth to provide a thorough understanding of the present disclosure, including, without limitation, particular architectures, interfaces, and/or techniques. In some instances, detailed descriptions of well-known systems, technologies, components, devices, circuits, methods, and applications are omitted so as not to obscure the description of the present disclosure with unnecessary detail.

Further, it will be appreciated that block diagrams reproduced herein can represent conceptual views of illustrative components embodying the principles of the technology.

Accordingly, the system and method components have been represented where appropriate by conventional symbols in the drawings, showing only those specific details that are pertinent to understanding the examples of the present disclosure, so as not to obscure the disclosure with details that will be readily apparent to those of ordinary skill in the art having the benefit of the description herein.

Any drawings provided herein may not be drawn to scale and may not be considered to limit the present disclosure in any way.

Any feature or action shown in dashed outline may in some examples be considered as optional.

SUMMARY

It is an object of the present disclosure to obviate or mitigate at least one disadvantage of the prior art.

The present disclosure discloses a layered device having a plurality of layers. In a first portion of a lateral aspect of the device, the device comprises a patterning coating such as a nucleation-inhibiting coating (NIC) disposed on a first layer surface of an underlying layer.

A deposited layer comprised of a deposited material is disposed on a second layer surface.

An initial sticking probability against deposition of the deposited material onto a surface of the NIC in the first portion is substantially less than the initial sticking probability against deposition of the deposited material onto the second layer surface. Accordingly, the NIC is substantially devoid of a closed coating of the deposited material.

The NIC comprises a compound containing a rare earth element.

The deposited layer can comprise a closed coating on the second layer surface in a second portion of the lateral aspect, and/or a discontinuous layer of at least one particle structure on a surface of the NIC.

According to a broad aspect of the present disclosure, there is disclosed a device having a plurality of layers, comprising: a nucleation-inhibiting coating (NIC) disposed on a first layer surface of an underlying layer in a first portion of a lateral aspect thereof; and a deposited layer comprised of a deposited material, disposed on a second layer surface; wherein an initial sticking probability against deposition of the deposited layer onto a surface of the NIC in the first portion is substantially less than the initial sticking probability against deposition of the deposited layer onto the second layer surface, such that the NIC is substantially devoid of a closed coating of the deposited material; and wherein the NIC comprises a compound containing a rare earth element.

In some non-limiting examples, the rare earth element may comprise at least one of: cerium (Ce), dysprosium (Dy), erbium (Er), europium (Eu), gadolinium (Gd), holmium (Ho), lanthanum (La), lutetium (Lu), neodymium (Nd), promethium (Pm), praseodymium (Pr), scandium (Sc), samarium (Sm), terbium (Tb), thulium (Tm), yttrium (Y), and ytterbium (Yb). In some non-limiting examples, the rare earth element may comprise Ce, Dy, Er, Eu, Gd, Ho, Lu, Nd, Pr, Sm, Tb, Tm, and Yb. In some non-limiting examples, the rare earth element may comprise Ce, Dy, Er, Eu, Gd, Ho, Lu, Nd, Sm, Tm, and Yb.

In some non-limiting examples, the compound may comprise an oxide of the rare earth element. In some non-limiting examples, the oxide may comprise at least one of: $CeO_2$, $Dy_2O_3$, $Er_2O_3$, $Eu_2O_3$, $Gd_2O_3$, $Ho_2O_3$, $La_2O_3$, $Lu_2O_3$, $Nd_2O_3$, $Pr_2O_3$, $PrO_2$, $Pr_2O_5$, $Pm_2O_3$, $Sm_2O_3$, $Sc_2O_3$, $Tb_7O_{12}$, $Tb_2O_3$, $TbO_2$, $Tb_3O_7$, $Tm_2O_3$, $Yb_2O_3$, and $Y_2O_3$.

In some non-limiting examples, a critical surface energy of the NIC may be less than about 30 dynes/cm.

In some non-limiting examples, the deposited layer may comprise a closed coating on the second layer surface in a second portion of the lateral aspect.

In some non-limiting examples, the device may further comprise an interface coating in the second portion, wherein the interface coating comprises the rare earth element. In some non-limiting examples, the second layer surface may be a surface of the interface coating. In some non-limiting examples, an oxidation state of the rare earth element in the interface coating may be zero. In some non-limiting examples, the interface coating may be contiguous with the NIC in the lateral aspect. In some non-limiting examples, the rare earth element may comprise Yb. In some non-limiting examples, the interface coating may comprise $Yb^0$, and the NIC may comprise $Yb_2O_3$. In some non-limiting examples, a critical surface energy of the NIC may be lower than a critical surface energy of the interface coating.

In some non-limiting examples, the second portion may comprise at least one emissive region. In some non-limiting examples, the first portion may comprise at least part of a non-emissive region. In some non-limiting examples, the emissive region may comprise: a substrate; a first electrode; at least one semiconducting layer; and a second electrode; wherein the first electrode lies between the substrate and the at least one semiconducting layer; and wherein the at least one semiconducting layer lies between the first and second electrodes. In some non-limiting examples, the deposited layer may be electrically coupled to the second electrode. In some non-limiting examples, the deposited layer may form at least part of the second electrode in the second portion. In some non-limiting examples, the second portion may comprise a partition and a third electrode in a sheltered region of the partition, wherein the deposited layer is electrically coupled to the second electrode and the third electrode.

In some non-limiting examples, the deposited layer may comprise a discontinuous layer of at least one particle structure and the second layer surface may be a surface of the NIC.

In some non-limiting examples, the device may comprise at least one covering layer disposed on a surface of the NIC and forming an interface therewith, wherein the deposited layer is located at the interface.

In some non-limiting examples, the first portion may comprise at least one emissive region and the deposited layer may be tuned to enhance out-coupling of at least one electromagnetic signal emitted by the emissive region.

In some non-limiting examples, a resonance imparted by the at least one particle structure may be tuned by selection of a feature selected from at least one of a characteristic size, size distribution, shape, surface coverage, configuration, dispersity, material of the at least one particle structure, and any combination of any of these. In some non-limiting examples, the resonance may be tuned by varying at least one of a deposited thickness of the deposited material, an average film thickness of the NIC, a thickness of the at least one covering layer, a composition of metal in the deposited material, a dielectric constant of the at least one particle structure, an extent to which the NIC is doped with an organic material having a different composition, a refractive index of the NIC, an extinction coefficient of the NIC, a material deposited as the at least one covering layer, a refractive index of the at least one covering layer, an extinction coefficient of the at least one covering layer, and any combination of any of these.

In some non-limiting examples, the first portion may be substantially limited to the at least one emissive region. In some non-limiting examples, the first portion may be bounded by a second portion of the lateral aspect that comprises at least one non-emissive region. In some non-limiting examples, the NIC may extend beyond the first portion into the second portion.

In some non-limiting examples, the emissive region may comprise: a substrate; a first electrode; at least one semiconducting layer; and a second electrode; wherein the first electrode lies between the substrate and the at least one semiconducting layer; and wherein the at least one semiconducting layer lies between the first and second electrodes. In some non-limiting examples, the underlying layer may comprise the second electrode. In some non-limiting examples, the underlying layer may comprise one of the at least one semiconducting layers. In some non-limiting examples, the underlying layer may be selected from at least one of a hole injection layer, a hole transport layer, an electron transport layer, and an electron injection layer. In some non-limiting examples, the at least one covering layer may be selected from at least one of the electron transport layer and the electron injection layer. In some non-limiting examples, the deposited layer may comprise the second electrode. In some non-limiting examples, the deposited layer may be formed by deposition of the deposited material across the lateral aspect. In some non-limiting examples, the deposited material may form an electrode in the second portion. In some non-limiting examples, the electrode in the second portion may be an auxiliary electrode. In some non-limiting examples, the second portion may comprise at least one further emissive region and the electrode in the second portion may be an electrode of the at least one further emissive region.

In some non-limiting examples, the at least one further emissive region may comprise: a substrate; a first electrode; at least one semiconducting layer; and a second electrode; wherein the first electrode lies between the substrate and the at least one semiconducting layer; and wherein the at least one semiconducting layer lies between the first and second electrodes. In some non-limiting examples, the electrode in the second portion may comprise the second electrode of the at least one further emissive region. In some non-limiting examples, the electrode in the second portion may be a closed coating of the deposited material.

In some non-limiting examples, the deposited material may comprise Mg.

DESCRIPTION

Opto-Electronic Device

The present disclosure relates generally to layered devices, and more specifically, to opto-electronic devices. An opto-electronic device generally encompasses any device that converts electrical signals into photons and vice versa.

Those having ordinary skill in the relevant art will appreciate that, while the present disclosure is directed to opto-electronic devices, the principles thereof may be applicable to any panel having a plurality of layers, including without limitation, at least one layer of conductive deposited material 531 (FIG. 5A), including as a thin film, and in some non-limiting examples, through which electromagnetic (EM) signals may pass, entirely or partially, at an angle relative to a plane of at least one of the layers.

Thin Film Formation

The formation of thin films during vapor deposition on an exposed layer surface 11 (FIG. 10) of an underlying layer may involve processes of nucleation and growth.

During initial stages of film formation, a sufficient number of vapor monomers (which in some non-limiting examples may be molecules, and/or atoms of a deposited material 531 in vapor form) may typically condense from a vapor phase to form initial nuclei on the exposed layer surface 11 presented of an underlying layer. As vapor monomers continue to impinge on such surface, a characteristic size S1, and/or deposited density of these initial nuclei may increase to form small particle structures 941 (FIG. 9). Non-limiting examples of a dimension to which such characteristic size S1 refers may include a height, width, length, and/or diameter of such particle structure 941.

After reaching a saturation island density, adjacent particle structures 941 may typically start to coalesce, increasing an average characteristic size S1 of such particle structures 941, while decreasing a deposited density thereof.

With continued vapor deposition of monomers, coalescence of adjacent particle structures 941 may continue until a substantially closed coating 340 (FIG. 3A) may eventually be deposited on an exposed layer surface 11 of an underlying material. The behaviour, including optical effects caused thereby, of such closed coatings 340 may be generally relatively uniform, consistent, and unsurprising.

There may be at least three basic growth modes for the formation of thin films, in some non-limiting examples, culminating in a closed coating 340: 1) island (Volmer-Weber), 2) layer-by-layer (Frank-van der Merwe), and 3) Stranski-Krastanov.

Island growth may typically occur when stale clusters of monomers nucleate on an exposed layer surface 11 and grow to form discrete islands. This growth mode may occur when the interaction between the monomers is stronger than that between the monomers and the surface.

The nucleation rate may describe how many nuclei of a given size (where the free energy does not push a cluster of such nuclei to either grow or shrink) ("critical nuclei") on a surface per unit time. During initial stages of film formation, it may be unlikely that nuclei will grow from direct impingement of monomers on the surface, since the deposited density of nuclei is low, and thus the nuclei may cover a relatively small fraction of the surface (e.g., there are large gaps/spaces between neighboring nuclei). Therefore, the rate at which critical nuclei may grow may typically depend on the rate at which adatoms (e.g., adsorbed monomers) on the surface migrate and attach to nearby nuclei.

An example of an energy profile of an adatom adsorbed onto an exposed layer surface 11 of an underlying material is illustrated in FIG. 1. Specifically, FIG. 1 illustrates example qualitative energy profiles corresponding to: an adatom escaping from a local low energy site (110); diffusion of the adatom on the exposed layer surface 11 (120); and desorption of the adatom (120).

In 110, the local low energy site may be any site on the exposed layer surface 11 of an underlying layer, onto which an adatom will be at a lower energy. Typically, the nucleation site may comprise a defect, and/or an anomaly on the exposed layer surface 11, including without limitation, a ledge, a step edge, a chemical impurity, a bonding site, and/or a kink ("heterogeneity").

Sites of substrate heterogeneity may increase an energy involved to desorb the adatom from the surface $E_{des}$ 131, leading to a higher deposited density of nuclei observed at such sites. Also, impurities or contamination on a surface may also increase $E_{des}$ 131, leading to a higher deposited density of nuclei. For vapor deposition processes, conducted under high vacuum conditions, the type and deposited density of contaminants on a surface may be affected by a vacuum pressure and a composition of residual gases that make up that pressure.

Once the adatom is trapped at the local low energy site, there may typically, in some non-limiting examples, be an energy barrier before surface diffusion takes place. Such energy barrier may be represented as ΔE 111 in FIG. 1. In some non-limiting examples, if the energy barrier ΔE 111 to escape the local low energy site is sufficiently large, the site may act as a nucleation site.

In 120, the adatom may diffuse on the exposed layer surface 11. By way of non-limiting example, in the case of localized absorbates, adatoms may tend to oscillate near a minimum of the surface potential and migrate to various neighboring sites until the adatom is either desorbed, and/or is incorporated into growing islands 941 formed by a cluster of adatoms, and/or a growing film. In FIG. 1, the activation energy associated with surface diffusion of adatoms may be represented as $E_s$ 121.

In 130, the activation energy associated with desorption of the adatom from the surface may be represented as $E_{des}$ 131. Those having ordinary skill in the relevant art will appreciate that any adatoms that are not desorbed may remain on the exposed layer surface 11. By way of non-limiting example, such adatoms may diffuse on the exposed layer surface 11, become part of a cluster of adatoms that form islands 941 on the exposed layer surface 11, and/or be incorporated as part of a growing film, and/or coating.

After adsorption of an adatom on a surface, the adatom may either desorb from the surface, or may migrate some distance on the surface before either desorbing, interacting with other adatoms to form a small cluster, or attaching to a growing nucleus. An average amount of time that an adatom remains on the surface after initial adsorption may be given by:

$$\tau_s = \frac{1}{v} \exp\left(\frac{E_{des}}{kT}\right)$$

In the above equation:

v is a vibrational frequency of the adatom on the surface, k is the Botzmann constant, and Tis temperature.

From this equation it may be noted that the lower the value of $E_{des}$ 131, the easier it may be for the adatom to desorb from the surface, and hence the shorter the time the adatom may remain on the surface. A mean distance an adatom can diffuse may be given by, $$X = a_0 \exp\left(\frac{E_{des} - E_s}{2kT}\right)$$

where:

$\alpha_0$ is a lattice constant.

For low values of $E_{des}$ 131, and/or high values of $E_s$ 121, the adatom may diffuse a shorter distance before desorbing, and hence may be less likely to attach to growing nuclei or interact with another adatom or cluster of adatoms.

During initial stages of formation of a deposited layer of particle structures 941, adsorbed adatoms may interact to form particle structures 941, with a critical concentration of particle structures 941 per unit area being given by, $$\frac{N_i}{n_0} = \left|\frac{N_1}{n_0}\right|^i \exp\left(\frac{E_i}{kT}\right)$$

where:

$E_i$ is an energy involved to dissociate a critical cluster containing i adatoms into separate adatoms, $n_0$ is a total deposited density of adsorption sites, and $N_1$ is a monomer deposited density given by:

$$N_1 = \dot{R}\tau_s$$

where:

$\dot{R}$ is a vapor impingement rate.

Typically, i may depend on a crystal structure of a material being deposited and may determine the critical particle structure size to form a stable nucleus.

A critical monomer supply rate for growing particle structures 941 may be given by the rate of vapor impingement and an average area over which an adatom can diffuse before desorbing:

$$\dot{R}X^2 = \alpha_0^2 \exp\left(\frac{E_{des} - E_s}{kT}\right)$$

The critical nucleation rate may thus be given by the combination of the above equations:

$$\dot{N}_i = \dot{R}\alpha_0^2 n_0 \left(\frac{\dot{R}}{\nu n_0}\right)^i \exp\left(\frac{(i+1)E_{des} - E_s + E_i}{kT}\right)$$

From the above equation, it may be noted that the critical nucleation rate may be suppressed for surfaces that have a low desorption energy for adsorbed adatoms, a high activation energy for diffusion of an adatom, are at high temperatures, and/or are subjected to vapor impingement rates.

Under high vacuum conditions, a flux of molecules that impinge on a surface (per $cm^2$-sec) may be given by:

$$\phi = 3.513 \times 10^{22} \frac{P}{MT}$$

where:

P is pressure, and

M is molecular weight.

Therefore, a higher partial pressure of a reactive gas, such as $H_2O$, may lead to a higher deposited density of contamination on a surface during vapor deposition, leading to an increase in $E_{des}$ 131 and hence a higher deposited density of nuclei.

In the present disclosure, "nucleation-inhibiting" may refer to a coating, material, and/or a layer thereof, that has a surface that exhibits an initial sticking probability $S_0$ for deposition of a deposited material 531 thereon, that is close to 0, including without limitation, less than about 0.3, such that the deposition of the deposited material 531 on such surface may be inhibited.

In the present disclosure, "nucleation-promoting" may refer to a coating, material, and/or a layer thereof, that has a surface that exhibits an initial sticking probability $S_0$ for deposition of a deposited material 531 thereon, that is close to 1, including without limitation, greater than about 0.7, such that the deposition of the deposited material 531 on such surface may be facilitated.

Without wishing to be bound by a particular theory, it may be postulated that the shapes and sizes of such nuclei and the subsequent growth of such nuclei into islands and thereafter into a thin film may depend upon various factors, including without limitation, interfacial tensions between the vapor, the surface, and/or the condensed film nuclei.

One measure of a nucleation-inhibiting, and/or nucleation-promoting property of a surface may be the initial sticking probability $S_0$ of the surface against the deposition of a given deposited material 531.

In some non-limiting examples, the sticking probability S may be given by:

$$S = \frac{N_{ads}}{N_{total}}$$

where:

$N_{ads}$ is a number of adatoms that remain on an exposed layer surface 11 (that is, are incorporated into a film), and $N_{total}$ is a total number of impinging monomers on the surface.

A sticking probability S equal to 1 may indicate that all monomers that impinge on the surface are adsorbed and subsequently incorporated into a growing film. A sticking probability S equal to 0 may indicate that all monomers that impinge on the surface are desorbed and subsequently no film may be formed on the surface.

A sticking probability S of a deposited material 531 on various surfaces may be evaluated using various techniques of measuring the sticking probability S, including without limitation, a dual quartz crystal microbalance (QCM) technique as described by Walker et al., *J. Phys. Chem. C* 2007, 111, 765 (2006).

As the deposited density of a deposited material 531 increases (e.g., increasing average film thickness d), a sticking probability S may change.

An initial sticking probability $S_0$ may therefore be specified as a sticking probability S of a surface prior to the formation of any significant number of critical nuclei. One measure of an initial sticking probability $S_0$ may involve a sticking probability S of a surface against the deposition of a deposited material 531 during an initial stage of deposition thereof, where an average film thickness d of the deposited material 531 across the surface is at or below a threshold value. In the description of some non-limiting examples a threshold value for an initial sticking probability $S_0$ may be specified as, by way of non-limiting example, 1 nm. An average sticking probability $\overline{S}$ may then be given by:

$$\overline{S} = S_0(1 - A_{nuc}) + S_{nuc}(A_{nuc})$$

where:

$S_{nuc}$ is a sticking probability S of an area covered by particle structures 941, and $A_{nuc}$ is a percentage of an area of a substrate surface covered by particle structures 941.

By way of non-limiting example, a low initial sticking probability $S_0$ may increase with increasing average film thickness d. This may be understood based on a difference in sticking probability S between an area of an exposed layer surface 11 with no particle structures 941, by way of non-limiting example, a bare substrate 10, and an area with a high deposited density. By way of non-limiting example, a monomer that impinges on a surface of a particle structure 941 may have a sticking probability S that approaches 1.

Based on the energy profiles 110, 120, 130 shown in FIG. 1, it may be postulated that materials that exhibit relatively low activation energy for desorption ($E_{des}$ 131), and/or relatively high activation energy for surface diffusion ($E_s$ 121), may be deposited as an NIC 310, and may be suitable for use in various applications.

Without wishing to be bound by a particular theory, it may be postulated that, in some non-limiting examples, the relationship between various interfacial tensions present during nucleation and growth may be dictated according to Young's equation in capillarity theory:

$$\gamma_{sv} = \gamma_{fs} + \gamma_{vf}\cos\theta$$

where:

- $\gamma_{sv}$ corresponds to the interfacial tension between the substrate 10 and vapor,
- $\gamma_{fs}$ corresponds to the interfacial tension between the deposited material 531 and the substrate 10,
- $\gamma_{vf}$ corresponds to the interfacial tension between the vapor and the film, and
- $\theta$ is the film nucleus contact angle.

Figure 2:
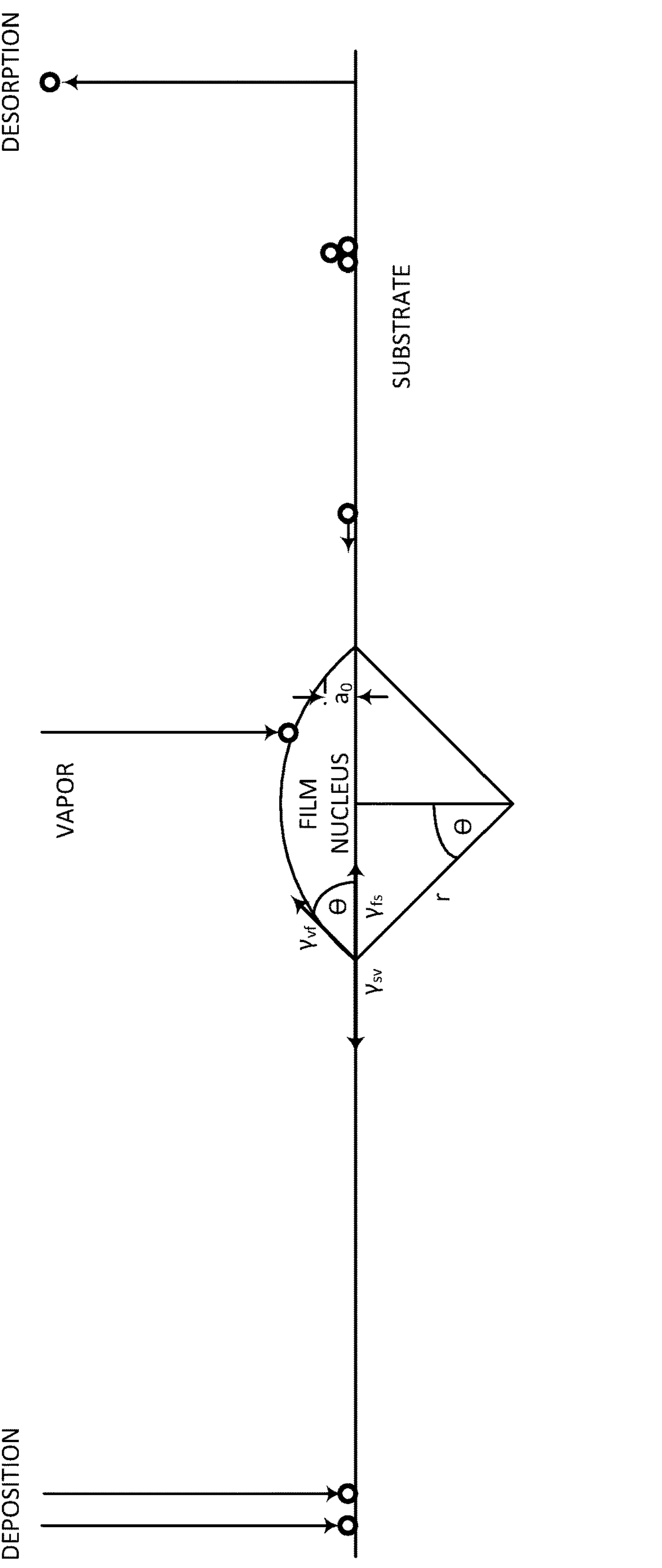
FIG. 2 is a schematic diagram illustrating the formation of a film nucleus according to an example in the present disclosure.

FIG. 2 illustrates the relationship between the various parameters represented in this equation.

On the basis of Young's equation, it may be derived that, for island growth, the film nucleus contact angle $\theta$ may be greater than 0 and therefore: $\gamma_{sv}<\gamma_{fs}+\gamma_{vf}$.

For layer growth, where the deposited material 531 "wets" the substrate 10, the nucleus contact angle $\theta$ may be equal to 0, and therefore: $\gamma_{sv}=\gamma_{fs}+\gamma_{vf}$.

For Stranski-Krastanov (S-K) growth, where the strain energy per unit area of the film overgrowth is large with respect to the interfacial tension between the vapor and the deposited material 531: $\gamma_{sv}>\gamma_{fs}+\gamma_{vf}$.

Without wishing to be bound by any particular theory, it may be postulated that the nucleation and growth mode of a deposited material 531 at an interface between the NIC 310 and the exposed layer surface 11 of the substrate 10, may follow the island growth model, where $\theta>0$.

Particularly in cases where the NIC 310 exhibits a relatively low initial sticking probability $S_0$ (in some non-limiting examples, under the conditions identified in the dual QCM technique described by Walker et. al) towards the deposited material 531, there may be a relatively high thin film contact angle $\theta$ of the deposited material 531.

On the contrary, when a deposited material 531 may be selectively deposited on an exposed layer surface 11 without the use of a patterning coating 410, by way of non-limiting example, by employing a shadow mask 415, the nucleation and growth mode of such deposited material 531 may differ. In particular, it has been observed that a coating formed using a shadow mask 415 patterning process may, at least in some non-limiting examples, exhibit relatively low thin film contact angle $\theta$ of less than about 10°.

It has now been found, somewhat surprisingly, that in some non-limiting examples, a nucleation-inhibiting coating 310 (and/or the patterning material 511 of which it is comprised) may exhibit a relatively low critical surface tension.

Those having ordinary skill in the relevant art will appreciate that a "surface energy" of a coating, layer, and/or a material constituting such coating, and/or layer, may generally correspond to a critical surface tension of the coating, layer, and/or material. According to some models of surface energy, the critical surface tension of a surface may correspond substantially to the surface energy of such surface.

Generally, a material with a low surface energy may exhibit low intermolecular forces. Generally, a material with low intermolecular forces may readily crystallize or undergo other phase transformation at a lower temperature in comparison to another material with high intermolecular forces. In at least some applications, a material that readily crystallizes or undergoes other phase transformations at relatively low temperatures may be detrimental to the long-term performance, stability, reliability, and/or lifetime of the device.

Figure 3A:
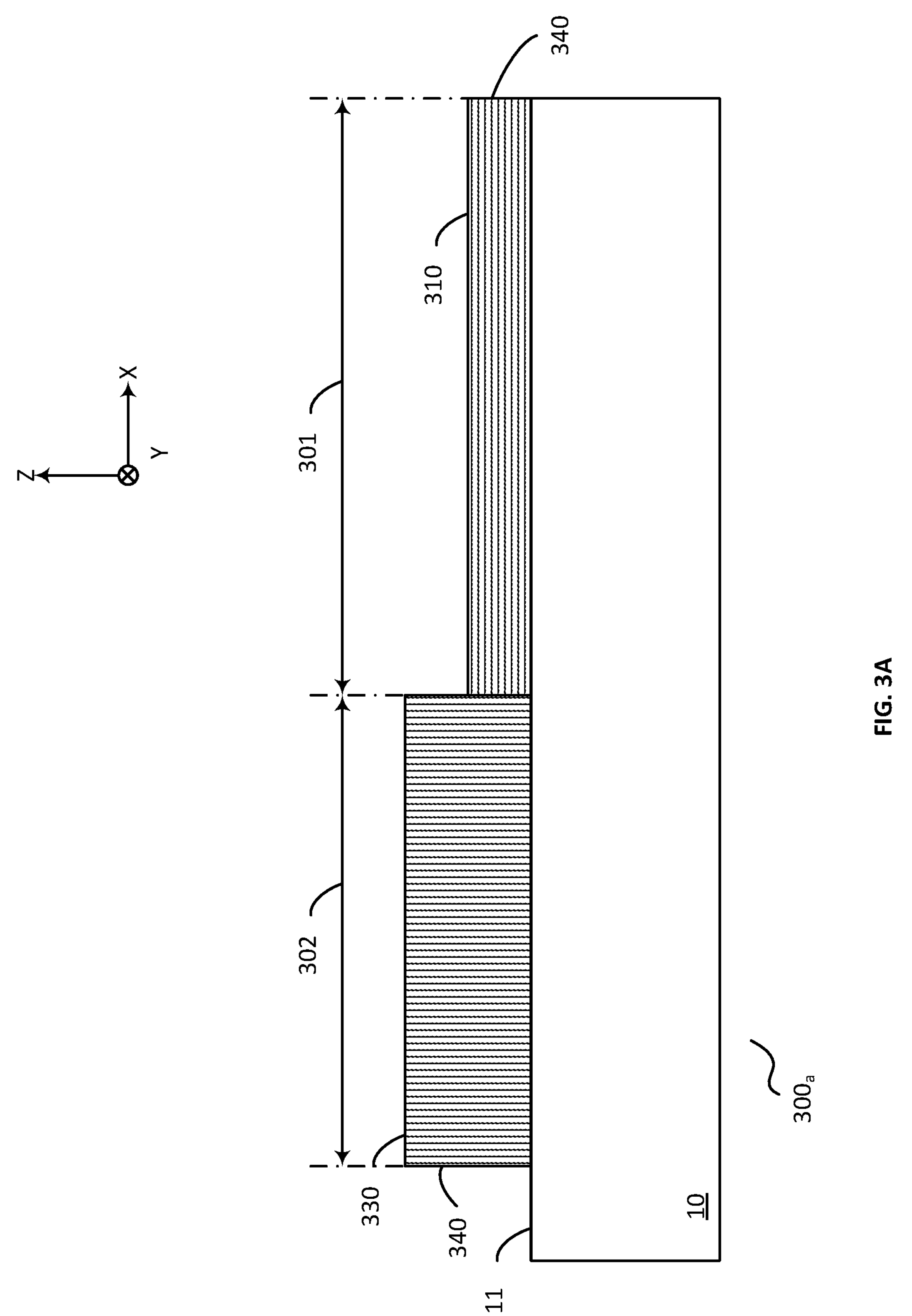
FIG. 3A is a simplified block diagram from a cross-sectional aspect, of an example device having a plurality of layers in a lateral aspect, formed by selective deposition of an NIC in a first portion of the lateral aspect, followed by deposition of a closed coating of deposited material in a second portion thereof, according to an example in the present disclosure.

Without wishing to be bound by a particular theory, it may be postulated that certain low energy surfaces may exhibit relatively low initial sticking probabilities $S_0$ and may thus be suitable for forming the NIC 310 (FIG. 3A).

Without wishing to be bound by any particular theory, it may be postulated that, especially for low surface energy surfaces, the critical surface tension may be positively correlated with the surface energy. By way of non-limiting example, a surface exhibiting a relatively low critical surface tension may also exhibit a relatively low surface energy, and a surface exhibiting a relatively high critical surface tension may also exhibit a relatively high surface energy.

In reference to Young's equation described above, a lower surface energy may result in a greater contact angle $\theta$, while also lowering the $\gamma_{sv}$, thus enhancing the likelihood of such surface having low wettability and low initial sticking probability $S_0$ with respect to the deposited material 531.

The critical surface tension values, in various non-limiting examples, herein may correspond to such values measured at around normal temperature and pressure (NTP), which in some non-limiting examples, may correspond to a temperature of 20° C., and an absolute pressure of 1 atm. In some non-limiting examples, the critical surface tension of a surface may be determined according to the Zisman method, as further detailed in Zisman, W. A., "*Advances in Chemistry*" 43 (1964), p. 1-51.

In some non-limiting examples, the exposed layer surface 11 of the NIC 310 may exhibit a critical surface tension of less than about: 20 dynes/cm, 19 dynes/cm, 18 dynes/cm, 17 dynes/cm, 16 dynes/cm, 15 dynes/cm, 13 dynes/cm, 12 dynes/cm, or 11 dynes/cm.

In some non-limiting examples, the exposed layer surface 11 of the NIC 310 may exhibit a critical surface tension of greater than about: 6 dynes/cm, 7 dynes/cm, 8 dynes/cm, 9 dynes/cm, and 10 dynes/cm.

Those having ordinary skill in the relevant art will appreciate that various methods and theories for determining the surface energy of a solid are known. By way of non-limiting example, the surface energy may be calculated, and/or derived based on a series of measurements of contact angle $\theta$, in which various liquids are brought into contact with a surface of a solid to measure the contact angle $\theta$ between the liquid-vapor interface and the surface. In some non-limiting examples, the surface energy of a solid surface may be equal to the surface tension of a liquid with the highest surface tension that completely wets the surface. By way of non-limiting example, a Zisman plot may be used to determine the highest surface tension value that would result in a contact angle $\theta$ of 0° with the surface.

Without wishing to be bound by a particular theory, it may be postulated that, in some non-limiting examples, the contact angle $\theta$ of a coating of deposited material 531 may be determined, based at least partially on the properties (including, without limitation, initial sticking probability $S_0$) of the NIC 310 onto which the deposited material 531 is deposited. Accordingly, NIC materials 511 that allow selective deposition of deposited materials 531 exhibiting relatively high contact angles θ may provide some benefit.

Those having ordinary skill in the relevant art will appreciate that various methods may be used to measure a contact angle θ, including without limitation, the static, and/or dynamic sessile drop method and the pendant drop method.

In some non-limiting examples, the activation energy for desorption ($E_{des}$ 131) (in some non-limiting examples, at a temperature T of about 300K) may be less than about: 2 times, 1.5 times, 1.3 times, 1.2 times, 1.0 times, 0.8 times, or 0.5 times, the thermal energy ($k_B T$). In some non-limiting examples, the activation energy for surface diffusion ($E_s$ 121) (in some non-limiting examples, at a temperature T of about 300K) may be greater than about: 1.0 times, 1.5 times, 1.8 times, 2 times, 3 times, 5 times, 7 times, or 10 times the thermal energy ($k_B T$).

Without wishing to be bound by a particular theory, it may be postulated that, during thin film nucleation and growth of a deposited material 531 at, and/or near an interface between the exposed layer surface 11 of the underlying layer and the NIC 310, a relatively high contact angle θ between the edge of the deposited material 531 and the underlying layer may be observed due to the inhibition of nucleation of the solid surface of the deposited material 531 by the NIC 310. Such nucleation inhibiting property may be driven by minimization of surface energy between the underlying layer, thin film vapor and the NIC 310.

One measure of a nucleation-inhibiting, and/or nucleation-promoting property of a surface may be an initial deposition rate of a given (electrically conductive) deposited material 531, on the surface, relative to an initial deposition rate of the same deposited material 531 on a reference surface, where both surfaces are subjected to, and/or exposed to an evaporation flux of the deposited material 531.

Layered Device

Turning now to FIG. 3A, there is shown a cross-sectional view of an example layered device 300*a*. In some non-limiting examples, as shown in greater detail in FIG. 10, the device 300 may comprise a plurality of layers deposited upon a substrate 10.

A lateral axis, identified as the X-axis, is shown, together with a longitudinal axis, identified as the Z-axis. A second lateral axis, identified as the Y-axis, is shown as being substantially transverse to both the X-axis and the Z-axis. At least one of the lateral axes may define a lateral aspect of the device 300. The longitudinal axis may define a transverse aspect of the device 300.

Figure 3B:
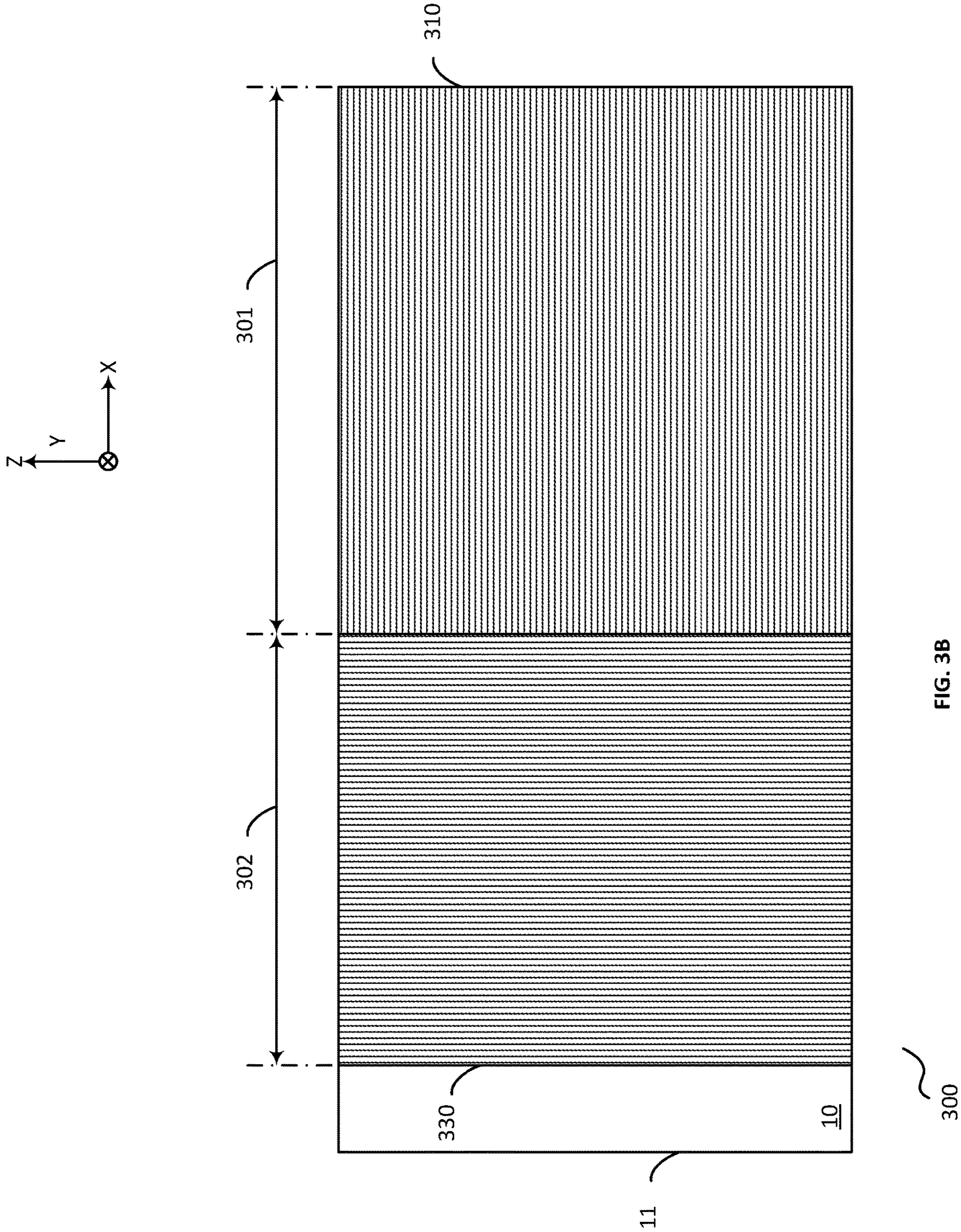
FIG. 3B is a plan view of the device of FIG. 3A.

FIG. 3B is a simplified example plan view of the device 300 according to the non-limiting example of FIG. 3A. In the plan view of FIG. 3B, a pair of lateral axes, identified as the X-axis and Y-axis respectively, which in some non-limiting examples may be substantially transverse to one another, are shown. At least one of these lateral axes, may define a lateral aspect of the device 300.

The layers of the device 300 may extend in the lateral aspect substantially parallel to a plane defined by the lateral axes. Those having ordinary skill in the relevant art will appreciate that the substantially planar representation shown in FIG. 3A may be, in some non-limiting examples, an abstraction for purposes of illustration. In some non-limiting examples, there may be, across a lateral extent of the device 300, there may be localized substantially planar strata of different thicknesses and dimension, including, in some non-limiting examples, the substantially complete absence of a layer, and/or layer(s) separated by non-planar transition regions (including lateral gaps and even discontinuities).

Thus, while for illustrative purposes, the device 300 is shown in its cross-sectional aspect as a substantially stratified structure of substantially parallel planar layers, such display panel may illustrate locally, a diverse topography to define features, each of which may substantially exhibit the stratified profile discussed in the cross-sectional aspect.

Deposition of Patterning Coatings

Figure 4:
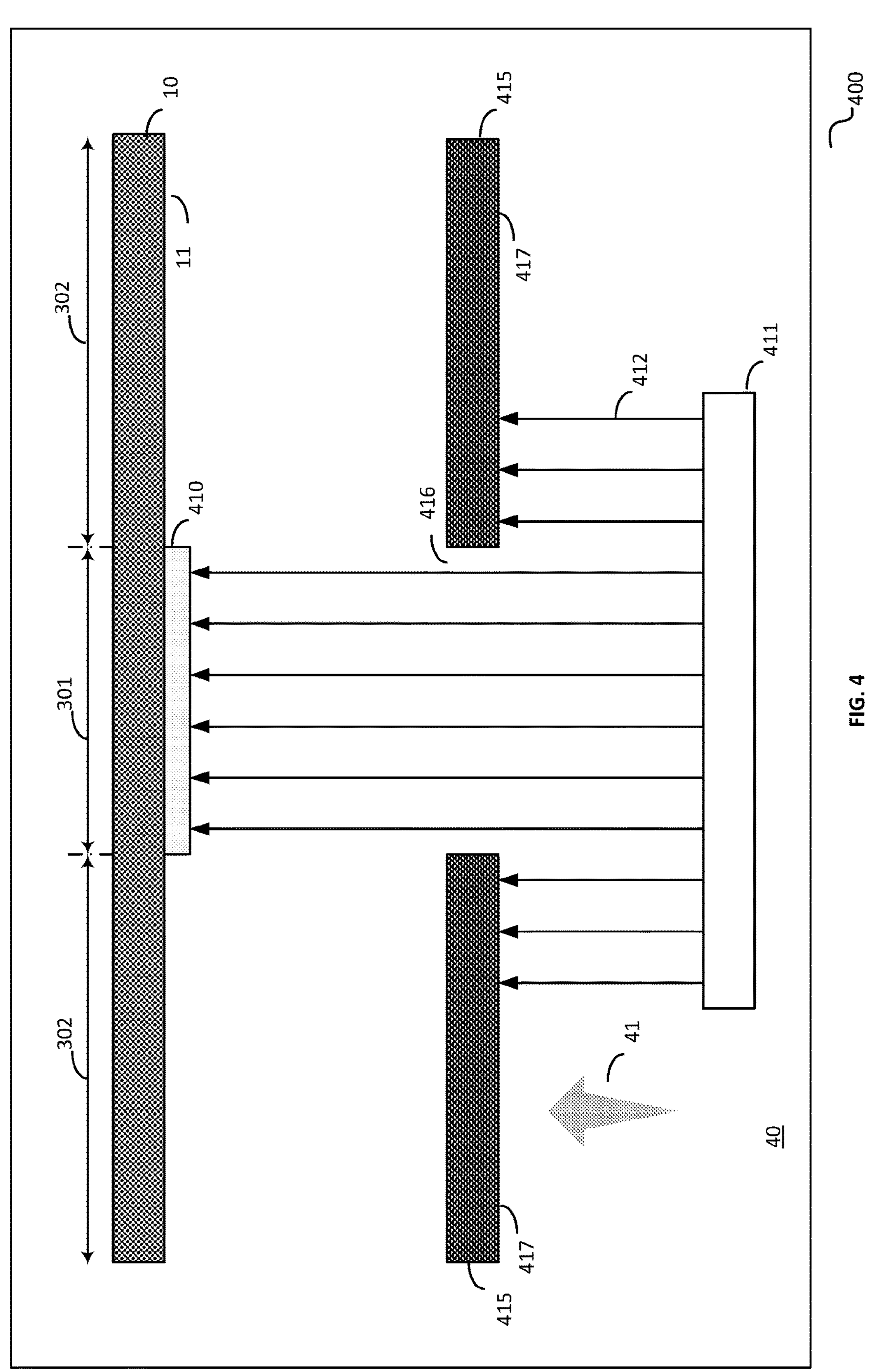
FIG. 4 is a schematic diagram showing an example process for depositing a patterning coating in a pattern on an exposed layer surface of an underlying material in an example version of the device of FIG. 3A, according to an example in the present disclosure.

FIG. 4 is an example schematic diagram illustrating a non-limiting example of an evaporative process, shown generally at 400, in a chamber 40, for selectively depositing a patterning coating 410, including without limitation, an NIC 310 or an NPC 520, onto a first portion 301 of an exposed layer surface 11 of an underlying material (in the figure, for purposes of simplicity of illustration only, the substrate 10).

In the process 400, a quantity of a patterning material 411, including without limitation, an NIC material 511, and/or an NPC material 511 (FIG. 15A) is heated under vacuum, to evaporate, and/or sublime 412 the patterning material 411. In some non-limiting examples, the patterning material 411 comprises entirely, and/or substantially, a material used to form the patterning coating 410. In some non-limiting examples, such material comprises an organic material.

Evaporated patterning material 412 flows through the chamber 40, including in a direction indicated by arrow 41, toward the exposed layer surface 11. When the evaporated patterning material 412 is incident on the exposed layer surface 11, the patterning coating 410 may be formed thereon.

In some non-limiting examples, as shown in the figure for the process 400, the patterning coating 410 may be selectively deposited only onto a portion, in the example illustrated, the first portion 301, of the exposed layer surface 11, by the interposition, between the patterning material 411 and the exposed layer surface 11, of a shadow mask 415, which in some non-limiting examples, may be a fine metal mask (FMM). In some non-limiting examples, a shadow mask 415 such as an FMM may, in some non-limiting examples, be used to form relatively small features, with a feature size on the order of tens of microns or smaller.

The shadow mask 415 has at least one aperture 416 extending therethrough such that a part of the evaporated patterning material 412 passes through the aperture 416 and is incident on the exposed layer surface 11 to form the patterning coating 410. Where the evaporated patterning material 412 does not pass through the aperture 416 but is incident on the surface 417 of the shadow mask 415, it is precluded from being disposed on the exposed layer surface 11 to form the patterning coating 410. In some non-limiting examples, the shadow mask 415 is configured such that the evaporated patterning material 412 that passes through the aperture 416 is incident on the first portion 301 but not the second portion 302. The second portion 302 of the exposed layer surface 11 is thus substantially devoid of the patterning coating 410. In some non-limiting examples (not shown), the patterning material 411 that is incident on the shadow mask 415 may be deposited on the surface 417 thereof.

Accordingly, a patterned surface is produced upon completion of the deposition of the patterning coating 410.

In some non-limiting examples, the patterning coating 410 employed in FIG. 4 may be an NIC 310.

Figure 5A:
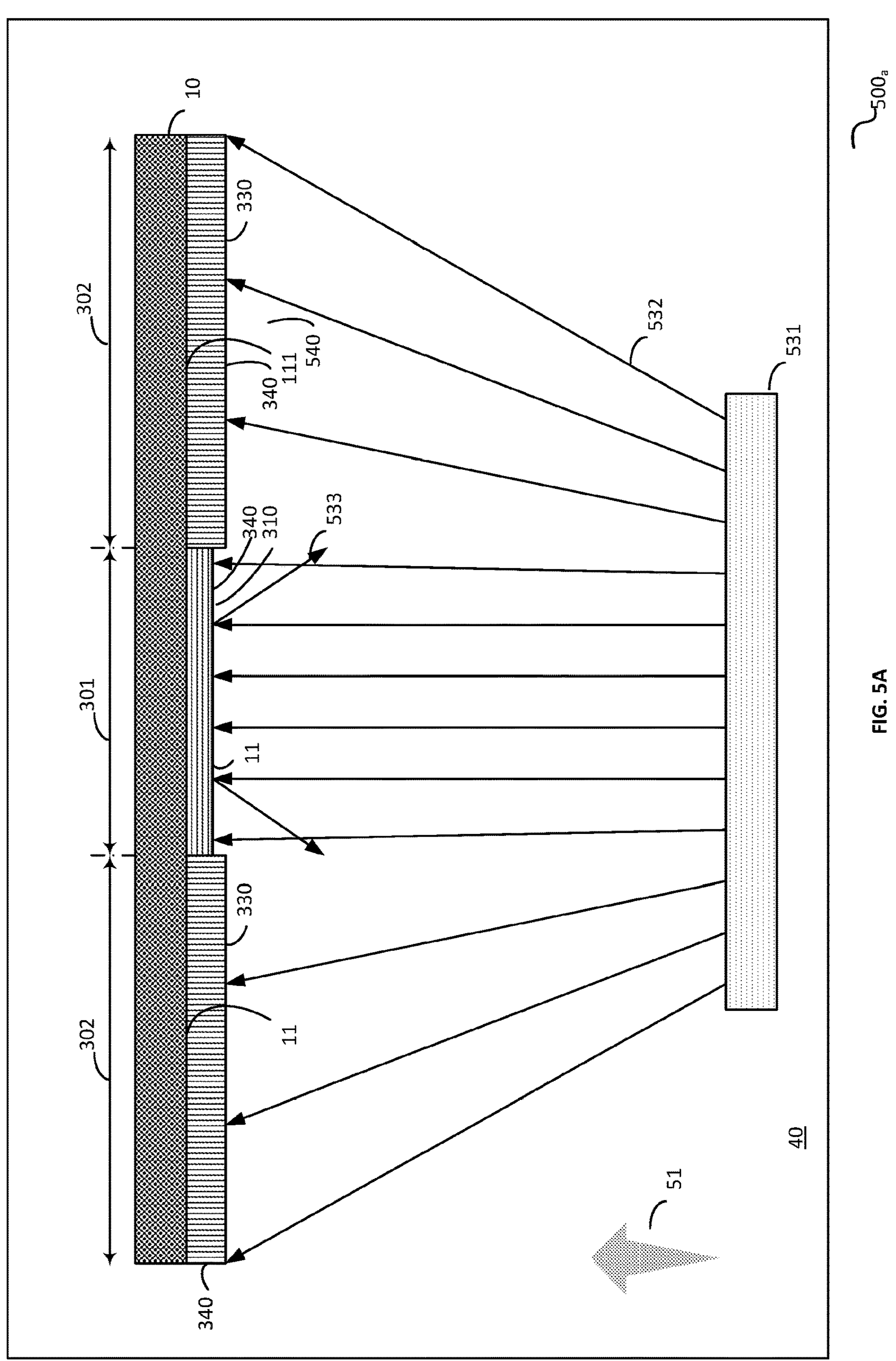
FIG. 5A is a schematic diagram showing an example process for depositing a deposited material 531 in the second portion on an exposed layer surface that comprises the deposited pattern of the patterning coating of FIG. 4 where the patterning coating is a nucleation-inhibiting coating (NIC)

FIG. 5A is an example schematic diagram illustrating a non-limiting example of a result of an evaporative process, shown generally at 500*a*, in a chamber 40, for selectively depositing a closed coating 340 of a deposited layer 330 onto the second portion 302 of an exposed layer surface 11 of an underlying material (in the figure, for purposes of simplicity of illustration only, the substrate 10) that is substantially devoid of the NIC 310 that was selectively deposited onto the first portion 301, including without limitation, by the evaporative process 400 of FIG. 4.

In some non-limiting examples, the deposited layer 330 may be comprised of a deposited material 531, in some non-limiting examples, comprising at least one metal. It will be appreciated by those having ordinary skill in the relevant art that typically, the vaporization temperature of an organic material is low relative to the vaporization temperature of metals, such as may be employed as a deposited material 531 531.

Thus, in some non-limiting examples, while it may be feasible to employ a shadow mask 415 such as an FMM to selectively deposit a patterning coating 410, such as an NIC 310, it may not be feasible to employ a shadow mask 415 such as an FMM to pattern such a deposited layer 330 330, since, in some non-limiting examples:

- an FMM 415 may be deformed during a deposition process, especially at high temperatures, such as may be employed for deposition of a thin conductive film;
- limitations on the mechanical (including, without limitation, tensile) strength of the FMM 415 and/or shadowing effects, especially in a high-temperature deposition process, may impart a constraint on an aspect ratio of features that may be achievable using such FMMs 415;
- the type and number of patterns that may be achievable using such FMMs 415 may be constrained since, by way of non-limiting example, each part of the FMM 415 will be physically supported so that, in some non-limiting examples, some patterns may not be achievable in a single processing stage, including by way of non-limiting example, where a pattern specifies an isolated feature;
- FMMs may exhibit a tendency to warp during a high-temperature deposition process, which may, in some non-limiting examples, distort the shape and position of apertures therein, which may cause the selective deposition pattern to be varied, with a degradation in performance, and/or yield;
- FMMs 415 that may be used to produce repeating structures spread across the entire surface of a device 300, may call for a large number of apertures to be formed in the FMM 415, which may compromise the structural integrity of the FMM 415;
- repeated use of FMMs 415 in successive depositions, especially in a metal deposition process, may cause the deposited material 531 to adhere thereto, which may obfuscate features of the FMM 415, and which may cause the selective deposition pattern to be varied, with a degradation in performance, and/or yield;
- while FMMs 415 may be periodically cleaned to remove adhered non-metallic material, such cleaning procedures may not be suitable for use with adhered metal, and even so, in some non-limiting examples, may be time-consuming, and/or expensive; and
- irrespective of any such cleaning processes, continued use of such FMMs 415, especially in a high-temperature deposition process, may render them ineffective at producing a desired patterning, at which point they may be discarded, and/or replaced, in a complex and expensive process.

Once the NIC 310 has been deposited on the first portion 301 of an exposed layer surface 11 of an underlying material (in the figure, the substrate 10), a closed coating 340 of the deposited material 531 may be deposited on the second portion 302 of the exposed layer surface 11 that is substantially devoid of the NIC 310 as the deposited layer 330.

In the process $\mathbf{500}_a$, a quantity of the deposited material 531 is heated under vacuum, to evaporate, and/or sublime 532 the deposited material 531. In some non-limiting examples, the deposited material 531 comprises entirely, and/or substantially, a material used to form the deposited layer 330. Evaporated deposited material 532 is directed inside the chamber 40, including in a direction indicated by arrow 51, toward the exposed layer surface 11 of the first portion 301 and of the second portion 302. When the evaporated deposited material 532 is incident on the second portion 302 of the exposed layer surface 11, a closed coating 340 of the deposited material 531 may be formed thereon as the deposited layer 330.

In some non-limiting examples, deposition of the deposited material 531 may be performed using an open mask 600 (FIG. 6A), and/or mask-free deposition process.

It will be appreciated by those having ordinary skill in the relevant art that, contrary to that of an FMM 415, the feature size of an open mask 600 is generally comparable to the size of a device 300 being manufactured. In some non-limiting examples, such an open mask 600 may have an aperture that may generally correspond to a size of the device 300, which in some non-limiting examples, may correspond, without limitation, to about 1" for micro-displays, about 4-6" for mobile displays, and/or about 8-17" for laptop, and/or tablet displays, so as to mask edges of such device 300 during manufacturing. In some non-limiting examples, the feature size of an open mask 600 may be on the order of about 1 cm, and/or greater.

It will be appreciated by those having ordinary skill in the relevant art that, in some non-limiting examples, the use of an open mask 600 may be omitted, if desired. In some non-limiting examples, an open mask deposition process described herein may alternatively be conducted without the use of an open mask 600, such that an entire target exposed layer surface 11 may be exposed.

FIGS. 6A-6D illustrate non-limiting examples of open masks 600.

Figure 6A:
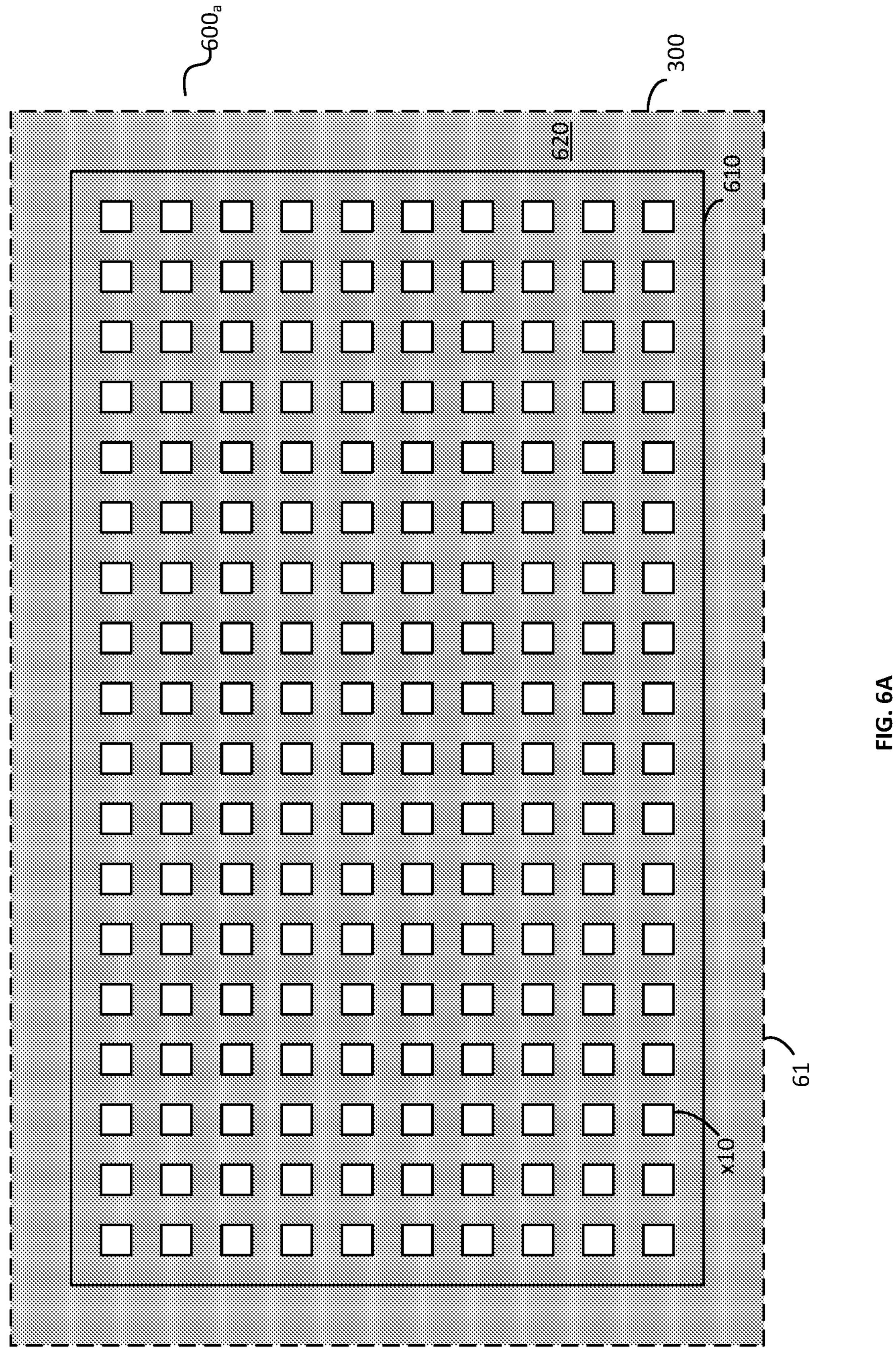
FIGS. 6A-D are schematic diagrams showing example open masks, suitable for use with the process of FIG. 4, having an aperture therewithin according to an example in the present disclosure.

FIG. 6A illustrates a non-limiting example of an open mask 600*a* having, and/or defining an aperture 610 formed therein. In some non-limiting examples, such as shown, the aperture 610 of the open mask 600*a* is smaller than a size of a device 300, such that when the mask $\mathbf{600}_a$ is overlaid on the device 300, the mask $\mathbf{600}_a$ covers edges of the device 300. In some non-limiting examples, where, as shown, the device 300 comprises a plurality of emissive regions 2210, each corresponding to a corresponding (sub-) pixel 1240/244*x* of the device 300, the lateral aspect(s) 910 of such emissive regions 2210 may be contained within the aperture 610 and thus exposed, while an unexposed region 620 may be formed between outer edges 61 of the device 300 and the aperture 610. It will be appreciated by those having ordinary skill in the relevant art that, in some non-limiting examples, electrical contacts, and/or other components (not shown) of the device 300 may be located in such unexposed region 620, such that these components remain substantially unaffected throughout an open mask deposition process.

Figure 6B:
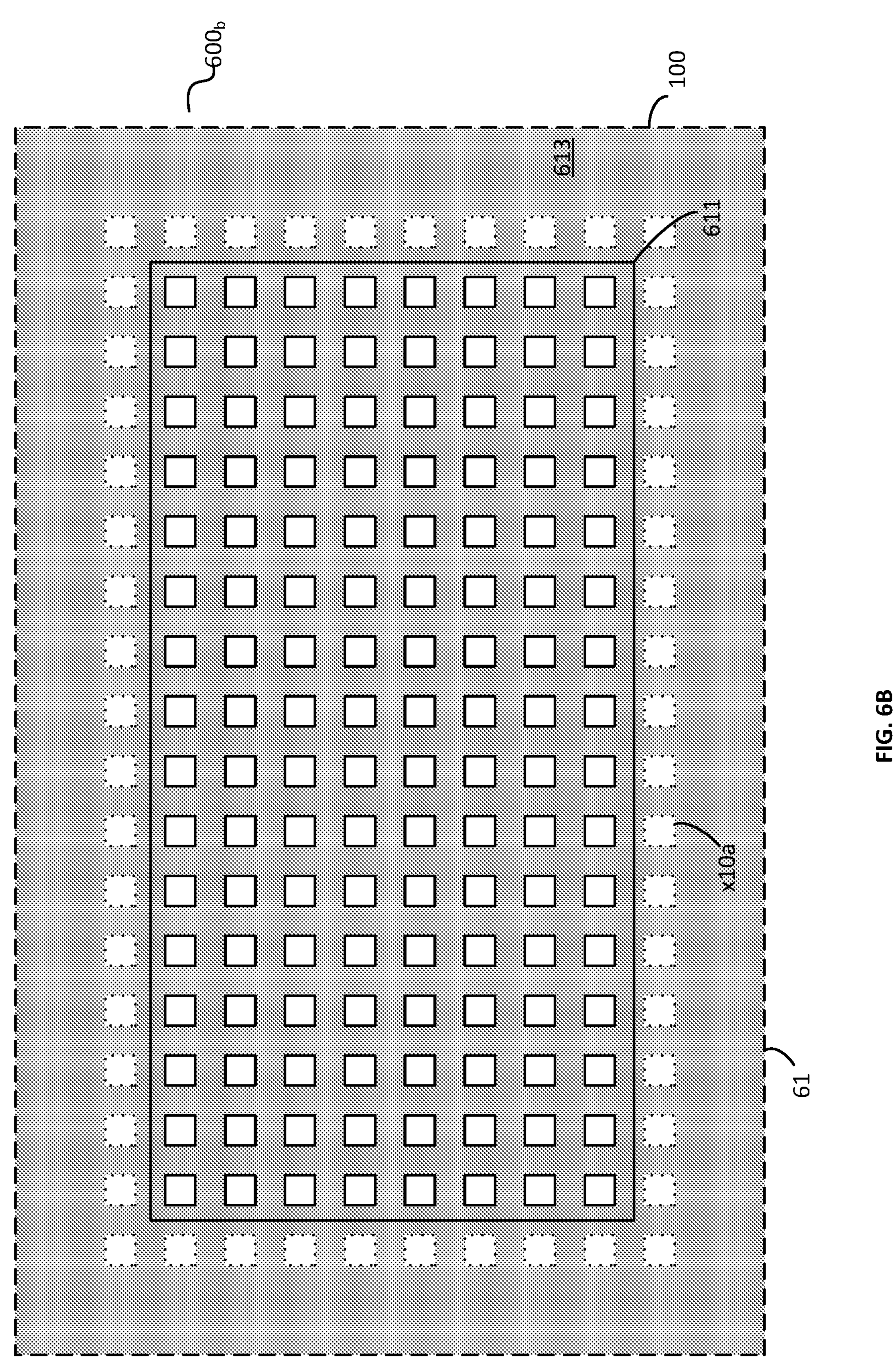

FIG. 6B illustrates a non-limiting example of an open mask 600*b* having, and/or defining an aperture 611 formed therein that is smaller than the aperture 610 of FIG. 6A, such that when the mask 9411 is overlaid on the device 300, the mask 600*b* covers at least the lateral aspect(s) 910*a* of the emissive region(s) 2210 corresponding to at least some (sub-) pixel(s) 1240/244*x*. As shown, in some non-limiting examples, the lateral aspect(s) 910*a* of the emissive region(s) 2210 corresponding to outermost (sub-) pixel(s) 1240/244_x_ are located within an unexposed region 613 of the device 300, formed between the outer edges 61 of the device 300 and the aperture 611, are masked during an open mask deposition process to inhibit evaporated deposited material 532 from being incident on the unexposed region 613.

Figure 6C:
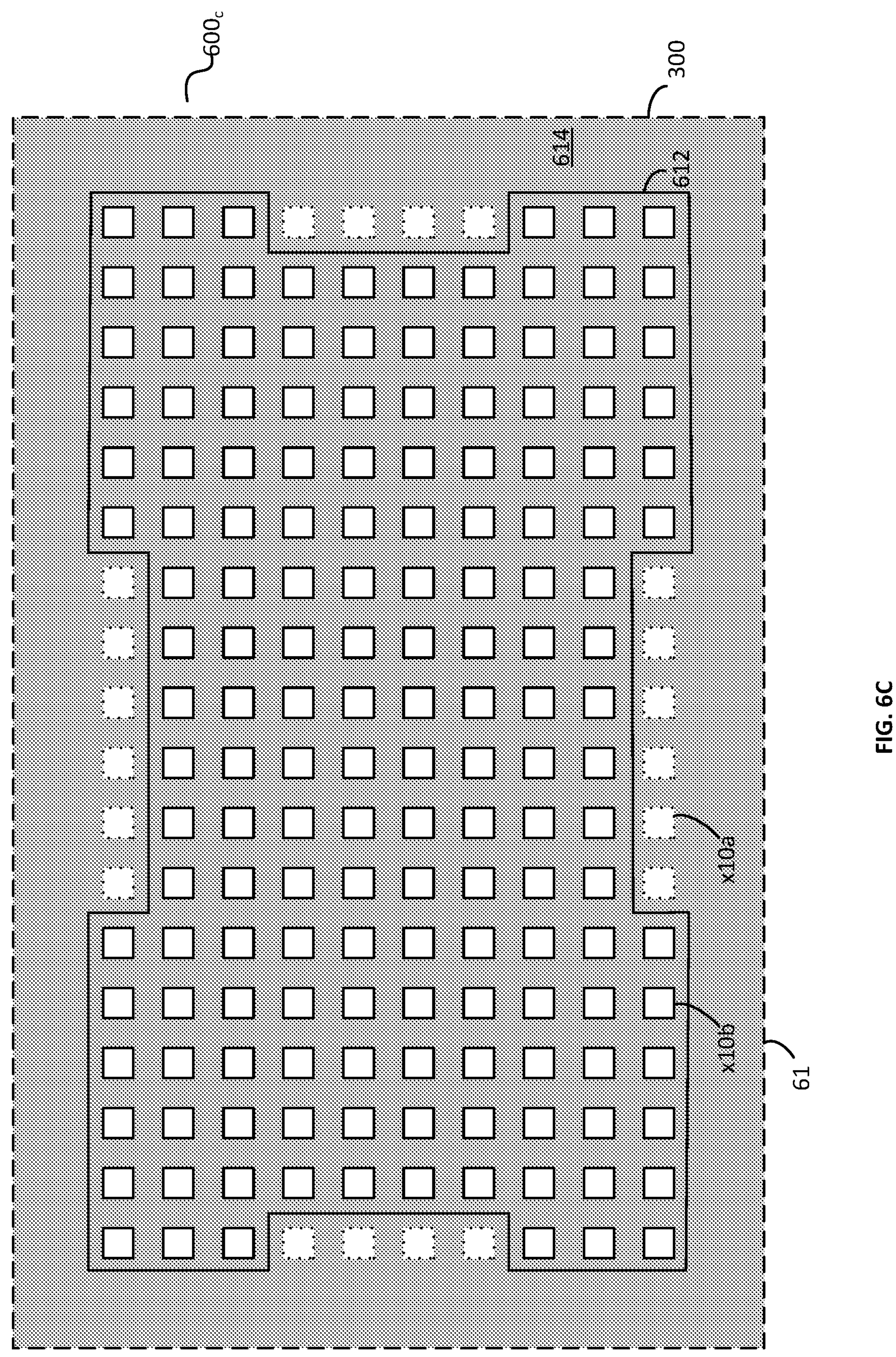

FIG. 6C illustrates a non-limiting example of an open mask 600_c_ having, and/or defining an aperture 612 formed therein defines a pattern that covers the lateral aspect(s) 910_a_ of the emissive region(s) 2210 corresponding to at least some (sub-) pixel(s) 1240/244_x_, while exposing the lateral aspect(s) 910_b_ of the emissive region(s) 2210 corresponding to at least some (sub-) pixel(s) 1240/244_x_. As shown, in some non-limiting examples, the lateral aspect(s) 910_a_ of the emissive region(s) 2210 corresponding to at least some (sub-) pixel(s) 1240/244_x_ located within an unexposed region 614 of the device 300, are masked during an open mask deposition process to inhibit evaporated deposited material 531 330 from being incident on the unexposed region 614.

While in FIGS. 6B-6C, the lateral aspects 910_a_ of the emissive region(s) 2210 corresponding to at least some of the outermost (sub-) pixel(s) 1240/244_x_ have been masked, as illustrated, those having ordinary skill in the relevant art will appreciate that, in some non-limiting examples, an aperture of an open mask 600 may be shaped to mask the lateral aspects 910 of other emissive region(s) 2210, and/or the lateral aspects x20 of non-emissive region(s) 2220 of the device 300.

Furthermore, while FIGS. 6A-6C show open masks 600 having a single aperture 610-612, those having ordinary skill in the relevant art will appreciate that such open masks 600 may, in some non-limiting examples (not shown), additional apertures (not shown) for exposing multiple regions of an exposed layer surface 11 of an underlying material of a device 300.

Figure 6D:
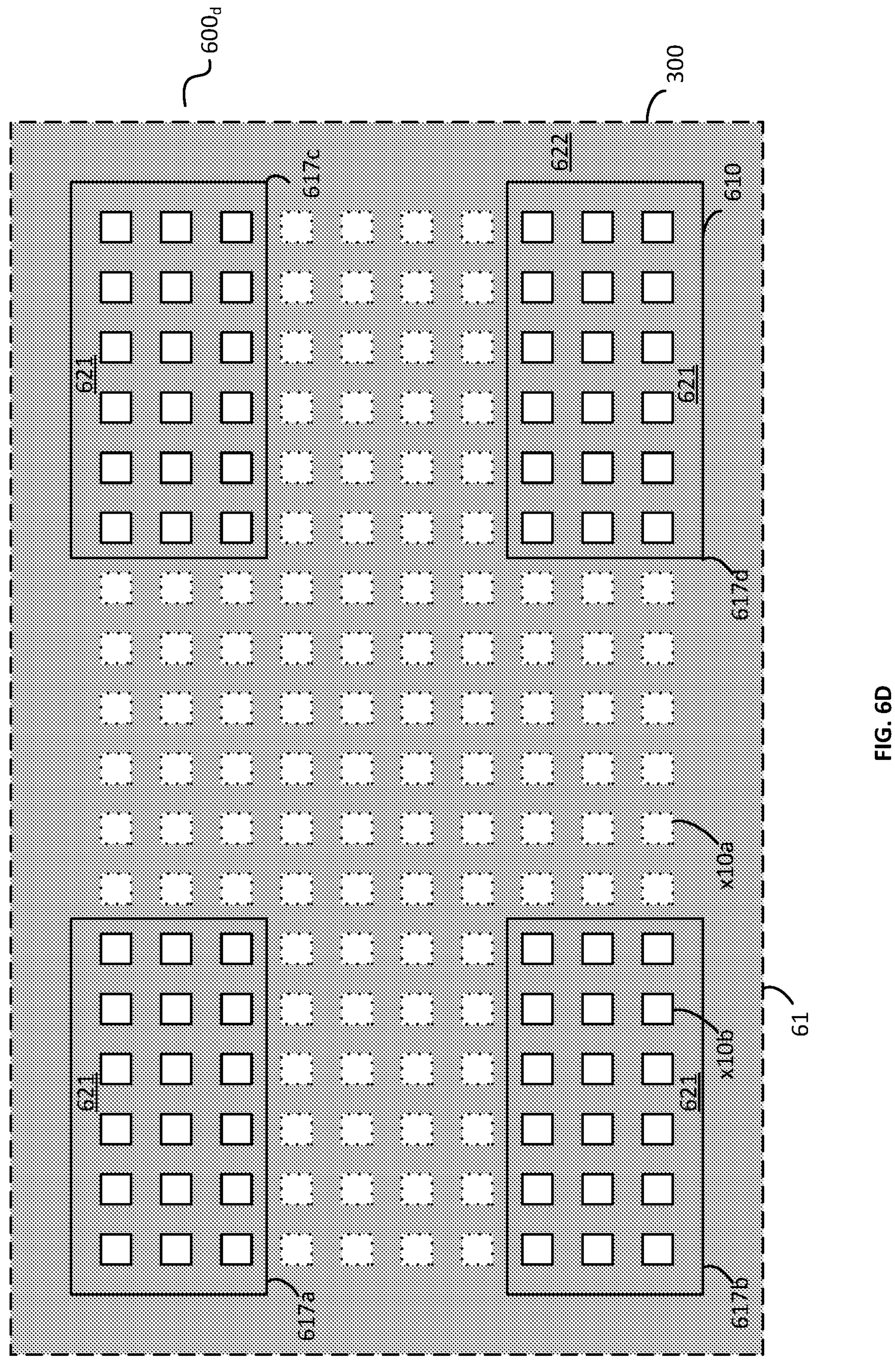

FIG. 6D illustrates a non-limiting example of an open mask 600_d_ having, and/or defining a plurality of apertures 617_a_-617_d_. The apertures 617_a_-617_d_ are, in some non-limiting examples, positioned such that they may selectively expose certain regions 621 of the device 300, while masking other regions 622. In some non-limiting examples, the lateral aspects 910_b_ of certain emissive region(s) 2210 corresponding to at least some (sub-) pixel(s) 1240/244_x_ are exposed through the apertures 617_a_-617_d_ in the regions 621, while the lateral aspects 910_a_ of other emissive region(s) 2210 corresponding to at least one some (sub-) pixel(s) 1240/244_x_ lie within regions 622 and are thus masked.

Indeed, as shown in FIG. 5A, the evaporated deposited material 532 is incident both on an exposed layer surface 11 of the NIC 310 across the first portion 301 as well as the exposed layer surface 11 of the substrate 10 across the second portion 302 that is substantially devoid of any NIC 310.

Since the exposed layer surface 11 of the NIC 310 in the first portion 301 exhibits a relatively low initial sticking probability $S_0$ against the deposition of the deposited layer 330 compared to the exposed layer surface 11 of the substrate 10 in the second portion 302, the deposited layer 330 is selectively deposited substantially only on the exposed layer surface 11 of the substrate 10 in the second portion 302 that is substantially devoid of the NIC 310. By contrast, the evaporated deposited material 532 incident on the exposed layer surface 11 of the NIC 310 across the first portion 301 tends not to be deposited, as shown (533) and the exposed layer surface 11 of the NIC 310 across the first portion 301 is substantially devoid of a closed coating 340 of the deposited layer 330.

In some non-limiting examples, an initial deposition rate, of the evaporated deposited material 531 on the exposed layer surface 11 of the substrate 10 in the second portion 302, may exceed about: 200 times, 550 times, 900 times, 1,000 times, 1,500 times, 1,900 times, or 2,000 times an initial deposition rate of the evaporated deposited material 531 on the exposed layer surface 11 of the NIC 310 in the first portion 301.

Thus, the combination of the selective deposition of an NIC 310 as the patterning coating 410 in FIG. 4 using a shadow mask 415 such as an FMM and the open mask 600, and/or mask-free deposition of the deposited material 531 may result in a version 300$_a$ of the device 300, shown in FIG. 3A.

The device 300$_a$ shows a lateral aspect 1310 of the exposed layer surface 11 of the underlying material. The lateral aspect 1310 comprises a first portion 301 and a second portion 302. In the first portion 301, an NIC 310 is disposed on the exposed layer surface 11. However, in the second portion 302, the exposed layer surface 11 is substantially devoid of the NIC 310. In some non-limiting examples, the second portion 302 comprises that part of the exposed layer surface 11 that lies beyond the first portion 301.

After selective deposition of the NIC 310 across the first portion 301, a closed coating 340 of the deposited material 531 is deposited over the device 300$_a$ as the deposited layer 330, in some non-limiting examples, using an open mask 600, and/or a mask-free deposition process, but remains substantially only within the second portion 302, which is substantially devoid of the NIC 310.

The NIC 310 provides, within the first portion 301, an exposed layer surface 11 with a relatively low initial sticking probability $S_0$, against the deposition of the deposited material 531, and that is substantially less than the initial sticking probability $S_0$, against the deposition of the deposited material 531, of the exposed layer surface 11 of the underlying material of the device 300$_a$ within the second portion 302.

Thus, the first portion 301 is substantially devoid of a closed coating 340 of the deposited material 531.

In this fashion, the NIC 310 may be selectively deposited, including using a shadow mask 415, to allow the deposited layer 330 to be deposited, including without limitation, using an open mask 600, and/or a mask-free deposition process, so as to form a device feature, including without limitation, an electrode 1020, 1040, 2150, a busbar 5050, and/or at least one layer thereof, and/or a conductive element electrically coupled thereto.

Thus, the selective deposition of an NIC 310 as the patterning coating 410 in FIG. 4 using a shadow mask 415 such as an FMM and the open mask 600, and/or mask-free deposition of the deposited material 531 may be combined in order to effect the selective deposition of at least one deposited layer 330 to form a device feature, including without limitation, a patterned electrode 1020, 1040, 2150, a busbar 5050, and/or at least one layer thereof, and/or a conductive element electrically coupled thereto, in the device 300$_a$ shown in FIG. 3A, without employing an FMM 415 within the deposited layer 330 deposition process. In some non-limiting examples, such patterning may permit, and/or enhance the transmissivity of the device 300$_a$.

Figure 5B:
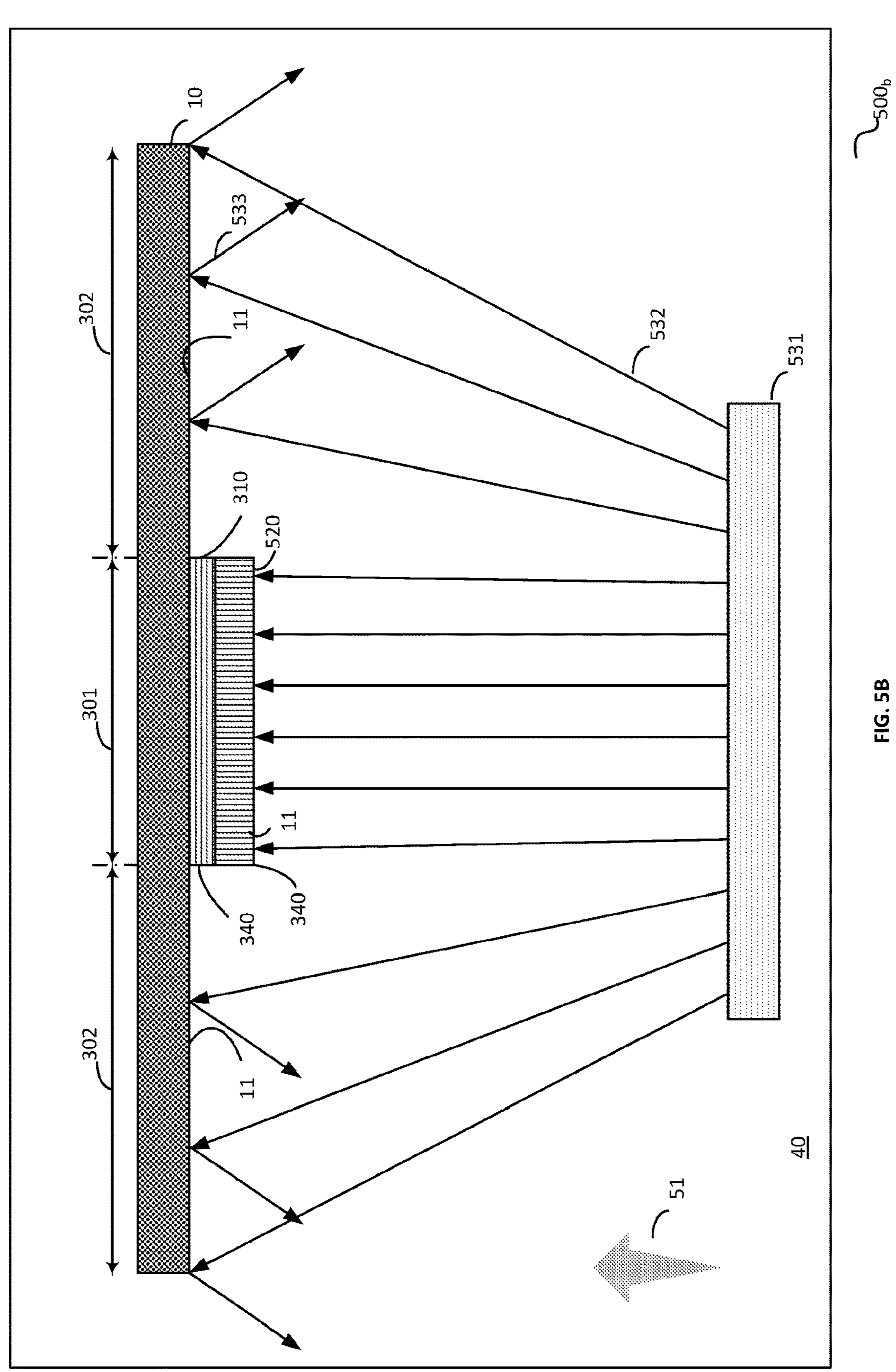
FIG. 5B is a schematic diagram showing an example process for depositing a deposited material in the first portion on an exposed layer surface that is substantially devoid of the patterning coating of FIG. 4, where the patterning coating is a nucleation-promoting coating (NPC)

In some non-limiting examples, the patterning coating 410 employed in FIG. 4 may be an NPC 520 (FIG. 5B).

FIG. 5B is an example schematic diagram illustrating a non-limiting example of a result of an evaporative process, shown generally at 500*b*, in a chamber 50, for selectively depositing a closed coating 340 of a deposited layer 330 onto the first portion 301 of an exposed layer surface 11 of an underlying material (in the figure, for purposes of simplicity of illustration only, the NPC 520 that was selectively deposited onto the first portion 301), including without limitation, by the evaporative process 400 of FIG. 4.

Once the NPC 520 has been deposited on the first portion 301 of an exposed layer surface 11 of an underlying material (in the figure, the substrate 10), a closed coating 340 of the deposited material 531 may be deposited on the first portion 301 of the exposed layer surface 11 that is substantially covered by the NPC 520 as the deposited layer 330.

In the process 500*b*, a quantity of the deposited material 531 is heated under vacuum, to evaporate, and/or sublime 532 the deposited material 531. In some non-limiting examples, the deposited material 531 comprises entirely, and/or substantially, a material used to form the deposited layer 330. Evaporated deposited material 532 is directed inside the chamber 40, including in a direction indicated by arrow 51, toward the exposed layer surface 11 of the first portion 301 and of the second portion 302. When the evaporated deposited material 531 832 is incident on the first portion 301 of the exposed layer surface 11, a closed coating 340 of the deposited material 531 may be formed thereon as the deposited layer 330.

In some non-limiting examples, deposition of the deposited material 531 may be performed using an open mask 600, and/or mask-free deposition process.

Indeed, as shown in FIG. 5B, the evaporated deposited material 532 is incident both on an exposed layer surface 11 of the NPC 520 across the first portion 301 as well as the exposed layer surface 11 of the substrate 10 across the second portion 302 that is substantially devoid of the NPC 520.

Since the exposed layer surface 11 of the NPC 520 in the first portion 301 exhibits a relatively high initial sticking probability $S_0$ against the deposition of the deposited material 531 compared to the exposed layer surface 11 of the substrate 10 in the second portion 302, the deposited layer 330 is selectively deposited substantially only on the exposed layer surface 11 of the NPC 520 in the first portion 301. By contrast, the evaporated deposited material 532 incident on the exposed layer surface 11 of the substrate 10 across the second portion 302 tends not to be deposited, as shown (533) and the exposed layer surface 11 of the substrate 10 across the second portion 302 is substantially devoid of a closed coating 340 of the deposited material 531.

Figure 7:
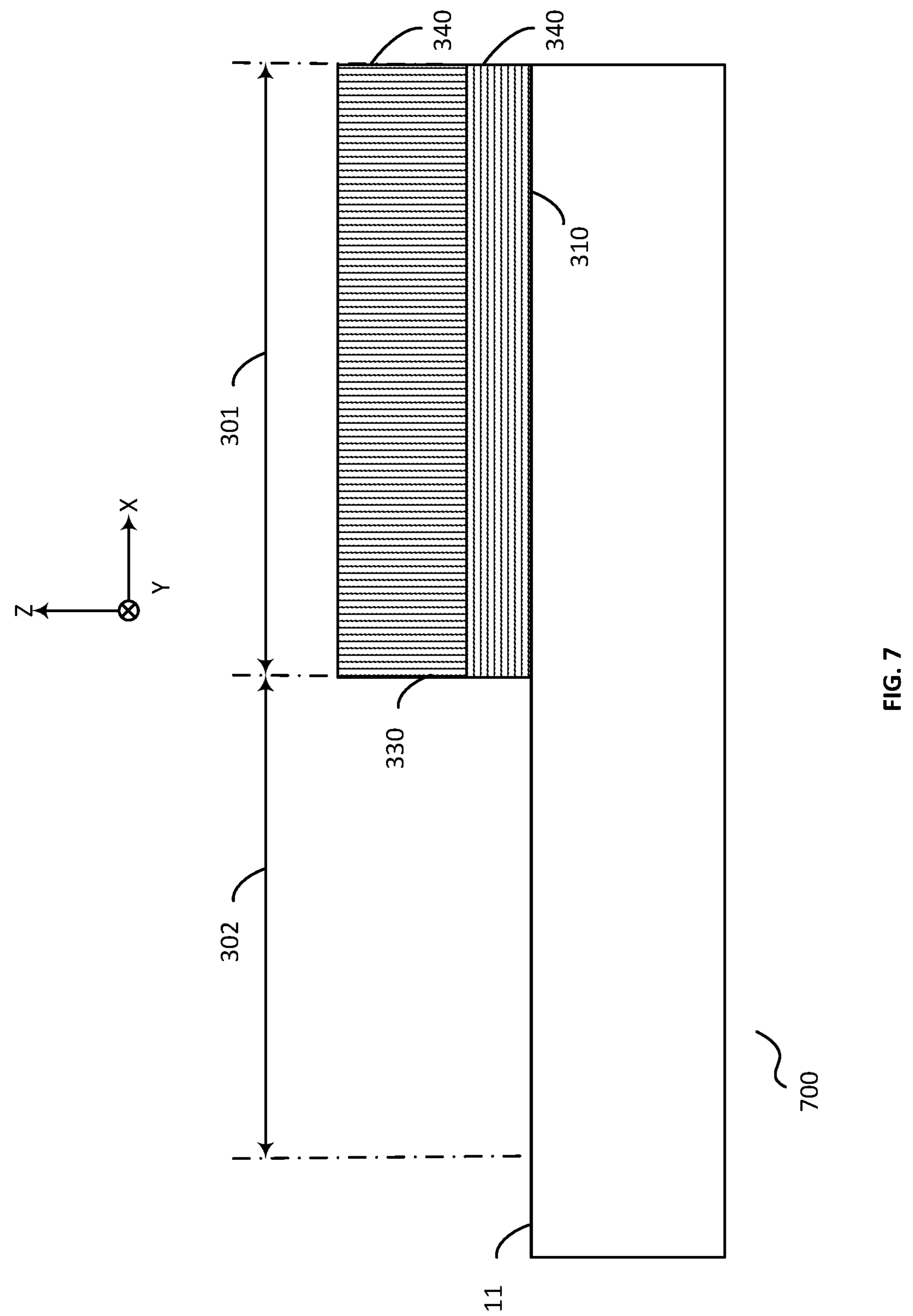
FIG. 7 is a simplified block diagram from a cross-sectional aspect, of an example device having a plurality of layers in a lateral aspect, formed by selective deposition of an NPC in a first portion of the lateral aspect, followed by deposition of a closed coating of deposited material 531 thereover in the first portion, according to an example in the present disclosure.

Thus, the combination of the selective deposition of an NPC 520 as the patterning coating 410 in FIG. 4 using a shadow mask 415 such as an FMM and the open mask 600, and/or mask-free deposition of the deposited material 531 may result in a version 700 of the device 300, shown in FIG. 7.

The device 300 shows a lateral aspect 1310 of the exposed layer surface 11 of the underlying material. The lateral aspect 1310 comprises a first portion 301 and a second portion 302. In the first portion 301, an NPC 520 is disposed on the exposed layer surface 11. However, in the second portion 302, the exposed layer surface 11 is substantially devoid of the NPC 520. In some non-limiting examples, the second portion 302 comprises that part of the exposed layer surface 11 that lies beyond the first portion 301.

After selective deposition of the NPC 520 across the first portion 301, a closed coating 340 of the deposited material 531 is deposited over the device 300*b* as the deposited layer 330, in some non-limiting examples, using an open mask 600, and/or a mask-free deposition process, but remains substantially only within the first portion 301, which contains the deposited NPC 520.

The NPC 520 provides, within the first portion 301, an exposed layer surface 11 with a relatively high initial sticking probability $S_0$, against the deposition of the deposited material 531, and that is substantially greater than the initial sticking probability $S_0$, against the deposition of the deposited material 531, of the exposed layer surface 11 of the underlying material of the device 300*b* within the second portion 302.

Thus, the second portion 302 is substantially devoid of a closed coating 340 of the deposited material 531.

In this fashion, the NPC 520 may be selectively deposited, including using a shadow mask 415, to allow the deposited layer 330 to be deposited, including without limitation, using an open mask 600, and/or a mask-free deposition process, so as to form a device feature, including without limitation, an electrode, a busbar 5050, and/or at least one layer thereof, and/or a conductive element electrically coupled thereto.

Thus, the selective deposition of an NPC 520 as the patterning coating 410 in FIG. 4 using a shadow mask 415 such as an FMM and the open mask 600, and/or mask-free deposition of the deposited material 531 may be combined in order to effect the selective deposition of at least one deposited layer 330 to form a device feature, including without limitation, a patterned electrode 1020, 1040, 2150, 5050, and/or a conductive element electrically coupled thereto, in the device 700 shown in FIG. 7, without employing an FMM 415 within the deposited layer 330 deposition process. In some non-limiting examples, such patterning may permit, and/or enhance the transmissivity of the device 700.

In some non-limiting examples, the patterning coating 410, which may be an NIC 310, and/or an NPC 520, may be applied a plurality of times during the manufacturing process of the device 300, in order to pattern a device feature comprising a plurality of electrodes 1020, 1040, 2150, busbars 5050, and/or at least one layer thereof, and/or various layers thereof, and/or a deposited layer 330 electrically coupled thereto.

In some non-limiting examples, a thickness of the patterning coating 410, such as an NIC 310, and/or an NPC 520, and of the deposited layer 330 deposited thereafter may be varied according to a variety of parameters, including without limitation, a desired application and desired performance characteristics. In some non-limiting examples, the thickness of the NIC 310 may be comparable to, and/or substantially less than a thickness of the deposited layer 330 deposited thereafter. Use of a relatively thin NIC 310 to achieve selective patterning of a deposited layer 330 may be suitable to provide flexible devices 300, including without limitation, PMOLED devices. In some non-limiting examples, a relatively thin NIC 310 may provide a relatively planar surface on which a barrier coating 2050 (FIG. 20C) or other thin film encapsulation (TFE) layer, may be deposited. In some non-limiting examples, providing such a relatively planar surface for application of the barrier coating 2050 may increase adhesion of the barrier coating 2050 to such surface.

NICs

The NIC 310 may comprise an NIC material 511. In some non-limiting examples, the NIC 310 may comprise a closed coating 340 of the NIC material 511.

The NIC 310 may provide an exposed layer surface 11 with a relatively low initial sticking probability $S_0$ against the deposition of deposited material 531, which, in some non-limiting examples, may be substantially less than the initial sticking probability $S_0$ (against the deposition of the deposited material 531) of the exposed layer surface 11 of the underlying layer of the device 300, upon which the NIC 310 has been deposited.

Because of the low initial sticking probability $S_0$ of the NIC 310, and/or the NIC material 511, in some non-limiting examples, when deposited as a film, and/or coating in a form, and under circumstances similar to the deposition of the NIC 310 within the device 300, against the deposition of the deposited material 531, the NIC 310 may be substantially devoid of a closed coating 340 of the deposited material 531.

In some non-limiting examples, the NIC 310, and/or the NIC material 511, in some non-limiting examples, when deposited as a film, and/or coating in a form, and under circumstances similar to the deposition of the NIC 310 within the device 300, may have an initial sticking probability $S_0$ (in some non-limiting examples, under the conditions identified in the dual QCM technique described by Walker et al.) against the deposition of the deposited material 531, that is less than about: 0.9, 0.3, 0.2, 0.15, 0.1, 0.08, 0.05, 0.03, 0.02, 0.01, 0.008, 0.005, 0.003, 0.001, 0.0008, 0.0005, 0.0003, or 0.0001.

In some non-limiting examples, the NIC 310, and/or the NIC material 511, in some non-limiting examples, when deposited as a film, and/or coating in a form, and under circumstances similar to the deposition of the NIC 310 within the device 300, may have an initial sticking probability $S_0$ (in some non-limiting examples, under the conditions identified in the dual QCM technique described by Walker et al.) against the deposition of silver (Ag), and/or magnesium (Mg) that is less than about: 0.9, 0.3, 0.2, 0.15, 0.1, 0.08, 0.05, 0.03, 0.02, 0.01, 0.008, 0.005, 0.003, 0.001, 0.0008, 0.0005, 0.0003, or 0.0001.

In some non-limiting examples, the NIC 310, and/or the NIC material 511, in some non-limiting examples, when deposited as a film, and/or coating in a form, and under circumstances similar to the deposition of the NIC 310 within the device 300, may have an initial sticking probability $S_0$ (in some non-limiting examples, under the conditions identified in the dual QCM technique described by Walker et al.) against the deposition of a deposited material 531 of between about: 0.15-0.0001, 0.1-0.0003, 0.08-0.0005, 0.08-0.0008, 0.05-0.001, 0.03-0.0001, 0.03-0.0003, 0.03-0.0005, 0.03-0.0008, 0.03-0.001, 0.03-0.005, 0.03-0.008, 0.03-0.01, 0.02-0.0001, 0.02-0.0003, 0.02-0.0005, 0.02-0.0008, 0.02-0.001, 0.02-0.005, 0.02-0.008, 0.02-0.01, 0.01-0.0001, 0.01-0.0003, 0.01-0.0005, 0.01-0.0008, 0.01-0.001, 0.01-0.005, 0.01-0.008, 0.008-0.0001, 0.008-0.0003, 0.008-0.0005, 0.008-0.0008, 0.008-0.001, 0.008-0.005, 0.005-0.0001, 0.005-0.0003, 0.005-0.0005, 0.005-0.0008, or 0.005-0.001.

In some non-limiting examples, the NIC 310, and/or the NIC material 511, in some non-limiting examples, when deposited as a film, and/or coating in a form, and under circumstances similar to the deposition of the NIC 310 within the device 300, may have an initial sticking probability $S_0$ (in some non-limiting examples, under the conditions identified in the dual QCM technique described by Walker et al.) that is less than a threshold value against the deposition of a plurality of deposited materials 531. In some non-limiting examples, the threshold value may be about: 0.3, 0.2, 0.18, 0.15, 0.13, 0.1, 0.08, 0.05, 0.03, 0.02, 0.01, 0.008, 0.005, 0.003, or 0.001.

In some non-limiting examples, the NIC 310, and/or the NIC material 511, in some non-limiting examples, when deposited as a film, and/or coating in a form, and under circumstances similar to the deposition of the NIC 310 within the device 300, may have an initial sticking probability $S_0$ (in some non-limiting examples, under the conditions identified in the dual QCM technique described by Walker et al.) that is less than a threshold value against the deposition of two or more deposition materials 531 selected from: Ag, Mg, Yb, Cd, and Zn. In some further non-limiting examples, the NIC 310 may exhibit $S_0$ of or below a threshold value against the deposition of two or more deposition materials 531 selected from: Ag, Mg, and Yb.

In some non-limiting examples, the NIC 310, and/or the NIC material 511, in some non-limiting examples, when deposited as a film, and/or coating in a form, and under circumstances similar to the deposition of the NIC 310 within the device 300, may exhibit an initial sticking probability $S_0$ of, or below, a first threshold value against the deposition of a first deposited material 531, and an initial sticking probability $S_0$ of, or below, a second threshold value against the deposition of a second deposited material 531. In some non-limiting examples, the first deposited material 531 may be Ag, and the second deposited material 531 may be Mg. In some other non-limiting examples, the first deposited material 531 may be Ag, and the second deposited material 531 may be Yb. In some other non-limiting examples, the first deposited material 531 may be Yb, and the second deposited material 531 may be Mg. In some non-limiting examples, the first threshold value may be greater than the second threshold value.

In some non-limiting examples, the NIC 310, and/or the NIC material 511, in some non-limiting examples, when deposited as a film, and/or coating in a form, and under circumstances similar to the deposition of the NIC 310 within the device 300, may have an extinction coefficient k that may be less than about 0.01 for photons at a wavelength that exceeds at least one of about: 600 nm, 500 nm, 460 nm, 420 nm, or 410 nm.

In some non-limiting examples, the NIC 310 comprises a compound containing a rare earth element, selected from: cerium (Ce), dysprosium (Dy), erbium (Er), europium (Eu), gadolinium (Gd), holmium (Ho), lanthanum (La), lutetium (Lu), neodymium (Nd), promethium (Pm), praseodymium (Pr), scandium (Sc), samarium (Sm), terbium (Tb), thulium (Tm), yttrium (Y), and ytterbium (Yb). In some non-limiting examples, the rare earth element is selected from: Ce, Dy, Er, Eu, Gd, Ho, Lu, Nd, Pr, Sm, Tb, Tm, and Yb. In some non-limiting examples, the rare earth element is selected from: Ce, Dy, Er, Eu, Gd, Ho, Lu, Nd, Sm, Tm, and Yb.

In some non-limiting examples, the compound is an oxide of the rare earth element, including, without limitation: $CeO_2$, $Dy_2O_3$, $Er_2O_3$, $Eu_2O_3$, $Gd_2O_3$, $Ho_2O_3$, $La_2O_3$, $Lu_2O_3$, $Nd_2O_3$, $Pr_6O_{11}$, $Pr_2O_3$, $PrO_2$, $Pr_2O_5$, $Pm_2O_3$, $Sm_2O_3$, $Sc_2O_3$, $Tb_7O_{12}$, $Tb_2O_3$, $TbO_2$, $Tb_3O_7$, $Tm_2O_3$, $Yb_2O_3$, and $Y_2O_3$.

In general, metals and metallic compounds, including by way of non-limiting example, pure metals and metal oxides, are known to exhibit relatively high critical surface tension. However, it has been found, somewhat surprisingly, that at least some oxides of rare earth elements ("rare earth oxides"), exhibit a relatively low critical surface tension.

Without wishing to be bound by any particular theory, it may be postulated that low energy surfaces formed by such rare earth oxides may exhibit relatively low initial sticking probabilities, and may thus be particularly suitable for forming the NIC 310 or a component thereof.

Without wishing to be bound by any particular theory, it may be postulated that, especially for low surface energy surfaces, the critical surface tension may positively correlate with the surface energy. By way of non-limiting example, a surface exhibiting a relatively low critical surface tension may also exhibit a relatively low surface energy, and a surface exhibiting a relatively high critical surface tension may also exhibit a relatively high surface energy.

According to some models of surface energy, the critical surface tension of a surface may equate to, or substantially equate to, the surface energy of such surface. In reference to Young's equation described above, a lower surface energy may result in a greater contact angle $\theta$, while also lowering the $\gamma_{sv}$, thus enhancing the likelihood of such surface having low wettability and low initial sticking probability $S_0$ against deposition of the deposited material 531 for forming the deposited layer 330.

In some non-limiting examples, the exposed layer surface 11 of the NIC 310 may be, at least partially, formed by a rare earth oxide and may exhibit a critical surface energy Y1 of less than about: 40 dynes/cm, 35 dynes/cm, 30 dynes/cm, 28 dynes/cm, 25 dynes/cm, 23 dynes/cm, 20 dynes/cm, 18 dynes/cm, or 15 dynes/cm. In some non-limiting examples, the critical surface energy Y1 of the surface of the NIC 310 may be between about: 10-40 dynes/cm, 10-35 dynes/cm, 10-30 dynes/cm, 10-28 dynes/cm, 10-25 dynes/cm, 10-23 dynes/cm, 10-20 dynes/cm, 10-19 dynes/cm, 10-18 dynes/cm, or 10-15 dynes/cm. In some non-limiting examples, the critical surface energy Y1 of the surface of the NIC 310 may be determined according to the Zisman method, as further detailed in W. A. Zisman, Advances in Chemistry 43 (1964), P. 1-51.

Figure 8A:
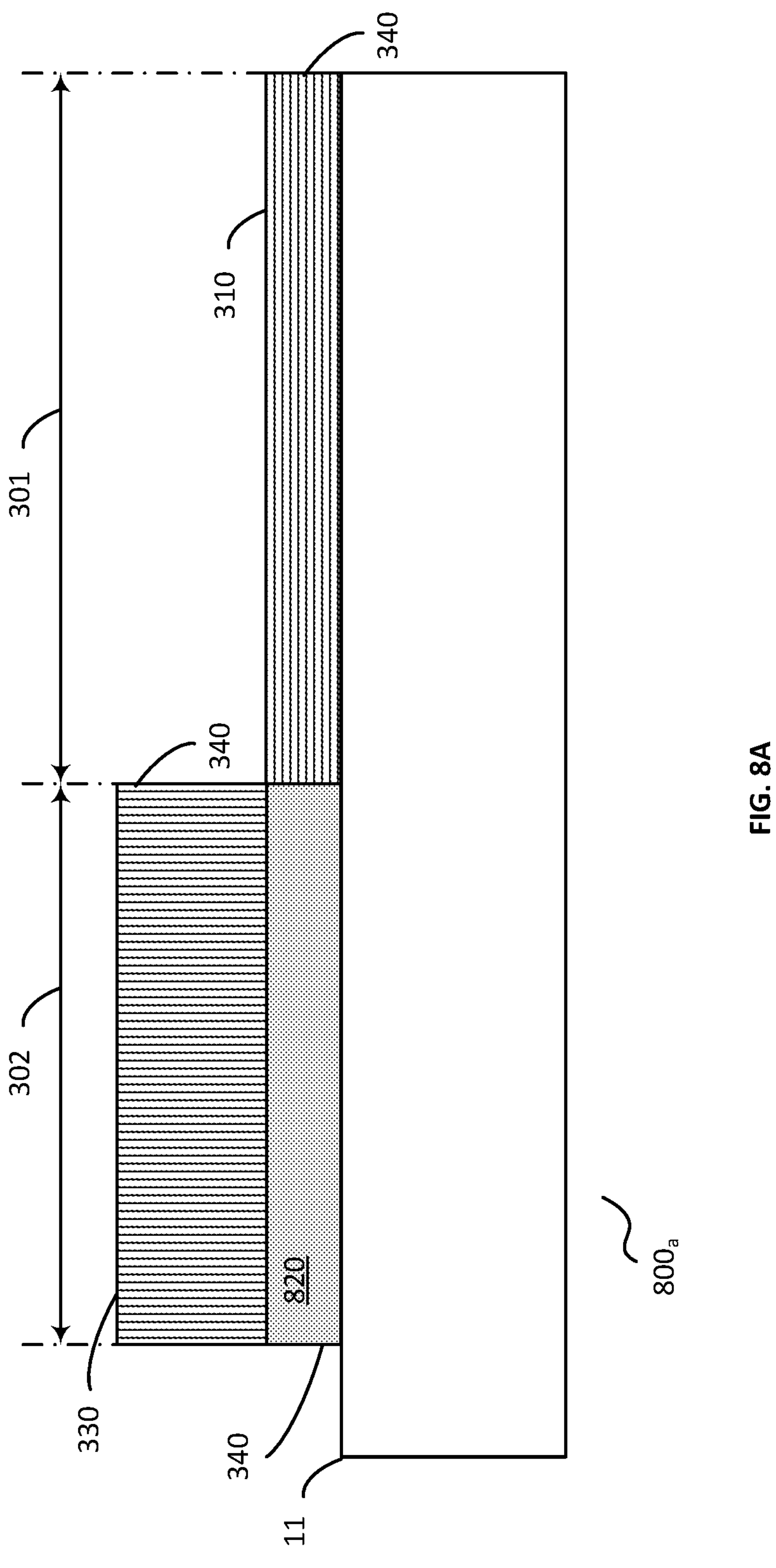
FIGS. 8A-8C are example versions of the device of FIG. 3A, with additional example deposition steps according to examples in the present disclosure.

Turning now to FIG. 8A, there is shown an example version 800$_a$ of the device 300.

The device 800$_a$ shows a lateral aspect of the exposed layer surface 11 of the underlying material. The lateral aspect comprises a first portion 301 and a second portion 302. In the first portion 301, an NIC 310 is disposed on the exposed layer surface 11. In the second portion 302, an interface coating 820 is disposed on the exposed layer surface 11. The second portion 302 is substantially devoid of the NIC 310.

After deposition of the NIC 310 across the first portion 301 and the interface coating 820 across the second portion 302, deposited material 531 is deposited over the device 800$_a$, in some non-limiting examples, using an open mask 600, and/or a mask-free deposition process, but remains substantially only within the second portion 302, which is substantially devoid of the NIC 310.

The NIC 310 provides, within the first portion 301, an exposed layer surface 11 with a relatively low initial sticking probability $S_0$, against the deposition of the deposited material 531, and that is substantially less than the initial sticking probability $S_0$ against the deposition of the deposited material 531, of the exposed layer surface 9410 of the interface coating 820 within the second portion 302. In some non-limiting examples, the interface coating 820 may be an NPC 520.

Thus, the first portion 301 is substantially devoid of a closed coating 340 of the deposited material 531.

In this fashion, the NIC 310 may be selectively deposited, including using a shadow mask 415, to allow the deposited layer 330 to be deposited, including without limitation, using an open mask 600, and/or a mask-free deposition process, so as to form a device feature, including without limitation, an electrode 1020, 1040, 2150, a busbar 5050, and/or at least one layer thereof, and/or at least one layer thereof, and/or a conductive element electrically coupled thereto.

In some non-limiting examples, the interface coating 820 may comprise a rare earth element. In some non-limiting examples, the interface coating 820 and the NIC 310 comprise the same rare earth element. In some other non-limiting examples, the rare earth element in the interface coating 520 is different from the rare earth element in the NIC 310.

In some non-limiting examples, the device 800$_a$ is an opto-electronic device having at least one emissive region 2210 in the second portion 302. In some non-limiting examples, the interface coating 820 may act as an electron injection layer (EIL) 139 and the deposited layer 330 may form a cathode 1242, or a part thereof, of the device 800$_a$. In some non-limiting examples, the interface coating 820, together with the deposited layer 330, may form the cathode 1242 of the device 800$_a$ or a part thereof.

In some non-limiting examples, the interface coating 820 and the NIC 310 may be formed contiguously across the lateral aspect of the device 800$_a$. By way of non-limiting example, an edge of the interface coating 820 may abut an edge of the NIC 310.

In some non-limiting examples, the interface coating 820 and the NIC 310 may be formed substantially continuously across the lateral aspect.

In some non-limiting examples, during the manufacture of the device 800$_a$ and prior to depositing the deposited layer 330, a rare earth element is deposited on both the first portion 301 and the second portion 302 of the lateral aspect. In some non-limiting examples, the rare earth element deposited on the first portion 301, upon being deposited, and/or subjected to additional processing, may be oxidized to form a rare earth oxide that may constitute the NIC 310. By contrast, in some non-limiting examples, the rare earth element deposited on the second portion 302 may form the interface coating 820. In some non-limiting examples, the interface coating 820 may contain a rare earth element having an oxidation state of 0.

Figure 8B:
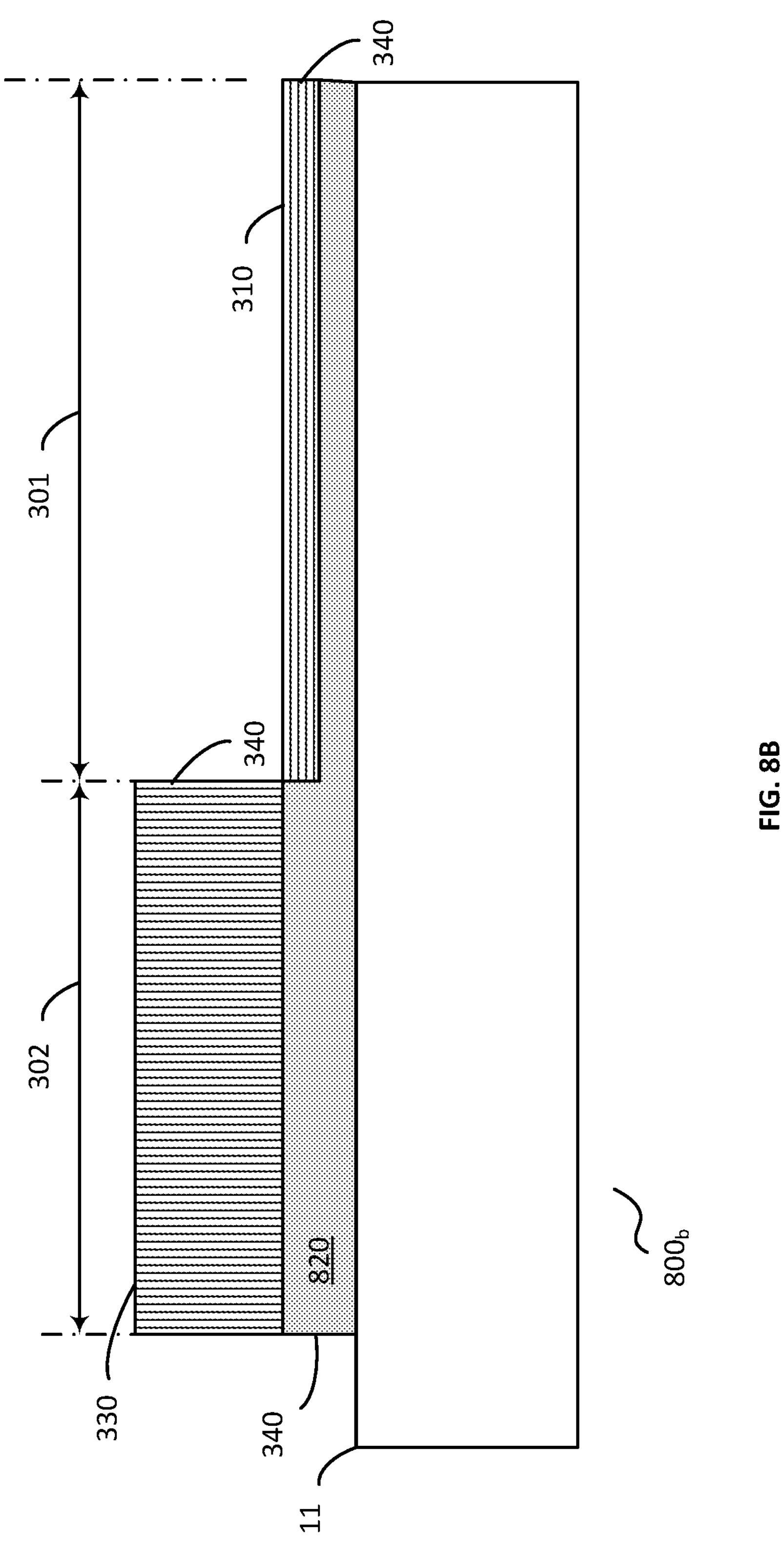

Turning now to FIG. 8B, there is shown an example version 800$_b$ of the device 300.

The device 800$_b$ shows a lateral aspect of the exposed layer surface 11 of the underlying material. An interface coating 820 is disposed over the exposed layer surface 11 across both the first portion 301 and the second portion 302. In the first portion 301, the NIC 310 is disposed over the interface coating 820. In some non-limiting examples, the NIC 310 may be formed by causing an exposed layer surface 11 of the interface coating 820 to become oxidized. After forming the NIC 310, the deposited layer 330 is deposited in the second portion 302 over the interface coating 820. By way of non-limiting example, the first portion 301 continues to have a part of the interface coating 820 disposed between the NIC 310 and the exposed layer surface 11 of the underlying surface, and the second portion 302 has another part of the interface coating 820 disposed between the deposited layer 330 and the exposed layer surface 11 of the underlying surface. The interface coating 820 comprises a rare earth element, and the NIC 310 comprises an oxide of such rare earth element. In some non-limiting examples, the interface coating 820 in the first portion 301 and the second portion 302 are formed continuously with each other, or as a single monolithic structure. In some non-limiting examples, a thickness of the interface coating 820 in the first portion 301 may be less than a thickness of the interface coating 820 in the second portion 302.

Figure 8C:
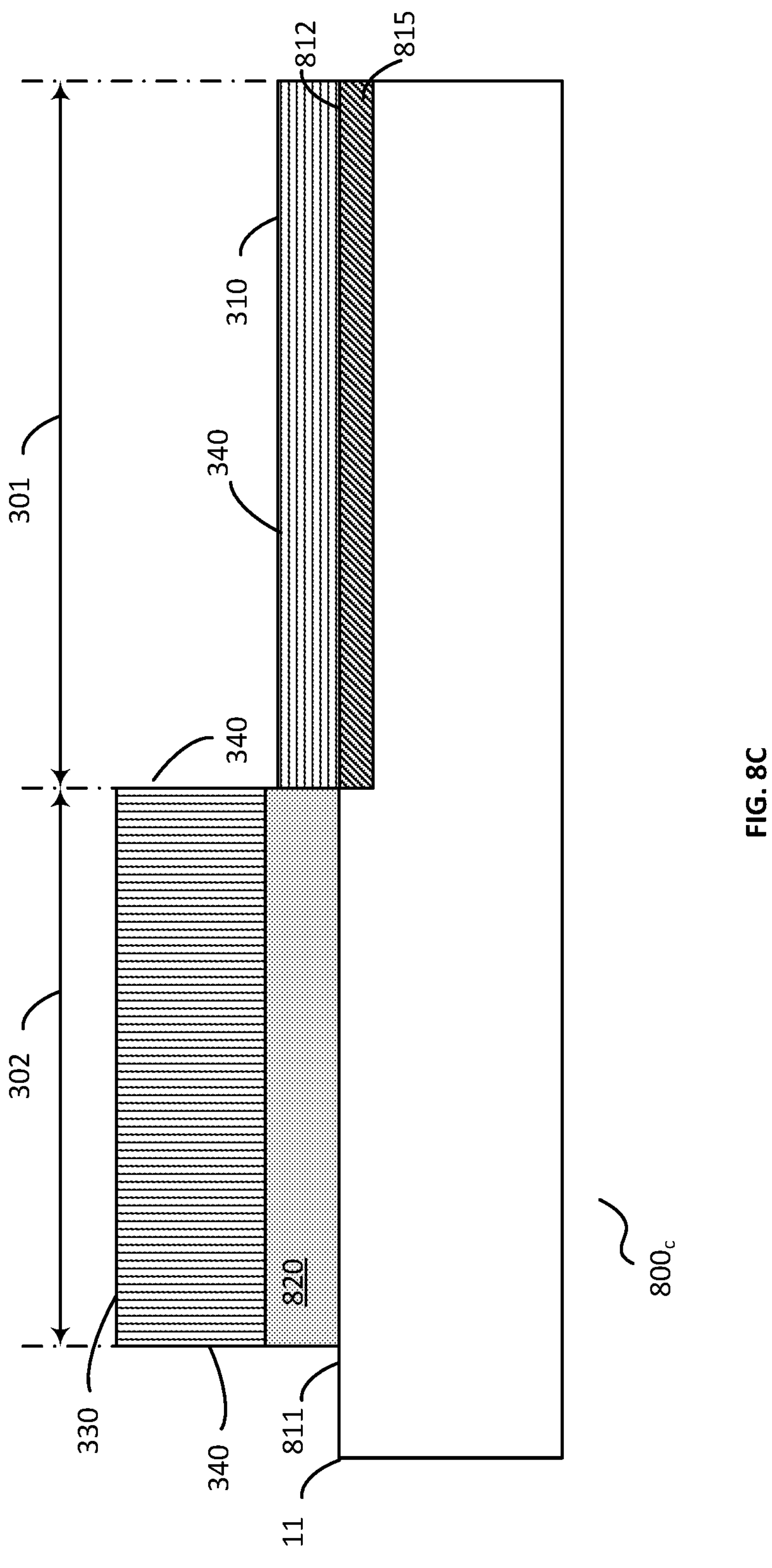

Turning now to FIG. 8C, there is shown an example version 800$_c$ of the device 300.

The device 800$_c$ shows a first part 811 of the lateral aspect of the exposed layer surface 11 of the underlying material being provided in the second portion 302, and a second part 812 of the lateral aspect of the exposed layer surface 11 being provided in the first portion 301. In some non-limiting examples, as shown, the second part 812 may correspond to the surface of a modifying layer 815 provided in the first portion 301. In some non-limiting examples, during the manufacture of the device 800$_c$, a rare earth element may be deposited on both the first portion 301 and the second portion 302. To the extent that such rare earth element is deposited on or over the modifying layer 815, the modifying layer 815 may cause, promote, and/or catalyze the oxidation of the rare earth element disposed thereon in the first portion 301, thus forming the NIC 310.

In some non-limiting examples, the surface energy or critical surface tension Y1 of the exposed layer surface 11 of the underlying surface 11 in the second part 812 is lower than that in the first part 811 thereof. By way of non-limiting example, the exposed layer surface 11 in the second part 812 may exhibit a lower initial sticking probability $S_0$ against deposition of the rare earth element relative to the exposed layer surface 11 in the first part 811. In such scenario, as discussed herein in the context of particle structures 941, in some non-limiting examples, a thickness of the NIC 310 formed by deposition and subsequent oxidation of the rare earth element in the first part 811 may be less than a thickness of the interface coating 820 formed by deposition of the rare earth element in the second part 812. By way of non-limiting example, the NIC 310 may include a rare earth oxide formed as particle structures 941 in the second part 812. Without wishing to be bound by any particular theory, it is postulated that the relatively high critical surface energy Y1 of the exposed layer surface 11 of the underlying surface in the second part 812 may cause the rare earth element to be deposited thereon as particle structures 941 during manufacture of the device 800$_c$. Such morphology of the rare earth element may facilitate the oxidation of the rare earth element to form the NIC 310.

In some non-limiting examples, the rare earth element is Yb. In some non-limiting examples, the interface coating 820 comprises Yb and the NIC 310 comprises ytterbium oxide, which may for example be represented by the formula $Yb_2O_3$. In such examples, the NIC 310 comprises Yb having an oxidation state of 3+. For purposes of illustration only, such specie may be represented as $Yb^{3+}$ herein. Similarly, Yb specie having an oxidation state of 0 and 2+ may be represented respectively as $Yb^0$ and $Yb^{2+}$. In some non-limiting examples, the interface coating 820 comprises $Yb^0$.

In some non-limiting examples, a concentration of $Yb^{3+}$ specie in the first portion 301 may exceed a concentration of $Yb^{3+}$ specie in the second portion 302. By way of non-limiting example, the device 800$_c$ may, in some non-limiting examples, satisfy the following relationship:

$$\frac{Yb_{FP}^{3+}}{Yb_{FP}^{0}+Yb_{FP}^{2+}+Yb_{FP}^{3+}} > \frac{Yb_{SP}^{3+}}{Yb_{SP}^{0}+Yb_{SP}^{2+}+Yb_{SP}^{3+}}$$

where $$Yb_{FP}^{0},\ YB_{FP}^{2+},\text{ and } Yb_{FP}^{3+}$$

correspond respectively to the number of $Yb^0$, $Yb^{2+}$, and $Yb^{3+}$ specie present in the first portion 301, and $$Yb_{SP}^{0},\ YB_{SP}^{2+},\text{ and } Yb_{SP}^{3+}$$

correspond respectively to the number of $Yb^0$, $Yb^{2+}$, and $Yb^{3+}$ specie present in the second portion 302.

In some non-limiting examples, a concentration of $Yb^0$ specie in the second portion 302 may exceed a concentration of $Yb^0$ specie in the first portion 301. By way of non-limiting example, the device 800$_c$ may, in some non-limiting examples, satisfy the following relationship:

$$\frac{Yb_{SP}^{0}}{Yb_{SP}^{0}+Yb_{SP}^{2+}+Yb_{SP}^{3+}} > \frac{Yb_{FP}^{0}}{Yb_{FP}^{0}+Yb_{FP}^{2+}+Yb_{FP}^{3+}}$$

It has now been found that a surface comprising a rare earth element having an oxidation state of 0 may exhibit substantially higher critical surface energy Y1 than a surface comprising a rare earth oxide, in which the rare earth element has a non-zero oxidation state. As described above, materials found to form relatively low energy surfaces may be particularly suitable for use as an NIC 310, and materials found to form relatively high energy surfaces may be suitable for use as the interface coating 820, which may act as, and/or be an NPC 520.

In some non-limiting examples, a concentration of a rare earth oxide in the first portion 301 may exceed a concentration of the rare earth oxide in the second portion 302. In some non-limiting examples, a concentration of a rare earth element having an oxidation state of zero in the second portion 302 may exceed a concentration of the rare earth element having an oxidation state of zero in the first portion 301. In some non-limiting examples, a majority of the rare earth element in the first region 301 may have a non-zero oxidation state, and a majority of the rare earth element in the second region 302 may have an oxidation state of zero.

By way of non-limiting example, the presence of rare earth elements and their oxidation states in thin films may be detected using a variety of techniques, including but not limited to, x-ray photoelectron spectroscopy (XPS). Using XPS for example, a core-level binding energy and associated intensities may be determined. The measured binding energy may then be compared against reference binding energies of known elements in various forms and oxidation states to determine the species present in the measured sample. Non-limiting examples of reference core-level binding energy for various rare earth elements in their metal form and oxide forms are summarized in the table below.

| Metal | Oxide | Core Level | Binding Energy in Metal (eV) | Binding Energy in Oxide (eV) |
|---|---|---|---|---|
| Dy | $Dy_2O_3$ | 4d | 152-153 | 155.8-168 |
| | | 3d5/2 | 1295.3-1296.8 | 1297.6-1298.9 |
| Er | $Er_2O_3$ | 4d | 166.7-167.7 | 168.4-169 |
| Eu | $Eu_2O_3$ | 4d | 128.2-128.8 | 135.2-135.9 |
| | | 3d5/2 | 1125.2-1125.7 | 1135.2-1136 |
| Gd | $Gd_2O_3$ | 4d5/2 | 140-141.7 | 141.8-143.8 |
| | | 3d5/2 | 1186.7-1187.3 | 1187.7-1189.3 |
| Ho | $Ho_2O_3$ | 4d | 159.2-159.8 | 160.8-161.8 |
| | | 5p3/2 | 24.2-24.6 | 26.9-27.4 |
| La | $La_2O_3$ | 3d5/2 | 835.6-836.2 | 833.3-835.1 |

-continued

| Metal | Oxide | Core Level | Binding Energy in Metal (eV) | Binding Energy in Oxide (eV) |
|---|---|---|---|---|
| Lu | $Lu_2O_3$ | 4f7/2 | 6.5-7.4 | 8-8.8 |
| | | 4d5/2 | 196.1-196.6 | 195-197.7 |
| Nd | $Nd_2O_3$ | 4d | — | 120.5-121.1 |
| | | 3d5/2 | 980.5-981 | 981.7-983.1 |
| Pr | $Pr_6O_{11}$ | 3d5/2 | — | — |
| | $Pr_2O_3$ | | 931.5-932 | 933-933.6 |
| | $PrO_2$ | | 931.5-932 | 935-935.5 |
| | $Pr_2O_5$ | | 931.5-932 | 928.8-933.6 |
| Sc | $Sc_2O_3$ | 2p3/2 | 398.5-399 | 401.5-402.3 |
| Sm | $Sm_2O_3$ | 3d5/2 | 1080.9-1081.5 | 1083.2-1083.7 |
| | | 4d5/2 | — | 134.4-135.4 |
| Tb | $Tb_7O_{12}$ | — | — | — |
| | $Tb_2O_3$ | 4d | 145.5-146.2 | 146.5-147 |
| | | 3d5/2 | 1241.7-1242.3 | 1241.2-1241.7 |
| | $TbO_2$ | 4d | 145.5-146.2 | 149-149.5 |
| | | 3d5/2 | 1241.7-1242.3 | 1241.2-1241.7 |
| | $Tb_3O_7$ | 4d5/2 | 145.4-146.4 | 149.4-150.4 |
| Tm | $Tm_2O_3$ | 4d | 175.2-175.8 | 176-176.6 |
| Y | $Y_2O_3$ | 3d5/2 | 155.5-156 | 156.5-157 |
| Yb | $Yb_2O_3$ | 4d | 182.2-182.8 | 185.2-185.8 |

While the binding energies are provided as ranges in the above table, those having ordinary skill in the relevant art will appreciate that specific reference binding energy values falling within or outside of these ranges may be found in various sources. Non-limiting examples of such sources include but are not limited to: BV Crist. (1999). *Handbook of The Elements and Native Oxides*. XPS International, Inc.; A. V. Naumkin et al., *NIST X-ray Photoelectron Spectroscopy Database*, NIST Standard Reference Database 20, Version 4.1, NIST; and J. F. Moulder et al. (1992). *Handbook of X-ray Photoelectron Spectroscopy*. Perkin-Elmer Corporation.

In some non-limiting examples, the critical surface energy Y1 of the NIC 310 may be less than about ⅓ of the critical surface energy Y1 of the exposed layer surface 11 onto which the deposited layer 330 is disposed, which may for example be an exposed layer surface 11 of the interface coating 820. In some non-limiting examples, the critical surface energy Y1 of the NIC 310 may be less than about: ⅓, ¼, ⅕, ⅙, ⅛, 1/10, 1/15, 1/20, 1/30, or 1/50 of the critical surface energy Y1 of the exposed layer surface 11 onto which the deposited layer 330 is disposed, which may for example be an exposed layer surface 11 of the interface coating 820.

In some non-limiting examples, the contact angle θ of water on an exposed layer surface 11 of the NIC 310 may be at least about: 90°, 100°, 110°, 120°, 130°, 140°, or 150°. In some non-limiting examples, the contact angle θ of water on an exposed layer surface 11 of the NIC 310 may be about: 90-130, or 95-120. Various methods may be used to measure such contact angle θ, including but not limited to the static or dynamic sessile drop method and the pendant drop method.

Various methods and theories for determining the surface energy Y1 of a solid are known. For example, the surface energy Y1 may be calculated or derived based on a series of measurements of the contact angle θ, in which various liquids are brought into contact with a surface of a solid to measure the contact angle θ between the liquid-vapor interface and the surface. In some non-limiting examples, the surface energy Y1 of a solid surface is equal to the surface tension of a liquid with the highest surface tension that completely wets the surface. By way of non-limiting example, a Zisman plot may be used to determine the highest surface tension value that would result in complete wetting (i.e., contact angle θ of 0°) of the surface. According to some theories of surface energy, various types of interactions between solid surfaces and liquids may be considered in determining the surface energy Y1 of the solid. For example, according to some theories, including without limitation, the Owens/Wendt theory, and/or Fowkes' theory, the surface energy Y1 may comprise a dispersive component and a non-dispersive or "polar" component.

In some non-limiting examples, the polar component of the surface energy Y1 of the NIC 310 may be less than about: 5 $mJ/m^2$, 3 $mJ/m^2$, 1 $mJ/m^2$, or substantially zero.

While various examples have been described with respect to NIC 310 containing certain rare earth oxides, it will be appreciated that the NIC 310 may comprise other rare earth compounds instead of, or in conjunction with, such rare earth oxides.

Aspects of some non-limiting examples will now be illustrated and described with reference to the following examples, which are not intended to limit the scope of the present disclosure in any way.

Examples

A series of samples were fabricated by depositing, in vacuo, a 20 nm thick layer of an organic material, followed by a Yb layer of varying thicknesses. Specifically, samples having Yb thicknesses of 3 Å, 5 Å, 1 nm, and 2 nm were fabricated. The samples were then taken out and exposed to air for approximately 10 minutes, such that the surface of the Yb layer oxidized to form an NIC 310. The oxidized Yb surface of each sample was then subjected to open mask 600 deposition of Mg. Each sample was subjected to an Mg vapor flux having an average evaporation rate of about 0.9 Å/s. In conducting the deposition of the Mg coating, a deposition time of about 167 seconds was used in order to obtain a reference layer thickness of Mg of about 15 nm.

Once the samples were fabricated, optical transmission measurements were taken to determine the relative amount of Mg deposited on the surface of the NIC 310. As will be appreciated, relatively thin Mg coatings having, by way of non-limiting example, thickness of less than a few nm are substantially transparent. However, light transmission decreases as the thickness of the Mg coating is increased. Accordingly, the relative performance of various NIC 310 materials may be assessed by measuring the light transmission through the samples, which directly correlates to the amount, and/or thickness of Mg coating deposited thereon from the Mg deposition process. Upon accounting for any loss, and/or absorption of light caused by the presence of the glass substrate, it was found that all samples prepared according to the above exhibited relatively high transmission of greater than about 90%, across the visible spectrum. High optical transmission may be directly attributed to a relatively small amount of Mg coating, if any, being present on the exposed layer surface 11 of the NIC 310 to absorb the light being transmitted through the sample. Accordingly, such NIC 310 materials generally exhibit relatively low affinity, and/or initial sticking probability $S_0$ to Mg and thus may be particularly useful for achieving selective deposition and patterning of coatings containing Mg in certain applications.

In some non-limiting examples, the NIC 310 may be doped, covered, and/or supplemented with another material that may act as a seed or heterogeneity, to act as a nucleation site for the deposited material 531. In some non-limiting examples, such other material may comprise an NPC material. In some non-limiting examples, such other material may comprise an organic material, such as by way of non-limiting example, a polycyclic aromatic compound, and/or a material containing a non-metallic element such as, without limitation, oxygen (O), sulfur (S), nitrogen (N), or carbon (C), whose presence might otherwise be considered to be a contaminant in the source material, equipment used for deposition, and/or the vacuum chamber environment. In some non-limiting examples, such other material may be deposited in a layer thickness that is a fraction of a monolayer, to avoid forming a continuous coating 340 thereof. Rather, the monomers of such other material will tend to be spaced apart in the lateral aspect so as form discrete nucleation sites for the deposited material.

Figure 9A:
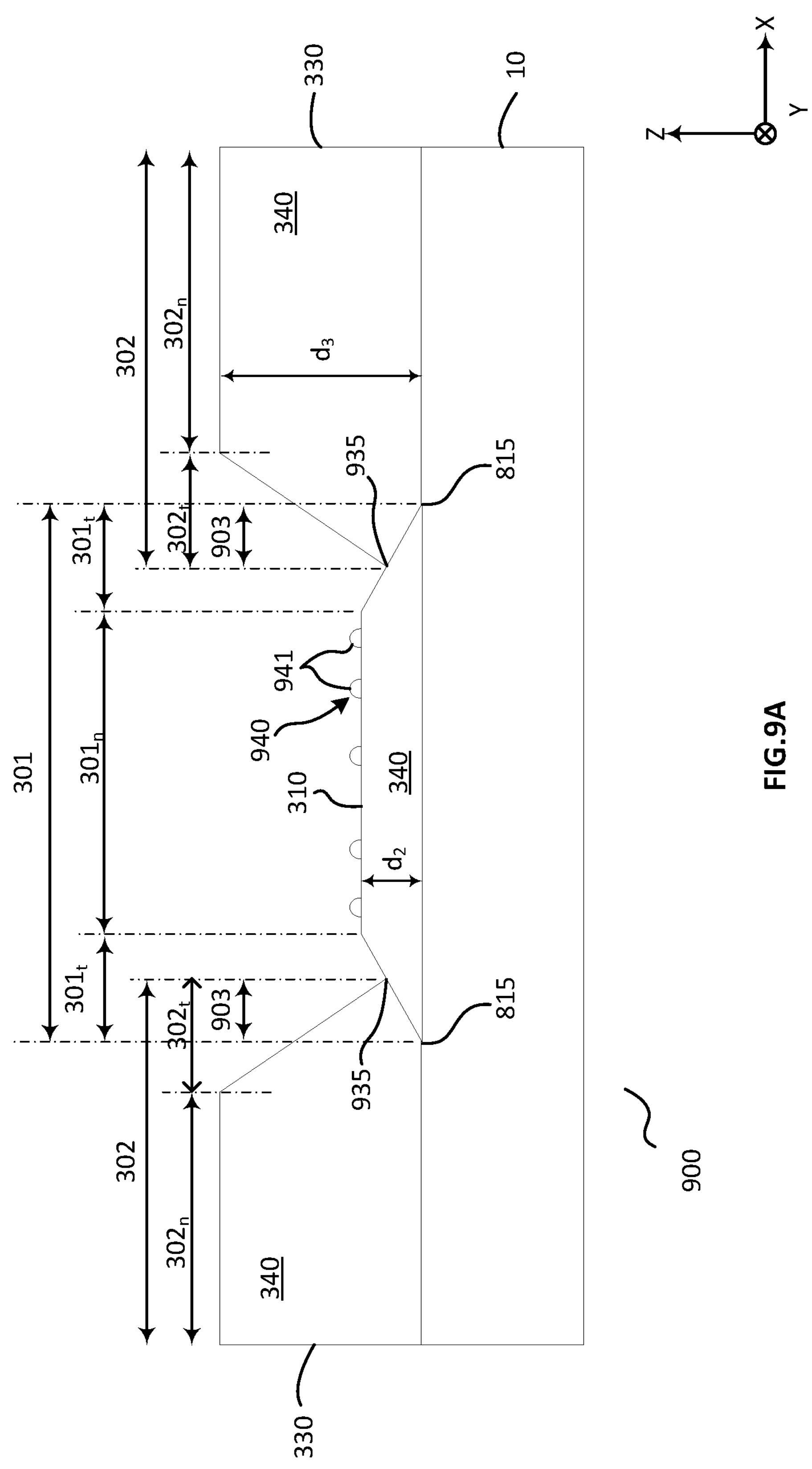
FIG. 9A is a schematic diagram illustrating an example version of the device of FIG. 3A in a cross-sectional view.
Figure 9B:
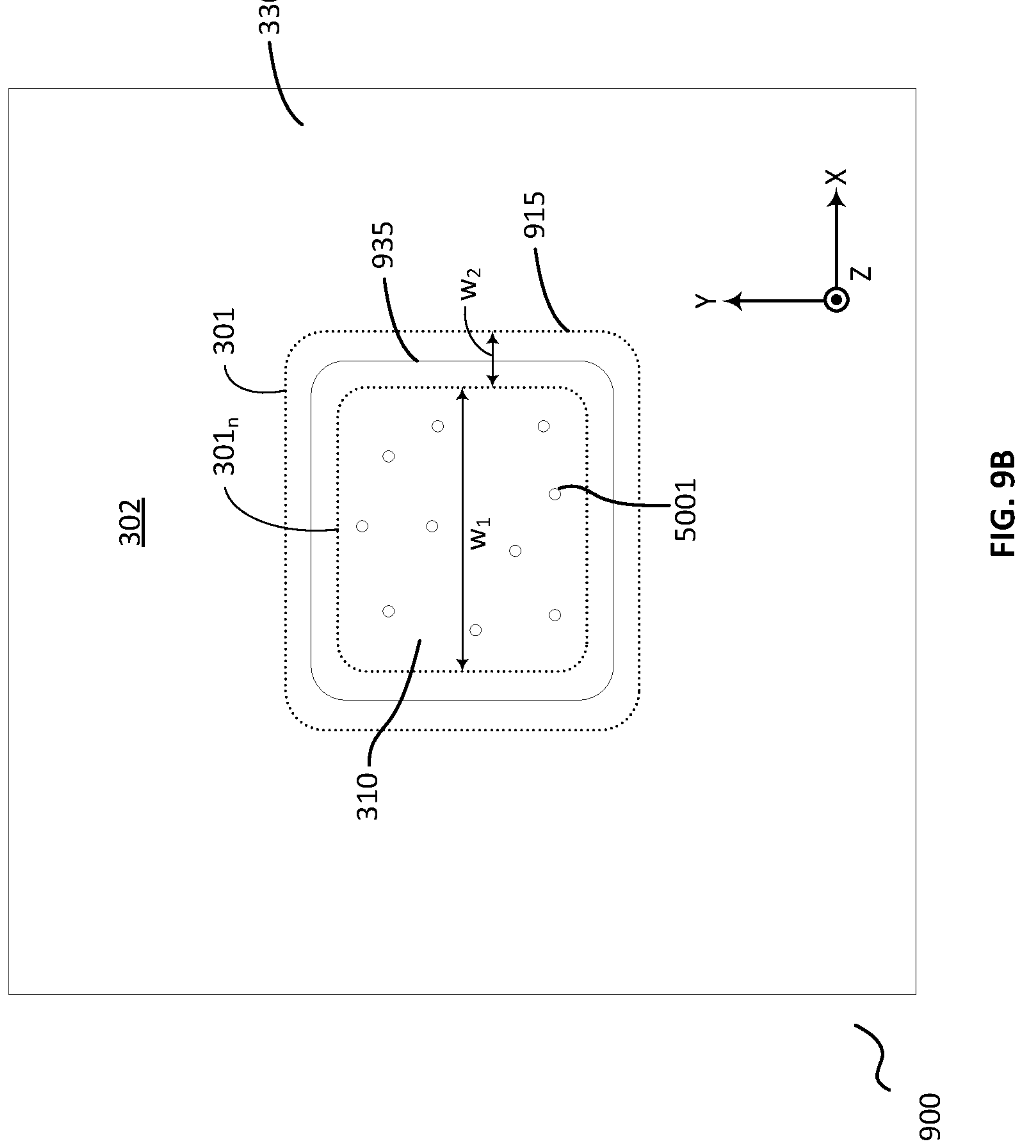
FIG. 9B is a schematic diagram illustrating the device of FIG. 9A in a complementary plan view.

Turning to FIG. 9A, there is shown a version 900 of the device 300 of FIG. 3A that shows in exaggerated form, the interface between the NIC 310 in the first portion 301 and the deposited layer 330 in the second portion 302. FIG. 9B shows the device 900 in plan.

As may be better seen in FIG. 9B, in some non-limiting examples, the NIC 310 in the first portion 301 may be surrounded on all sides by the deposited layer 330 in the second portion 302, such that the first portion 301 may have a boundary that is defined by the further extent or edge 915 of the NIC 310 in the lateral aspect along each lateral axis. In some non-limiting examples, the NIC edge 915 in the lateral aspect may be defined by a perimeter of the first portion 301 in such aspect.

In some non-limiting examples, the first portion 301 may comprise at least one NIC transition region $\mathbf{301}_t$, in the lateral aspect, in which a thickness of the NIC 310 may transition from a maximum thickness to a reduced thickness. The extent of the first portion 301 that does not exhibit such a transition is identified as a non-transition part $\mathbf{301}_n$ of the first portion 301. In some non-limiting examples, the NIC 310 may form a substantially closed coating 340 in the NIC non-transition part $\mathbf{301}_n$ of the first portion 301.

In some non-limiting examples, the NIC transition region $\mathbf{301}_t$ may extend, in the lateral aspect, between the NIC non-transition part $\mathbf{301}_n$ of the first portion 301 and the NIC edge 915.

In some non-limiting examples, in plan, the NIC transition region $\mathbf{301}_t$ may surround, and/or extend along a perimeter of, the non-transition part $\mathbf{301}_n$ of the first portion 301.

In some non-limiting examples, along at least one lateral axis, the NIC non-transition part $\mathbf{301}_n$ may occupy the entirety of the first portion 301, such that there is no NIC transition region $\mathbf{301}_t$ between it and a second portion 302.

As illustrated in FIG. 3, in some non-limiting examples, the NIC 310 may have an average film thickness $d_2$ in the NIC non-transition part $\mathbf{301}_n$ of the first portion 301 that may be in a range of between about: 1-100 nm, 2-50 nm, 3-30 nm, 4-20 nm, 5-15 nm, 5-10 nm, or 1-10 nm. In some non-limiting examples, the average film thickness $d_2$ of the NIC 310 in the NIC non-transition part $\mathbf{301}_n$ of the first portion 301 may be substantially the same, or constant, thereacross. In some non-limiting examples, a thickness of the NIC 310 may remain, within the NIC non-transition part $\mathbf{301}_n$, within about: 95%, or 90% of the average film thickness $d_2$ of the NIC 310.

In some non-limiting examples, the average film thickness $d_2$ may be less than about: 80 nm, 60 nm, 50 nm, 40 nm, 30 nm, 20 nm, 15 nm, or 10 nm. In some non-limiting examples, the average film thickness $d_2$ of the NIC 310 may exceed about: 3 nm, 5 nm, or 8 nm.

In some non-limiting examples, the average film thickness $d_2$ of the NIC 310 in the NIC non-transition part $\mathbf{301}_n$ of the first portion 301 may be less than about 10 nm. Without wishing to be bound by any particular theory, it has been found, somewhat surprisingly, that an average film thickness $d_2$ of the NIC 310 that is greater than zero and no more than about 10 nm may, at least in some non-limiting examples, provide certain advantages for achieving, by way of non-limiting example, enhanced patterning contrast of the deposited layer 330, relative to an NIC 310 having an average film thickness $d_2$ in the NIC non-transition part $\mathbf{301}_n$ of the first portion 301 in excess of 10 nm.

In some non-limiting examples, the NIC 310 may have an NIC thickness that decreases from a maximum to a minimum within the NIC transition region $\mathbf{301}_t$. In some non-limiting examples, the maximum may be at, and/or proximate to the boundary between the NIC transition region $\mathbf{301}_t$ and the NIC non-transition part $\mathbf{301}_n$ of the first portion 301. In some non-limiting examples, the minimum may be at, and/or proximate to the NIC edge 915. In some non-limiting examples, the maximum may be the average film thickness $d_2$ in the NIC non-transition part $\mathbf{301}_n$ of the first portion 301. In some non-limiting examples, the maximum may be no more than about: 95% or 90% of the average film thickness $d_2$ in the NIC non-transition part $\mathbf{301}_n$ of the first portion 301. In some non-limiting examples, the minimum may be in a range of between about 0-0.1 nm.

In some non-limiting examples, a profile of the NIC thickness in the NIC transition region $\mathbf{301}_t$ may be sloped, and/or follow a gradient. In some non-limiting examples, such profile may be tapered. In some non-limiting examples, the taper may follow a linear, non-linear, parabolic, and/or exponential decaying profile.

In some non-limiting examples, the NIC 310 may completely cover the underlying surface in the NIC transition region $\mathbf{301}_t$. In some non-limiting examples, at least a part of the underlying surface may be left uncovered by the NIC 310 in the NIC transition region $\mathbf{301}_t$. In some non-limiting examples, the NIC 310 may comprise a substantially closed coating 340 in at least a part of the NIC transition region $\mathbf{301}_t$. In some non-limiting examples, the NIC 310 may comprise a discontinuous layer 940 (FIG. 9A) in at least a part of the NIC transition region $\mathbf{301}_t$.

In some non-limiting examples, at least a part of the NIC 310 in the first portion 301 may be substantially devoid of a closed coating 340 of the deposited layer 330. In some non-limiting examples, at least a part of the exposed layer surface 11 of the first portion 301 may be substantially devoid of the deposited layer 330 or of the deposited material 531.

In some non-limiting examples, along at least one lateral axis, including without limitation, the X-axis, the NIC non-transition region $\mathbf{301}_n$ may have a width of $w_1$, and the NIC transition part $\mathbf{301}_t$ may have a width of $w_2$. In some non-limiting examples, the NIC non-transition region $\mathbf{301}_n$ may have a cross-sectional area 301 that, in some non-limiting examples, may be approximated by multiplying the average film thickness $d_2$ by the width $w_1$. In some non-limiting examples, the NIC transition part $\mathbf{301}_t$ may have a cross-sectional area $a_2$ that, in some non-limiting examples, may be approximated by multiplying an average film thickness across the NIC transition part $\mathbf{301}_t$ by the width $w_1$.

In some non-limiting examples, $w_1$ may exceed $w_2$. In some non-limiting examples, a quotient of $w_1/w_2$ may be at least about: 5, 10, 20, 50, 100, 500, 1,000, 1,500, 5,000, 10,000, 50,000, or 100,000.

In some non-limiting examples, at least one of w1 and w2 may exceed the average film thickness $d_1$ of the underlying surface.

In some non-limiting examples, at least one of $w_1$ and $w_2$ may exceed $d_2$. In some non-limiting examples, both $w_1$ and $w_2$ may exceed $d_2$. In some non-limiting examples, $w_1$ and $w_2$ both may exceed $d_1$, and $d_1$ may exceed $d_2$.

Those having ordinary skill in the relevant art will appreciate that, while not explicitly illustrated, the NIC material 511 may also be present to some extent at an interface between the deposited layer 330 and an underlying surface (including without limitation, a surface of an NPC 520 layer (not shown), and/or the substrate 10). Such material may be deposited as a result of a shadowing effect, in which a deposited pattern is not identical to a pattern of a mask 600 and may, in some non-limiting examples, result in some evaporated NIC material 512 being deposited on a masked part of a target surface 11. By way of non-limiting examples, such material may form as particle structures 941, and/or as a thin film having a thickness that may be substantially less than an average thickness of the NIC 310.

In some non-limiting examples, the NIC 310 may act as an optical coating. In some non-limiting examples, the NIC 310 may modify at least one property, and/or characteristic of the light emitted from at least one emissive region 2210 of the device 300. In some non-limiting examples, the NIC 310 may exhibit a degree of haze, causing emitted light to be scattered. In some non-limiting examples, the NIC 310 may comprise a crystalline material for causing light transmitted therethrough to be scattered. Such scattering of light may facilitate enhancement of the outcoupling of light from the device in some non-limiting examples. In some non-limiting examples, the NIC 310 may initially be deposited as a substantially non-crystalline, including without limitation, substantially amorphous, coating, whereupon, after deposition thereof, the NIC 310 may become crystallized and thereafter serve as an optical coupling.

Deposited Layer

The deposited layer 330 is disposed on an exposed layer surface 11 of the underlying surface in the second portion 302 of the lateral aspect of the device 300 as defined by a lateral axis, including without limitation, the X-axis. As may be better seen in FIG. 9B, in some non-limiting examples, the NIC 310 in the first portion 301 may be surrounded on all sides by the deposited layer 330 in the second portion 302 such that the second portion 302 has a boundary that is defined by the further extent or edge 935 of the deposited layer 330 in the lateral aspect along each lateral axis. In some non-limiting examples, the deposited layer edge 935 in the lateral aspect may be defined by a perimeter of the second portion 302 in such aspect.

In some non-limiting examples, the second portion 302 may comprise at least one deposited layer transition region $\mathbf{302}_t$, in the lateral aspect, in which a thickness of the deposited layer 330 may transition from a maximum thickness to a reduced thickness. The extent of the second portion 302 that does not exhibit such a transition is identified as a non-transition part $\mathbf{302}_n$ of the second portion 302. In some non-limiting examples, the deposited layer 330 may form a substantially closed coating 340 in the non-transition part $\mathbf{302}_n$ of the second portion 302.

In some non-limiting examples, in plan, the deposited layer transition region $\mathbf{302}_t$ may extend, in the lateral aspect, between the non-transition part $\mathbf{302}_n$ of the second portion 302 and the deposited layer edge 935.

In some non-limiting examples, in plan, the deposited layer transition region $\mathbf{302}_t$ may surround, and/or extend along a perimeter of, the non-transition part $\mathbf{302}_n$ of the second portion 302.

In some non-limiting examples, along at least one lateral axis, the non-transition part $\mathbf{302}_n$ may occupy the entirety of the second portion 302, such that there is no deposited layer transition region $\mathbf{302}_t$ between it and the first portion 301.

As illustrated in FIG. 9A, in some non-limiting examples, the deposited layer 330 may have an average film thickness $d_3$ in the non-transition part $\mathbf{302}_n$ of the second portion 302 that may be in a range of between about: 1-500 nm, 5-200 nm, 5-40 nm, 10-30 nm, or 10-100 nm. In some non-limiting examples, $d_3$ may exceed about: 10 nm, 50 nm, or 100 nm. In some non-limiting examples, the average film thickness $d_3$ of the deposited layer 330 in the non-transition part $\mathbf{302}_t$ of the second portion 302 may be substantially the same, or constant, thereacross.

In some non-limiting examples, $d_3$ may exceed the average film thickness $d_1$ of the underlying surface.

In some non-limiting examples, a quotient $d_3/d_1$ may be at least about: 1.5, 2, 5, 10, 20, 50, or 100. In some non-limiting examples, the quotient $d_3/d_1$ may be in a range of between about: 0.1-10, or 0.2-40.

In some non-limiting examples, $d_3$ may exceed an average film thickness $d_2$ of the NIC 310.

In some non-limiting examples, a quotient $d_3/d_2$ may be at least about: 1.5, 2, 5, 10, 20, 50, or 100. In some non-limiting examples, the quotient $d_3/d_2$ may be in a range of between about: 0.2-10, or 0.5-40.

In some non-limiting examples, $d_3$ may exceed $d_2$ and $d_2$ may exceed $d_1$. In some other non-limiting examples, $d_3$ may exceed $d_1$ and $d_1$ may exceed $d_2$.

In some non-limiting examples, a quotient $d_2/d_1$ may be between about: 0.2-3, or 0.1-5.

In some non-limiting examples, along at least one lateral axis, including without limitation, the X-axis, the non-transition region $\mathbf{302}_n$ has a width of $w_3$. In some non-limiting examples, the non-transition region $\mathbf{302}_n$ may have a cross-sectional area $a_3$ that, in some non-limiting examples, may be approximated by multiplying the average film thickness $d_3$ by the width $w_3$.

In some non-limiting examples, $w_3$ may exceed the width $w_1$ of the NIC non-transition region $\mathbf{301}_n$. In some non-limiting examples, $w_1$ may exceed $w_3$.

In some non-limiting examples, a quotient $w_1/w_3$ may be in a range of between about: 0.1-10, 0.2-5, 0.3-3, or 0.4-2. In some non-limiting examples, a quotient $w_3/w_1$ may be at least: 1, 2, 3, or 4.

In some non-limiting examples, $w_3$ may exceed the average film thickness $d_3$ of the deposited layer 330.

In some non-limiting examples, a quotient $w_3/d_3$ may be at least about: 10, 50, 100, or 500. In some non-limiting examples, the quotient $w_3/d_3$ may be less than about 100,000.

In some non-limiting examples, the deposited layer 330 may have a thickness that decreases from a maximum to a minimum within the deposited layer transition region $\mathbf{302}_t$. In some non-limiting examples, the maximum may be at, and/or proximate to the boundary between the deposited layer transition region $\mathbf{302}_t$ and the non-transition part $\mathbf{302}_n$ of the second portion 302. In some non-limiting examples, the minimum may be at, and/or proximate to the deposited layer edge 935. In some non-limiting examples, the maximum may be the average film thickness $d_3$ in the non-transition part $\mathbf{302}_n$ of the second portion 302. In some non-limiting examples, the minimum may be in a range of between about 0-0.1 nm. In some non-limiting examples, the minimum may be the average film thickness $d_3$ in the non-transition part $\mathbf{302}_n$ of the second portion 302.

In some non-limiting examples, a profile of the thickness in the deposited layer transition region 302$_t$ may be sloped, and/or follow a gradient. In some non-limiting examples, such profile may be tapered. In some non-limiting examples, the taper may follow a linear, non-linear, parabolic, and/or exponential decaying profile.

Figure 9C:
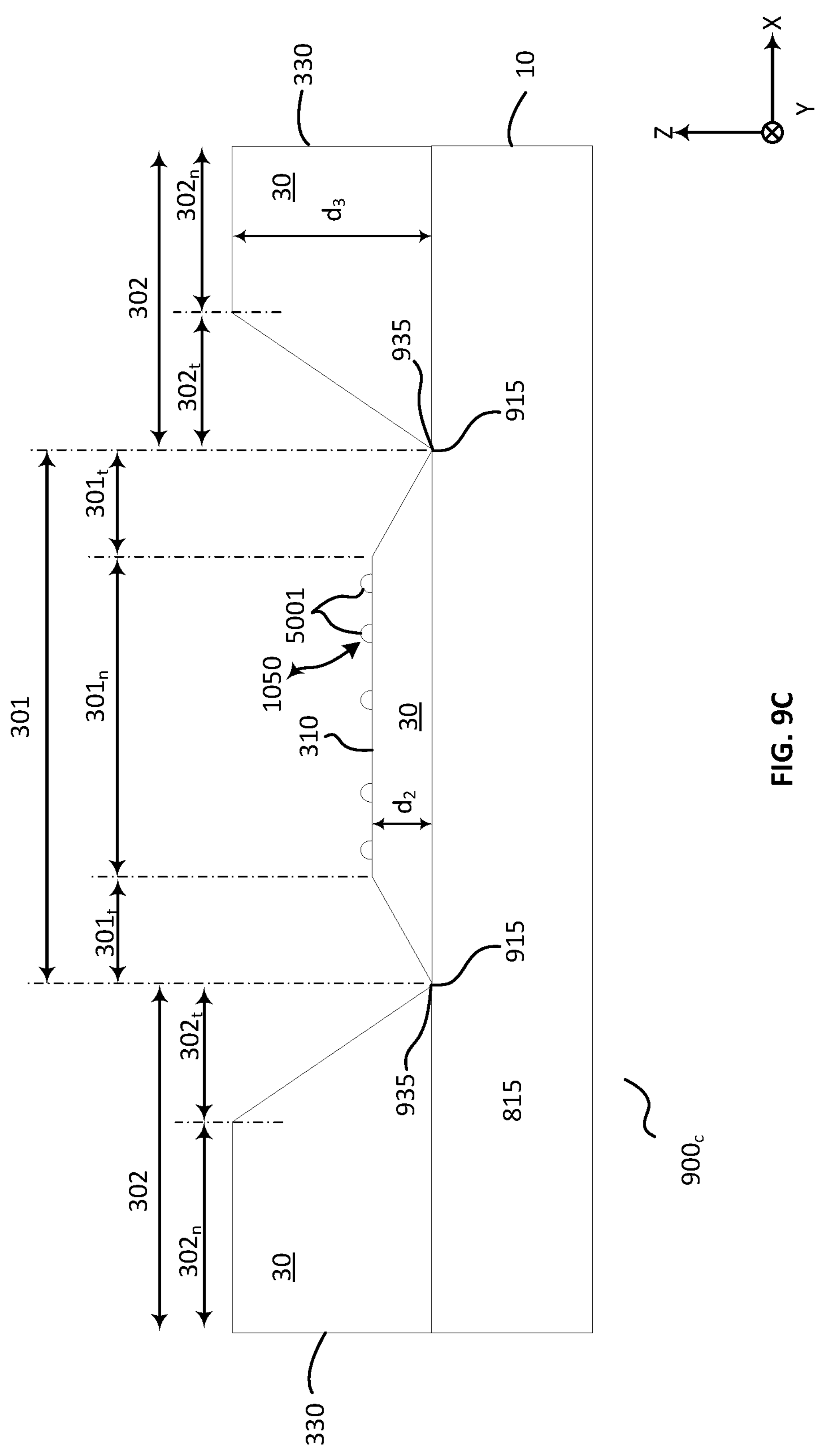
FIGS. 9C, 9D and 9E are schematic diagrams illustrating example versions of the device of FIG. 9A.

In some non-limiting examples, as shown by way of non-limiting example in the example version 900$_c$ in FIG. 9C of the device 300, the deposited layer 330 may completely cover the underlying surface in the deposited layer transition region 302$_t$. In some non-limiting examples, at least a part of the underlying surface may be uncovered by the deposited layer 330 in the deposited layer transition region 302$_t$. In some non-limiting examples, the deposited layer 330 may comprise a substantially closed coating 340 in at least a part of the deposited layer transition region 302$_t$. In some non-limiting examples, the deposited layer 330 may comprise a discontinuous layer 940 in at least a part of the deposited layer transition region 302$_t$.

In some non-limiting examples, the deposited layer edge 935 may be spaced apart, in the lateral aspect from the non-transition part 301$_n$ of the first portion 301, such that there is no overlap between the first portion 301 and the second portion 302 in the lateral aspect.

In some non-limiting examples, at least a part of the first portion 301 and at least a part of the second portion 302 may overlap in the lateral aspect. Such overlap is identified by an overlap portion 903, such as is shown by way of non-limiting example in FIG. 9A, in which at least a part of the second portion 302 overlaps at least a part of the first portion 301.

Figure 9D:
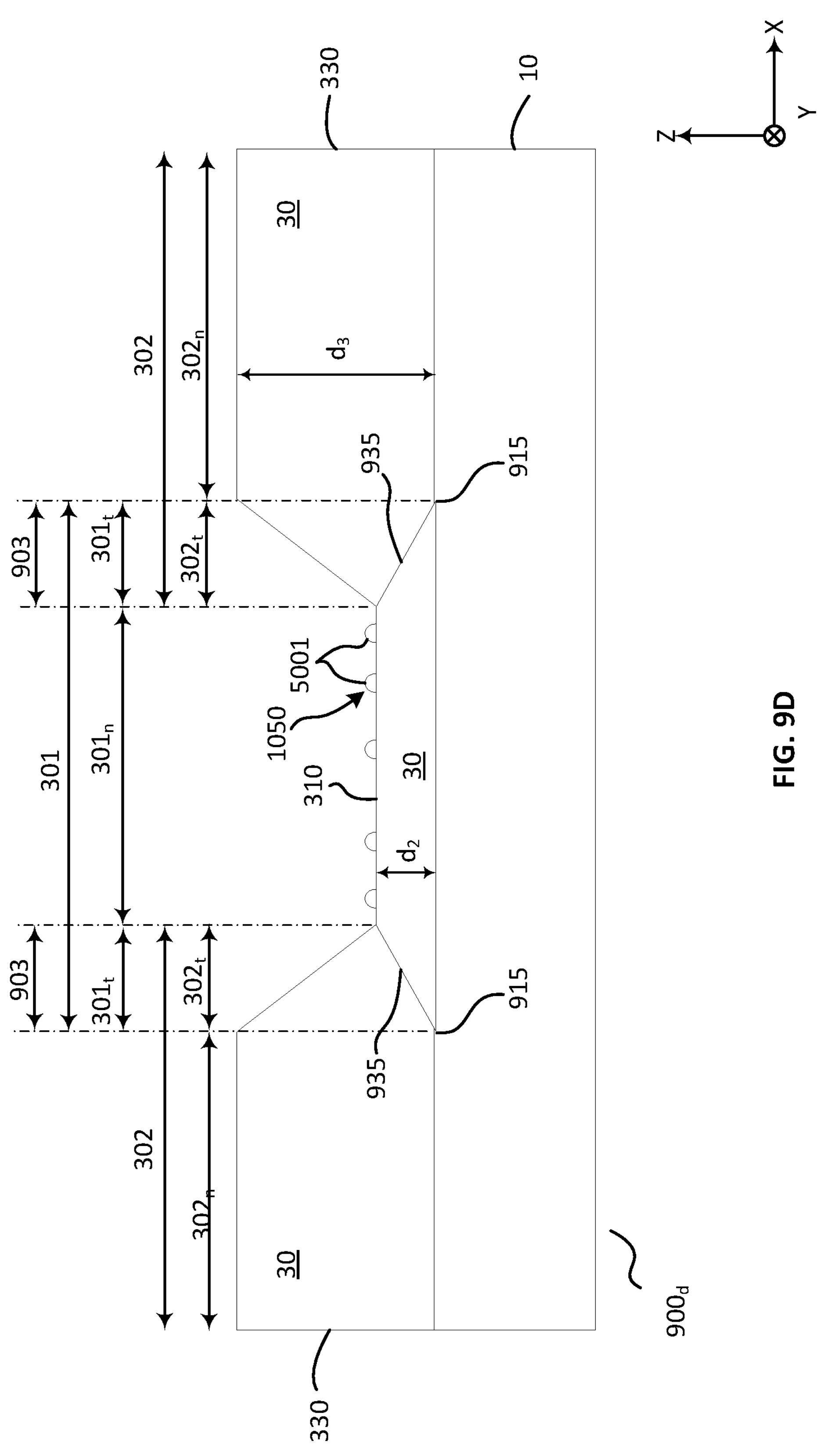

In some non-limiting examples, as shown by way of non-limiting example in FIG. 9D, at least a part of the deposited layer transition region 302$_t$ may be disposed over at least a part of the NIC transition region 301$_t$. In some non-limiting examples, at least a part of the NIC transition region 301$_t$ may be substantially devoid of the deposited layer 330, and/or the deposited material 531. In some non-limiting examples, the deposited material 531 may form a discontinuous layer 940 on an exposed layer surface 11 of at least a part of the NIC transition region 301$_t$.

Figure 9E:
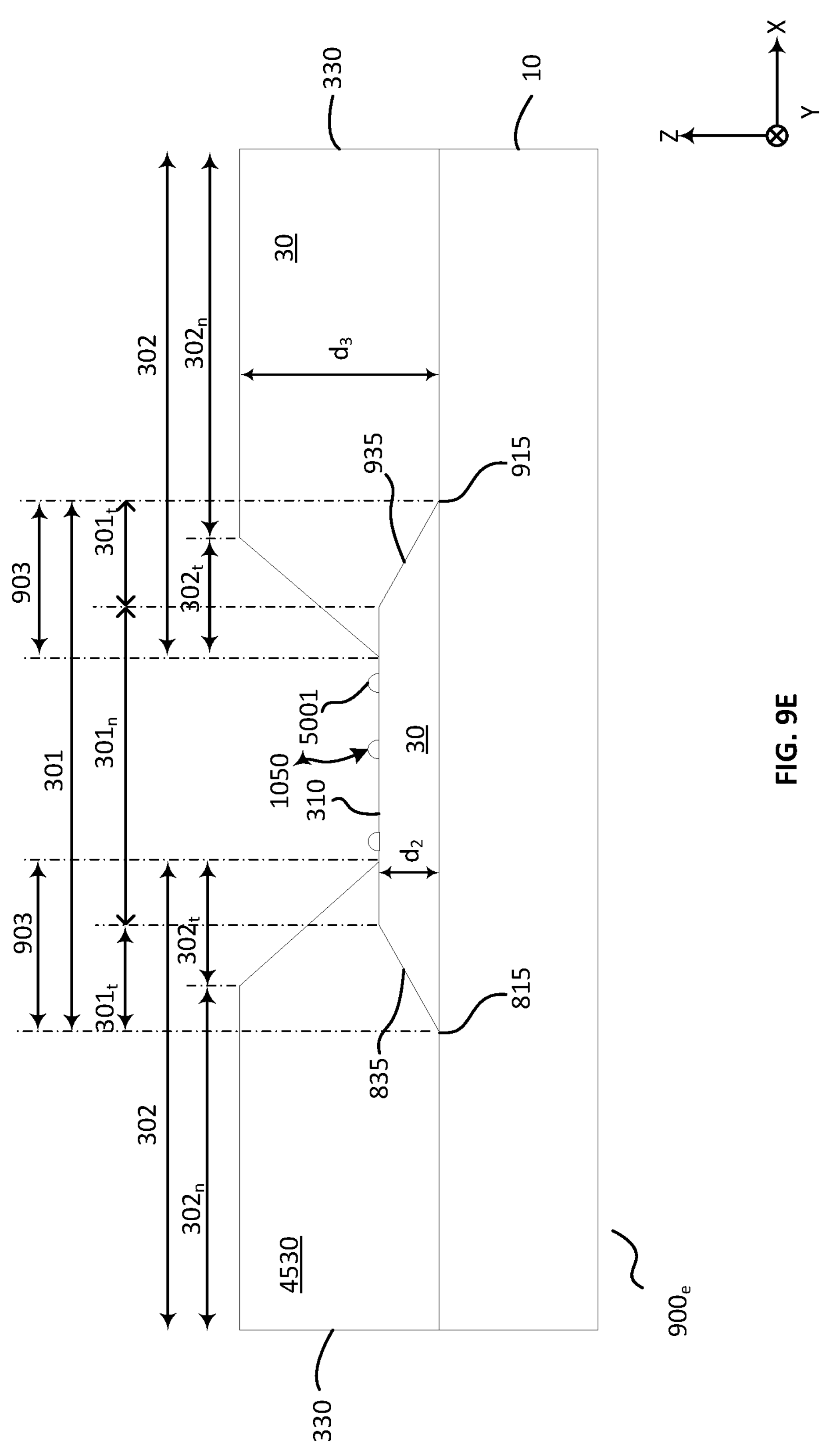

In some non-limiting examples, as shown by way of non-limiting example in FIG. 9E, at least a part of the deposited layer transition region 302$_t$ may be disposed over at least a part of the NIC non-transition part 301$_n$ of the first portion 301.

Although not shown, those having ordinary skill in the relevant art will appreciate that the overlap portion 903 may reflect a scenario in which at least a part of the first portion 301 overlaps at least a part of the second portion 302.

Thus, in some non-limiting examples, at least a part of the NIC transition region 301$_t$ may be disposed over at least a part of the deposited layer transition region 302$_t$. In some non-limiting examples, at least a part of the deposited layer transition region 302$_t$ may be substantially devoid of the NIC 310, and/or the NIC material 511. In some non-limiting examples, the NIC material 511 may form a discontinuous layer 940 on an exposed layer surface of at least a part of the deposited layer transition region 302$_t$.

In some non-limiting examples, at least a part of the NIC transition region 301$_t$ may be disposed over at least a part of the non-transition part 302$_n$ of the second portion 302.

In some non-limiting examples, the NIC edge 915 may be spaced apart, in the lateral aspect, from the non-transition part 302$_n$ of the second portion 302.

In some non-limiting examples, a sheet resistance $R_2$ of the deposited layer 330 may generally correspond to a sheet resistance of the deposited layer 330, measured or determined in isolation from other components, layers, and/or parts of the device 300. In some non-limiting examples, the deposited layer 330 may be formed as a thin film. Accordingly, in some non-limiting examples, the characteristic sheet resistance for the deposited layer 330 may be determined, and/or calculated based on the composition, thickness, and/or morphology of such thin film. In some non-limiting examples, the sheet resistance $R_2$ may be no more than about: 10Ω/□, 5Ω/□, 1Ω/□, 0.5Ω/□, 0.2Ω/□, or 0.1Ω/□.

In some non-limiting examples, the deposited layer 330 may comprise a deposited material 531.

In some non-limiting examples, the deposited material 531 may comprise a metal having a bond dissociation energy, of no more than about: 300 kJ/mol, 200 kJ/mol, 165 kJ/mol, 150 kJ/mol, 100 kJ/mol, 50 kJ/mol, or 20 kJ/mol.

In some non-limiting examples, the deposited material 531 may comprise a metal having an electronegativity that is no more than about: 1.4, 1.3, or 1.2.

In some non-limiting examples, the deposited material 531 may comprise an element selected from: potassium (K), sodium (Na), lithium (Li), barium (Ba), cesium (Cs), Yb, Ag, gold (Au), copper (Cu), aluminum (Al), Mg, zinc (Zn), cadmium (Cd), tin (Sn), or yttrium (Y). In some non-limiting examples, the element may comprise K, Na, Li, Ba, Cs, Yb, Ag, Au, Cu, Al, and/or Mg. In some non-limiting examples, the element may comprise Cu, Ag, and/or Au. In some non-limiting examples, the element may be Cu. In some non-limiting examples, the element may be Al. In some non-limiting examples, the element may comprise Mg, Zn, Cd, or Yb. In some non-limiting examples, the element may comprise Mg, Ag, Al, Yb, or Li. In some non-limiting examples, the element may comprise Mg, Ag, or Yb. In some non-limiting examples, the element may comprise Mg, or Ag. In some non-limiting examples, the element may be Ag.

In some non-limiting examples, the deposited material 531 may comprise a pure metal. In some non-limiting examples, the deposited material 531 may be a pure metal. In some non-limiting examples, the deposited material 531 may be pure Ag or substantially pure Ag. In some non-limiting examples, the substantially pure Ag may have a purity of at least about: 95%, 99%, 99.9%, 99.99%, 99.999%, or 99.9995%. In some non-limiting examples, the deposited material 531 may be pure Mg or substantially pure Mg. In some non-limiting examples, the substantially pure Mg may have a purity of at least about: 95%, 99%, 99.9%, 99.99%, 99.999%, or 99.9995%.

In some non-limiting examples, the deposited material 531 may comprise an alloy. In some non-limiting examples, the alloy may be an Ag-containing alloy, an Mg-containing alloy, or an AgMg-containing alloy. In some non-limiting examples, the AgMg-containing alloy may have an alloy composition that may range from 1:10 (Ag:Mg) to about 10:1 by volume.

In some non-limiting examples, the deposited material 531 may comprise other metals in place of, and/or in combination with, Ag. In some non-limiting examples, the deposited material 531 may comprise an alloy of Ag with at least one other metal. In some non-limiting examples, the deposited material 531 may comprise an alloy of Ag with Mg, and/or Yb. In some non-limiting examples, such alloy may be a binary alloy having a composition between about 5-95 vol. % Ag, with the remainder being the other metal. In some non-limiting examples, the deposited material 531 may comprise Ag and Mg. In some non-limiting examples, the deposited material 531 may comprise an Ag:Mg alloy having a composition between about 1:10-10:1 by volume. In some non-limiting examples, the deposited material 531 may comprise Ag and Yb. In some non-limiting examples, the deposited material 531 may comprise a Yb:Ag alloy having a composition between about 1:20-10:1 by volume. In some non-limiting examples, the deposited material 531 may comprise Mg and Yb. In some non-limiting examples, the deposited material 531 may comprise an Mg:Yb alloy. In some non-limiting examples, the deposited material 531 may comprise Ag, Mg, and Yb. In some non-limiting examples, the deposited layer 330 may comprise an Ag:Mg:Yb alloy.

In some non-limiting examples, the deposited layer 330 may comprise at least one additional element. In some non-limiting examples, such additional element may be a non-metallic element. In some non-limiting examples, the non-metallic material may be O, S, N, or C. It will be appreciated by those having ordinary skill in the relevant art that, in some non-limiting examples, such additional element(s) may be incorporated into the deposited layer 330 as a contaminant, due to the presence of such additional element(s) in the source material, equipment used for deposition, and/or the vacuum chamber environment. In some non-limiting examples, the concentration of such additional element(s) may be limited to be below a threshold concentration. In some non-limiting examples, such additional element(s) may form a compound together with other element(s) of the deposited layer 330. In some non-limiting examples, a concentration of the non-metallic element in the deposited material 531 may be less than about: 1%, 0.1%, 0.01%, 0.001%, 0.0001%, 0.00001%, 0.000001%, or 0.0000001%. In some non-limiting examples, the deposited layer 330 has a composition in which a combined amount of 0 and C therein is less than about: 10%, 5%, 1%, 0.1%, 0.01%, 0.001%, 0.0001%, 0.00001%, 0.000001%, or 0.0000001%.

It has now been found, somewhat surprisingly, that reducing a concentration of certain non-metallic elements in the deposited layer 330, particularly in cases wherein the deposited layer 330 is substantially comprised of metal(s), and/or metal alloy(s), may facilitate selective deposition of the deposited layer 330. Without wishing to be bound by any particular theory, it may be postulated that certain non-metallic elements, such as, by way of non-limiting examples, O, or C, when present in the vapour flux of the deposited layer 330, and/or in the deposition chamber, and/or environment, may be deposited onto the surface of the NIC 310 to act as nucleation sites for the metallic element(s) of the deposited layer 330. It may be postulated that reducing a concentration of such non-metallic elements that could act as nucleation sites may facilitate reducing an amount of deposited material 531 deposited on the exposed layer surface 11 of the NIC 310.

In some non-limiting examples, the deposited material 531 in the first portion 301 and the underlying layer thereunder may comprise a common metal.

In some non-limiting examples, the deposited layer 330 may comprise a plurality of layers of the deposited material 531. In some non-limiting examples, the deposited material 531 of a first one of the plurality of layers may be different from the deposited material 531 of a second one of the plurality of layers. In some non-limiting examples, the deposited layer 330 may comprise a multilayer coating. In some non-limiting examples, such multilayer coating may be Yb/Ag, Yb/Mg, Yb/Mg:Ag, Yb/Yb:Ag, Yb/Ag/Mg, or Yb/Mg/Ag.

In some non-limiting examples, the deposited layer 330 may be disposed in a pattern that may be defined by at least one region therein that is substantially devoid of a closed coating 340 of the deposited layer 330. In some non-limiting examples, the at least one region may separate the deposited layer 330 into a plurality of discrete fragments thereof. In some non-limiting examples, each discrete fragment of the deposited layer 330 may be considered to be a distinct second portion 302. In some non-limiting examples, the plurality of discrete fragments of the deposited layer 330 may be physically spaced apart from one another in the lateral aspect thereof. In some non-limiting examples, at least two of such plurality of discrete fragments of the deposited layer 330 may be electrically coupled. In some non-limiting examples, at least two of such plurality of discrete fragments of the deposited layer 330 may be each electrically coupled to a common conductive layer or coating, including without limitation, the underlying surface, to allow the flow of electrical current between them. In some non-limiting examples, at least two of such plurality of discrete fragments of the deposited layer 330 may be electrically insulated from one another.

In some non-limiting examples, the deposited layer 330 may be formed as a single monolithic coating across both the non-transition part $\mathbf{302}_n$ and the deposited layer transition region $\mathbf{302}_t$ of the second portion 302.

Particle

In some non-limiting examples, such as is shown in FIG. 9A, there may be at least one particle, including without limitation, a nanoparticle (NP), an island, a plate, a disconnected cluster, and/or a network (collectively particle structure 941) disposed on the NIC 310 in the first portion 301. In some non-limiting examples, the at least one particle structure 941 is disposed on an exposed layer surface 11 of the NIC 310. In some non-limiting examples, there may be a plurality of such particle structures 941. In some non-limiting examples, such plurality of particle structures 941 may form a discontinuous layer 940.

Without wishing to be limited to any particular theory, it may be postulated that, while the formation of a closed coating 340 of the deposited material 531 may be substantially inhibited on the NIC 310, in some non-limiting examples, when the NIC 310 is exposed to deposition of the deposited material 531 thereon, some vapor monomers of the deposited material 531 may ultimately form at least one particle structure 941 of the deposited material 531 thereon.

In some non-limiting examples, at least some of the particle structures 941 may be disconnected from one another. In other words, in some non-limiting examples, the discontinuous layer 940 may comprise features, including particle structures 941, that are physically separated from one another, such that the particle structures 941 do not form a closed coating 340. Accordingly, such discontinuous layer 940 may, in some non-limiting examples, thus comprise a thin disperse layer of deposited material 531 formed as particle structures 941, inserted at, and substantially across the lateral extent of, an interface between the NIC 310 and at least one covering layer in the device 300.

In some non-limiting examples, at least one of the particle structures 941 of deposited material 531 may be in physical contact with an exposed layer surface 11 of the NIC 310. In some non-limiting examples, substantially all of the particle structures 941 of deposited material 531 may be in physical contact with the exposed layer surface 11 of the NIC 310.

Without wishing to be bound by any particular theory, it has been found, somewhat surprisingly, that the presence of such a thin, disperse discontinuous layer 540 of deposited material 531, including without limitation, at least one particle structure 941, including without limitation, metal particle structures 941, on an exposed layer surface 11 of the NIC 310, may exhibit one or more varied characteristics and concomitantly, varied behaviours, including without limitation, optical effects and properties of the device 300, as discussed herein. In some non-limiting examples, such effects and properties may be controlled to some extent by judicious selection of the characteristic size $S_1$, size distribution, shape, surface coverage $C_1$, configuration, deposited density, and/or dispersity D of the particle structures 941 on the NIC 310.

In some non-limiting examples, the formation of at least one of the characteristic size $S_1$, size distribution, shape, surface coverage $C_1$, configuration, deposited density, and/or dispersity D of such discontinuous layer 940 may be controlled, in some non-limiting examples, by judicious selection of at least one of: at least one of a characteristic of the NIC material 511, the average film thickness $d_2$ of the NIC 310, the introduction of heterogeneities in the NIC 310, and/or a deposition environment, including without limitation, a temperature, pressure, duration, deposition rate, and/or method of deposition for the NIC 310.

In some non-limiting examples, the formation of at least one of the characteristic size $S_1$, size distribution, shape, surface coverage $C_1$, configuration, deposited density, and/or dispersity D of such discontinuous layer 940 may be controlled, in some non-limiting examples, by judicious selection of at least one of: at least one characteristic of the deposited material 531, an extent to which the NIC 310 may be exposed to deposition of the deposited material 531 (which, in some non-limiting examples may be specified in terms of a thickness of the corresponding discontinuous layer 940), and/or a deposition environment, including without limitation, a temperature, pressure, duration, deposition rate, and/or method of deposition for the deposited material 531.

In some non-limiting examples, the discontinuous layer 540 may be deposited in a pattern across the lateral extent of the NIC 310 using a fine metal mask (FMM).

In some non-limiting examples, the discontinuous layer 540 may be disposed in a pattern that may be defined by at least one region therein that is substantially devoid of a closed coating 340 of the deposited material 531.

In some non-limiting examples, the characteristics of such discontinuous layer 940 may be assessed, in some non-limiting examples, somewhat arbitrarily, according to at least one of several criteria, including without limitation, a characteristic size $S_1$, size distribution, shape, configuration, surface coverage $C_1$, deposited distribution, dispersity D, and/or a presence, and/or extent of aggregation instances of deposited material 531, formed on a portion of the exposed layer surface 11 of the underlying layer.

In some non-limiting examples, an assessment of the discontinuous layer 940 according to such at least one criterion, may be performed on, including without limitation, by measuring, and/or calculating, at least one attribute of the discontinuous layer 940, using a variety of imaging techniques, including without limitation, TEM, AFM, and/or SEM.

Those having ordinary skill in the relevant art will appreciate that such an assessment of the discontinuous layer 940 may depend, to a greater, and/or lesser extent, by the extent, of the exposed layer surface 11 under consideration, which in some non-limiting examples may comprise an area, and/or region thereof. In some non-limiting examples, the discontinuous layer 940 may be assessed across the entire extent, in a first lateral aspect, and/or a second lateral aspect that is substantially transverse thereto, of the exposed layer surface 11. In some non-limiting examples, the discontinuous layer 940 may be assessed across an extent that comprises at least one observation window applied against (a part of) the discontinuous layer 940.

In some non-limiting examples, the at least one observation window may be located at a perimeter, interior location, and/or grid coordinate of the lateral aspect of the exposed layer surface 11. In some non-limiting examples, a plurality of the at least one observation windows may be used in assessing the discontinuous layer 940.

In some non-limiting examples, the observation window may correspond to a field of view of an imaging technique applied to assess the discontinuous layer 940, including without limitation, TEM, AFM, and/or SEM. In some non-limiting examples, the observation window may correspond to a given level of magnification, including without limitation: 2.00 μm, 1.00 μm, 500 nm, or 200 nm.

In some non-limiting examples, the assessment of the discontinuous layer 940, including without limitation, at least one observation window used, of the exposed layer surface 11 thereof, may involve calculating, and/or measuring, by any number of mechanisms, including without limitation, manual counting, and/or known estimation techniques, which may, in some non-limiting examples, may comprise curve, polygon, and/or shape fitting techniques.

In some non-limiting examples, the assessment of the discontinuous layer 940, including without limitation, at least one observation window used, of the exposed layer surface 11 thereof, may involve calculating, and/or measuring an average, median, mode, maximum, minimum, and/or other probabilistic, statistical, and/or data manipulation of a value of the calculation, and/or measurement.

In some non-limiting examples, one of the at least one criterion by which such discontinuous layer 940 may be assessed, may be a surface coverage $C_1$ of the deposited material 531 on such (part of the) discontinuous layer 940. In some non-limiting examples, the surface coverage $C_1$ may be represented by a (non-zero) percentage coverage by such deposited material 531 of such (part of the) discontinuous layer 940. In some non-limiting examples, the percentage coverage may be compared to a maximum threshold percentage coverage.

In some non-limiting examples, a (part of a) discontinuous layer 940 having surface coverage $C_1$ that may be substantially no more than the maximum threshold percentage coverage, may result in a manifestation of different optical characteristics that may be imparted by such part of the discontinuous layer 940, to photons passing therethrough, whether transmitted entirely through the device 300, and/or emitted thereby, relative to photons passing through a part of the discontinuous layer 940 having a surface coverage $C_1$ that substantially exceeds the maximum threshold percentage coverage.

In some non-limiting examples, one measure of a surface coverage $C_1$ of an amount of an electrically conductive material on a surface may be a (light) transmittance, since in some non-limiting examples, electrically conductive materials, including without limitation, metals, including without limitation: Ag, Mg, or Yb, attenuate, and/or absorb photons.

Those having ordinary skill in the relevant art will appreciate that in some non-limiting examples, surface coverage $C_1$ may be understood to encompass one or both of particle size, and deposited density. Thus, in some non-limiting examples, two or more of these three criteria may be positively correlated. Indeed, in some non-limiting examples, a criterion of low surface coverage $C_1$ may comprise some combination of a criterion of low deposited density with a criterion of low particle size.

In some non-limiting examples, one of the at least one criterion by which such discontinuous layer 940 may be assessed, may be a characteristic size $S_1$ of the constituent particle structures 941.

In some non-limiting examples, the at least one particle structure 941 of the discontinuous layer 940, may have a characteristic size $S_1$ that is no more than a maximum threshold size. Non-limiting examples of the characteristic size $S_1$ may include height, width, length, and/or diameter.

In some non-limiting examples, substantially all of the particle structures 941, of the discontinuous layer 940 may have a characteristic size $S_1$ that lies within a specified range.

In some non-limiting examples, such characteristic size $S_1$ may be characterized by a characteristic length, which in some non-limiting examples, may be considered a maximum value of the characteristic size $S_1$. In some non-limiting examples, such maximum value may extend along a major axis of the particle structure 941. In some non-limiting examples, the major axis may be understood to be a first dimension extending in a plane defined by the plurality of lateral axes. In some non-limiting examples, a characteristic width may be identified as the value of the characteristic size $S_1$ of the particle structure 941 that may extend along a minor axis of the particle structure 941. In some non-limiting examples, the minor axis may be understood to be a second dimension extending in the same plane but substantially transverse to the major axis.

In some non-limiting examples, the characteristic length of the at least one particle structure 941, along the first dimension, may be less than the maximum threshold size.

In some non-limiting examples, the characteristic width of the at least one particle structure 941, along the second dimension, may be less than the maximum threshold size.

In some non-limiting examples, the size of the constituent particle structures 941, in the (part of the) discontinuous layer 940, may be assessed by calculating, and/or measuring a characteristic size $S_1$ of such at least one particle structure 941, including without limitation, a mass, volume, length of a diameter, perimeter, major, and/or minor axis thereof.

In some non-limiting examples, one of the at least one criterion by which such discontinuous layer 940 may be assessed, may be a deposited density thereof.

In some non-limiting examples, the characteristic size $S_1$ of the particle structure 941 may be compared to a maximum threshold size.

In some non-limiting examples, the deposited density of the particle structures 941 may be compared to a maximum threshold deposited density.

In some non-limiting examples, the particle structures 941 may have a substantially round shape. In some non-limiting examples, the particle structures 941 may have a substantially spherical shape.

For purposes of simplification, in some non-limiting examples, it may be assumed that the longitudinal extent of each particle structure 941 may be substantially the same (in any event, it cannot be directly measured from a plan view SEM image) so that the (area) size of the particle structure 941 may be represented as a two-dimensional area coverage along the pair of lateral axes. In the present disclosure, a reference to an (area) size may be understood to refer to such two-dimensional concept, and to be differentiated from a size (without the prefix "area") that may be understood to refer to a one-dimensional concept, such as a linear dimension.

Indeed, in some early investigations, it appears that, in some non-limiting examples, the longitudinal extent, along the longitudinal axis, of such particle structures 941, may tend to be small relative to the lateral extent (along at least one of the lateral axes), such that the volumetric contribution of the longitudinal extent thereof may be much less than that of such lateral extent. In some non-limiting examples, this may be expressed by an aspect ratio (a ratio of a longitudinal extent to a lateral extent) that may be less than 1. In some non-limiting examples, such aspect ratio may be about: 1:10, 1:20, 1:50, 1:75, or 1:300.

In this regard, the assumption set out above that the longitudinal extent is substantially the same and can be ignored, to represent the particle structure 941 as a two-dimensional area coverage may be appropriate.

Those having ordinary skill in the relevant art will appreciate, having regard to the non-determinative nature of the deposition process, especially in the presence of defects, and/or anomalies on the exposed layer surface 11 of the underlying material, including without limitation, heterogeneities, including without limitation, a step edge, a chemical impurity, a bonding site, a kink, and/or a contaminant thereon, and consequently the formation of particle structures 941 thereon, the non-uniform nature of coalescence thereof as the deposition process continues, and in view of the uncertainty in the size, and/or position of observation windows, as well as the intricacies and variability inherent in the calculation, and/or measurement of their characteristic size $S_1$, spacing, deposited density, degree of aggregation, and the like, there may be considerable variability in terms of the features, and/or topology within observation windows.

In the present disclosure, for purposes of simplicity of illustration, certain details of deposited materials 531, including without limitation, thickness profiles, and/or edge profiles of layer(s) have been omitted.

Those having ordinary skill in the relevant art will appreciate that certain metal NPs, whether or not as part of a discontinuous layer 940 of deposited material 531, including without limitation, at least one particle structure 941, may exhibit surface plasmon (SP) excitations, and/or coherent oscillations of free electrons, with the result that such NPs may absorb, and/or scatter light in a range of the EM spectrum, including without limitation, the visible light spectrum, and/or a sub-range thereof. The optical response, including without limitation, the (sub-) range of the EM spectrum over which absorption may be concentrated (absorption spectrum), refractive index n, and/or extinction spectrum k, of such localized SP (LSP) excitations, and/or coherent oscillations, may be tailored by varying properties of such NPs, including without limitation, a characteristic size $S_1$, size distribution, shape, surface coverage $C_1$, configuration, deposition density, dispersity D, and/or property, including without limitation, material, and/or degree of aggregation, of the nanostructures, and/or a medium proximate thereto.

Such optical response, in respect of photon-absorbing coatings, may include absorption of photons incident thereon, thereby reducing reflection. In some non-limiting examples, the absorption may be concentrated in a range of the EM spectrum, including without limitation, the visible light spectrum, and/or a sub-range thereof. In some nonlimiting examples, employing a photon-absorbing layer as part of an opto-electronic device may reduce reliance on a polarizer therein.

It has been reported in Fusella et al., "Plasmonic enhancement of stability and brightness in organic light-emitting devices", *Nature* 2020, 585, at 379-382 ("Fusella et al."), that the stability of an OLED device may be enhanced by incorporating an NP-based out-coupling layer above the cathode layer to extract energy from the plasmon modes. The NP-based out-coupling layer was fabricated by spin-casting cubic Ag NPs on top of an organic layer on top of a cathode. However, since most commercial OLED devices are fabricated using vacuum-based processing, spin-casting from solution may not constitute an appropriate mechanism for forming such an NP-based out-coupling layer above the cathode.

The inventors have discovered that such an NP-based out-coupling layer above the cathode may be fabricated in vacuum (and thus, may be suitable for use in a commercial OLED fabrication process), by depositing a metal deposited material 531 in a discontinuous layer 940 onto a NIC 310, which in some non-limiting examples, may be, and/or be deposited on, the cathode. Such process may avoid the use of solvents or other wet chemicals that may cause damage to the OLED device, and/or may adversely impact device reliability.

In some non-limiting examples, the presence of such a discontinuous layer 940 of deposited material 531, including without limitation, at least one particle structure 941, may contribute to enhanced light extraction, performance, stability, reliability, and/or lifetime of the device.

In some non-limiting examples, the existence, in a layered device 300, of at least one discontinuous layer 940, on, and/or proximate to the exposed layer surface 11 of a NIC 310, and/or, in some non-limiting examples, and/or proximate to the interface of such NIC 310 with at least one covering layer, may impart optical effects to photons, and/or (EM) signals emitted by the device, and/or transmitted therethrough.

Those having ordinary skill in the relevant art will appreciate that, while a simplified model of the optical effects is presented herein, other models, and/or explanations may be applicable.

In some non-limiting examples, the presence of such a discontinuous layer 940 of the deposited material 531, including without limitation, at least one particle structure 941, may reduce, and/or mitigate crystallization of thin film layers, and/or coatings disposed adjacent in the longitudinal aspect, including without limitation, the NIC 310, and/or at least one covering layer, thereby stabilizing the property of the thin film(s) disposed adjacent thereto, and, in some non-limiting examples, reducing scattering. In some non-limiting examples, such thin film may be, and/or comprise at least one layer of an outcoupling, and/or encapsulating coating of the device, including without limitation, a capping layer (CPL).

In some non-limiting examples, the presence of such a discontinuous layer 940 of deposited material 531, including without limitation, at least one particle structure 941, may provide an enhanced absorption in at least a part of the UV spectrum. In some non-limiting examples, controlling the characteristics of such particle structures 941, including without limitation, characteristic size $S_1$, size distribution, shape, surface coverage $C_1$, configuration, deposited density, dispersity D, deposited material 531, and refractive index n, of the particle structures 941, may facilitate controlling the degree of absorption, wavelength range and peak wavelength $\lambda_{max}$ of the absorption spectrum, including in the UV spectrum. Enhanced absorption of light in at least a part of the UV spectrum may be advantageous, for example, for improving device performance, stability, reliability, and/or lifetime.

In some non-limiting examples, the optical effects may be described in terms of its impact on the transmission, and/or absorption wavelength spectrum, including a wavelength range, and/or peak intensity thereof.

Additionally, while the model presented may suggest certain effects imparted on the transmission, and/or absorption of photons passing through such discontinuous layer 940, in some non-limiting examples, such effects may reflect local effects that may not be reflected on a broad, observable basis.

In some non-limiting examples, the at least one particle structure 941 may comprise a particle structure material.

In some non-limiting examples, the deposited material 531 in the discontinuous layer 940 in the first portion 301, the underlying layer thereunder, and/or the deposited layer 330, may comprise a common metal.

In some non-limiting examples, the particle structure material may comprise an element selected from K, Na, Li, Ba, Cs, Yb, Ag, Au, Cu, Al, Mg, Zn, Cd, Sn, or Y. In some non-limiting examples, the element may comprise K, Na, Li, Ba, Cs, Yb, Ag, Au, Cu, Al, or Mg. In some non-limiting examples, the element may comprise Cu, Ag, or Au. In some non-limiting examples, the element may be Cu. In some non-limiting examples, the element may be Al. In some non-limiting examples, the element may comprise Mg, Zn, Cd, or Yb. In some non-limiting examples, the element may comprise Mg, Ag, Al, Yb, or Li. In some non-limiting examples, the element may comprise Mg, Ag, or Yb. In some non-limiting examples, the element may comprise Mg, or Ag. In some non-limiting examples, the element may be Ag.

In some non-limiting examples, the particle structure material may comprise a pure metal. In some non-limiting examples, the at least one particle structure 941 may be a pure metal. In some non-limiting examples, the at least one particle structure 941 may be pure Ag or substantially pure Ag. In some non-limiting examples, the substantially pure Ag may have a purity of at least about: 95%, 99%, 99.9%, 99.99%, 99.999%, or 99.9995%. In some non-limiting examples, the at least one particle structure 941 may be pure Mg or substantially pure Mg.

In some non-limiting examples, the at least one particle structure 941 may comprise an alloy. In some non-limiting examples, the alloy may be an Ag-containing alloy, and Mg-containing alloy, or an AgMg-containing alloy.

In some non-limiting examples, the particle structure material may comprise other metals in place of, or in combination with Ag. In some non-limiting examples, the particle structure material may comprise an alloy of Ag with at least one other metal. In some non-limiting examples, the particle structure material may comprise an alloy of Ag with Mg, or Yb. In some non-limiting examples, such alloy may be a binary alloy having a composition of between about: 5-95 vol. % Ag, with the remainder being the other metal. In some non-limiting examples, the particle structure material may comprise Ag and Mg. In some non-limiting examples, the particle structure material may comprise an Ag:Mg alloy having a composition of between about 1:10-10:1 by volume. In some non-limiting examples, the particle structure material may comprise Ag and Yb. In some non-limiting examples, the particle structure material may comprise a Yb:Ag alloy having a composition of between about 1:20-

(1-10):1 by volume. In some non-limiting examples, the particle structure material may comprise Mg and Yb. I some non-limiting examples, the particle structure material may comprise an Mg:Yb alloy. In some non-limiting examples, the particle structure material may comprise an Ag:Mg:Yb alloy.

In some non-limiting examples, the at least one particle structure 941 may comprise at least one additional element. In some non-limiting examples, such additional element may be a non-metallic element. In some non-limiting examples, the non-metallic material may be O, S, N, or C. It will be appreciated by those having ordinary skill in the relevant art that, in some non-limiting examples, such additional element(s) may be incorporated into the at least one particle structure 941 as a contaminant, due to the presence of such additional element(s) in the source material, equipment used for deposition, and/or the vacuum chamber environment. In some non-limiting examples, such additional element(s) may form a compound together with other element(s) of the at least one particle structure 941. In some non-limiting examples, a concentration of the non-metallic element in the deposited material 531 may be less than about: 1%, 0.1%, 0.01%, 0.001%, 0.0001%, 0.00001%, 0.000001%, or 0.0000001%. In some non-limiting examples, the deposited layer 330 may have a composition in which a combined amount of 0 and C therein is less than about: 10%, 5%, 1%, 0.1%, 0.01%, 0.001%, 0.0001%, 0.00001%, 0.000001%, or 0.0000001%.

In some non-limiting examples, the presence of the at least one particle structure 941, including without limitation, NPs, including without limitation, in a discontinuous layer 940, on an exposed layer surface 11 of the NIC 310 may affect a number of the optical properties of the device 900.

Figure 10:
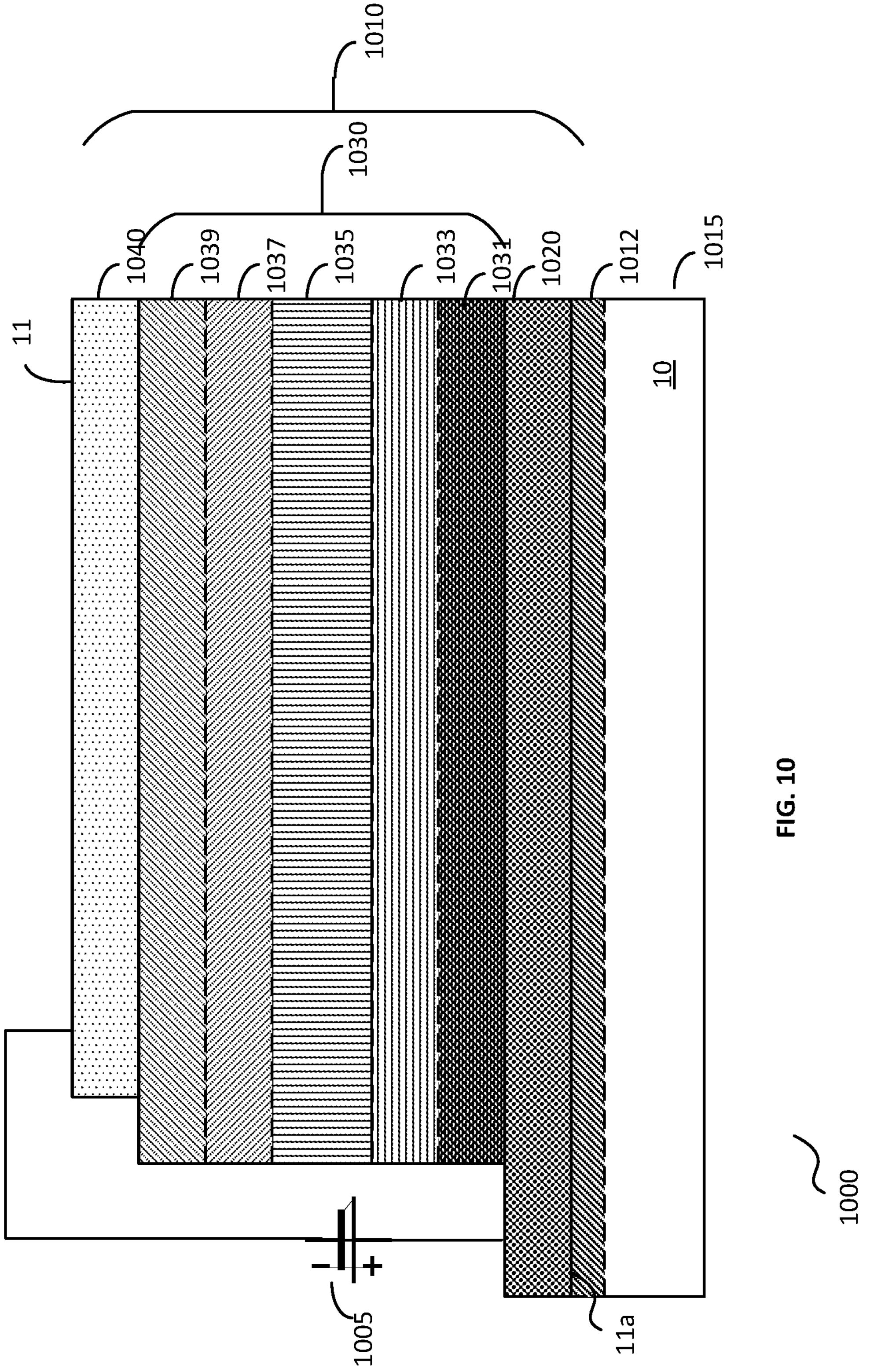
FIG. 10 is a block diagram from a cross-sectional aspect, of an example electro-luminescent device according to an example in the present disclosure.

FIG. 10 is a simplified block diagram from a cross-sectional aspect, of an example electro-luminescent device 1000 according to the present disclosure. In some non-limiting examples, the device 1000 is an OLED.

The device 1000 comprises, a substrate 10, upon which a frontplane 101010, comprising a plurality of layers, respectively, a first electrode 1020, at least one semiconducting layer 1030, and a second electrode 1040, are disposed. In some non-limiting examples, the frontplane 101010 may provide mechanisms for photon emission, and/or manipulation of emitted photons. In some non-limiting examples, a barrier coating 2050 may be provided to surround, and/or encapsulate the layers 1020, 1030, 1040, and/or the substrate 10 disposed thereon.

In some non-limiting examples, the deposited layer 330 and the underlying surface together forms at least a part of at least one of the first electrode 1020 and the second electrode 1040 of the device 1000. In some non-limiting examples, the deposited layer 330 and the underlying surface together form at least a part of a cathode 1242 of the device 1000.

In some non-limiting examples, the device 1000 may be electrically coupled to a power source 1005. When so coupled, the device 1000 may emit photons as described herein.

In some non-limiting examples, the device 1000 may be classified according to a direction of emission of photons generated therefrom. In some non-limiting examples, the device 1000 may be considered to be a bottom-emission device if the photons generated are emitted in a direction toward and through the substrate 10 at the bottom of the device 1000 and away from the layers 1020, 1030, 1040 disposed on top of the substrate 10. In some non-limiting examples, the device 1000 may be considered to be a top-emission device if the photons are emitted in a direction away from the substrate 10 at the bottom of the device 1000 and toward, and/or through the top layer 1040 disposed, with intermediate layers 1020, 1030, on top of the substrate 10. In some non-limiting examples, the device 1000 may be considered to be a double-sided emission device if it is configured to emit photons in both the bottom (toward and through the substrate 10) and top (toward and through the top layer 1040).

Substrate

In some examples, the substrate 10 may comprise a base substrate 1012. In some examples, the base substrate 1012 may be formed of material suitable for use thereof, including without limitation, an inorganic material, including without limitation, silicon (Si), glass, metal (including without limitation, a metal foil), sapphire, and/or other inorganic material, and/or an organic material, including without limitation, a polymer, including without limitation, a polyimide, and/or a silicon-based polymer. In some examples, the base substrate 1012 may be rigid or flexible. In some examples, the substrate 1012 may be defined by at least one planar surface. In some non-limiting examples, the substrate 10 has at least one surface that supports the remaining front plane 1010 components of the device 1000, including without limitation, the first electrode 1020, the at least one semiconducting layer 1030, and/or the second electrode 1040.

In some non-limiting examples, such surface may be an organic surface, and/or an inorganic surface.

In some examples, the substrate 10 may comprise, in addition to the base substrate 1012, one or more additional organic, and/or inorganic layers (not shown nor specifically described herein) supported on an exposed layer surface 11 of the base substrate 1012.

In some non-limiting examples, such additional layers may comprise, and/or form one or more organic layers, which may comprise, replace, and/or supplement one or more of the at least one semiconducting layers 1030.

In some non-limiting examples, such additional layers may comprise one or more inorganic layers, which may comprise, and/or form one or more electrodes, which in some non-limiting examples, may comprise, replace, and/or supplement the first electrode 1020, and/or the second electrode 1040.

In some non-limiting examples, such additional layers may comprise, and/or be formed of, and/or as a backplane layer 1015. In some non-limiting examples, the backplane layer 1015 contains power circuitry, and/or switching elements for driving the device 1000, including without limitation, electronic TFT structure(s), and/or component(s) 1100 (FIG. 11) thereof that may be formed by a photolithography process, which may not be provided under, and/or may precede the introduction of low pressure (including without limitation, a vacuum) environment.

In the present disclosure, a semiconductor material may be described as a material that generally exhibits a band gap. In some non-limiting examples, the band gap may be formed between a highest occupied molecular orbital (HOMO) and a lowest unoccupied molecular orbital (LUMO) of the semiconductor material. Semiconductor materials thus generally exhibit electrical conductivity that is less than that of a conductive material (including without limitation, a metal), but that is greater than that of an insulating material (including without limitation, a glass). In some non-limiting examples, the semiconductor material may comprise an organic semiconductor material. In some non-limiting examples, the semiconductor material may comprise an inorganic semiconductor material.

Backplane and TFT Structure(s) Embodied Therein

Figure 11:
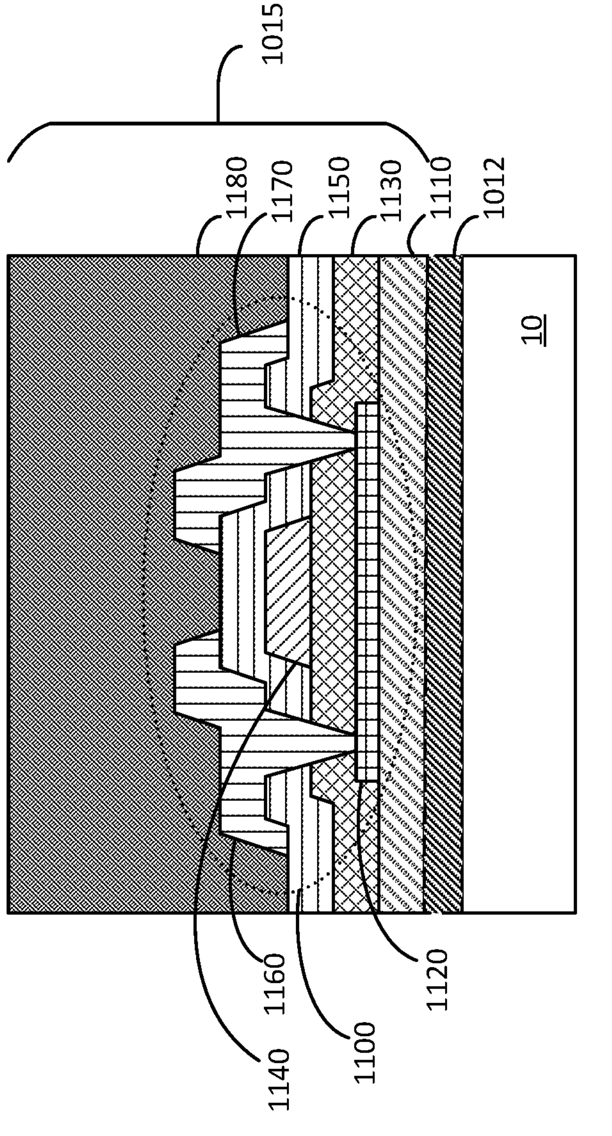
FIG. 11 is a cross-sectional view of an example backplane layer of the substrate of the device of FIG. 10, showing a thin film transistor (TFT) embodied therein.

FIG. 11 is a simplified cross-sectional view of an example of the substrate 10 of the device 1000, including a backplane layer 1015 thereof. In some non-limiting examples, the backplane 1015 of the substrate 10 may comprise one or more electronic, and/or opto-electronic components, including without limitation, transistors, resistors, and/or capacitors, such as which may support the device 1000 acting as an active-matrix, and/or a passive matrix device. In some non-limiting examples, such structures may be a thin-film transistor (TFT) structure, such as is shown at 1100. In some non-limiting examples, the TFT structure 1100 may be fabricated using organic, and/or inorganic materials to form various layers 1110, 112, 1130, 1140, 1150, 1160, 1170, 1180, and/or parts of the backplane layer 1015 of the substrate 10 above the base substrate 1012. In FIG. 11, the TFT structure 1000 shown is a top-gate TFT. In some non-limiting examples, TFT technology, and/or structures, including without limitation, one or more of the layers 1110, 1120, 1130, 1140, 1150, 1170, 1170, 1180, may be employed to implement non-transistor components, including without limitation, resistors, and/or capacitors.

In some non-limiting examples, the backplane 1015 may comprise a buffer layer 1110 deposited on an exposed layer surface 11 of the base substrate 1012 to support the components of the TFT structure 1100. In some non-limiting examples, the TFT structure 1100 may comprise a semiconductor active area 1120, a gate insulating layer 1130, a TFT gate electrode 1140, an interlayer insulating layer 1150, a TFT source electrode 1160, a TFT drain electrode 1170, and/or a TFT insulating layer 1180. In some non-limiting examples, the semiconductor active area 1120 may be formed over a part of the buffer layer 1110, and the gate insulating layer 1130 is deposited to substantially cover the semiconductor active area 1120. In some non-limiting examples, the gate electrode 1140 may be formed on top of the gate insulating layer 1130 and the interlayer insulating layer 1150 may be deposited thereon. The TFT source electrode 1170 and the TFT drain electrode 1170 may be formed such that they extend through openings formed through both the interlayer insulating layer 1150 and the gate insulating layer 1130 such that they may be electrically coupled to the semiconductor active area 1120. The TFT insulating layer 1180 may then be formed over the TFT structure 1100.

In some non-limiting examples, one or more of the layers 1110, 1120, 1130, 1140, 1150, 1160, 1170, 1180 of the backplane 1015 may be patterned using photolithography, which uses a photomask to expose selective parts of a photoresist covering an underlying device layer to UV light. Depending upon a type of photoresist used, exposed or unexposed parts of the photomask may then be removed to reveal desired parts of the underlying device layer. In some examples, the photoresist is a positive photoresist, in which the selective parts thereof exposed to UV light are not substantially removable thereafter, while the remaining parts not so exposed are substantially removable thereafter. In some non-limiting examples, the photoresist is a negative photoresist, in which the selective parts thereof exposed to UV light are substantially removable thereafter, while the remaining parts not so exposed are not substantially removable thereafter. A patterned surface may thus be etched, including without limitation, chemically, and/or physically, and/or washed off, and/or away, to effectively remove an exposed part of such layer 1110, 1120, 1130, 1140, 1150, 1160, 1170, 1180.

Further, while a top-gate TFT structure 1100 is shown in FIG. 11, those having ordinary skill in the relevant art will appreciate that other TFT structures, including without limitation a bottom-gate TFT structure, may be formed in the backplane 1015 without departing from the scope of the present disclosure.

In some non-limiting examples, the TFT structure 1100 may be an n-type TFT, and/or a p-type TFT. In some non-limiting examples, the TFT structure 1100 may incorporate any one or more of amorphous Si (a-Si), indium gallium zinc (Zn) oxide (IGZO), and/or low-temperature polycrystalline Si (LTPS).

First Electrode

The first electrode 1020 is deposited over the substrate 10. In some non-limiting examples, the first electrode 1020 may be electrically coupled to a terminal of the power source 1005, and/or to ground. In some non-limiting examples, the first electrode 1020 is so coupled through at least one driving circuit 1200 (FIG. 12), which in some non-limiting examples, may incorporate at least one TFT structures 1100 in the backplane 1015 of the substrate 10.

Figure 12:
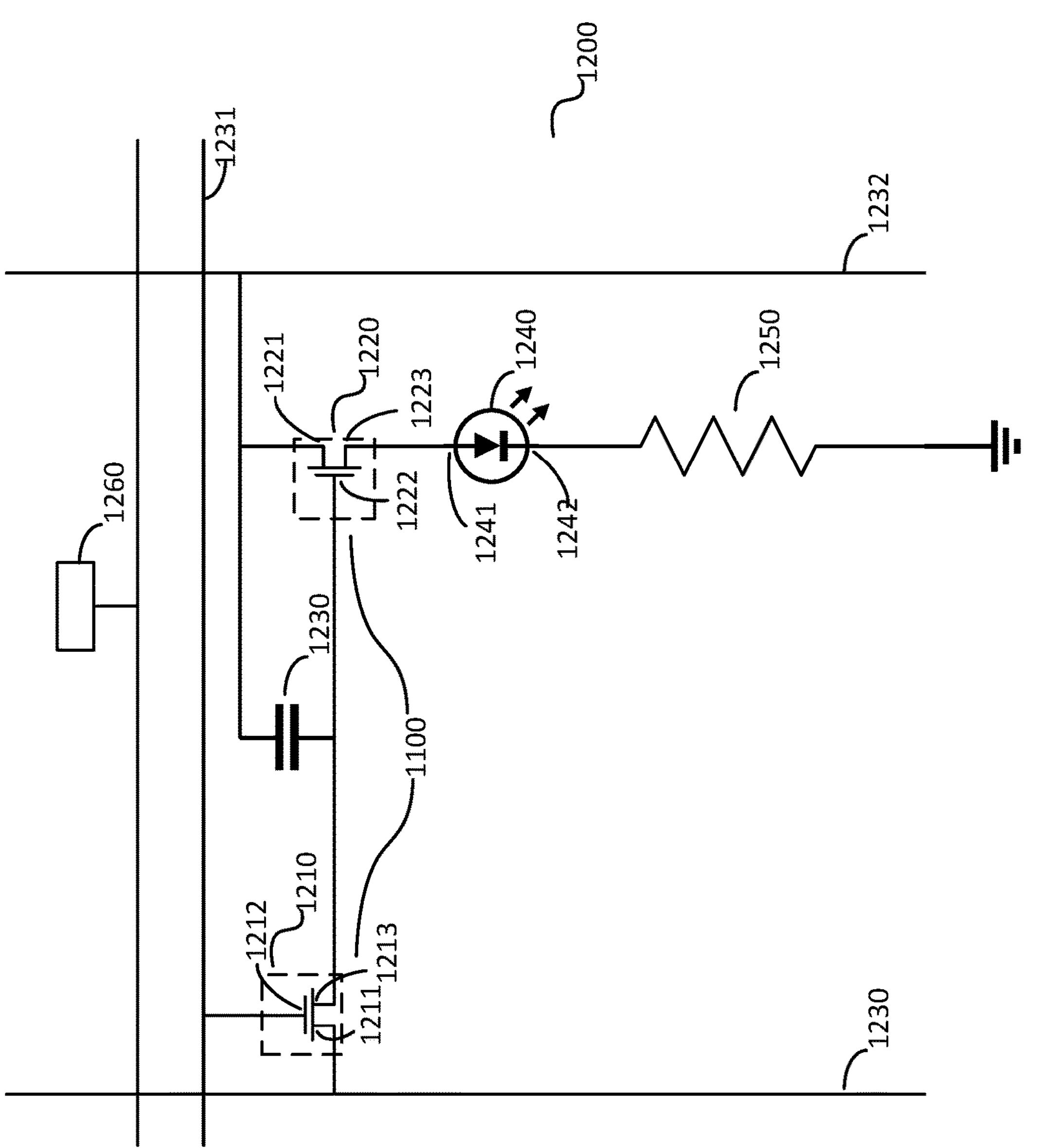
FIG. 12 is a circuit diagram for an example circuit such as may be provided by one or more of the TFTs shown in the backplane layer of FIG. 11.

In some non-limiting examples, the first electrode 1020 may comprise an anode 1241 (FIG. 12), and/or a cathode 1242 (FIG. 12). In some non-limiting examples, the first electrode 1020 is an anode 1241.

Figure 13:
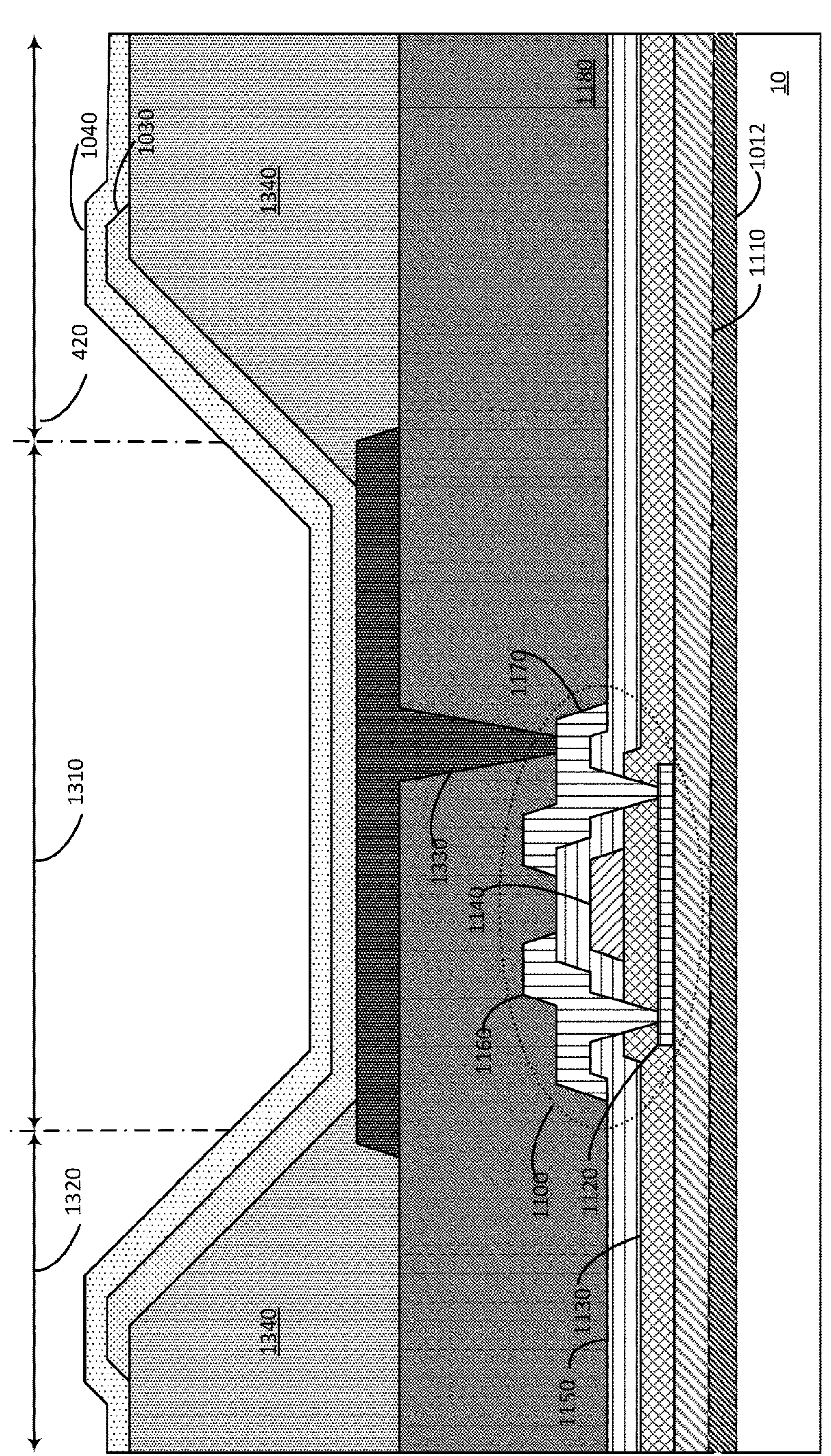
FIG. 13 is a cross-sectional view of the device of FIG. 10.

In some non-limiting examples, the first electrode 1020 may be formed by depositing at least one thin conductive film, over (a portion of) the substrate 10. In some non-limiting examples, there may be a plurality of first electrodes 1020, disposed in a spatial arrangement over a lateral aspect of the substrate 10. In some non-limiting examples, one or more of such at least one first electrodes 1020 may be deposited over (a portion of) the TFT insulating layer 1180 disposed in a lateral aspect in a spatial arrangement. If so, in some non-limiting examples, at least one of such at least one first electrodes 1020 may extend through an opening of the corresponding TFT insulating layer 1180, as shown in FIG. 13, to be electrically coupled to an electrode 1140, 1160, 1170 of the TFT structures 1100 in the backplane 1015. In FIG. 13, a part of the at least one first electrode 1020 is shown coupled to the TFT drain electrode 1170.

In some non-limiting examples, the at least one first electrode 1020, and/or at least one thin film thereof, may comprise various materials, including without limitation, one or more metallic materials, including without limitation, Mg, Al, calcium (Ca), Zn, Ag, Cd, Ba, or Yb, or combinations of any two or more thereof, including without limitation, alloys containing any of such materials, one or more metal oxides, including without limitation, a transparent conducting oxide (TCO), including without limitation, ternary compositions such as, without limitation, fluorine tin oxide (FTO), indium zinc oxide (IZO), or indium tin oxide (ITO), or combinations of any two or more thereof, or in varying proportions, or combinations of any two or more thereof in at least one layer, any one or more of which may be, without limitation, a thin film.

In some non-limiting examples, a thin conductive film comprising the first electrode 1020 may be selectively deposited, deposited, and/or processed using a variety of techniques, including without limitation, evaporation (including without limitation, thermal evaporation, and/or electron beam evaporation), photolithography, printing (including without limitation, ink jet, and/or vapor jet printing, reel-to-reel printing, and/or micro-contact transfer printing), PVD (including without limitation, sputtering), CVD (including without limitation, PECVD, and/or OVPD), laser annealing, LITI patterning, ALD, coating (including without limitation, spin coating, dip coating, line coating, and/or spray coating), and/or combinations of any two or more thereof.

Second Electrode

The second electrode 1040 is deposited over the at least one semiconducting layer 1030. In some non-limiting examples, the second electrode 1040 is electrically coupled to a terminal of the power source 1005, and/or to ground. In some non-limiting examples, the second electrode 1040 is so coupled through at least one driving circuit 1200, which in some non-limiting examples, may incorporate at least one TFT structure 1100 in the backplane 1015 of the substrate 10.

In some non-limiting examples, the second electrode 1040 may comprise an anode 1241, and/or a cathode 1242. In some non-limiting examples, the second electrode 1030 is a cathode 1242.

In some non-limiting examples, the second electrode 1040 may be formed by depositing a deposited layer 330, in some non-limiting examples, as at least one thin film, over (a part of) the at least one semiconducting layer 1030. In some non-limiting examples, there may be a plurality of second electrodes 1040, disposed in a spatial arrangement over a lateral aspect of the at least one semiconducting layer 1030.

In some non-limiting examples, the at least one second electrode 1040 may comprise various materials, including without limitation, one or more metallic materials, including without limitation, Mg, Al, Ca, Zn, Ag, Cd, Ba, or Yb, or combinations of any two or more thereof, including without limitation, alloys containing any of such materials, one or more metal oxides, including without limitation, a TCO, including without limitation, ternary compositions such as, without limitation, FTO, IZO, or ITO, or combinations of any two or more thereof, or in varying proportions, or zinc oxide (ZnO), or other oxides containing indium (In), or Zn, or combinations of any two or more thereof in at least one layer, and/or one or more non-metallic materials, any one or more of which may be, without limitation, a thin conductive film. In some non-limiting examples, for a Mg:Ag alloy, such alloy composition may range between about 1:9-9:1 by volume.

In some non-limiting examples, a thin conductive film comprising the second electrode 1040 may be selectively applied, deposited, and/or processed using a variety of techniques, including without limitation, evaporation (including without limitation, thermal evaporation, and/or electron beam evaporation), photolithography, printing (including without limitation, ink jet, and/or vapor jet printing, reel-to-reel printing, and/or micro-contact transfer printing), PVD (including without limitation, sputtering), CVD (including without limitation, PECVD, and/or OVPD), laser annealing, LITI patterning, ALD, coating (including without limitation, spin coating, dip coating, line coating, and/or spray coating), and/or combinations of any two or more thereof.

In some non-limiting examples, the deposition of the second electrode 1040 may be performed using an open mask 600 600, and/or a mask-free deposition process.

In some non-limiting examples, the second electrode 1040 may comprise a plurality of such layers, and/or coatings. In some non-limiting examples, such layers, and/or coatings may be distinct layers, and/or coatings disposed on top of one another.

In some non-limiting examples, the second electrode 1040 may comprise a Yb/Ag bi-layer coating. By way of non-limiting examples, such bi-layer coating may be formed by depositing a Yb coating, followed by an Ag coating. A thickness of such Ag coating may be greater than a thickness of the Yb coating.

In some non-limiting examples, the second electrode 1040 may be a multi-layer electrode 1040 comprising at least one metallic layer, and/or at least one oxide layer.

In some non-limiting examples, the second electrode 1040 may comprise a fullerene and Mg.

By way of non-limiting examples, such coating may be formed by depositing a fullerene coating followed by an Mg coating. In some non-limiting examples, a fullerene may be dispersed within the Mg coating to form a fullerene-containing Mg alloy coating. Non-limiting examples of such coatings are described in United States Patent Application Publication No. 2015/0287846 published 8 Oct. 2015, and/or in PCT International Application No. PCT/IB2017/054970 filed 15 Aug. 2017 and published as WO2018/033860 on 22 Feb. 2018.

Driving Circuit

In the present disclosure, the concept of a sub-pixel 3541-3543 (FIG. 35) may be referenced herein, for simplicity of description only, as a sub-pixel 244*x*. Likewise, in the present disclosure, the concept of a pixel 1240 (FIG. 12) may be discussed in conjunction with the concept of at least one sub-pixel 244*x* thereof. For simplicity of description only, such composite concept is referenced herein as a "(sub-) pixel 1240/244*x*" and such term is understood to suggest either or both of a pixel 1240, and/or at least one sub-pixel 244*x* thereof, unless the context dictates otherwise.

FIG. 12 is a circuit diagram for an example driving circuit such as may be provided by one or more of the TFT structures 1100 shown in the backplane 1015. In the example shown, the circuit, shown generally at 1200 is for an example driving circuit for an active-matrix OLED (AMOLED) device 1000 (and/or a (sub-) pixel 1240/244*x* thereof) for supplying current to the first electrode 1020 and the second electrode 1040, and that controls emission of photons from the device 1000 (and/or a (sub-) pixel 1240/244*x*). The circuit 1200 shown incorporates a plurality of p-type top-gate thin film TFT structures 1100, although the circuit 1200 could equally incorporate one or more p-type bottom-gate TFT structures 1100, one or more n-type top-gate TFT structures 1100, one or more n-type bottom-gate TFT structures 1100, one or more other TFT structure(s) 1100, and/or any combination thereof, whether or not formed as one or a plurality of thin film layers. The circuit 1200 comprises, in some non-limiting examples, a switching TFT 1210, a driving TFT 1220 and a storage capacitor 1230.

A (sub-) pixel 1240/244*x* of the OLED display 1000 is represented by a diode 1240. The source 1211 of the switching TFT 1210 is coupled to a data (or, in some non-limiting examples, a column selection) line 1230. The gate 1212 of the switching TFT 1210 is coupled to a gate (or, in some non-limiting examples, a row selection) line 1231. The drain 1213 of the switching TFT 1210 is coupled to the gate 1222 of the driving TFT 1220.

The source 1221 of the driving TFT 1220 is coupled to a positive (or negative) terminal of the power source 1005. The (positive) terminal of the power source 1005 is represented by a power supply line (VDD)1232.

The drain 1223 of the driving TFT 1220 is coupled to the anode 1241 (which may be, in some non-limiting examples, the first electrode 1020) of the diode 1240 (representing a (sub-) pixel 1240/244*x* of the OLED display 1000) so that the driving TFT 1220 and the diode 1240 (and/or a (sub-)

pixel 1240/244x of the OLED display 1000) are coupled in series between the power supply line (VDD)1232 and ground.

The cathode 1242 (which may be, in some non-limiting examples, the second electrode 1040) of the diode 1240 (representing a (sub-) pixel 1240/244x of the OLED display 1000) is represented as a resistor 1250 in the circuit 1200.

The storage capacitor 1230 is coupled at its respective ends to the source 1221 and gate 1222 of the driving TFT 1220. The driving TFT 1220 regulates a current passed through the diode 1240 (representing a (sub-) pixel 1240/244x of the OLED display 1000) in accordance with a voltage of a charge stored in the storage capacitor 1230, such that the diode 1240 outputs a desired luminance. The voltage of the storage capacitor 1230 is set by the switching TFT 1210, coupling it to the data line 1230.

In some non-limiting examples, a compensation circuit 1260 may be provided to compensate for any deviation in transistor properties from variances during the manufacturing process, and/or degradation of the switching TFT 1210, and/or driving TFT 1220 over time.

Semiconducting Layer

In some non-limiting examples, the at least one semiconducting layer 1030 may comprise a plurality of layers 1031, 1033, 1035, 1037, 1039, any of which may be disposed, in some non-limiting examples, in a thin film, in a stacked configuration, which may include, without limitation, any one or more of a hole injection layer (HIL) 1031, a hole transport layer (HTL) 1033, an emissive layer (EML) 1035, an electron transport layer (ETL) 1037, and/or an electron injection layer (EIL) 1039. In the present disclosure, the term "semiconducting layer(s)" may be used interchangeably with "organic layer(s)" since the layers 1031, 1033, 1035, 1037, 1039 in an OLED device 1000 may in some non-limiting examples, may comprise organic semiconducting materials.

In some non-limiting examples, the at least one semiconducting layer 1030 may form a "tandem" structure comprising a plurality of EMLs 1035. In some non-limiting examples, such tandem structure may also comprise at least one charge generation layer (CGL).

In some non-limiting examples, a thin film comprising a layer 1031, 1033, 1035, 1037, 1039 in the stack making up the at least one semiconducting layer 1030, may be selectively applied, deposited, and/or processed using a variety of techniques, including without limitation, evaporation (including without limitation, thermal evaporation, and/or electron beam evaporation), photolithography, printing (including without limitation, ink jet, and/or vapor jet printing, reel-to-reel printing, and/or micro-contact transfer printing), PVD (including without limitation, sputtering), CVD (including without limitation, PECVD, and/or OVPD), laser annealing, LITI patterning, ALD, coating (including without limitation, spin coating, dip coating, line coating, and/or spray coating), and/or combinations of any two or more thereof.

Those having ordinary skill in the relevant art will readily appreciate that the structure of the device 1000 may be varied by omitting, and/or combining one or more of the semiconductor layers 1031, 1033, 1035, 1037, 1039.

Further, any of the layers 1031, 1033, 1035, 1037, 1039 of the at least one semiconducting layer 1030 may comprise any number of sub-layers. Still further, any of such layers 1031, 1033, 1035, 1037, 1039, and/or sub-layer(s) thereof may comprise various mixture(s), and/or composition gradient(s). In addition, those having ordinary skill in the relevant art will appreciate that the device 1000 may comprise one or more layers containing inorganic, and/or organometallic materials and is not necessarily limited to devices composed solely of organic materials. By way of non-limiting example, the device 1000 may comprise one or more quantum dots.

In some non-limiting examples, the HIL 1031 may be formed using a hole injection material, which may facilitate injection of holes by the anode 1241.

In some non-limiting examples, the HTL 1033 may be formed using a hole transport material, which may, in some non-limiting examples, exhibit high hole mobility.

In some non-limiting examples, the ETL 1037 may be formed using an electron transport material, which may, in some non-limiting examples, exhibit high electron mobility.

In some non-limiting examples, the EIL 1039 may be formed using an electron injection material, which may facilitate injection of electrons by the cathode 1242.

In some non-limiting examples, the EML 1035 may be formed, by way of non-limiting example, by doping a host material with at least one emitter material. In some non-limiting examples, the emitter material may be a fluorescent emitter, a phosphorescent emitter, a thermally activated delayed fluorescence (TADF) emitter, and/or a plurality of any combination of these.

In some non-limiting examples, the device 1000 may be an OLED in which the at least one semiconducting layer 1030 comprises at least an EML 10035 interposed between conductive thin film electrodes 1020, 1040, whereby, when a potential difference is applied across them, holes are injected into the at least one semiconducting layer 1030 through the anode 1241 and electrons are injected into the at least one semiconducting layer 1030 through the cathode 1242.

The injected holes and electrons tend to migrate through the various layers 1031, 1033, 1035, 1037, 1039 until they reach and meet each other. When a hole and an electron are in close proximity, they tend to be attracted to one another due to a Coulomb force and in some examples, may combine to form a bound state electron-hole pair referred to as an exciton. Especially if the exciton may be formed in the EML 1035, the exciton may decay through a radiative recombination process, in which a photon is emitted. The type of radiative recombination process may depend upon a spin state of an exciton. In some examples, the exciton may be characterized as having a singlet or a triplet spin state. In some non-limiting examples, radiative decay of a singlet exciton may result in fluorescence. In some non-limiting examples, radiative decay of a triplet exciton may result in phosphorescence.

More recently, other photon emission mechanisms for OLEDs have been proposed and investigated, including without limitation, TADF. In some non-limiting examples, TADF emission occurs through a conversion of triplet excitons into single excitons via a reverse inter-system crossing process with the aid of thermal energy, followed by radiative decay of the singlet excitons.

In some non-limiting examples, an exciton may decay through a non-radiative process, in which no photon is released, especially if the exciton is not formed in the EML 1035.

In the present disclosure, the term "internal quantum efficiency" (IQE) of an OLED device 1000 refers to a proportion of all electron-hole pairs generated in the device 1000 that decay through a radiative recombination process and emit a photon.

In the present disclosure, the term "external quantum efficiency" (EQE) of an OLED device 1000 refers to a proportion of charge carriers delivered to the device 1000 relative to a number of photons emitted by the device 1000. In some non-limiting examples, an EQE of 100% indicates that one photon is emitted for each electron that is injected into the device 1000.

Those having ordinary skill in the relevant art will appreciate that the EQE of a device 1000 may, in some non-limiting examples, be substantially lower than the IQE of the same device 1000. A difference between the EQE and the IQE of a given device 1000 may in some non-limiting examples be attributable to a number of factors, including without limitation, adsorption and reflection of photons caused by various components of the device 1000.

In some non-limiting examples, the device 1000 may be an electro-luminescent quantum dot device in which the at least one semiconducting layer 1030 comprises an active layer comprising at least one quantum dot. When current may be provided by the power source 1005 to the first electrode 1020 and second electrode 1040, photons are emitted from the active layer comprising the at least one semiconducting layer 1030 between them.

Those having ordinary skill in the relevant art will readily appreciate that the structure of the device 1000 may be varied by the introduction of one or more additional layers (not shown) at appropriate position(s) within the at least one semiconducting layer 1030 stack, including without limitation, a hole blocking layer (not shown), an electron blocking layer (not shown), an additional charge transport layer (not shown), and/or an additional charge injection layer (not shown).

Barrier Coating

In some non-limiting examples, a barrier coating 2050 may be provided to surround, and/or encapsulate the first electrode 1020, second electrode 1040, and the various layers of the at least one semiconducting layer 1030, and/or the substrate 10 disposed thereon of the device 1000.

In some non-limiting examples, the barrier coating 2050 may be provided to inhibit the various layers 1020, 1030, 1040 of the device 1000, including the at least one semiconducting layer 1030, and/or the cathode 1242 from being exposed to moisture, and/or ambient air, since these layers 1020, 1030, 1040 may be prone to oxidation.

In some non-limiting examples, application of the barrier coating 2050 to a highly non-uniform surface may increase a likelihood of poor adhesion of the barrier coating 2050 to such surface.

In some non-limiting examples, the absence of a barrier coating 2050, and/or a poorly-applied barrier coating 2050 may cause, and/or contribute to defects in, and/or partial, and/or total failure of the device 1000. In some non-limiting examples, a poorly-applied barrier coating 2050 may reduce adhesion of the barrier coating 2050 to the device 1000. In some non-limiting examples, poor adhesion of the barrier coating 2050 may increase a likelihood of the barrier coating 2050 peeling off the device 1000 in whole or in part, especially if the device 1000 is bent, and/or flexed. In some non-limiting examples, a poorly-applied barrier coating 2050 may allow air pockets to be trapped, during application of the barrier coating 2050, between the barrier coating 2050 and an underlying surface of the device 1000 to which the barrier coating 2050 was applied.

In some non-limiting examples, the barrier coating 2050 may be a thin film encapsulation (TFE) layer 2950 (FIG. 29B) and may be selectively applied, deposited, and/or processed using a variety of techniques, including without limitation, evaporation (including without limitation, thermal evaporation, and/or electron beam evaporation), photolithography, printing (including without limitation, ink jet, and/or vapor jet printing, reel-to-reel printing, and/or micro-contact transfer printing), PVD (including without limitation, sputtering), CVD (including without limitation, PECVD, and/or OVPD), laser annealing, LITI patterning, ALD, coating (including without limitation, spin coating, dip coating, line coating, and/or spray coating), and/or combinations of any two or more thereof.

In some non-limiting examples, the barrier coating 2050 may be provided by laminating a pre-formed barrier film onto the device 1000. In some non-limiting examples, the barrier coating 2050 may comprise a multi-layer coating comprising at least one of an organic material, an inorganic material, and/or any combination thereof. In some non-limiting examples, the barrier coating 2050 may further comprise a getter material, and/or a dessicant.

Lateral Aspect

In some non-limiting examples, including where the OLED device 1000 comprises a lighting panel, an entire lateral aspect of the device 1000 may correspond to a single lighting element. As such, the substantially planar cross-sectional profile shown in FIG. 10 may extend substantially along the entire lateral aspect of the device 1000, such that photons are emitted from the device 1000 substantially along the entirety of the lateral extent thereof. In some non-limiting examples, such single lighting element may be driven by a single driving circuit 1200 of the device 1000.

In some non-limiting examples, including where the OLED device 1000 comprises a display module, the lateral aspect of the device 1000 may be sub-divided into a plurality of emissive regions 2210 of the device 1000, in which the cross-sectional aspect of the device structure 1000, within each of the emissive region(s) 2210 shown, without limitation, in FIG. 10 causes photons to be emitted therefrom when energized.

Emissive Regions

In some non-limiting examples, individual emissive regions 2210 of the device 1000 may be laid out in a lateral pattern. In some non-limiting examples, the pattern may extend along a first lateral direction. In some non-limiting examples, the pattern may also extend along a second lateral direction, which in some non-limiting examples, may be substantially normal to the first lateral direction. In some non-limiting examples, the pattern may have a number of elements in such pattern, each element being characterized by one or more features thereof, including without limitation, a wavelength of light emitted by the emissive region 2210 thereof, a shape of such emissive region 2210, a dimension (along either or both of the first, and/or second lateral direction(s)), an orientation (relative to either, and/or both of the first, and/or second lateral direction(s)), and/or a spacing (relative to either or both of the first, and/or second lateral direction(s)) from a previous element in the pattern. In some non-limiting examples, the pattern may repeat in either or both of the first, and/or second lateral direction(s).

In some non-limiting examples, each individual emissive region 2210 of the device 1000 is associated with, and driven by, a corresponding driving circuit 1200 within the backplane 1015 of the device 1000, in which the diode 1240 corresponds to the OLED structure for the associated emissive region 2210. In some non-limiting examples, including without limitation, where the emissive regions 2210 are laid out in a regular pattern extending in both the first (row) lateral direction and the second (column) lateral direction, there may be a signal line 1230, 1231 in the backplane 1015, which may be the gate line (or row selection) line 1231, corresponding to each row of emissive regions 2210 extending in the first lateral direction and a signal line 1230, 1231, which may in some non-limiting examples be the data (or column selection) line 1230, corresponding to each column of emissive regions 2210 extending in the second lateral direction. In such a non-limiting configuration, a signal on the row selection line 1231 may energize the respective gates 1212 of the switching TFT(s) 1210 electrically coupled thereto and a signal on the data line 1230 may energize the respective sources of the switching TFT(s) 1210 electrically coupled thereto, such that a signal on a row selection line 1231/data line 1230 pair will electrically couple and energise, by the positive terminal (represented by the power supply line VDD 1232) of the power source 1015, the anode 1241 of the OLED structure of the emissive region 2210 associated with such pair, causing the emission of a photon therefrom, the cathode 1242 thereof being electrically coupled to the negative terminal of the power source 1015.

In some non-limiting examples, each emissive region 2210 of the device 1000 corresponds to a single display pixel 1240. In some non-limiting examples, each pixel 1240 emits light at a given wavelength spectrum. In some non-limiting examples, the wavelength spectrum corresponds to a colour in, without limitation, the visible spectrum.

In some non-limiting examples, each emissive region 2210 of the device 1000 corresponds to a sub-pixel 244*x* of a display pixel 1240. In some non-limiting examples, a plurality of sub-pixels 244*x* may combine to form, or to represent, a single display pixel 1240.

In some non-limiting examples, a single display pixel 1240 may be represented by three sub-pixels 3541-3543. In some non-limiting examples, the three sub-pixels 3541-3543 may be denoted as, respectively, R(ed) sub-pixels 3541, G(reen) sub-pixels 3542, and/or B(lue) sub-pixels 3543. In some non-limiting examples, a single display pixel 1240 may be represented by four sub-pixels 244*x*, in which three of such sub-pixels 244*x* may be denoted as R, G and B sub-pixels 3541-3543 and the fourth sub-pixel 244*x* may be denoted as a W(hite) sub-pixel 244*x*. In some non-limiting examples, the emission spectrum of the light emitted by a given sub-pixel 244*x* corresponds to the colour by which the sub-pixel 244*x* is denoted. In some non-limiting examples, the wavelength of the light does not correspond to such colour, but further processing is performed, in a manner apparent to those having ordinary skill in the relevant art, to transform the wavelength to one that does so correspond.

Since the wavelength of sub-pixels 244*x* of different colours may be different, the optical characteristics of such sub-pixels 244*x* may differ, especially if a common electrode 1020, 1040 having a substantially uniform thickness profile is employed for sub-pixels 244*x* of different colours.

When a common electrode 1020, 1040 having a substantially uniform thickness may be provided as the second electrode 1040 in a device 1000, the optical performance of the device 1000 may not be readily be fine-tuned according to an emission spectrum associated with each (sub-)pixel 1240/244*x*. The second electrode 1040 used in such OLED devices 1000 may in some non-limiting examples, be a common electrode 1020, 1040 coating a plurality of (sub-) pixels 1240/244*x*. By way of non-limiting example, such common electrode 1020, 1040 may be a relatively thin conductive film having a substantially uniform thickness across the device 1000. While efforts have been made in some non-limiting examples, to tune the optical microcavity effects associated with each (sub-)pixel 1240/244*x* color by varying a thickness of organic layers disposed within different (sub-)pixel(s) 1240/244*x*, such approach may, in some non-limiting examples, provide a significant degree of tuning of the optical microcavity effects in at least some cases. In addition, in some non-limiting examples, such approach may be difficult to implement in an OLED display production environment.

As a result, the presence of optical interfaces created by numerous thin-film layers and coatings with different refractive indices, such as may in some non-limiting examples be used to construct opto-electronic devices including without limitation OLED devices 1000, may create different optical microcavity effects for sub-pixels 244*x* of different colours.

Some factors that may impact an observed microcavity effect in a device 1000 includes, without limitation, the total path length (which in some non-limiting examples may correspond to the total thickness of the device 1000 through which photons emitted therefrom will travel before being out-coupled) and the refractive indices of various layers and coatings.

In some non-limiting examples, modulating the thickness of an electrode 1020, 1040 in and across a lateral aspect 1310 of emissive region(s) 2210 of a (sub-) pixel 1240/244*x* may impact the microcavity effect observable. In some non-limiting examples, such impact may be attributable to a change in the total optical path length.

In some non-limiting examples, a change in a thickness of the electrode 1020, 1040 may also change the refractive index of light passing therethrough, in some non-limiting examples, in addition to a change in the total optical path length. In some non-limiting examples, this may be particularly the case where the electrode 1020, 1040 may be formed of at least one deposited layer 330.

In some non-limiting examples, the optical properties of the device 1000, and/or in some non-limiting examples, across the lateral aspect 1310 of emissive region(s) 2210 of a (sub-) pixel 1240/244*x* that may be varied by modulating at least one optical microcavity effect, include, without limitation, the emission spectrum, the intensity (including without limitation, luminous intensity), and/or angular distribution of emitted light, including without limitation, an angular dependence of a brightness, and/or color shift of the emitted light.

In some non-limiting examples, a sub-pixel 244*x* is associated with a first set of other sub-pixels 244*x* to represent a first display pixel 1240 and also with a second set of other sub-pixels 244*x* to represent a second display pixel 1240, so that the first and second display pixels 340 may have associated therewith, the same sub-pixel(s) 244*x*.

The pattern, and/or organization of sub-pixels 244*x* into display pixels 340 continues to develop. All present and future patterns, and/or organizations are considered to fall within the scope of the present disclosure.

Non-Emissive Regions

In some non-limiting examples, the various emissive regions 2210 of the device 1000 are substantially surrounded and separated by, in at least one lateral direction, one or more non-emissive regions 2220, in which the structure, and/or configuration along the cross-sectional aspect, of the device structure 1000 shown, without limitation, in FIG. 10, is varied, so as to substantially inhibit photons to be emitted therefrom. In some non-limiting examples, the non-emissive regions 2220 comprise those regions in the lateral aspect, that are substantially devoid of an emissive region 2210.

Thus, as shown in the cross-sectional view of FIG. 13, the lateral topology of the various layers of the at least one semiconducting layer 1030 may be varied to define at least one emissive region 2210, surrounded (at least in one lateral direction) by at least one non-emissive region 2220.

In some non-limiting examples, the emissive region 2210 corresponding to a single display (sub-) pixel 1240/244*x* may be understood to have a lateral aspect 1310, surrounded in at least one lateral direction by at least one non-emissive region 2220 having a lateral aspect 1320.

A non-limiting example of an implementation of the cross-sectional aspect of the device 1000 as applied to an emissive region 2210 corresponding to a single display (sub-) pixel 1240/244*x* of an OLED display 1000 will now be described. While features of such implementation are shown to be specific to the emissive region 2210, those having ordinary skill in the relevant art will appreciate that in some non-limiting examples, more than one emissive region 2210 may encompass common features.

In some non-limiting examples, the first electrode 1020 may be disposed over an exposed layer surface 11 of the device 1000, in some non-limiting examples, within at least a part of the lateral aspect 1310 of the emissive region 2210. In some non-limiting examples, at least within the lateral aspect 1310 of the emissive region 2210 of the (sub-) pixel(s) 1240/244*x*, the exposed layer surface 11, may, at the time of deposition of the first electrode 1020, comprise the TFT insulating layer 1180 of the various TFT structures 1100 that make up the driving circuit 1200 for the emissive region 2210 corresponding to a single display (sub-) pixel 1240/244*x*.

In some non-limiting examples, the TFT insulating layer 1180 may be formed with an opening 1330 extending therethrough to permit the first electrode 1020 to be electrically coupled to one of the TFT electrodes 1140, 1160, 1170, including, without limitation, as shown in FIG. 4, the TFT drain electrode 1170.

Those having ordinary skill in the relevant art will appreciate that the driving circuit 1200 comprises a plurality of TFT structures 1100, including without limitation, the switching TFT 1210, the driving TFT 1220, and/or the storage capacitor 1230. In FIG. 13, for purposes of simplicity of illustration, only one TFT structure 1100 is shown, but it will be appreciated by those having ordinary skill in the relevant art, that such TFT structure 1100 is representative of such plurality thereof that comprise the driving circuit 1200.

In a cross-sectional aspect, the configuration of each emissive region 2210 may, in some non-limiting examples, be defined by the introduction of at least one pixel definition layer (PDL) 1340 substantially throughout the lateral aspects 1320 of the surrounding non-emissive region(s) 2220. In some non-limiting examples, the PDLs 134*p* may comprise an insulating organic, and/or inorganic material.

In some non-limiting examples, the PDs 1340 are deposited substantially over the TFT insulating layer 1180, although, as shown, in some non-limiting examples, the PDLs 1340 may also extend over at least a part of the deposited first electrode 1020, and/or its outer edges.

In some non-limiting examples, as shown in FIG. 13, the cross-sectional thickness, and/or profile of the PDLs 1340 may impart a substantially valley-shaped configuration to the emissive region 2210 of each (sub-) pixel 1240/244*x* by a region of increased thickness along a boundary of the lateral aspect 1320 of the surrounding non-emissive region 2220 with the lateral aspect 1310 of the surrounded emissive region 2210, corresponding to a (sub-) pixel 1240/244*x*.

In some non-limiting examples, the profile of the PDLs 1340 may have a reduced thickness beyond such valley-shaped configuration, including without limitation, away from the boundary between the lateral aspect 1320 of the surrounding non-emissive region 2220 and the lateral aspect 1310 of the surrounded emissive region 2210, in some non-limiting examples, substantially well within the lateral aspect 1320 of such non-emissive region 2220.

While the PDL(s) 1340 have been generally illustrated as having a linearly-sloped surface to form a valley-shaped configuration that define the emissive region(s) 2210 surrounded thereby, those having ordinary skill in the relevant art will appreciate that in some non-limiting examples, at least one of the shape, aspect ratio, thickness, width, and/or configuration of such PDL(s) 1340 may be varied. By way of non-limiting example, a PDL 1340 may be formed with a steeper or more gradually-sloped part. In some non-limiting examples, such PDL(s) 1340 may be configured to extend substantially normally away from a surface on which it is deposited, that covers one or more edges of the first electrode 1020. In some non-limiting examples, such PDL(s) 1340 may be configured to have deposited thereon at least one semiconducting layer 1030 by a solution-processing technology, including without limitation, by printing, including without limitation, ink-jet printing.

In some non-limiting examples, the at least one semiconducting layer 1030 may be deposited over the exposed layer surface 11 of the device 1000, including at least a part of the lateral aspect 1310 of such emissive region 2210 of the (sub-) pixel(s) 1240/244*x*. In some non-limiting examples, at least within the lateral aspect 1310 of the emissive region 2210 of the (sub-) pixel(s) 1240/244*x*, such exposed layer surface 11, may, at the time of deposition of the at least one semiconducting layer 1030 (and/or layers 1031, 1033, 1035, 1037, 1039 thereof), comprise the first electrode 1020.

In some non-limiting examples, the at least one semiconducting layer 1030 may also extend beyond the lateral aspect 1310 of the emissive region 2210 of the (sub-) pixel(s) 1240/244*x* and at least partially within the lateral aspects 1320 of the surrounding non-emissive region(s) 2220. In some non-limiting examples, such exposed layer surface 11 of such surrounding non-emissive region(s) 2220 may, at the time of deposition of the at least one semiconducting layer 1030, comprise the PDL(s) 1340.

In some non-limiting examples, the second electrode 1040 may be disposed over an exposed layer surface 11 of the device 1000, including at least a part of the lateral aspect 1310 of the emissive region 2210 of the (sub-) pixel(s) 1240/244*x*. In some non-limiting examples, at least within the lateral aspect 1310 of the emissive region 2210 of the (sub-) pixel(s) 1240/244*x*, such exposed layer surface 11, may, at the time of deposition of the second electrode 1020, comprise the at least one semiconducting layer 1030.

In some non-limiting examples, the second electrode 1040 may also extend beyond the lateral aspect 1310 of the emissive region 2210 of the (sub-) pixel(s) 1240/244*x* and at least partially within the lateral aspects 1320 of the surrounding non-emissive region(s) 2220. In some non-limiting examples, such exposed layer surface 11 of such surrounding non-emissive region(s) 2220 may, at the time of deposition of the second electrode 1040, comprise the PDL(s) 1340.

In some non-limiting examples, the second electrode 1040 may extend throughout substantially all or a substantial part of the lateral aspects 1320 of the surrounding non-emissive region(s) 2220.

Transmissivity

Because the OLED device 1000 emits photons through either or both of the first electrode 1020 (in the case of a bottom-emission, and/or a double-sided emission device), as well as the substrate 10, and/or the second electrode 1040 (in the case of a top-emission, and/or double-sided emission device), there may be an aim to make either or both of the first electrode 1020, and/or the second electrode 1040 substantially photon- (or light)-transmissive ("transmissive"), in some non-limiting examples, at least across a substantial part of the lateral aspect 1310 of the emissive region(s) 2210 of the device 1000. In the present disclosure, such a transmissive element, including without limitation, an electrode 1020, 1040, a material from which such element may be formed, and/or property thereof, may comprise an element, material, and/or property thereof that is substantially transmissive ("transparent"), and/or, in some non-limiting examples, partially transmissive ("semi-transparent"), in some non-limiting examples, in at least one wavelength range.

A variety of mechanisms have been adopted to impart transmissive properties to the device 1000, at least across a substantial part of the lateral aspect 1310 of the emissive region(s) 2210 thereof.

In some non-limiting examples, including without limitation, where the device 1000 is a bottom-emission device, and/or a double-sided emission device, the TFT structure(s) 1100 of the driving circuit 1200 associated with an emissive region 2210 of a (sub-) pixel 1240/244*x*, which may at least partially reduce the transmissivity of the surrounding substrate 10, may be located within the lateral aspect 1320 of the surrounding non-emissive region(s) 2220 to avoid impacting the transmissive properties of the substrate 10 within the lateral aspect 1310 of the emissive region 2210.

In some non-limiting examples, where the device 1000 is a double-sided emission device, in respect of the lateral aspect 1310 of an emissive region 2210 of a (sub-) pixel 1240/244*x*, a first one of the electrode 1020, 1040 may be made substantially transmissive, including without limitation, by at least one of the mechanisms disclosed herein, in respect of the lateral aspect 1310 of neighbouring, and/or adjacent (sub-) pixel(s) 1240/244*x*, a second one of the electrodes 1020, 1040 may be made substantially transmissive, including without limitation, by at least one of the mechanisms disclosed herein. Thus, the lateral aspect 1310 of a first emissive region 2210 of a (sub-) pixel 1240/244*x* may be made substantially top-emitting while the lateral aspect 1310 of a second emissive region 2210 of a neighbouring (sub-) pixel 1240/244*x* may be made substantially bottom-emitting, such that a subset of the (sub-) pixel(s) 1240/244*x* are substantially top-emitting and a subset of the (sub-) pixel(s) 1240/244*x* are substantially bottom-emitting, in an alternating (sub-) pixel 1240/244*x* sequence, while only a single electrode 1020, 1040 of each (sub-) pixel 1240/244*x* is made substantially transmissive.

In some non-limiting examples, a mechanism to make an electrode 1020, 1040, in the case of a bottom-emission device, and/or a double-sided emission device, the first electrode 1020, and/or in the case of a top-emission device, and/or a double-sided emission device, the second electrode 1040, transmissive is to form such electrode 1020, 1040 of a transmissive thin film.

In some non-limiting examples, an electrically conductive deposited layer 330, in a thin film, including without limitation, those formed by a depositing a thin conductive film layer of a metal, including without limitation, Ag, Al, and/or by depositing a thin layer of a metallic alloy, including without limitation, an Mg:Ag alloy, and/or a Yb:Ag alloy, may exhibit transmissive characteristics. In some non-limiting examples, the alloy may comprise a composition ranging from between about 1:9-9:1 by volume. In some non-limiting examples, the electrode 1020, 1040 may be formed of a plurality of thin conductive film layers of any combination of deposited layers 330, any one or more of which may be comprised of TCOs, thin metal films, thin metallic alloy films, and/or any combination of any of these.

In some non-limiting examples, especially in the case of such thin conductive films, a relatively thin layer thickness may be up to substantially a few tens of nm so as to contribute to enhanced transmissive qualities but also favorable optical properties (including without limitation, reduced microcavity effects) for use in an OLED device 1000.

In some non-limiting examples, a reduction in the thickness of an electrode 1020, 1040 to promote transmissive qualities may be accompanied by an increase in the sheet resistance of the electrode 1020, 1040.

In some non-limiting examples, a device 1000 having at least one electrode 1020, 1040 with a high sheet resistance creates a large current-resistance (IR) drop when coupled to the power source 1005, in operation. In some non-limiting examples, such an IR drop may be compensated for, to some extent, by increasing a level (VDD) 1332 of the power source 1005. However, in some non-limiting examples, increasing the level of the power source 1005 to compensate for the IR drop due to high sheet resistance, for at least one (sub-) pixel 1240/244*x* may call for increasing the level of a voltage to be supplied to other components to maintain effective operation of the device 1000.

In some non-limiting examples, to reduce power supply demands for a device 1000 without significantly impacting an ability to make an electrode 1020, 1040 substantially transmissive (by employing at least one thin film layer of any combination of TCOs, thin metal films, and/or thin metallic alloy films), an auxiliary electrode 2150, and/or busbar structure 5050 may be formed on the device 1000 to allow current to be carried more effectively to various emissive region(s) of the device 1000, while at the same time, reducing the sheet resistance and its associated IR drop of the transmissive electrode 1020, 1040.

In some non-limiting examples, a sheet resistance specification, for a common electrode 1020, 1040 of an AMOLED display device 1000, may vary according to a number of parameters, including without limitation, a (panel) size of the device 1000, and/or a tolerance for voltage variation across the device 1000. In some non-limiting examples, the sheet resistance specification may increase (that is, a lower sheet resistance is specified) as the panel size increases. In some non-limiting examples, the sheet resistance specification may increase as the tolerance for voltage variation decreases.

In some non-limiting examples, a sheet resistance specification may be used to derive an example thickness of an auxiliary electrode 2150, and/or a busbar 5050 to comply with such specification for various panel sizes. In one non-limiting example, an aperture ratio of 0.64 was assumed for all display panel sizes and a thickness of the auxiliary electrode 2150 for various example panel sizes were calculated for example voltage tolerances of 0.1 V and 0.2 V in Table 1 below.

TABLE 1

Example Auxiliary Electrode Thickness for Various Panel Size and Voltage Tolerances

| | | | | | | |
|---|---|---|---|---|---|---|
| Panel Size (in.) | | 9.7 | 12.9 | 15.4 | 27 | 65 |
| Specified Thickness (nm) | @0.1 V | 132 | 239 | 335 | 1200 | 6500 |
| | @0.2 V | 67 | 117 | 174 | 516 | 2800 |

By way of non-limiting example, for a top-emission device, the second electrode 1040 may be made transmissive. On the other hand, in some non-limiting examples, such auxiliary electrode 2150, and/or busbar 5050 may not be substantially transmissive but may be electrically coupled to the second electrode 1040, including without limitation, by deposition of a conductive deposited layer 330 therebetween, to reduce an effective sheet resistance of the second electrode 1040.

In some non-limiting examples, such auxiliary electrode 2150 may be positioned, and/or shaped in either or both of a lateral aspect, and/or cross-sectional aspect so as not to interfere with the emission of photons from the lateral aspect 1310 of the emissive region 2210 of a (sub-) pixel 1240/244*x*.

In some non-limiting examples, a mechanism to make the first electrode 1020, and/or the second electrode 1040, is to form such electrode 1020, 1040 in a pattern across at least a part of the lateral aspect 1310 of the emissive region(s) 2210 thereof, and/or in some non-limiting examples, across at least a part of the lateral aspect 1320 of the non-emissive region(s) 2220 surrounding them. In some non-limiting examples, such mechanism may be employed to form the auxiliary electrode 2150, and/or busbar 5050 in a position, and/or shape in either or both of a lateral aspect, and/or cross-sectional aspect so as not to interfere with the emission of photons from the lateral aspect 1310 of the emissive region 2210 of a (sub-) pixel 1240/244*x*, as discussed above.

In some non-limiting examples, the device 1000 may be configured such that it is substantially devoid of a conductive oxide material in an optical path of photons emitted by the device 1000. By way of non-limiting example, in the lateral aspect 1310 of at least one emissive region 2210 corresponding to a (sub-) pixel 1240/244*x*, at least one of the layers, and/or coatings deposited after the at least one semiconducting layer 1030, including without limitation, the second electrode 1040, the NIC 310, and/or any other layers, and/or coatings deposited thereon, may be substantially devoid of any conductive oxide material. In some non-limiting examples, being substantially devoid of any conductive oxide material may reduce absorption, and/or reflection of light emitted by the device 1000. By way of non-limiting example, conductive oxide materials, including without limitation, ITO, and/or IZO, may absorb light in at least the B(lue) region of the visible spectrum, which may, in generally, reduce efficiency, and/or performance of the device 1000.

In some non-limiting examples, a combination of these, and/or other mechanisms may be employed.

Additionally, in some non-limiting examples, in addition to rendering one or more of the first electrode 1020, the second electrode 1040, the auxiliary electrode 2150, and/or the busbar 5050, substantially transmissive across at least across a substantial part of the lateral aspect 1310 of the emissive region 2210 corresponding to the (sub-) pixel(s) 1240/244*x* of the device 1000, in order to allow photons to be emitted substantially across the lateral aspect 1310 thereof, it may be desired to make at least one of the lateral aspect(s) 1320 of the surrounding non-emissive region(s) 2220 of the device 1000 substantially transmissive in both the bottom and top directions, so as to render the device 1000 substantially transmissive relative to light incident on an external surface thereof, such that a substantial part such externally-incident light may be transmitted through the device 1000, in addition to the emission (in a top-emission, bottom-emission, and/or double-sided emission) of photons generated internally within the device 1000 as disclosed herein.

Patterning

As a result of the foregoing, there may be an aim to selectively deposit, across the lateral aspect 1310 of the emissive region 2210 of a (sub-) pixel 1240/244*x*, and/or the lateral aspect 1320 of the non-emissive region(s) 2220 surrounding the emissive region 2210, a device feature, including without limitation, at least one of the first electrode 1020, the second electrode 1040, the auxiliary electrode 2150, and/or busbar 5050, and/or a conductive element electrically coupled thereto, in a pattern, on an exposed layer surface 11 of a frontplane 1010 layer of the device 1000. In some non-limiting examples, the first electrode 1020, the second electrode 1040, the auxiliary electrode 2150, and/or the busbar 5050 may be deposited in at least one of a plurality of deposited layers 330.

Figure 14:
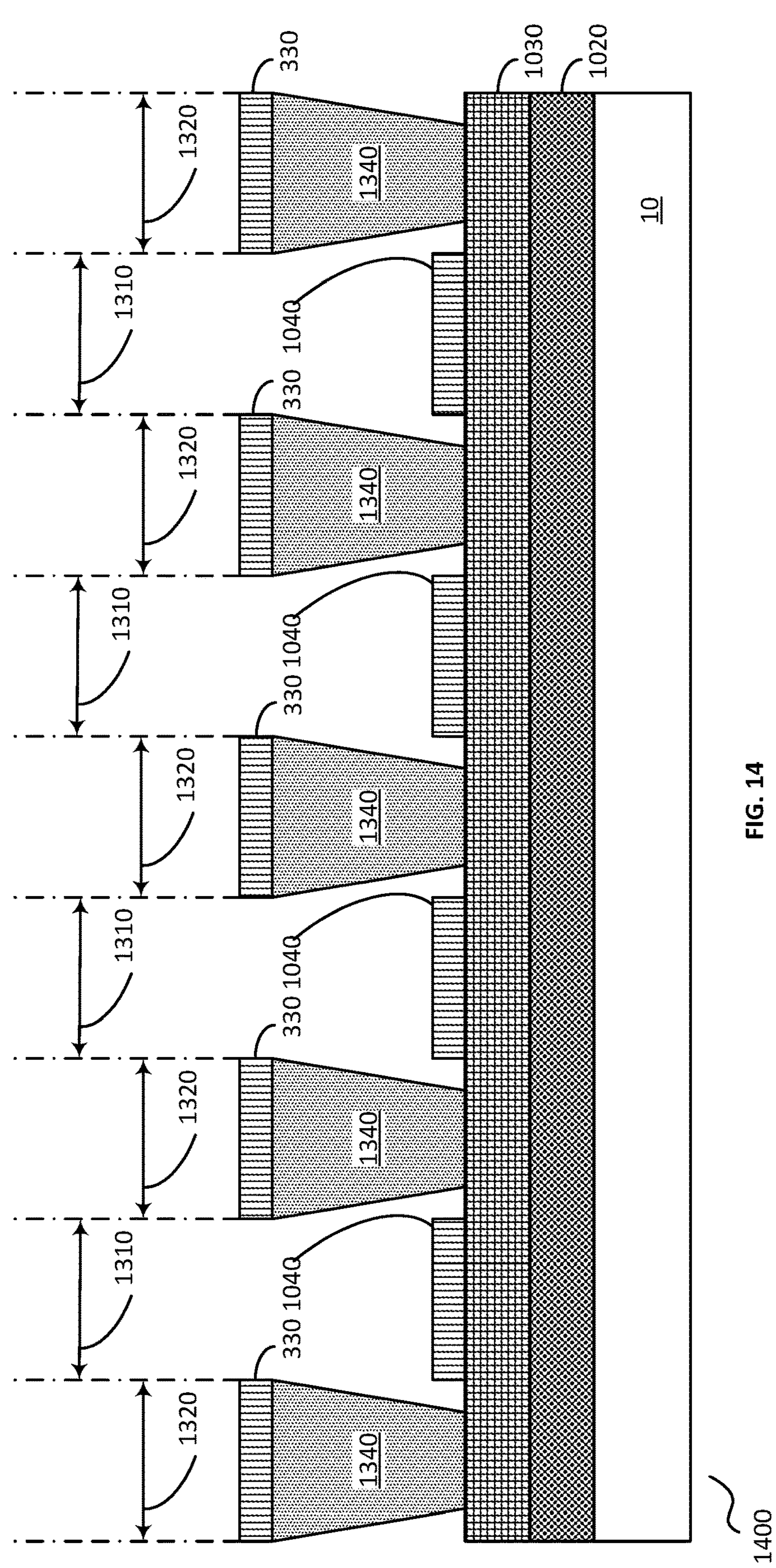
FIG. 14 is a cross-sectional view of an example version of the device of FIG. 10, showing at least one example pixel definition layer (PDL) supporting deposition of at least one second electrode of the device.

FIG. 14 shows an example cross-sectional view of a device 1400 that is substantially similar to the device 1000, but further comprises a plurality of raised PDLs 1340 across the lateral aspect(s) 1320 of non-emissive regions 2220 surrounding the lateral aspect(s) 1310 of emissive region(s) 2210 corresponding to (sub-) pixel(s) 1240/244*x*.

When the deposited layer 330 is deposited, in some non-limiting examples, using an open mask 600, and/or a mask-free deposition process, the deposited layer 330 is deposited across the lateral aspect(s) 1310 of emissive region(s) 2210 corresponding to (sub-) pixel(s) 1240/244*x* to form (in the figure) the second electrode 1040 thereon, and also across the lateral aspect(s) 1320 of non-emissive regions 2220 surrounding them, to form regions of the deposited layer 330 on top of the PDLs 1340. To ensure that each (segment) of the second electrode 1040 is not electrically coupled to any of the at least one conductive deposited layer region(s) 330, a thickness of the PDL(s) 1340 is greater than a thickness of the second electrode(s) 1040. In some non-limiting examples, the PDL(s) 1340 may be provided, as shown in the figure, with an undercut profile to further decrease a likelihood that any (segment) of the second electrode(s) 1040 will be electrically coupled to any of the at least one conductive deposited layer region(s) 330.

In some non-limiting examples, application of a barrier coating 2050 over the device 1400 may result in poor adhesion of the barrier coating 2050 to the device 1400, having regard to the highly non-uniform surface topography of the device 1400.

In some non-limiting examples, there may be an aim to tune optical microcavity effects associated with sub-pixel(s) 244*x* of different colours (and/or wavelengths) by varying a thickness of the at least one semiconducting layer 1030 (and/or a layer thereof) across the lateral aspect 1310 of emissive region(s) 2210 corresponding to sub-pixel(s) 244*x* of one colour relative to the lateral aspect 1310 of emissive region(s) 2210 corresponding to sub-pixel(s) 244*x* of another colour. In some non-limiting examples, the use of FMMs 415 to perform patterning may not provide a precision called for to provide such optical microcavity tuning effects in at least some cases, and/or, in some non-limiting examples, in a production environment for OLED displays 1000.

Figure 15A:
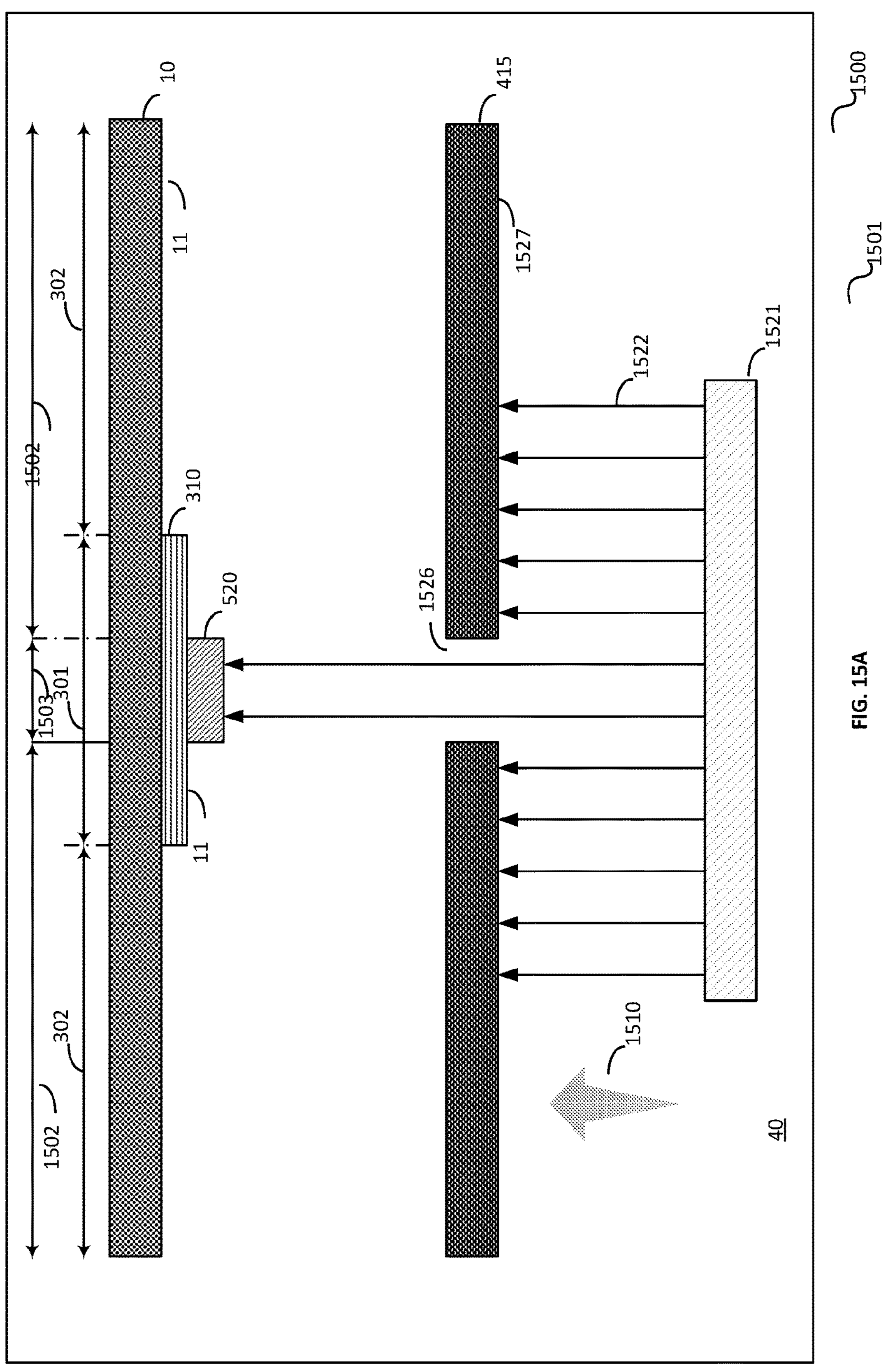
FIG. 15A is a schematic diagram showing an example process for depositing a patterning coating that is an NPC in a pattern on an exposed layer surface that comprises the deposited pattern of the patterning coating of FIG. 3A.

FIG. 15A describes a stage 1501 of a process 1500, in which, once the NIC 310 has been deposited on the first portion 301 of an exposed layer surface 11 of an underlying material (in the figure, the substrate 10), the NPC 520 may be deposited on an NPC portion 1503 of the exposed layer surface 11 of the NIC 310 disposed on the substrate 10 in the first portion 301. In the figure, by way of non-limiting example, the NPC portion 1503 may extend completely within the first portion 301.

In the stage 1501, a quantity of an NPC material 511, is heated under vacuum, to evaporate, and/or sublime 1522 the NPC material 511. In some non-limiting examples, the NPC material 511 comprises entirely, and/or substantially, a material used to form the NPC 520. Evaporated NPC material 1522 is directed through the chamber 40, including in a direction indicated by arrow 1510, toward the exposed layer surface 11 of the first portion 301 and of the NPC portion 1503. When the evaporated NPC material 1522 is incident on the NPC portion 1503 of the exposed layer surface 11, the NPC 520 may be formed thereon.

In some non-limiting examples, deposition of the NPC material 511 may be performed using an open mask 600, and/or a mask-free deposition technique, such that the NPC 520 may be formed substantially across the entire exposed layer surface 11 of the underlying material (which could be, in the figure, the NIC 310 throughout the first portion 301, and/or the substrate 10 through the second portion 302) to produce a treated surface (of the NPC 520).

In some non-limiting examples, as shown in the figure for the stage 1501, the NPC 520 may be selectively deposited only onto a portion, in the example illustrated, the NPC portion 1503, of the exposed layer surface 11 (in the figure, of the NIC 310), by the interposition, between the NPC material 511 and the exposed layer surface 11, of a shadow mask 415, which in some non-limiting examples, may be an FMM. The shadow mask 415 has at least one aperture 1526 extending therethrough such that a part of the evaporated NPC material 1522 passes through the aperture 1526 and is incident on the exposed layer surface 11 (in the figure, by way of non-limiting example, of the NIC 310 within the NPC portion 1503 only) to form the NPC 520. Where the evaporated NPC material 1522 does not pass through the aperture 1526 but is incident on the surface 1527 of the shadow mask 415, it is precluded from being disposed on the exposed layer surface 11 to form the NPC 520. The part 1502 of the exposed layer surface 11 that lies beyond the NPC portion 1503, is thus substantially devoid of the NPC 520. In some non-limiting examples (not shown), the evaporated NPC material 1522 that is incident on the shadow mask 415 may be deposited on the surface 1527 thereof.

While the exposed layer surface 11 of the NIC 310 in the first portion 301 exhibits a relatively low initial sticking probability $S_0$ for the deposited layer 330, in some non-limiting examples, this may not necessarily be the case for the NPC 520, such that the NPC 520 is still selectively deposited on the exposed layer surface 11 (in the figure, of the NIC 310) in the NPC portion 1503.

Accordingly, a patterned surface is produced upon completion of the deposition of the NPC 520.

Figure 15B:
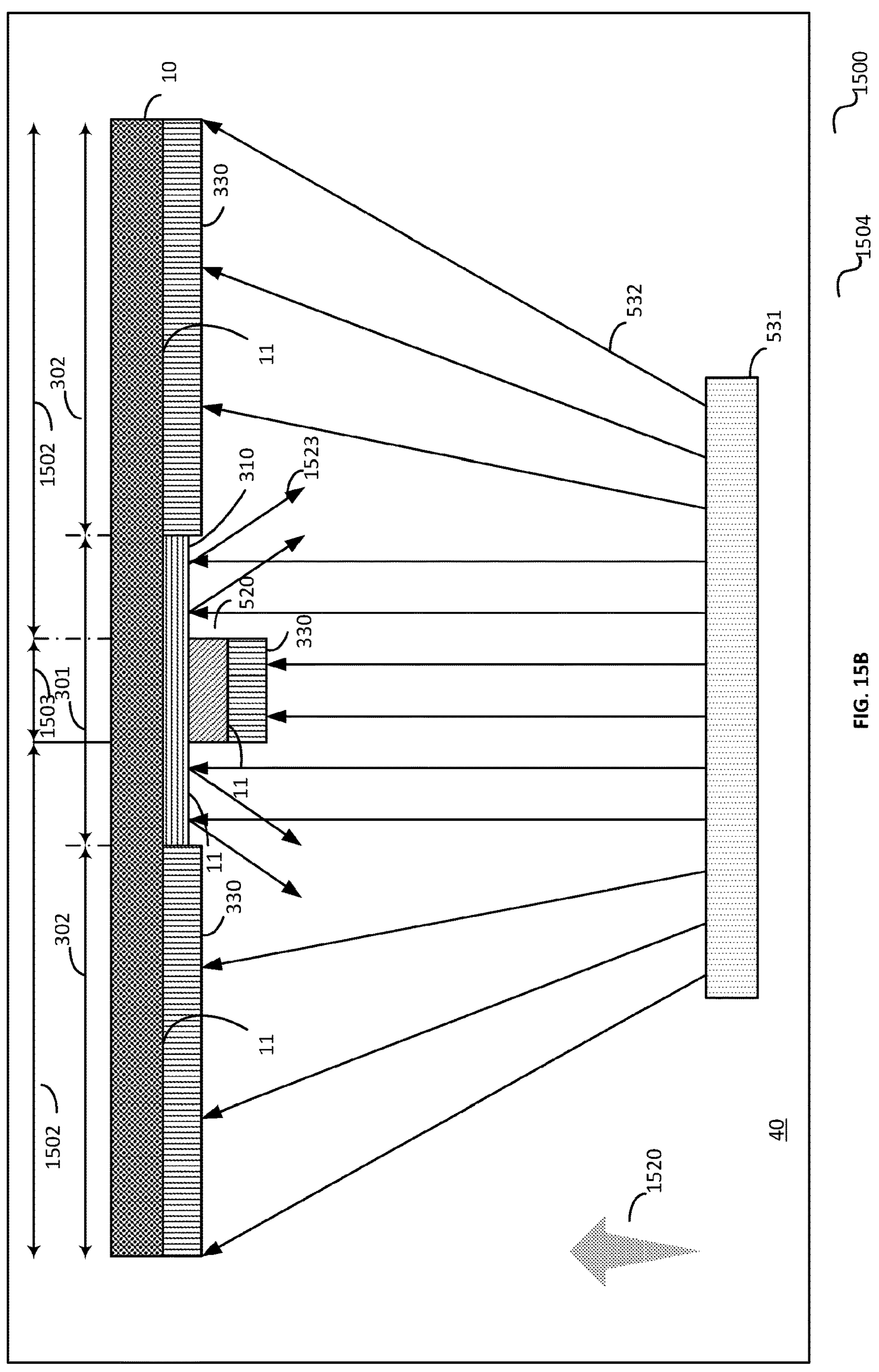
FIG. 15B is a schematic diagram showing an example process for depositing a deposited layer in a pattern on an exposed layer surface that comprises the deposited pattern of the NPC of FIG. 15A.

FIG. 15B describes a stage 1504 of the process 1500, in which, once the NIC 310 has been deposited on the first portion 301 of an exposed layer surface 11 of an underlying material (in the figure, the substrate 10) and the NPC 520 has been deposited on the NPC portion 1503 of the exposed layer surface 11 (in the figure, of the NIC 310), the deposited layer 330 may be deposited on the NPC portion 1503 and the second portion 302 of the exposed layer surface 11 (in the figure, the substrate 10).

In the stage 1504, a quantity of a deposited material 531, is heated under vacuum, to evaporate, and/or sublime 532 the deposited material 531. In some non-limiting examples, the deposited material 531 comprises entirely, and/or substantially, a material used to form the deposited layer 330. Evaporated deposited material 532 is directed through the chamber 40, including in a direction indicated by arrow 1520, toward the exposed layer surface 11 of the first portion 301, of the NPC portion 1503 and of the second portion 302. When the evaporated deposited material 532 is incident on the NPC portion 1503 of the exposed layer surface 11 (of the NPC 520) and on the second portion 302 of the exposed layer surface 11 (of the substrate 10), that is, other than on the exposed layer surface 11 of the NIC 310, the deposited layer 330 may be formed thereon.

In some non-limiting examples, as shown in the figure for the stage 1504, deposition of the deposited layer 330 may be performed using an open mask 600, and/or mask-free deposition process, such that the deposited layer 330 may be formed substantially across the entire exposed layer surface 11 of the underlying material (other than where the underlying material is the NIC 310) to produce a treated surface (of the deposited layer 330).

Indeed, as shown in FIG. 15B, the evaporated deposited material 532 is incident both on an exposed layer surface 11 of NIC 310 across the first portion 301 that lies beyond the NPC portion 1503, as well as the exposed layer surface 11 of the NPC 520 across the NPC portion 1503 and the exposed layer surface 11 of the substrate 10 across the second portion 302 that is substantially devoid of NIC 310.

Since the exposed layer surface 11 of the NIC 310 in the first portion 301 that lies beyond the NPC portion 1503 exhibits a relatively low initial sticking probability $S_0$ for the deposited layer 330 compared to the exposed layer surface 11 of the substrate 10 in the second portion 302, and/or since the exposed layer surface 11 of the NPC 520 in the NPC portion 1503 exhibits a relatively high initial sticking probability $S_0$ for the deposited layer 330 compared to both the exposed layer surface 11 of the NIC 310 in the first portion 301 that lies beyond the NPC portion 1503 and the exposed layer surface 11 of the substrate 10 in the second portion 302, the deposited layer 330 is selectively deposited substantially only on the exposed layer surface 11 of the substrate 10 in the NPC portion 1503 and the second portion 302, both of which are substantially devoid of the NIC 310. By contrast, the evaporated deposited material 532 incident on the exposed layer surface 11 of NIC 310 across the first portion 301 that lies beyond the NPC portion 1503, tends not to be deposited, as shown (1523) and the exposed layer surface 11 of NIC 310 across the first portion 301 that lies beyond the NPC portion 1503 is substantially devoid of the deposited layer 330.

Accordingly, a patterned surface is produced upon completion of the deposition of the deposited layer 330.

Figure 16A:
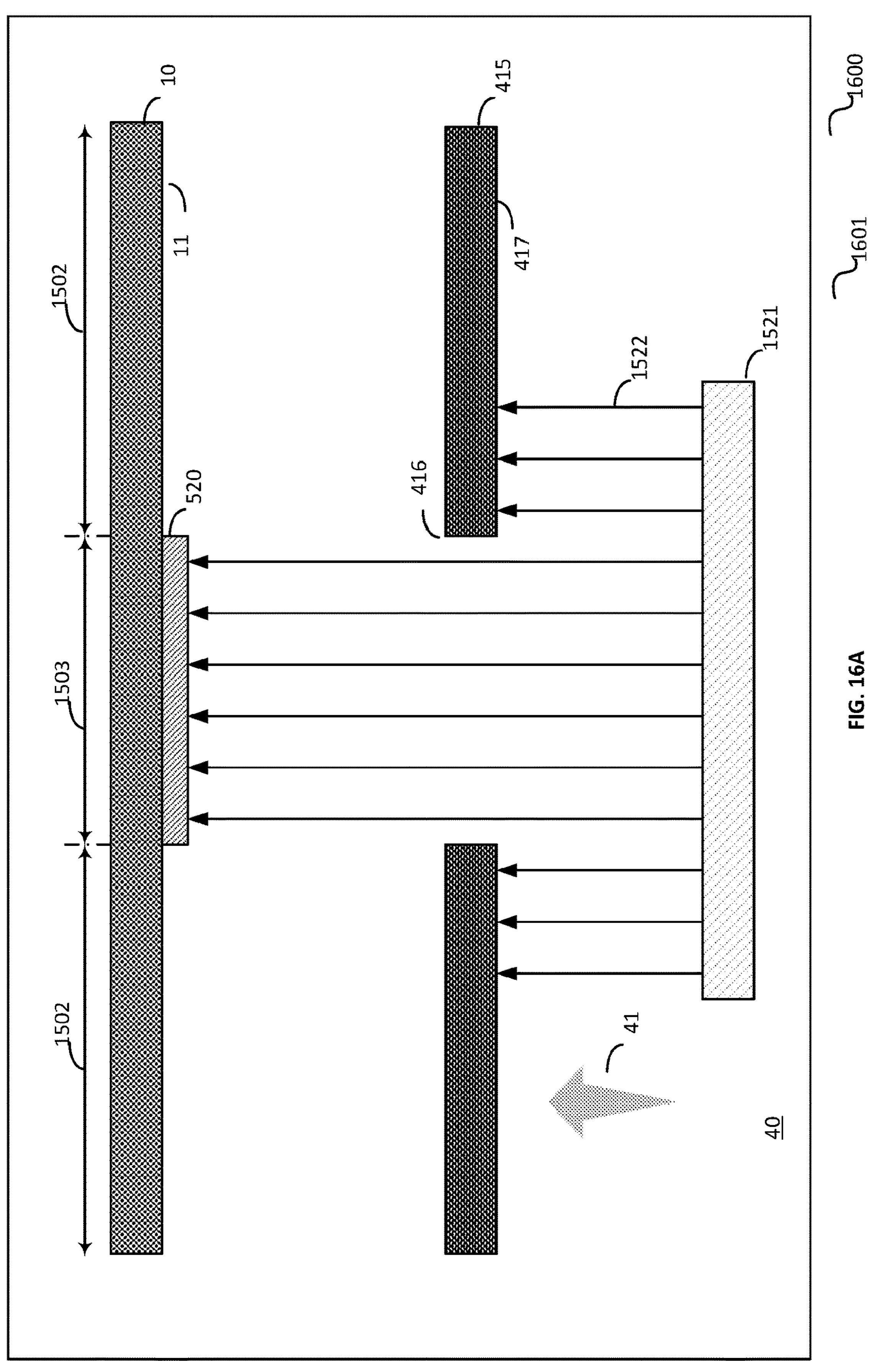
FIG. 16A is a schematic diagram showing an example process for depositing an NPC in a pattern on an exposed layer surface of an underlying material in an example version of the device of FIG. 10, according to an example in the present disclosure.
Figure 16B:
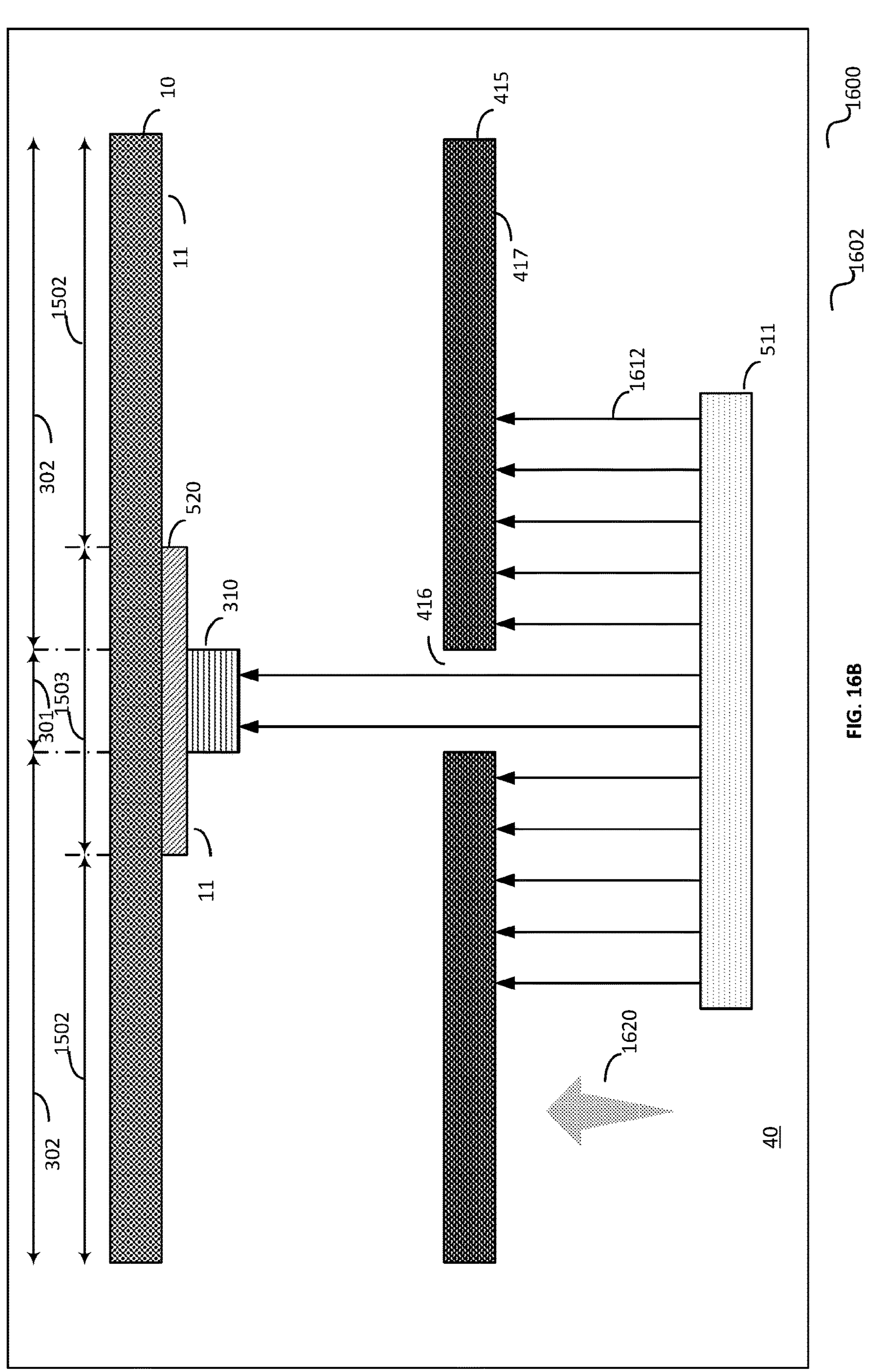
FIG. 16B is a schematic diagram showing an example process of depositing an NIC in a pattern on an exposed layer surface that comprises the deposited pattern of the NPC of FIG. 16A.
Figure 16C:
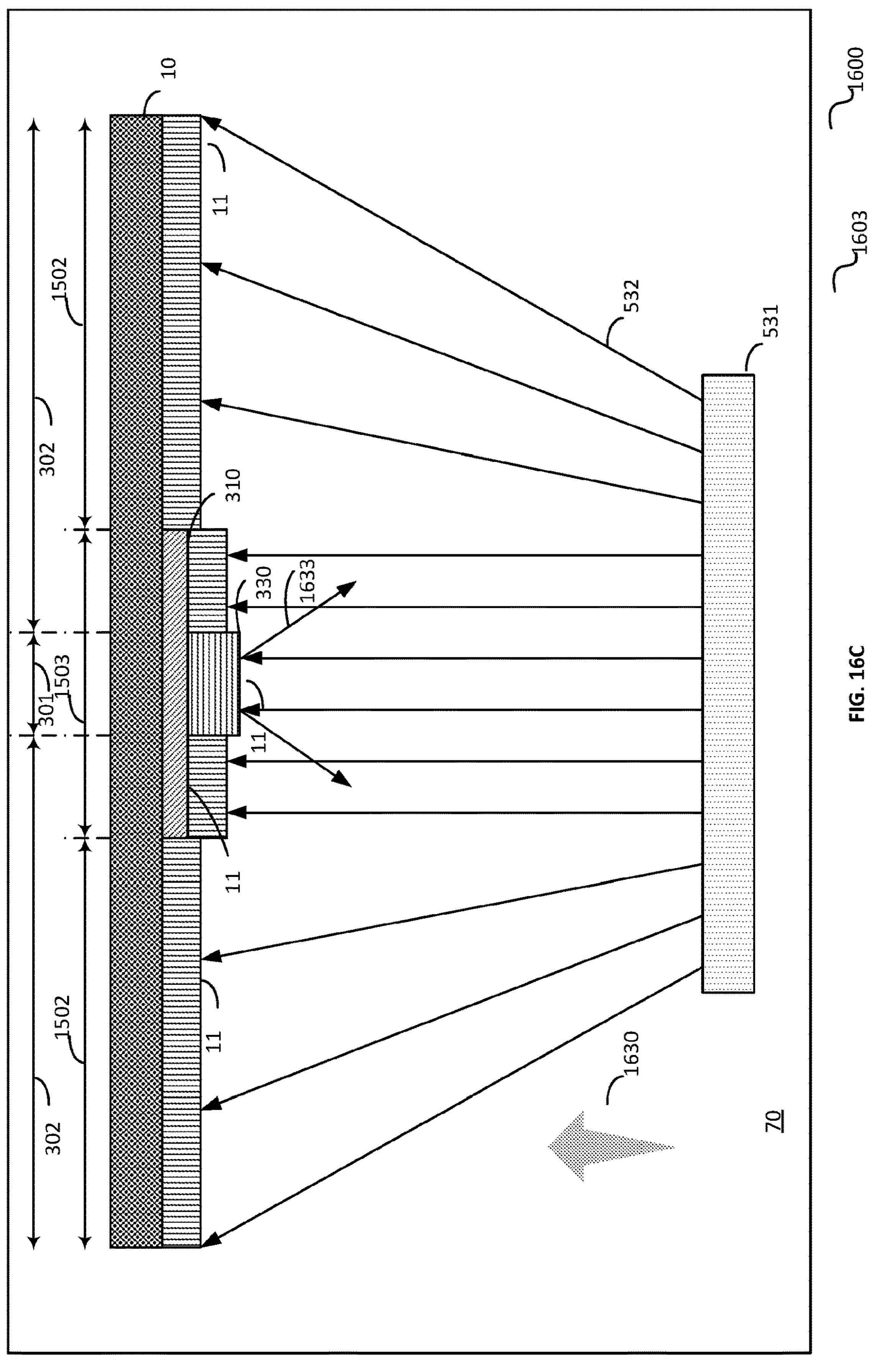
FIG. 16C is a schematic diagram showing an example process for depositing a deposited layer 330 in a pattern on an exposed layer surface that comprises the deposited pattern of the NIC of FIG. 16B.

FIGS. 16A-16C illustrate a non-limiting example of an evaporative process, shown generally at 2000, in a chamber 40, for selectively depositing a deposited layer 330 onto a second portion 302, 1502 (FIG. 16C) of an exposed layer surface 11 of an underlying material.

FIG. 16A describes a stage 1601 of the process 1600, in which, a quantity of an NPC material 511, is heated under vacuum, to evaporate, and/or sublime 1522 the NPC material 511. FIG. 16A is identical to FIG. 4 where the patterning coating 410 is an NPC 520, but with additional annotations of the NPC portion 1503 and the complementary part 1502.

In some non-limiting examples, the NPC material 511 comprises entirely, and/or substantially, a material used to form the NPC 520. Evaporated NPC material 1522 is directed through the chamber 40, including in a direction indicated by arrow 41, toward the exposed layer surface 11 (in the figure, the substrate 10).

In some non-limiting examples, deposition of the NPC material 511 may be performed using an open mask 600, and/or mask-free deposition process, such that the NPC 520 may be formed substantially across the entire exposed layer surface 11 of the underlying material (in the figure, the substrate 10) to produce a treated surface (of the NPC 520).

In some non-limiting examples, as shown in the figure for the stage 1601, the NPC 520 may be selectively deposited only onto a portion, in the example illustrated, the NPC portion 1503, of the exposed layer surface 11, by the interposition, between the NPC material 511 and the exposed layer surface 11, of the shadow mask 415, which in some non-limiting examples, may be an FMM. The shadow mask 415 has at least one aperture 416 extending therethrough such that a part of the evaporated NPC material 1522 passes through the aperture 416 and is incident on the exposed layer surface 11 to form the NPC 520 in the NPC portion 1503. Where the evaporated NPC material 1522 does not pass through the aperture 416 but is incident on the surface 417 of the shadow mask 415, it is precluded from being disposed on the exposed layer surface 11 to form the NPC 520 within the part 1502 of the exposed layer surface 11 that lies beyond the NPC portion 1503. The part 1502 is thus substantially devoid of the NPC 520. In some non-limiting examples (not shown), the NPC material 511 that is incident on the shadow mask 415 may be deposited on the surface 417 thereof.

When the evaporated NPC material 1522 is incident on the exposed layer surface 11, that is, in the NPC portion 1503, the NPC 520 may be formed thereon.

Accordingly, a patterned surface is produced upon completion of the deposition of the NPC 520.

FIG. 16 describes a stage 1602 of a process 1600, in which, once an NPC 520 has been deposited on the NPC portion 1503 of an exposed layer surface 11 of an underlying material (in the figure, the substrate 10), the NIC 310 may be deposited on a first portion 301 of the exposed layer surface 11. In the figure, by way of non-limiting example, the first portion 301 may extend completely within the NPC portion 1503. As a result, in the figure, by way of non-limiting example, the part 1502 comprises part of the exposed layer surface 11 that lies beyond the first portion 301.

In the stage 1602, a quantity of an NIC material 511, is heated under vacuum, to evaporate, and/or sublime 1612 the NIC material 511. In some non-limiting examples, the NIC material 511 comprises entirely, and/or substantially, a material used to form the NIC 310. Evaporated NIC material 1612 is directed through the chamber 40, including in a direction indicated by arrow 1620, toward the exposed layer surface 11 of the first portion 301, of the NPC portion 1503 that may extend beyond the first portion 301 and of the part 1502. When the evaporated NIC material 1612 is incident on the first portion 301 of the exposed layer surface 11, the NIC 310 may be formed thereon.

In some non-limiting examples, deposition of the NIC material 511 may be performed using an open mask 600, and/or mask-free deposition process, such that the NIC 310 may be formed substantially across the entire exposed layer surface 11 of the underlying material to produce a treated surface (of the NIC 310).

In some non-limiting examples, as shown in the figure for the stage 1602, the NIC 310 may be selectively deposited only onto a portion, in the example illustrated, the first portion 301, of the exposed layer surface 11 (in the figure, of the NPC 520), by the interposition, between the NIC material 511 and the exposed layer surface 11, of a shadow mask 415, which in some non-limiting examples, may be an FMM. The shadow mask 415 has at least one aperture 416 extending therethrough such that a part of the evaporated NIC material 1612 passes through the aperture 416 and is incident on the exposed layer surface 11 (in the figure, by way of non-limiting example, of the NPC 520) to form the NIC 310. Where the evaporated NIC material 1612 does not pass through the aperture 416 but is incident on the surface 417 of the shadow mask 415, it is precluded from being disposed on the exposed layer surface 11 to form the NIC 310 within the second portion 302 beyond the first portion 301. The second portion 302 of the exposed layer surface 11 that lies beyond the first portion 301, is thus substantially devoid of the NIC 310. In some non-limiting examples (not shown), the evaporated NIC material 1612 that is incident on the shadow mask 415 may be deposited on the surface 417 thereof.

While the exposed layer surface 11 of the NPC 520 in the NPC portion 1503 exhibits a relatively high initial sticking probability $S_0$ against deposition of the deposited layer 330, in some non-limiting examples, this may not necessarily be the case for the NIC 310. Even so, in some non-limiting examples, the initial sticking probability $S_0$ against deposition of the NIC 310 may be such that the NIC 310 is still selectively deposited on the exposed layer surface 11 (in the figure, of the NPC 520) in the first portion 301.

Accordingly, a patterned surface is produced upon completion of the deposition of the NIC 310.

FIG. 16C describes a stage 1603 of the process 1600, in which, once the NIC 310 has been deposited on the first portion 301 of an exposed layer surface 11 of an underlying material (in the figure, the NPC 520), the deposited layer 330 may be deposited on a second portion 302 of the exposed layer surface 11 (in the figure, of the substrate 10 across the part 1502 beyond the NPC portion 1503 and of the NPC 520 across the NPC portion 1503 beyond the first portion 301). 6 In the stage 1603, a quantity of a deposited material 531, is heated under vacuum, to evaporate, and/or sublime 532 the deposited material 531. In some non-limiting examples, the deposited material 531 comprises entirely, and/or substantially, a material used to form the deposited layer 330. Evaporated deposited material 532 is directed through the chamber 40, including in a direction indicated by arrow 1630, toward the exposed layer surface 11 of the first portion 301, of the NPC portion 1503 and of the part 1502 beyond the NPC portion 1503. When the evaporated deposited material 532 is incident on the NPC portion 1503 of the exposed layer surface 11 (of the NPC 520) beyond the first portion 301 and on the part 1502 beyond the NPC portion 1503 of the exposed layer surface 11 (of the substrate 10), that is, on the second portion 302 other than on the exposed layer surface 11 of the NIC 310, the deposited layer 330 may be formed thereon.

In some non-limiting examples, as shown in the figure for the stage 1603, deposition of the deposited layer 330 may be performed using an open mask 600, and/or mask-free deposition process, such that the deposited layer 330 may be formed substantially across the entire exposed layer surface 11 of the underlying material (other than where the underlying material is the NIC 310) to produce a treated surface (of the deposited layer 330).

Indeed, as shown in FIG. 16C, the evaporated deposited material 532 is incident both on an exposed layer surface 11 of NIC 310 across the first portion 301 that lies within the NPC portion 1503, as well as the exposed layer surface 11 of the NPC 520 across the NPC portion 1503 that lies beyond the first portion 301 and the exposed layer surface 11 of the substrate 10 across the part 1502 that lies beyond the NPC portion 1503.

Since the exposed layer surface 11 of the NIC 310 in the first portion 301 exhibits a relatively low initial sticking probability $S_0$ for the deposited layer 330 compared to the exposed layer surface 11 of the substrate 10 in the second portion 302 that lies beyond the NPC portion 1503, and/or since the exposed layer surface 11 of the NPC 520 in the NPC portion 1503 that lies beyond the first portion 301 exhibits a relatively high initial sticking probability $S_0$ for the deposited layer 330 compared to both the exposed layer surface 11 of the NIC 310 in the first portion 301 and the exposed layer surface 11 of the substrate 10 in the part 1502 that lies beyond the NPC portion 1503, the deposited layer 330 is selectively deposited substantially only on the exposed layer surface 11 of the substrate 10 in the NPC portion 1503 that lies beyond the first portion 301 and on the part 1502 that lies beyond the NPC portion 1503, both of which are substantially devoid of the NIC 310. By contrast, the evaporated deposited material 532 incident on the exposed layer surface 11 of NIC 310 across the first portion 301, tends not to be deposited, as shown (1233) and the exposed layer surface 11 of NIC 310 across the first portion 301 is substantially devoid of the deposited layer 330.

Accordingly, a patterned surface is produced upon completion of the deposition of the deposited layer 330.

In some non-limiting examples, an initial deposition rate of the evaporated deposited material 532 on the exposed layer surface 11 in the second portion 302 may exceed about: 200 times, 550 times, 900 times, 1,000 times, 1,500 times, 1,900 times, or 2,000 times an initial deposition rate of the evaporated deposited material 532 on the exposed layer surface 11 of the NIC 310 in the first portion 301.

Figures 17A, 17B, 17C:
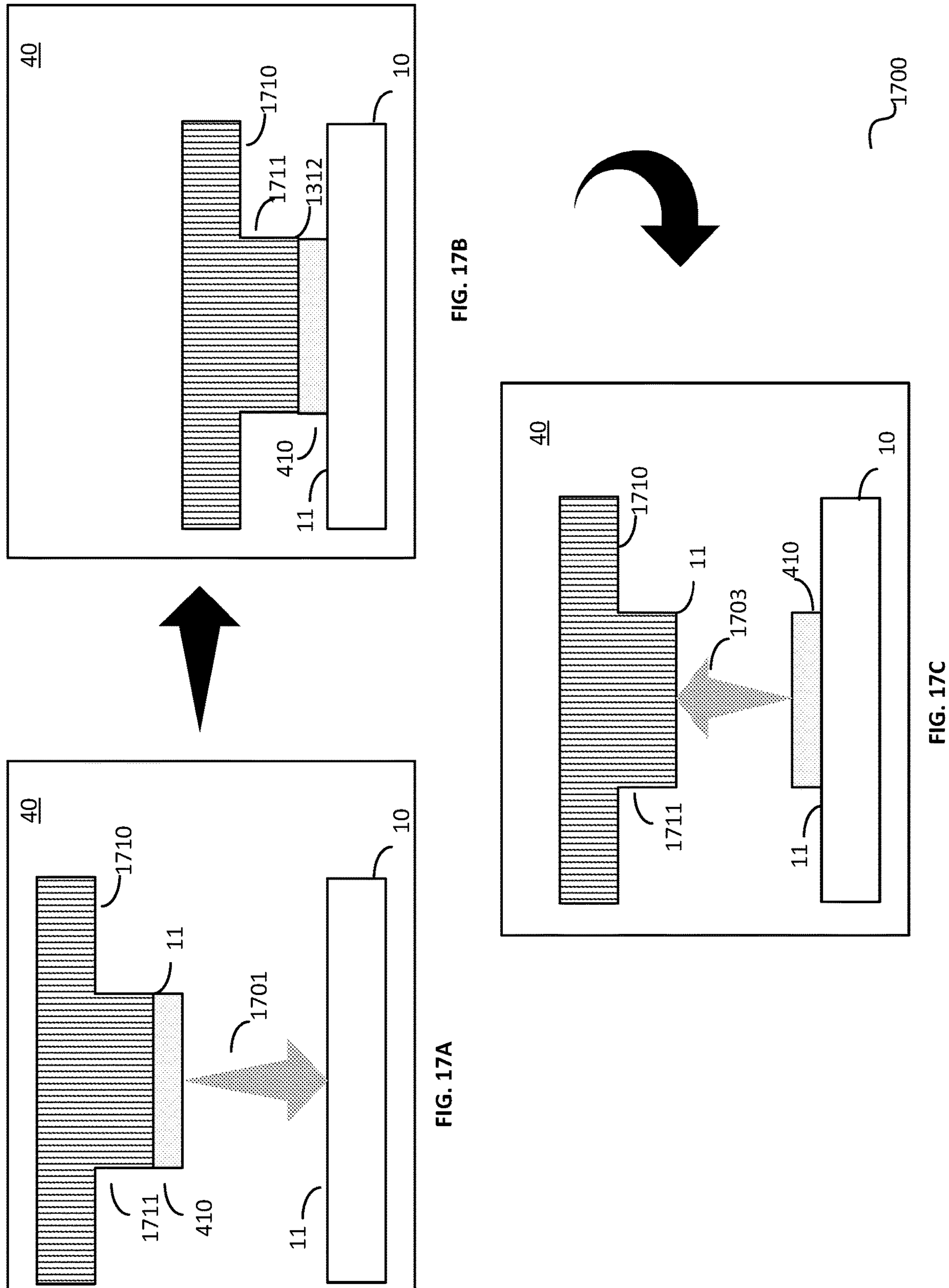
FIGS. 17A-17C are schematic diagrams that show example stages of an example printing process for depositing a selective coating in a pattern on an exposed layer surface in an example version of the device of FIG. 10, according to an example in the present disclosure.

FIGS. 17A-17C illustrate a non-limiting example of a printing process, shown generally at 1700, for selectively depositing a selective coating 410, which in some non-limiting examples may be an NIC 310, or an NPC 520, onto an exposed layer surface 11 of an underlying material (in the figure, for purposes of simplicity of illustration only, the substrate 10).

FIG. 17A describes a stage of the process 1700, in which a stamp 1710 having a protrusion 1711 thereon may be provided with the selective coating 410 on an exposed layer surface 11 of the protrusion 1711. Those having ordinary skill in the relevant art will appreciate that the selective coating 410 may be deposited, and/or deposited on the protrusion surface 11 using a variety of suitable mechanisms.

FIG. 17B describes a stage of the process 1700, in which the stamp 1710 is brought into proximity 1701 with the exposed layer surface 11, such that the selective coating 410 comes into contact with the exposed layer surface 11 and adheres thereto.

FIG. 17C describes a stage of the process 1700, in which the stamp 1710 is moved away 1703 from the exposed layer surface 11, leaving the selective coating 410 deposited on the exposed layer surface 11.

Selective Deposition of a Patterned Electrode

The foregoing may be combined in order to effect the selective deposition of at least one deposited layer 330 to form a patterned electrode 1020, 1040, 2150, and/or a busbar 5050, which may, in some non-limiting examples, may be the second electrode 1040, and/or an auxiliary electrode 2150, without employing an FMM 415 within the high-temperature deposited layer 330 deposition process. In some non-limiting examples, such patterning may permit, and/or enhance the transmissivity of the device 1000.

Figure 18:
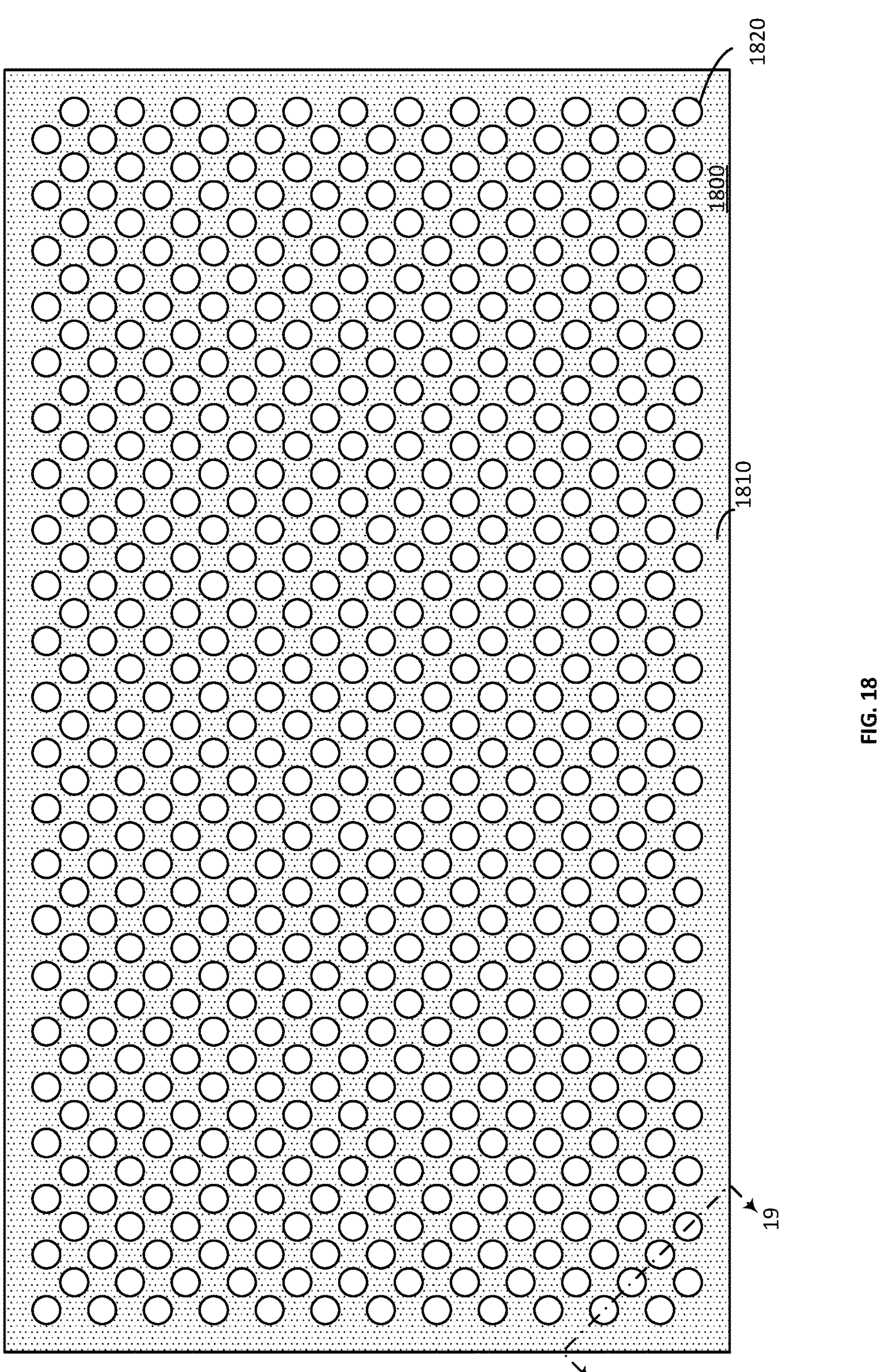
FIG. 18 is a schematic diagram illustrating, in plan view, an example patterned electrode suitable for use in a version of the device of FIG. 10, according to an example in the present disclosure.

FIG. 18 shows an example patterned electrode 1800 in plan view, in the figure, the second electrode 1040 suitable for use in an example version 1900 (FIG. 19) of the device 1000. The electrode 1800 may be formed in a pattern 1810 that comprises a single continuous structure, having or defining a patterned plurality of apertures 1820 therewithin, in which the apertures 1820 correspond to regions of the device 1000 where there is no cathode 1242.

In the figure, by way of non-limiting example, the pattern 1810 is disposed across the entire lateral extent of the device 1900, without differentiation between the lateral aspect(s) 910 of emissive region(s) 2210 corresponding to (sub-) pixel(s) 1240/244*x* and the lateral aspect(s) 920 of non-emissive region(s) 2220 surrounding such emissive region(s) 2210. Thus, the example illustrated may correspond to a device 1900 that is substantially transmissive relative to light incident on an external surface thereof, such that a substantial part of such externally-incident light may be transmitted through the device 1900, in addition to the emission (in a top-emission, bottom-emission, and/or double-sided emission) of photons generated internally within the device 1900 as disclosed herein.

The transmittivity of the device 1900 may be adjusted, and/or modified by altering the pattern 1810 employed, including without limitation, an average size of the apertures 1820, and/or a spacing, and/or density of the apertures 1820.

Figure 19:
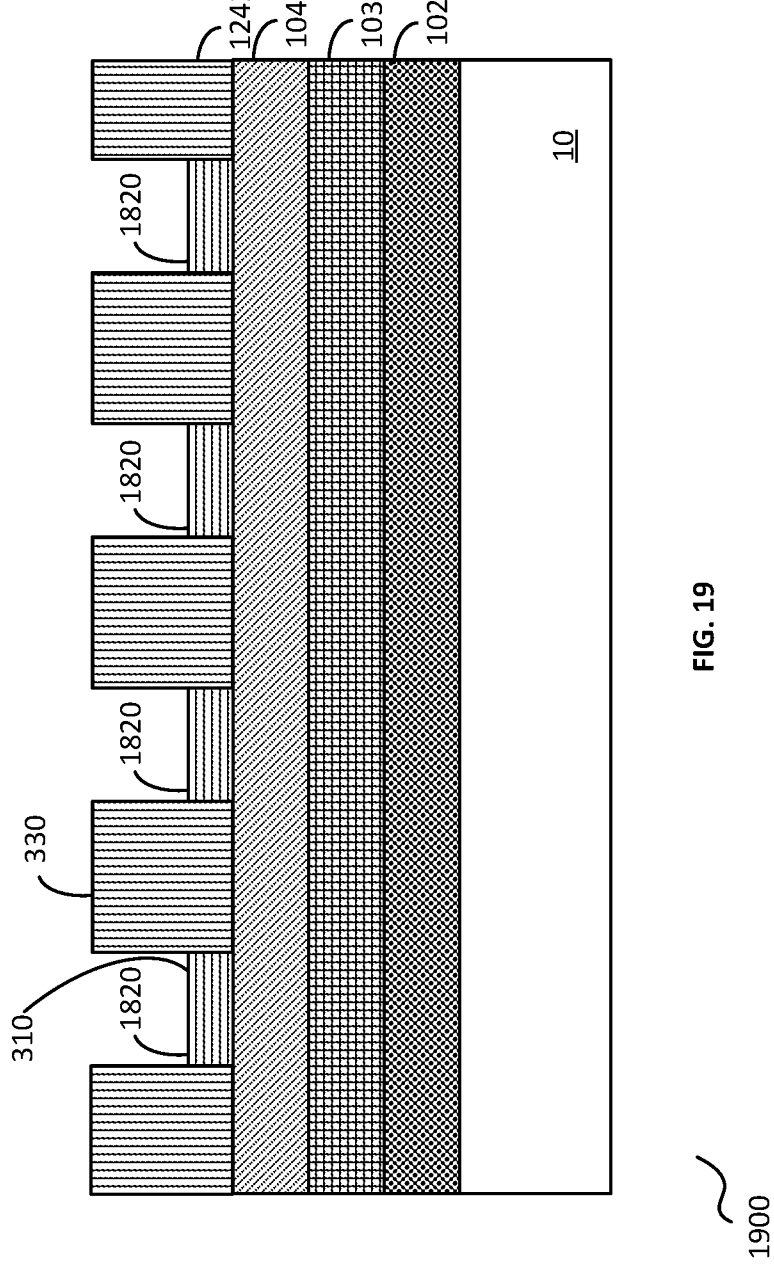
FIG. 19 is a schematic diagram illustrating an example cross-sectional view of the device of FIG. 18 taken along line 19-19.

Turning now to FIG. 19, there is shown a cross-sectional view of the device 1900, taken along line 19-19 in FIG. 18. In the figure, the device 1900 is shown as comprising the substrate 10, the first electrode 1020 and the at least one semiconducting layer 1030. In some non-limiting examples, an NPC 520 is disposed on substantially all of the exposed layer surface 11 of the at least one semiconducting layer 1030. In some non-limiting examples, the NPC 520 could be omitted.

An NIC 310 is selectively disposed in a pattern substantially corresponding to the pattern 1810 on the exposed layer surface 11 of the underlying material, which, as shown in the figure, is the NPC 520 (but, in some non-limiting examples, could be the at least one semiconducting layer 1030 if the NPC 520 has been omitted).

A deposited layer 330 suitable for forming the patterned electrode 1800, which in the figure is the second electrode 1040, is disposed on substantially all of the exposed layer surface 11 of the underlying material, using an open mask 600, and/or a mask-free deposition process, neither of which employs any FMM 415 during the high-temperature deposited layer 330 deposition process. The underlying material comprises both regions of the NIC 310, disposed in the pattern 1810, and regions of NPC 520, in the pattern 1810 where the NIC 310 has not been deposited. In some non-limiting examples, the regions of the NIC 310 may correspond substantially to a first portion 301 comprising the apertures 1820 shown in the pattern 1810.

Because of the nucleation-inhibiting properties of those regions of the pattern 1810 where the NIC 310 was disposed (corresponding to the apertures 1820), the deposited layer 330 disposed on such regions tends not to remain, resulting in a pattern of selective deposition of the deposited layer 330, that corresponds substantially to the remainder of the pattern 1810, leaving those regions of the first portion 301 of the pattern 1810 corresponding to the apertures 1820 substantially devoid of the deposited layer 330.

In other words, the deposited layer 330 that will form the cathode 1242 is selectively deposited substantially only on a second portion 302 comprising those regions of the NPC 520 that surround but do not occupy the apertures 1820 in the pattern 1810.

Figure 20A:
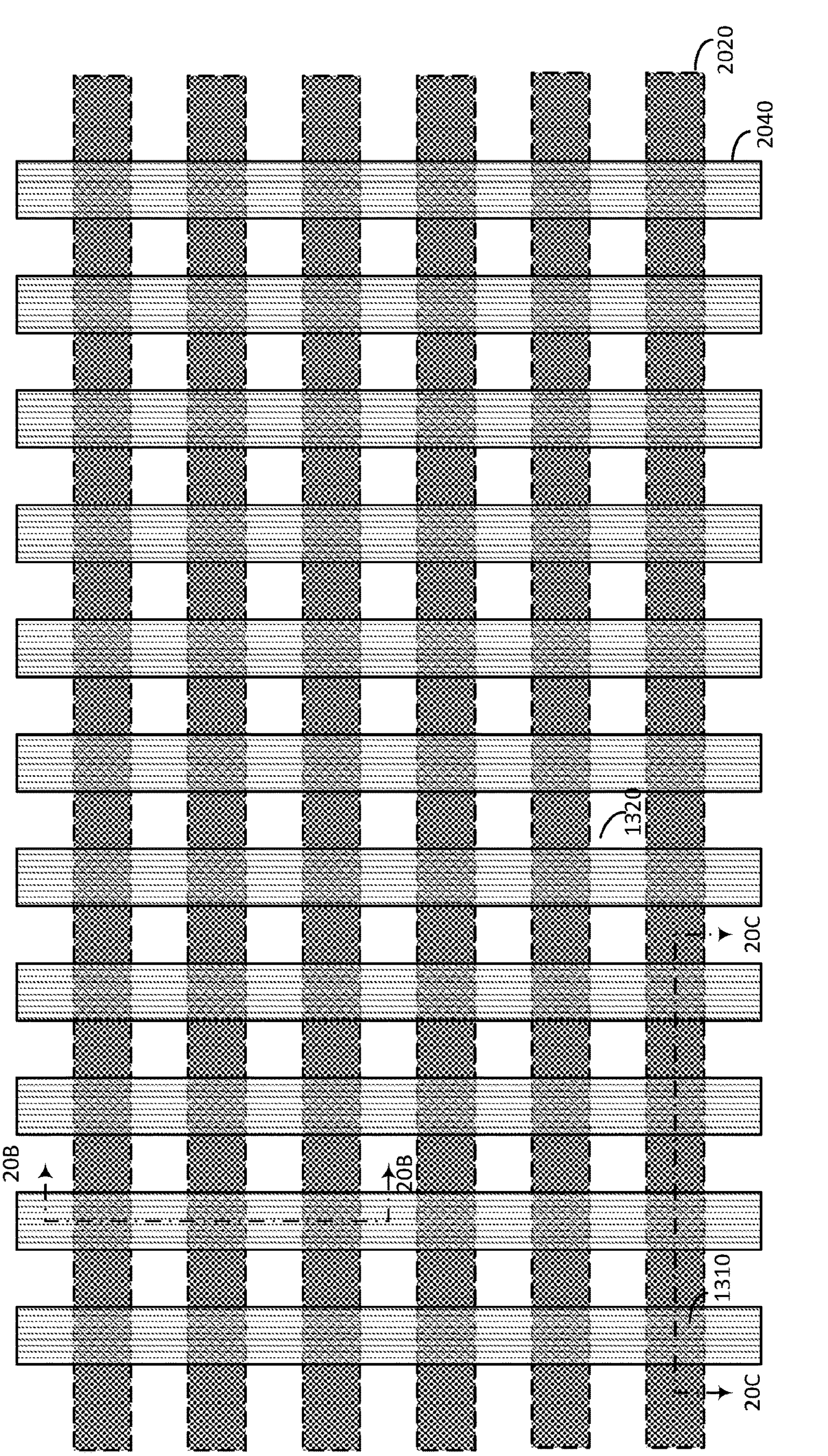
FIG. 20A is a schematic diagram illustrating, in plan view, a plurality of example patterns of electrodes suitable for use in an example version of the device of FIG. 10, according to an example in the present disclosure.

FIG. 20A shows, in plan view, a schematic diagram showing a plurality of patterns 2020, 2040 of electrodes 1020, 1040, 2150.

In some non-limiting examples, the first pattern 1620 comprises a plurality of elongated, spaced-apart regions that extend in a first lateral direction. In some non-limiting examples, the first pattern 1620 may comprise a plurality of first electrodes 1020. In some non-limiting examples, a plurality of the regions that comprise the first pattern 1620 may be electrically coupled.

In some non-limiting examples, the second pattern 2040 comprises a plurality of elongated, spaced-apart regions that extend in a second lateral direction. In some non-limiting examples, the second lateral direction may be substantially normal to the first lateral direction. In some non-limiting examples, the second pattern 2040 may comprise a plurality of second electrodes 1040. In some non-limiting examples, a plurality of the regions that comprise the second pattern 2040 may be electrically coupled.

In some non-limiting examples, the first pattern 1620 and the second pattern 2040 may form part of an example version, shown generally at 2000 (FIG. 20C) of the device 1000, which may comprise a plurality of PMOLED elements.

In some non-limiting examples, the lateral aspect(s) 1310 of emissive region(s) 3010 corresponding to (sub-) pixel(s) 1240/244*x* are formed where the first pattern 1620 overlaps the second pattern 2040. In some non-limiting examples, the lateral aspect(s) 1320 of non-emissive region 2220 correspond to any lateral aspect other than the lateral aspect(s) 1310.

In some non-limiting examples, a first terminal, which, in some non-limiting examples, may be a positive terminal, of the power source 1005, is electrically coupled to at least one electrode 1020, 1040, 2150 of the first pattern 1620. In some non-limiting examples, the first terminal is coupled to the at least one electrode 1020, 1040, 2150 of the first pattern 1620 through at least one driving circuit 1200. In some non-limiting examples, a second terminal, which, in some non-limiting examples, may be a negative terminal, of the power source 1005, is electrically coupled to at least one electrode 1020, 1040, 2150 of the second pattern 2040. In some non-limiting examples, the second terminal is coupled to the at least one electrode 1020, 1040, 2150 of the second pattern 1740 through the at least one driving circuit 1200.

Figure 20B:
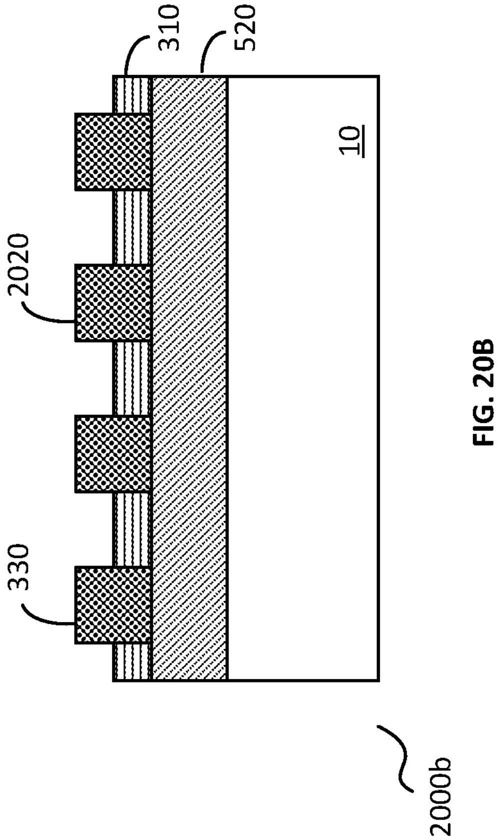
FIG. 20B is a schematic diagram illustrating an example cross-sectional view, at an intermediate stage, of the device of FIG. 20A taken along line 20B-20B.

Turning now to FIG. 20B, there is shown a cross-sectional view of the device 2000, at a deposition stage 2000*b*, taken along line 20B-20B in FIG. A. In the figure, the device 2000 at the stage 2000*b* is shown as comprising the substrate 10. In some non-limiting examples, an NPC 520 is disposed on the exposed layer surface 11 of the substrate 10. In some non-limiting examples, the NPC 520 could be omitted.

An NIC 310 is selectively disposed in a pattern substantially corresponding to the inverse of the first pattern 1620 on the exposed layer surface 11 of the underlying material, which, as shown in the figure, is the NPC 520.

A deposited layer 330 suitable for forming the first pattern 1620 of electrodes 1020, 1040, 2150, which in the figure is the first electrode 1020, is disposed on substantially all of the exposed layer surface 11 of the underlying material, using an open mask 600, and/or a mask-free deposition process, neither of which employs any FMM 415 during the high-temperature deposited layer 330 deposition process. The underlying material comprises both regions of the NIC 310, disposed in the inverse of the first pattern 1620, and regions of NPC 520, disposed in the first pattern 1620 where the NIC 310 has not been deposited. In some non-limiting examples, the regions of the NPC 520 may correspond substantially to the elongated spaced-apart regions of the first pattern 1620, while the regions of the NIC 310 may correspond substantially to a first portion comprising the gaps therebetween.

Because of the nucleation-inhibiting properties of those regions of the first pattern 1620 where the NIC 310 was disposed (corresponding to the gaps therebetween), the deposited layer 330 disposed on such regions tends not to remain, resulting in a pattern of selective deposition of the deposited layer 330, that corresponds substantially to elongated spaced-apart regions of the first pattern 1620, leaving a first portion 301 comprising the gaps therebetween substantially devoid of a closed coating 340 of the deposited layer 330.

In other words, the deposited layer 330 that will form the first pattern 1620 of electrodes 1020, 1040, 2150 is selectively deposited substantially only on a second portion 302 comprising those regions of the NPC 520 (or in some non-limiting examples, the substrate 10 if the NPC 520 has been omitted), that define the elongated spaced-apart regions of the first pattern 1620.

Figure 20C:
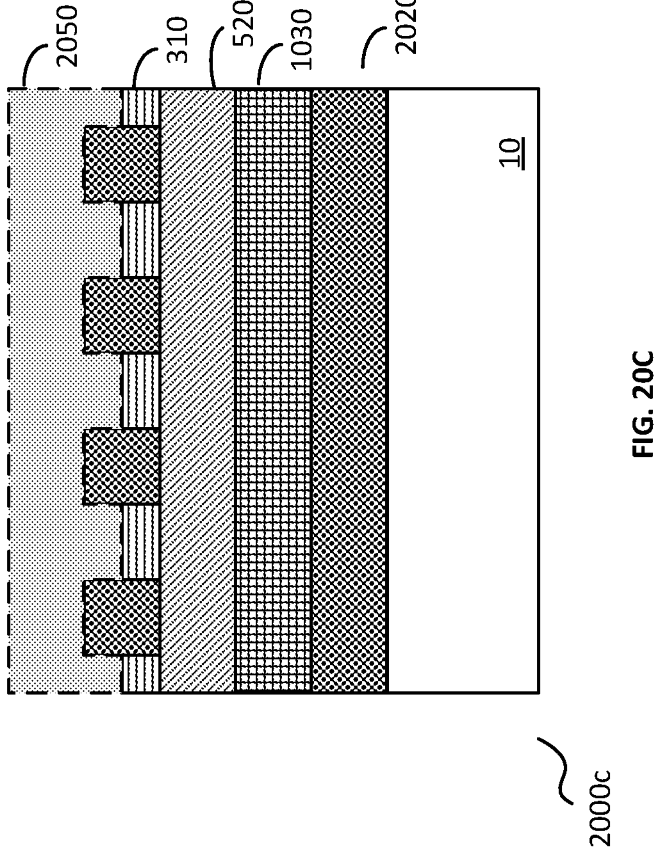
FIG. 20C is a schematic diagram illustrating an example cross-sectional view of the device of FIG. 20A taken along line 20C-20C.

Turning now to FIG. 20C, there is shown a cross-sectional view 2000*c* of the device 2000, taken along line 20C-20C in FIG. 2-A. In the figure, the device 2000 is shown as comprising the substrate 10; the first pattern 1620 of electrodes 1020 deposited as shown in FIG. 20B, and the at least one semiconducting layer(s) 1030.

In some non-limiting examples, the at least one semiconducting layer(s) 1030 may be provided as a common layer across substantially all of the lateral aspect(s) of the device 2000.

In some non-limiting examples, an NPC 520 is disposed on substantially all of the exposed layer surface 11 of the at least one semiconducting layer 1030. In some non-limiting examples, the NPC 520 could be omitted.

An NIC 310 is selectively disposed in a pattern substantially corresponding to the second pattern 2040 on the exposed layer surface 11 of the underlying material, which, as shown in the figure, is the NPC 520 (but, in some non-limiting examples, could be the at least one semiconducting layer 1030 if the NPC 520 has been omitted).

A deposited layer 330 suitable for forming the second pattern 2040 of electrodes 1020, 1040, 2150, which in the figure is the second electrode 1040, is disposed on substantially all of the exposed layer surface 11 of the underlying material, using an open mask 600, and/or a mask-free deposition process, neither of which employs any FMM 415 during the high-temperature deposited layer 330 deposition process. The underlying material comprises both regions of the NIC 310, disposed in the inverse of the second pattern 2040, and regions of NPC 520, in the second pattern 2040 where the NIC 310 has not been deposited. In some non-limiting examples, the regions of the NPC 520 may correspond substantially to a first portion 301 comprising the elongated spaced-apart regions of the second pattern 2040, while the regions of the NIC 310 may correspond substantially to the gaps therebetween.

Because of the nucleation-inhibiting properties of those regions of the second pattern 2040 where the NIC 310 was disposed (corresponding to the gaps therebetween), the deposited layer 330 disposed on such regions tends not to remain, resulting in a pattern of selective deposition of the deposited layer 330, that corresponds substantially to elongated spaced-apart regions of the second pattern 2040, leaving the first portion 301 comprising the gaps therebetween substantially devoid of a closed coating 340 of the deposited layer 330.

In other words, the deposited layer 330 that will form the second pattern 2040 of electrodes 1020, 1040, 2150 is selectively deposited substantially only on a second portion 302 comprising those regions of the NPC 520 that define the elongated spaced-apart regions of the second pattern 2040.

In some non-limiting examples, a thickness of the NIC 310 and of the deposited layer 330 deposited thereafter for forming either or both of the first pattern 1620, and/or the second pattern 2040 of electrodes 1020, 1040, 2150 may be varied according to a variety of parameters, including without limitation, a desired application and desired performance characteristics. In some non-limiting examples, the thickness of the NIC 310 may be comparable to, and/or substantially less than a thickness of the deposited layer 330 deposited thereafter. Use of a relatively thin NIC 310 to achieve selective patterning of a deposited layer 330 deposited thereafter may be suitable to provide flexible devices 1000, including without limitation, PMOLED devices. In some non-limiting examples, a relatively thin NIC 310 may provide a relatively planar surface on which the barrier coating 2050 may be deposited. In some non-limiting examples, providing such a relatively planar surface for application of the barrier coating 2050 may increase adhesion of the barrier coating 2050 to such surface.

At least one of the first pattern 1620 of electrodes 1020, 1040, 2150 and at least one of the second pattern 2040 of electrodes 1020, 1040, 2150 may be electrically coupled to the power source 1005, whether directly, and/or, in some non-limiting examples, through their respective driving circuit(s) 1200 to control photon emission from the lateral aspect(s) 1310 of the emissive region(s) 3010 corresponding to (sub-) pixel(s) 1240/244*x*.

Those having ordinary skill in the relevant art will appreciate that the process of forming the second electrode 1040 in the second pattern 2040 shown in FIGS. 20A-20C may, in some non-limiting examples, be used in similar fashion to form an auxiliary electrode 2150 for the device 2000. In some non-limiting examples, the second electrode 1040 thereof may comprise a common electrode, and the auxiliary electrode 2150 may be deposited in the second pattern 2040, in some non-limiting examples, above or in some non-limiting examples below, the second electrode 1040 and electrically coupled thereto. In some non-limiting examples, the second pattern 2040 for such auxiliary electrode 2150 may be such that the elongated spaced-apart regions of the second pattern 2040 lie substantially within the lateral aspect(s) 1320 of non-emissive region(s) 3020 surrounding the lateral aspect(s) 1310 of emissive region(s) 3010 corresponding to (sub-) pixel(s) 1240/244*x*. In some non-limiting examples, the second pattern 2040 for such auxiliary electrodes 2150 may be such that the elongated spaced-apart regions of the second pattern 2040 lie substantially within the lateral aspect(s) 1310 of emissive region(s) 3010 corresponding to (sub-) pixel(s) 1240/244*x*, and/or the lateral aspect(s) 1320 of non-emissive region(s) 3020 surrounding them.

Figure 21:
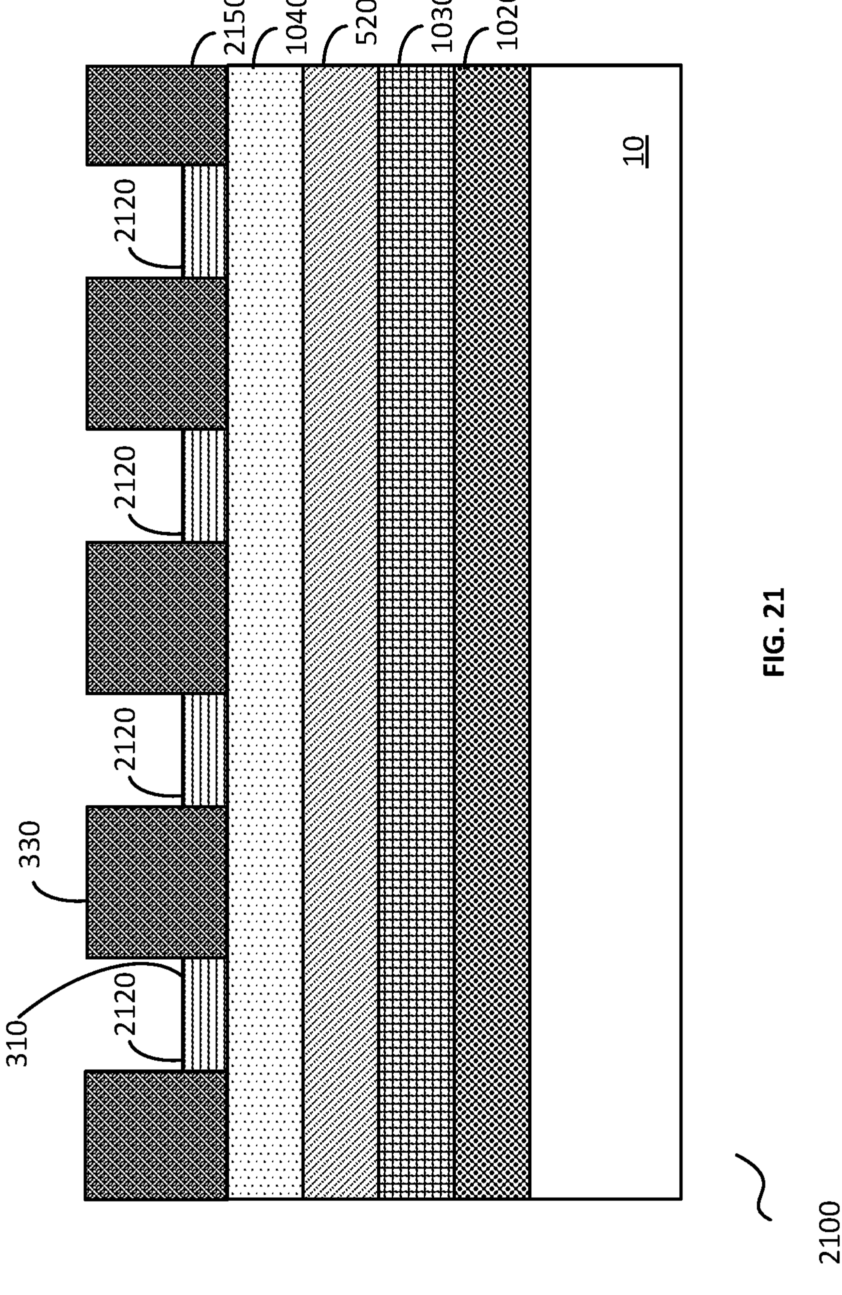
FIG. 21 is a schematic diagram illustrating a cross-sectional view of an example version of the device of FIG. 10, having an example patterned auxiliary electrode according to an example in the present disclosure.

FIG. 21 shows an example cross-sectional view of an example version 2100 of the device 1000 that is substantially similar thereto, but further comprises at least one auxiliary electrode 2150 disposed in a pattern above and electrically coupled (not shown) with the second electrode 1040.

The auxiliary electrode 2150 is electrically conductive. In some non-limiting examples, the auxiliary electrode 2150 may be formed by at least one metal, and/or metal oxide. Non-limiting examples of such metals include Cu, Al, molybdenum (Mo), or Ag. By way of non-limiting examples, the auxiliary electrode 2150 may comprise a multi-layer metallic structure, including without limitation, one formed by Mo/Al/Mo. Non-limiting examples of such metal oxides include ITO, ZnO, IZO, or other oxides containing In, or Zn. In some non-limiting examples, the auxiliary electrode 2150 may comprise a multi-layer structure formed by a combination of at least one metal and at least one metal oxide, including without limitation, Ag/ITO, Mo/ITO, ITO/Ag/ITO, or ITO/Mo/ITO. In some non-limiting examples, the auxiliary electrode 2150 comprises a plurality of such electrically conductive materials.

The device 2100 is shown as comprising the substrate 10, the first electrode 1020 and the at least one semiconducting layer 1030.

In some non-limiting examples, an NPC 520 is disposed on substantially all of the exposed layer surface 11 of the at least one semiconducting layer 1030. In some non-limiting examples, the NPC 520 could be omitted.

The second electrode 1040 is disposed on substantially all of the exposed layer surface 11 of the NPC 520 (or the at least one semiconducting layer 1030, if the NPC 520 has been omitted).

In some non-limiting examples, particularly in a top-emission device 2100, the second electrode 1040 may be formed by depositing a relatively thin conductive film layer (not shown) in order, by way of non-limiting example, to reduce optical interference (including, without limitation, attenuation, reflections, and/or diffusion) related to the presence of the second electrode 1040. In some non-limiting examples, as discussed elsewhere, a reduced thickness of the second electrode 1040, may generally increase a sheet resistance of the second electrode 1040, which may, in some non-limiting examples, reduce the performance, and/or efficiency of the device 2100. By providing the auxiliary electrode 2150 that is electrically coupled to the second electrode 1040, the sheet resistance and thus, the IR drop associated with the second electrode 1040, may, in some non-limiting examples, be decreased.

In some non-limiting examples, the device 2100 may be a bottom-emission, and/or double-sided emission device 2100. In such examples, the second electrode 1040 may be formed as a relatively thick conductive layer without substantially affecting optical characteristics of such a device 2100. Nevertheless, even in such scenarios, the second electrode 1040 may nevertheless be formed as a relatively thin conductive film layer (not shown), by way of non-limiting example, so that the device 2100 may be substantially transmissive relative to light incident on an external surface thereof, such that a substantial part such externally-incident light may be transmitted through the device 2100, in addition to the emission of photons generated internally within the device 2100 as disclosed herein.

An NIC 310 is selectively disposed in a pattern on the exposed layer surface 11 of the underlying material, which, as shown in the figure, is the NPC 520. In some non-limiting examples, as shown in the figure, the NIC 310 may be disposed, in a first portion of the pattern, as a series of parallel rows 2120.

A deposited layer 330 suitable for forming the patterned auxiliary electrode 2150, is disposed on substantially all of the exposed layer surface 11 of the underlying material, using an open mask 600, and/or a mask-free deposition process, neither of which employs any FMM 415 during the high-temperature deposited layer 330 deposition process. The underlying material comprises both regions of the NIC 310, disposed in the pattern of rows 2120, and regions of NPC 520 where the NIC 310 has not been deposited.

Because of the nucleation-inhibiting properties of those rows 2120 where the NIC 310 was disposed, the deposited layer 330 disposed on such rows 2120 tends not to remain, resulting in a pattern of selective deposition of the deposited layer 330, that corresponds substantially to at least one second portion 302 of the pattern, leaving the first portion 301 comprising the rows 2120 substantially devoid of a closed coating 340 of the deposited layer 330.

In other words, the deposited layer 330 that will form the auxiliary electrode 2150 is selectively deposited substantially only on a second portion 302 comprising those regions of the NPC 520, that surround but do not occupy the rows 2120.

In some non-limiting examples, selectively depositing the auxiliary electrode 2150 to cover only certain rows 2120 of the lateral aspect of the device 2100, while other regions thereof remain uncovered, may control, and/or reduce optical interference related to the presence of the auxiliary electrode 2150.

In some non-limiting examples, the auxiliary electrode 2150 may be selectively deposited in a pattern that is not readily detected by the naked eye from a typical viewing distance.

In some non-limiting examples, the auxiliary electrode 2150 may be formed in devices other than OLED devices, including for decreasing an effective resistance of the electrodes of such devices.

Auxiliary Electrode

The ability to pattern electrodes 1020, 1040, 2150, 5050 including without limitation, the second electrode 1040, and/or the auxiliary electrode 2150 without employing FMMs 415 during the high-temperature deposited layer 330 deposition process by employing a selective coating 410, including without limitation, the process depicted in FIG. 21, allows numerous configurations of auxiliary electrodes 2150 to be deployed.

Figures 22A, 22B, 22C, 22D:
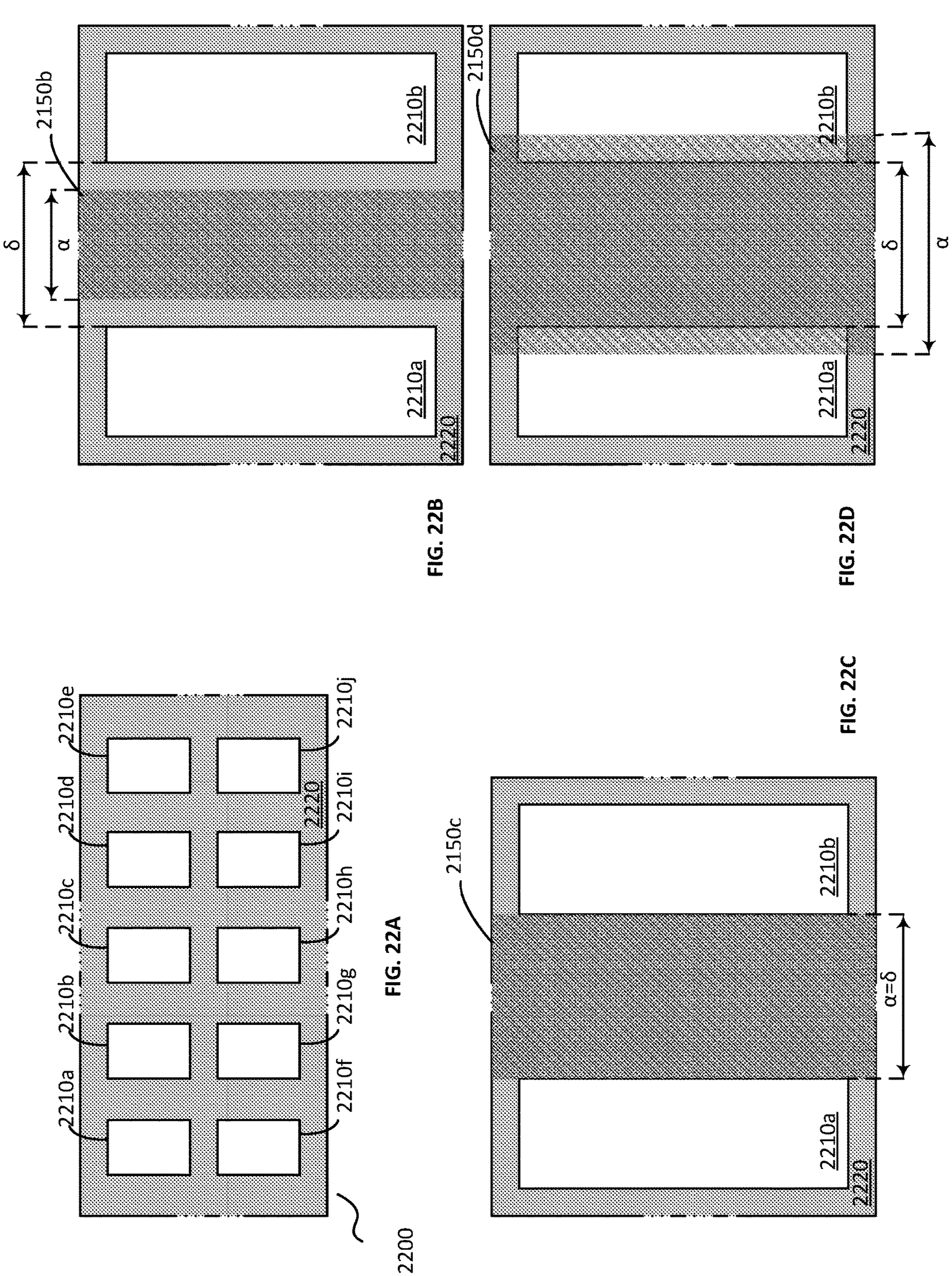
FIG. 22A is a schematic diagram illustrating, in plan view, an example arrangement of emissive region(s), and/or non-emissive region(s) in an example version of the device of FIG. 10, according to an example in the present disclosure.
FIGS. 22B-22D are schematic diagrams each illustrating a segment of a part of FIG. 22A, showing an example auxiliary electrode overlaying a non-emissive region according to an example in the present disclosure.

FIG. 22A shows, in plan view, a part of an example version 2200 of the device 1000 having a plurality of emissive regions 2210*a*-2210*j* and at least one non-emissive region 2220 surrounding them. In some non-limiting examples, the device 2200 may be an AMOLED device in which each of the emissive regions 2210*a*-2210*j* corresponds to a (sub-) pixel 1240/244*x* thereof.

FIGS. 22B-22D show examples of a part of the device 2200 corresponding to neighbouring emissive regions 2210*a* and 2210*b* thereof and a part of the at least one non-emissive region 2220 therebetween, in conjunction with different configurations 2150*b*-2150*d* of an auxiliary electrode 2150 overlaid thereon. In some non-limiting examples, while not expressly illustrated in FIGS. 22B-22D, the second electrode 1040 of the device 2200, is understood to substantially cover at least both emissive regions 2210*a* and 2210*b* thereof and the part of the at least one non-emissive region 2220 therebetween.

In FIG. 22B, the auxiliary electrode configuration 2150*b* is disposed between the two neighbouring emissive regions 2210*a* and 2210*b* and electrically coupled to the second electrode 1040. In this example, a width α of the auxiliary electrode configuration 2150*b* is less than a separation distance δ between the neighbouring emissive regions 2210*a* and 2210*b*. As a result, there exists a gap within the at least one non-emissive region 2220 on each side of the auxiliary electrode configuration 2150*b*. In some non-limiting examples, such an arrangement may reduce a likelihood that the auxiliary electrode configuration 2150*b* would interfere with an optical output of the device 2200, in some non-limiting examples, from at least one of the emissive regions 2210*a* and 2210*b*. In some non-limiting examples, such an arrangement may be appropriate where the auxiliary electrode configuration 2150*b* is relatively thick (in some non-limiting examples, greater than several hundred nm, and/or on the order of a few microns in thickness). In some non-limiting examples, an aspect ratio of the auxiliary electrode configuration 2150*b* may exceed about 0.05, such as about at least: 0.1, 0.2, 0.5, 0.8, 1, or 2. By way of non-limiting example, a height (thickness) of the auxiliary electrode configuration 2150*b* may exceed about 50 nm, such as at least about: 80 nm, 100 nm, 200 nm, 500 nm, 700 nm, 1000 nm, 1500 nm, 1700 nm, or 2000 nm.

In FIG. 22C, the auxiliary electrode configuration 2150*c* is disposed between the two neighbouring emissive regions 2210*a* and 2210*b* and electrically coupled to the second electrode 1040. In this example, the width α of the auxiliary electrode configuration 2150*c* is substantially the same as the separation distance δ between the neighbouring emissive regions 2210*a* and 2210*b*. As a result, there is no gap within the at least one non-emissive region 2220 on either side of the auxiliary electrode configuration 2150*c*. In some non-limiting examples, such an arrangement may be appropriate where the separation distance δ between the neighbouring emissive regions 2210*a* and 2210*b* is relatively small, by way of non-limiting example, in a high pixel density device 2200.

In FIG. 22D, the auxiliary electrode 2150*d* is disposed between the two neighbouring emissive regions 2210*a* and 2210*b* and electrically coupled to the second electrode 1040. In this example, the width α of the auxiliary electrode configuration 2150*d* is greater than the separation distance δ between the neighbouring emissive regions 2210*a* and 2210*b*. As a result, a part of the auxiliary electrode configuration 2150*d* overlaps a part of at least one of the neighbouring emissive regions 2210*a*, and/or 2210*b*. While the figure shows that the extent of overlap of the auxiliary electrode configuration 2150*d* with each of the neighbouring emissive regions 2210*a* and 2210*b*, in some non-limiting examples, the extent of overlap, and/or in some non-limiting examples, a profile of overlap between the auxiliary electrode configuration 2150*d* and at least one of the neighbouring emissive regions 2210*a* and 2210*b* may be varied, and/or modulated.

Figure 23:
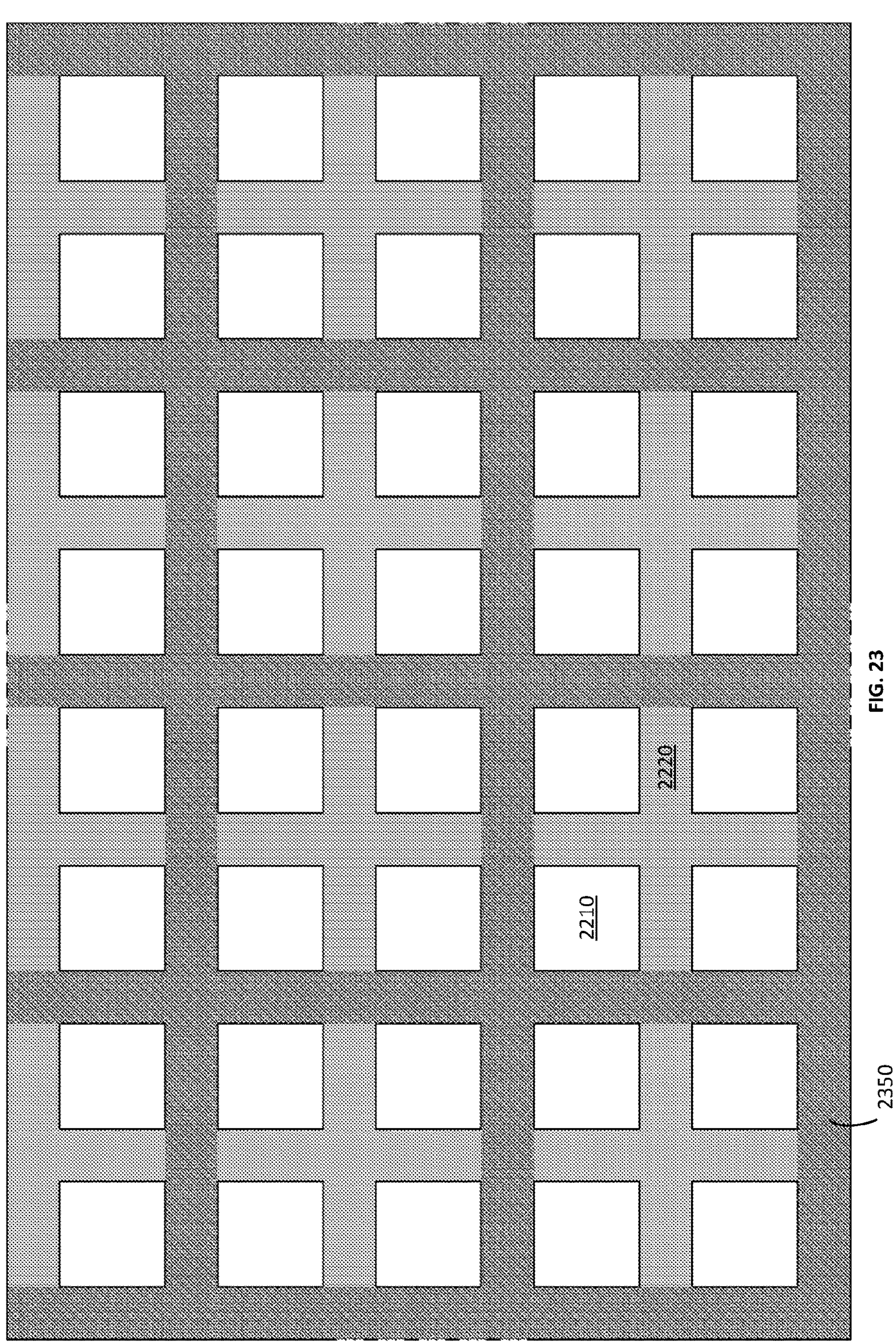
FIG. 23 is a schematic diagram illustrating, in plan view an example pattern of an auxiliary electrode overlaying at least one emissive region and at least one non-emissive region according to an example in the present disclosure.

FIG. 23 shows, in plan view, a schematic diagram showing an example of a pattern 2350 of the auxiliary electrode 2150 formed as a grid that is overlaid over both the lateral aspects 910 of emissive regions 2210, which may correspond to (sub-) pixel(s) 1240/244*x* of an example version 2300 of device 1000, and the lateral aspects 920 of non-emissive regions 2220 surrounding the emissive regions 2210.

In some non-limiting examples, the auxiliary electrode pattern 2350 may extend substantially only over some but not all of the lateral aspects 920 of non-emissive regions 2220, so as not to substantially cover any of the lateral aspects 910 of the emissive regions 2210.

Those having ordinary skill in the relevant art will appreciate that while, in the figure, the auxiliary electrode pattern 2350 is shown as being formed as a continuous structure such that all elements thereof are both physically connected and electrically coupled with one another and electrically coupled to at least one electrode 1020, 1040, 2150, and/or busbar 5050, which in some non-limiting examples may be the first electrode 1020, and/or the second electrode 1040, in some non-limiting examples, the auxiliary electrode pattern 2350 may be provided as a plurality of discrete elements of the auxiliary electrode pattern 2350 that, while remaining electrically coupled to one another, are not physically connected to one another. Even so, such discrete elements of the auxiliary electrode pattern 2350 may still substantially lower a sheet resistance of the at least one electrode 1020, 1040, 2150, and/or busbar 5050 with which they are electrically coupled, and consequently of the device 2300, so as to increase an efficiency of the device 2300 without substantially interfering with its optical characteristics.

In some non-limiting examples, auxiliary electrodes 2150 may be employed in devices 1000 with a variety of arrangements of (sub-) pixel(s) 1240/244*x*. In some non-limiting examples, the (sub-) pixel 1240/244*x* arrangement may be substantially diamond-shaped.

Figure 24A:
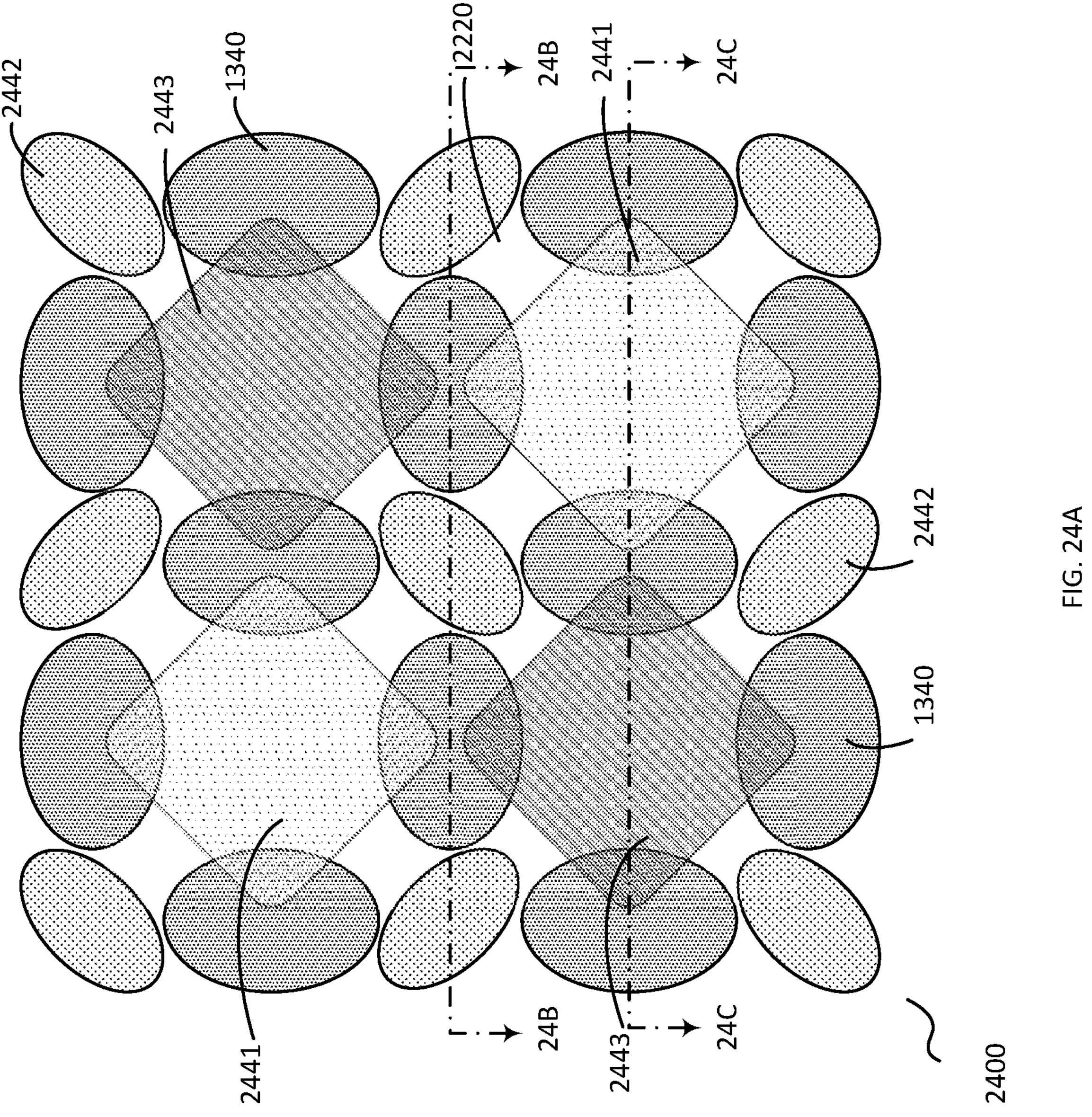
FIG. 24A is a schematic diagram illustrating, in plan view, an example pattern of an example version of the device of FIG. 10, having a plurality of groups of emissive regions in a diamond configuration according to an example in the present disclosure.

By way of non-limiting example, FIG. 24A shows, in plan view, in an example version 2400 of device 1000, a plurality of groups 2441-2443 of emissive regions 2210 each corresponding to a sub-pixel 244*x*, surrounded by the lateral aspects of a plurality of non-emissive regions 2220 comprising PDLs 1340 in a diamond configuration. In some non-limiting examples, the configuration is defined by patterns 2441-2443 of emissive regions 2210 and PDLs 1340 in an alternating pattern of first and second rows.

In some non-limiting examples, the lateral aspects 1320 of the non-emissive regions 2220 comprising PDLs 1340 may be substantially elliptically-shaped. In some non-limiting examples, the major axes of the lateral aspects 1320 of the non-emissive regions 2220 in the first row are aligned and substantially normal to the major axes of the lateral aspects 1320 of the non-emissive regions 2220 in the second row. In some non-limiting examples, the major axes of the lateral aspects 1320 of the non-emissive regions 2220 in the first row are substantially parallel to an axis of the first row.

In some non-limiting examples, a first group 2441 of emissive regions 2210 correspond to sub-pixels 244*x* that emit light at a first wavelength, in some non-limiting examples the sub-pixels 244*x* of the first group 2441 may correspond to R(ed) sub-pixels 2441. In some non-limiting examples, the lateral aspects 1310 of the emissive regions 2210 of the first group 2441 may have a substantially diamond-shaped configuration. In some non-limiting examples, the emissive regions 2210 of the first group 2441 lie in the pattern of the first row, preceded and followed by PDLs 1340. In some non-limiting examples, the lateral aspects 1310 of the emissive regions 2210 of the first group 2441 slightly overlap the lateral aspects 1320 of the preceding and following non-emissive regions 2220 comprising PDLs 1340 in the same row, as well as of the lateral aspects 1320 of adjacent non-emissive regions 2220 comprising PDLs 1340 in a preceding and following pattern of the second row.

In some non-limiting examples, a second group 2442 of emissive regions 2210 correspond to sub-pixels 244*x* that emit light at a second wavelength, in some non-limiting examples the sub-pixels 244*x* of the second group 2442 may correspond to G(reen) sub-pixels 2442. In some non-limiting examples, the lateral aspects 1310 of the emissive regions 2210 of the second group 2441 may have a substantially elliptical configuration. In some non-limiting examples, the emissive regions 2210 of the second group 2441 lie in the pattern of the second row, preceded and followed by PDLs 1340. In some non-limiting examples, the major axis of some of the lateral aspects 1310 of the emissive regions 2210 of the second group 2441 may be at a first angle, which in some non-limiting examples, may be 45° relative to an axis of the second row. In some non-limiting examples, the major axis of others of the lateral aspects 1310 of the emissive regions 2210 of the second group 2441 may be at a second angle, which in some non-limiting examples may be substantially normal to the first angle. In some non-limiting examples, the emissive regions 2210 of the first group 2441, whose lateral aspects 1310 have a major axis at the first angle, alternate with the emissive regions 2210 of the first group 2441, whose lateral aspects 1310 have a major axis at the second angle.

In some non-limiting examples, a third group 2443 of emissive regions 2210 correspond to sub-pixels 244*x* that emit light at a third wavelength, in some non-limiting examples the sub-pixels 244*x* of the third group 2443 may correspond t4 B(lue) sub-pixels 2443. In some non-limiting examples, the lateral aspects 1310 of the emissive regions 2210 of the third group 2443 may have a substantially diamond-shaped configuration. In some non-limiting examples, the emissive regions 2210 of the third group 2443 lie in the pattern of the first row, preceded and followed by PDLs 1340. In some non-limiting examples, the lateral aspects 1310 of the emissive regions 2210 of the third group 2443 slightly overlap the lateral aspects 1310 of the preceding and following non-emissive regions 2220 comprising PDLs 1340 in the same row, as well as of the lateral aspects 1320 of adjacent non-emissive regions 2220 comprising PDLs 1340 in a preceding and following pattern of the second row. In some non-limiting examples, the pattern of the second row comprises emissive regions 2210 of the first group 2441 alternating emissive regions 2210 of the third group 2443, each preceded and followed by PDLs 1340.

Figures 24B, 24C:
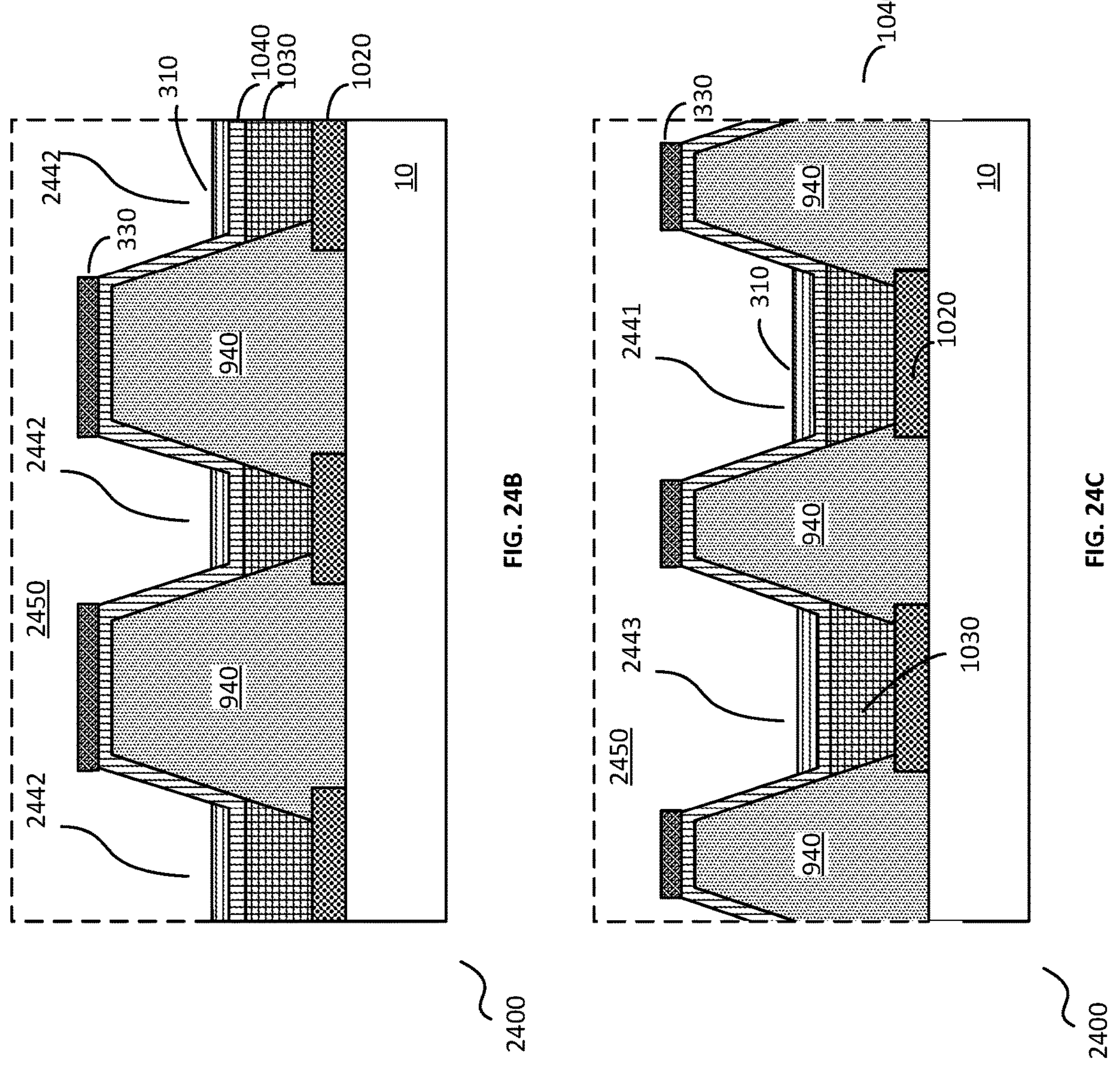
FIG. 24B is a schematic diagram illustrating an example cross-sectional view of the device of FIG. 24A taken along line 24B-24B.
FIG. 24C is a schematic diagram illustrating an, example cross-sectional view of the device of FIG. 24A taken along line 24C-24C.

Turning now to FIG. 24B, there is shown an example cross-sectional view of the device 2400, taken along line 24B-24B in FIG. 24A. In the figure, the device 2400 is shown as comprising a substrate 10 and a plurality of elements of a first electrode 1020, formed on an exposed layer surface 11 thereof. The substrate 10 may comprise the base substrate 1012 (not shown for purposes of simplicity of illustration), and/or at least one TFT structure 1100, corresponding to and for driving each sub-pixel 244*x*. PDLs 1340 are formed over the substrate 10 between elements of the first electrode 1020, to define emissive region(s) 2210 over each element of the first electrode 1020, separated by non-emissive region(s) 2220 comprising the PDL(s) 1340. In the figure, the emissive region(s) 2210 all correspond to the second group 2442.

In some non-limiting examples, at least one semiconducting layer 1030 is deposited on each element of the first electrode 1020, between the surrounding PDLs 1340.

In some non-limiting examples, a second electrode 1040, which in some non-limiting examples, may be a common cathode 1242, may be deposited over the emissive region(s) 2210 of the second group 2442 to form the G(reen) sub-pixel(s) 2442 thereof and over the surrounding PDLs 1340.

In some non-limiting examples, an NIC 310 is selectively deposited over the second electrode 1040 across the lateral aspects 1310 of the emissive region(s) 2210 of the second group 2442 of G(reen) sub-pixels 2442 to allow selective deposition of a deposited layer 330 over parts of the second electrode 1040 that is substantially devoid of the NIC 310, namely across the lateral aspects 1320 of the non-emissive region(s) 2220 comprising the PDLs 1340. In some non-limiting examples, the deposited layer 330 may tend to accumulate along the substantially planar parts of the PDLs 1340, as the deposited layer 330 may not tend to remain on the inclined parts of the PDLs 1340, but tends to descend to a base of such inclined parts, which are coated with the NIC 310. In some non-limiting examples, the deposited layer 330 on the substantially planar parts of the PDLs 1340 may form at least one auxiliary electrode 2150 that may be electrically coupled to the second electrode 1040.

In some non-limiting examples, the device 2400 may comprise a CPL, and/or an outcoupling layer. By way of non-limiting example, such CPL, and/or outcoupling layer may be provided directly on a surface of the second electrode 1040, and/or a surface of the NIC 310. In some non-limiting examples, such CPL, and/or outcoupling layer may be provided across the lateral aspect 1310 of at least one emissive region 2210 corresponding to a (sub-) pixel 1240/244*x*.

In some non-limiting examples, the NIC 310 may also act as an index-matching coating. In some non-limiting examples, the NIC 310 may also act as an outcoupling layer.

In some non-limiting examples, the device 2400 comprises an encapsulation layer. Non-limiting examples of such encapsulation layer include a glass cap, a barrier film, a barrier adhesive, and/or a TFE layer 2450 such as shown in dashed outline in the figure, provided to encapsulate the device 2400. In some non-limiting examples, the TFE layer 2450 may be considered a type of barrier coating 2050.

In some non-limiting examples, the encapsulation layer may be arranged above at least one of the second electrode 1040, and/or the NIC 310. In some non-limiting example, the device 2400 comprises additional optical, and/or structural layers, coatings and components, including without limitation, a polarizer, a color filter, an anti-reflection coating, an anti-glare coating, cover glass, and/or an optically-clear adhesive (OCA).

Turning now to FIG. 24C, there is shown an example cross-sectional view of the device 2400, taken along line 24C-24C in FIG. 24A. In the figure, the device 2400 is shown as comprising a substrate 10 and a plurality of elements of a first electrode 1020, formed on an exposed layer surface 11 thereof. PDLs 1340 are formed over the substrate 10 between elements of the first electrode 1020, to define emissive region(s) 2210 over each element of the first electrode 1020, separated by non-emissive region(s) 2220 comprising the PDL(s) 1340. In the figure, the emissive region(s) 2210 correspond to the first group 2441 and to the third group 2443 in alternating fashion.

In some non-limiting examples, at least one semiconducting layer 1030 is deposited on each element of the first electrode 1020, between the surrounding PDLs 1340.

In some non-limiting examples, a second electrode 1040, which in some non-limiting examples, may be a common cathode 1242, may be deposited over the emissive region(s) 2210 of the first group 2441 to form the R(ed) sub-pixel(s) 2441 thereof, over the emissive region(s) 2210 of the third group 2443 to form the B(lue) sub-pixel(s) 2443 thereof, and over the surrounding PDLs 1340.

In some non-limiting examples, an NIC 310 is selectively deposited over the second electrode 1040 across the lateral aspects 1310 of the emissive region(s) 2210 of the first group 2441 of R(ed) sub-pixels 2441 and of the third group 2443 of B(lue) sub-pixels 2443 to allow selective deposition of a deposited layer 330 over parts of the second electrode 1040 that is substantially devoid of the NIC 310, namely across the lateral aspects 1320 of the non-emissive region(s) 2220 comprising the PDLs 1340. In some non-limiting examples, the deposited layer 330 may tend to accumulate along the substantially planar parts of the PDLs 1340, as the deposited layer 330 may not tend to remain on the inclined parts of the PDLs 1340, but tends to descend to a base of such inclined parts, which are coated with the NIC 310. In some non-limiting examples, the deposited layer 330 on the substantially planar parts of the PDLs 1340 may form at least one auxiliary electrode 2150 that may be electrically coupled to the second electrode 1040.

Figure 25:
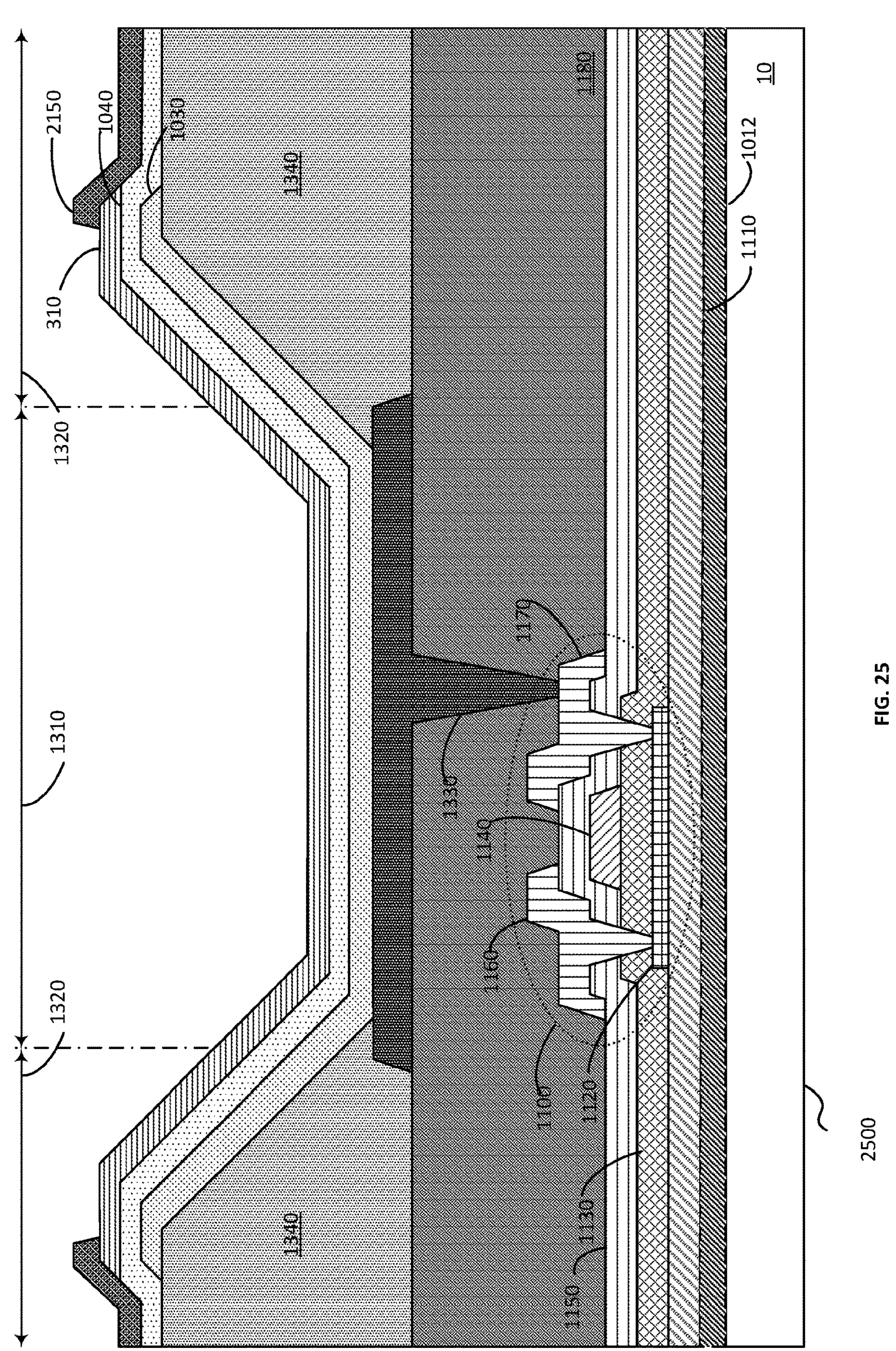
FIG. 25 is a schematic diagram illustrating an example cross-sectional view of an example version of the device of FIG. 13 with additional example deposition steps according to an example in the present disclosure.

Turning now to FIG. 25, there is shown an example version 2500 of the device 1000, which encompasses the device shown in cross-sectional view in FIG. 13, but with a number of additional deposition steps that are described herein.

The device 2500 shows an NIC 310 selectively deposited over the exposed layer surface 11 of the underlying material, in the figure, the second electrode 1040, within a first portion 301 of the device 2500, corresponding substantially to the lateral aspect 1310 of emissive region(s) 2210 corresponding to (sub-) pixel(s) 1240/244*x* and not within a second portion 302 of the device 2500, corresponding substantially to the lateral aspect(s) 1320 of non-emissive region(s) 2220 surrounding the first portion 301.

In some non-limiting examples, the NIC 310 may be selectively deposited using a shadow mask 415.

The NIC 310 provides, within the first portion 301, an exposed layer surface 11 with a relatively low initial sticking probability $S_0$ for a deposited layer 330 to be thereafter deposited on form an auxiliary electrode 2150.

After selective deposition of the NIC 310, the deposited layer 330 is deposited over the device 2500 but remains substantially only within the second portion 302, which is substantially devoid of NIC 310, to form the auxiliary electrode 2150.

In some non-limiting examples, the deposited layer 330 may be deposited using an open mask 600, and/or a mask-free deposition process.

The auxiliary electrode 2150 is electrically coupled to the second electrode 1040 so as to reduce a sheet resistance of the second electrode 1040, including, as shown, by lying above and in physical contact with the second electrode 1040 across the second portion that is substantially devoid of NIC 310.

In some non-limiting examples, the deposited layer 330 may comprise substantially the same material as the second electrode 1040, to ensure a high initial sticking probability $S_0$ for the deposited layer 330 in the second portion.

In some non-limiting examples, the second electrode 1040 may comprise substantially pure Mg, and/or an alloy of Mg and another metal, including without limitation, Ag. In some non-limiting examples, an Mg:Ag alloy composition may range from about 1:9-by volume. In some non-limiting examples, the second electrode 1040 may comprise metal oxides, including without limitation, ternary metal oxides, such as, without limitation, ITO, and/or IZO, and/or a combination of metals, and/or metal oxides.

In some non-limiting examples, the deposited layer 330 used to form the auxiliary electrode 2150 may comprise substantially pure Mg.

Figure 26:
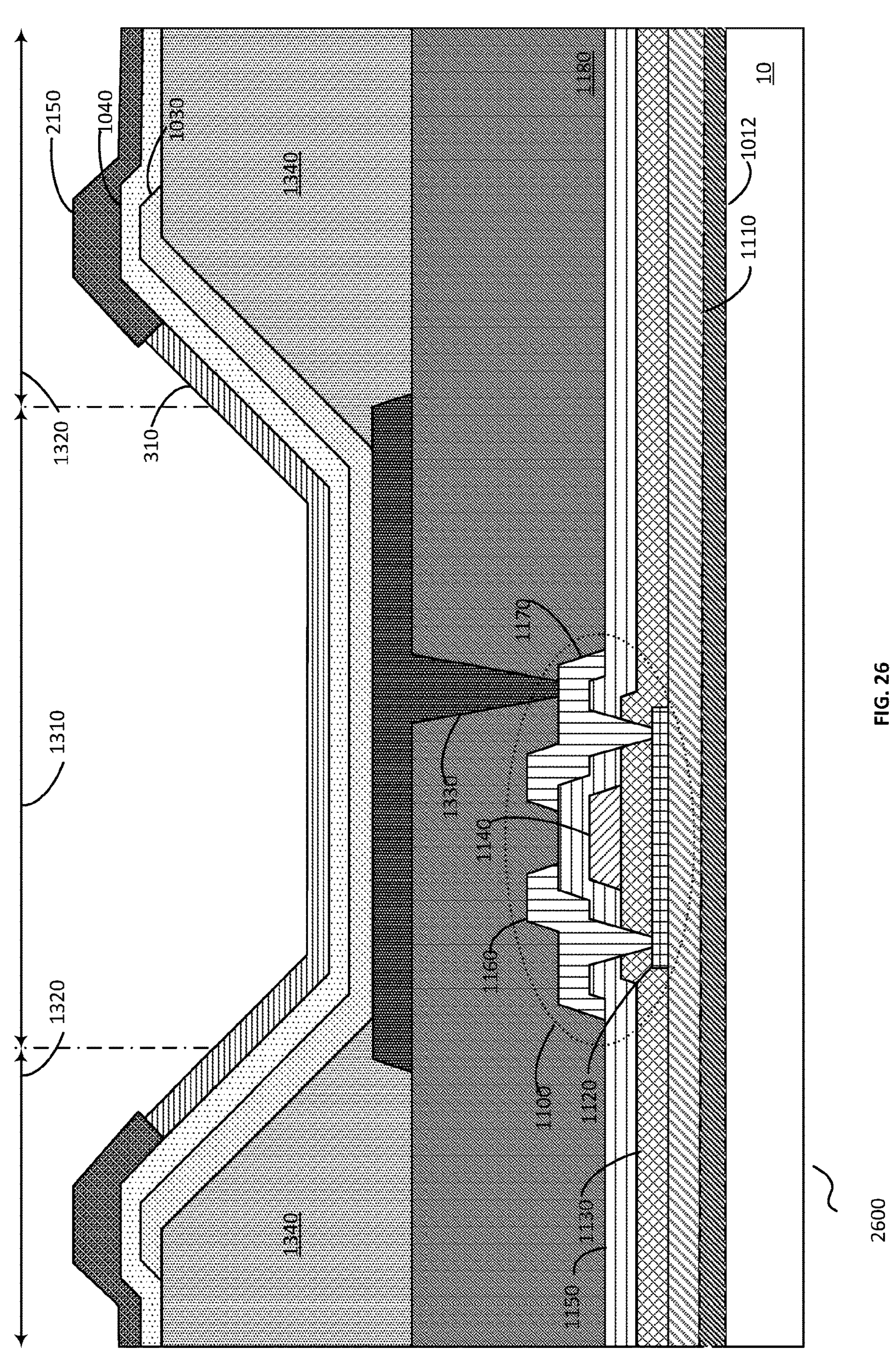
FIG. 26 is a schematic diagram illustrating an example cross-sectional view of an example version of the device of FIG. 13 with additional example deposition steps according to an example in the present disclosure.

Turning now to FIG. 26, there is shown an example version 2600 of the device 1000, which encompasses the device shown in cross-sectional view in FIG. 13, but with a number of additional deposition steps that are described herein.

The device 2600 shows an NIC 310 selectively deposited over the exposed layer surface 11 of the underlying material, in the figure, the second electrode 1040, within a first portion 301 of the device 2600, corresponding substantially to a part of the lateral aspect 1310 of emissive region(s) 2210 corresponding to (sub-) pixel(s) 1240/244*x*, and not within a second portion 302. In the figure, the first portion 301 may extend partially along the extent of an inclined part of the PDLs 1340 defining the emissive region(s) 2210.

In some non-limiting examples, the NIC 310 may be selectively deposited using a shadow mask 410.

The NIC 310 provides, within the first portion 301, an exposed layer surface 11 with a relatively low initial sticking probability $S_0$ for a deposited layer 330 to be thereafter deposited on form an auxiliary electrode 2150.

After selective deposition of the NIC 310, the deposited layer 330 is deposited over the device 2600 but remains substantially only within the second portion 302, which is substantially devoid of NIC 310, to form the auxiliary electrode 2150. As such, in the device 2600, the auxiliary electrode 2150 may extend partly across the inclined part of the PDLs 1340 defining the emissive region(s) 2210.

In some non-limiting examples, the deposited layer 330 may be deposited using an open mask 600, and/or a mask-free deposition process.

The auxiliary electrode 2150 is electrically coupled to the second electrode 1040 so as to reduce a sheet resistance of the second electrode 1040, including, as shown, by lying above and in physical contact with the second electrode 1040 across the second portion 302 that is substantially devoid of NIC 310.

In some non-limiting examples, the material of which the second electrode 1040 may be comprised, may not have a high initial sticking probability $S_0$ for the deposited layer 330.

Figure 27:
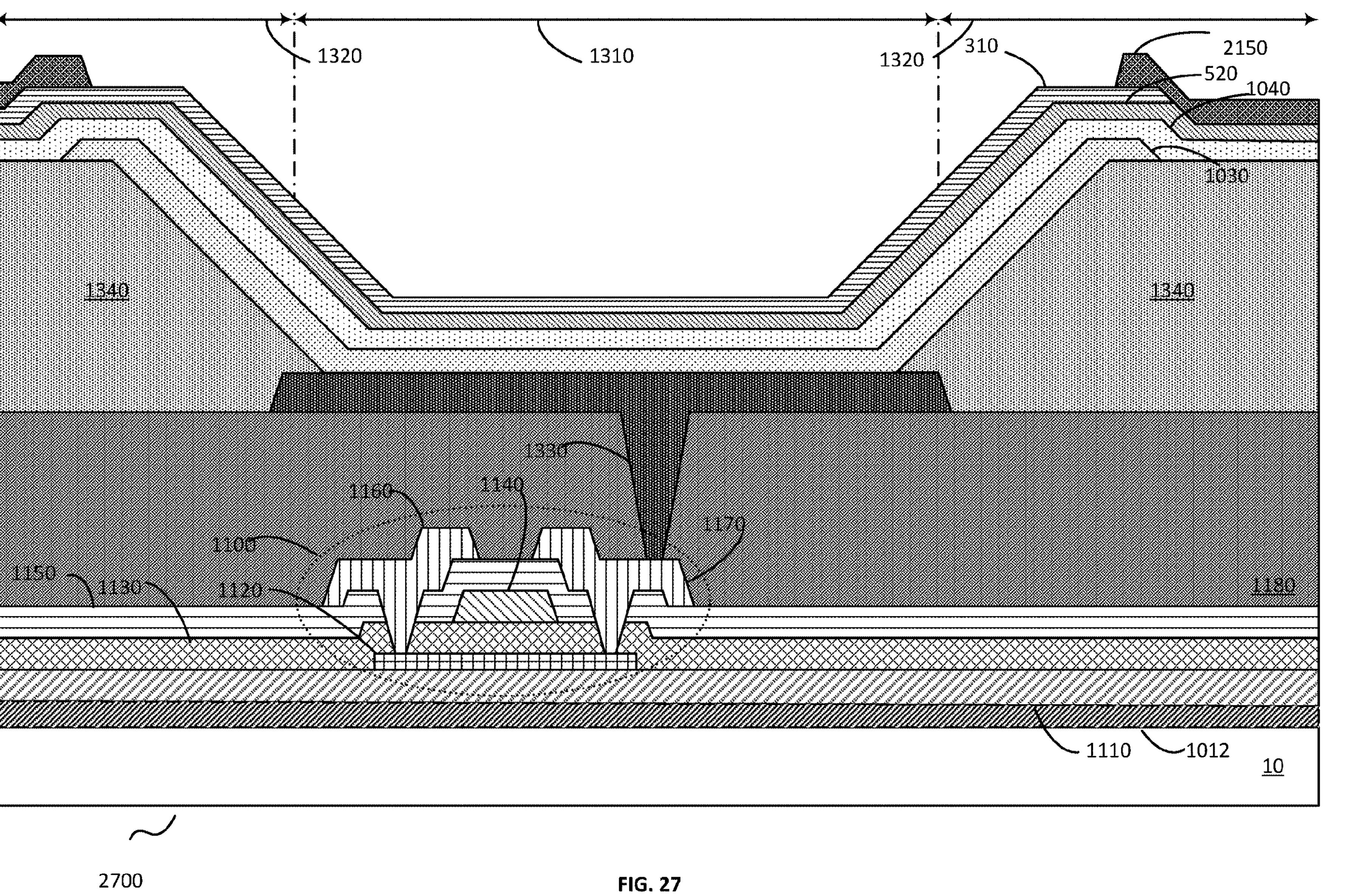
FIG. 27 is a schematic diagram illustrating an example cross-sectional view of an example version of the device of FIG. 13 with additional example deposition steps according to an example in the present disclosure.

FIG. 27 illustrates such a scenario, in which there is shown an example version 2700 of the device 1000, which encompasses the device shown in cross-sectional view in FIG. 13, but with a number of additional deposition steps that are described herein.

The device 2700 shows an NPC 520 deposited over the exposed layer surface 11 of the underlying material, in the figure, the second electrode 1040.

In some non-limiting examples, the NPC 520 may be deposited using an open mask 600, and/or a mask-free deposition process.

Thereafter, an NIC 310 is deposited selectively deposited over the exposed layer surface 11 of the underlying material, in the figure, the NPC 520, within a first portion 301 of the device 2700, corresponding substantially to a part of the lateral aspect 1310 of emissive region(s) 2210 corresponding to (sub-) pixel(s) 1240/244*x*, and not within a second portion 302 of the device 2700, corresponding substantially to the lateral aspect(s) 1320 of non-emissive region(s) 2220 surrounding the first portion 301.

In some non-limiting examples, the NIC 310 may be selectively deposited using a shadow mask 415.

The NIC 310 provides, within the first portion 301, an exposed layer surface 11 with a relatively low initial sticking probability $S_0$ for a deposited layer 330 to be thereafter deposited on form an auxiliary electrode 2150.

After selective deposition of the NIC 310, the deposited layer 330 is deposited over the device 2700 but remains substantially only within the second portion 302, which is substantially devoid of NIC 310, to form the auxiliary electrode 2150.

In some non-limiting examples, the deposited layer 330 may be deposited using an open mask 600, and/or a mask-free deposition process.

The auxiliary electrode 2150 is electrically coupled to the second electrode 1040 so as to reduce a sheet resistance thereof. While, as shown, the auxiliary electrode 2150 is not lying above and in physical contact with the second electrode 1040, those having ordinary skill in the relevant art will nevertheless appreciate that the auxiliary electrode 2150 may be electrically coupled to the second electrode 1040 by a number of well-understood mechanisms. By way of non-limiting example, the presence of a relatively thin film (in some non-limiting examples, of up to about 50 nm) of an NIC 310, and/or an NPC 520 may still allow a current to pass therethrough, thus allowing a sheet resistance of the second electrode 1040 to be reduced.

Figure 28:
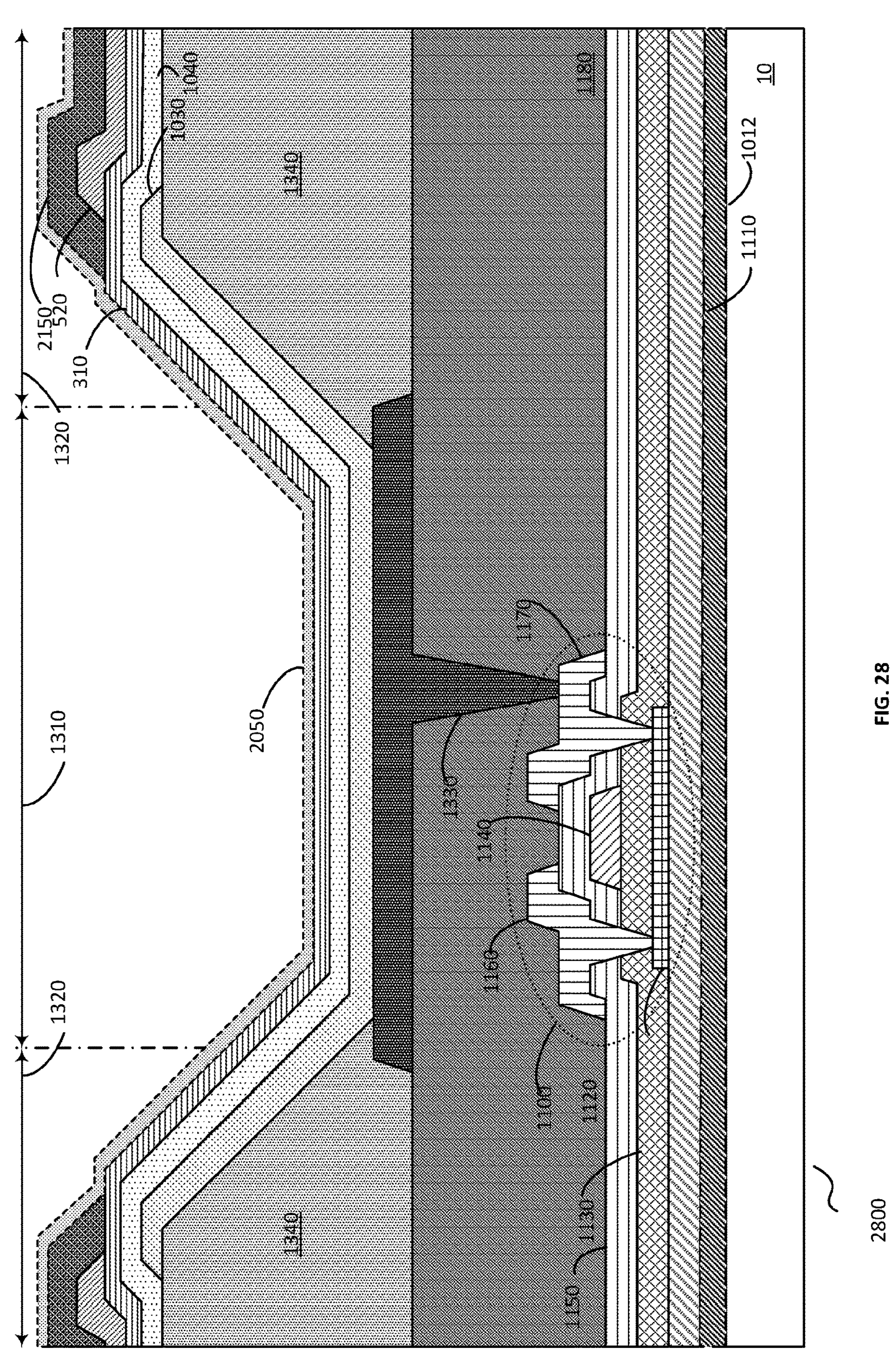
FIG. 28 is a schematic diagram illustrating an example cross-sectional view of an example version of the device of FIG. 13 with additional example deposition steps according to an example in the present disclosure.

Turning now to FIG. 28, there is shown an example version 2800 of the device 1000, which encompasses the device shown in cross-sectional view in FIG. 13, but with a number of additional deposition steps that are described herein.

The device 2800 shows an NIC 310 deposited over the exposed layer surface 11 of the underlying material, in the figure, the second electrode 1040.

In some non-limiting examples, the NIC 310 may be deposited using an open mask 600, and/or a mask-free deposition process.

The NIC 310 provides an exposed layer surface 11 with a relatively low initial sticking probability $S_0$ or a deposited layer 330 to be thereafter deposited on form an auxiliary electrode 2150.

After deposition of the NIC 310, an NPC 520 is selectively deposited over the exposed layer surface 11 of the underlying material, in the figure, the NIC 310, within an NPC portion 1503 of the device 2800, corresponding substantially to a part of the lateral aspect 1320 of non-emissive region(s) 2220 surrounding a second portion of the device 2800, corresponding substantially to the lateral aspect(s) 1310 of emissive region(s) 2210 corresponding to (sub-) pixel(s) 1240/244*x*.

In some non-limiting examples, the NPC 520 may be selectively deposited using a shadow mask 415.

The NPC 520 provides, within the first portion 301, an exposed layer surface 11 with a relatively high initial sticking probability $S_0$ or a deposited layer 330 to be thereafter deposited on form an auxiliary electrode 2150.

After selective deposition of the NPC 520, the deposited layer 330 is deposited over the device 2800 but remains substantially only within the NPC portion 1503, in which the NIC 310 has been overlaid with the NPC 520, to form the auxiliary electrode 2150.

In some non-limiting examples, the deposited layer 330 may be deposited using an open mask 600, and/or a mask-free deposition process.

The auxiliary electrode 2150 is electrically coupled to the second electrode 1040 so as to reduce a sheet resistance of the second electrode 1040.

Removal of Selective Coating

In some non-limiting examples, the NIC 310 may be removed subsequent to deposition of the deposited layer 330, such that at least a part of a previously exposed layer surface 11 of an underlying material covered by the NIC 310 may become exposed once again. In some non-limiting examples, the NIC 310 may be selectively removed by etching, and/or dissolving the NIC 310, and/or by employing plasma, and/or solvent processing techniques that do not substantially affect or erode the deposited layer 330.

Figures 29A, 29B, 29C:
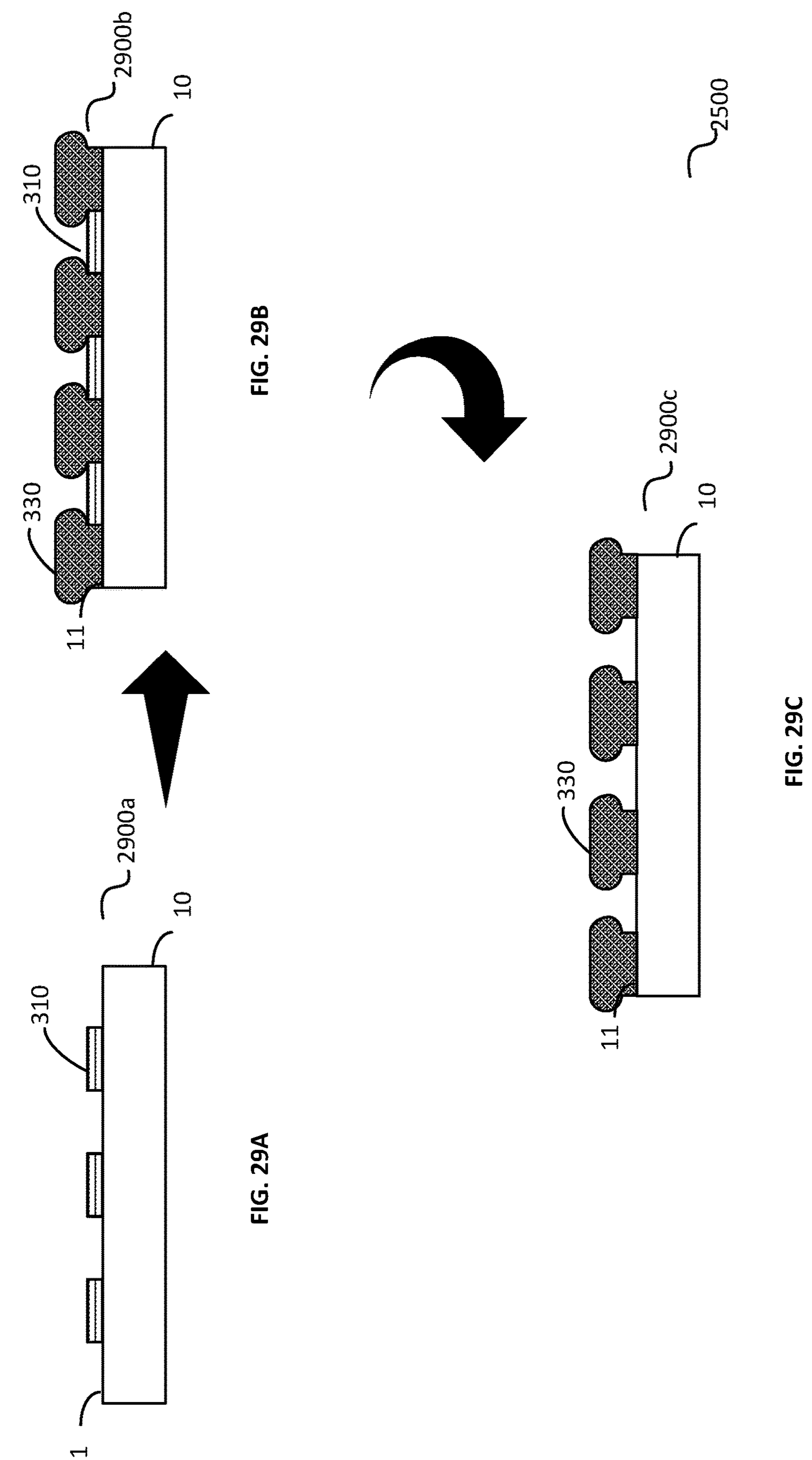
FIGS. 29A-29C are schematic diagrams that show example stages of an example process for depositing a deposited layer in a pattern on an exposed layer surface of an example version of the device of FIG. 13, by selective deposition and subsequent removal process, according to an example in the present disclosure.

Turning now to FIG. 29A, there is shown an example cross-sectional view of an example version 2900 of the device 1000, at a deposition stage 3300*a*, in which an NIC 310 has been selectively deposited on a first portion 301 of an exposed layer surface 11 of an underlying material. In the figure, the underlying material may be the substrate 10.

In FIG. 29B, the device 2900 is shown at a deposition stage 3300*b*, in which a deposited layer 330 is deposited on the exposed layer surface 11 of the underlying material, that is, on both the exposed layer surface 11 of NIC 310 where the NIC 310 has been deposited during the stage 3300*a*, as well as the exposed layer surface 11 of the substrate 10 where that NIC 310 has not been deposited during the stage 3300*a*. Because of the nucleation-inhibiting properties of the first portion 301 where the NIC 310 was disposed, the deposited layer 330 disposed thereon tends not to remain, resulting in a pattern of selective deposition of the deposited layer 330, that corresponds to a second portion 302, leaving the first portion 301 substantially devoid of the deposited layer 330.

In FIG. 29C, the device 3300 is shown at a deposition stage 3300*c*, in which the NIC 310 has been removed from the first portion 301 of the exposed layer surface 11 of the substrate 10, such that the deposited layer 330 deposited during the stage 3300*b* remains on the substrate 10 and regions of the substrate 10 on which the NIC 310 had been deposited during the stage 3300*a* are now exposed or uncovered.

In some non-limiting examples, the removal of the NIC 310 in the stage 3300*c* may be effected by exposing the device 2900 to a solvent, and/or a plasma that reacts with, and/or etches away the NIC 310 without substantially impacting the deposited layer 330.

Transparent OLED

Figure 30A:
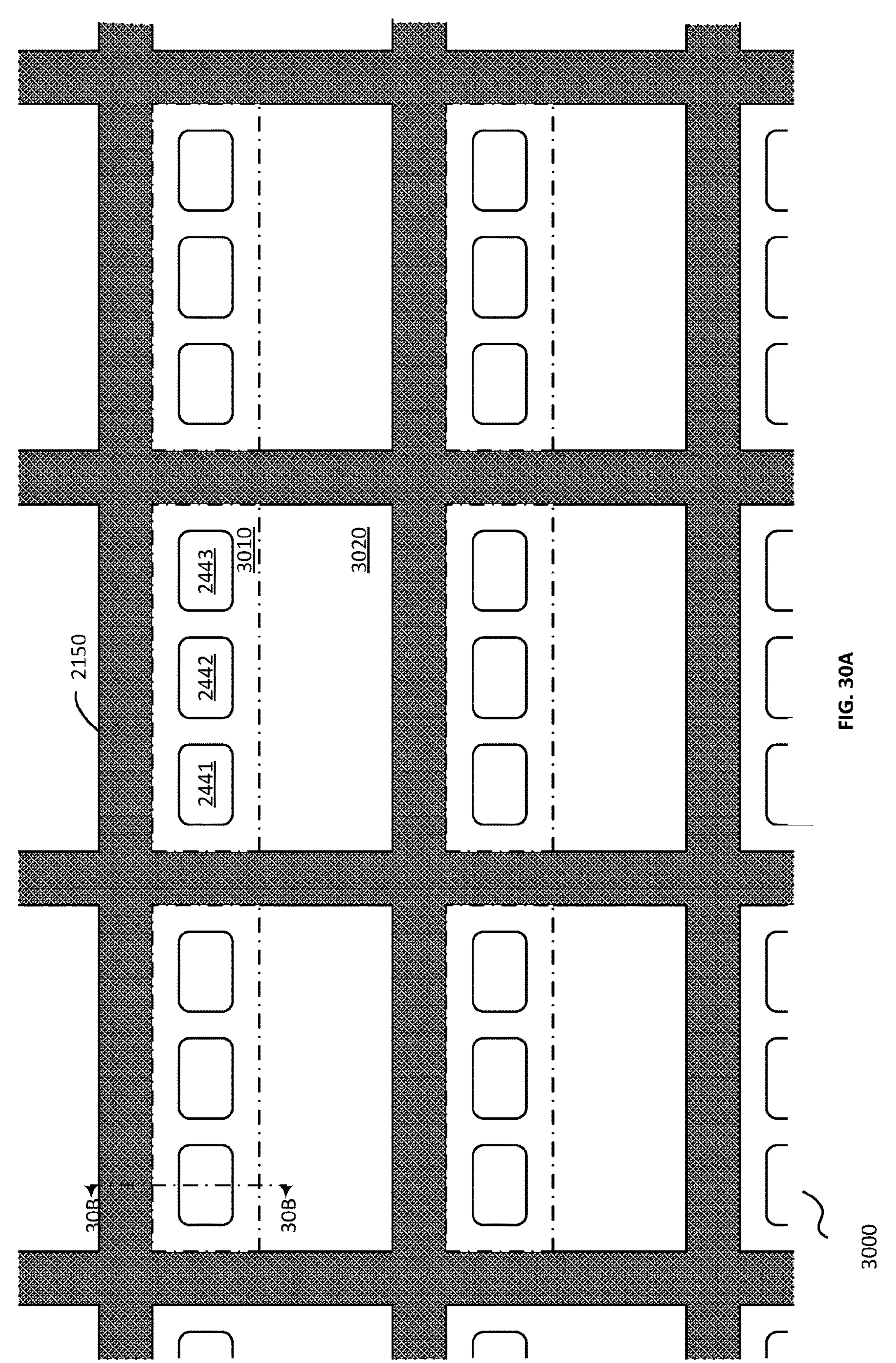
FIG. 30A is a schematic diagram illustrating, in plan view, an example of a transparent version of the device of FIG. 10 comprising at least one example pixel region and at least one example light-transmissive region, with at least one auxiliary electrode according to an example in the present disclosure.

Turning now to FIG. 30A, there is shown an example plan view of a transmissive (transparent) version, shown generally at 3000, of the device 1000. In some non-limiting examples, the device 3000 is an AMOLED device having a plurality of pixel regions 3010 and a plurality of transmissive regions 3020. In some non-limiting examples, at least one auxiliary electrode 2150 may be deposited on an exposed layer surface 11 of an underlying material between the pixel region(s) 3010, and/or the transmissive region(s) 3020.

In some non-limiting examples, each pixel region 3010 may comprise a plurality of emissive regions 2210 each corresponding to a sub-pixel 244*x*. In some non-limiting examples, the sub-pixels 244*x* may correspond to, respectively, R(ed) sub-pixels 2441, G(reen) sub-pixels 2442, and/or B(lue) sub-pixels 2443.

In some non-limiting examples, each transmissive region 3020 is substantially transparent and allows light to pass through the entirety of a cross-sectional aspect thereof.

Figure 30B:
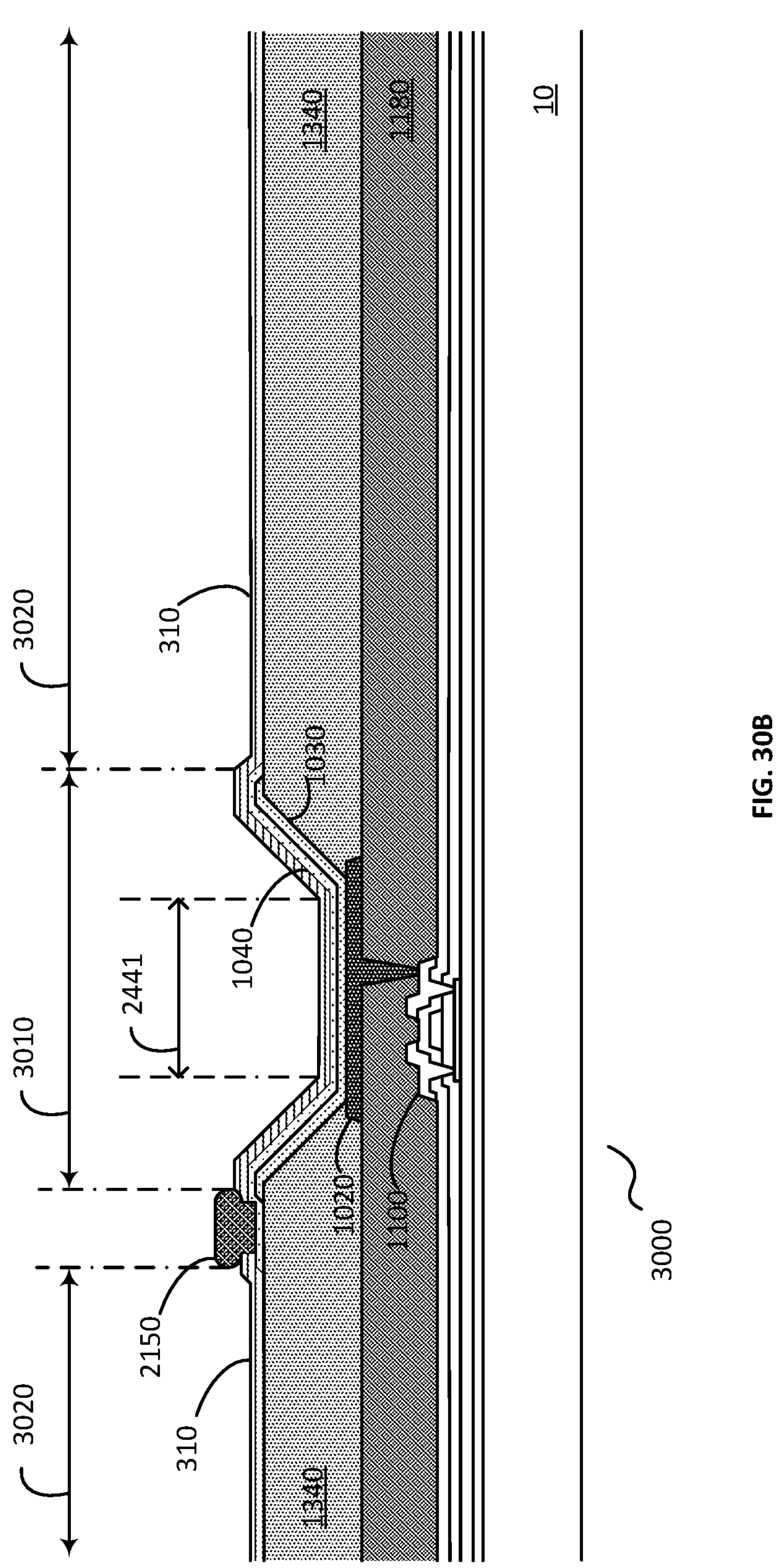
FIG. 30B is a schematic diagram illustrating an example cross-sectional view of the device of FIG. 30A taken along line 30B-30B.

Turning now to FIG. 30B, there is shown an example cross-sectional view of the device 3000, taken along line 30B-30B in FIG. 30A. In the figure, the device 3000 is shown as comprising a substrate 10, a TFT insulating layer 1180 and a first electrode 1020 formed on a surface of the TFT insulating layer 1180. The substrate 10 may comprise the base substrate 1012 (not shown for purposes of simplicity of illustration), and/or at least one TFT structure 1100, corresponding to and for driving each sub-pixel 244*x* positioned substantially thereunder and electrically coupled to the first electrode 1020 thereof. PDL(s) 1340 are formed in non-emissive regions 2220 over the substrate 10, to define emissive region(s) 2210 also corresponding to each sub-pixel 244*x*, over the first electrode 1020 corresponding thereto. The PDL(s) 1340 cover edges of the first electrode 1020.

In some non-limiting examples, at least one semiconducting layer 1030 is deposited over exposed region(s) of the first electrode 1020 and, in some non-limiting examples, at least parts of the surrounding PDLs 1340.

In some non-limiting examples, a second electrode 1040 may be deposited over the at least one semiconducting layer(s) 1030, including over the pixel region 3010 to form the sub-pixel(s) 244*x* thereof and, in some non-limiting examples, at least partially over the surrounding PDLs 1340 in the transmissive region 3020.

In some non-limiting examples, an NIC 310 is selectively deposited over first portion(s) 301 of the device 3000, comprising both the pixel region 3010 and the transmissive region 3020 but not the region of the second electrode 1040 corresponding to the auxiliary electrode 2150 comprising second portion(s) 302 thereof.

In some non-limiting examples, the entire exposed layer surface 11 of the device 3000 is then exposed to a vapor flux of the deposited material 531, which in some non-limiting examples may be Mg. The deposited layer 330 is selectively deposited over second portion(s) of the second electrode 1040 that is substantially devoid of the NIC 310 to form an auxiliary electrode 2150 that is electrically coupled to and in some non-limiting examples, in physical contact with uncoated parts of the second electrode 1040.

At the same time, the transmissive region 3020 of the device 3000 remains substantially devoid of any materials that may substantially affect the transmission of light therethrough. In particular, as shown in the figure, the TFT structure 1100 and the first electrode 1020 are positioned, in a cross-sectional aspect, below the sub-pixel 244*x* corresponding thereto, and together with the auxiliary electrode 2150, lie beyond the transmissive region 3020. As a result, these components do not attenuate or impede light from being transmitted through the transmissive region 3020. In some non-limiting examples, such arrangement allows a viewer viewing the device 3000 from a typical viewing distance to see through the device 3000, in some non-limiting examples, when all of the (sub-) pixel(s) 1240/244*x* are not emitting, thus creating a transparent AMOLED device 3000.

While not shown in the figure, in some non-limiting examples, the device 3000 may further comprise an NPC 520 disposed between the auxiliary electrode 2150 and the second electrode 1040. In some non-limiting examples, the NPC 520 may also be disposed between the NIC 310 and the second electrode 1040.

In some non-limiting examples, the NIC 310 may be formed concurrently with the at least one semiconducting layer(s) 1030. By way of non-limiting example, at least one material used to form the NIC 310 may also be used to form the at least one semiconducting layer(s) 1030. In such non-limiting example, a number of stages for fabricating the device 3000 may be reduced.

Those having ordinary skill in the relevant art will appreciate that in some non-limiting examples, various other layers, and/or coatings, including without limitation those forming the at least one semiconducting layer(s) 1030, and/or the second electrode 1040, may cover a part of the transmissive region 3020, especially if such layers, and/or coatings are substantially transparent. In some non-limiting examples, the PDL(s) 1340 may have a reduced thickness, including without limitation, by forming a well therein, which in some non-limiting examples is not dissimilar to the well defined for emissive region(s) 2210, to further facilitate light transmission through the transmissive region 3020.

Those having ordinary skill in the relevant art will appreciate that (sub-) pixel(s) 340/244*x* arrangements other than the arrangement shown in FIGS. 30A and 30B may, in some non-limiting examples, be employed.

Those having ordinary skill in the relevant art will appreciate that arrangements of the auxiliary electrode(s) 2150 other than the arrangement shown in FIGS. 30A and 30B may, in some non-limiting examples, be employed. By way of non-limiting example, the auxiliary electrode(s) 2150 may be disposed between the pixel region 3010 and the transmissive region 3020. By way of non-limiting example, the auxiliary electrode(s) 2150 may be disposed between sub-pixel(s) 244*x* within a pixel region 3010.

Figure 31A:
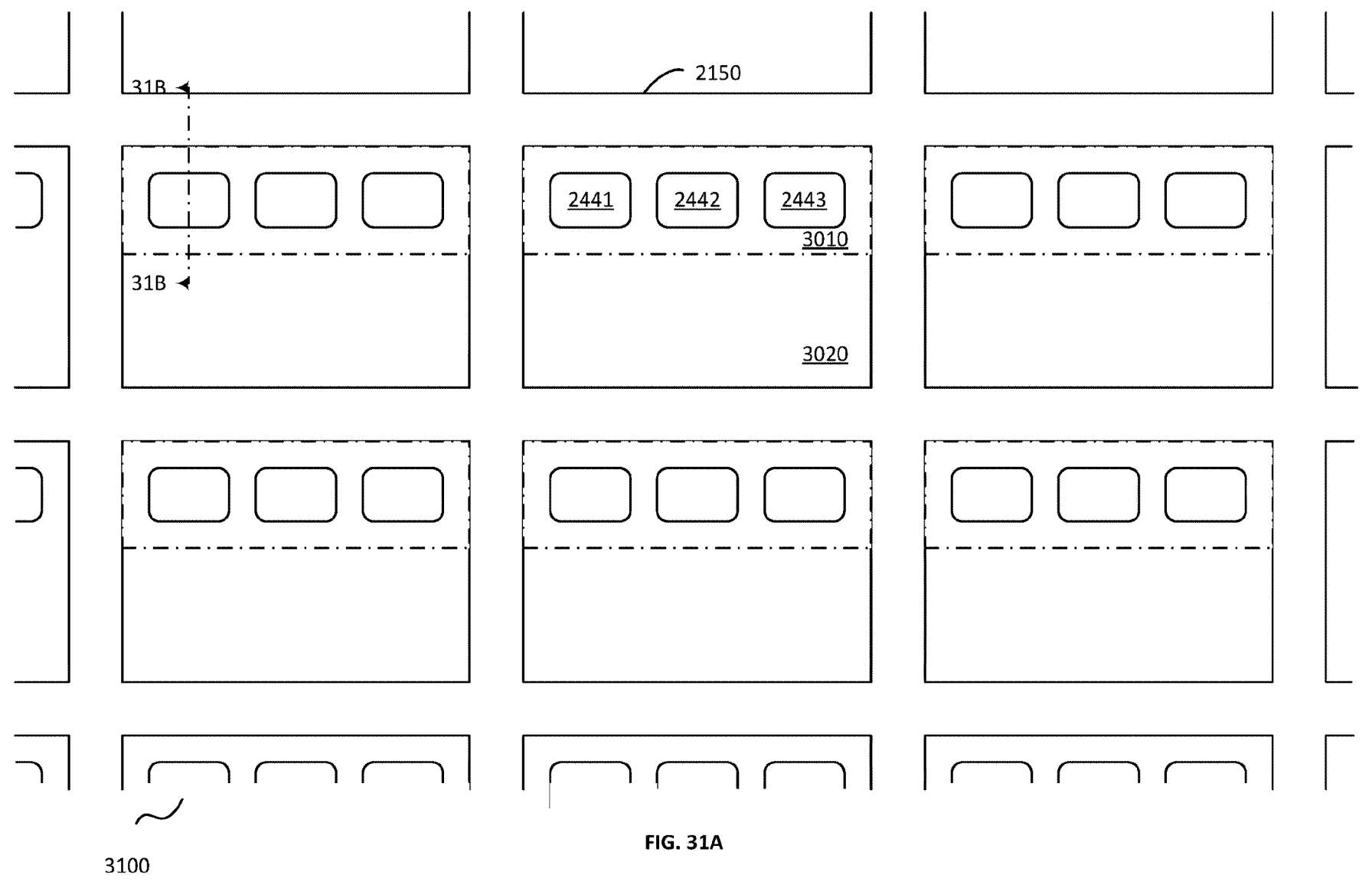

Turning now to FIG. 31A, there is shown an example plan view of a transparent version, shown generally at 3100 of the device 1000. In some non-limiting examples, the device 3100 is an AMOLED device having a plurality of pixel regions 3010 and a plurality of transmissive regions 3020. The device 3100 differs from device 3000 in that no auxiliary electrode(s) 2150 lie between the pixel region(s) 3010, and/or the transmissive region(s) 3020.

In some non-limiting examples, each pixel region 3010 may comprise a plurality of emissive regions 2210 each corresponding to a sub-pixel 244*x*. In some non-limiting examples, the sub-pixels 244*x* may correspond to, respectively, R(ed) sub-pixels 2441, G(reen) sub-pixels 2442, and/or B(lue) sub-pixels 2443.

In some non-limiting examples, each transmissive region 3020 is substantially transparent and allows light to pass through the entirety of a cross-sectional aspect thereof.

Figure 31B:
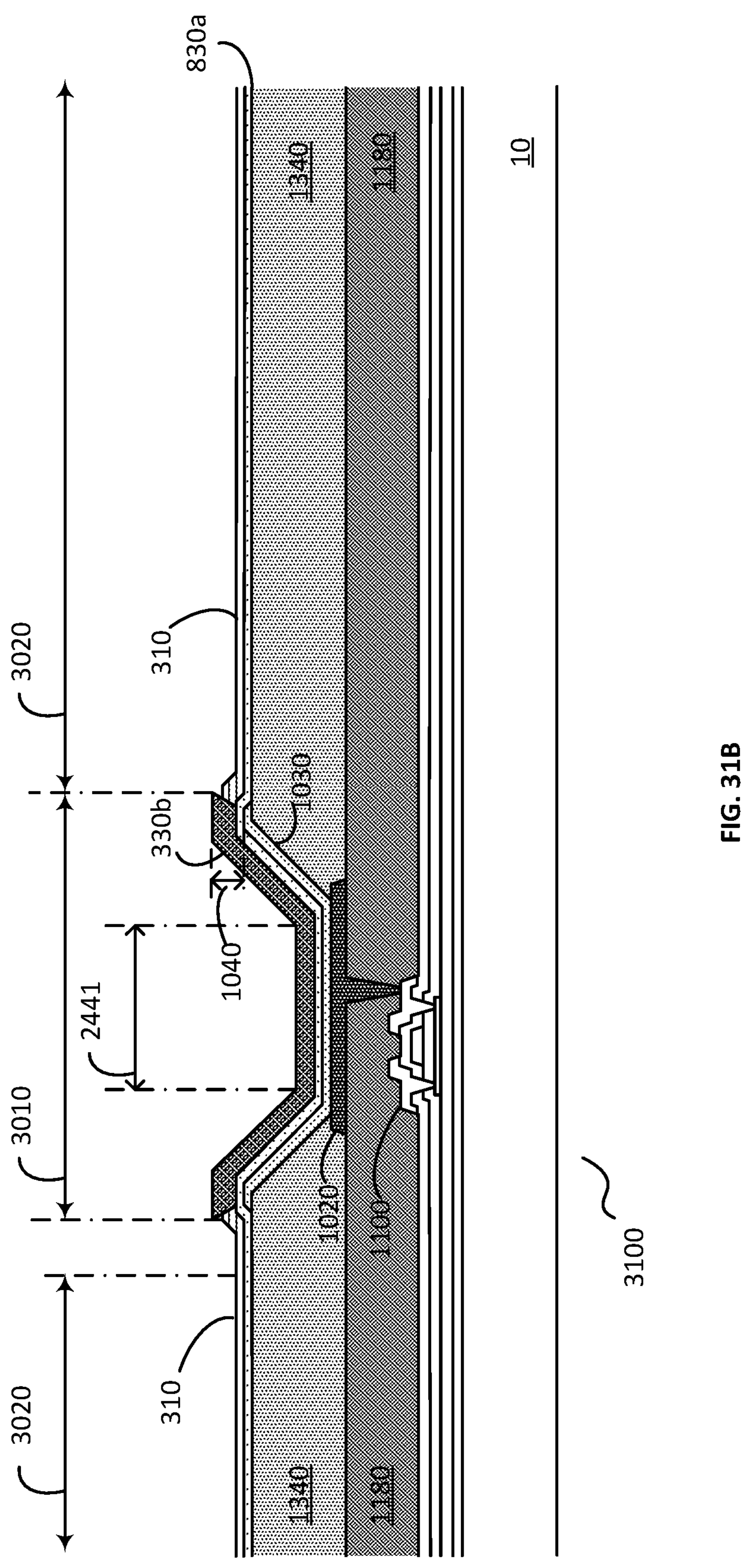
FIG. 31B is a schematic diagram illustrating an example cross-sectional view of the device of FIG. 31A taken along line 31B-31B.

Turning now to FIG. 31B, there is shown an example cross-sectional view of the device 3100, taken along line 31B-31B in FIG. 31A. In the figure, the device 3100 is shown as comprising a substrate 10, a TFT insulating layer 1180 and a first electrode 1020 formed on a surface of the TFT insulating layer 1180. The substrate 10 may comprise the base substrate 1012 (not shown for purposes of simplicity of illustration), and/or at least one TFT structure 1100 corresponding to and for driving each sub-pixel 244*x* positioned substantially thereunder and electrically coupled to the first electrode 1020 thereof. PDL(s) 1340 are formed in non-emissive regions 2220 over the substrate 10, to define emissive region(s) 2210 also corresponding to each sub-pixel 244*x*, over the first electrode 1020 corresponding thereto. The PDL(s) 1340 cover edges of the first electrode 1020.

In some non-limiting examples, at least one semiconducting layer 1030 is deposited over exposed region(s) of the first electrode 1020 and, in some non-limiting examples, at least parts of the surrounding PDLs 1340.

In some non-limiting examples, a first deposited layer 330*a* may be deposited over the at least one semiconducting layer(s) 1030, including over the pixel region 3010 to form the sub-pixel(s) 244*x* thereof and over the surrounding PDLs 1340 in the transmissive region 3020. In some non-limiting examples, the thickness of the first deposited layer 330*a* may be relatively thin such that the presence of the first deposited layer 330*a* across the transmissive region 3020 does not substantially attenuate transmission of light therethrough. In some non-limiting examples, the first deposited layer 330*a* may be deposited using an open mask 600, and/or mask-free deposition process.

In some non-limiting examples, an NIC 310 is selectively deposited over first portions of the device 3100, comprising the transmissive region 3020.

In some non-limiting examples, the entire surface of the device 3100 is then exposed to a vapor flux of the deposited material 531, which in some non-limiting examples may be Mg to selectively deposit a second deposited layer 330*b* over second portion(s) 302 of the first deposited layer 330*a* that are substantially devoid of the NIC 310, in some examples, the pixel region 3010, such that the second deposited layer 330*b* is electrically coupled to and in some non-limiting examples, in physical contact with uncoated parts of the first deposited layer 330*a*, to form the second electrode 1040.

In some non-limiting examples, a thickness of the first deposited layer 330*a* may be less than a thickness of the second deposited layer 330*b*. In this way, relatively high transmittance may be maintained in the transmissive region 3020, over which only the first deposited layer 330*a* may extend. In some non-limiting examples, the thickness of the first deposited layer 330*a* may be less than about: 30 nm, 25 nm, 20 nm, 15 nm, 10 nm, 8 nm, and/or 5 nm. In some non-limiting examples, the thickness of the second deposited layer 330*b* may be less than about: 30 nm, 25 nm, 20 nm, 15 nm, 10 nm, or 8 nm.

Thus, in some non-limiting examples, a thickness of the second electrode 1040 may be less than about 40 nm, and/or in some non-limiting examples, between about: 5-30 nm, 10-25 nm, or 15-25 nm.

In some non-limiting examples, the thickness of the first deposited layer 330*a* may be greater than the thickness of the second deposited layer 330*b*. In some non-limiting examples, the thickness of the first deposited layer 330*a* and the thickness of the second deposited layer 330*b* may be substantially the same.

In some non-limiting examples, at least one deposited material 531 used to form the first deposited layer 330*a* may be substantially the same as at least one deposited material 531 used to form the second deposited layer 330*b*. In some non-limiting examples, such at least one deposited material 531 may be substantially as described herein in respect of the first electrode 1020, the second electrode 1040, the auxiliary electrode 2150, and/or a deposited layer 330 thereof.

In some non-limiting examples, the transmissive region 3020 of the device 3100 remains substantially devoid of any materials that may substantially affect the transmission of light therethrough. In particular, as shown in the figure, the TFT structure 1100, and/or the first electrode 1020 are positioned, in a cross-sectional aspect below the sub-pixel 244*x* corresponding thereto and beyond the transmissive region 3020. As a result, these components do not attenuate or impede light from being transmitted through the transmissive region 3020. In some non-limiting examples, such arrangement allows a viewer viewing the device 3100 from a typical viewing distance to see through the device 3100, in some non-limiting examples, when all of the (sub-) pixel(s) 340/244*x* are not emitting, thus creating a transparent AMOLED device 3100.

While not shown in the figure, in some non-limiting examples, the device 3100 may further comprise an NPC 520 disposed between the second deposited layer 330*b* and the first deposited layer 330*a*. In some non-limiting examples, the NPC 520 may also be disposed between the NIC 310 and the first deposited layer 330*a*.

In some non-limiting examples, the NIC 310 may be formed concurrently with the at least one semiconducting layer(s) 1030. By way of non-limiting example, at least one material used to form the NIC 310 may also be used to form the at least one semiconducting layer(s) 1030. In such non-limiting example, a number of stages for fabricating the device 3100 may be reduced.

Those having ordinary skill in the relevant art will appreciate that in some non-limiting examples, various other layers, and/or coatings, including without limitation those forming the at least one semiconducting layer(s) 1030, and/or the first deposited layer 330*a*, may cover a part of the transmissive region 3020, especially if such layers, and/or coatings are substantially transparent. In some non-limiting examples, the PDL(s) 1340 may have a reduced thickness, including without limitation, by forming a well therein, which in some non-limiting examples is not dissimilar to the well defined for emissive region(s) 2210, to further facilitate light transmission through the transmissive region 3020.

Those having ordinary skill in the relevant art will appreciate that (sub-) pixel(s) 1240/244*x* arrangements other than the arrangement shown in FIGS. 31A and 31B may, in some non-limiting examples, be employed.

Figure 31C:
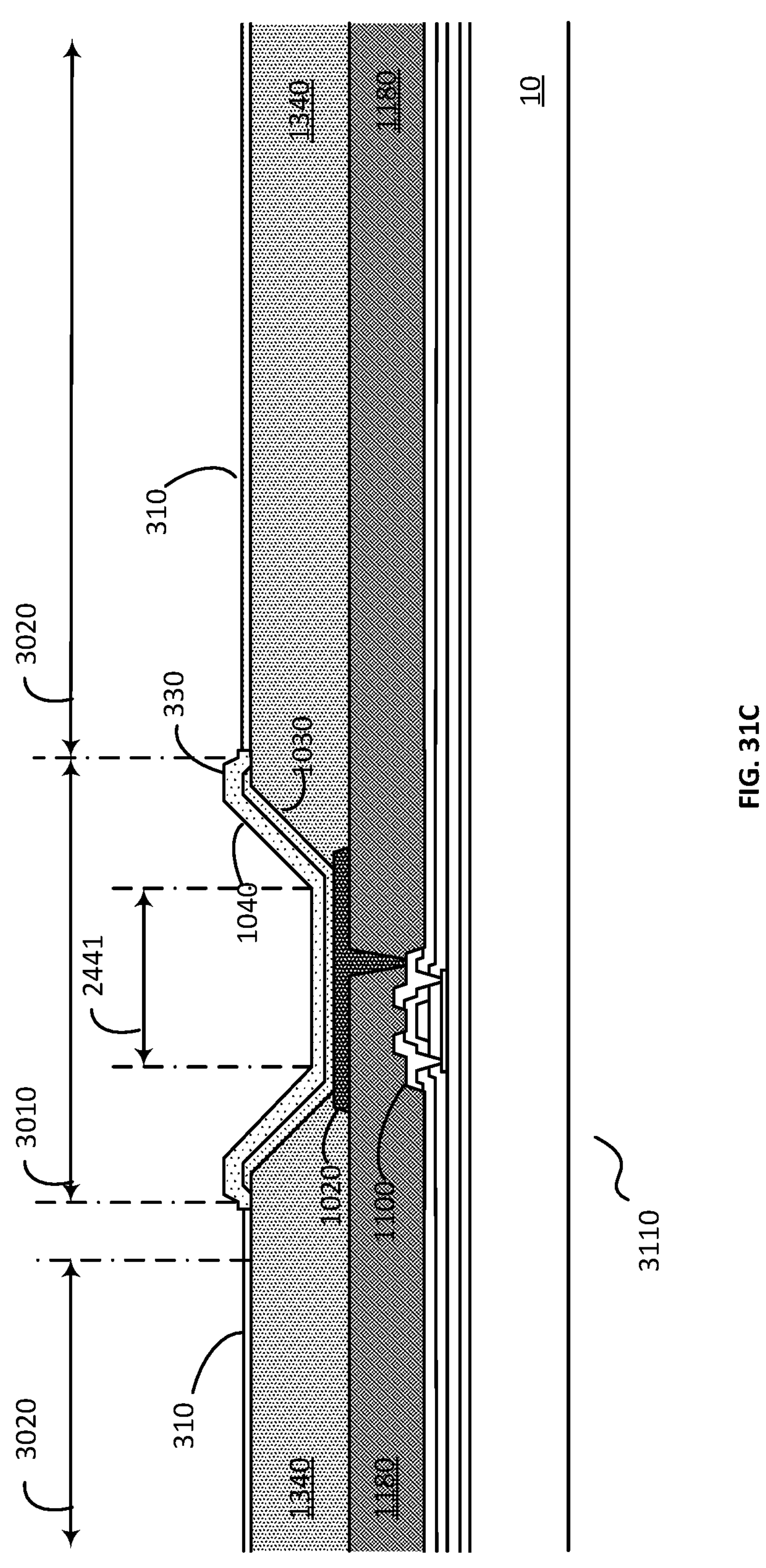
FIG. 31C is a schematic diagram illustrating another example cross-sectional view of the device of FIG. 31A taken along line 31B-31B.

Turning now to FIG. 31C, there is shown an example cross-sectional view of a different version of the device 1000, shown as device 3110, taken along the same line 31B-31B in FIG. 31A. In the figure, the device 3110 is shown as comprising a substrate 10, a TFT insulating layer 1180 and a first electrode 1020 formed on a surface of the TFT insulating layer 1180. The substrate 10 may comprise the base substrate 1012 (not shown for purposes of simplicity of illustration), and/or at least one TFT structure 1100 corresponding to and for driving each sub-pixel 244*x* positioned substantially thereunder and electrically coupled to the first electrode 1020 thereof. PDL(s) 1340 are formed in non-emissive regions 2220 over the substrate 10, to define emissive region(s) 2210 also corresponding to each sub-pixel 244*x*, over the first electrode 1020 corresponding thereto. The PDL(s) 1340 cover edges of the first electrode 1020.

In some non-limiting examples, at least one semiconducting layer 1030 is deposited over exposed region(s) of the first electrode 1020 and, in some non-limiting examples, at least parts of the surrounding PDLs 1340.

In some non-limiting examples, an NIC 310 is selectively deposited over first portions 301 of the device 3110, comprising the transmissive region 3020.

In some non-limiting examples, a deposited layer 330 may be deposited over the at least one semiconducting layer(s) 1030, including over the pixel region 3010 to form the sub-pixel(s) 244*x* thereof but not over the surrounding PDLs 1340 in the transmissive region 3020. In some non-limiting examples, the first deposited layer 330*a* may be deposited using an open mask 600, and/or mask-free deposition process. In some non-limiting examples, such deposition may be effected by exposing the entire exposed layer surface 11 of the device 3110 to a vapour flux of the deposited material 531, which in some non-limiting examples may be Mg to selectively deposit the deposited layer 330 over second portions of the at least one semiconducting layer(s) 1030 that are substantially devoid of the NIC 310, in some examples, the pixel region 3010, such that the deposited layer 330 is deposited on the at least one semiconducting layer(s) 1030 to form the second electrode 1040.

In some non-limiting examples, the transmissive region 3020 of the device 3110 remains substantially devoid of any materials that may substantially affect the transmission of light therethrough. In particular, as shown in the figure, the TFT structure 1100, and/or the first electrode 1020 are positioned, in a cross-sectional aspect below the sub-pixel 244*x* corresponding thereto and beyond the transmissive region 3020. As a result, these components do not attenuate or impede light from being transmitted through the transmissive region 3020. In some non-limiting examples, such arrangement allows a viewer viewing the device 3110 from a typical viewing distance to see through the device 3110, in some non-limiting examples, when all of the (sub-) pixel(s) 1240/244*x* are not emitting, thus creating a transparent AMOLED device 3110.

By providing a transmissive region 3020 that is free, and/or substantially devoid of any deposited layer 330, the transmittance in such region may, in some non-limiting examples, be favorably enhanced, by way of non-limiting example, by comparison to the device 3100 of FIG. 31B.

While not shown in the figure, in some non-limiting examples, the device 3110 may further comprise an NPC 520 disposed between the deposited layer 330 and the at least one semiconducting layer(s) 1030. In some non-limiting examples, the NPC 520 may also be disposed between the NIC 310 and the PDL(s) 1340.

In some non-limiting examples, the NIC 310 may be formed concurrently with the at least one semiconducting layer(s) 1030. By way of non-limiting example, at least one material used to form the NIC 310 may also be used to form the at least one semiconducting layer(s) 1030. In such non-limiting example, a number of stages for fabricating the device 3110 may be reduced.

Those having ordinary skill in the relevant art will appreciate that in some non-limiting examples, various other layers, and/or coatings, including without limitation those forming the at least one semiconducting layer(s) 1030, and/or the deposited layer 330, may cover a part of the transmissive region 3020, especially if such layers, and/or coatings are substantially transparent. In some non-limiting examples, the PDL(s) 1340 may have a reduced thickness, including without limitation, by forming a well therein, which in some non-limiting examples is not dissimilar to the well defined for emissive region(s) 2210, to further facilitate light transmission through the transmissive region 3020.

Those having ordinary skill in the relevant art will appreciate that (sub-) pixel(s) 1240/244*x* arrangements other than the arrangement shown in FIGS. 31A and 31C may, in some non-limiting examples, be employed.

Selective Deposition of a Conductive Coating Over Emissive Region(s)

As discussed above, modulating the thickness of an electrode 1020, 1040, 2150, and/or a busbar 5050 in and across a lateral aspect 1310 of emissive region(s) 2210 of a (sub-) pixel 1240/244*x* may impact the microcavity effect observable. In some non-limiting examples, selective deposition of at least one deposited layer 330 through deposition of at least one patterning coating 410, such as an NIC 310, and/or an NPC 520, in the lateral aspects 1310 of emissive region(s) 2210 corresponding to different sub-pixel(s) 244*x* in a pixel region 3010 may allow the optical microcavity effect in each emissive region 2210 to be controlled, and/or modulated to optimize desirable optical microcavity effects on a sub-pixel 244*x* basis, including without limitation, an emission spectrum, a luminous intensity, and/or an angular dependence of a brightness, and/or a color shift of emitted light.

Such effects may be controlled by modulating the thickness of the patterning coating 410, such as an NIC 310, and/or an NPC 520, disposed in each emissive region 2210 of the sub-pixel(s) 244*x* independently of one another. By way of non-limiting example, the thickness of an NIC 310 disposed over a B(lue) sub-pixel 2443 may be less than the thickness of an NIC 310 disposed over a G(reen) sub-pixel 2442, and the thickness of the NIC disposed over a G(reen) sub-pixel 2442 may be less than the thickness of an NIC 310 disposed over a R(ed) sub-pixel 2441.

In some non-limiting examples, such effects may be controlled to an even greater extent by independently modulating the thickness of not only the patterning coating 410, but also the deposited layer 330 deposited in part(s) of each emissive region 2210 of the sub-pixel(s) 244*x*.

Such a mechanism is illustrated in the schematic diagrams of FIGS. 32A-32D. These diagrams illustrate various stages of manufacturing an example version, shown generally at 3200, of the device 1000.

Figure 32A:
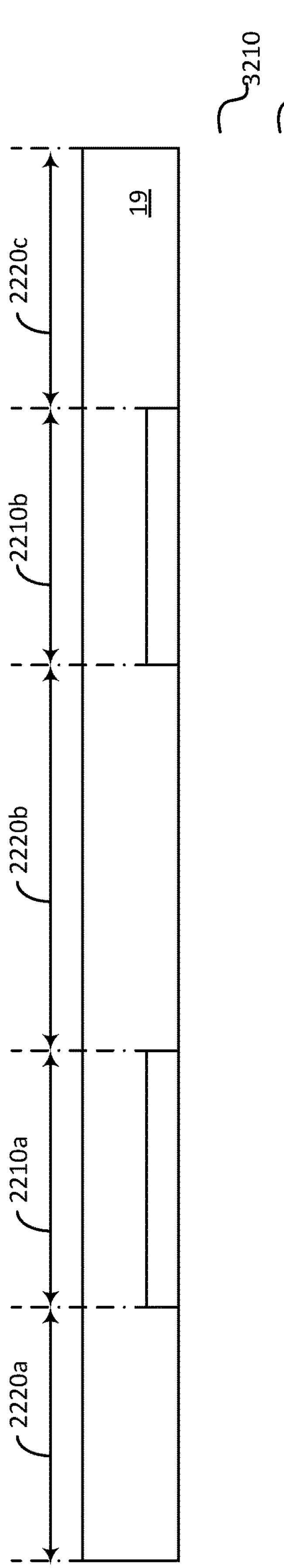
FIGS. 32A-32D are schematic diagrams that show example stages of an example process for manufacturing an example version of the device of FIG. 13 to provide emissive region having a second electrode of different thickness according to an example in the present disclosure.

FIG. 32A shows a stage 3210 of manufacturing the device 3200. In the stage 3210, a substrate 10 may be provided. The substrate 10 comprises a first emissive region 2210*a* and a second emissive region 2210*b*. In some non-limiting examples, the first emissive region 2210*a*, and/or the second emissive region 2210*b* may be surrounded, and/or spaced-apart by at least one non-emissive region 2220*a*-2220*c*. In some non-limiting examples, the first emissive region 2210*a*, and/or the second emissive region 2210*b* may each correspond to a (sub-) pixel 1240/244*x*.

Figure 32B:
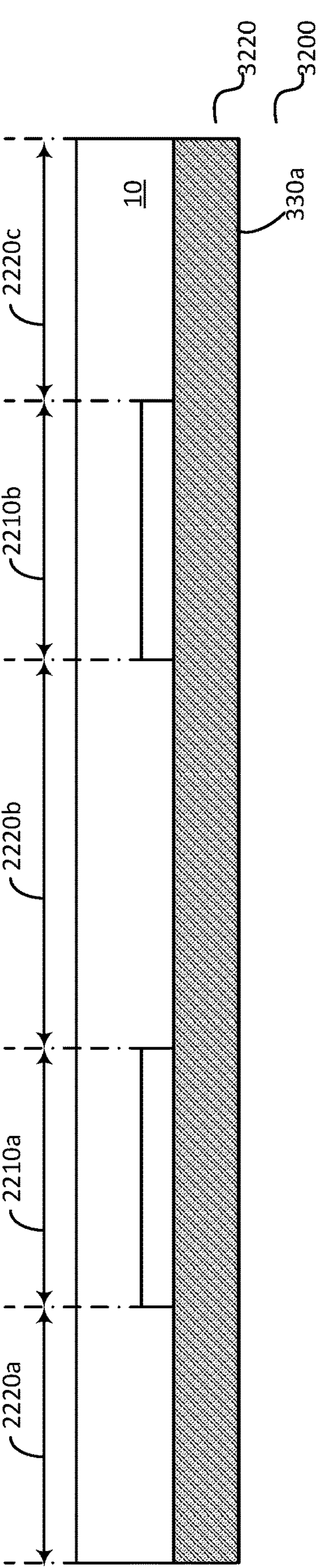

FIG. 32B shows a stage 3220 of manufacturing the device 3200. In the stage 3220, a first deposited layer 330*a* is deposited on an exposed layer surface 11 of an underlying material, in this case the substrate 10. The first deposited layer 330*a* is deposited across the first emissive region 2210*a* and the second emissive region 2210*b*. In some non-limiting examples, the first deposited layer 330*a* is deposited across at least one of the non-emissive regions 2220*a*-2220*c*.

In some non-limiting examples, the first deposited layer 330*a* may be deposited using an open mask 600, and/or a mask-free deposition process.

Figure 32C:
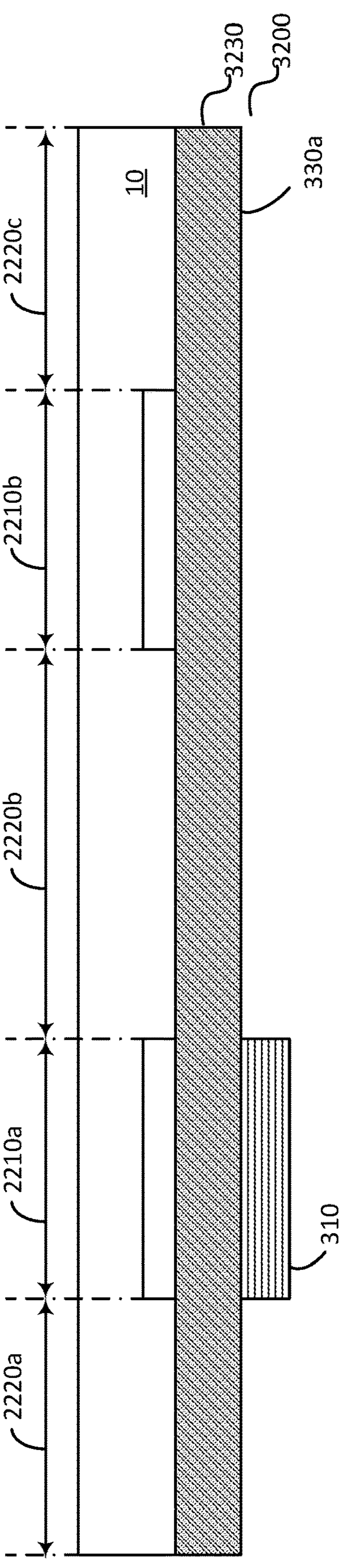

FIG. 32C shows a stage 3230 of manufacturing the device 3200. In the stage 3230, an NIC 310 is selectively deposited over a first portion 301 of the first deposited layer 330*a*. As shown in the figure, in some non-limiting examples, the NIC 310 is deposited across the first emissive region 2210*a*, while in some non-limiting examples, the second emissive region 2210*b*, and/or in some non-limiting examples, at least one of the non-emissive regions 2220*a*-2220*c* are substantially devoid of the NIC 310.

Figure 32D:
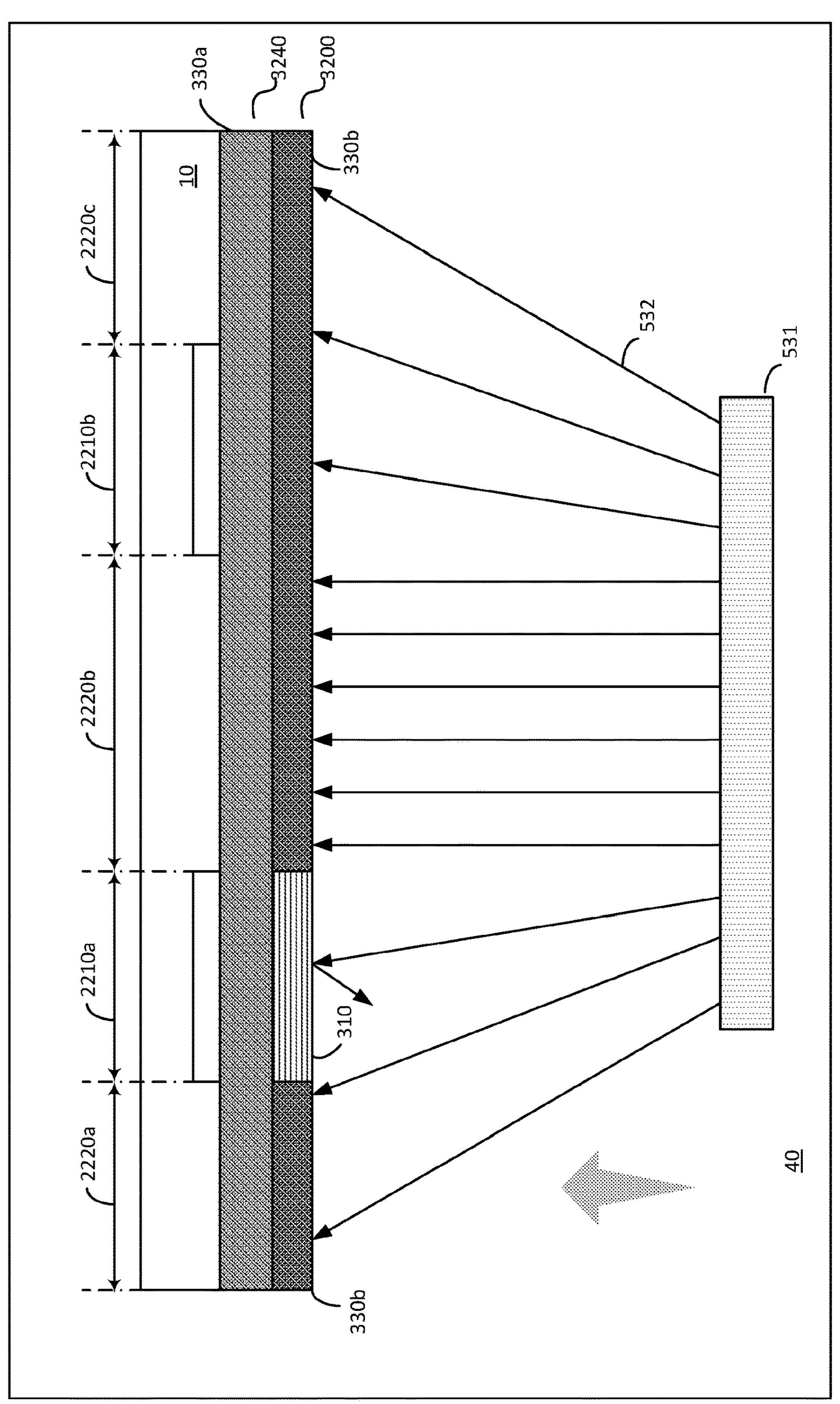

FIG. 32D shows a stage 3240 of manufacturing the device 3200. In the stage 3240, a second deposited layer 330*b* may be deposited across those second portions 302 of the device 3200 that are substantially devoid of the NIC 310. In some non-limiting examples, the second deposited layer 330*b* may be deposited across the second emissive region 2210*b*, and/or, in some non-limiting examples, at least one of the non-emissive region 2220*a*-2220*c*.

Those having ordinary skill in the relevant art will appreciate that the evaporative process shown in FIG. 32D and described in detail in connection with any one or more of FIGS. 4-5B, 15A-15B, and/or 16A-16C may, although not shown, for simplicity of illustration, equally be deposited in any one or more of the preceding stages described in FIGS. 32A-32C.

Those having ordinary skill in the relevant art will appreciate that the manufacture of the device 3200 may in some non-limiting examples, encompass additional stages that are not shown for simplicity of illustration. Such additional stages may include, without limitation, depositing one or more 0NICs 310, depositing one or more NPCs 520, depositing one or more additional deposited layers 330, depositing an outcoupling coating, and/or encapsulation of the device 3200.

Those having ordinary skill in the relevant art will appreciate that while the manufacture of the device 3200 has been described and illustrated in connection with a first emissive region 2210*a* and a second emissive region 2210*b*, in some non-limiting examples, the principles derived therefrom may equally be deposited on the manufacture of devices having more than two emissive regions 1910.

In some non-limiting examples, such principles may be deposited on deposited layer(s) 330 of varying thickness for emissive region(s) 2210 corresponding to sub-pixel(s) 244*x*, in some non-limiting examples, in an OLED display device 1000, having different emission spectra. In some non-limiting examples, the first emissive region 2210*a* may correspond to a sub-pixel 244*x* configured to emit light of a first wavelength, and/or emission spectrum, and/or in some non-limiting examples, the second emissive region 2210*b* may correspond to a sub-pixel 244*x* configured to emit light of a second wavelength, and/or emission spectrum. In some non-limiting examples, the device 3200 may comprise a third emissive region 2210*c* (FIG. 33A) that may correspond to a sub-pixel 244*x* configured to emit light of a third wavelength, and/or emission spectrum.

In some non-limiting examples, the first wavelength may be less than, greater than, and/or equal to at least one of the second wavelength, and/or the third wavelength. In some non-limiting examples, the second wavelength may be less than, greater than, and/or equal to at least one of the first wavelength, and/or the third wavelength. In some non-limiting examples, the third wavelength may be less than, greater than, and/or equal to at least one of the first wavelength, and/or the second wavelength.

In some non-limiting examples, the device 3200 may also comprise at least one additional emissive region 2210 (not shown) that may in some non-limiting examples be configured to emit light having a wavelength, and/or emission spectrum that is substantially identical to at least one of the first emissive region 2210*a*, the second emissive region 2210*b*, and/or the third emissive region 2210*c*.

In some non-limiting examples, the NIC 310 may be selectively deposited using a shadow mask 415 that may also have been used to deposit the at least one semiconducting layer 1030 of the first emissive region 2210*a*. In some non-limiting examples, such shared use of a shadow mask 415 may allow the optical microcavity effect(s) to be tuned for each sub-pixel 244*x* in a cost-effective manner.

The use of such mechanism to create an example version 3300 of the device 1000 having sub-pixel(s) 244*x* of a given pixel 1240 with modulated micro-cavity effects is described in FIGS. 33A-33D.

Figure 33A:
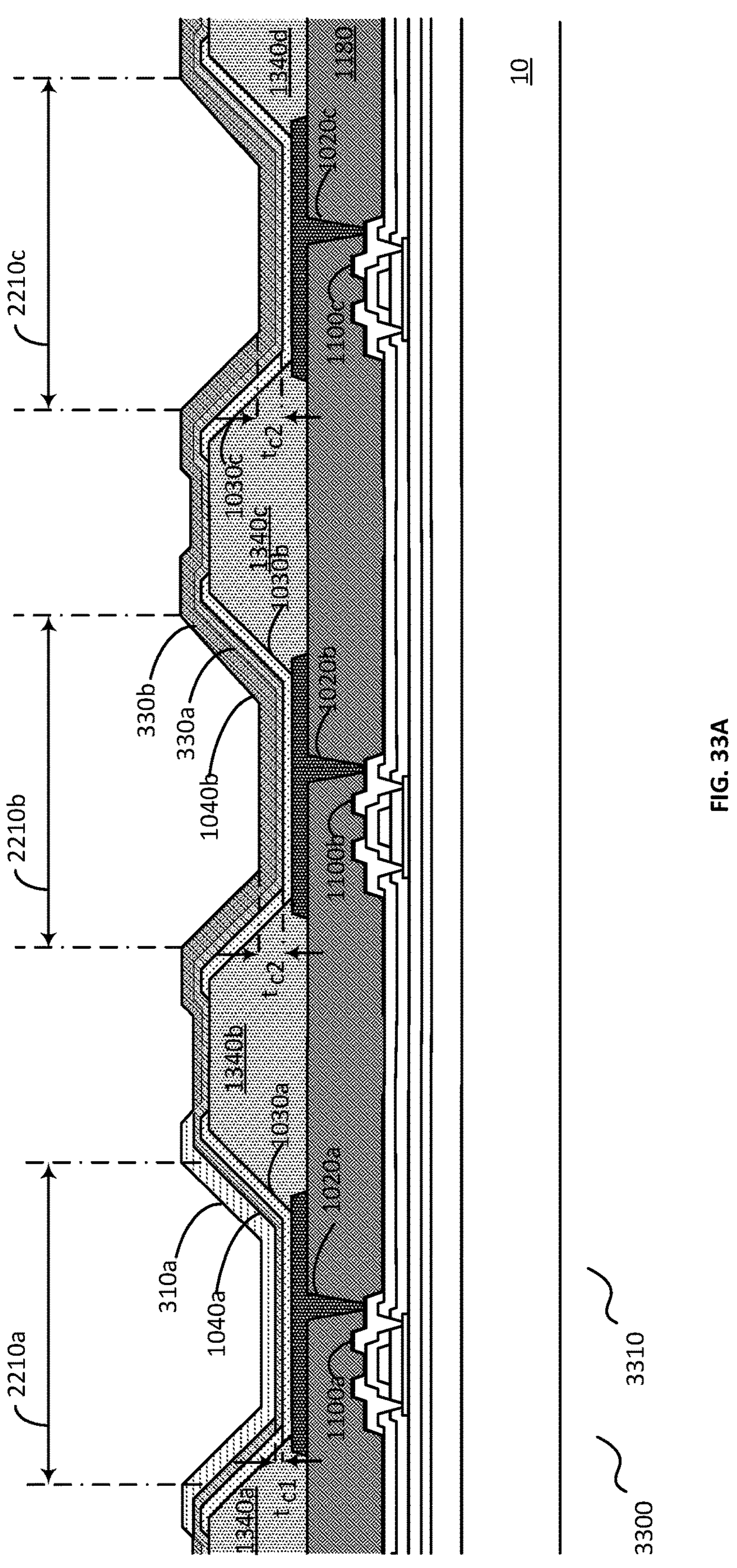
FIGS. 33A-33D are schematic diagrams that show example stages of an example process for manufacturing an example version of the device of FIG. 13 having sub-pixel regions having a second electrode of different thickness according to an example in the present disclosure.

In FIG. 33A, a stage 3310 of manufacture of the device 3300 is shown as comprising a substrate 10, a TFT insulating layer 1180 and a plurality of first electrodes 1020*a*-1020*c*, formed on a surface of the TFT insulating layer 1180.

The substrate 10 may comprise the base substrate 1012 (not shown for purposes of simplicity of illustration), and/or at least one TFT structure 1100*a*-1100*c* corresponding to and for driving an emissive region 2210*a*-2210*c* each having a corresponding sub-pixel 244*x*, positioned substantially thereunder and electrically coupled to its associated first electrode 1020*a*-1020*c*. PDL(s) 1340*a*-1340*d* are formed over the substrate 10, to define emissive region(s) 2210*a*-2210*c*. The PDL(s) 1340*a*-1340*d* cover edges of their respective first electrodes 1020*a*-1020*c*.

In some non-limiting examples, at least one semiconducting layer 1030*a*-1030*c* is deposited over exposed region(s) of their respective first electrodes 1020*a*-1020*c* and, in some non-limiting examples, at least parts of the surrounding PDLs 1340*a*-1340*d*.

In some non-limiting examples, a first deposited layer 330*a* may be deposited over the at least one semiconducting layer(s) 1030*a*-1030*c*. In some non-limiting examples, the first deposited layer 330*a* may be deposited using an open mask 600, and/or mask-free deposition process. In some non-limiting examples, such deposition may be effected by exposing the entire exposed layer surface 11 of the device 3300 to a vapor flux of deposited material 531, which in some non-limiting examples may be Mg, to deposit the first deposited layer 330*a* over the at least one semiconducting layer(s) 1030*a*-1030*c* to form a first layer of the second electrode 1040_a_ (not shown), which in some non-limiting examples may be a common electrode, at least for the first emissive region 2210_a_. Such common electrode has a first thickness $t_{c1}$ in the first emissive region 2210_a_. The first thickness $t_{c1}$ may correspond to a thickness of the first deposited layer 330_a_.

In some non-limiting examples, a first NIC 310_a_ is selectively deposited over first portions 301 of the device 3300, comprising the first emissive region 2210_a_.

In some non-limiting examples, a second deposited layer 330_b_ may be deposited over the device 3300. In some non-limiting examples, the second deposited layer 330_b_ may be deposited using an open mask 600, and/or mask-free deposition process. In some non-limiting examples, such deposition may be effected by exposing the entire exposed layer surface 11 of the device 3300 to a vapour flux of deposited material 531, which in some non-limiting examples may be Mg, to deposit the second deposited layer 330_b_ over the first deposited layer 330_a_ that is substantially devoid of the first NIC 310_a_, in some examples, the second and third emissive region 2210_b_, 2210_c_, and/or at least part(s) of the non-emissive region(s) 2220 in which the PDLs 1340_a_-1340_d_ lie, such that the second deposited layer 330_b_ is deposited on the second portion(s) 302 of the first deposited layer 330_a_ that are substantially devoid of the first NIC 310_a_ to form a second layer of the second electrode 1040_b_ (not shown), which in some non-limiting examples, may be a common electrode, at least for the second emissive region 2210_b_. Such common electrode has a second thickness $t_{c2}$ in the second emissive region 2210_b_. The second thickness $t_{c2}$ may correspond to a combined thickness of the first deposited layer 330_a_ and of the second deposited layer 330_b_ and may in some non-limiting examples be greater than the first thickness $t_{c1}$.

Figure 33B:
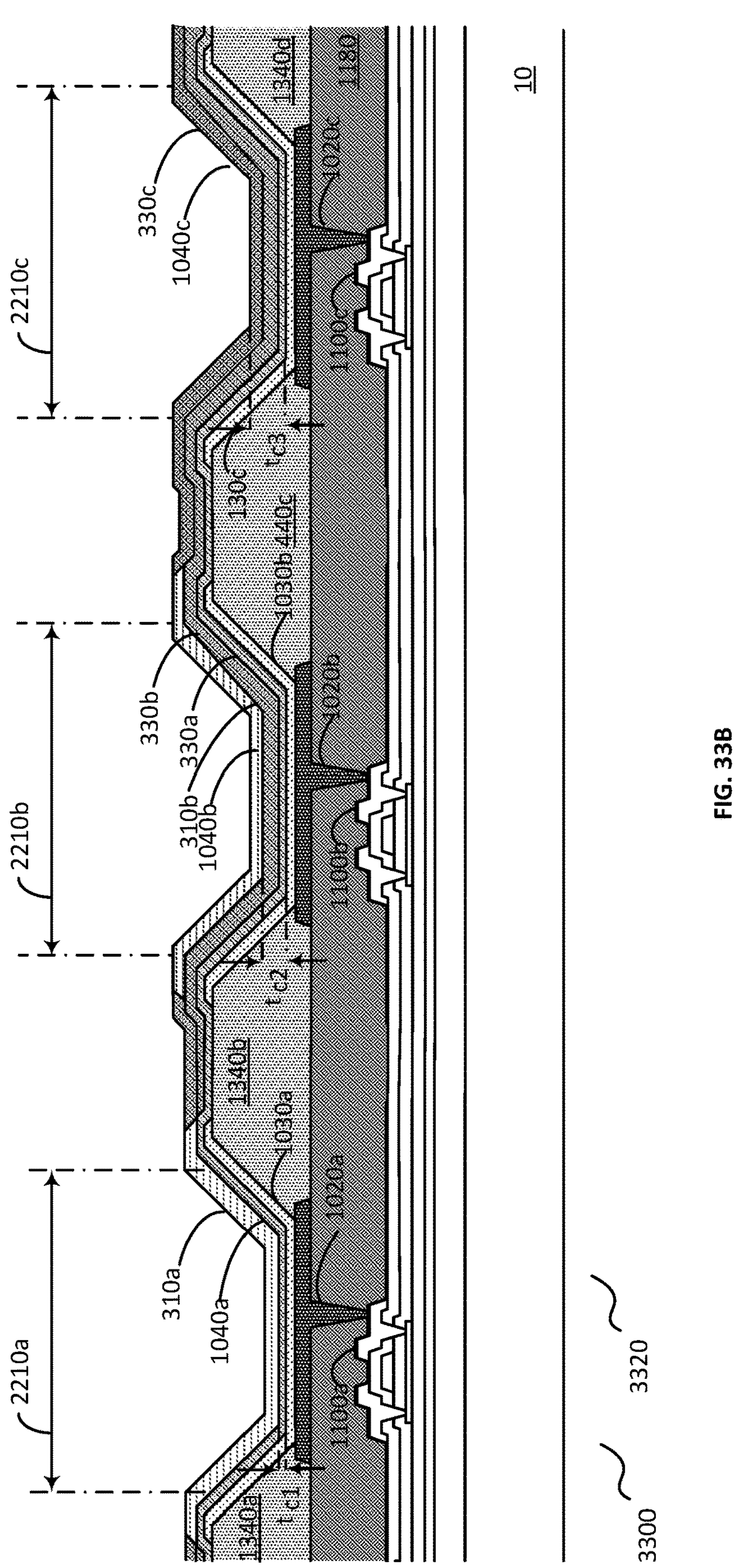

In FIG. 33B, a stage 3320 of manufacture of the device 3300 is shown.

In some non-limiting examples, a second NIC 310_b_ is selectively deposited over further first portions 301 of the device 3300, comprising the second emissive region 2210_b_.

In some non-limiting examples, a third deposited layer 330_c_ may be deposited over the device 3300. In some non-limiting examples, the third deposited layer 330_c_ may be deposited using an open mask 600, and/or mask-free deposition process. In some non-limiting examples, such deposition may be effected by exposing the entire exposed layer surface 11 of the device 3300 to a vapour flux of deposited material 531, which in some non-limiting examples may be Mg, to deposit the third deposited layer 330_c_ over the second deposited layer 330_b_ that is substantially devoid of either the first NIC 310_a_ or the second NIC 310_b_, in some examples, the third emissive region 2210_c_, and/or at least part(s) of the non-emissive region 2220 in which the PDLs 1340_a_-1340_d_ lie, such that the third deposited layer 330_c_ is deposited on the further second portion(s) 302 of the second deposited layer 330_b_ that are substantially devoid of the second NIC 310_b_ to form a third layer of the second electrode 1040_c_ (not shown), which in some non-limiting examples, may be a common electrode, at least for the third emissive region 2210_c_. Such common electrode has a third thickness $t_{c3}$ in the third emissive region 2210_c_. The third thickness $t_{c3}$ may correspond to a combined thickness of the first deposited layer 330_a_, the second deposited layer 330_b_ and the third deposited layer 330_c_ and may in some non-limiting examples be greater than either or both of the first thickness $t_{c1}$ and the second thickness $t_{c2}$.

Figure 33C:
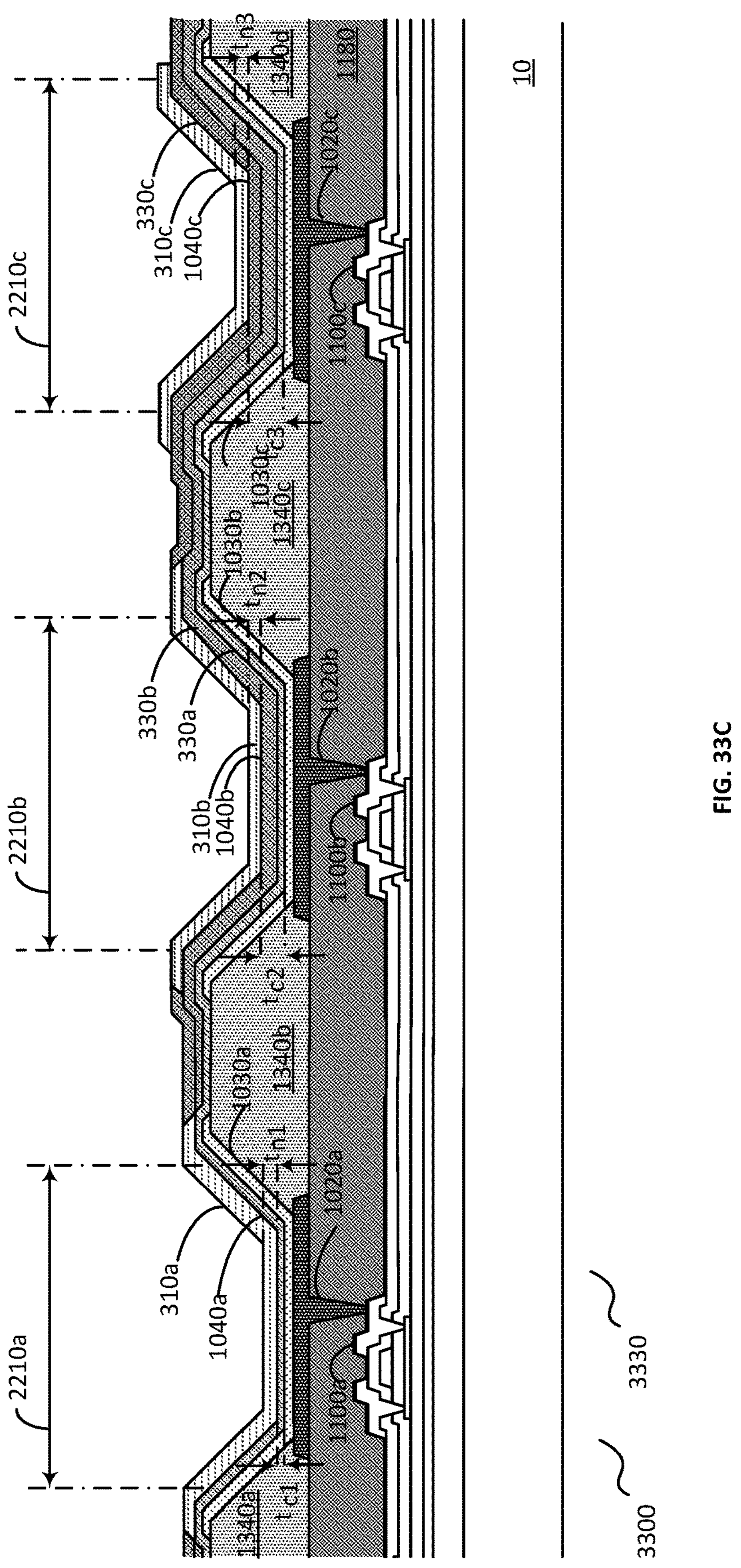

In FIG. 33C, a stage 3330 of manufacture of the device 3300 is shown.

In some non-limiting examples, a third NIC 310_c_ is selectively deposited over additional first portions 301 of the device 3300, comprising the third emissive region 2210_b_.

Figure 33D:
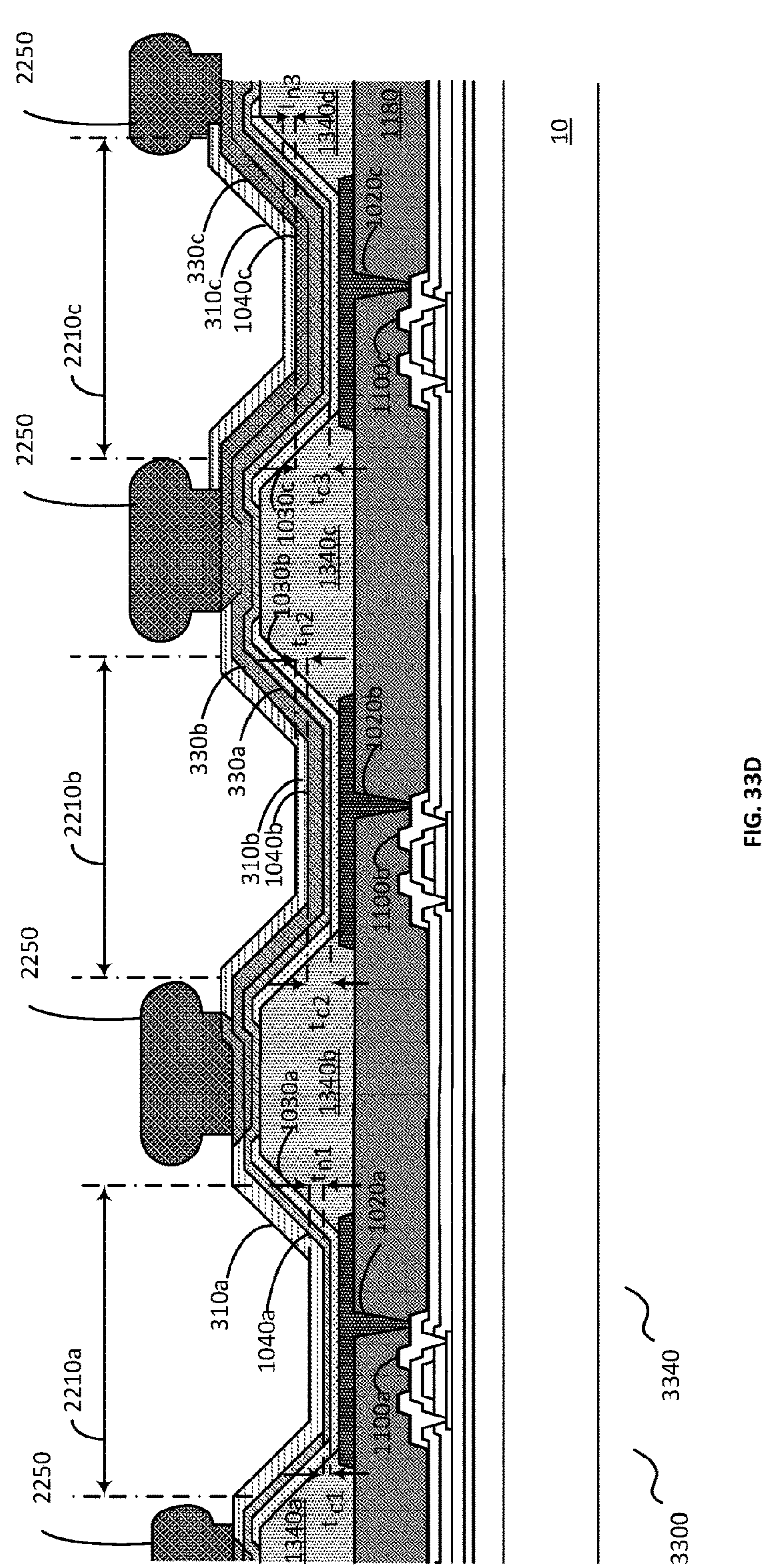

In FIG. 33D, a stage 3340 of manufacture of the device 3300 is shown.

In some non-limiting examples, at least one auxiliary electrode 2150 is disposed in the non-emissive region(s) 2220 of the device 3300 between neighbouring emissive regions 2210_a_-2210_c_ thereof and in some non-limiting examples, over the PDLs 1340_a_-1340_d_. In some non-limiting examples, the deposited layer 330 used to deposit the at least one auxiliary electrode 2150 may be deposited using an open mask 600, and/or mask-free deposition process. In some non-limiting examples, such deposition may be effected by exposing the entire exposed layer surface 11 of the device 3300 to a vapour flux of deposited material 531, which in some non-limiting examples may be Mg, to deposit the deposited layer 330 over the exposed parts of the first deposited layer 330_a_, the second deposited layer 330_b_ and the third deposited layer 330_c_ that is substantially devoid of any of the first NIC 310_a_ the second NIC 310_b_, and/or the third NIC 310_c_, such that the deposited layer 330 is deposited on an additional second portion 302 comprising the exposed part(s) of the first deposited layer 330_a_, the second deposited layer 330_b_, and/or the third deposited layer 330_c_ that are substantially devoid of any of the first NIC 310_a_, the second NIC 310_b_, and/or the third NIC 310_c_ to form the at least one auxiliary electrode 2150. Each of the at least one auxiliary electrode 2150 is electrically coupled to a respective one of the second electrodes 1040_a_-1040_c_. In some non-limiting examples, each of the at least one auxiliary electrode 2150 is in physical contact with such second electrode 1040_a_-1040_c_.

In some non-limiting examples, the first emissive region 2210_a_, the second emissive region 2210_b_ and the third emissive region 2210_c_ may be substantially devoid of the material used to form the at least one auxiliary electrode 2150.

In some non-limiting examples, at least one of the first deposited layer 330_a_, the second deposited layer 330_b_, and/or the third deposited layer 330_c_ may be transmissive, and/or substantially transparent in at least a part of the visible wavelength range of the electromagnetic spectrum. Thus, if the second deposited layer 330_b_, and/or the third deposited layer 330_a_ (and/or any additional deposited layer(s) 330) is disposed on top of the first deposited layer 330_a_ to form a multi-coating electrode 1020, 1040, 2150, and/or a busbar 5050 that may also be transmissive, and/or substantially transparent in at least a part of the visible wavelength range of the electromagnetic spectrum. In some non-limiting examples, the transmittance of any one or more of the first deposited layer 330_a_, the second deposited layer 330_b_, the third deposited layer 330_c_, any additional deposited layer(s) 330, and/or the multi-coating electrode 1020, 1040, 2150, and/or a busbar 5050 may be greater than about: 30%, 40% 45%, 50%, 60%, 70%, 75%, or 80% in at least a part of the visible spectrum.

In some non-limiting examples, a thickness of the first deposited layer 330_a_, the second deposited layer 330_b_, and/or the third deposited layer 330_c_ may be made relatively thin to maintain a relatively high transmittance. In some non-limiting examples, the thickness of the first deposited layer 330_a_ may be between about: 5-30 nm, 8-25 nm, or 10-20 nm. In some non-limiting examples, the thickness of the second deposited layer 330_b_ may be between about: 1-25 nm, 1-20 nm, 1-15 nm, 1-10 nm, or 3-6 nm. In some non-limiting examples, the thickness of the third deposited layer 330*c* may be between about: 1-25 nm, 1-20 nm, 1-15 nm, 1-10 nm, or 3-6 nm. In some non-limiting examples, the thickness of a multi-coating electrode formed by a combination of the first deposited layer 330*a*, the second deposited layer 330*b*, the third deposited layer 330*c*, and/or any additional deposited layer(s) 330 may be between about: 6-35 nm, 10-30 nm, 10-25 nm, or 12-18 nm.

In some non-limiting examples, a thickness of the at least one auxiliary electrode 2150 may be greater than the thickness of the first deposited layer 330*a*, the second deposited layer 330*b*, the third deposited layer 330*c*, and/or a common electrode. In some non-limiting examples, the thickness of the at least one auxiliary electrode 2150 may be greater than about: 50 nm, 80 nm, 100 nm, 150 nm, 200 nm, 300 nm, 400 nm, 500 nm, 700 nm, 800 nm, 1 μm, 1.2 μm, 1.5 μm, 2 μm, 2.5 μm, or 3 μm.

In some non-limiting examples, the at least one auxiliary electrode 2150 may be substantially non-transparent, and/or opaque. However, since the at least one auxiliary electrode 2150 may be in some non-limiting examples provided in a non-emissive region 2220 of the device 3300, the at least one auxiliary electrode 2150 may not cause or contribute to significant optical interference. In some non-limiting examples, the transmittance of the at least one auxiliary electrode 2150 may be less than about: 50%, 70%, 80%, 85%, 90%, or 95% in at least a part of the visible spectrum.

In some non-limiting examples, the at least one auxiliary electrode 2150 may absorb light in at least a part of the visible spectrum.

In some non-limiting examples, a thickness of the first NIC 310*a*, the second NIC 310*b*, and/or the third NIC 310*c* disposed in the first emissive region 2210*a*, the second emissive region 2210*b*, and/or the third emissive region 2210*c* respectively, may be varied according to a colour, and/or emission spectrum of light emitted by each emissive region 2210*a*-2210*c*. As shown in FIGS. 33C-33D, the first NIC 310*a* may have a first NIC thickness $t_{n1}$, the second NIC 310*b* may have a second NIC thickness $t_{n2}$, and/or the third NIC 310*c* may have a third NIC thickness $t_{n3}$. In some non-limiting examples, the first NIC thickness $t_{n1}$, the second NIC thickness $t_{n2}$, and/or the third NIC thickness $t_{n3}$, may be substantially the same as one another. In some non-limiting examples, the first NIC thickness $t_{n1}$, the second NIC thickness $t_{n2}$, and/or the third NIC thickness $t_{n3}$, may be different from one another.

In some non-limiting examples, the device 3300 may also comprise any number of emissive regions 2210*a*-2210*c*, and/or (sub-) pixel(s) 1240/244*x* thereof. In some non-limiting examples, a device may comprise a plurality of pixels 1240, wherein each pixel 1240 comprises two, three or more sub-pixel(s) 244*x*.

Those having ordinary skill in the relevant art will appreciate that the specific arrangement of (sub-) pixel(s) 1240/244*x* may be varied depending on the device design. In some non-limiting examples, the sub-pixel(s) 244*x* may be arranged according to known arrangement schemes, including without limitation, RGB side-by-side, diamond, and/or PenTile®.

Figure 34:
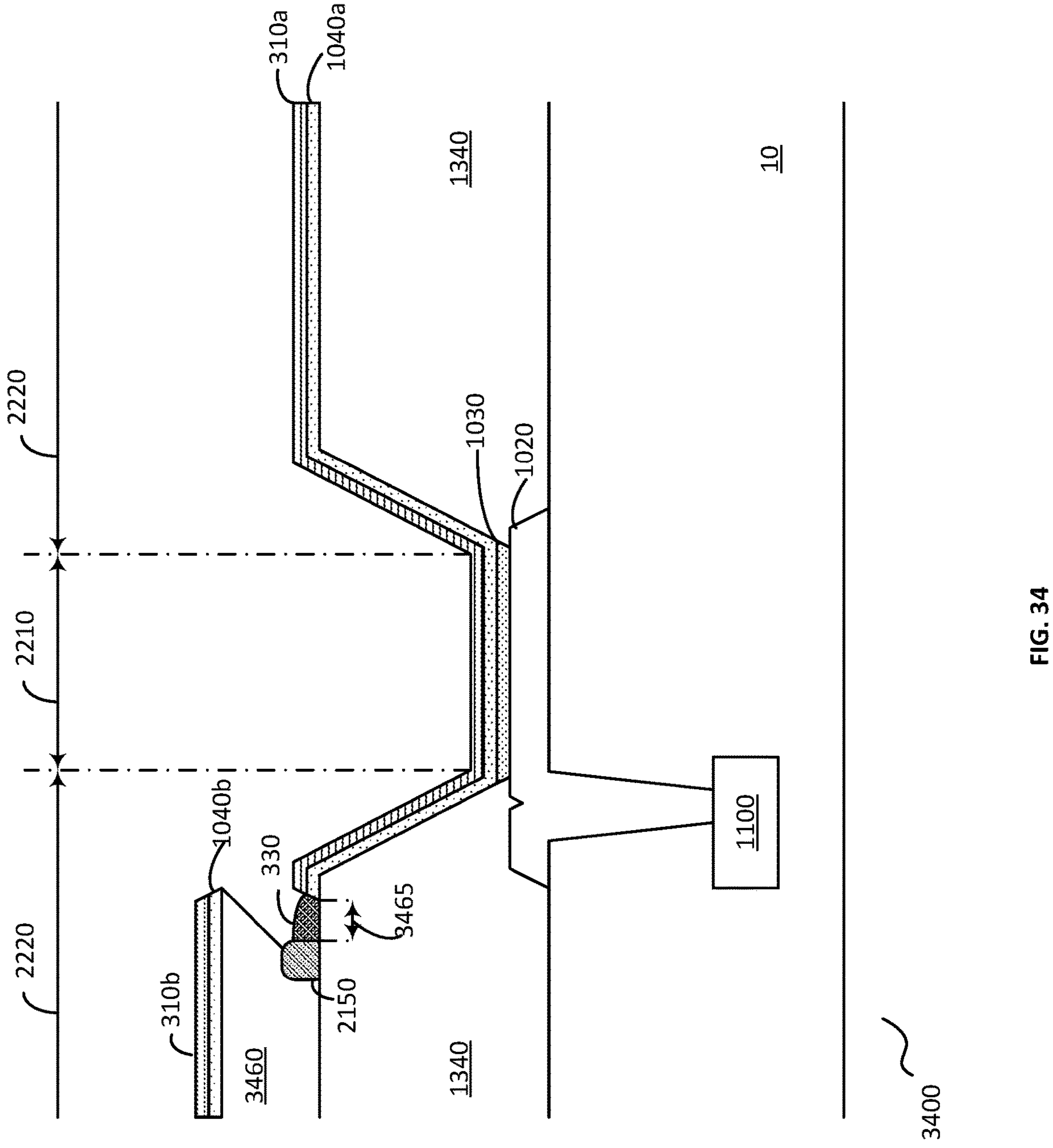
FIG. 34 is a schematic diagram illustrating an example cross-sectional view of an example version of the device of FIG. 13 in which a second electrode is coupled to an auxiliary electrode according to an example in the present disclosure.

Conductive Coating for Electrically Coupling an Electrode to an Auxiliary Electrode Turning to FIG. 34, there is shown a cross-sectional view of an example version 3400 of the device 1000. The device 3400 comprises in a lateral aspect, an emissive region 2210 and an adjacent non-emissive region 2220.

In some non-limiting examples, the emissive region 2210 corresponds to a sub-pixel 244*x* of the device 3400. The emissive region 2210 has a substrate 10, a first electrode 1020, a second electrode 1040 and at least one semiconducting layer 1030 arranged therebetween.

The first electrode 1020 is disposed on an exposed layer surface 11 of the substrate 10. The substrate 10 comprises a TFT structure 1100, that is electrically coupled to the first electrode 1020. The edges, and/or perimeter of the first electrode 1020 is generally covered by at least one PDL 1340.

The non-emissive region 2220 has an auxiliary electrode 2150 and a first part of the non-emissive region 2220 has a projecting structure 3460 arranged to project over and overlap a lateral aspect of the auxiliary electrode 2150. The projecting structure 3460 may extend laterally to provide a sheltered region 3465. By way of non-limiting example, the projecting structure 3460 may be recessed at, and/or near the auxiliary electrode 2150 on at least one side to provide the sheltered region 3465. As shown, the sheltered region 3465 may in some non-limiting examples, correspond to a region on a surface of the PDL 1340 that overlaps with a lateral projection of the projecting structure 3460. The non-emissive region 2220 further comprises a deposited layer 330 disposed in the sheltered region 3465. The deposited layer 330 electrically couples the auxiliary electrode 2150 with the second electrode 1040.

An NIC 310*a* is disposed in the emissive region 2210 over the exposed layer surface 11 of the second electrode 1040. In some non-limiting examples, an exposed layer surface 11 of the projecting structure 3460 is coated with a residual thin conductive film 3440 from deposition of a thin conductive film to form the second electrode 1040. In some non-limiting examples, a surface of the residual thin conductive film 3440 is coated with a residual NIC 310*b* from deposition of the NIC 310.

However, because of the lateral projection of the projecting structure 3460 over the sheltered region 3465, the sheltered region 3465 is substantially devoid of NIC 310. Thus, when a deposited layer 330 is deposited on the device 3400 after deposition of the NIC 310, the deposited layer 330 is deposited on, and/or migrates to the sheltered region 3465 to couple the auxiliary electrode 2150 to the second electrode 1040.

Those having ordinary skill in the relevant art will appreciate that a non-limiting example has been shown in FIG. 34 and that various modifications may be apparent. By way of non-limiting example, the projecting structure 3460 may provide a sheltered region 3465 along at least two of its sides. In some non-limiting examples, the projecting structure 3460 may be omitted and the auxiliary electrode 2150 may include a recessed portion that defines the sheltered region 3465. In some non-limiting examples, the auxiliary electrode 2150 and the deposited layer 330 may be disposed directly on a surface of the substrate 10, instead of the PDL 1340.

Selective Deposition of Optical Coating

In some non-limiting examples, a device (not shown), which in some non-limiting examples may be an opto-electronic device, comprises a substrate 10, an NIC 310 and an optical coating. The NIC 310 covers a first lateral portion 301 of the substrate 10. The optical coating covers a second lateral portion 302 of the substrate. At least a part of the NIC 310 is substantially devoid of a closed coating 340 of the optical coating.

In some non-limiting examples, the optical coating may be used to modulate optical properties of light being transmitted, emitted, and/or absorbed by the device, including without limitation, plasmon modes. By way of non-limiting example, the optical coating may be used as an optical filter, index-matching coating, optical out-coupling coating, scattering layer, diffraction grating, and/or parts thereof.

In some non-limiting examples, the optical coating may be used to modulate at least one optical microcavity effect in the device by, without limitation, tuning the total optical path length, and/or the refractive index thereof. At least one optical property of the device may be affected by modulating at least one optical microcavity effect including without limitation, the output light, including without limitation, an angular dependence of a brightness, and/or a color shift thereof. In some non-limiting examples, the optical coating may be a non-electrical component, that is, the optical coating may not be configured to conduct, and/or transmit electrical current during normal device operations.

In some non-limiting examples, the optical coating may be formed of any material used as a deposited layer 330, and/or employing any mechanism of depositing a deposited layer 330 as described herein.

Edge Effects of NICs and Deposited Layers

FIGS. 35A-35I describe various potential behaviours of NICs 310 at a deposition interface with deposited layers 330.

Figure 35A:
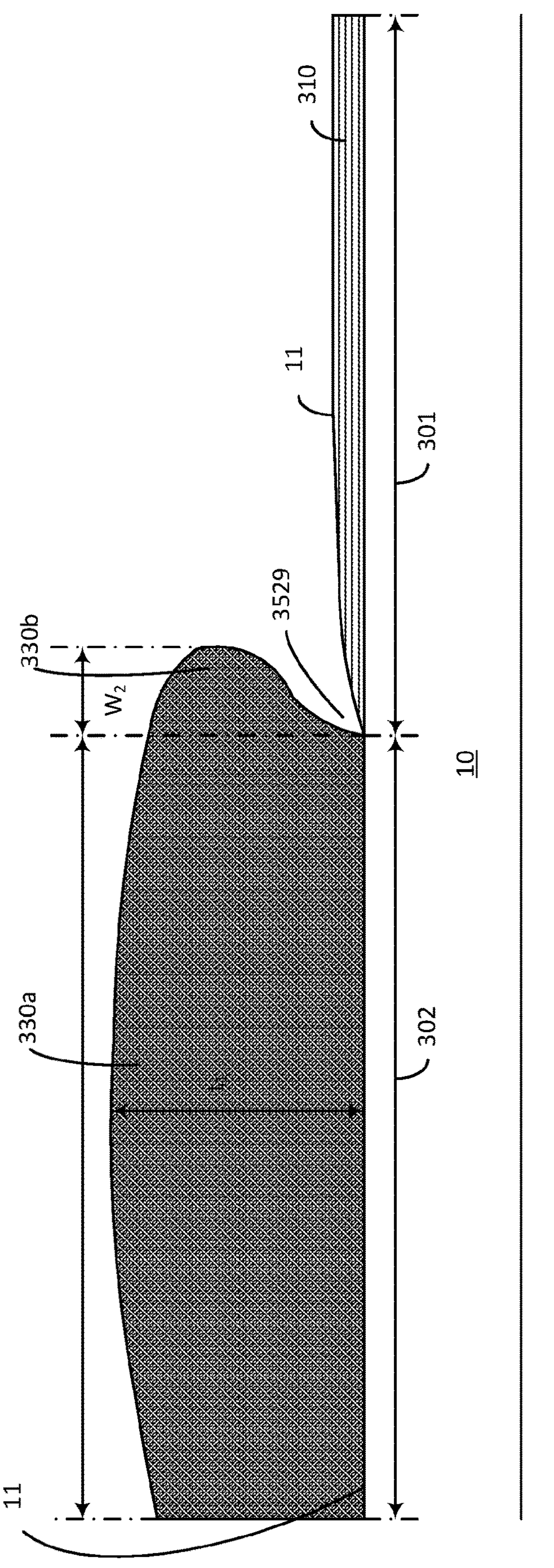
FIGS. 35A-35I are schematic diagrams that show various potential behaviours of an NIC at a deposition interface with a deposited layer in an example version of the device of FIG. 13, according to various examples in the present disclosure.

Turning to FIG. 35A, there is shown a first example of a part of an example version 3500 of the device 1000 at an NIC deposition boundary. The device 3500 comprises a substrate 10 having an exposed layer surface 11. An NIC 310 is deposited over a first portion 301 of the exposed layer surface 11. A deposited layer 330 is deposited over a second portion 302 of the exposed layer surface 11. As shown, by way of non-limiting example, the first portion 301 and the second portion 302 are distinct and non-overlapping parts of the exposed layer surface 11.

The deposited layer 330 comprises a first part 330*a* and a remaining part 330*b*. As shown, by way of non-limiting example, the first part 330*a* of the deposited layer 330 substantially covers the second portion 302 and the second part 330*b* of the deposited layer 330 partially projects over, and/or overlaps a first part of the NIC 310.

In some non-limiting examples, since the NIC 310 may be formed such that its exposed layer surface 11 exhibits a relatively low initial sticking probability $S_0$ against deposition of the deposited material 531, there is a gap 3529 formed between the projecting, and/or overlapping second part 330*b* of the deposited layer 330 and the exposed layer surface 11 of the NIC 310. As a result, the second part 330*b* is not in physical contact with the NIC 310 but is spaced-apart therefrom by the gap 3529 in a cross-sectional aspect. In some non-limiting examples, the first part 330*a* of the deposited layer 330 may be in physical contact with the NIC 310 at an interface, and/or boundary between the first portion 301 and the second portion 302.

In some non-limiting examples, the projecting, and/or overlapping second part 330*b* of the deposited layer 330 may extend laterally over the NIC 310 by a comparable extent as a thickness $t_1$ of the deposited layer 330. By way of non-limiting example, as shown, a width $w_2$ of the second part 330*b* may be comparable to the thickness $t_1$. In some non-limiting examples, a ratio off $w_2:t_1$ may be in a range of between about: 1:1-1:3, 1:1-1:1.5, or 1:1-1:2. While the thickness $t_1$ may in some non-limiting examples be relatively uniform across the deposited layer 330, in some non-limiting examples, the extent to which the second part 330*b* projects, and/or overlaps with the NIC 310 (namely $w_2$) may vary to some extent across different parts of the exposed layer surface 11.

Figure 35B:
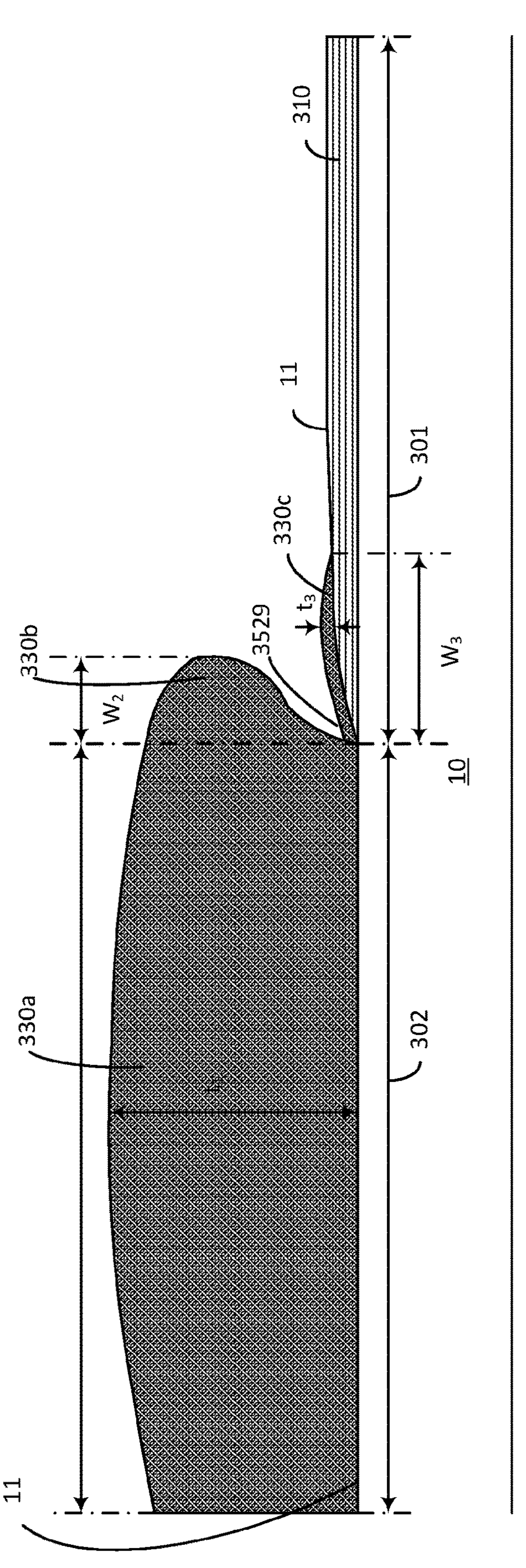

Turning now to FIG. 35B, the deposited layer 330 is shown to include a third part 330*c* disposed between the second part 330*b* and the NIC 310. As shown, the second part 330*b* of the deposited layer 330 may extend laterally over and is spaced apart from the third part 330*c* of the deposited layer 330 and the third part 330*c* may be in physical contact with the exposed layer surface 11 of the NIC 310. A thickness $t_3$ of the third part 330*c* of the deposited layer 330 may be less and in some non-limiting examples, substantially less than the thickness $t_1$ of the first part 330*a* thereof. In some non-limiting examples, a width $w_3$ of the third part 330*c* may be greater than the width $w_2$ of the second part 330*b*. In some non-limiting examples, the third part 330*c* may extend laterally to overlap the NIC 310 to a greater extent than the second part 330*b*. In some non-limiting examples, a ratio of $w_3:t_1$ may be in a range of about: 1:2-3:1, or 1:1.2-2.5:1. While the thickness $t_1$ may in some non-limiting examples be relatively uniform across the deposited layer 330, in some non-limiting examples, the extent to which the third part 330*c* projects, and/or overlaps with the NIC 310 (namely $w_3$) may vary to some extent across different parts of the exposed layer surface 11.

The thickness $t_3$ of the third part 330*c* may be no greater than, and/or less than about 5% of the thickness $t_3$ of the first part 330*a*. By way of non-limiting example, $t_3$ may be less than about: 4%, 3%, 2%, 1%, or 0.5% of $t_1$. Instead of, and/or in addition to, the third part 330*c* being formed as a thin film, as shown, the material of the deposited layer 330 may form as particle structures 941 on a part of the NIC 310. By way of non-limiting example, such particle structures 941 may comprise features that are physically separated from one another, such that the islands, and/or clusters do not form a continuous layer.

Figure 35C:
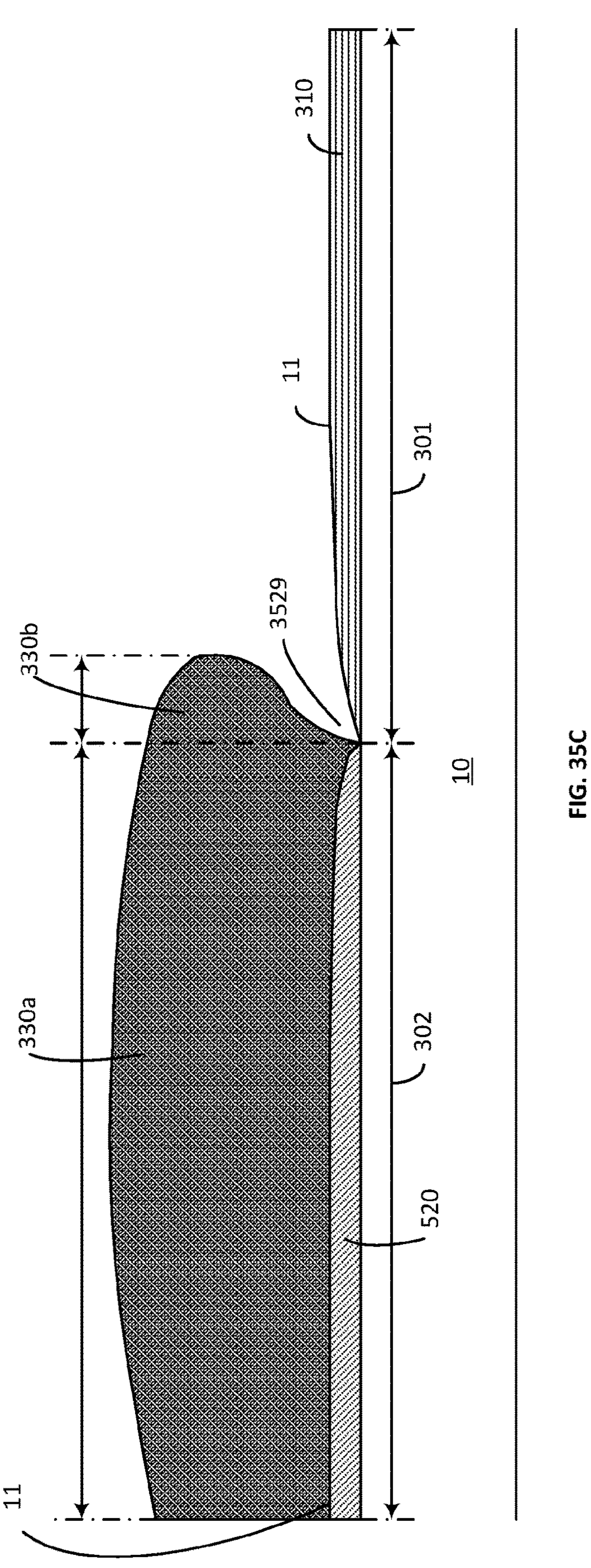

Turning now to FIG. 35C, an NPC 520 is disposed between the substrate 10 and the deposited layer 330. The NPC 520 is disposed between the first part 330*a* of the deposited layer 330 and the second portion 302 of the substrate 10. The NPC 520 is illustrated as being disposed on the second portion 302 and not on the first portion 301, where the NIC 310 has been deposited. The NPC 520 may be formed such that, at an interface, and/or boundary between the NPC 520 and the deposited layer 330, a surface of the NPC 520 exhibits a relatively high initial sticking probability $S_0$ against deposition of the deposited material 531. As such, the presence of the NPC 520 may promote the formation, and/or growth of the deposited layer 330 during deposition.

Figure 35D:
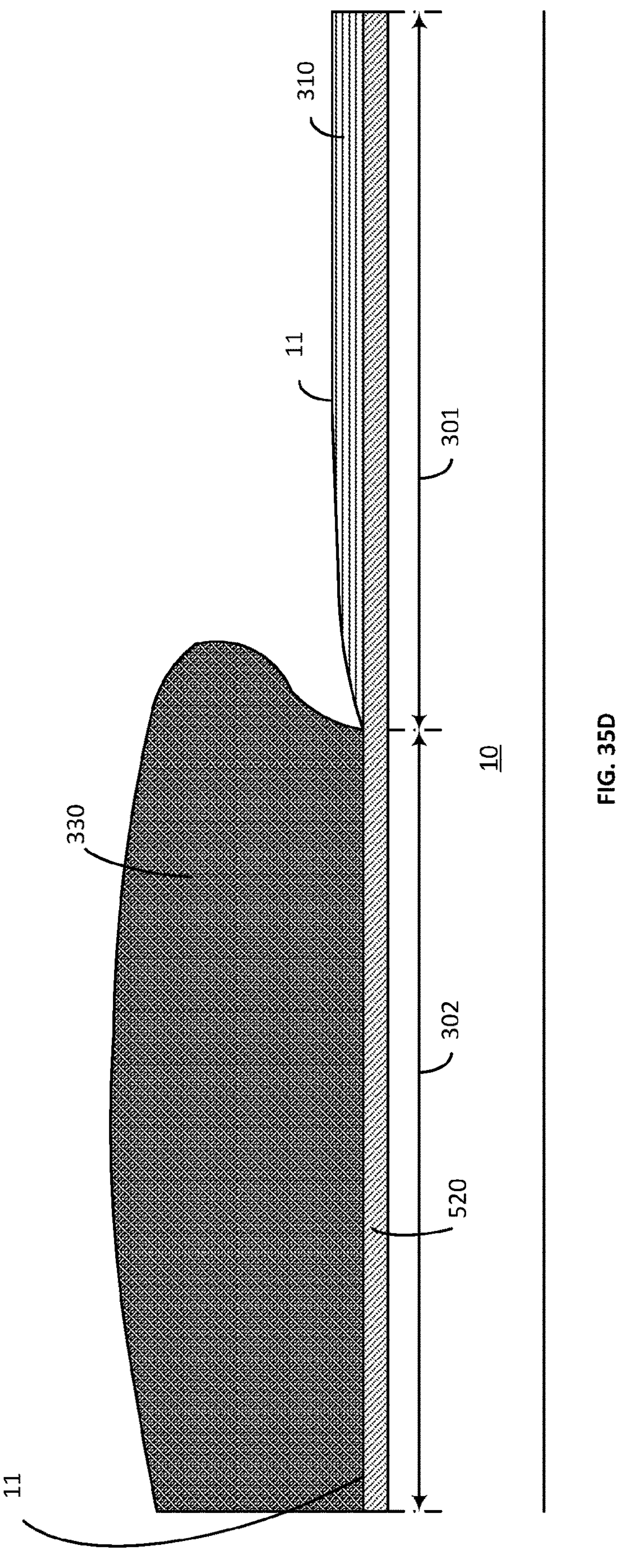

Turning now to FIG. 35D, the NPC 520 is disposed on both the first portion 301 and the second portion 302 of the substrate 10 and the NIC 310 covers a part of the NPC 520 disposed on the first portion 301. Another part of the NPC 520 is substantially devoid of the NIC 310 and the deposited layer 330 covers such part of the NPC 520.

Figure 35E:
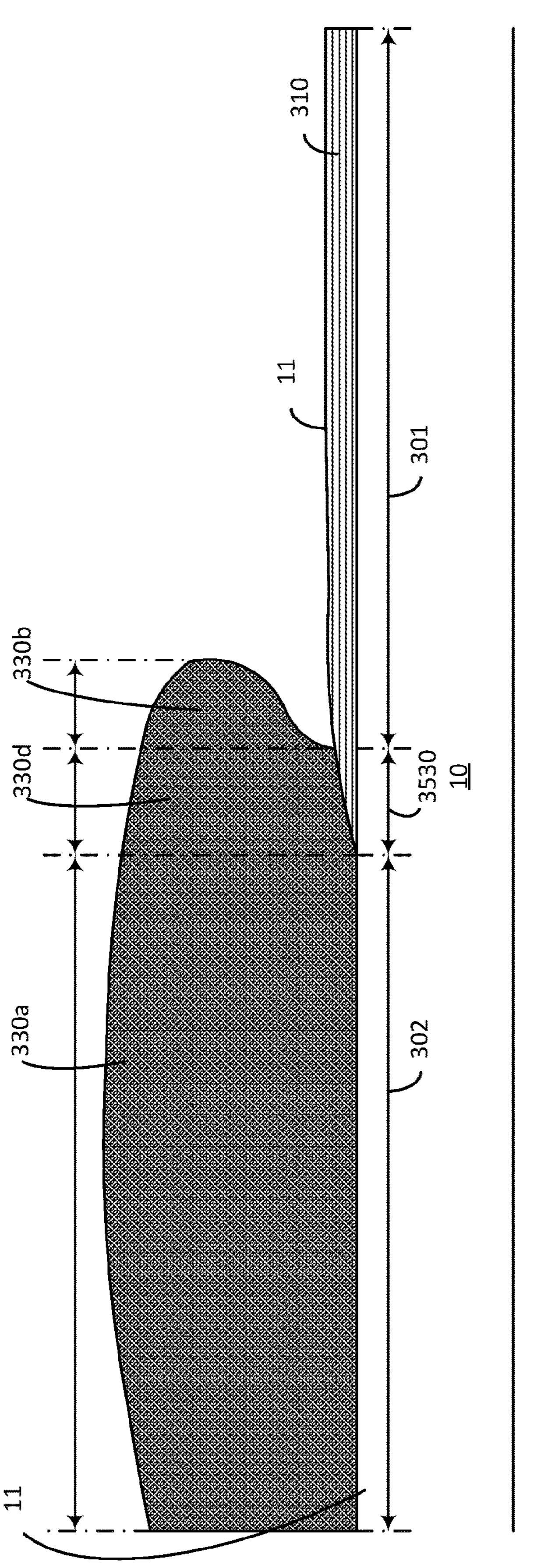

Turning now to FIG. 35E, the deposited layer 330 is shown to partially overlap a part of the NIC 310 in a third portion 3530 of the substrate 10. In some non-limiting examples, in addition to the first part 330*a* and the second part 330*b*, the deposited layer 330 further includes a fourth part 330*d*. As shown, the fourth part 330*d* of the deposited layer 330 is disposed between the first part 330*a* and the second part 330*b* of the deposited layer 330 and the fourth part 330*d* may be in physical contact with the exposed layer surface 11 of the NIC 310. In some non-limiting examples, the overlap in the third portion 3530 may be formed as a result of lateral growth of the deposited layer 330 during an open mask 600, and/or mask-free deposition process. In some non-limiting examples, while the exposed layer surface 11 of the NIC 310 may exhibit a relatively low initial sticking probability $S_0$ against deposition of the deposited material 531, and thus the probability of the material nucleating the exposed layer surface 11 is low, as the deposited layer 330 grows in thickness, the deposited layer 330 may also grow laterally and may cover a subset of the NIC 310 as shown.

Figure 35F:
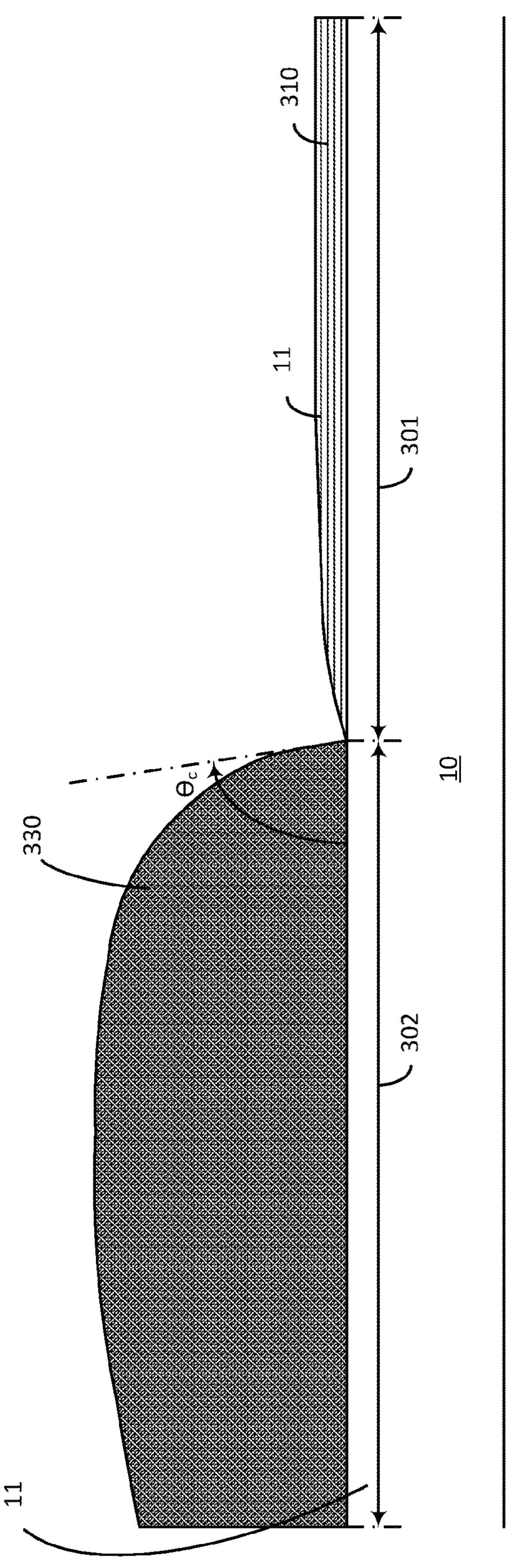

Turning now to FIG. 35F the first portion 301 of the substrate 10 is coated with the NIC 310 and the second portion 302 adjacent thereto is coated with the deposited layer 330. In some non-limiting examples, it has been observed that conducting an open mask 600, and/or mask-free deposition of the deposited layer 330 may result in the deposited layer 330 exhibiting a tapered cross-sectional profile at, and/or near an interface between the deposited layer 330 and the NIC 310.

In some non-limiting examples, a thickness of the deposited layer 330 at, and/or near the interface may be less than an average thickness of the deposited layer 330. While such tapered profile is shown as being curved, and/or arched, in some non-limiting examples, the profile may, in some non-limiting examples be substantially linear, and/or non-linear. By way of non-limiting example, the thickness of the deposited layer 330 may decrease, without limitation, in a substantially linear, exponential, and/or quadratic fashion in a region proximal to the interface.

It has been observed that a contact angle $\theta_c$ of the deposited layer 330 at, and/or near the interface between the deposited layer 330 and the NIC 310 may vary, depending on properties of the NIC 310, such as a relative initial sticking probability $S_0$. It is further postulated that the contact angle $\theta_c$ of the nuclei may, in some non-limiting examples, dictate the thin film contact angle of the deposited layer 330 formed by deposition. Referring to FIG. 35F by way of non-limiting example, the contact angle $\theta_c$ may be determined by measuring a slope of a tangent of the deposited layer 330 at or near the interface between the deposited layer 330 and the NIC 310. In some non-limiting examples, where the cross-sectional taper profile of the deposited layer 330 is substantially linear, the contact angle $\theta_c$ may be determined by measuring the slope of the deposited layer 330 at, and/or near the interface. As will be appreciated by those having ordinary skill in the relevant art, the contact angle $\theta_c$ may be generally measured relative to an angle of the underlying surface. In the present disclosure, for purposes of simplicity of illustration, the NIC 310 and the deposited layer 330 are shown deposited on a planar surface. However, those having ordinary skill in the relevant art will appreciate that the NIC 310 and the deposited layer 330 may be deposited on non-planar surfaces.

Figure 35G:
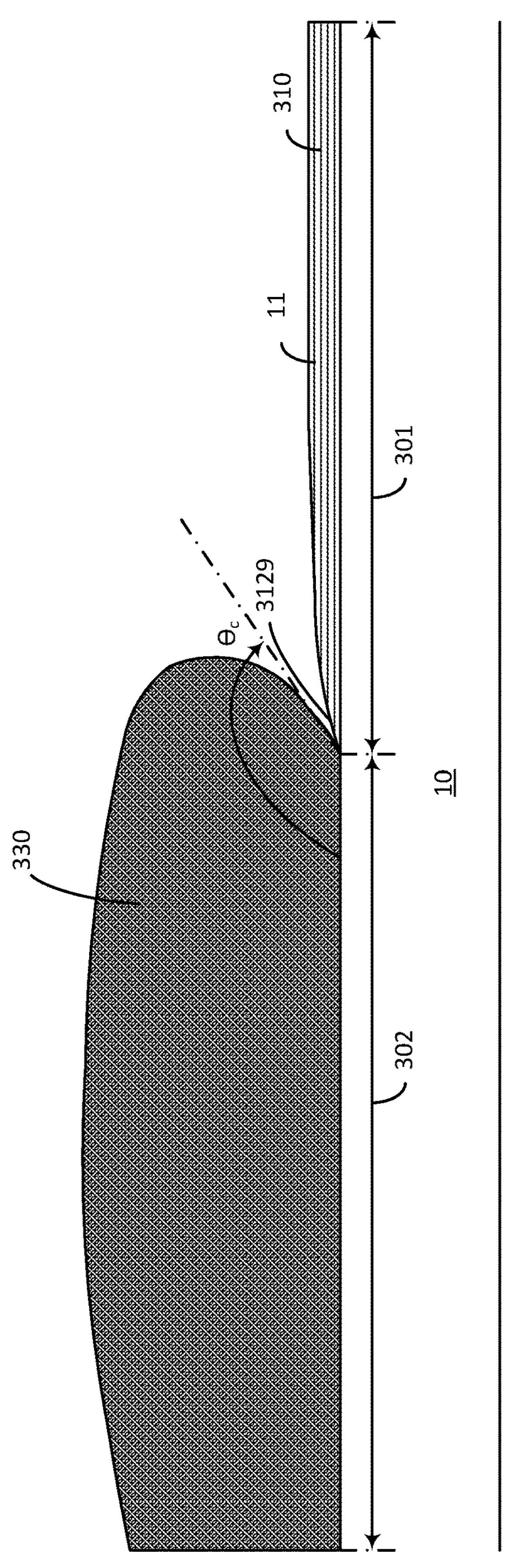

In some non-limiting examples, the contact angle $\theta_c$ of the deposited layer 330 may be greater than about 90°. Referring now to FIG. 35G, by way of non-limiting example, the deposited layer 330 is shown as including a part extending past the interface between the NIC 310 and the deposited layer 330 and is spaced apart from the NIC by a gap 3529. In such non-limiting scenario, the contact angle $\theta_c$ may, in some non-limiting examples, exceed 90°.

In some non-limiting examples, it may be advantageous to form a deposited layer 330 exhibiting a relatively high contact angle $\theta_c$. By way of non-limiting example, the contact angle $\theta_c$ may be greater than about: 10°, 15°, 20°, 25°, 30°, 35°, 40°, 50°, 70°, 75°, or 80°. By way of non-limiting example, a deposited layer 330 having a relatively high contact angle $\theta_c$ may allow for creation of finely patterned features while maintaining a relatively high aspect ratio. By way of non-limiting example, there may be an aim to form a deposited layer 330 exhibiting a contact angle $\theta_c$ greater than about 90°. By way of non-limiting example, the contact angle $\theta_c$ may be greater than about: 90°, 95°, 100°, 105°, 110° 120°, 130°, 135°, 140°, 145°, 150°, or 170°.

Figure 35H:
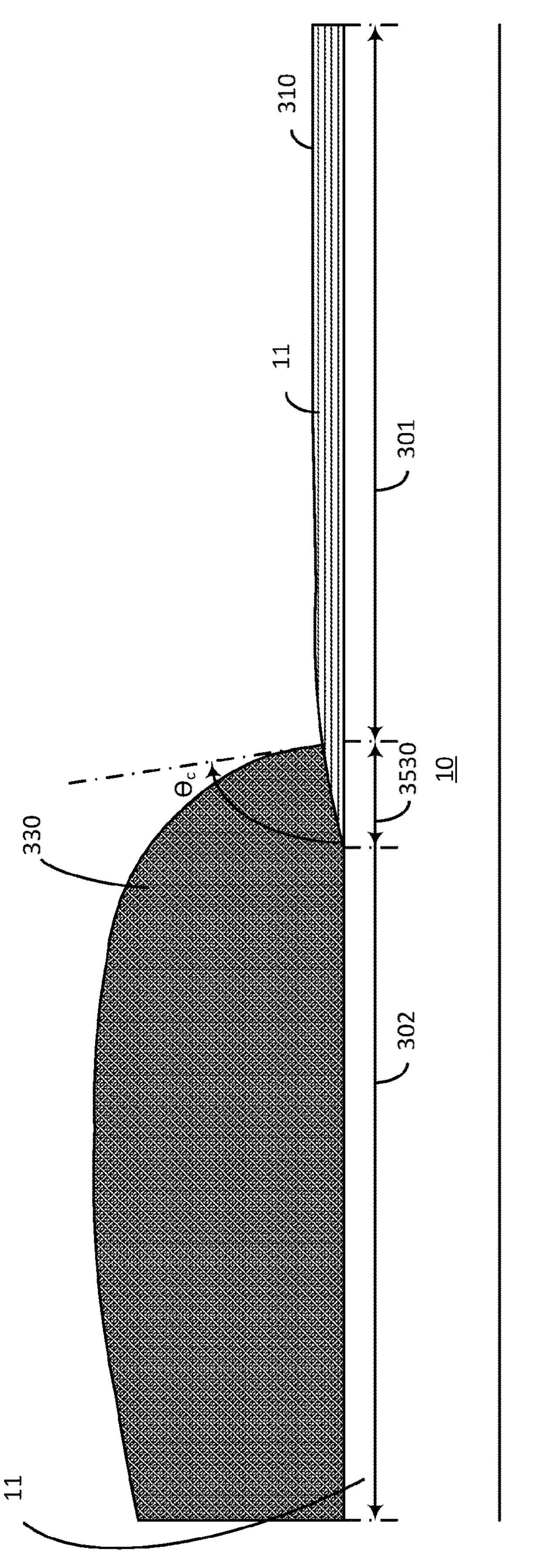
Figure 35I:
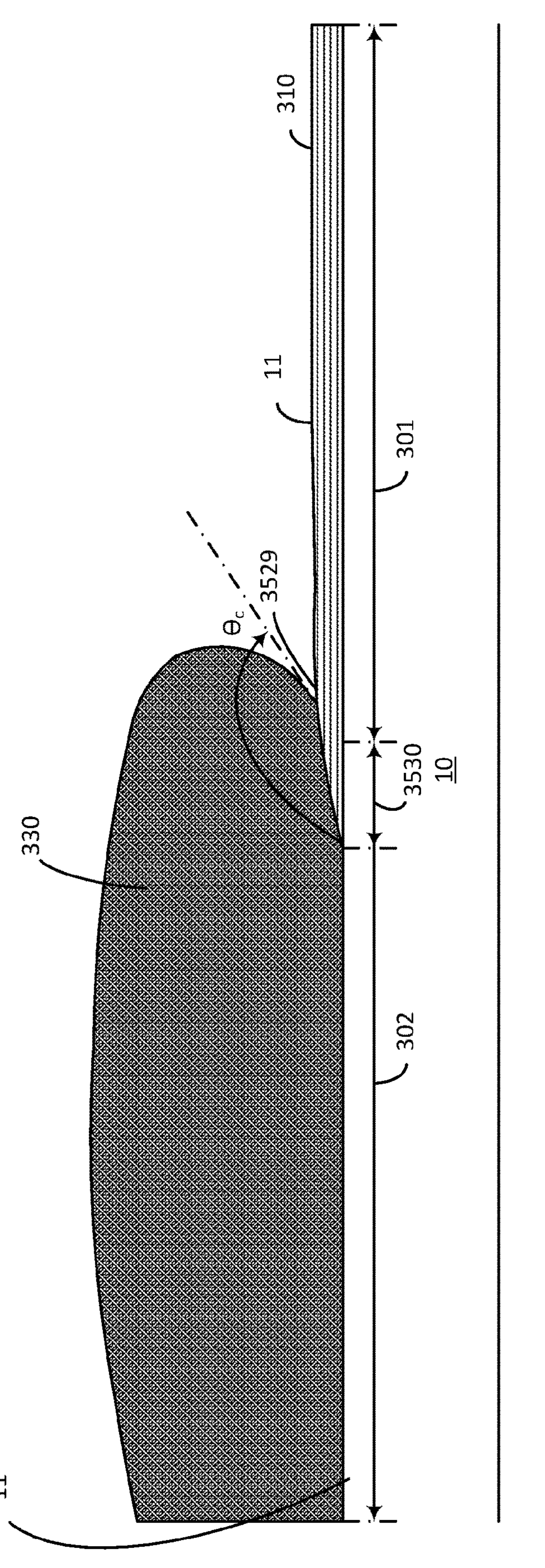

Turning now to FIGS. 35H-35I, the deposited layer 330 partially overlaps a part of the NIC 310 in the third portion 3530 of the substrate 10, which is disposed between the first portion 301 and the second portion 302 thereof. As shown, the subset of the deposited layer 330 partially overlapping a subset of the NIC 310 may be in physical contact with the exposed layer surface 11 thereof. In some non-limiting examples, the overlap in the third region 3130 may be formed as a result of lateral growth of the deposited layer 330 during an open mask 600, and/or mask-free deposition process. In some non-limiting examples, while the exposed layer surface 11 of the NIC 310 may exhibit a relatively low affinity or initial sticking probability $S_0$ against deposition of the deposited material 531 and thus the probability of the material nucleating on the exposed layer surface 11 is low, as the deposited layer 330 grows in thickness, the deposited layer 330 may also grow laterally and may cover a subset of the NIC 310.

In the case of FIGS. 35H-35I, the contact angle $\theta_c$ of the deposited layer 330 may be measured at an edge thereof near the interface between it and the NIC 310, as shown. In FIG. 35I, the contact angle $\theta_c$ may be greater than about 90°, which may in some non-limiting examples result in a subset of the deposited layer 330 being spaced apart from the NIC 310 by a gap 3529.

Partition and Recess

Figure 36:
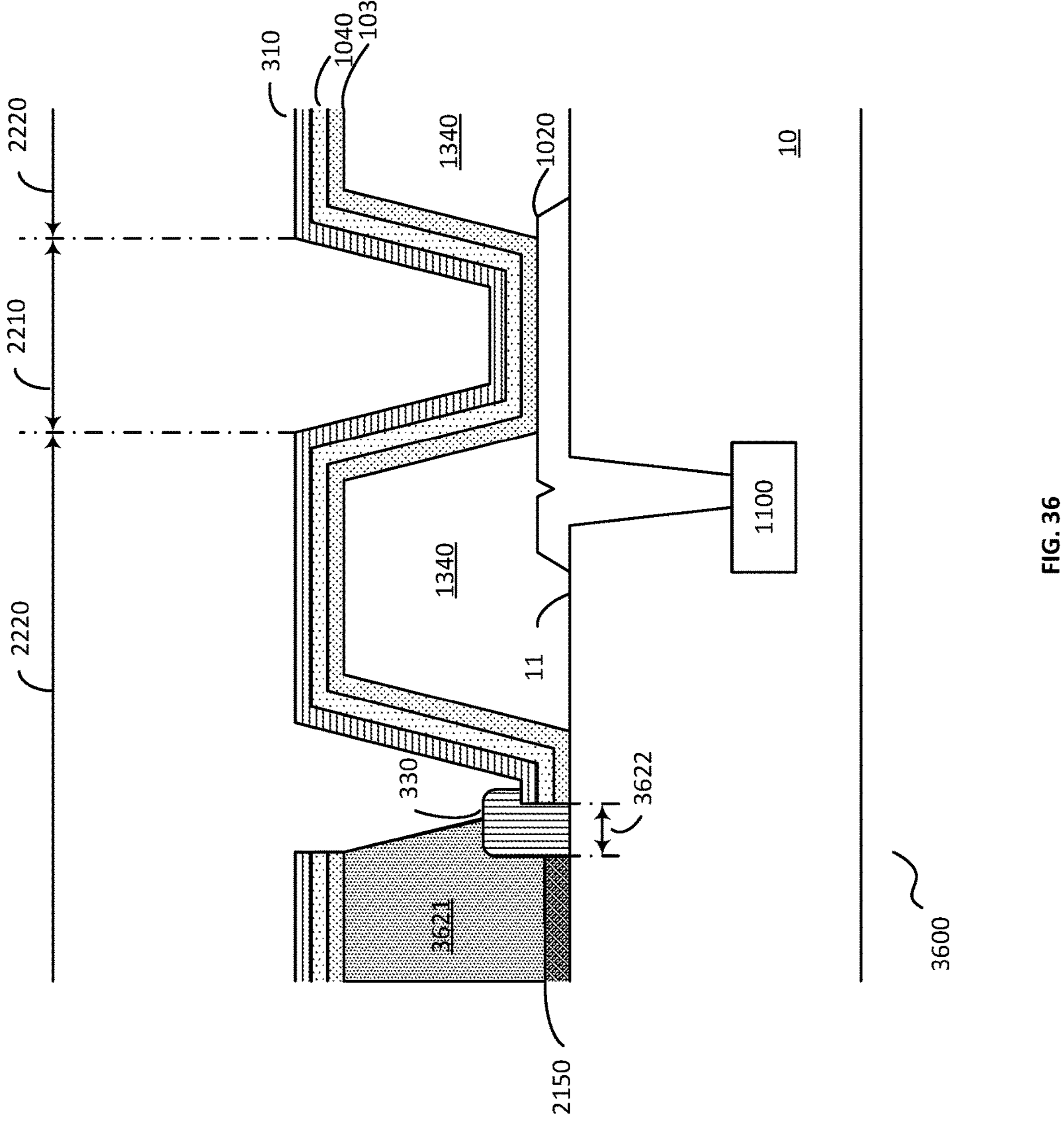
FIG. 36 is a schematic diagram illustrating an example cross-sectional view of an example version of the device of FIG. 13 having a partition and a sheltered region, such as a recess, in a non-emissive region thereof according to an example in the present disclosure.

Turning to FIG. 36, there is shown a cross-sectional view of an example version 3600 of the device 1000. The device 3600 comprises a substrate 10 having an exposed layer surface 11. The substrate 10 comprises at least one TFT structure 1100. By way of non-limiting example, the at least one TFT structure 1100 may be formed by depositing and patterning a series of thin films when fabricating the substrate 10, in some non-limiting examples, as described herein.

The device 3600 comprises, in a lateral aspect, an emissive region 2210 having an associated lateral aspect 1310 and at least one adjacent non-emissive region 2220, each having an associated lateral aspect 1320. The exposed layer surface 11 of the substrate 10 in the emissive region 2210 may be provided with a first electrode 1020, that is electrically coupled to the at least one TFT structure 1100. A PDL 1340 may be provided on the exposed layer surface 11, such that the PDL 1340 covers the exposed layer surface 11 as well as at least one edge, and/or perimeter of the first electrode 1020. The PDL 1340 may, in some non-limiting examples, be provided in the lateral aspect 1320 of the non-emissive region 2220. The PDL 1340 defines a valley-shaped configuration that provides an opening that generally corresponds to the lateral aspect 1310 of the emissive region 2210 through which a layer surface of the first electrode 1020 may be exposed. In some non-limiting examples, the device 3600 may comprise a plurality of such openings defined by the PDLs 400, each of which may correspond to a (sub-) pixel 1240/244*x* region of the device 3600.

As shown, in some non-limiting examples, a partition 3621 may be provided on the exposed layer surface 11 in the lateral aspect 1320 of a non-emissive region 2220 and, as described herein, defines a sheltered region 3465, such as a recess 3622. In some non-limiting examples, the recess 3622 may be formed by an edge of a lower section 3723 (FIG. 37A) of the partition 3621 being recessed, staggered, and/or offset with respect to an edge of an upper section 3724 (FIG. 37A) of the partition 3621 that overlaps, and/or projects beyond the recess 3622.

In some non-limiting examples, the lateral aspect 1310 of the emissive region 2210 comprises at least one semiconducting layer 1030 disposed over the first electrode 1020, a second electrode 1040, disposed over the at least one semiconducting layer 1030, and an NIC 310 disposed over the second electrode 1040. In some non-limiting examples, the at least one semiconducting layer 1030, the second electrode 1040 and the NIC 310 may extend laterally to cover at least the lateral aspect 1320 of a part of at least one adjacent non-emissive region 2220. In some non-limiting examples, as shown, the at least one semiconducting layer 1030, the second electrode 1040 and the NIC 310 may be disposed on at least a part of at least one PDL 1340 and at least a part of the partition 3621. Thus, as shown, the lateral aspect 1310 of the emissive region 2210, the lateral aspect 1320 of a part of at least one adjacent non-emissive region 2220 and a part of at least one PDL 1340 and at least a part of the partition 3621, together can make up a first portion 301, in which the second electrode 1040 lies between the NIC 310 and the at least one semiconducting layer 1030.

An auxiliary electrode 2150 is disposed proximate to, and/or within the recess 3622 and a deposited layer 330 may be arranged to electrically couple the auxiliary electrode 2150 to the second electrode 1040. Thus as shown, the recess 3622 may comprise a second portion 302, in which the deposited layer 330 is disposed on the exposed layer surface 11.

A non-limiting example of a method for fabricating the device 3600 is now described.

In a stage, the method provides the substrate 10 and at least one TFT structure 1100. In some non-limiting examples, at least some of the materials for forming the at least one semiconducting layer 1030 may be deposited using an open mask 600, and/or mask-free deposition process, such that the materials are deposited in, and/or across both the lateral aspect 1310 of both the emissive region 2210, and/or the lateral aspect 1320 of at least a part of at least one non-emissive region 2220. Those having ordinary skill in the relevant art will appreciate that in some non-limiting examples, it may be appropriate to deposit the at least one semiconducting layer 1030 in such manner so as to reduce any reliance on patterned deposition, which in some non-limiting examples, is performed using an FMM 415.

In a stage, the method deposits the second electrode 1040 over the at least one semiconducting layer 1030. In some non-limiting examples, the second electrode 1040 may be deposited using an open mask 600, and/or mask-free deposition process. In some non-limiting examples, the second electrode 1040 may be deposited by subjecting an exposed layer surface 11 of the at least one semiconducting layer 1030 disposed in the lateral aspect 1310 of the emissive region 2210, and/or the lateral aspect 1320 of at least a part of at least one of the non-emissive region 2220 to an evaporated flux of a material for forming the second electrode 130.

In a stage, the method deposits the NIC 310 over the second electrode 1040. In some non-limiting examples, the NIC 310 may be deposited using an open mask 600, and/or mask-free deposition process. In some non-limiting examples, the NIC 310 may be deposited by subjecting an exposed layer surface 11 of the second electrode 1040 disposed in the lateral aspect 1310 of the emissive region 2210, and/or the lateral aspect 1320 of at least a part of at least one of the non-emissive region 2220 to an evaporated flux of an NIC material 511.

As shown, the recess 3622 is substantially free of, or is uncovered by the NIC 310. In some non-limiting examples, this may be achieved by masking, by the partition 3621, a recess 3622, in a lateral aspect thereof, such that the evaporated flux of an NIC material 511 is substantially precluded from being incident onto such recess 3622 of the exposed layer surface 11. Accordingly, in such example, the recess 3622 of the exposed layer surface 11 is substantially devoid of the NIC 310. By way of non-limiting example, a laterally projecting part of the partition 3621 may define the recess 3622 at a base of the partition 3621. In such example, at least one surface of the partition 3621 that defines the recess 3622 may also be substantially devoid of the NIC 310.

In a stage, the method deposits the deposited layer 330, in some non-limiting examples, after providing the NIC 310, on the device 3600. In some non-limiting examples, the deposited layer 330 may be deposited using an open mask 600, and/or mask-free deposition process. In some non-limiting examples, the deposited layer 330 may be deposited by subjecting the device 3600 to an evaporated flux of a deposited material 531. By way of non-limiting example, a source (not shown) of deposited material 531 may be used to direct an evaporated flux of deposited material 531 towards the device 3600, such that the evaporated flux is incident on the exposed layer surface 11 thereof. However, in some non-limiting examples, the exposed layer surface 11 of the NIC 310 disposed in the lateral aspect 1310 of the emissive region 2210, and/or the lateral aspect 1320 of at least a part of at least one of the non-emissive region 2220 exhibits a relatively low initial sticking probability $S_0$, for the deposited layer 330, the deposited layer 330 may selectively deposit onto a second portion 302, including without limitation, the recessed part of the device 3600, where the NIC 310 is not present.

In some non-limiting examples, at least a part of the evaporated flux of the deposited material 531 may be directed at a non-normal angle relative to a lateral plane of the exposed layer surface 11. By way of non-limiting example, at least a part of the evaporated flux may be incident on the device 3600 at an angle of incidence that is, relative to such lateral plane of the exposed layer surface 11, less than about: 90°, 85°, 80°, 75°, 70°, 60°, or 50°. By directing an evaporated flux of a deposited material 531, including at least a part thereof incident at a non-normal angle, at least one surface of, and/or in the recess 3622 may be exposed to such evaporated flux.

In some non-limiting examples, a likelihood of such evaporated flux being precluded from being incident onto at least one surface of, and/or in the recess 3622 due to the presence of the partition 3621, may be reduced since at least a part of such evaporated flux may be flowed at a non-normal angle of incidence.

In some non-limiting examples, at least a part of such evaporated flux may be non-collimated. In some non-limiting examples, at least a part of such evaporated flux may be generated by an evaporation source that is a point source, a linear source, and/or a surface source.

In some non-limiting examples, the device 3600 may be displaced during deposition of the deposited layer 330. By way of non-limiting example, the device 3600, and/or the substrate 10 thereof, and/or any layer(s) deposited thereon, may be subjected to a displacement that is angular, in a lateral aspect, and/or in an aspect substantially parallel to the cross-sectional aspect.

In some non-limiting examples, the device 3600 may be rotated about an axis that substantially normal to the lateral plane of the exposed layer surface 11 while being subjected to the evaporated flux.

In some non-limiting examples, at least a part of such evaporated flux may be directed toward the exposed layer surface 11 of the device 3600 in a direction that is substantially normal to the lateral plane of the surface.

Without wishing to be bound by a particular theory, it is postulated that the deposited material 531 may nevertheless be deposited within the recess 3622 due to lateral migration, and/or desorption of adatoms adsorbed onto the surface of the NIC 310. In some non-limiting examples, it is postulated that any adatoms adsorbed onto the exposed layer surface 11 of the NIC 310 may have a tendency to migrate, and/or desorb from such surface due to unfavorable thermodynamic properties of the surface for forming a stable nucleus. In some non-limiting examples, it is postulated that at least some of the adatoms migrating, and/or desorbing off such surface may be re-deposited onto the surfaces in the recess 3622 to form the deposited layer 330.

In some non-limiting examples, the deposited layer 330 may be formed such that the deposited layer 330 is electrically coupled to both the auxiliary electrode 2150 and the second electrode 1040. In some non-limiting examples, the deposited layer 330 is in physical contact with at least one of the auxiliary electrode 2150, and/or the second electrode 1040. In some non-limiting examples, an intermediate layer may be present between the deposited layer 330 and at least one of the auxiliary electrode 2150, and/or the second electrode 1040. However, in such example, such intermediate layer may not substantially preclude the deposited layer 330 from being electrically coupled to the at least one of the auxiliary electrode 2150, and/or the second electrode 1040. In some non-limiting examples, such intermediate layer may be relatively thin and be such as to permit electrical coupling therethrough. In some non-limiting examples, a sheet resistance of the deposited layer 330 may be equal to, and/or less than a sheet resistance of the second electrode 1040.

As shown in FIG. 36, the recess 3622 is substantially devoid of the second electrode 1040. In some non-limiting examples, during the deposition of the second electrode 1040, the recess 3622 is masked, by the partition 3621, such that the evaporated flux of the material for forming the second electrode 1040 is substantially precluded form being incident on at least one surface of, and/or in the recess 3622. In some non-limiting examples, at least a part of the evaporated flux of the material for forming the second electrode 1040 is incident on at least one surface of, and/or in the recess 3622, such that the second electrode 1040 may extend to cover at least a part of the recess 3622.

In some non-limiting examples, the auxiliary electrode 2150, the deposited layer 330, and/or the partition 3621 may be selectively provided in certain region(s) of a display panel. In some non-limiting examples, any of these features may be provided at, and/or proximate to one or more edges of such display panel for electrically coupling at least one element of the frontplane 1010, including without limitation, the second electrode 1040, to at least one element of the backplane 1015. In some non-limiting examples, providing such features at, and/or proximate to such edges may facilitate supplying and distributing electrical current to the second electrode 1040 from an auxiliary electrode 2150 located at, and/or proximate to such edges. In some non-limiting examples, such configuration may facilitate reducing a bezel size of the display panel.

In some non-limiting examples, the auxiliary electrode 2150, the deposited layer 330, and/or the partition 3621 may be omitted from certain regions(s) of such display panel. In some non-limiting examples, such features may be omitted from parts of the display panel, including without limitation, where a relatively high pixel density is to be provided, other than at, and/or proximate to at least one edge thereof.

Figure 37A:
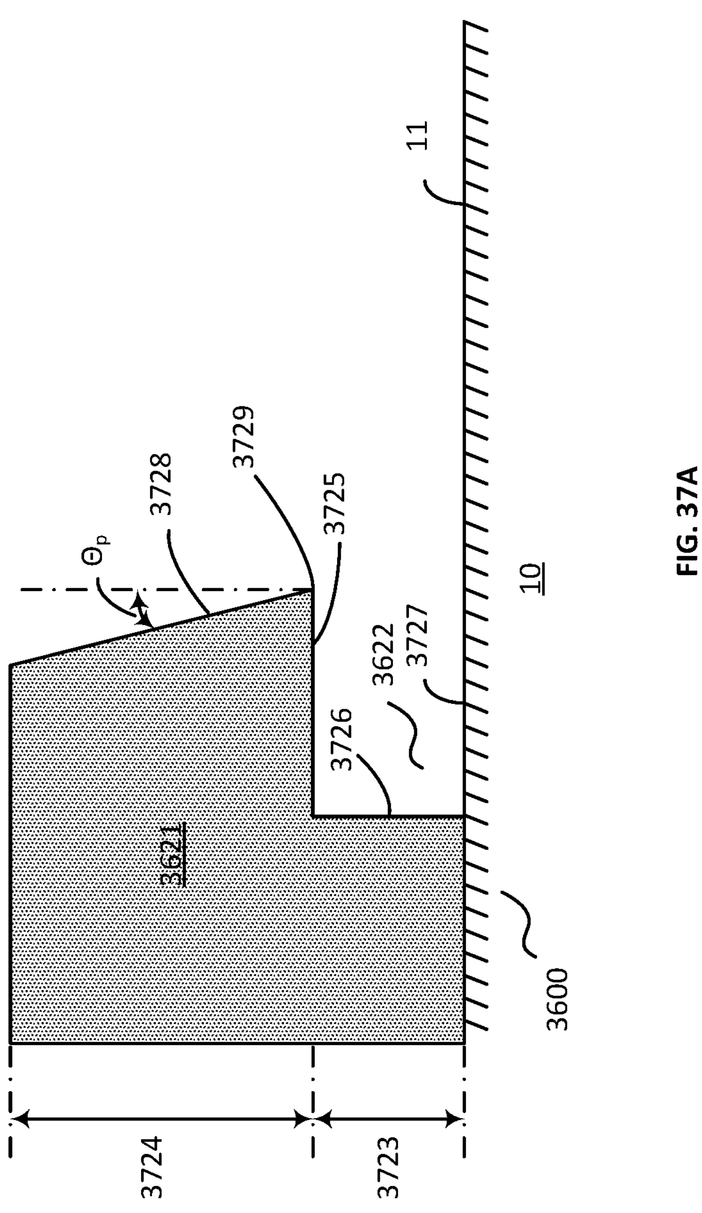
FIG. 37A is a schematic diagram that shows an example cross-sectional view of an example version of the device of FIG. 13 having a partition and a sheltered region, such as a recess, in a non-emissive region prior to deposition of a semiconducting layer thereon, according to an example in the present disclosure.

FIG. 37A shows a fragment of the device 3600 in a region proximal to the partition 3621 and at a stage prior to deposition of the at least one semiconducting layer 1030. In some non-limiting examples, the partition 3621 comprises a lower section 3723 and an upper section 3724, with the upper section 3724 projecting over the lower section 3723, so as to form the recess 3622 where the lower section 3723 is laterally recessed relative to the upper section 3724. By way of non-limiting example, the recess 3622 may be formed such that it may extend substantially laterally into the partition 3621. In some non-limiting examples, the recess 3622 may correspond to a space defined between a ceiling 3725 defined by the upper section 3724, a side 3726 of the lower section 3723 and a floor 3727 corresponding to the exposed layer surface 11 of the substrate 10. In some non-limiting examples, the upper section 3724 comprises an angled section 3728. By way of non-limiting example, the angled section 3728 may be provided by a surface that is not substantially parallel to a lateral plane of the exposed layer surface 11. By way of non-limiting example, the angled section 3728 may be tilted, and/or offset from an axis that is substantially normal to the exposed layer surface 11 by an angle $\theta_p$. A lip 3729 is also provided by the upper section 3724. In some non-limiting examples, the lip 3729 may be provided at or near an opening of the recess 3622. By way of non-limiting example, the lip 3729 may be provided at a junction of the angled section 3728 and the ceiling 3725. In some non-limiting examples, at least one of the upper section 3724, the side 3726 and the floor 3727 may be electrically conductive so as to form at least a part of the auxiliary electrode 2150.

In some non-limiting examples, the angle $\theta_p$, which represents the angle by which the angled section 3728 of the upper section 3724 is tilted, and/or offset from the axis, may be less than or equal to about 60°. By way of non-limiting example, the angle $\theta_p$ may be less than or equal to about: 50°, 45°, 40°, 30°, 25°, 20°, 15°, or 10°. In some non-limiting examples, the angle $\theta_p$ may be between about: 60° and 25°, 60° and 30°, or 50° and 30°. Without wishing to be bound by any particular theory, it may be postulated that providing an angled section 3728 may inhibit deposition of the NIC material 511 at or near the lip 3729, so as to facilitate the deposition of the deposited material 531 at or near the lip 3729.

Figure 37B:
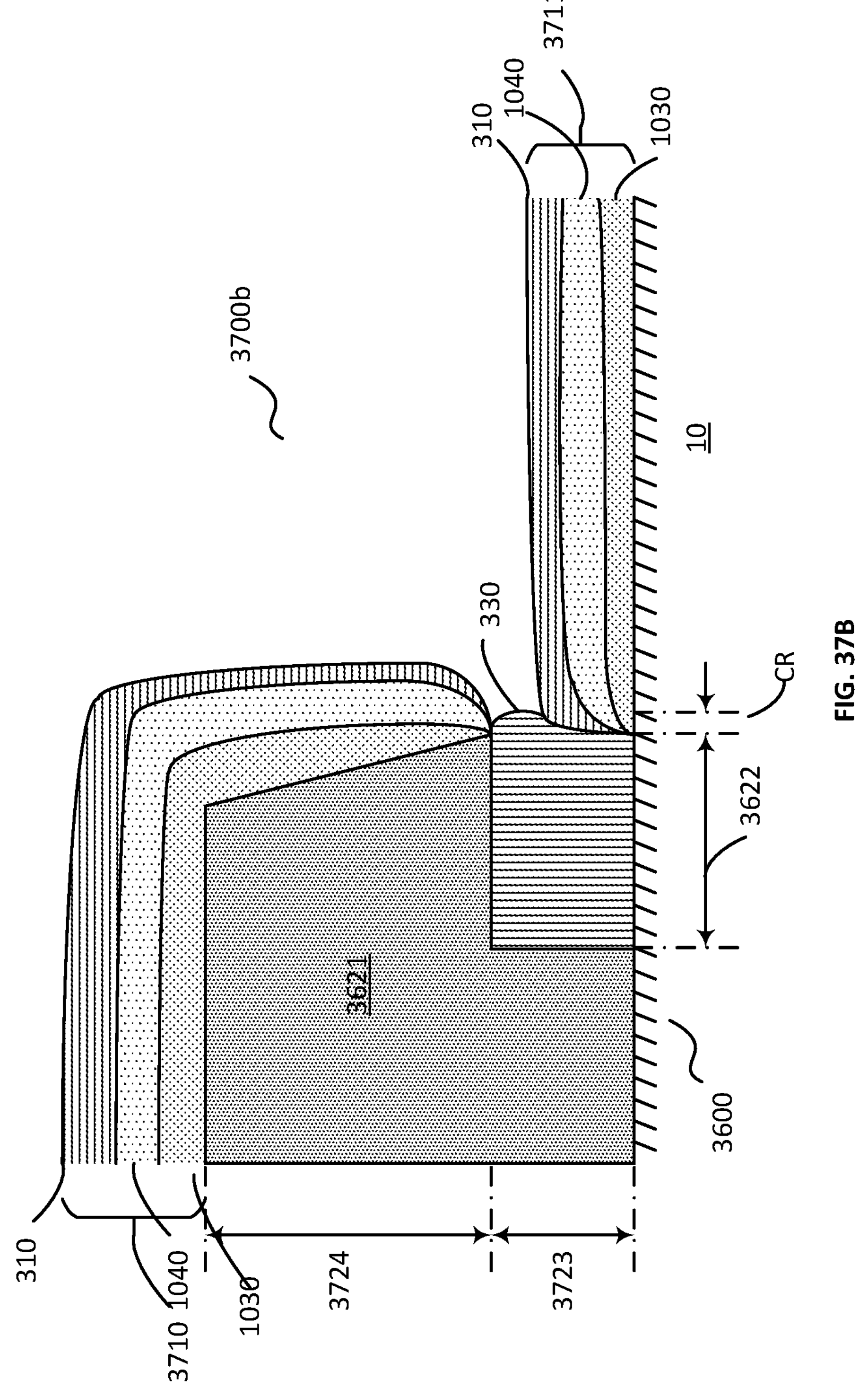
FIGS. 37B-37P are schematic diagrams that show various examples of interactions between the partition of FIG. 37A after deposition of a semiconducting layer, a second electrode and an NIC with a deposited layer 330 deposited thereon, according to various examples in the present disclosure.
Figure 37C:
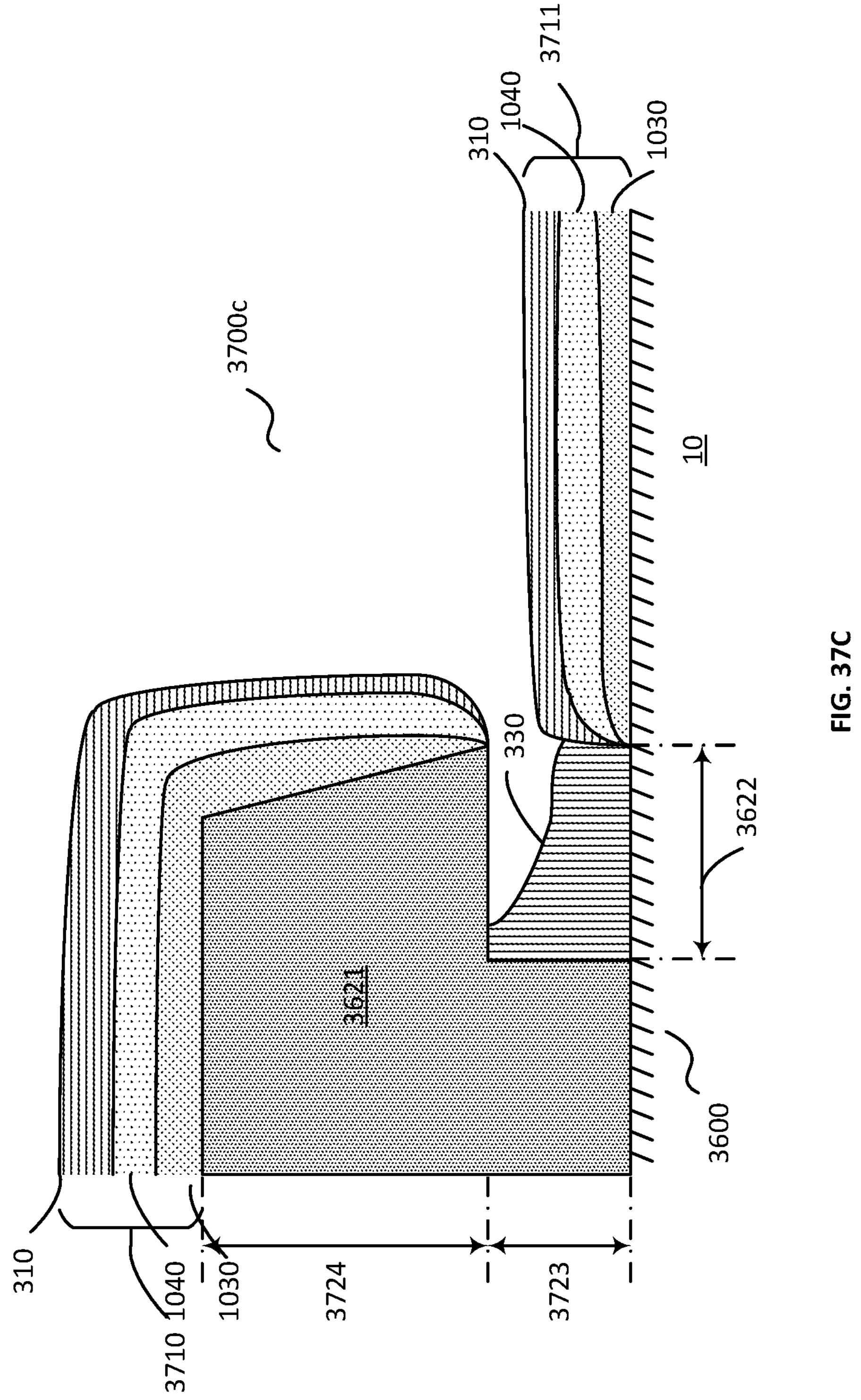
Figure 37D:
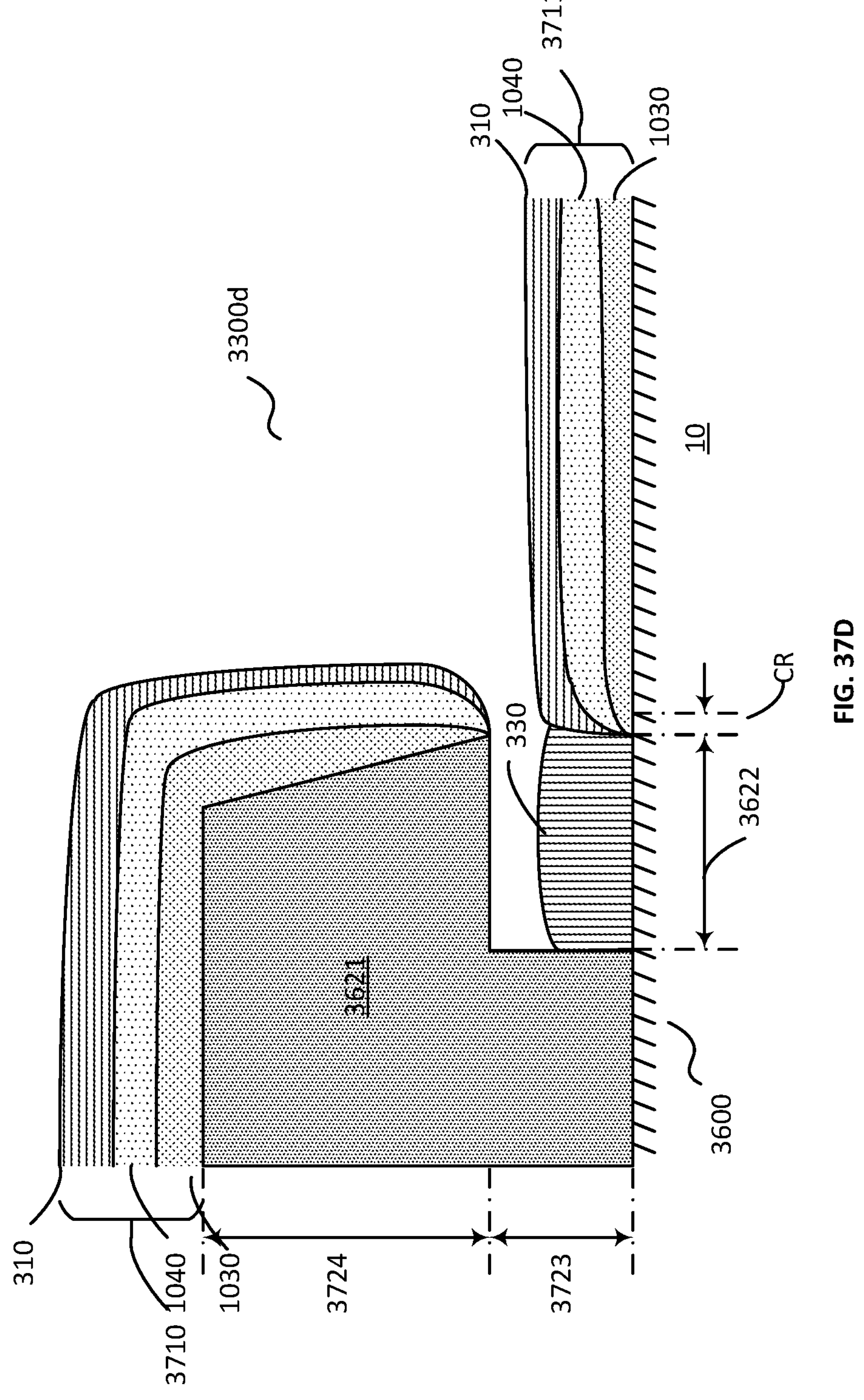
Figure 37E:
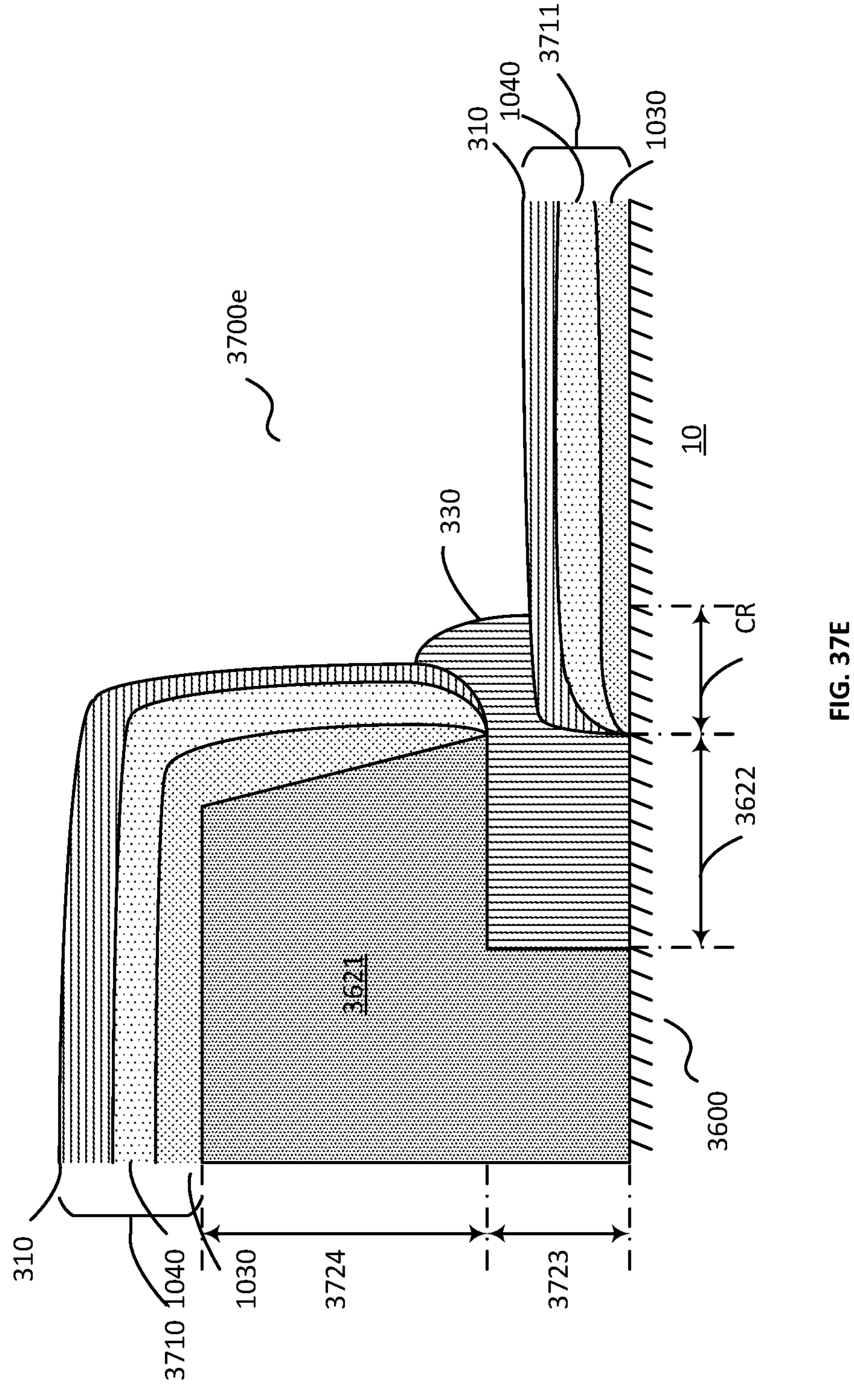
Figure 37F:
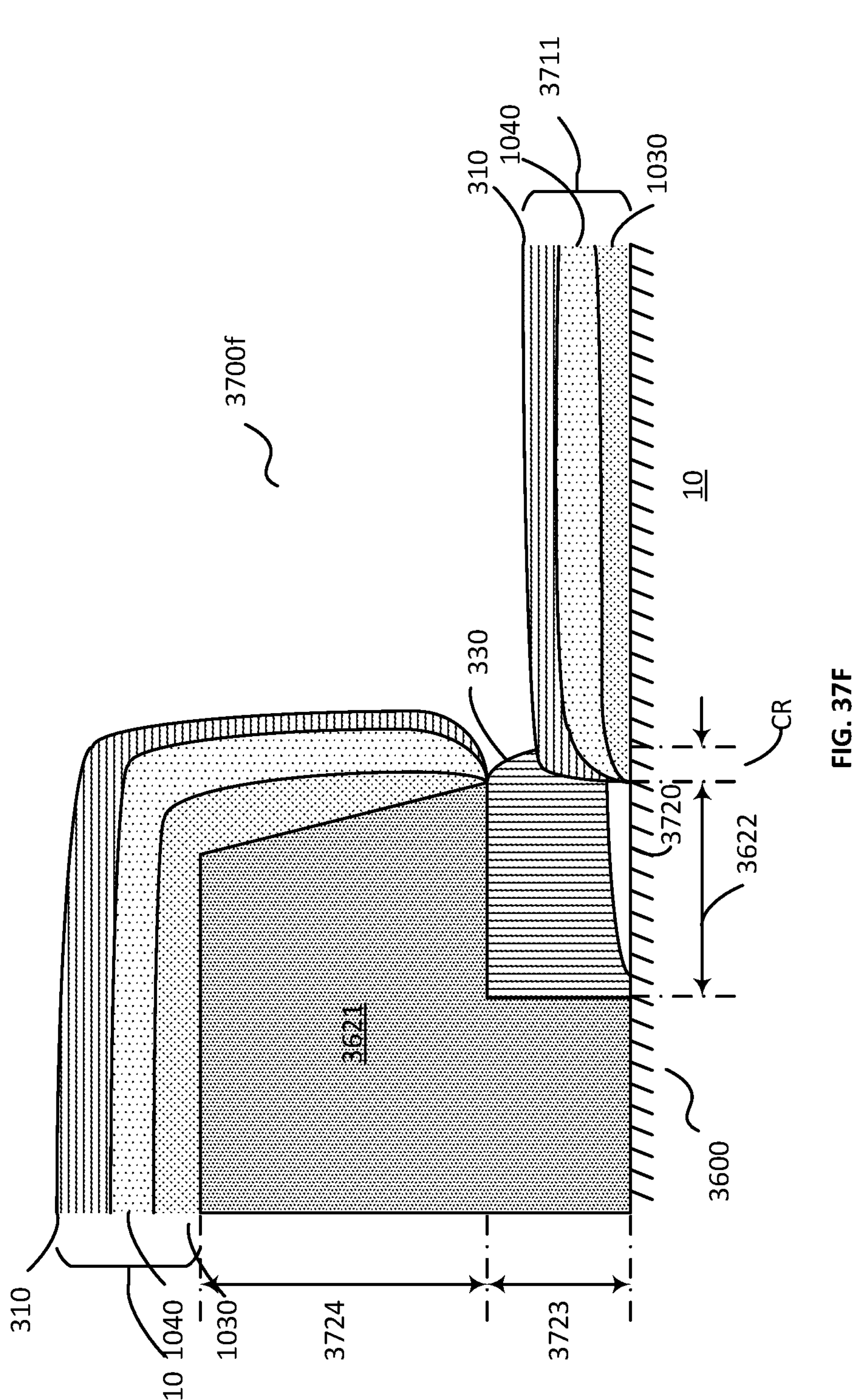
Figure 37G:
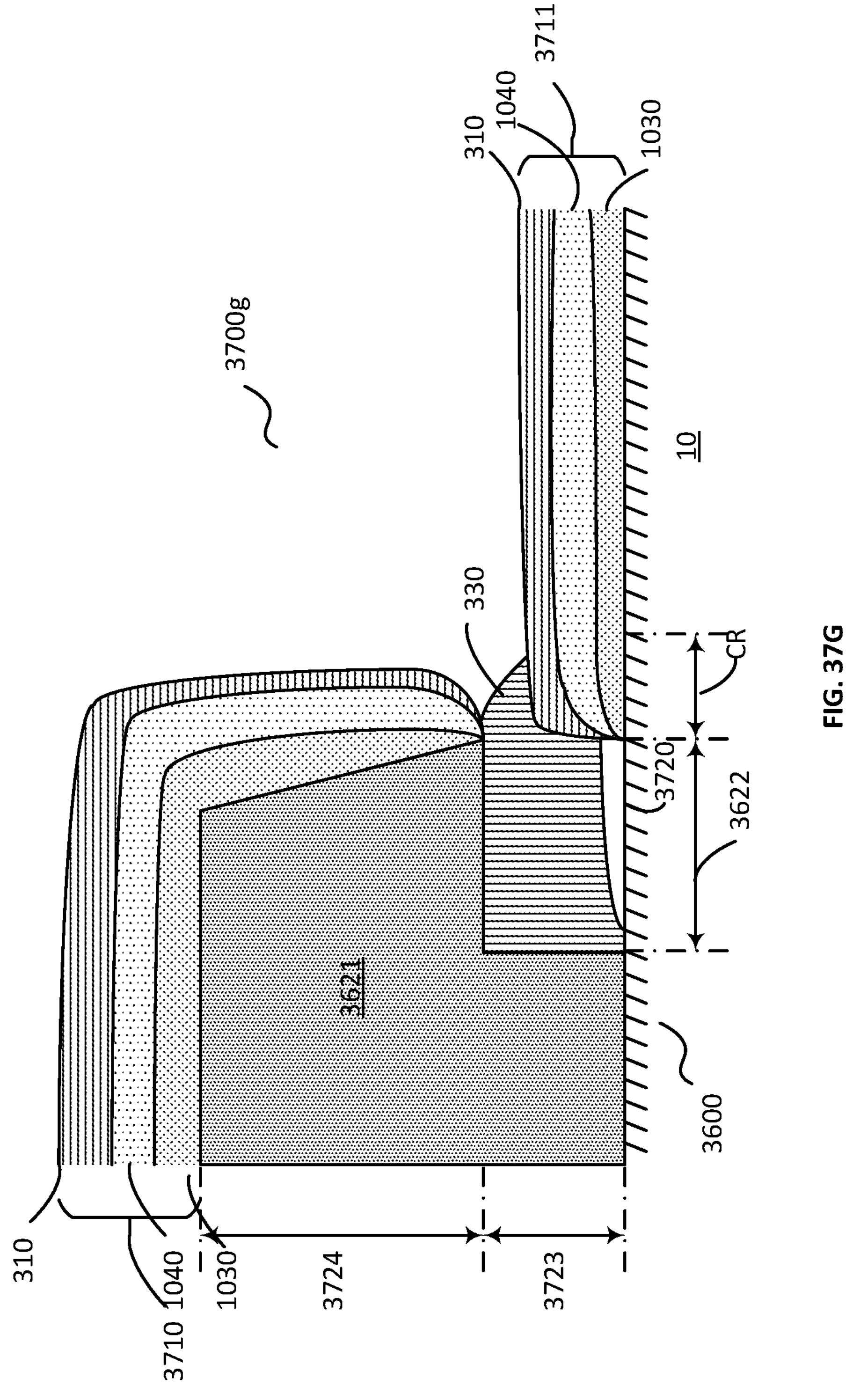
Figure 37H:
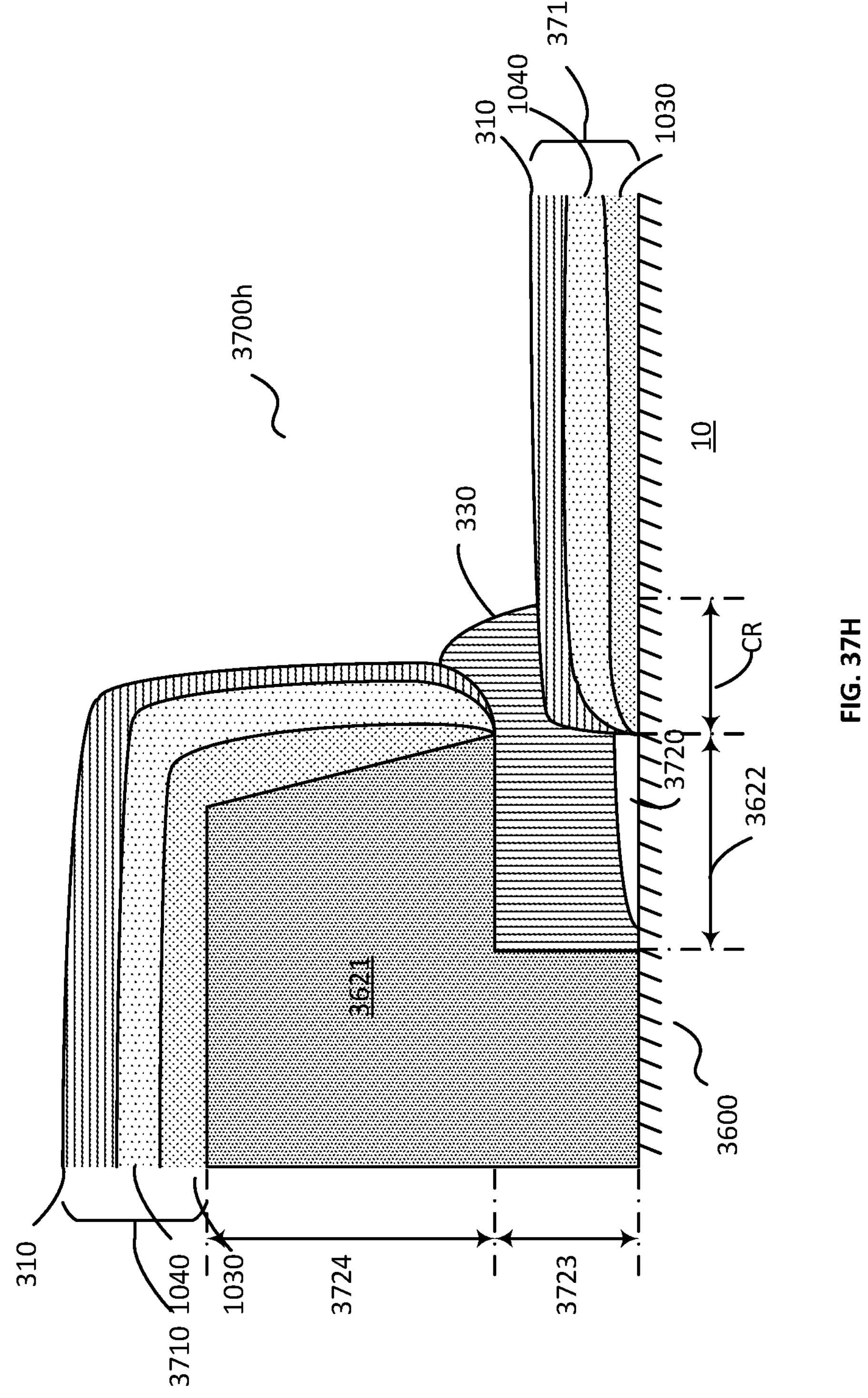
Figure 37I:
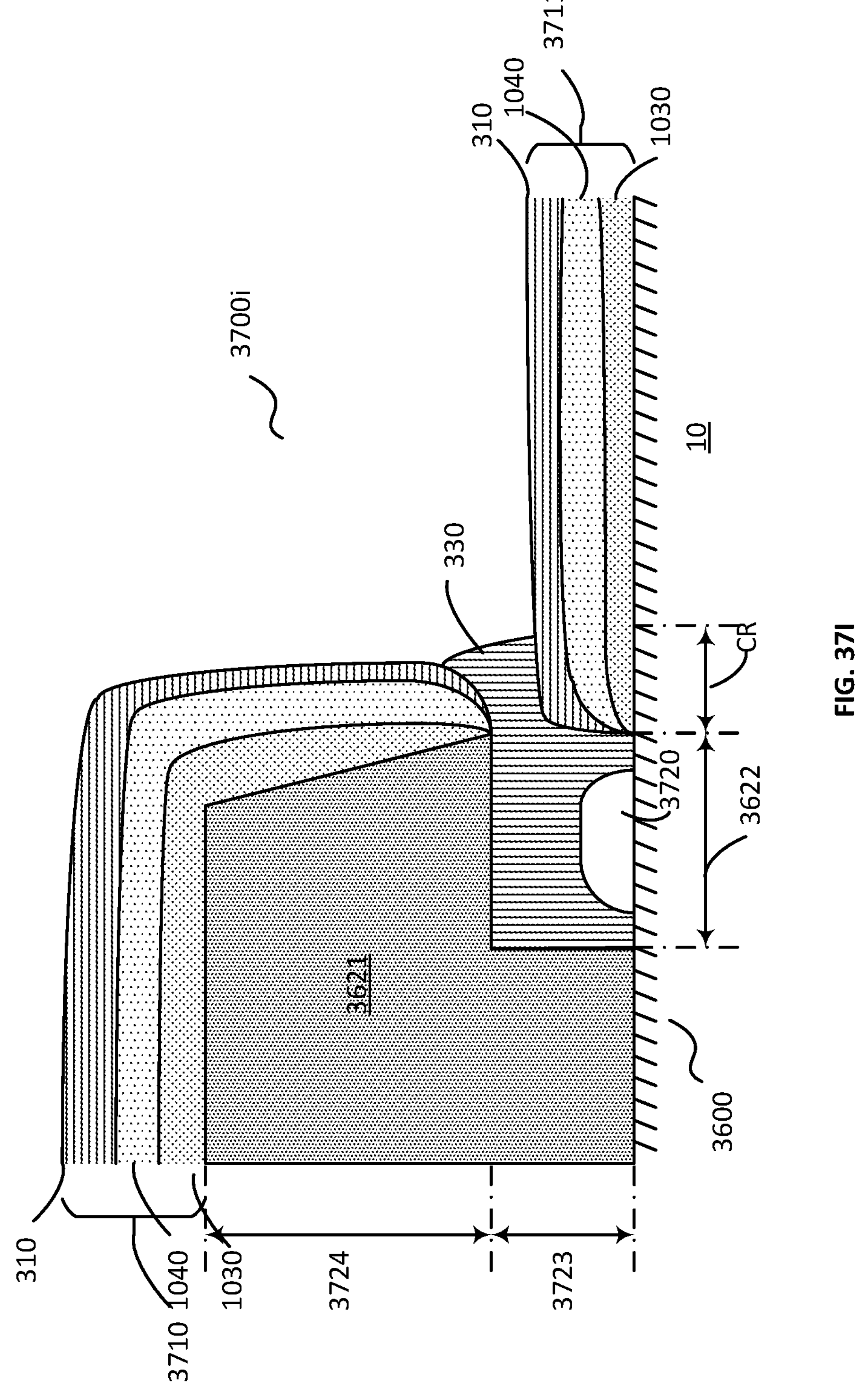
Figure 37J:
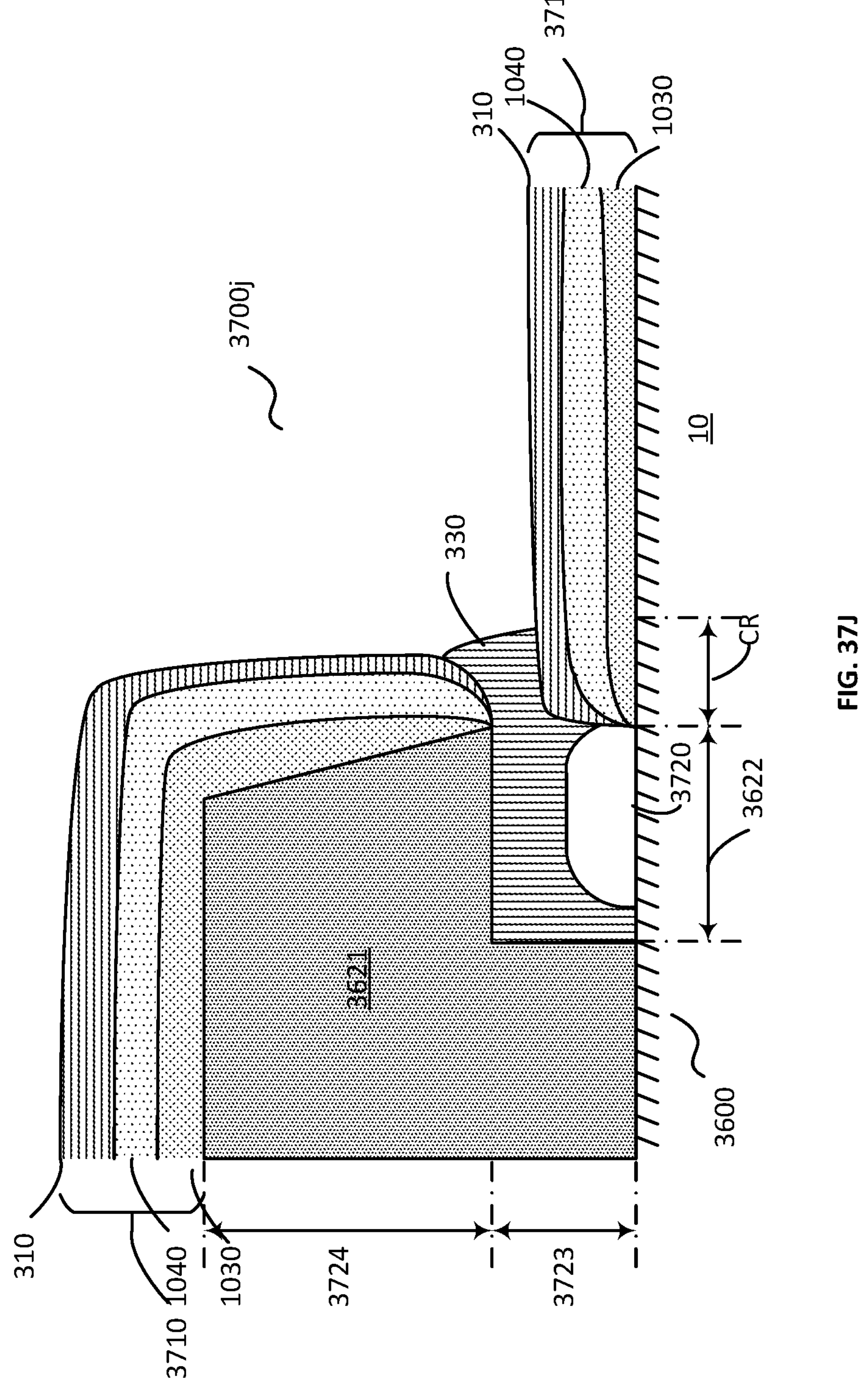
Figure 37K:
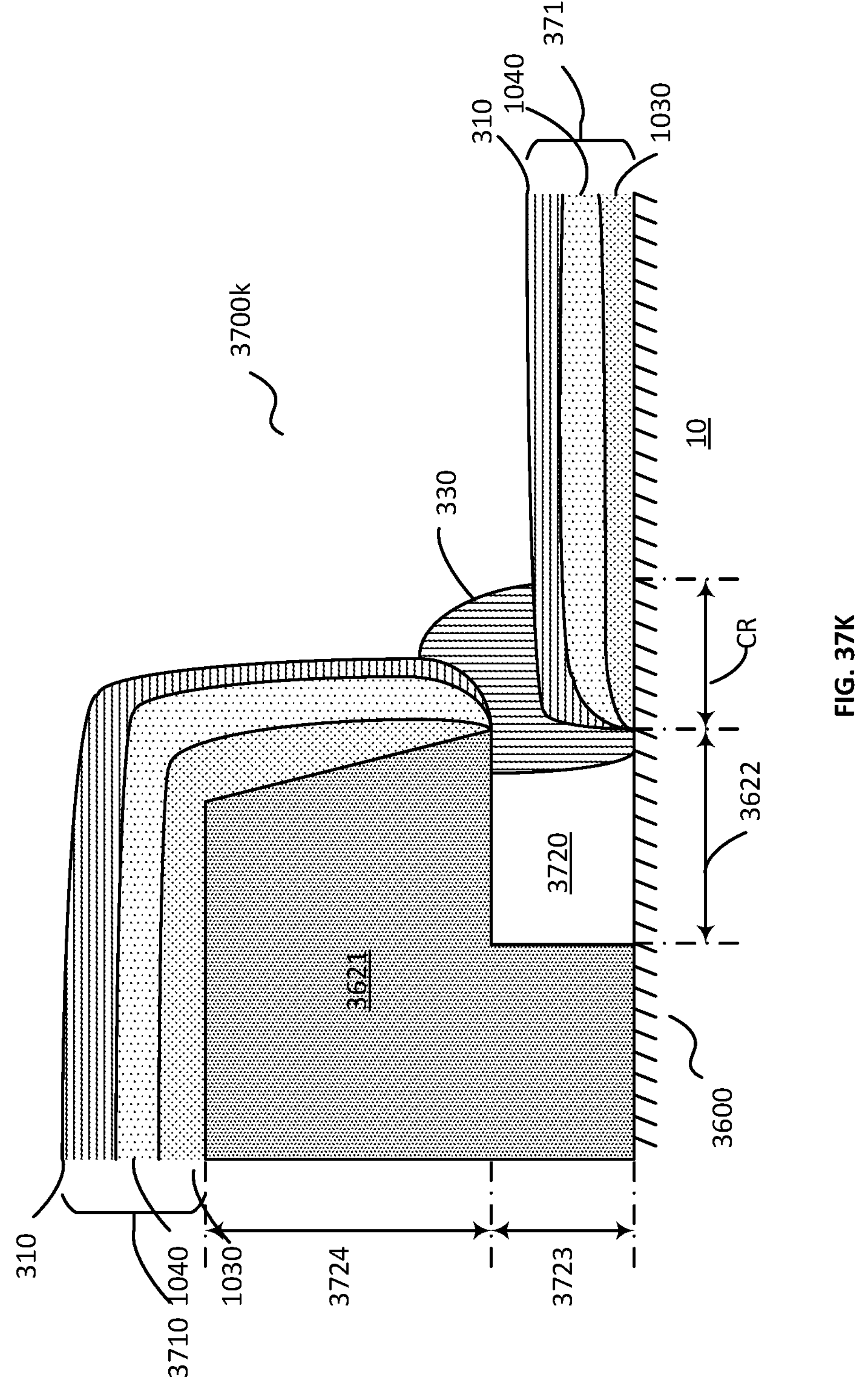
Figure 37L:
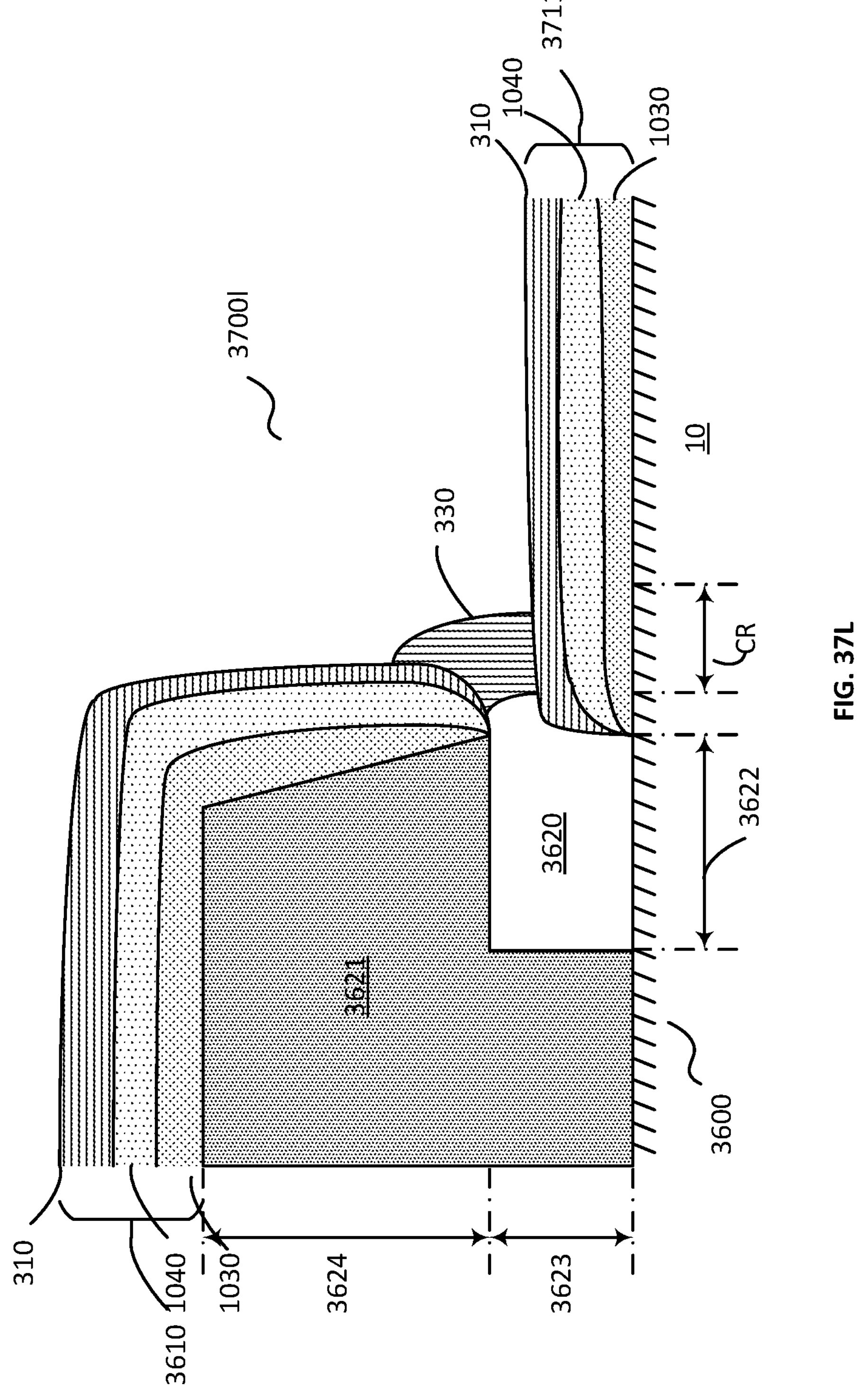
Figure 37M:
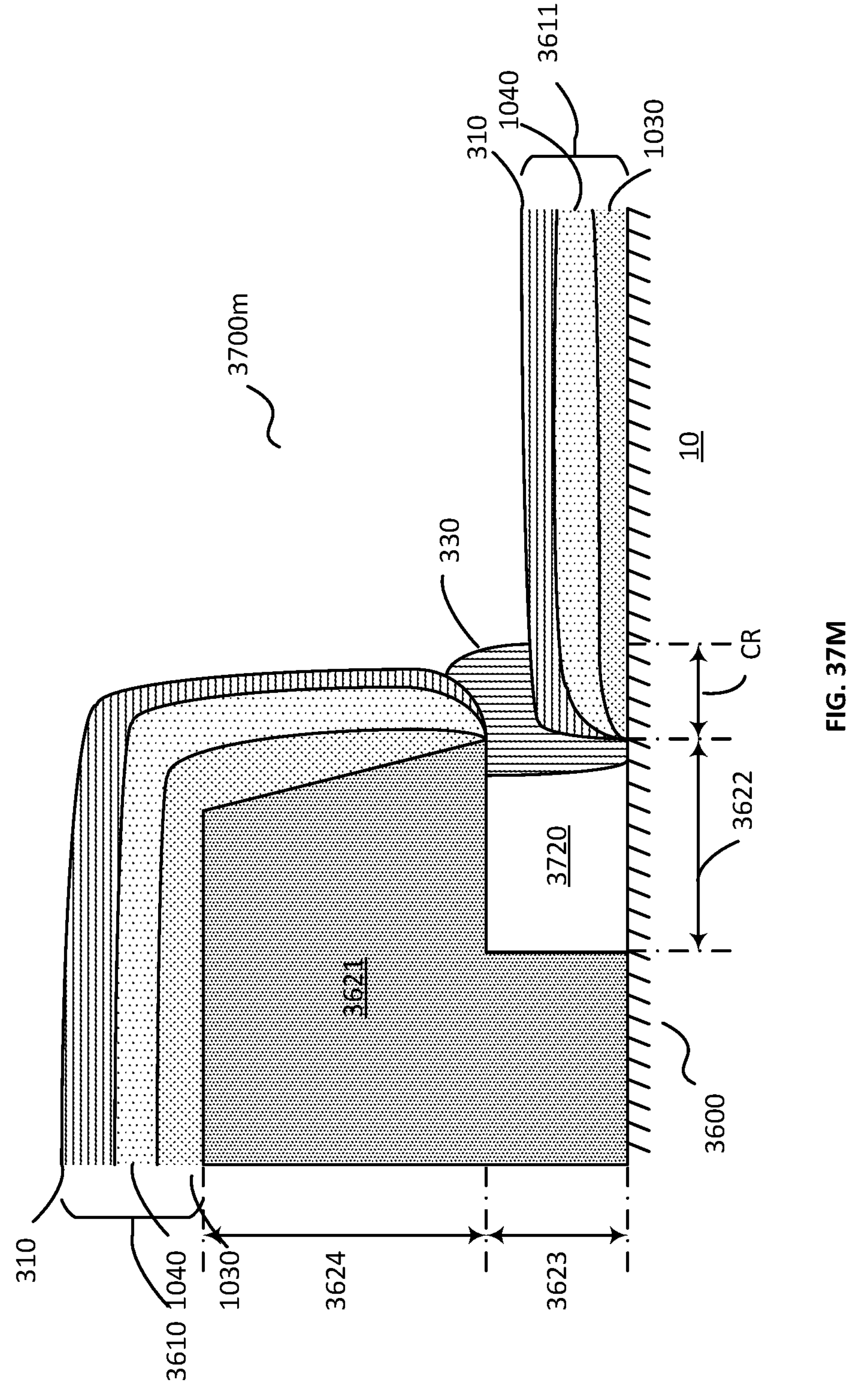
Figure 37N:
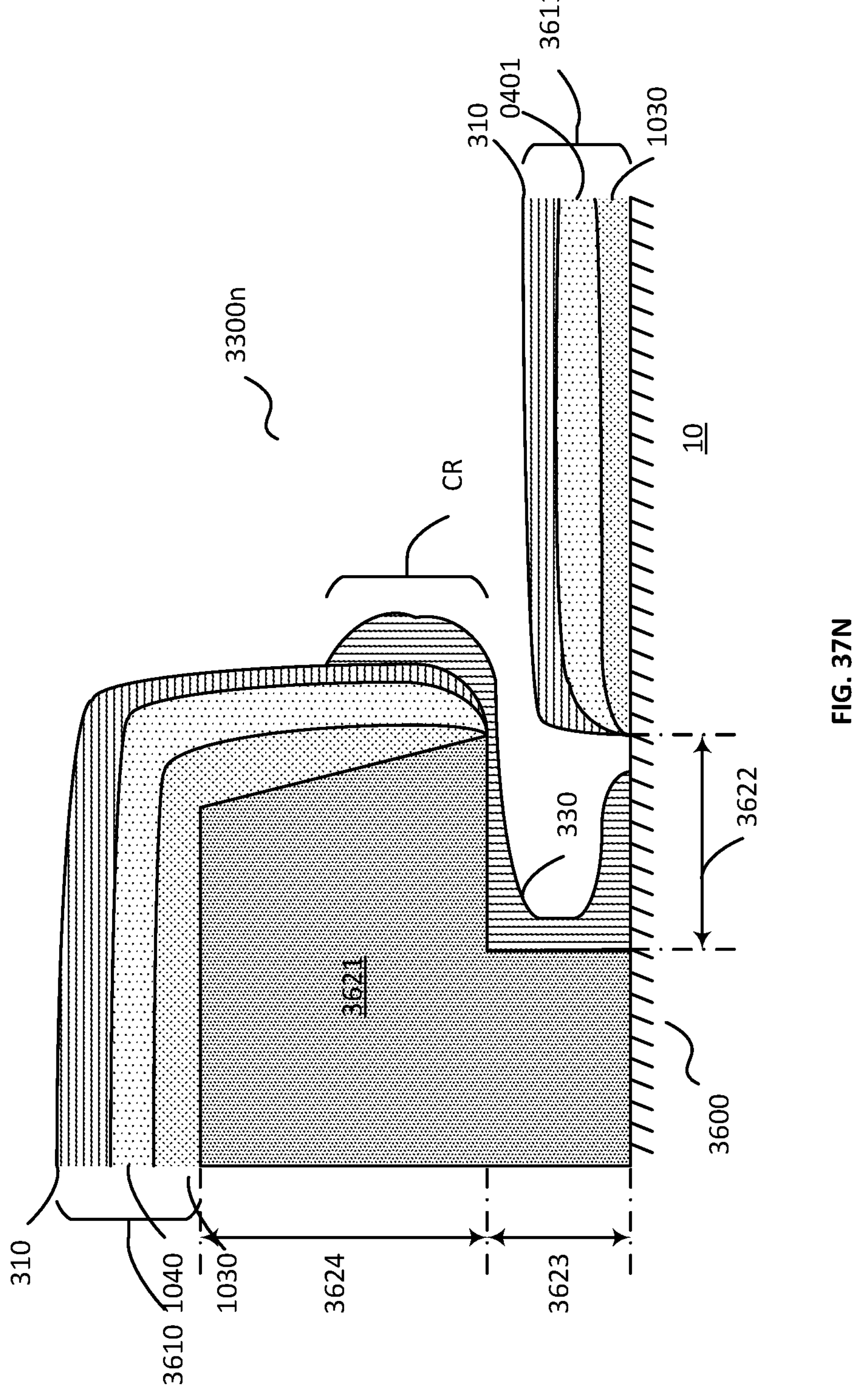
Figure 37O:
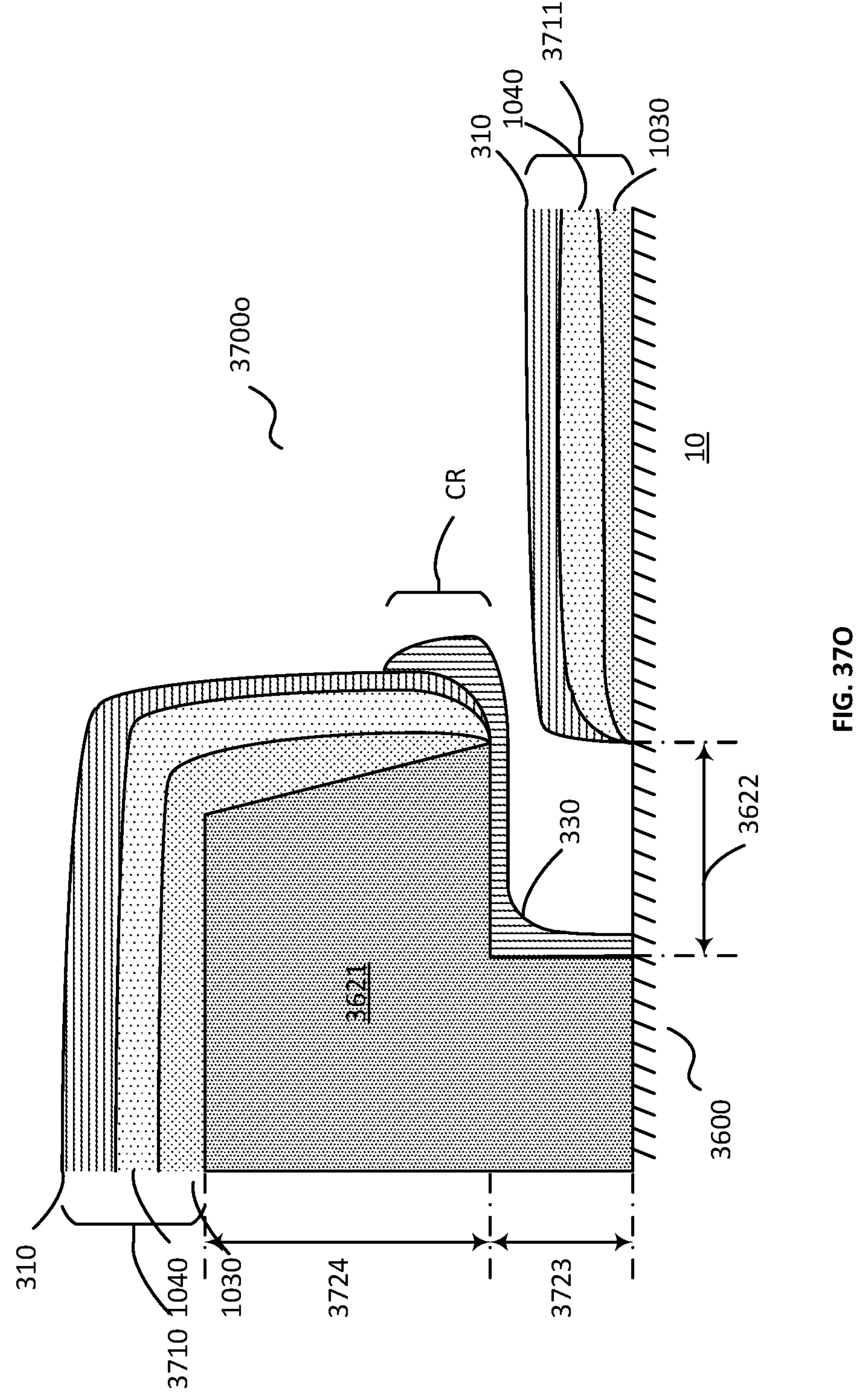
Figure 37P:
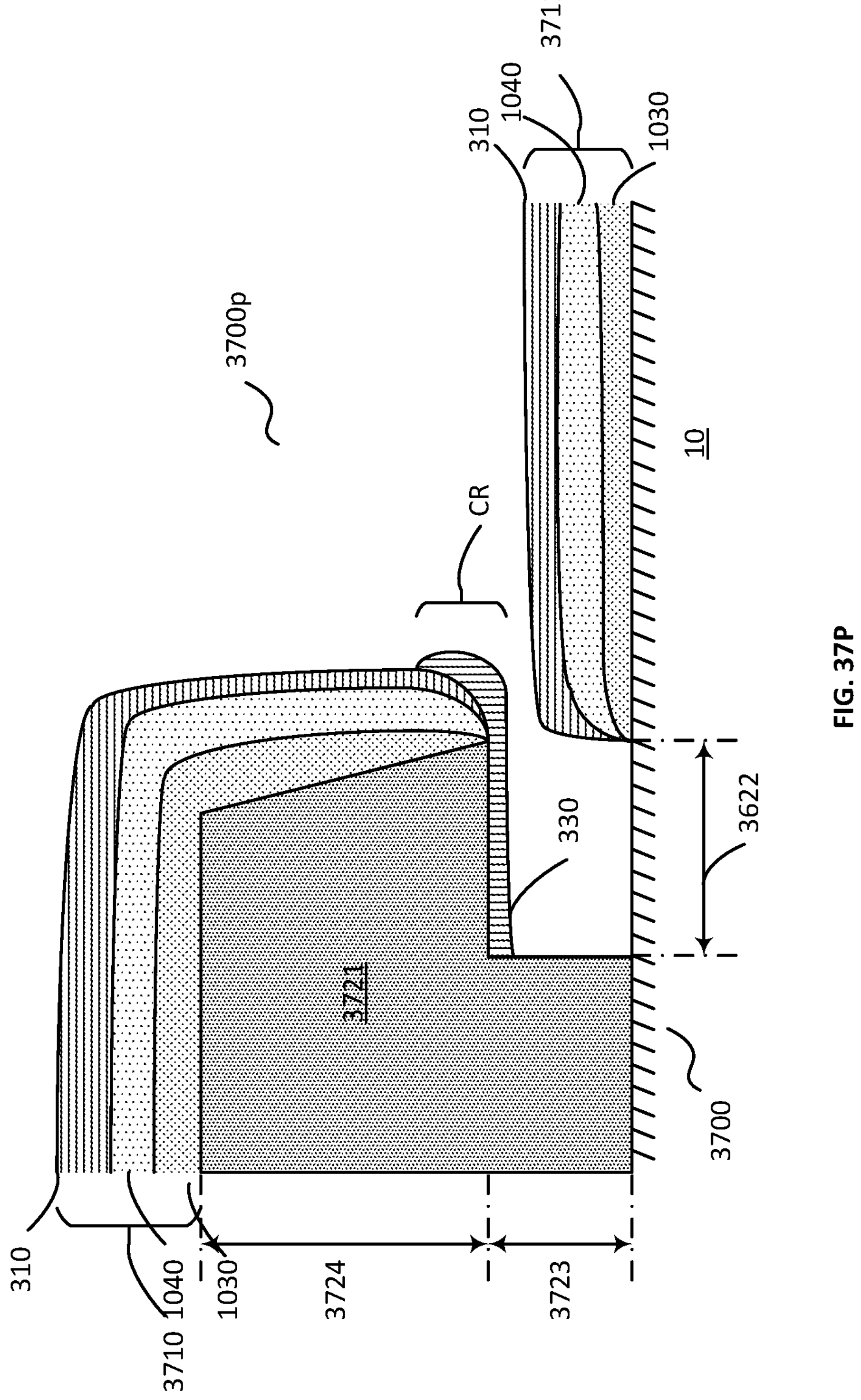

FIGS. 37B-37P show various non-limiting examples of the fragment of the device 3600 shown in FIG. 37A after the stage of depositing the deposited layer 330. In FIGS. 37B-37P, for purposes of simplicity of illustration, not all features of the partition 3621, and/or the recess 3622 as described in FIG. 37A may always be shown and the auxiliary electrode 2150 has been omitted, but it will be appreciated by those having ordinary skill in the relevant art, that such feature(s), and/or the auxiliary electrode 2150 may, in some non-limiting examples, nevertheless be present. It will be appreciated by those having ordinary skill in the relevant art that the auxiliary electrode 2150 may be present in any of the examples of FIGS. 37B-37P, in any form, and/or position, including without limitation, those shown in any of the examples of FIGS. 38A-38G described herein.

In these figures, a device stack 3710 is shown comprising the at least one semiconducting layer 1030, the second electrode 1040 and the NIC 310 deposited on the upper section 3724.

In these figures, a residual device stack 3711 is shown comprising the at least one semiconducting layer 1030, the second electrode 1040 and the NIC 310 deposited on the substrate 10 beyond the partition 3621 and recess 3622. From comparison with FIG. 36, it may be seen that the residual device stack 3711 may, in some non-limiting examples, correspond to the semiconductor layer 1030, second electrode 1040 and the NIC 310 as it approaches the recess 3622 at, and/or proximate to the lip 3729. In some non-limiting examples, the residual device stack 3711 may be formed when an open mask 600, and/or mask-free deposition process is used to deposit various materials of the device stack 3710.

In a non-limiting example 3700*b* shown in FIG. 37B, the deposited layer 330 may be substantially confined to, and/or substantially fills all of the recess 3622. As such, in some non-limiting examples, the deposited layer 330 may be in physical contact with the ceiling 3725, the side 3726 and the floor 3727 and thus be electrically coupled to the auxiliary electrode 2150.

Without wishing to be bound by any particular theory, it may be postulated that substantially filling all of the recess 3622 may reduce a likelihood that any unwanted substances (including without limitation, gases) would be trapped within the recess 3622 during fabrication of the device 3600.

In some non-limiting examples, a coupling, and/or contact region (CR) may correspond to a region of the device 3600 wherein the deposited layer 330 is in physical contact with the device stack 3710 in order to electrically couple the second electrode 1040 with the deposited layer 330. In some non-limiting examples, the CR may extend between about 50-1500 nm from an edge of the device stack 3710 proximate to the partition 3621. By way of non-limiting examples, the CR may extend between about: 50-1000 nm, 100-500 nm, 100-350 nm, 100-300 nm, 150-300 nm, or 100-200 nm. In some non-limiting examples, the CR may encroach on the device stack 3710 substantially laterally away from an edge thereof by such distance.

In some non-limiting examples, an edge of the residual device stack 3711 may be formed by the at least one semiconducting layer 1030, the second electrode 1040 and the NIC 310, wherein an edge of the second electrode 1040 may be coated, and/or covered by the NIC 310. In some non-limiting examples, the edge of the residual device stack 3711 may be formed in other configurations, and/or arrangements. In some non-limiting examples, the edge of the NIC 310 may be recessed relative to the edge of the second electrode 1040, such that the edge of the second electrode 1040 may be exposed, such that the CR may include such exposed edge of the second electrode 1040 in order that the second electrode 1040 may be in physical contact with the deposited layer 330 to electrically couple them. In some non-limiting examples, the edges of the at least one semiconducting layer 1030, the second electrode 1040 and the NIC 310 may be aligned with one another, such that the edges of each layer are exposed. In some non-limiting examples, the edges of the second electrode 1040 and of the NIC 310 may be recessed relative to the edge of the at least one semiconducting layer 1030, such that the edge of the residual device stack 3711 is substantially provided by the semiconductor layer 1030.

Additionally, as shown, in some non-limiting examples, within a small CR and arranged at, and/or near the lip 3729 of the partition 3621, the deposited layer 330 may extend to cover at least an edge of the NIC 310 within the residual device stack 3711 arranged closest to the partition 3621. In some non-limiting examples, the NIC 310 may comprise a semiconducting material, and/or an insulating material.

While it has been described herein that direct deposition of the deposited material 531 on the surface of the NIC 310 is generally inhibited, in some non-limiting examples, it has been discovered that a part of the deposited layer 330 may nevertheless overlap at least a part of the NIC 310. By way of non-limiting example, during deposition of the deposited layer 330, the deposited material 531 may initially deposit within the recess 3622. Thereafter continuing to deposit the deposited material 531 may, in some non-limiting examples, cause the deposited layer 330 to extend laterally beyond the recess 3622 and overlap at least a part of the NIC 310 within the residual device stack 3711.

Those having ordinary skill in the relevant art will appreciate that while the deposited layer 330 has been shown as overlapping a part of the NIC 310, the lateral extent 1310 of the emissive region 2210 remains substantially devoid of a closed coating 340 of the deposited material 531. In some non-limiting examples, the deposited layer 330 may be arranged within the lateral extent 1320 of at least a part of at least one non-emissive region 2220 of the device 3600, in some non-limiting examples, without substantially interfering with emission of photons from emissive region(s) 2210 of the device 3600.

In some non-limiting examples, the deposited layer 330 may nevertheless be electrically coupled to the second electrode 1040 despite the interposition of the NIC 310 therebetween so as to reduce an effective sheet resistance of the second electrode 1040.

In some non-limiting examples, the NIC 310 may be formed using an electrically conductive material, and/or otherwise exhibit a level of charge mobility that allows current to tunnel, and/or pass therethrough.

In some non-limiting examples, the NIC 310 may have a thickness that allows current to pass therethrough. In some non-limiting examples, the thickness of the NIC 310 may be between about: 3-65 nm, 3-50 nm, 5-50 nm, 5-30 nm, 5-15 nm, or 5-10 nm. In some non-limiting examples, the NIC 310 may be provided with a relatively low thickness (in some non-limiting examples, a thin coating thickness), in order to reduce contact resistance that may be created due to the presence of the NIC 310 in the path of such electric current.

Without wishing to be bound by any particular theory, it may be postulated that substantially filling all of the recess 3622 may, in some non-limiting examples, enhance reliability of electrical coupling between the deposited layer 330 and at least one of the second electrode 1040 and the auxiliary electrode 2150.

Further, as shown, in some non-limiting examples, the deposited layer 330 may extend to cover at least a part of the NIC 310 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

In a non-limiting example 3700*c* shown in FIG. 37C, the deposited layer 330 may be substantially confined to, and/or may partially fill the recess 3622. As such, in some non-limiting examples, the deposited layer 330 may be in physical contact with the side 3726, the floor 3727 and, in some non-limiting examples, at least a part of the ceiling 3725 and thus be electrically coupled to the auxiliary electrode 2150.

As shown, in some non-limiting examples, at least a part of the ceiling 3725 is substantially devoid of the deposited layer 330. In some non-limiting examples, such part is proximate to the lip 3729.

Additionally, as shown, in some non-limiting examples, within the small CR arranged at, and/or near the lip 3729 of the partition 3621, the deposited layer 330 may extend to cover at least an edge of the NIC 310 within the residual device stack 3711 arranged closest to the partition 3621. In some non-limiting examples, the deposited layer 330 may nevertheless be electrically coupled to the second electrode 1040 despite the interposition of the NIC 310 therebetween.

In a non-limiting example 3700*d* shown in FIG. 37D, the deposited layer 330 may be substantially confined to, and/or may partially fill the recess 3622. As such, in some non-limiting examples, the deposited layer 330 may be in physical contact with the floor 3727 and in some non-limiting examples, at least a part of the side 3726 and thus be electrically coupled to the auxiliary electrode 2150.

As shown, in some non-limiting examples, the ceiling 3725 is substantially devoid of the deposited layer 330.

Additionally, as shown, in some non-limiting examples, within the small CR arranged at, and/or near the lip 3729 of the partition 3621, the deposited layer 330 may extend to cover at least an edge of the NIC 310 within the residual device stack 3711 arranged closest to the partition 3621. In some non-limiting examples, the deposited layer 330 may nevertheless be electrically coupled to the second electrode 1040 despite the interposition of the NIC 310 therebetween.

In a non-limiting example 3700*e* shown in FIG. 37E, the deposited layer 330 substantially fills all of the recess 3622. As such, in some non-limiting examples, the deposited layer 330 may be in physical contact with the ceiling 3725, the side 3726 and the floor 3727 and thus be electrically coupled to the auxiliary electrode 2150.

Additionally, as shown, in some non-limiting examples, within the CR, the deposited layer 330 may extend to cover at least a part of the NIC 310 within the residual device stack 3711 in order to electrically couple the second electrode 1040 with the deposited layer 330.

Further, as shown, in some non-limiting examples, the deposited layer 330 may extend to cover at least a part of the NIC 310 of the device stack 3710 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

In a non-limiting example 3700*f* shown in FIG. 37F, the deposited layer 330 may be substantially confined to, and/or may partially fill the recess 3622. As such, in some non-limiting examples, the deposited layer 330 may be in physical contact with the ceiling 3725, the side 3726, and in some non-limiting examples, at least a part of the floor 3727 and thus be electrically coupled to the auxiliary electrode 2150.

As shown, in some non-limiting examples, a cavity 3720 may be formed between the deposited layer 330 and the floor 3727. In some non-limiting examples, the cavity 3720 may correspond to a gap separating the deposited layer 330 from at least a part of the floor 3727, such that the deposited layer 330 is not in physical contact therealong.

As shown, in some non-limiting examples, the cavity 3720 may engage a part of the floor 3727 and a part of the residual device stack 3711 and may have a relatively thin profile.

In some non-limiting examples, the cavity 3720 may correspond to a volume that is between about: 1-30%, 5-25%, 5-20% or 5-10% of a volume of the recess 3622.

Additionally, as shown, in some non-limiting examples, within the CR, the deposited layer 330 may extend to cover at least a part of the NIC 310 within the residual device stack 3711 in order to electrically couple the second electrode 1040 with the deposited layer 330.

In a non-limiting example 3300*g* shown in FIG. 33G, the deposited layer 330 may partially fill the recess 3622. As such, in some non-limiting examples, the deposited layer 330 may be in physical contact with the ceiling 3725, the side 3726 and in some non-limiting examples, at least a part of the floor 3727 and thus be electrically coupled to the auxiliary electrode 2150.

As shown, in some non-limiting examples, a cavity 3720 may be formed between the deposited layer 330 and the floor 3727. In some non-limiting examples, the cavity 3720 may correspond to a gap separating the deposited layer 330 from at least a part of the floor 3727, such that the deposited layer 330 is not in physical contact therealong.

As shown, in some non-limiting examples, the cavity 3720 may engage a part of the floor 3727 and a part of the residual device stack 3711 and may have a relatively thin profile.

In some non-limiting examples, the cavity 3720 may correspond to a volume that is between about: 1-30%, 5-25%, 5-20%, or 5-10% of a volume of the recess 3622.

Additionally, as shown, in some non-limiting examples, within the CR, the deposited layer 330 may extend to cover at least a part of the NIC 310 within the residual device stack 3711 in order to electrically couple the second electrode 1040 with the deposited layer 330.

In a non-limiting example 3700*h* shown in FIG. 37H, the deposited layer 330 may partially fill the recess 3622. As such, in some non-limiting examples, the deposited layer 330 may be in physical contact with the ceiling 3725, the side 3726 and, in some non-limiting examples, at least a part of the floor 3727.

As shown, in some non-limiting examples, a cavity 3720 may be formed between the deposited layer 330 and the floor 3727. In some non-limiting examples, the cavity 3720 may correspond to a gap separating the deposited layer 330 from at least a part of the floor 3727, such that the deposited layer 330 is not in physical contact therealong.

As shown, in some non-limiting examples, the cavity 3720 may engage a part of the floor 3727 and a part of the residual device stack 3711 and may have a relatively thin profile.

In some non-limiting examples, the cavity 3720 may correspond to a volume that is between about: 1-30%, 5-25%, 5-20%, or 5-10% of a volume of the recess 3622.

Additionally, as shown, in some non-limiting examples, within the CR, the deposited layer 330 may extend to cover at least a part of the NIC 310 within the residual device stack 3711. In some non-limiting examples, the deposited layer 330 may nevertheless be electrically coupled to the second electrode 1040 despite the interposition of the NIC 310 therebetween.

Further, as shown, in some non-limiting examples, the deposited layer 330 may extend to cover at least a part of the NIC 310 of the device stack 3710 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

In a non-limiting example 3700*i* shown in FIG. 37I, the deposited layer 330 may partially fill the recess 3622. As such, in some non-limiting examples, the deposited layer 330 may be in physical contact with the ceiling 3725, the side 3726 and, in some non-limiting examples, at least a part of the floor 3727.

As shown, in some non-limiting examples, a cavity 3720 may be formed between the deposited layer 330 and the floor 3727. In some non-limiting examples, the cavity 3720 may correspond to a gap separating the deposited layer 330 from at least a part of the floor 3727, such that the deposited layer 330 is not in physical contact therealong.

As shown, in some non-limiting examples, the cavity 3720 may engage a part of the floor 3727 and may have a relatively thicker profile than the cavity 3720 shown in examples 3700*f*-3700*h*.

In some non-limiting examples, the cavity 3720 may correspond to a volume that is between about: 10-80%, 10-70%, 20-60%, 10-30%, 25-50%, 50-80%, or 70-95% of a volume of the recess 3622.

Additionally, as shown, in some non-limiting examples, within the CR, the deposited layer 330 may extend to cover at least a part of the NIC 310 within the residual device stack 3711. In some non-limiting examples, the deposited layer 330 may nevertheless be electrically coupled to the second electrode 1040 despite the interposition of the NIC 310 therebetween.

Further, as shown, in some non-limiting examples, the deposited layer 330 may extend to cover at least a part of the NIC 310 of the device stack 3710 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

In a non-limiting example 3700*j* shown in FIG. 37J, the deposited layer 330 may partially fill the recess 3622. As such, in some non-limiting examples, the deposited layer 330 may be in physical contact with the ceiling 3725, the side 3726 and, in some non-limiting examples, at least a part of the floor 3727.

As shown, in some non-limiting examples, a cavity 3720 may be formed between the deposited layer 330 and the floor 3727. In some non-limiting examples, the cavity 3720 may correspond to a gap separating the deposited layer 330 from at least a part of the floor 3727, such that the deposited layer 330 is not in physical contact therealong.

As shown, in some non-limiting examples, the cavity 3720 may engage a part of the floor 3727 and a [art of the residual device stack 3711 and may have a relatively thicker profile than the cavity 3720 shown in examples 3700*f*-3700*h*.

In some non-limiting examples, the cavity 3720 may correspond to a volume that is between about: 10-80%, 10-70%, 20-60%, 10-30%, 25-50%, 50-80%, or 70-95% of a volume of the recess 3622.

Additionally, as shown, in some non-limiting examples, within the CR, the deposited layer 330 may extend to cover at least a part of the NIC 310 within the residual device stack 3711. In some non-limiting examples, the deposited layer 330 may nevertheless be electrically coupled to the second electrode 1040 despite the interposition of the NIC 310 therebetween.

Further, as shown, in some non-limiting examples, the deposited layer 330 may extend to cover at least a part of the NIC 310 of the device stack 3710 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

In a non-limiting example 3700*k* shown in FIG. 37K, the deposited layer 330 may partially fill the recess 3622. As such, in some non-limiting examples, the deposited layer 330 may be in physical contact with, in some non-limiting examples, at least a part of the ceiling 3725 and, in some non-limiting examples, at least a part of the floor 3727.

As shown, in some non-limiting examples, a cavity 3720 may be formed between the deposited layer 330 and the side 3726, in some non-limiting examples, at least a part of the ceiling 3725 and in some non-limiting examples, at least a part of the floor 3727. In some non-limiting examples, the cavity 3720 may correspond to a gap separating the deposited layer 330 from the side 3726, in some non-limiting examples, at least a part of the ceiling 3725 and, in some non-limiting examples, at least a part of the floor 3727, such that the deposited layer 330 is not in physical contact therealong.

As shown, in some non-limiting examples, the cavity 3720 may occupy substantially all of the recess 3622.

In some non-limiting examples, the cavity 3720 may correspond to a volume that is between about: 10-80%, 10-70%, 20-60%, 10-30%, 25-50%, 50-80%, or 70-95% of a volume of the recess 3622.

Additionally, as shown, in some non-limiting examples, within the CR, the deposited layer 330 may extend to cover at least a part of the NIC 310 within the residual device stack 3711. In some non-limiting examples, the deposited layer 330 may nevertheless be electrically coupled to the second electrode 1040 despite the interposition of the NIC 310 therebetween.

Further, as shown, in some non-limiting examples, the deposited layer 330 may extend to cover at least a part of the NIC 310 of the device stack 3710 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

In a non-limiting example 3700I shown in FIG. 37L, the deposited layer 330 may partially fill the recess 3622.

As shown, in some non-limiting examples, a cavity 3720 may be formed between the deposited layer 330 and the side 3726, the floor 3727 and the ceiling 3725. In some non-limiting examples, the cavity 3720 may correspond to a gap separating the deposited layer 330 from the side 3726, the floor 3727 and the ceiling 3725, such that the deposited layer 330 is not in physical contact therealong.

As shown, in some non-limiting examples, the cavity 3720 may occupy substantially all of the recess 3622.

In some non-limiting examples, the cavity 3720 may correspond to a volume that is greater than about 80% of a volume of the recess 3622.

Additionally, as shown, in some non-limiting examples, within the CR, the deposited layer 330 may extend to cover at least a part of the NIC 310 within the residual device stack 3711. In some non-limiting examples, the deposited layer 330 may nevertheless be electrically coupled to the second electrode 1040 despite the interposition of the NIC 310 therebetween.

Further, as shown, in some non-limiting examples, the deposited layer 330 may extend to cover at least a part of the NIC 310 of the device stack 3710 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

In a non-limiting example 3700*m* shown in FIG. 37M, the deposited layer 330 may be substantially confined to, and/or may partially fill the recess 3622. As such, in some non-limiting examples, the deposited layer 330 may be in physical contact with, in some non-limiting examples, at least a part of the ceiling 3725 and in some non-limiting examples, at least a part of the floor 3727.

As shown, in some non-limiting examples, a cavity 3720 may be formed between the deposited layer 330 and the side 3726, in some non-limiting examples, at least a part of the ceiling 3725 and in some non-limiting examples, at least a part of the floor 3727. In some non-limiting examples, the cavity 3720 may correspond to a gap separating the deposited layer 330 from the side, in some non-limiting examples, at least a part of the ceiling 3725 and, in some non-limiting examples, at least a part of the floor 3727, such that the deposited layer 330 is not in physical contact therealong.

As shown, in some non-limiting examples, the cavity 3720 may occupy substantially all of the recess 3622.

In some non-limiting examples, the cavity 3720 may correspond to a volume that is between about: 10-80%, 10-70%, 20-60%, 10-30%, 25-50%, 50-80%, or 70-95% of a volume of the recess 3622.

Additionally, as shown, in some non-limiting examples, within the CR, the deposited layer 330 may extend to cover at least a part of the NIC 310 within the residual device stack 3711. In some non-limiting examples, the deposited layer 330 may nevertheless be electrically coupled to the second electrode 1040 despite the interposition of the NIC 310 therebetween.

Further, as shown, in some non-limiting examples, the deposited layer 330 may extend to cover at least a part of the NIC 310 of the device stack 3710 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

In a non-limiting example 3700*n* shown in FIG. 37N, the deposited layer 330 may partially fill the recess 3622. As such, in some non-limiting examples, the deposited layer 330 may be in physical contact with the ceiling 3725, the side 3726 and, in some non-limiting examples, at least a part of the floor 3727.

Additionally, as shown, in some non-limiting examples, the deposited layer 330 may extend to cover at least a part of the NIC 310 of the device stack 3710 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

In a non-limiting example 3700*o* shown in FIG. 37O, the deposited layer 330 may partially fill the recess 3622. As such, in some non-limiting examples, the deposited layer 330 may be in physical contact with the ceiling 3725, the side 3726 and, in some non-limiting examples, at least a part of the floor 3727.

Additionally, as shown, in some non-limiting examples, the deposited layer 330 may extend to cover at least a part of the NIC 310 of the device stack 3710 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

In a non-limiting example 3700*p* shown in FIG. 37P, the deposited layer 330 may partially fill the recess 3622. As such, in some non-limiting examples, the deposited layer 330 may be in physical contact with the ceiling 3725, in some non-limiting examples, at least a part of the side 3726.

Additionally, as shown, in some non-limiting examples, the deposited layer 330 may extend to cover at least a part of the NIC 310 of the device stack 3710 disposed on the upper section 3724 of the partition 3621. In some non-limiting examples, a part of the NIC 310 at, and/or proximate to the lip 3729 may be covered by the deposited layer 330. In some non-limiting examples, the deposited layer 330 may nevertheless be electrically coupled to the second electrode 1040 despite the interposition of the NIC 310 therebetween.

FIGS. 38A-38G show various non-limiting examples of different locations of the auxiliary electrode 2150 throughout the fragment of the device 3600 shown in FIG. 37A, again at a stage prior to deposition of the at least one semiconducting layer 1030. Accordingly, in FIGS. 37A-37G, the at least one semiconducting layer 1030, the second electrode 1040 and the NIC 310, whether or not as part of the residual device stack 3711, and the deposited layer 330 are not shown. Nevertheless, it will be appreciated by those having ordinary skill in the relevant art, that such feature(s), and/or layer(s) may be present, after deposition, in any of the examples of FIGS. 38A-38G, in any form, and/or position, including without limitation, those shown in any of the examples of FIGS. 37B-37P.

Figure 38A:
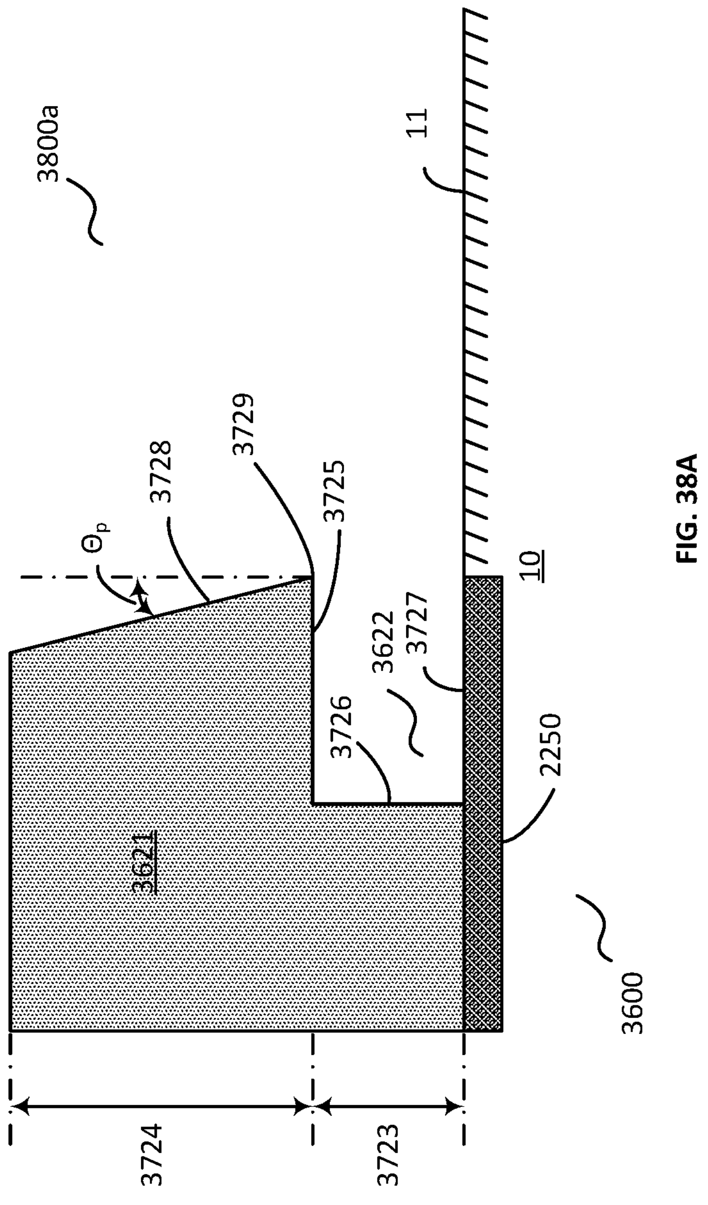
FIGS. 38A-38G are schematic diagrams that show various examples of an auxiliary electrode within the device of FIG. 37A, according to various examples in the present disclosure.

In a non-limiting example 3800*a* shown in FIG. 38A, the auxiliary electrode 2150 may be arranged adjacent to, and/or within the substrate 10 such that a surface of the auxiliary electrode 2150 is exposed in the recess 3622. As shown, in some non-limiting examples, such surface of the auxiliary electrode 2150 may be provided in, and/or may form, and/or provide at least a part of the floor 3727. By way of non-limiting example, the auxiliary electrode 2150 may be arranged to be disposed adjacent to the partition 3621. In some non-limiting examples, the auxiliary electrode 2150 may be formed of at least one electrically conductive material. In some non-limiting examples, the partition 3621 may be formed of at least one substantially insulating material including without limitation, photoresist. In some non-limiting examples, various features of the device 3600, including without limitation, the partition 3621, and/or the auxiliary electrode 2150, may be formed using techniques including without limitation, photolithography.

Figure 38B:
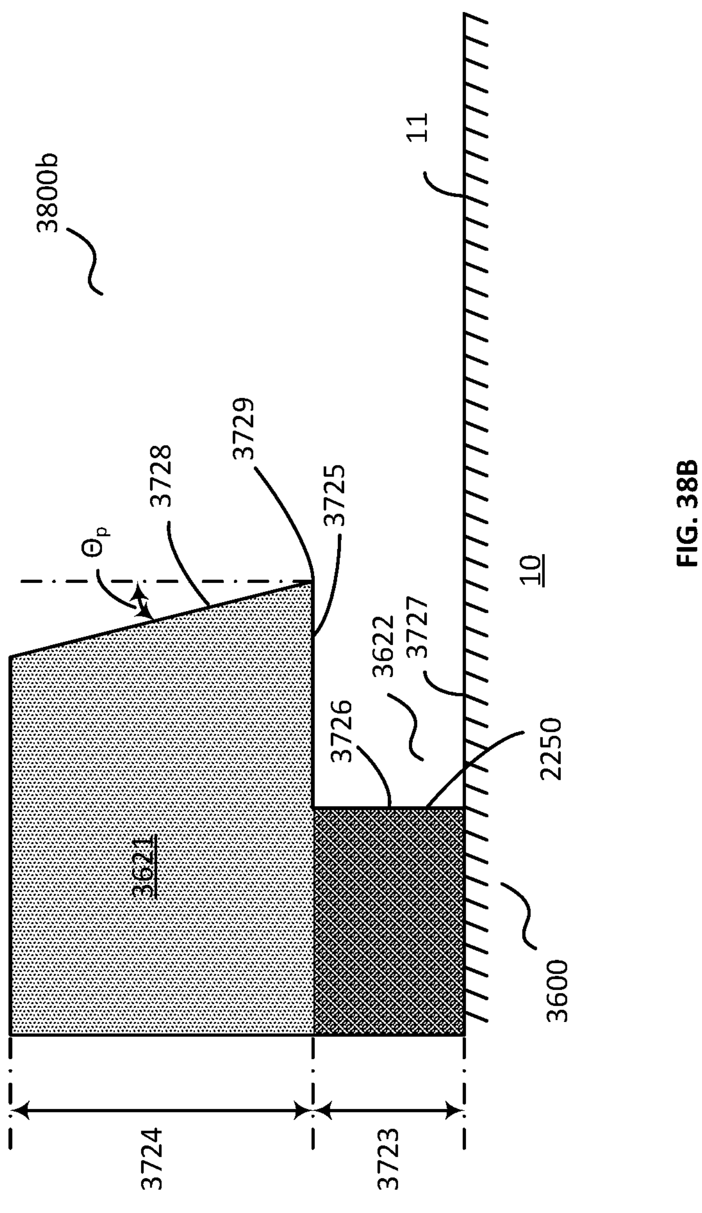

In a non-limiting example 3800*b* shown in FIG. 38B, the auxiliary electrode 2150 may be formed integrally with, and/or as part of the partition 3621 such that a surface of the auxiliary electrode 2150 is exposed in the recess 3622. As shown, in some non-limiting examples, such surface of the auxiliary electrode 2150 may be provided in, and/or may form, and/or provide at least a part of the side 3726. By way of non-limiting example, the auxiliary electrode 2150 may be arranged to correspond to the lower section 3723. In some non-limiting examples, the auxiliary electrode 2150 may be formed of at least one electrically conductive material. In some non-limiting examples, the upper section 3724 may be formed of at least one substantially insulating material including without limitation, photoresist. In some non-limiting examples, various features of the device 3600, including without limitation, the upper section 3724, and/or the auxiliary electrode 2150, may be formed using techniques including without limitation, photolithography.

Figure 38C:
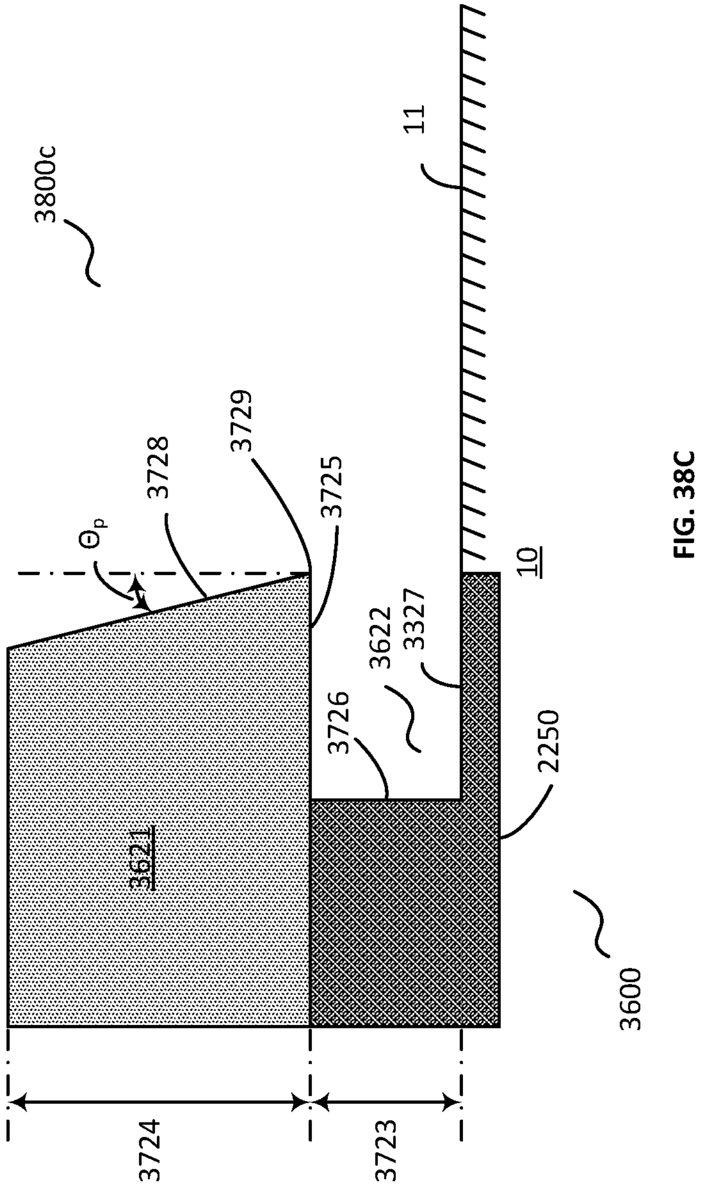

In a non-limiting example 3800*c* shown in FIG. 38C, the auxiliary electrode 2150 may be arranged both adjacent to, and/or within the substrate 10 and integrally with, and/or as part of the partition 3621 such that a surface of the auxiliary electrode 2150 is exposed in the recess 3622. As shown, in some non-limiting examples, such surface of the auxiliary electrode 2150 may be provided in, and/or may form, and/or provide at least a part of the side 3726, and/or at least a part of the floor 3727. By way of non-limiting example, the auxiliary electrode 2150 may be arranged to be disposed adjacent to the partition 3621, and/or to correspond to the lower section 3723. In some non-limiting examples, the part of the auxiliary electrode 2150 disposed adjacent to the partition 3621 may be electrically coupled, and/or in physical contact with the part thereof that corresponds to the lower section 3723. In some non-limiting examples, such parts may be formed continuously, and/or integrally with one another. In some non-limiting examples, the auxiliary electrode 2150 may be formed of at least one electrically conductive material. In some non-limiting examples, the parts thereof may be formed of different materials. In some non-limiting examples, the partition 3621, and/or the upper section 3724 thereof may be formed of at least one substantially insulating material including without limitation, photoresist. In some non-limiting examples, various features of the device 3600, including without limitation, the partition 3621, the upper section 3724, and/or the auxiliary electrode 2150, may be formed using techniques including without limitation, photolithography.

Figure 38D:
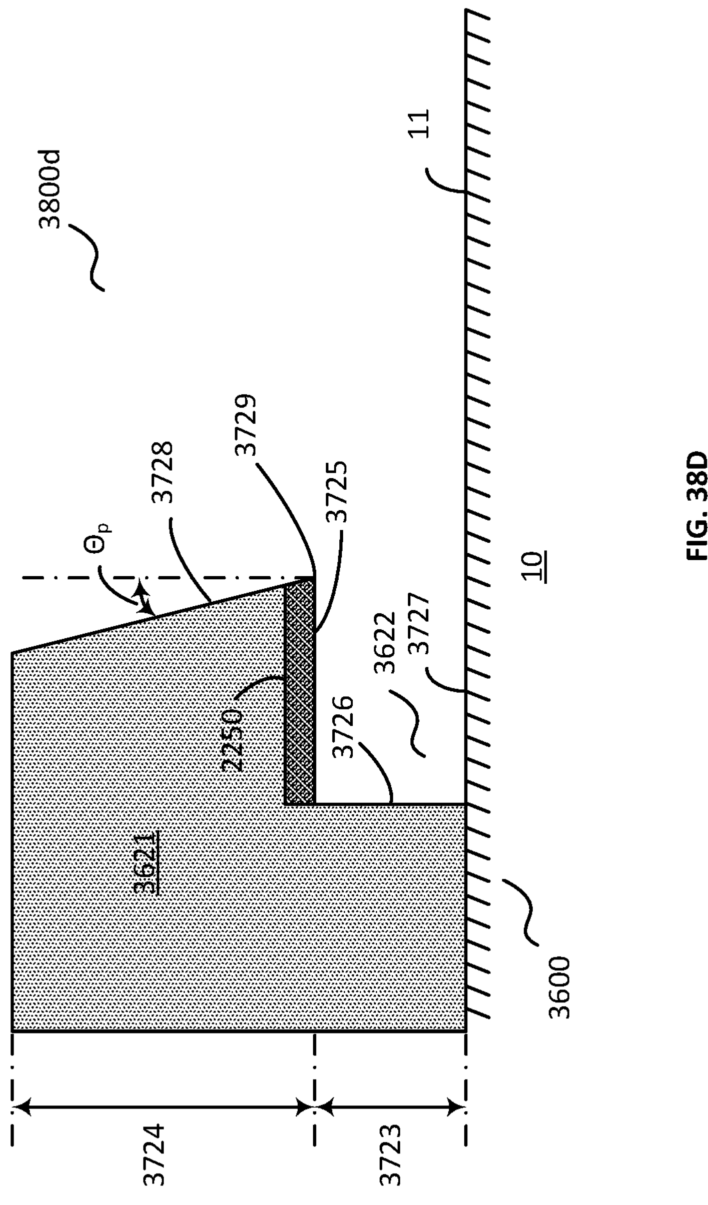

In a non-limiting example 3800*d* shown in FIG. 38D, the auxiliary electrode 2150 may be arranged adjacent to, and/or within the upper section 3724 such that a surface of the auxiliary electrode 2150 is exposed within the recess 3622. As shown, in some non-limiting examples, such surface of the auxiliary electrode 2150 may be provided in, and/or may form, and/or provide at least a part of the ceiling 3725. By way of non-limiting example, the auxiliary electrode 2150 may be arranged to be disposed adjacent to the upper section 3724. In some non-limiting examples, the auxiliary electrode 2150 may be formed of at least one electrically conductive material. In some non-limiting examples, the partition 3621 may be formed of at least one substantially insulating material including without limitation, photoresist. In some non-limiting examples, various features of the device 3600, including without limitation, the partition 3621, and/or the auxiliary electrode 2150, may be formed using techniques including without limitation, photolithography.

Figure 38E:
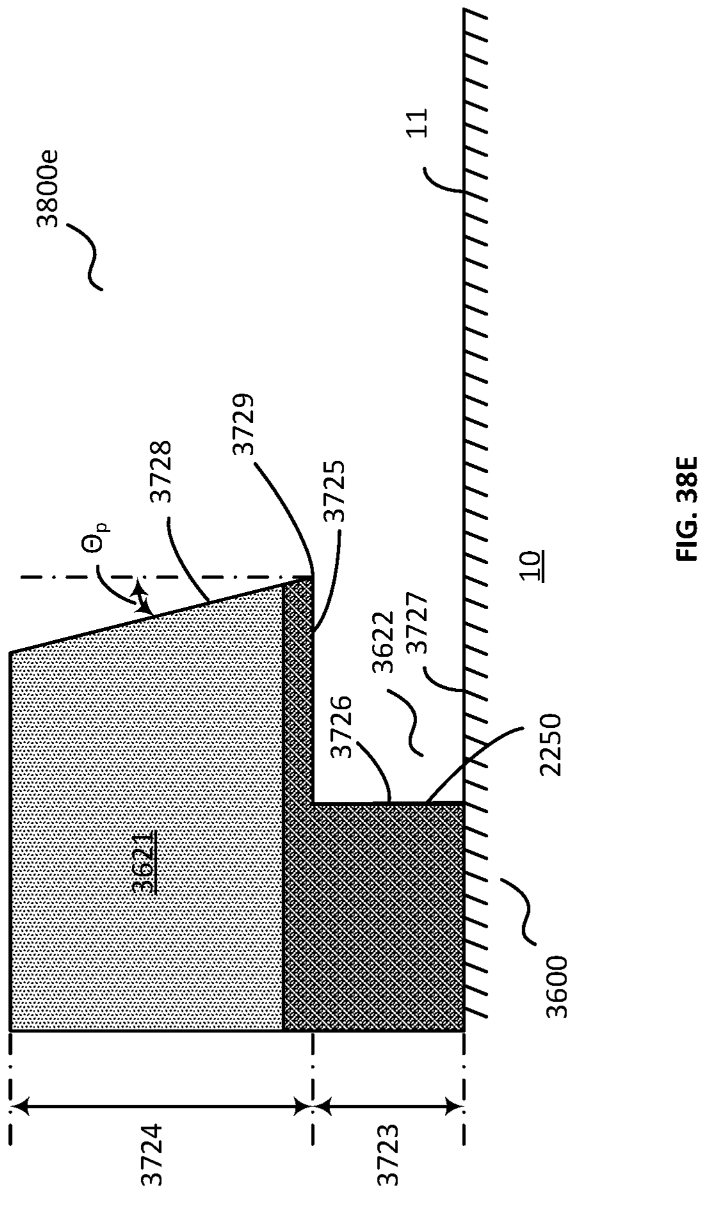

In a non-limiting example 3800*e* shown in FIG. 38E, the auxiliary electrode 2150 may be arranged both adjacent to, and/or within the upper section 3724 and integrally with, and/or as part of the partition 3621 such that a surface of the auxiliary electrode 2150 is exposed in the recess 3622. As shown, in some non-limiting examples, such surface of the auxiliary electrode 2150 may be provided in, and/or may form, and/or provide at least a part of the ceiling 3725, and/or at least a part of the side 3726. By way of non-limiting example, the auxiliary electrode 2150 may be arranged to be disposed adjacent to the upper section 3724, and/or to correspond to the lower section 3723. In some non-limiting examples, the part of the auxiliary electrode 2150 disposed adjacent to the upper section 3724 may be electrically coupled, and/or in physical contact with the part thereof that corresponds to the lower section 3723. In some non-limiting examples, such parts may be formed continuously, and/or integrally with one another. In some non-limiting examples, the auxiliary electrode 2150 may be formed of at least one electrically conductive material. In some non-limiting examples, the parts thereof may be formed of different materials. In some non-limiting examples, the upper section 3724 may be formed of at least one substantially insulating material including without limitation, photoresist. In some non-limiting examples, various features of the device 3600, including without limitation, the upper section 3724, and/or the auxiliary electrode 2150, may be formed using techniques including without limitation, photolithography.

Figure 38F:
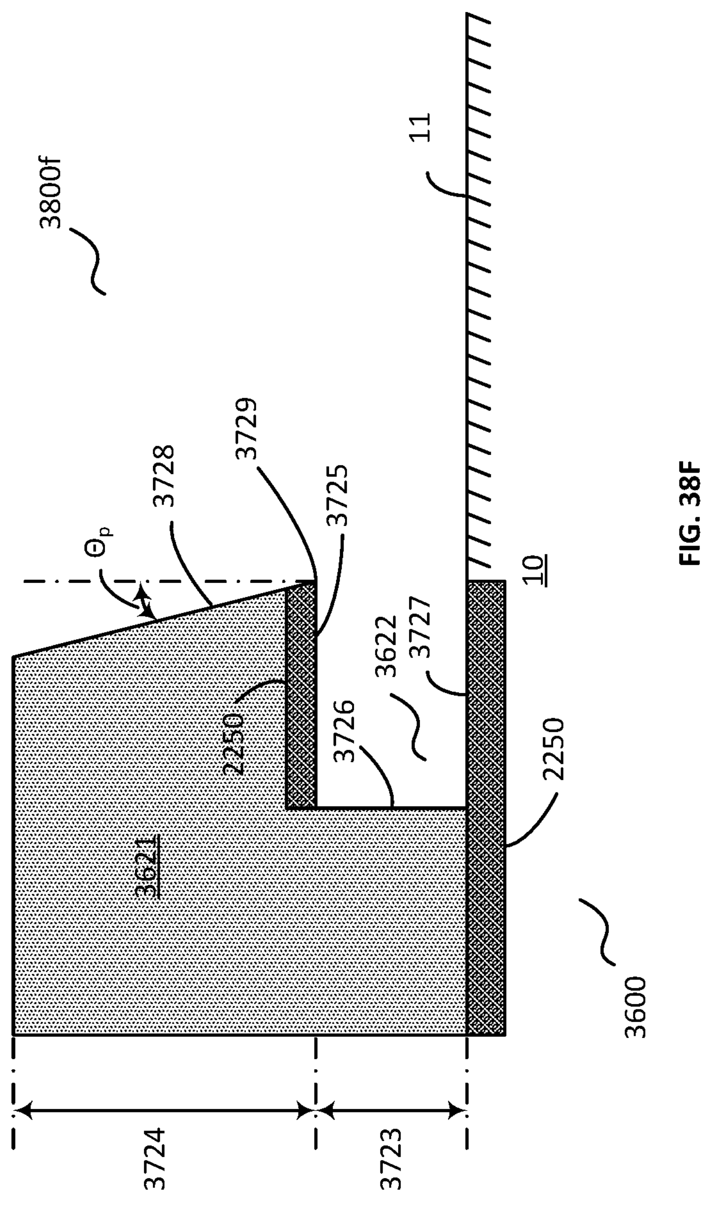

In a non-limiting example 3800*f* shown in FIG. 38F, the auxiliary electrode 2150 may be arranged both adjacent to, and/or within the substrate 10 and adjacent to, and/or within the upper section 3724 such that a surface of the auxiliary electrode 2150 is exposed within the recess 3622. As shown, in some non-limiting examples, such surface of the auxiliary electrode 2150 may be provided in, and/or may form, and/or provide at least a part of the ceiling 3725, and/or at least a part of the floor 3727. By way of non-limiting example, the auxiliary electrode 2150 may be arranged to be disposed adjacent to the partition 3621, and/or adjacent to the upper section 3724 thereof. In some non-limiting examples, the part of the auxiliary electrode 2150 disposed adjacent to the partition may be electrically coupled to the part thereof that corresponds to the ceiling 3725. In some non-limiting examples, the auxiliary electrode 2150 may be formed of at least one electrically conductive material. In some non-limiting examples, the part thereof may be formed of different materials. In some non-limiting examples, the partition 3621, and/or the upper section 3724 thereof may be formed of at least one substantially insulating material including without limitation, photoresist. In some non-limiting examples, various features of the device 3600, including without limitation, the partition 3621, the upper section 3724, and/or the auxiliary electrode 2150, may be formed using techniques including without limitation, photolithography.

Figure 38G:
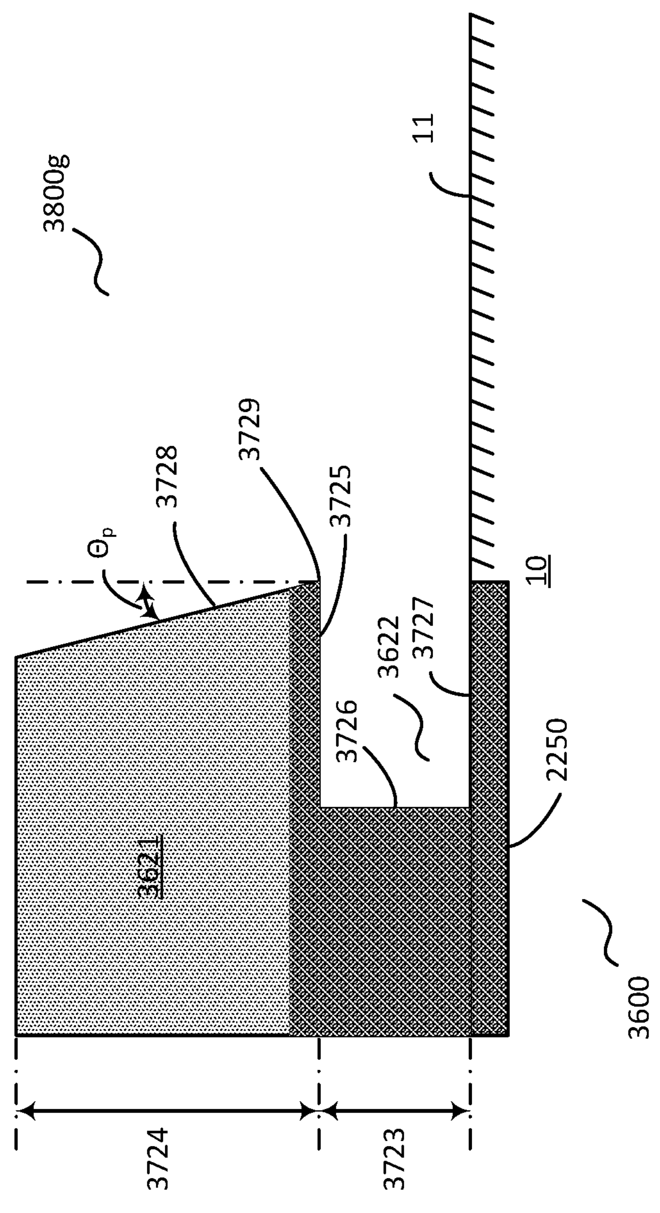

In a non-limiting example 3800*g* shown in FIG. 38G the auxiliary electrode 2150 may be arranged both adjacent to, and/or within the substrate 10, integrally with, and/or as part of the partition 3621, and/or adjacent to, and/or within the upper section 3724 such that a surface of the auxiliary electrode 2150 is exposed within the recess 3622. As shown, in some non-limiting examples, such surface of the auxiliary electrode 2150 may be provided in, and/or may form, and/or provide at least a part of the ceiling 3725, at least a part of the side 3726, and/or at least a part of the floor 3727. By way of non-limiting example, the auxiliary electrode 2150 may be arranged to be disposed adjacent to the partition 3621, to correspond to the lower section 3723, and/or adjacent to the upper section 3724 thereof. In some non-limiting examples, the part of the auxiliary electrode 2150 disposed adjacent to the partition 3621 may be electrically coupled to at least one of the parts thereof that correspond to the lower section 3723, and/or to the ceiling 3725. In some non-limiting examples, the part of the auxiliary electrode 2150 that corresponds to the lower section 3723 may be electrically coupled to at least one of the parts thereof disposed adjacent to the partition 3621, and/or to the ceiling 3725. In some non-limiting examples, the part of the auxiliary electrode 2150 that corresponds to the ceiling 3725 may be electrically coupled to at least one of the parts thereof disposed adjacent to the partition, and/or to the lower section 3723. In some non-limiting examples, the part of the auxiliary electrode 2150 that corresponds to the lower section 3723 may be in physical contact with at least one of the parts thereof disposed adjacent to the partition 3621, and/or that corresponds to the upper section 3724. In some non-limiting examples, the auxiliary electrode 2150 may be formed of at least one electrically conductive material. In some non-limiting examples, the parts thereof may be formed of different materials. In some non-limiting examples, the partition 3621, the lower section 3723, and/or the upper section 3724 thereof may be formed of at least one substantially insulating material including without limitation, photoresist. In some non-limiting examples, various features of the device 3600, including without limitation, the partition 3621, the lower section 3723, and/or the upper section 3724 thereof, and/or the auxiliary electrode 2150, may be formed using techniques including without limitation, photolithography.

In some non-limiting examples, various features described in relation to FIGS. 37B-37P may be combined with various features described in relation to FIGS. 38A-38G. In some non-limiting examples, the residual device stack 3711 and the deposited layer 330 according to any one of FIGS. 37B, 37C, 37E, 37F, 37G, 37H, 37I, and/or 37J may be combined together with the partition 3621 and the auxiliary electrode 2150 according to any one of FIGS. 38A-38G. In some non-limiting examples, any one of FIGS. 37K-37M may be independently combined with any one of FIGS. 38D-38G. In some non-limiting examples, any one of FIGS. 37C-37D may be combined with any one of FIGS. 38A, 38C, 38F, and/or 38G.

Aperture in Non-Emissive Region

Figure 39A:
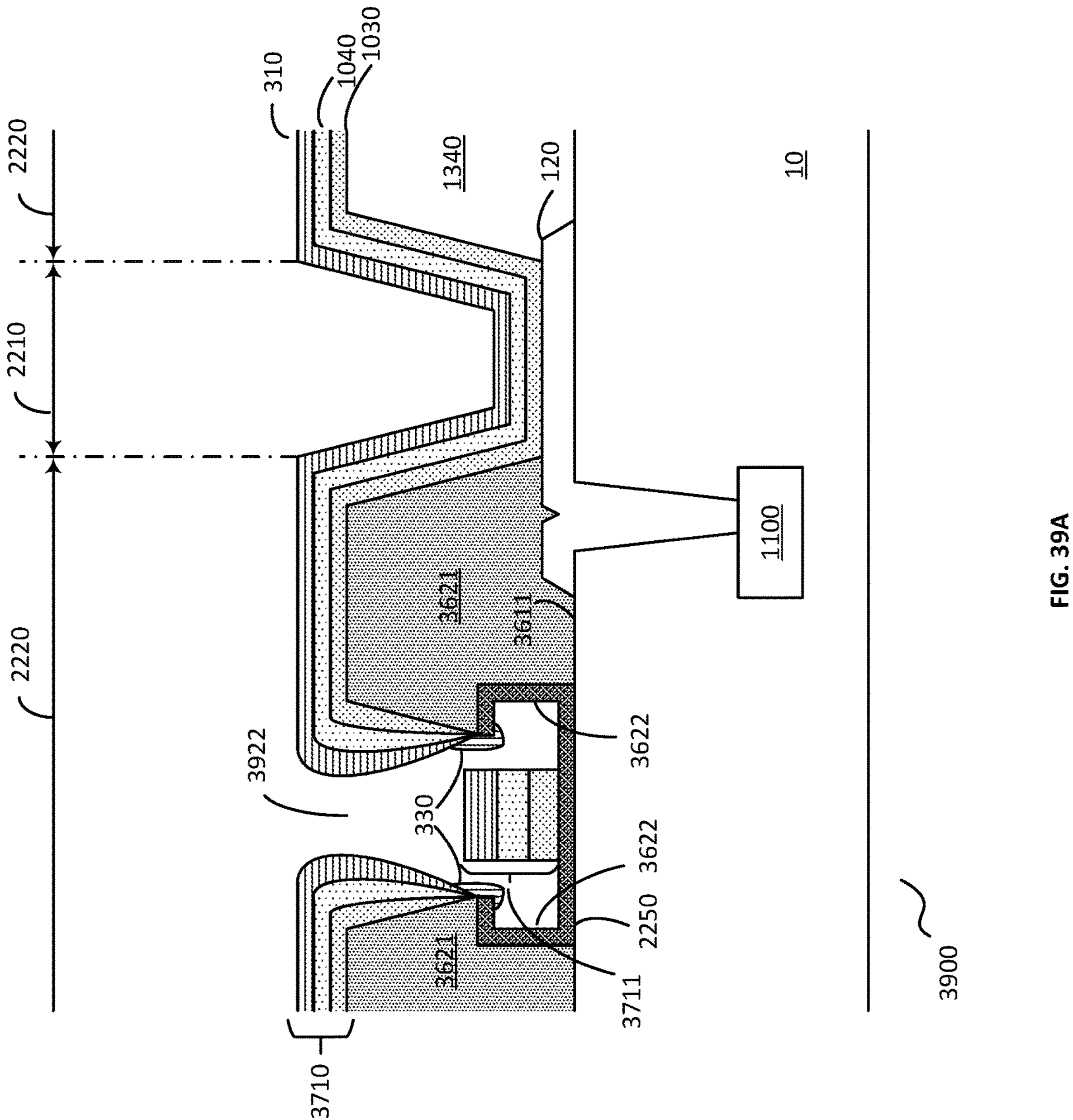
FIGS. 39A-39B are schematic diagrams that show example cross-sectional views of an example version of the device of FIG. 13 having a partition and a sheltered region, such as an aperture, in a non-emissive region, according to various examples in the present disclosure.

Turning now to FIG. 39A, there is shown a cross-sectional view of an example version 3900 of the device 1000. The device 3900 differs from the device 3600 in that a pair of partitions 3621 in the non-emissive region 2220 are disposed in a facing arrangement to define a sheltered region 3465, such as an aperture 3922, therebetween. As shown, in some non-limiting examples, at least one of the partitions 3621 may function as a PDL 1340 that covers at least an edge of the first electrode 1020 and that defines at least one emissive region 2210. In some non-limiting examples, at least one of the partitions 3621 may be provided separately from a PDL 1340.

A sheltered region 3465, such as the recess 3622, is defined by at least one of the partitions 3621. In some non-limiting examples, the recess 3622 may be provided in a part of the aperture 3922 proximal to the substrate 10. In some non-limiting examples, the aperture 3922 may be substantially elliptical when viewed in plan view. In some non-limiting examples, the recess 3622 may be substantially annular when viewed in plan view and surround the aperture 3922.

In some non-limiting examples, the recess 3622 may be substantially devoid of materials for forming each of the layers of the device stack 3710, and/or of the residual device stack 3711.

In some non-limiting examples, the residual device stack 3711 may be disposed within the aperture 3922. In some non-limiting examples, evaporated materials for forming each of the layers of the device stack 3710 may be deposited within the aperture 3922 to form the residual device stack 3711 therein.

In some non-limiting examples, the auxiliary electrode 2150 may be arranged such that at least a part thereof is disposed within the recess 3622. By way of non-limiting example, the auxiliary electrode 2150 may be disposed relative to the recess 3622 by any one of the examples shown in FIGS. 38A-38G. As shown, in some non-limiting examples, the auxiliary electrode 2150 may be arranged within the aperture 3922, such that the residual device stack 3711 is deposited onto a surface of the auxiliary electrode 2150.

A deposited layer 330 may be disposed within the aperture 3922 for electrically coupling the second electrode 1040 to the auxiliary electrode 2150. By way of non-limiting example, at least a part of the deposited layer 330 may be disposed within the recess 3622. By way of non-limiting example, the deposited layer 330 may be disposed relative to the recess 3622 by any one of the examples shown in FIGS. 37A-37P. By way of non-limiting example, the arrangement shown in FIG. 39A may be seen to be a combination of the example shown in FIG. 37P in combination with the example shown in FIG. 38C.

Figure 39B:
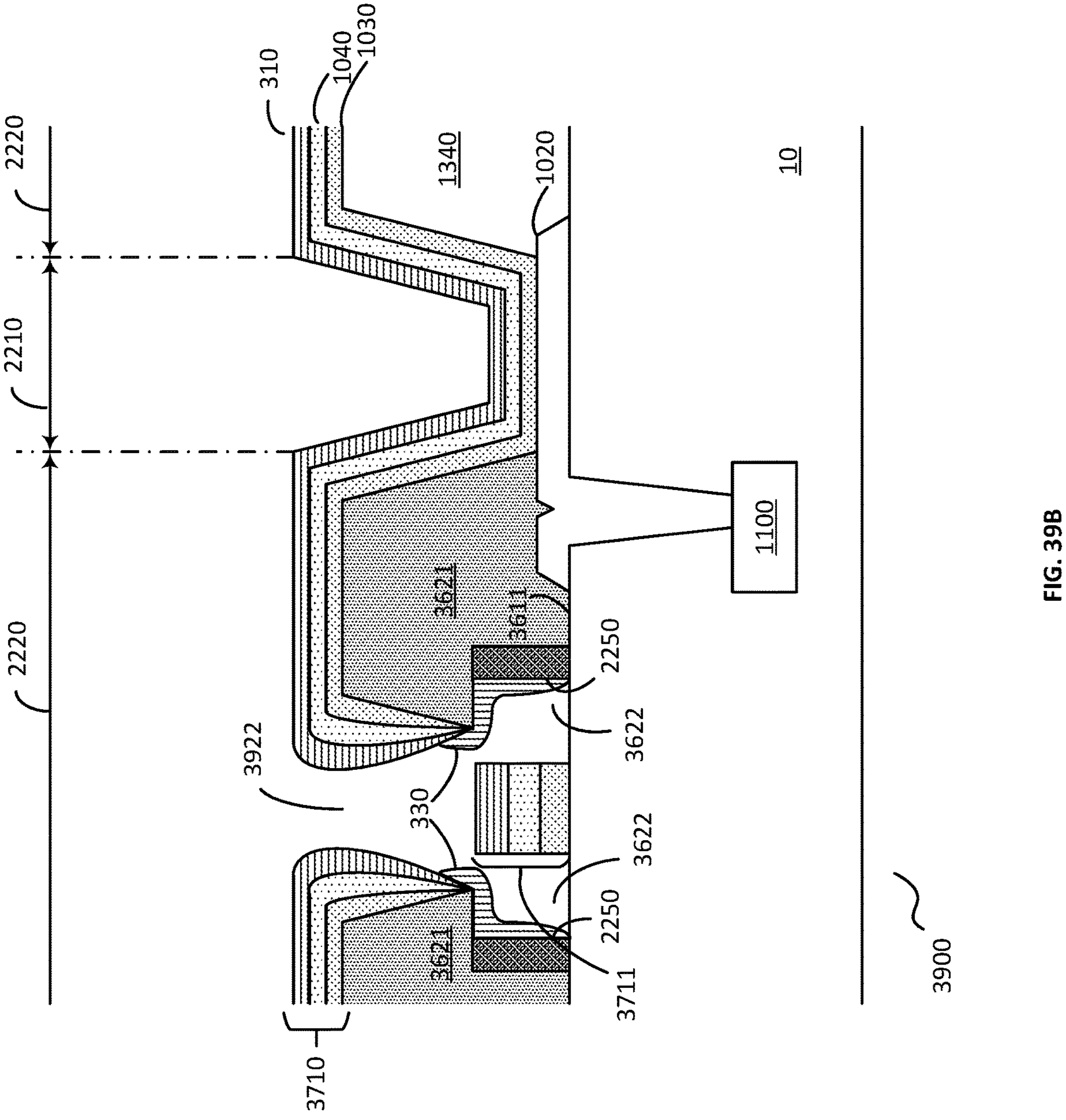

Turning now to FIG. 39B, there is shown a cross-sectional view of a further example of the device 3900. As shown, the auxiliary electrode 2150 may be arranged to form at least a part of the side 3726. As such, the auxiliary electrode 2150 may be substantially annular when viewed in plan view and surround the aperture 3922. As shown, in some non-limiting examples, the residual device stack 3711 may be deposited onto an exposed layer surface 11 of the substrate 10.

By way of non-limiting examples, the arrangement shown in FIG. 39B may be seen to be a combination of the example shown in FIG. 37O in combination with the example shown in FIG. 38B.

In some non-limiting examples, the partition 3622 may include, and/or is formed by an NPC 520. By way of non-limiting examples, the auxiliary electrode 2150 may act as an NPC 520.

In some non-limiting examples, the NPC 520 may be provided by the second electrode 1040, and/or a portion, layer, and/or material thereof. In some non-limiting examples, the second electrode 1040 may extend laterally to cover the exposed layer surface 11 arranged in the sheltered region 3465. In some non-limiting examples, the second electrode 1040 may comprise a lower layer thereof and a second layer thereof, wherein the second layer thereof is deposited on the lower layer thereof. In some non-limiting examples, the lower layer of the second electrode 1040 may comprise an oxide such as, without limitation, ITO, IZO, or ZnO. In some non-limiting examples, the upper layer of the second electrode 1040 may comprise a metal such as, without limitation, at least one of Ag, Mg, Mg:Ag, Yb/Ag, other alkali metals, and/or other alkali earth metals.

In some non-limiting examples, the lower layer of the second electrode 1040 may extend laterally to cover a surface of the sheltered region 3465, such that it forms the NPC 520. In some non-limiting examples, one or more surfaces defining the sheltered region 3465 may be treated to form the NPC 520. In some non-limiting examples, such NPC 520 may be formed by chemical, and/or physical treatment, including without limitation, subjecting the surface(s) of the sheltered region 3465 to a plasma, UV, and/or UV-ozone treatment.

Without wishing to be bound to any particular theory, it is postulated that such treatment may chemically, and/or physically alter such surface(s) to modify at least one property thereof. By way of non-limiting example, such treatment of the surface(s) may increase a concentration of C—O, and/or C—OH bonds on such surface(s), increase a roughness of such surface(s), and/or increase a concentration of certain species, and/or functional groups, including without limitation, halogens, nitrogen-containing functional groups, and/or oxygen-containing functional groups to thereafter act as an NPC 520.

In the present disclosure, the terms "overlap", and/or "overlapping" may refer generally to two or more layers, and/or structures arranged to intersect a cross-sectional axis extending substantially normally away from a surface onto which such layers, and/or structures may be disposed.

Technical

An organic opto-electronic device may encompass any opto-electronic device where one or more active layers, and/or strata thereof are formed primarily of an organic (carbon-containing) material, and more specifically, an organic semiconductor material.

Where the opto-electronic device emits photons through a luminescent process, the device may be considered an electro-luminescent device. In some non-limiting examples, the electro-luminescent device may be an organic light-emitting diode (OLED) device. In some non-limiting examples, the electro-luminescent device may be part of an electronic device. By way of non-limiting example, the electro-luminescent device may be an OLED lighting panel or module, and/or an OLED display or module of a computing device, such as a smartphone, a tablet, a laptop, an e-reader, and/or of some other electronic device such as a monitor, and/or a television set.

In some non-limiting examples, the opto-electronic device may be an organic photo-voltaic (OPV) device that converts photons into electricity. In some non-limiting examples, the opto-electronic device may be an electro-luminescent quantum dot (QD) device.

In the present disclosure, unless specifically indicated to the contrary, reference will be made to OLED devices, with the understanding that such disclosure could, in some examples, equally be made applicable to other opto-electronic devices, including without limitation, an OPV, and/or QD device, in a manner apparent to those having ordinary skill in the relevant art.

The structure of such devices may be described from each of two aspects, namely from a cross-sectional aspect, and/or from a lateral (plan view) aspect.

In the present disclosure, a directional convention may be followed, extending substantially normally to the lateral aspect described above, in which the substrate may be considered to be the "bottom" of the device, and the layers may be disposed on "top" of the substrate. Following such convention, the second electrode may be at the top of the device shown, even if (as may be the case in some examples, including without limitation, during a manufacturing process, in which one or more layers may be introduced by means of a vapor deposition process), the substrate may be physically inverted, such that the top surface, in which one of the layers, such as, without limitation, the first electrode, is to be disposed, may be physically below the substrate, so as to allow the deposition material (not shown) to move upward and be deposited upon the top surface thereof as a thin film.

In the context of introducing the cross-sectional aspect herein, the components of such devices may be shown in substantially planar lateral strata. Those having ordinary skill in the relevant art will appreciate that such substantially planar representation is for purposes of illustration only, and that across a lateral extent of such a device, there may be localized substantially planar strata of different thicknesses and dimension, including, in some non-limiting examples, the substantially complete absence of a layer, and/or layer(s) separated by non-planar transition regions (including lateral gaps and even discontinuities). Thus, while for illustrative purposes, the device is shown below in its cross-sectional aspect as a substantially stratified structure, in the plan view aspect discussed below, such device may illustrate a diverse topography to define features, each of which may substantially exhibit the stratified profile discussed in the cross-sectional aspect.

In the present disclosure, the terms "layer" and "strata" may be used interchangeably to refer to similar concepts.

The thickness of each layer shown in the figures is illustrative only and not necessarily representative of a thickness relative to another layer.

For purposes of simplicity of description, in the present disclosure, a combination of a plurality of elements in a single layer may be denoted by a colon ":", while a plurality of (combination(s) of) elements comprising a plurality of layers in a multi-layer coating may be denoted by separating two such layers by a slash "/". In some non-limiting examples, the layer after the slash may be deposited after, and/or on the layer preceding the slash.

For purposes of illustration, an exposed layer surface of an underlying material, onto which a coating, layer, and/or material is deposited, may be understood to be a surface of such underlying material that is presented for deposition of the coating, layer, and/or material thereon, at the time of deposition.

Those having ordinary skill in the relevant art will appreciate that when a component, a layer, a region, and/or a portion thereof, is referred to as being "formed", "disposed", and/or "deposited" on, and/or over another underlying material, component, layer, region, and/or portion, such formation, disposition, and/or deposition may be directly, and/or indirectly on an exposed layer surface (at the time of such formation, disposition, and/or deposition) of such underlying material, component, layer, region, and/or portion, with the potential of intervening material(s), component(s), layer(s), region(s), and/or portion(s) therebetween.

While the present disclosure discusses thin film formation, in reference to at least one layer or coating, in terms of vapor deposition, those having ordinary skill in the relevant art will appreciate that, in some non-limiting examples, various components of the device may be selectively deposited using a wide variety of techniques, including without limitation, evaporation (including without limitation, thermal evaporation, and/or electron beam evaporation), photolithography, printing (including without limitation, ink jet, and/or vapor jet printing, reel-to-reel printing, and/or micro-contact transfer printing), PVD (including without limitation, sputtering), chemical vapor deposition (CVD) (including without limitation, plasma-enhanced CVD (PECVD), and/or organic vapor phase deposition (OVPD)), laser annealing, laser-induced thermal imaging (LITI) patterning, atomic-layer deposition (ALD), coating (including without limitation, spin-coating, $d_1$ coating, line coating, and/or spray coating), and/or combinations thereof.

Some processes may be used in combination with a shadow mask, which may, in some non-limiting examples, may be an open mask, and/or fine metal mask (FMM), during deposition of any of various layers, and/or coatings to achieve various patterns by masking, and/or precluding deposition of a deposited material on certain parts of a surface of an underlying material exposed thereto.

In the present disclosure, the terms “evaporation”, and/or “sublimation” may be used interchangeably to refer generally to deposition processes in which a source material is converted into a vapor, including without limitation, by heating, to be deposited onto a target surface in, without limitation, a solid state. As will be understood, an evaporation process may be a type of PVD process where one or more source materials are evaporated, and/or sublimed under a low pressure (including without limitation, a vacuum) environment to form vapor monomers and deposited on a target surface through de-sublimation of the one or more evaporated source materials. A variety of different evaporation sources may be used for heating a source material, and, as such, it will be appreciated by those having ordinary skill in the relevant art, that the source material may be heated in various ways. By way of non-limiting example, the source material may be heated by an electric filament, electron beam, inductive heating, and/or by resistive heating. In some non-limiting examples, the source material may be loaded into a heated crucible, a heated boat, a Knudsen cell (which may be an effusion evaporator source), and/or any other type of evaporation source.

In some non-limiting examples, a deposition source material may be a mixture. In some non-limiting examples, at least one component of a mixture of a deposition source material may be not be deposited during the deposition process (or, in some non-limiting examples, be deposited in a relatively small amount compared to other components of such mixture).

In the present disclosure, a reference to a layer thickness, a film thickness, and/or an average layer, and/or film thickness, of a material, irrespective of the mechanism of deposition thereof, may refer to an amount of the material deposited on a target exposed layer surface, which corresponds to an amount of the material to cover the target surface with a uniformly thick layer of the material having the referenced layer thickness. By way of non-limiting example, depositing a layer thickness of 10 nm of material may indicate that an amount of the material deposited on the surface may correspond to an amount of the material to form a uniformly thick layer of the material that is 10 nm thick. It will be appreciated that, having regard to the mechanism by which thin films are formed discussed above, by way of non-limiting example, due to possible stacking or clustering of monomers, an actual thickness of the deposited material may be non-uniform. By way of non-limiting example, depositing a layer thickness of 10 nm may yield some parts of the deposited material 531 having an actual thickness greater than 10 nm, or other parts of the deposited material 531 having an actual thickness less than 10 nm. A certain layer thickness of a material deposited on a surface may thus correspond, in some non-limiting examples, to an average thickness of the deposited material across the target surface.

In the present disclosure, a reference to a reference layer thickness may refer to a layer thickness of the deposited material, also referred to herein as the deposited material (such as Mg), that may be deposited on a reference surface exhibiting a high initial sticking probability or initial sticking coefficient $S_0$ (that is, a surface having an initial sticking probability $S_0$ that is about, and/or close to 1.0). The reference layer thickness may not indicate an actual thickness of the deposited material deposited on a target surface (such as, without limitation, a surface of an NIC). Rather, the reference layer thickness may refer to a layer thickness of the deposited material that would be deposited on a reference surface, in some non-limiting examples a surface of a quartz crystal positioned inside a deposition chamber for monitoring a deposition rate and the reference layer thickness, upon subjecting the target surface and the reference surface to identical vapor flux of the deposited material for the same deposition period. Those having ordinary skill in the relevant art will appreciate that in the event that the target surface and the reference surface are not subjected to identical vapor flux simultaneously during deposition, an appropriate tooling factor may be used to determine, and/or to monitor the reference layer thickness.

In the present disclosure, a reference deposition rate may refer to a rate at which a layer of the deposited material would grow on the reference surface, if it were identically positioned and configured within a deposition chamber as the sample surface.

In the present disclosure, a reference to depositing a number X of monolayers of material may refer to depositing an amount of the material to cover a desired area of an exposed layer surface with X single layer(s) of constituent monomers of the material, such as, without limitation, in a closed coating.

In the present disclosure, a reference to depositing a fraction 1/X monolayer of a material may refer to depositing an amount of the material to cover a fraction 0.X of a desired area of an exposed layer surface with a single layer of constituent monomers of the material. Those having ordinary skill in the relevant art will appreciate that due to, by way of non-limiting example, possible stacking, and/or clustering of monomers, an actual local thickness of a deposited material across a desired area of a surface may be non-uniform. By way of non-limiting example, depositing 1 monolayer of a material may result in some local regions of the desired area of the surface being uncovered by the material, while other local regions of the desired area of the surface may have multiple atomic, and/or molecular layers deposited thereon.

In the present disclosure a target surface (and/or target region(s) thereof) may be considered to be “substantially devoid of”, “substantially free of”, and/or “substantially uncovered by” a material if there is a substantial absence of the material on the target surface as determined by any suitable determination mechanism.

In the present disclosure, the terms “sticking probability” and “sticking coefficient” may be used interchangeably.

In the present disclosure, the term “nucleation” may reference a nucleation stage of a thin film formation process, in which monomers in a vapor phase condense onto a surface to form nuclei.

In the present disclosure, in some non-limiting examples, as the context dictates, the terms “patterning coating” and “patterning material” may be used interchangeably to refer to similar concepts, and references to an patterning coating herein, in the context of being selectively deposited to pattern a deposited layer 330 may, in some non-limiting examples, be applicable to a NIC material in the context of selective deposition thereof to pattern a deposited material, and/or an electrode coating material.

Similarly, in some non-limiting examples, as the context dictates, the term “patterning coating” and “patterning material" may be used interchangeably to refer to similar concepts, and reference to an NPC herein, in the context of being selectively deposited to pattern a deposited layer may, in some non-limiting examples, be applicable to an NPC material in the context of selective deposition thereof to pattern an electrode coating.

While a patterning material may be either nucleation-inhibiting or nucleation-promoting, in the present disclosure, unless the context dictates otherwise, a reference herein to a patterning material is intended to be a reference to an NIC.

In some non-limiting examples, reference to a patterning material may signify a coating having a specific composition as described herein.

In the present disclosure, the terms "deposited layer" and "electrode coating" may be used interchangeably to refer to similar concepts and references to a deposited layer herein, in the context of being patterned by selective deposition of an NIC, and/or an NPC may, in some non-limiting examples, be applicable to an electrode coating in the context of being patterned by selective deposition of a patterning material. In some non-limiting examples, reference to an electrode coating may signify a coating having a specific composition as described herein. Similarly, in the present disclosure, the terms "deposited material", "deposited material" and "electrode coating material" may be used interchangeably to refer to similar concepts and references to a deposited material herein.

In the present disclosure, it will be appreciated by those having ordinary skill in the relevant art that an organic material, may comprise, without limitation, a wide variety of organic molecules, and/or organic polymers. Further, it will be appreciated by those having ordinary skill in the relevant art that organic materials that are doped with various inorganic substances, including without limitation, elements, and/or inorganic compounds, may still be considered organic materials. Still further, it will be appreciated by those having ordinary skill in the relevant art that various organic materials may be used, and that the processes described herein are generally applicable to an entire range of such organic materials. Still further, it will be appreciated by those having ordinary skill in the relevant art that organic materials that contain metals, and/or other organic elements, may still be considered as organic materials. Still further, it will be appreciated by those having ordinary skill in the relevant art that various organic materials may be molecules, oligomers, and/or polymers.

As used herein, an oligomer generally refers to a material which includes at least two monomer units or monomers. As would be appreciated by a person skilled in the art, an oligomer may differ from a polymer in at least one aspect, including but not limited to: (1) the number of monomer units contained therein; (2) the molecular weight; and (3) other materials properties, and/or characteristics. By way of non-limiting example, further description of polymers and oligomers may be found in Naka K. (2014) *Monomers, Oligomers, Polymers, and Macromolecules* (*Overview*), and in Kobayashi S., Müllen K. (eds.) *Encyclopedia of Polymeric Nanomaterials*, Springer, Berlin, Heidelberg.

An oligomer or a polymer generally includes monomer units that are chemically bonded together to form a molecule. Such monomer units may be substantially identical to one another such that the molecule is primarily formed by repeating monomer units, or the molecule may include two or more different monomer units. Additionally, the molecule may include one or more terminal units, which may be different from the monomer units of the molecule. An oligomer or a polymer may be linear, branched, cyclic, cyclo-linear, and/or cross-linked. An oligomer or a polymer may include two or more different monomer units which are arranged in a repeating pattern, and/or in alternating blocks of different monomer units.

In the present disclosure, the term "semiconducting layer(s)" may be used interchangeably with "organic layer(s)" since the layers in an OLED device may in some non-limiting examples, may comprise organic semiconducting materials.

In the present disclosure, an inorganic substance may refer to a substance that primarily includes an inorganic material. In the present disclosure, an inorganic material may comprise any material that is not considered to be an organic material, including without limitation, metals, glasses, and/or minerals.

In the present disclosure, the terms "photon" and "light" may be used interchangeably to refer to similar concepts. In the present disclosure, photons may have a wavelength that lies in the visible spectrum, in the infrared (IR) region (IR spectrum), near IR region (NIR spectrum), ultraviolet (UV) region (UV spectrum), and/or UVA region (UVA spectrum) (which may correspond to a wavelength range between about 315-400 nm) thereof.

In the present disclosure, the term "visible spectrum" as used herein, generally refers to at least one wavelength in the visible part of the EM spectrum.

In the present disclosure, the term "emission spectrum" as used herein, generally refers to an electroluminescence spectrum of light emitted by an opto-electronic device. By way of non-limiting example, an emission spectrum may be detected using an optical instrument, such as, by way of non-limiting example, a spectrophotometer, which measures an intensity of EM radiation across a wavelength range.

In the present disclosure, the term "onset wavelength" $\lambda_{onset}$, as used herein, may generally refer to a lowest wavelength at which an emission is detected within an emission spectrum.

In the present disclosure, the term "peak wavelength" $\lambda_{max}$, as used herein, may generally refer to a wavelength at which a maximum luminous intensity is detected within an emission spectrum.

In some non-limiting examples, the onset wavelength $\lambda_{onset}$ may be less than the peak wavelength $\lambda_{max}$. In some non-limiting examples, the onset wavelength $\lambda_{onset}$ may correspond to a wavelength at which a luminous intensity is no more than about: 10%, 5%, 3%, 1%, 0.5%, 0.1%, or 0.01%, of the luminous intensity at the peak wavelength $\lambda_{max}$.

As would be appreciated by those having ordinary skill in the relevant art, such visible part may correspond to any wavelength between about 380-740 nm. In general, electro-luminescent devices may be configured to emit, and/or transmit light having wavelengths in a range of between about 425-725 nm, and more specifically, in some non-limiting examples, light having peak emission wavelengths $\lambda_{e\ max}$ of 456 nm, 528 nm, and 624 nm, corresponding to B(lue), G(reen), and R(ed) sub-pixels, respectively. Accordingly, in the context of such electro-luminescent devices, the visible part may refer to any wavelength between about 425-725 nm, or between about 456-624 nm. Photons having a wavelength in the visible spectrum may, in some non-limiting examples, also be referred to as "visible light" herein.

In some non-limiting examples, an emission spectrum that lies in the R(ed) part of the visible spectrum may be characterized by a peak wavelength $\lambda_{max}$ that may lie in a wavelength range of about 9410-640 nm and in some non-limiting examples, may be substantially about 620 nm.

In some non-limiting examples, an emission spectrum that lies in the G(reen) part of the visible spectrum may be characterized by a peak wavelength $\lambda_{max}$ that may lie in a wavelength range of about 510-340 nm and in some non-limiting examples, may be substantially about 530 nm.

In some non-limiting examples, an emission spectrum that lies in the B(lue) part of the visible spectrum may be characterized by a peak wavelength $\lambda_{max}$ that may lie in a wavelength range of about 450-4941 nm and in some non-limiting examples, may be substantially about 455 nm.

In the present disclosure, the term "IR signal" as used herein, may generally refer to EM radiation having a wavelength in an IR subset (IR spectrum) of the EM spectrum. An IR signal may, in some non-limiting examples, have a wavelength corresponding to a near-infrared (NIR) subset (NIR spectrum) thereof. By way of non-limiting examples, an NIR signal may have a wavelength of between about: 750-1400 nm, 750-1300 nm, 800-1300 nm, 800-1200 nm, 850-1300 nm, or 900-1300 nm.

In the present disclosure, the term "absorption spectrum", as used herein, may generally refer to a wavelength (sub-) range of the EM spectrum over which absorption may be concentrated.

In the present disclosure, the terms "absorption edge", "absorption discontinuity", and/or "absorption limit" as used herein, may generally refer to a sharp discontinuity in the absorption spectrum of a substance. In some non-limiting examples, an absorption edge may tend to occur at wavelengths where the energy of an absorbed photon may correspond to an electronic transition, and/or ionization potential.

In the present disclosure, the term "extinction coefficient" as used herein, may generally refer to the degree to which an EM coefficient is attenuated when propagating through a material. In some non-limiting examples, the extinction coefficient may be understood to correspond to the imaginary component k of a complex refractive index N In some non-limiting examples, the extinction coefficient k of a material may be measured by a variety of methods, including without limitation, by ellipsometry.

In the present disclosure, the terms "refractive index", and/or "index", as used herein to describe a medium, may refer to a value calculated from a ratio of the speed of light in such medium relative to the speed of light in a vacuum. In the present disclosure, particularly when used to describe the properties of substantially transparent materials, including without limitation, thin film layers, and/or coatings, the terms may correspond to the real part, n, in the expression N=n+ik, in which N represents the complex refractive index and k represents the extinction coefficient.

As would be appreciated by those having ordinary skill in the relevant art, substantially transparent materials, including without limitation, thin film layers, and/or coatings, may generally exhibit a relatively low k value in the visible spectrum, and therefore the imaginary component of the expression may have a negligible contribution to the complex refractive index, N On the other hand, light-transmissive electrodes formed, for example, by a metallic thin film, may exhibit a relatively low n value and a relatively high k value in the visible spectrum. Accordingly, the complex refractive index, N of such thin films may be dictated primarily by its imaginary component k.

In the present disclosure, unless the context dictates otherwise, reference without specificity to a refractive index may be intended to be a reference to the real part n of the complex refractive index N.

In some non-limiting examples, there may be a generally positive correlation between refractive index n and transmittance, or in other words, a generally negative correlation between refractive index n and absorption. In some non-limiting examples, the absorption edge of a substance may correspond to a wavelength at which the extinction coefficient k approaches 0.

It will be appreciated that the refractive index n, and/or extinction coefficient k values described herein may correspond to such value(s) measured at a wavelength in the visible range of the EM spectrum. In some non-limiting examples, the refractive index n, and/or extinction coefficient k value may correspond to the value measured at wavelength(s) of about 456 nm which may correspond to the peak emission wavelength of a B(lue) subpixel, about 528 nm which may correspond to the peak emission wavelength of a G(reen) subpixel, and/or about 624 nm which may correspond to the peak emission wavelength of a R(ed) subpixel. In some non-limiting examples, the refractive index n, and/or extinction coefficient k value described herein may correspond to the value measured at a wavelength of about 589 nm, which approximately corresponds to the Fraunhofer D-line.

In the present disclosure, the concept of a pixel may be discussed on conjunction with the concept of at least one sub-pixel thereof. For simplicity of description only, such composite concept may be referenced herein as a "(sub-) pixel" and such term is understood to suggest either or both of a pixel, and/or at least one sub-pixel may be thereof, unless the context dictates otherwise.

In some nonlimiting examples, one measure of an amount of a material on a surface may be a percentage coverage of the surface by such material. In some non-limiting examples, surface coverage may be assessed using a variety of imaging techniques, including without limitation, TEM, AFM, and/or SEM.

In the present disclosure, the terms "particle", "island" and "cluster" may be used interchangeably to refer to similar concepts.

In the present disclosure, for purposes of simplicity of description, the terms "coating film", "closed coating", and/or "closed coating", as used herein, may refer to a thin film structure, and/or coating of a deposited material used for a deposited layer, in which a relevant part of a surface may be substantially coated thereby, such that such surface may be not substantially exposed by or through the coating film deposited thereon.

In the present disclosure, unless the context dictates otherwise, reference without specificity to a thin film may be intended to be a reference to a substantially closed coating.

In some non-limiting examples, a closed coating, in some non-limiting examples, of a deposited layer, and/or a deposited material, may be disposed to cover a portion of an underlying surface, such that, within such part, less than about: 40%, 30%, 25%, 20%, 15%, 10%, 5%, 3%, or 1% of the underlying surface therewithin is exposed by or through the closed coating.

Those having ordinary skill in the relevant art will appreciate that a closed coating may be patterned using various techniques and processes, including without limitation, those described herein, so as to deliberately leave a part of the exposed layer surface of the underlying surface to be exposed after deposition of the closed coating. In the present disclosure, such patterned films may nevertheless be considered to constitute a closed coating, if, by way of non-limiting example, the thin film, and/or coating that is deposited, within the context of such patterning, and between such deliberately exposed parts of the exposed layer surface of the underlying surface, itself substantially comprises a closed coating.

Those having ordinary skill in the relevant art will appreciate that, due to the inherent variability in the deposition process, and in some non-limiting examples, to the existence of impurities in either or both of the deposited materials, in some non-limiting examples, the deposited material, and the exposed layer surface of the underlying material, deposition of a thin film, using various techniques and processes, including without limitation, those described herein, may nevertheless result in the formation of small apertures, including without limitation, pin-holes, tears, and/or cracks, therein. In the present disclosure, such thin films may nevertheless be considered to constitute a closed coating, if, by way of non-limiting example, the thin film, and/or coating that is deposited substantially comprises a closed coating and meets any specified percentage coverage criterion set out, despite the presence of such apertures.

In the present disclosure, for purposes of simplicity of description, the term "discontinuous layer" as used herein, may refer to a thin film structure, and/or coating of a material used for a deposited layer, in which a relevant part of a surface coated thereby, may be neither substantially devoid of such material, or forms a closed coating thereof. In some non-limiting examples, a discontinuous layer of a deposited material may manifest as a plurality of discrete islands disposed on such surface.

In the present disclosure, for purposes of simplicity of description, the result of deposition of vapor monomers onto an exposed layer surface of an underlying material, that has not (yet) reached a stage where a closed coating has been formed, may be referred to as a "intermediate stage layer". In some non-limiting examples, such an intermediate stage layer may reflect that the deposition process has not been completed, in which such an intermediate stage layer may be considered as an interim stage of formation of a closed coating. In some non-limiting examples, an intermediate stage layer may be the result of a completed deposition process, and thus constitute a final stage of formation in and of itself.

In some non-limiting examples, an intermediate stage layer may more closely resemble a thin film than a discontinuous layer but may have apertures, and/or gaps in the surface coverage, including without limitation, one or more dendritic projections, and/or one or more dendritic recesses. In some non-limiting examples, such an intermediate stage layer may comprise a fraction 1/X of a single monolayer of the deposited material 531 such that it does not form a closed coating.

In the present disclosure, for purposes of simplicity of description, the term "dendritic", with respect to a coating, including without limitation, the deposited layer, may refer to feature(s) that resemble a branched structure when viewed in a lateral aspect. In some non-limiting examples, the deposited layer may comprise a dendritic projection, and/or a dendritic recess. In some non-limiting examples, a dendritic projection may correspond to a part of the deposited layer that exhibits a branched structure comprising a plurality of short projections that are physically connected and extend substantially outwardly. In some non-limiting examples, a dendritic recess may correspond to a branched structure of gaps, openings, and/or uncovered parts of the deposited layer that are physically connected and extend substantially outwardly. In some non-limiting examples, a dendritic recess may correspond to, including without limitation, a mirror image, and/or inverse pattern, to the pattern of a dendritic projection. In some non-limiting examples, a dendritic projection, and/or a dendritic recess may have a configuration that exhibits, and/or mimics a fractal pattern, a mesh, a web, and/or an interdigitated structure.

In some non-limiting examples, sheet resistance may be a property of a component, layer, and/or part that may alter a characteristic of an electric current passing through such component, layer, and/or part. In some non-limiting examples, a sheet resistance of a coating may generally correspond to a characteristic sheet resistance of the coating, measured, and/or determined in isolation from other components, layers, and/or parts of the device.

In the present disclosure, a deposited density may refer to a distribution, within a region, which in some non-limiting examples may comprise an area, and/or a volume, of a deposited material therein. Those having ordinary skill in the relevant art will appreciate that such deposited density may be unrelated to a density of mass or material within a particle structure itself that may comprise such deposited material. In the present disclosure, unless the context dictates otherwise, reference to a deposited density, and/or to a density, may be intended to be a reference to a distribution of such deposited material, including without limitation, as at least one particle, within an area.

In some non-limiting examples, a bond dissociation energy of a metal may correspond to a standard-state enthalpy change measured at 298 K from the breaking of a bond of a diatomic molecule formed by two identical atoms of the metal. Bond dissociation energies may, by way of non-limiting example, be determined based on known literature including without limitation, Luo, Yu-Ran, "*Bond Dissociation Energies*" (2010).

Without wishing to be bound by a particular theory, it is postulated that providing an NPC may facilitate deposition of the deposited layer onto certain surfaces.

Non-limiting examples of suitable materials for forming an NPC include without limitation, at least one of metals, including without limitation, alkali metals, alkaline earth metals, transition metals, and/or post-transition metals, metal fluorides, metal oxides, and/or fullerene.

Non-limiting examples of such materials include Ca, Ag, Mg, Yb, ITO, IZO, ZnO, ytterbium fluoride ($YbF_3$), magnesium fluoride ($MgF_2$), and/or cesium fluoride (CsF).

In the present disclosure, the term "fullerene" may refer generally to a material including carbon molecules. Non-limiting examples of fullerene molecules include carbon cage molecules, including without limitation, a three-dimensional skeleton that includes multiple carbon atoms that form a closed shell and which may be, without limitation, spherical, and/or semi-spherical in shape. In some non-limiting examples, a fullerene molecule can be designated as $C_n$, where n is an integer corresponding to a number of carbon atoms included in a carbon skeleton of the fullerene molecule. Non-limiting examples of fullerene molecules include $C_n$, where n is in the range of 50 to 250, such as, without limitation, $C_{60}$, $C_{70}$, $C_{72}$, $C_{74}$, $C_{76}$, $C_{78}$, $C_{80}$, $C_{82}$, and $C_{84}$. Additional non-limiting examples of fullerene molecules include carbon molecules in a tube, and/or a cylindrical shape, including without limitation, single-walled carbon nanotubes, and/or multi-walled carbon nanotubes.

Based on findings and experimental observations, it is postulated that nucleation promoting materials, including without limitation, fullerenes, metals, including without limitation, Ag, and/or Yb, and/or metal oxides, including without limitation, ITO, and/or IZO, as discussed further herein, may act as nucleation sites for the deposition of a deposited layer, including without limitation Mg.

In some non-limiting examples, suitable materials for use to form an NPC 520, may include those exhibiting or characterized as having an initial sticking probability $S_0$ for a material of a deposited layer of at least about: 0.4, 0.5, 0.6, 0.7, 0.75, 0.8, 0.9, 0.93, 0.95, 0.98, or 0.99.

By way of non-limiting example, in scenarios where Mg is deposited using without limitation, an evaporation process on a fullerene-treated surface, in some non-limiting examples, the fullerene molecules may act as nucleation sites that may promote formation of stable nuclei for Mg deposition.

In some non-limiting examples, less than a monolayer of an NPC, including without limitation, fullerene, may be provided on the treated surface to act as nucleation sites for deposition of Mg.

In some non-limiting examples, treating a surface by depositing several monolayers of an NPC thereon may result in a higher number of nucleation sites and accordingly, a higher initial sticking probability $S_0$.

Those having ordinary skill in the relevant art will appreciate than an amount of material, including without limitation, fullerene, deposited on a surface, may be more, or less than one monolayer. By way of non-limiting example, such surface may be treated by depositing: 0.1, 1, 10, or more monolayers of a nucleation promoting material, and/or a nucleation inhibiting material.

In some non-limiting examples, a thickness of the NPC\deposited on an exposed layer surface of underlying material(s) may be between about: 1-5 nm, or 1-3 nm.

Where features or aspects of the present disclosure are described in terms of Markush groups, it will be appreciated by those having ordinary skill in the relevant art that the present disclosure is also thereby described in terms of any individual member of sub-group of members of such Markush group.

References in the singular form may include the plural and vice versa, unless otherwise noted.

As used herein, relational terms, such as "first" and "second", and numbering devices such as "a", "b" and the like, may be used solely to distinguish one entity or element from another entity or element, without necessarily requiring or implying any physical or logical relationship or order between such entities or elements.

The terms "including" and "comprising" may be used expansively and in an open-ended fashion, and thus should be interpreted to mean "including, but not limited to". The terms "example" and "exemplary" may be used simply to identify instances for illustrative purposes and should not be interpreted as limiting the scope of the embodiments to the stated instances. In particular, the term "exemplary" should not be interpreted to denote or confer any laudatory, beneficial or other quality to the expression with which it is used, whether in terms of design, performance or otherwise.

Further, the term "critical", especially when used in the expressions "critical nuclei", "critical nucleation rate", "critical concentration", "critical cluster", "critical monomer", "critical particle structure size", and/or "critical surface tension" may be a term familiar to those having ordinary skill in the relevant art, including as relating to or being in a state in which a measurement or point at which some quality, property or phenomenon undergoes a definite change. As such, the term "critical" should not be interpreted to denote or confer any significance or importance to the expression with which it is used, whether in terms of design, performance, or otherwise.

The terms "couple" and "communicate" in any form may be intended to mean either a direct connection or indirect connection through some interface, device, intermediate component or connection, whether optically, electrically, mechanically, chemically, or otherwise.

The terms "on" or "over" when used in reference to a first component relative to another component, and/or "covering" or which "covers" another component, may encompass situations where the first component is direct on (including without limitation, in physical contact with) the other component, as well as cases where one or more intervening components are positioned between the first component and the other component.

Directional terms such as "upward", "downward", "left" and "right" may be used to refer to directions in the drawings to which reference is made unless otherwise stated. Similarly, words such as "inward" and "outward" may be used to refer to directions toward and away from, respectively, the geometric center of the device, area or volume or designated parts thereof. Moreover, all dimensions described herein may be intended solely to be by way of example of purposes of illustrating certain embodiments and may not be intended to limit the scope of the disclosure to any embodiments that may depart from such dimensions as may be specified.

As used herein, the terms "substantially", "substantial", "approximately", and/or "about" may be used to denote and account for small variations. When used in conjunction with an event or circumstance, such terms may refer to instances in which the event or circumstance occurs precisely, as well as instances in which the event or circumstance occurs to a close approximation. By way of non-limiting example, when used in conjunction with a numerical value, such terms may refer to a range of variation of no more than about ±10% of such numerical value, such as no more than: ±5%, ±4%, ±3%, ±2%, ±1%, ±0.5%, ±0.1%, or ±0.05%.

As used herein, the phrase "consisting substantially of" may be understood to include those elements specifically recited and any additional elements that do not materially affect the basic and novel characteristics of the described technology, while the phrase "consisting of" without the use of any modifier, may exclude any element not specifically recited.

As will be understood by those having ordinary skill in the relevant art, for any and all purposes, particularly in terms of providing a written description, all ranges disclosed herein may also encompass any and all possible sub-ranges, and/or combinations of sub-ranges thereof. Any listed range may be easily recognized as sufficiently describing, and/or enabling the same range being broken down at least into equal fractions thereof, including without limitation, halves, thirds, quarters, fifths, tenths etc. As a non-limiting example, each range discussed herein may be readily be broken down into a lower third, middle third, and/or upper third, etc.

As will also be understood by those having ordinary skill in the relevant art, all language, and/or terminology such as "up to", "at least", "greater than", "less than", and the like, may include, and/or refer the recited range(s) and may also refer to ranges that may be subsequently broken down into sub-ranges as discussed herein.

As will be understood by those having ordinary skill in the relevant art, a range includes each individual member of the recited range.

General

The purpose of the Abstract is to enable the relevant patent office or the public generally, and specifically, persons of ordinary skill in the art who are not familiar with patent or legal terms or phraseology, to quickly determine from a cursory inspection, the nature of the technical disclosure. The Abstract is neither intended to define the scope of this disclosure, nor is it intended to be limiting as to the scope of this disclosure in any way.

The structure, manufacture and use of the presently disclosed examples have been discussed above. The specific examples discussed are merely illustrative of specific ways to make and use the concepts disclosed herein, and do not limit the scope of the present disclosure. Rather, the general principles set forth herein are considered to be merely illustrative of the scope of the present disclosure.

It should be appreciated that the present disclosure, which is described by the claims and not by the implementation details provided, and which can be modified by varying, omitting, adding or replacing, and/or in the absence of any element(s), and/or limitation(s) with alternatives, and/or equivalent functional elements, whether or not specifically disclosed herein, will be apparent to those having ordinary skill in the relevant art, may be made to the examples disclosed herein, and may provide many applicable inventive concepts that may be embodied in a wide variety of specific contexts, without straying from the present disclosure.

In particular, features, techniques, systems, sub-systems and methods described and illustrated in one or more of the above-described examples, whether or not described an illustrated as discrete or separate, may be combined or integrated in another system without departing from the scope of the present disclosure, to create alternative examples comprised of a combination or sub-combination of features that may not be explicitly described above, or certain features may be omitted, or not implemented. Features suitable for such combinations and sub-combinations would be readily apparent to persons skilled in the art upon review of the present application as a whole. Other examples of changes, substitutions, and alterations are easily ascertainable and could be made without departing from the spirit and scope disclosed herein.

All statements herein reciting principles, aspects and examples of the disclosure, as well as specific examples thereof, are intended to encompass both structural and functional equivalents thereof and to cover and embrace all suitable changes in technology. Additionally, it is intended that such equivalents include both currently-known equivalents as well as equivalents developed in the future, i.e., any elements developed that perform the same function, regardless of structure.

The present disclosure includes, without limitation, the following clauses:

Accordingly, the specification and the examples disclosed therein are to be considered illustrative only, with a true scope of the disclosure being disclosed by the following numbered claims:

What is claimed is:

1. A device having a plurality of layers, comprising:

a nucleation-inhibiting coating (NIC) disposed on a first layer surface of an underlying layer in a first portion of a lateral aspect thereof; and a deposited layer comprised of a deposited material, disposed on a second layer surface;

wherein an initial sticking probability against deposition of the deposited layer onto a surface of the NIC in the first portion is substantially less than the initial sticking probability against deposition of the deposited layer onto the second layer surface, such that the NIC is substantially devoid of a closed coating of the deposited material; and wherein the NIC comprises a compound containing a rare earth element.

2. The device of claim 1, wherein the rare earth element comprises at least one of: cerium (Ce), dysprosium (Dy), erbium (Er), europium (Eu), gadolinium (Gd), holmium (Ho), lanthanum (La), lutetium (Lu), neodymium (Nd), promethium (Pm), praseodymium (Pr), scandium (Sc), samarium (Sm), terbium (Tb), thulium (Tm), yttrium (Y), and ytterbium (Yb).

3. The device of claim 1, wherein the rare earth element comprises Ce, Dy, Er, Eu, Gd, Ho, Lu, Nd, Pr, Sm, Tb, Tm, and Yb.

4. The device of claim 1, wherein the rare earth element comprises Ce, Dy, Er, Eu, Gd, Ho, Lu, Nd, Sm, Tm, and Yb.

5. The device of claim 1, wherein the compound comprises an oxide of the rare earth element.

6. The device of claim 5, wherein the oxide comprises at least one of: $CeO_2$, $Dy_2O_3$, $Er_2O_3$, $Eu_2O_3$, $Gd_2O_3$, $Ho_2O_3$, $La_2O_3$, $Lu_2O_3$, $Nd_2O_3$, $Pr_6O_{11}$, $Pr_2O_3$, $PrO_2$, $Pr_2O_5$, $Pm_2O_3$, $Sm_2O_3$, $Sc_2O_3$, $Tb_7O_{12}$, $Tb_2O_3$, $TbO_2$, $Tb_3O_7$, $Tm_2O_3$, $Yb_2O_3$, and $Y_2O_3$.

7. The device of claim 1, wherein a critical surface energy of the NIC is less than about 30 dynes/cm.

8. The device of claim 1, wherein the deposited layer comprises a closed coating on the second layer surface in a second portion of the lateral aspect.

9. The device of claim 8, further comprising an interface coating in the second portion, wherein the interface coating comprises the rare earth element.

10. The device of claim 9, wherein the second layer surface is a surface of the interface coating.

11. The device of claim 9, wherein an oxidation state of the rare earth element in the interface coating is zero.

12. The device of claim 9, wherein the interface coating is contiguous with the NIC in the lateral aspect.

13. The device of claim 9, wherein the rare earth element comprises Yb.

14. The device of claim 13, wherein the interface coating comprises $Yb^0$, and the NIC comprises $Yb_2O_3$.

15. The device of claim 9, wherein a critical surface energy of the NIC is lower than a critical surface energy of the interface coating.

16. The device of claim 8, wherein the second portion comprises at least one emissive region.

17. The device of claim 16, wherein the first portion comprises at least part of a non-emissive region.

18. The device of claim 16, wherein the emissive region comprises:

a substrate;

a first electrode;

at least one semiconducting layer; and a second electrode;

wherein the first electrode lies between the substrate and the at least one semiconducting layer; and wherein the at least one semiconducting layer lies between the first and second electrodes.

19. The device of claim 18, wherein the deposited layer is electrically coupled to the second electrode.

20. The device of claim 18, wherein the deposited layer forms at least part of the second electrode in the second portion.

21. The device of claim 18, wherein the second portion comprises a partition and a third electrode in a sheltered region of the partition, wherein the deposited layer is electrically coupled to the second electrode and the third electrode.

22. The device of claim 1, wherein the deposited layer comprises a discontinuous layer of at least one particle structure and the second layer surface is a surface of the NIC.

23. The device of claim 22, further comprising at least one covering layer disposed on a surface of the NIC and forming an interface therewith, wherein the deposited layer is located at the interface.

24. The device of claim 23, wherein the first portion comprises at least one emissive region and the deposited layer is tuned to enhance out-coupling of at least one electromagnetic signal emitted by the emissive region.

25. The device of claim 24, wherein a resonance imparted by the at least one particle structure is tuned by selection of a feature selected from at least one of a characteristic size, size distribution, shape, surface coverage, configuration, dispersity, material of the at least one particle structure, and any combination of any of these.

26. The device of claim 25, wherein the resonance is tuned by varying at least one of a deposited thickness of the deposited material, an average film thickness of the NIC, a thickness of the at least one covering layer, a composition of metal in the deposited material, a dielectric constant of the at least one particle structure, an extent to which the NIC is doped with an organic material having a different composition, a refractive index of the NIC, an extinction coefficient of the NIC, a material deposited as the at least one covering layer, a refractive index of the at least one covering layer, an extinction coefficient of the at least one covering layer, and any combination of any of these.

27. The device of claim 24, wherein the first portion is substantially limited to the at least one emissive region.

28. The device of claim 24, wherein the first portion is bounded by a second portion of the lateral aspect that comprises at least one non-emissive region.

29. The device of claim 28, wherein the NIC extends beyond the first portion into the second portion.

30. The device of claim 24, wherein the emissive region comprises:

a substrate;

a first electrode;

at least one semiconducting layer; and a second electrode;

wherein the first electrode lies between the substrate and the at least one semiconducting layer; and wherein the at least one semiconducting layer lies between the first and second electrodes.

31. The device of claim 30, wherein the underlying layer comprises the second electrode.

32. The device of claim 30, wherein the underlying layer comprises one of the at least one semiconducting layers.

33. The device of claim 32, wherein the underlying layer is selected from at least one of a hole injection layer, a hole transport layer, an electron transport layer, and an electron injection layer.

34. The device of claim 32, wherein the at least one covering layer is selected from at least one of the electron transport layer and the electron injection layer.

35. The device of claim 30, wherein the deposited layer comprises the second electrode.

36. The device of claim 22, wherein the deposited layer is formed by deposition of the deposited material across a second portion of the lateral aspect.

37. The device of claim 36, wherein the deposited material forms an electrode in the second portion.

38. The device of claim 37, wherein the electrode in the second portion is an auxiliary electrode.

39. The device of claim 37, wherein the second portion comprises at least one further emissive region and the electrode in the second portion is an electrode of the at least one further emissive region.

40. The device of claim 39, wherein the at least one further emissive region comprises:

a substrate;

a first electrode;

at least one semiconducting layer; and a second electrode;

wherein the first electrode lies between the substrate and the at least one semiconducting layer; and wherein the at least one semiconducting layer lies between the first and second electrodes.

41. The device of claim 40, wherein the electrode in the second portion comprises the second electrode of the at least one further emissive region.

42. The device of claim 37, wherein the electrode in the second portion is a closed coating of the deposited material.

43. The device of claim 1, wherein the deposited material comprises Mg.

* * * * *